US009287356B2

(12) United States Patent
Bertin et al.

(10) Patent No.: US 9,287,356 B2
(45) Date of Patent: Mar. 15, 2016

(54) NONVOLATILE NANOTUBE DIODES AND NONVOLATILE NANOTUBE BLOCKS AND SYSTEMS USING SAME AND METHODS OF MAKING SAME

(75) Inventors: Claude L. Bertin, Venice, FL (US); Eliodor G. Ghenciu, King Of Prussia, PA (US); Thomas Rueckes, Rockport, MA (US); H. Montgomery Manning, Eagle, ID (US)

(73) Assignee: Nantero Inc., Woburn, MA (US)

( * ) Notice: Subject to any disclaimer, the term of this patent is extended or adjusted under 35 U.S.C. 154(b) by 870 days.

(21) Appl. No.: 12/356,447

(22) Filed: Jan. 20, 2009

(65) Prior Publication Data

US 2009/0184389 A1 Jul. 23, 2009

Related U.S. Application Data

(63) Continuation-in-part of application No. 12/273,807, filed on Nov. 19, 2008, now Pat. No. 8,183,665, which is a continuation-in-part of application No. 11/835,865, filed on Aug. 8, 2007, now Pat. No.

(Continued)

(51) Int. Cl.
*H01L 29/06* (2006.01)
*B82Y 10/00* (2011.01)

(Continued)

(52) U.S. Cl.
CPC ............. *H01L 29/0665* (2013.01); *B82Y 10/00* (2013.01); *G11C 11/56* (2013.01);

(Continued)

(58) Field of Classification Search
CPC .................................................. H01L 27/1021
USPC .................. 365/129, 146, 148, 151–152, 159
See application file for complete search history.

(56) References Cited

U.S. PATENT DOCUMENTS

| | | | | |
|---|---|---|---|---|
| 3,719,933 A * | 3/1973 | Wakabayashi et al. | ....... | 365/148 |
| 4,256,514 A | 3/1981 | Pogge et al. | | |

(Continued)

FOREIGN PATENT DOCUMENTS

| | | |
|---|---|---|
| EP | 1916722 | 4/2008 |
| GB | 2 364 933 A | 2/2002 |

(Continued)

OTHER PUBLICATIONS

Endo, K., et al. "Plasma Deposition of Low-Dielectric-Constant Fluorinated Amorphous Carbon." J. Appl. Phys., vol. 86, No. 5 (Sep. 1, 1999): pp. 2739-2745.*

(Continued)

*Primary Examiner* — Mark Tornow
(74) *Attorney, Agent, or Firm* — Nantero Inc.

(57) ABSTRACT

A non-volatile nanotube switch and memory arrays constructed from these switches are disclosed. A non-volatile nanotube switch includes a conductive terminal and a nanoscopic element stack having a plurality of nanoscopic elements arranged in direct electrical contact, a first comprising a nanotube fabric and a second comprising a carbon material, a portion of the nanoscopic element stack in electrical contact with the conductive terminal. Control circuitry is provided in electrical communication with and for applying electrical stimulus to the conductive terminal and to at least a portion of the nanoscopic element stack. At least one of the nanoscopic elements is capable of switching among a plurality of electronic states in response to a corresponding electrical stimuli applied by the control circuitry to the conductive terminal and the portion of the nanoscopic element stack. For each electronic state, the nanoscopic element stack provides an electrical pathway of corresponding resistance.

45 Claims, 274 Drawing Sheets

Related U.S. Application Data

9,196,615, which is a continuation-in-part of application No. 11/280,786, filed on Nov. 15, 2005, now Pat. No. 7,781,862, and a continuation-in-part of application No. 11/280,599, filed on Nov. 15, 2005, now Pat. No. 7,394,687, and a continuation-in-part of application No. 11/274,967, filed on Nov. 15, 2005, now Pat. No. 7,479,654.

(60) Provisional application No. 60/679,029, filed on May 9, 2005, provisional application No. 60/692,765, filed on Jun. 22, 2005, provisional application No. 60/692,918, filed on Jun. 22, 2005, provisional application No. 60/692,891, filed on Jun. 22, 2005, provisional application No. 60/836,437, filed on Aug. 8, 2006, provisional application No. 60/836,343, filed on Aug. 8, 2006, provisional application No. 60/840,586, filed on Aug. 28, 2006, provisional application No. 60/855,109, filed on Oct. 27, 2006, provisional application No. 60/918,388, filed on Mar. 16, 2007.

(51) Int. Cl.

| | |
|---|---|
| ***G11C 11/56*** | (2006.01) |
| ***G11C 13/00*** | (2006.01) |
| ***G11C 13/02*** | (2006.01) |
| ***H01L 27/102*** | (2006.01) |
| ***H01L 29/12*** | (2006.01) |
| ***H01L 29/16*** | (2006.01) |
| ***H01L 51/00*** | (2006.01) |
| *H01L 21/822* | (2006.01) |
| *H01L 23/525* | (2006.01) |
| *H01L 27/06* | (2006.01) |
| *H01L 27/12* | (2006.01) |

(52) U.S. Cl.

CPC ......... *G11C 13/003* (2013.01); *G11C 13/0069* (2013.01); *G11C 13/025* (2013.01); *H01L 27/1021* (2013.01); *H01L 29/0673* (2013.01); *H01L 29/0676* (2013.01); *H01L 29/125* (2013.01); *H01L 29/1606* (2013.01); *H01L 51/0048* (2013.01); *G11C 2013/009* (2013.01); *G11C 2213/19* (2013.01); *G11C 2213/35* (2013.01); *G11C 2213/71* (2013.01); *G11C 2213/72* (2013.01); *G11C 2213/75* (2013.01); *G11C 2213/79* (2013.01); *H01L 21/8221* (2013.01); *H01L 23/5256* (2013.01); *H01L 27/0688* (2013.01); *H01L 27/1203* (2013.01); *H01L 2924/0002* (2013.01); *H01L 2924/00011* (2013.01)

(56) References Cited

U.S. PATENT DOCUMENTS

| | | | | |
|---|---|---|---|---|
| 4,442,507 | A | 4/1984 | Roesner et al. | |
| 4,845,533 | A * | 7/1989 | Pryor et al. | 257/4 |
| 4,916,087 | A | 4/1990 | Tateoka et al. | |
| 4,944,836 | A | 7/1990 | Beyer et al. | |
| 5,096,849 | A | 3/1992 | Beilstein et al. | |
| 5,536,968 | A | 7/1996 | Crafts et al. | |
| 5,546,349 | A | 8/1996 | Watanabe et al. | |
| 5,670,803 | A | 9/1997 | Beilstein et al. | |
| 6,057,637 | A | 5/2000 | Zettl et al. | |
| 6,256,767 | B1 | 7/2001 | Kuekes et al. | |
| 6,277,318 | B1 | 8/2001 | Bower et al. | |
| 6,314,019 | B1 | 11/2001 | Kuekes et al. | |
| 6,342,276 | B1 | 1/2002 | You et al. | |
| 6,422,450 | B1 | 7/2002 | Zhou | |
| 6,423,583 | B1 | 7/2002 | Avouris | |
| 6,445,006 | B1 | 9/2002 | Brandes | |
| 6,495,116 | B1 | 12/2002 | Herman | |
| 6,495,258 | B1 | 12/2002 | Chen et al. | |
| 6,515,339 | B2 | 2/2003 | Shin et al. | |
| 6,528,020 | B1 | 3/2003 | Dai et al. | |
| 6,548,841 | B2 | 4/2003 | Frazier | |
| 6,574,130 | B2 * | 6/2003 | Segal et al. | 365/129 |
| 6,574,763 | B1 | 6/2003 | Bertin et al. | |
| 6,630,772 | B1 | 10/2003 | Bower et al. | |
| 6,643,165 | B2 | 11/2003 | Segal et al. | |
| 6,645,628 | B2 | 11/2003 | Shiffler, Jr. et al. | |
| 6,706,402 | B2 | 3/2004 | Rueckes et al. | |
| 6,707,098 | B2 | 3/2004 | Hofmann | |
| 6,759,693 | B2 | 7/2004 | Vogeli | |
| 6,784,028 | B2 | 8/2004 | Rueckes et al. | |
| 6,803,840 | B2 | 10/2004 | Hunt | |
| 6,808,746 | B1 | 10/2004 | Dai | |
| 6,833,558 | B2 | 12/2004 | Lee et al. | |
| 6,835,591 | B2 | 12/2004 | Rueckes et al. | |
| 6,858,197 | B1 | 2/2005 | Delzeit | |
| 6,863,942 | B2 | 3/2005 | Ren et al. | |
| 6,894,359 | B2 | 5/2005 | Bradley et al. | |
| 6,911,682 | B2 | 6/2005 | Rueckes et al. | |
| 6,918,284 | B2 | 7/2005 | Snow et al. | |
| 6,919,592 | B2 | 7/2005 | Segal et al. | |
| 6,919,740 | B2 | 7/2005 | Snider | |
| 6,921,575 | B2 | 7/2005 | Horiuchi et al. | |
| 6,924,538 | B2 | 8/2005 | Jaiprakash et al. | |
| 6,946,410 | B2 | 9/2005 | French et al. | |
| 7,015,500 | B2 | 3/2006 | Choi et al. | |
| 7,097,906 | B2 | 8/2006 | Gardner | |
| 7,115,901 | B2 | 10/2006 | Bertin et al. | |
| 7,132,841 | B1 | 11/2006 | Bertin et al. | |
| 7,161,403 | B2 | 1/2007 | Bertin et al. | |
| 7,336,523 | B2 * | 2/2008 | Kang | 365/151 |
| 7,394,687 | B2 | 7/2008 | Bertin et al. | |
| 7,416,993 | B2 | 8/2008 | Segal et al. | |
| 7,667,999 | B2 | 2/2010 | Herner et al. | |
| 7,982,209 | B2 | 7/2011 | Herner et al. | |
| 2001/0004979 | A1 | 6/2001 | Han et al. | |
| 2001/0023986 | A1 | 9/2001 | Mancevski | |
| 2002/0160111 | A1 | 10/2002 | Sun et al. | |
| 2002/0175390 | A1 | 11/2002 | Goldstein | |
| 2003/0004058 | A1 | 1/2003 | Li et al. | |
| 2003/0122111 | A1 | 7/2003 | Glatkowski | |
| 2003/0177450 | A1 | 9/2003 | Nugent | |
| 2003/0200521 | A1 | 10/2003 | DeHon | |
| 2004/0005723 | A1 | 1/2004 | Empedocles et al. | |
| 2004/0007528 | A1 | 1/2004 | Bakajin et al. | |
| 2004/0023253 | A1 | 2/2004 | Kunwar et al. | |
| 2004/0026629 | A1 * | 2/2004 | Fujieda et al. | 250/423 R |
| 2004/0031975 | A1 | 2/2004 | Kern | |
| 2004/0041154 | A1 | 3/2004 | Watanabe et al. | |
| 2004/0071949 | A1 | 4/2004 | Glatkowski et al. | |
| 2004/0099438 | A1 | 5/2004 | Arthur et al. | |
| 2004/0104129 | A1 | 6/2004 | Gu et al. | |
| 2004/0181630 | A1 | 9/2004 | Jaiprakash et al. | |
| 2004/0253167 | A1 | 12/2004 | Silva et al. | |
| 2004/0265550 | A1 | 12/2004 | Glatkowski | |
| 2005/0030810 | A1 * | 2/2005 | Shepard | 365/222 |
| 2005/0053525 | A1 | 3/2005 | Segal | |
| 2005/0095938 | A1 | 5/2005 | Rosenberger et al. | |
| 2005/0243595 | A1 * | 11/2005 | Rinerson et al. | 365/148 |
| 2006/0029537 | A1 | 2/2006 | Zhang | |
| 2006/0094168 | A1 | 5/2006 | Hoffman | |
| 2006/0193093 | A1 | 8/2006 | Bertin et al. | |
| 2006/0237537 | A1 | 10/2006 | Empedocles et al. | |
| 2006/0250843 | A1 | 11/2006 | Bertin et al. | |
| 2006/0250856 | A1 | 11/2006 | Bertin et al. | |
| 2006/0258122 | A1 | 11/2006 | Whitefield et al. | |
| 2006/0264053 | A1 | 11/2006 | Yates | |
| 2006/0276056 | A1 | 12/2006 | Ward | |
| 2006/0281256 | A1 | 12/2006 | Carter et al. | |
| 2006/0281287 | A1 | 12/2006 | Yates et al. | |
| 2006/0292716 | A1 | 12/2006 | Gu et al. | |
| 2007/0004191 | A1 | 1/2007 | Gu et al. | |
| 2008/0012047 | A1 | 1/2008 | Bertin | |
| 2008/0066802 | A1 | 3/2008 | Reddy | |
| 2008/0070162 | A1 * | 3/2008 | Ufert | 430/290 |
| 2008/0142850 | A1 | 6/2008 | Bertin | |

(56) References Cited

U.S. PATENT DOCUMENTS

| | | | | |
|---|---|---|---|---|
| 2008/0159042 | A1 | 7/2008 | Bertin | |
| 2008/0239790 | A1* | 10/2008 | Herner et al. | 365/151 |
| 2008/0299307 | A1 | 12/2008 | Ward | |
| 2009/0166609 | A1 | 7/2009 | Schricker et al. | |
| 2009/0166610 | A1* | 7/2009 | Schricker et al. | 257/40 |
| 2009/0168491 | A1 | 7/2009 | Schricker et al. | |

FOREIGN PATENT DOCUMENTS

| | | | |
|---|---|---|---|
| JP | 2000-203821 | | 7/2000 |
| JP | 2001-035362 | A2 | 2/2001 |
| JP | 2004-090208 | A2 | 3/2004 |
| WO | WO-98/39250 | A1 | 9/1998 |
| WO | WO-99/65821 | A1 | 12/1999 |
| WO | WO-00/48195 | | 8/2000 |
| WO | WO-01/03208 | | 1/2001 |
| WO | WO-0245113 | A2 | 6/2002 |
| WO | WO-0248701 | A2 | 6/2002 |
| WO | WO-03/016901 | A1 | 2/2003 |
| WO | WO-03/034142 | A1 | 4/2003 |

OTHER PUBLICATIONS

Avouris, P., et al., "Carbon Nanotube Electronics," Chemical Physics, 2002, vol. 284, pp. 429-445.

Bachtold, A., et al., "Logic circuits cased on carbon nanotubes," *Physica E,* 2003, vol. 16, pp. 42-46.

Huang, Y., et al,, "Logic Gates and Computation from Assembled Nanowire Building Blocks," *Science,* Nov. 9, 2001, vol. 294, pp. 1313-1316.

Javey, A., et al., "Carbon Nanotube Transistor Arrays for Multistage Complementary Logic and Ring Oscillators," *Nano Letters,* 2002, vol. 2 , No. 9, pp. 929-932.

Rueckes, et al., "Carbon nanotube-based nonvolatile random access memory for molecular computing", *Science,* vol. 289, pp. 94-97, Jul. 7, 2000.

Valentini, L. et al., "Sensors for Sub-ppm $NO_2$ Gas Detection Based on Carbon Nanotube Thin Films," *Applied Physics Letters,* 2003, vol. 82(6), pp. 961-963.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

International Search Report, International Searching Authority, for International Application PCT/US05/18539, mailed Sep. 18, 2006, 4 pages.

International Search Authority, International Search Report for PCT/US2005/045316 mailed Sep. 6, 2006, 2 pages.

Chiang et al., "Purification and Charactirization of Single-Wall Carbon Nanotubes,", *J. Phys. Chem B.,* vol. 105, pp. 1157-1161 (2001).

Haddon et al.,"Purification and Separation of Carbon Nanotubes," *MRS Bulletin,* , pp. 252-259, Apr. 2004.

Onoa et al., "Bulk Production of singly dispersed carbon nanotubes with prescriped lengths", *Nanotechnology,* vol. 16, pp. 2799-2803, 2005.

Desai et al., "Frestanding Carbon Nanotube Specimen Fabrication," Proc. of 2005, 5th IEEE Conf. nanotech, Nagoya, Japan, Jul. 2005, pp. 1-4.

Kong, J. et al., "Quantum Interference and Ballistic Transmission in Nanotube Electron Waveguides", *The American Physical Society,* vol. 87, No. 10, pp. 106801-1-106801-4, Sep. 3, 2001.

Chen, J. et al., "Self-aligned carbon nanotube transistors with charge transfer doping", *Applied Physics Letters,* vol. 86, pp. 123108-1-123108-3, 2005.

Chen, J. et al., "Self-aligned Carbon Nanotube Transistors with Novel Chemical Doping", *IEDM,* pp. 29.4.1-29.4.4, 2004.

Derycke, V. et al., "Controlling doping and carrier injection in carbon nanotube transistors", *Applied Physics Letters,* vol. 80, No. 15, pp. 2773-2775, Apr. 15, 2002.

Wind, S. J. et al., "Vertical scaling of carbon nanotube field-effect transistors using top gate electrodes", *Applied Physics Letters,* vol. 80, No. 20, pp. 3817-3819, May 20, 2002.

Lin, Y.M. et al., "Novel Carbon Nanotube FET Design with Tunable Polarity", *IEDM,* pp. 29.2.1-29.2.4, 2004.

Javey, A. et al., "High-k dielectrics for advanced carbon-nanotube transistors and logic gates", *Nature Materials,* vol. 1, pp. 241-246, Dec. 2002.

Li, J. et al., "Carbon Nanotube Nanoelectrode Array for Ultrasensitive DNA Detection", Nano Letters, vol. 3, No. 5, pp. 597-602, 2003.

Parikh, K. et al., "Flexible vapour sensors using single walled carbon nanotubes", Sensors and Actuators B, vol. 113, pp. 55-63, 2006.

Ajayan, P. M. et al., "Applications of Carbon Nanotubes", Carbon Nanotubes, vol. 80, pp. 391-425, 2001.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Dai, H. et al., "Controlled Chemical Routes to Nanotube Artchitectures, Physics, and Devices", J. Phys. Chem. B, vol. 103, pp. 1126-11255, 1999.

Franklin, N. R. et al., "An Enhanced CVD Approach to Extensive Nanotube Networks with Directionality", Advanced Materials, 5 pages, 2000.

Hafner, J. H. et al., "Catalytic growth of single-wall carbon nanotubes from metal particles", Chemical Physics Letters, vol. 296, pp. 195-202, Oct. 30, 1998.

Joselevich, E., "Vectorial Growth of Metallic and Semiconducting Single-Wall Carbon Nanotubes", Nano Letters, vol. 0, No. 0, A-E, 2002.

Kong, J. et al., "Chemical vapor deposition of methane for single-walled carbon nanotubes", Chemical Physics Letters, pp. 567-574, Aug. 14, 1998.

Li, Y. et al., "Preparation of Monodispersed Fe—Mo Nanoparticles as the Catalyst for CVD Synthesis of Carbon Nanotubes", Chem. Mater., vol. 13. pp. 1008-1014, 2001.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Nerushev, O. A., et al., "Carbon nanotube films obtained by thermal chemical vapour deposition", J. Mater. Chem., vol. 11, pp. 1122-1132, 2001.

Peigney, M. et al., "A Study of the Formation of Single- and Double-Walled Carbon Nanotubes by a CVD Method", J. Phys. Chem. B., vol. 105, pp. 9699-9710, 2001.

Sotiropoulou, S. et al., "Carbon nanotube array-based biosensor", Anal. Bioanal. Chem, vol. 375, pp. 103-105, 2003.

Zhao, Y. P. et al., Frequency-dependent electrical transport in carbon nanotubes, Physical Review B., vol. 64, pp. 201402-1 to 201402-4, 2001.

Zhang, Z. et al.,"Select Pathways to Carbon Nanotube Film Growth", Advanced Materials, 4 pages, Jun. 19, 2001.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-91, 2002.

Zhang, Y. et al., "Metal coating on suspended carbon Nanotubes and its implication to metal-tube interaction", Chemical Physics Letters, vol. 331, pp. 35-41, 2000.

Khan et al, "Solubilization of Oxidized Single-Walled Carbon Nanotubes in Organic and aqueous Solvents through Organic Derivation," Nano Letters, vol. 2, No. 11, pp. 1215-1218 (2002).

Banerjee et al., "Functionalization of Carbon Nanotubes with a Metal-Containing Molecular Complex," Nano Letters, vol. 2, No. 1, pp. 49-53 (2002).

(56) References Cited

OTHER PUBLICATIONS

International Search Report and Written Opinion for International Patent Application PCT/US05/18467, mailed Oct. 1, 2007, 5 pages.
Jeong et al., "A new purification method of single-wall carbon nanotubes using H2S and O2 mixture gas," Chemical Physics Letters, vol. 344, pp. 18-22, Aug. 17, 2001.
Shelimov et al., "Purification of single-wall carbon nanotubes by ultrasonically assisted filtration," Chemical Physics Letters, vol. 282, pp. 429-434, Jan. 23, 1998.
Delzeit et al., "Multilayered metal catalysts for controlling the density of single-walled carbon nanotubes growth," Chemical Physics letters, vol. 348, pp. 368-374, Nov. 16, 2001.
Kong et al., "Nanotube Molecular Wires as Chemical Sensors," Science, vol. 287, pp. 622-625, Jan. 28, 2000.
Ago et al., "Workfunction of Purified and Oxidised Carbon Nanotubes," Synthetic Metals, vol. 103, pp. 2494-2495 (1999).
Radosavljevic, M. et al., "Nonvolatile molecular memory elements based on ambipolar nanotube field effect transistors," Nano Letters, 2002, vol. 2(7), 761-764.
Derycke, V. et al. "Carbon Nanotube Inter-and Intramolecular Logic Gates." Nano Letters, vol. 1, pp. 453-456, Sep. 2001.
Duan, Xiangfeng, Nonvolatile Memory and Programmable Logic from Molecule-Gated Nanowires, Nano Letters, Mar. 2002, pp. 1-4.
Heinze, S., "Carbon Nanotubes as Schottky Barrier Transistors," Physical Review Letters, vol. 89, No. 10, pp. 106801-1-106801-4, Sep. 2, 2002.
Wind, S. J., "Fabrication and Electrical Characterization of Top Gate Single-Wall Carbon Nanotube Field-Effect Transistors," IBM T. J. Watson Research Center, May 2002, 14 pgs.
Hone, James. "Phonons and Thermal Properties of Carbon Nanotubes." Topics of Applied Physics (2001); 80, 273-286.
Johnson, R. Colin, "IBM Fellow Unrolls Blueprint for Nano," EETimes Online, Mar. 6, 2006, 3 pages.
Langer, L. et al., "Electrical Resistance of a Carbon Nanotube Bundle," J. Mater. Res. vol. 9, No. 4, Apr. 1994, 6 pages.
Niu, Chunming et al., "High Power Electrochemical Capacitors Based on Carbon Nanotube Electrodes," Appl. Phys. Letter 70, Mar. 17, 1997, pp. 1480-1482.
Awano, et al., "Graphene for VLSI: FET and Interconnect Applications," IEDM 2009 Technical Digest, pp. 10.1.1-10.1.4.
Baker, et al., "CMOS Circuit Design, Layout, and Simulation," IEEE Press, 1998, pp. 168-169.
Brown, K. M. "System in package "The Rebirth of SIP"," 2004 IEEE Custom Integrated Circuits, May 2004, 6 pages.
Crowley, et al., "512 Mb PROM with 8 layers of antifuse/Diode cells," IEEE International Solid-State Circuits Conference, vol. XLVI, Feb. 2003, pp. 284-285.
Frechet, et al., "Thermally Depolymerizable Polycarbonates V. Acid Catalyzed Thermolysis of Allylic and Benzylic Polycarbonates: A New Route to Resist Imaging," Polymer Journal, vol. 19, No. 1, 1987, pp. 31-49.
Huai, Y., "Spin-Transfet MRAM (STT-MTAM): Challenges and Prospects," AAPS Bulletin, vol. 18, No. 6, Dec. 2008, pp. 33-40.
Ito, et al., "Highly Sensitive Thermally Developable, Positive Resist Systems," J. Vac. Sci. Technol. B, vol. 6, No. 6, Nov./Dec. 1988, pp. 2259-2263.
Ito, et al., "Thermally Developable, Positive Resist Systems with High Sensitivity," J. Electrochemical Soc., vol. 136, No. 1, Jan. 1989, pp. 241-245.
Jiang, et al., "Performance Breakthrough in 8nm Gate-All-Around Length Gate-All-Around Nanowire Transistors using Metallic Nanowire Contacts," 2008 Symposium on VLSI Technology Digest of Technical Papers, pp. 34-35.
Kianian, et al., "A 3D Stackable Carbon Nanotube-based Nonvolatile Memory (NRAM)," ESSDERC, Nantero Inc., Jun. 14, 2010, 4 pages.
Ng, "Complete Guide to Semiconductor Devices," $2^{nd}$ Edition, John Wiley and Sons, 2002, pp. 11-23, 24-41, 396-407.
Ryan, J. G., et al., "The evolution of interconnection technology at IBM," Journal of Research and Development, vol. 39, No. 4, Jul. 1995, pp. 371-381.
Servalli, G., "A 45nm Generation Phase Change Memory Technology," IEDM 2009 Technical Digest, pp. 5.7.1-5.7.4.
Thanawala, et al., "Reduction in the Effective Dielectric Constant of Integrated Interconnect Structures through an All-Spin-On Strategy," Honeywell Electronic Materials, Honeywell International Inc., Sunnyvale, California 94089, 6 pages.
Treffonas, P.T., Organosilane High Polymers: Synthesis of Formable Homopolymers, Polym. Sci., Polym Letters Edition, 1983, vol. 21, No. 10, pp. 819-822.
West, et al., "Phenylmethylpolysilanes: Formable Silane Copolymers with Potential Semiconducting Properties," J. Am. Chem. Soc., 1981, 103, pp. 7352-7354.

* cited by examiner

CIRCUIT OPERATION WAVEFORMS FOR NANOTUBE DIODE (NV NT DIODE)

5700A'
5710'
5720'
5715'

5700B'
5730'
5740'
5735'

5700C
5750
5760
5755

5700A
5710
5720
5715

5700B
5730
5740
5735

6100

6V x 6V x 100

6V x (6V x 5) x 100

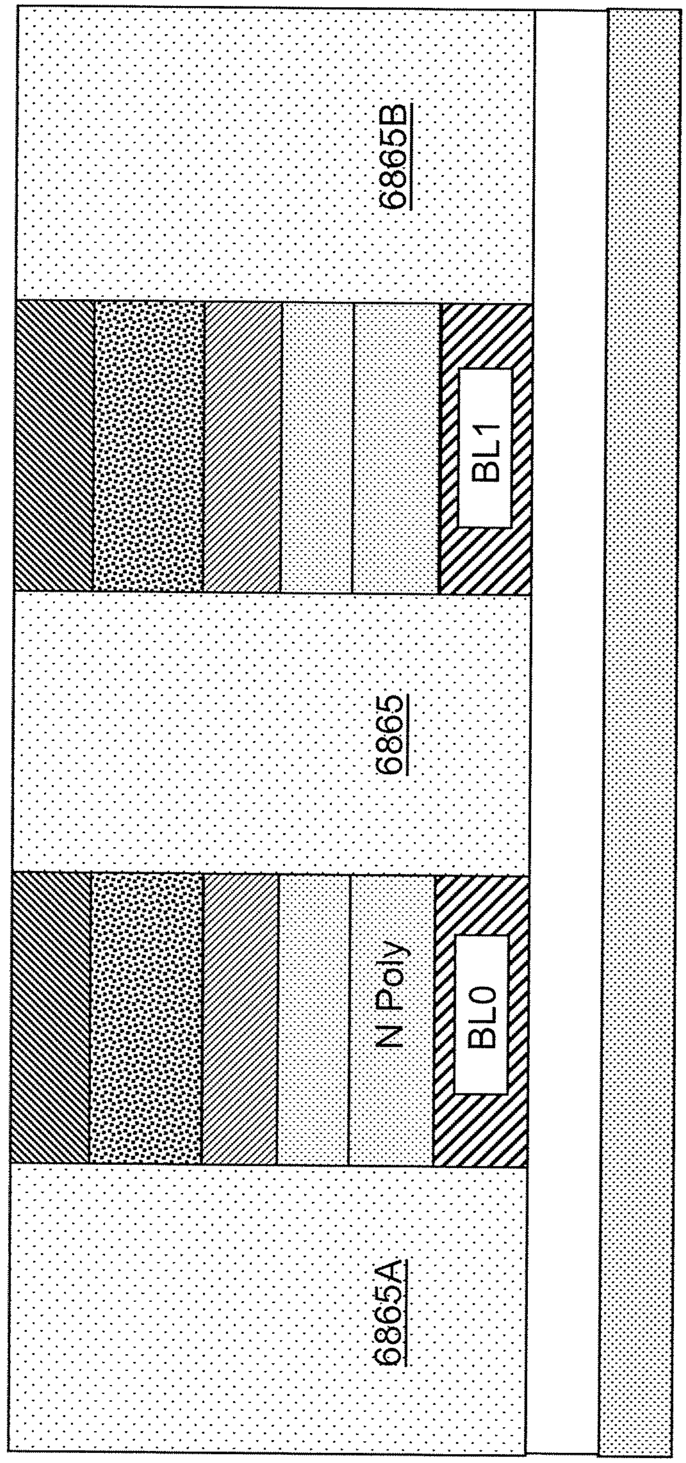
Figure 68E
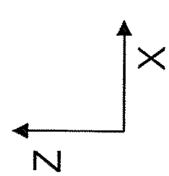

| Additional Nanoscopic Particle Characteristics | | Composite Article |
|---|---|---|
| **Passive** | **Active** | **States** |
| Electrically nonconductive | Electrically conductive | Electrically conductive as-deposited |
| | Electrically non-conductive | Electrically non-conductive as-deposited |
| | Switchable between electrically conductive & nonconductive | Insitu-activated (i.e.: voltage &/or current for a short time such as 100's of milliseconds) |
| | | In Operation: Electrically conductive paths form & un-form with applied voltage &/or current |

Figure 84A

| **Nanoscopic Carbon Type:**<br>Additional nanoscopic material may include one or more: | **Structure** | **Electrical and Thermal Characteristics** |
|---|---|---|
| Graphite | Short range order | Conducts:<br>-Thermally<br>- Electrically |
| Diamond | Short range order | Conducts:<br>Thermally |
| Amorphous Carbon | No short range order | No conduction |
| Buckminster-fullerenes ex.: C60, C70, C540 | Short range order | Conducts:<br>- Thermally<br>- Electrically |
| Carbon nanotubes of various types:<br>- Metallic<br>- Semiconducting<br>- Single-wall<br>- Multi-wall | Short range order | Conducts:<br>- Thermally<br>- Electrically |

Figure 84B 8601 8602 8603 8604 8605

| NV NT Switch | Element or Block | First Contact | Second Contact | Composite Switching Element |
|---|---|---|---|---|
| (1) 5600A _2D Horiz. | 5602A_Element | Top | Top | 8350 |
| (2) 5600B_2D Horiz. | 5602B_Element | Bottom | Bottom | 8350 |
| (3) 5600C_2D, Horiz. | 5602C_Element | Top | Bottom | 8350 |
| (4) 5602D_3D, Horiz. | 5602D_Block | Top & Sides & End | Top & Sides & End | 8350 |
| (5) 5600E_3D, Block | 5620_Block | End | End | 8350 |
| (6) 5600F_3D, Block | 5630_Block | Top & End | Bottom | 8350 |
| (7) 5700A_3D, Block | 5710_Block | Top | Bottom | 8350 |
| (8) 5700A'_3D, Block Cylindrical | 5710'_Block | Top | Bottom | 8350 |
| (9) 5700C_Block & Perf. Enh. Material | 5750_Block | Top | Bottom | 8350 Carbon Perf. Enh. Material |
| (10) 8100_3D, Trace | 8110_Trace | Top_Shared | Bottom | 8350 |
| (11) 8200_3D, Plane | 8210_Plane | Top_Shared | Bottom_Shared | 8350 |

| | RESET of typical NP:CNT article | SET of typical NP:CNT article |
|---|---|---|
| **Pulse Voltage** | ~4.0 V | ~5.0 V |
| **Rise/Fall Duration of Pulses** | ~1.8 ns | ~1 µs |
| **Pulse Width** | ~50 ns | ~50 µs |
| **Current After Function** | Current after RESET is less than ~100 nA | Current after SET is more than ~1 µA. |

Figure 88

| | **RESET of typical nanoscopic element stack** | **SET of typical nanoscopic element stack** |
|---|---|---|
| **Pulse Voltage** | ~4.0 V | ~4.5 V |
| **Rise/Fall Duration of Pulses** | ~1.8 ns | ~1 μs |
| **Pulse Width** | ~50 ns | ~50 μs |
| **Current After Function** | Current after RESET is less than ~100 nA | Current after SET is more than ~1 μA. |

Figure 94

| Item # | Nanoscopic Element Stacks*; & Correspond. NV NT Switches | Example Methods | | | | | | | | |
|---|---|---|---|---|---|---|---|---|---|---|
| | | 10420 | 10430 | 10440 | 10450 | 10455 | 10460 | 10470 | 10475 | 10480 |
| 1 | 9650A | | | X | X | | | | | |
| | 9600A | X | | X | X | | | X | X | |
| 2 | 9650B | | X | X | | | | | | |
| | 9600B | X | X | X | | | | X | X | |
| 3 | 9650D | | X | X | | | X | | | |
| | 9600D | X | X | X | | | X | X | X | |
| 4 | 9650E | | | X | | | X | | | |
| | 9600E | X | | X | | | X | X | X | |
| 5 | 5700B | | | X | | X | | | | X |
| | 5700B' | X | | X | | | | X | X | |
| 6 | 9750A | | | O | X | | | | | |
| | 9700A | X | | O | X | | | X | X | |

• Nanoscopic Element Stack for items 1,2,5,6
• Nanoscopic Element Stack for items 3,4

NONVOLATILE NANOTUBE DIODES AND NONVOLATILE NANOTUBE BLOCKS AND SYSTEMS USING SAME AND METHODS OF MAKING SAME

CROSS REFERENCE TO RELATED APPLICATIONS

This application is a continuation in part of and claims priority under 35 USC. §120 to U.S. patent application Ser. No. 12/273,807 entitled Nonvolatile Nanotube Diodes and Nonvolatile Nanotube Blocks and Systems Using Same and Methods of Making Same, filed Nov. 19, 2008 which is a continuation-in-part of and claims priority under 35 USC. §120 to U.S. patent application Ser. No. 11/835,865 entitled Nonvolatile Nanotube Diodes and Nonvolatile Nanotube Blocks and Systems Using Same and Methods of Making Same, filed Aug. 8, 2007 which is a continuation-in-part of and claims priority to the following applications, the entire contents of which are incorporated by reference:

U.S. patent application Ser. No. 11/280,786, entitled "Two-Terminal Nanotube Devices And Systems And Methods Of Making Same," filed Nov. 15, 2005; and U.S. patent application Ser. No. 11/274,967, entitled "Memory Arrays Using Nanotube Articles With Reprogrammable Resistance," filed Nov. 15, 2005; and This application is related to the following applications, the entire contents of which are incorporated by reference:

U.S. patent application Ser. No. 11/280,599, entitled "Non-Volatile Shadow Latch Using A Nanotube Switch," filed Nov. 15, 2005.

U.S. patent application Ser. No. 11/835,612, entitled "Nonvolatile Resistive Memories Having Scalable Two-Terminal Nanotube Switches," filed Aug. 8, 2007;

U.S. patent application Ser. No. 11/835,583, entitled "Latch Circuits and Operation Circuits Having Scalable Nonvolatile Nanotube Switches as Electronic Fuse Replacement Elements," filed Aug. 8, 2007;

U.S. patent application Ser. No. 11/835,651, entitled "Nonvolatile Nanotube Diodes and Nonvolatile Nanotube Blocks and Systems Using Same and Methods of Making Same," filed Aug. 8, 2007;

U.S. patent application Ser. No. 11/835,759, entitled "Nonvolatile Nanotube Diodes and Nonvolatile Nanotube Blocks and Systems Using Same and Methods of Making Same," filed Aug. 8, 2007;

U.S. patent application Ser. No. 11/835,845, entitled "Nonvolatile Nanotube Diodes and Nonvolatile Nanotube Blocks and Systems Using Same and Methods of Making Same," filed Aug. 8, 2007;

U.S. patent application Ser. No. 11/835,852, entitled "Nonvolatile Nanotube Diodes and Nonvolatile Nanotube Blocks and Systems Using Same and Methods of Making Same," filed Aug. 8, 2007;

U.S. patent application Ser. No. 11/835,856, entitled "Nonvolatile Nanotube Diodes and Nonvolatile Nanotube Blocks and Systems Using Same and Methods of Making Same," filed Aug. 8, 2007;

U.S. patent application Ser. No. 12/195,675, entitled "Patterned Nanoscopic Articles and Methods of Making Same," filed Aug. 21, 2008; and U.S. Provisional Patent Application No. 61/074,241, entitled "NRAM Arrays with Nanotube Blocks, Nanotube Traces, and Nanotube Planes and Methods of Making Same," filed Jun. 20, 2008.

TECHNICAL FIELD

The present invention relates to nonvolatile switching devices having nanotube components and methods of forming such devices.

DISCUSSION OF RELATED ART

There is an ever-increasing demand for ever-denser memories that enable larger memory functions, both stand alone and embedded, ranging from 100's of kbits to memories in excess of 1 Gbit. These required larger memories at increasingly higher densities, sold in increasing volumes, and at lower cost per bit, are challenging the semiconductor industry to rapidly improve geometries and process features. For example, such demands drive photolithography technology to smaller line and spacing dimensions with corresponding improved alignment between layers, improved process features/structures such as smaller transistors and storage elements, but also including increased chip size required to accommodate larger memory function, or combined memory and logic function. Sensitivity to smaller defect size increases due to the smaller geometries, while overall defect densities must be significantly reduced.

When transitioning to a new denser technology node, lithography and corresponding process changes typically result in insulator and conductor dimensional reduction of 0.7× in the X and Y directions, or an area reduction of 2× for logic circuits and memory support circuits. Process features unique to the memory cell are typically added, resulting in an additional typical 0.7× area reduction beyond the area reduction resulting from photolithographic improvements, such that the memory cell achieves a cell area reduction of approximately 2.8×. In DRAMs, for example, a process feature change such as a buried trench or stacked storage capacitor is introduced with corresponding optimized cell contact means between one capacitor plate and the source of a cell select FET formed in the semiconductor substrate. The tradeoffs described with respect to DRAM memories are similar to those for other memory types such as EPROM, EEPROM, and Flash.

Memory efficiency is determined by comparing the bit storage area and the corresponding overhead of the support circuit area. Support circuit area is minimized with respect to array storage area. For 2-D memories, that is memories in which a cell select transistor is formed in a semiconductor substrate, for a transition to a denser new technology node (technology generation) the bit area may be reduced by more than the support circuit area as illustrated further above with respect to a memory example where the bit area is reduced by 2.8× while the support circuit area is reduced by 2×. In order to preserve memory efficiency, memory architecture may be changed such that larger sub-arrays are fabricated, that is sub-arrays with more bits per word line and more bits per bit line. In order continue to improve memory performance while containing power dissipation, new memory architectures use global and local (segmented) word line and global and local (segmented) bit line architectures to accommodate larger sub-arrays with more bits per word and bit lines as described for example in U.S. Pat. No. 5,546,349, the entire contents of which are incorporated herein by reference.

In addition to the growth in memory sub-array size, chip area may grow as well. For example, if the memory function at a new technology node is to have 4× more bits, then if the bit area reduction is 2.8×, chip area growth will be at least 1.4-1.5×.

Continuing with the memory example described further above, if the chip area of a memory at the present technology node is 60% bit area array and 40% support circuit area, then if chip architecture is not changed, and if bit area efficiency for a new technology node is improved by 2.8× while support circuit layout is improved by 2×, then bit area and support circuit areas will both be approximately 50% of chip area. Architecture changes and circuit design and layout improvements to increase the number of bits per word and bit lines, such as global and local segmented word and bit lines described in U.S. Pat. No. 5,546,349, may be used to achieve 60% bit area and 40% support circuits for a new 4× larger memory function chip design at a new technology node. However, the chip area will be 1.4× to 1.5× larger for the 4× the memory function. So for example, if the present chip area is 100 $mm^2$, then the new chip area for a 4× larger memory will be 140 to 150 $mm^2$; if the present chip area is 70 $mm^2$, then the new chip area for a 4× larger memory function will be at least 100 $mm^2$.

From a fabrication (manufacturing) point of view, transition to high volume production of a new 4× larger memory function at a new technology node does not occur until the cost per bit of the new memory function is competitive with that of the present generation. Typically, at least two and sometimes three new chips are designed with incremental reductions in photolithographic linear dimensions (shrinks) of 10 to 15% each, reducing chip area of the 4× memory function to 100 $mm^2$ or less to increase the number of chips per wafer and reduce the cost per bit of memory to levels competitive with the present generation memory.

Crafts et al., U.S. Pat. No. 5,536,968, the entire contents of which are incorporated herein by reference, discloses a OTP field-programmable memory having a cell formed by a diode in series with a nonvolatile OTP element, in this patent a polysilicon fuse element. Each cell includes an as-formed polysilicon fuse of typically 100s of Ohms and a series select diode. The memory array is a 2-D memory array with a long folded narrow polyfuse element. If selected, milli-Amperes of current blow a selected polysilicon fuse which becomes nonconducting. The storage cell is large because of large polysilicon fuse dimensions, so the OTP memory described in U.S. Pat. No. 5,536,968 does not address the memory scaling problems describe further above.

Roesner, U.S. Pat. No. 4,442,507, the entire contents of which are incorporated herein by reference, discloses a one-time-programmable (OTP) field-programmable memory using a 3-dimensional (3-D) memory cell and corresponding process, design, and architecture to replace the 2-dimensional (2-D) memory approach of increasing chip area while reducing individual component size (transistors) and interconnections for each new generation of memory. U.S. Pat. No. 4,442,507 illustrates an EPROM (one-time-programmable) memory having a 3-D EPROM array in which cell select devices, storage devices, and interconnect means are not fabricated in or on a semiconductor substrate, but are instead formed on an insulating layer above support circuits formed in and on a semiconductor substrate with interconnections between support circuits and the 3-D EPROM memory array. Such a 3-D memory approach significantly reduces lithographic and process requirements associated with denser larger memory function.

3-D EPROM prior art array 100 illustrated in FIG. 1 is a representation of a prior art corresponding structure in U.S. Pat. No. 4,442,507. The memory cell includes a vertically-oriented Schottky diode in series with an antifuse formed above the Schottky diode using lightly doped polysilicon. Support circuits and interconnections 110 are formed in and on supporting semiconductor substrate 105, silicon for example. Interconnections through insulator 115 (not shown in FIG. 1) are used to connect support circuits to array lines such as conductor 120 and conductor 170. Memory cells are fabricated on the surface of insulator 115, include Schottky diode 142, antifuse 155, and interconnected by combined conductor 120 and N+ polysilicon conductor 122, and metal conductor 170 and conductive barrier layer 160. Note that although the surface of insulator 115 is illustrated as if planar, in fact it is non-planar as illustrated in more detail in U.S. Pat. No. 4,442,507 because VLSI planarization techniques were not available at the time of the invention.

N+ polysilicon patterned layer semiconductor 122 is used as one Schottky diode 142 contact and as an array interconnect line. N+ polysilicon semiconductor 122 may be silicon or germanium, for example, and is typically doped to $10^{20}$ dopant atoms/$cm^3$ with a resistance of 0.04 Ohms/square. While semiconductor 122 may be used as an array line, a lower resistance array line may be formed by depositing N+ polysilicon semiconductor 122 on a molybdenum silicide conductor 120 between the N+ semiconductor layer and the surface of insulator 115. A second N− polycrystalline silicon or germanium semiconductor patterned layer (semiconductor) 125, in contact with semiconductor 122, is typically doped in the range of $10^{14}$ to $10^{17}$ dopant atoms/$cm^3$, with a resistance of 15 Ohms/square and forms the cathode terminal of Schottky diode 142 which is used as a cell selection device. Dopants may be arsenic, phosphorous, and antimony for example. Polysilicon conductors 122 and 125 are typically 400 nm thick and 2 um in width.

The anode of Schottky diode device 142 is formed by patterned conductor 140 using a noble metal such as platinum of thickness 25 nm deposited on N− polycrystalline silicon conductor 125, and heated to 600 degrees C. to form a compound (e.g. platinum silicide) with the underlying polycrystalline material. The silicide of noble metal 140 and the underlying N− polysilicon semiconductor 125 forms junction 145 of Schottky diode 142. Schottky diode 142 measurements resulted in a turn-on voltage of approximately 0.4 volts and a reverse breakdown voltage of approximately 10 volts.

The nonvolatile state of the memory cell is stored in antifuse 155 as a resistive state. The resistive state of antifuse 155 is alterable (programmable) once (OTP) after the fabrication process is complete. Preferably, the material 150 used to form antifuse 155 is a single element N−semiconductor such as silicon or germanium, typically having a doping of less than $10^{17}$ atoms/$cm^3$, where arsenic and phosphorous are suitable N-type dopants as described further in U.S. Pat. No. 4,442,507. After patterning to form antifuse 155, a conductive barrier layer 160 of TiW 100 nm thick is deposited in contact with antifuse 155 and insulator 130. Then, an 800 nm aluminum layer is deposited and patterned to form conductor 170. Both conductor 170 and conductive barrier layer 160 are patterned. Conductive barrier layer 160 is used to prevent aluminum from migrating into the N− polysilicon material 150.

The resistance of the antifuse is typically $10^7$ ohms as formed. Initially, all antifuses in all cells have a resistance value of approximately $10^7$ ohms as-fabricated. If a cell is selected and programmed such that an antifuse threshold voltage of approximately 10 volts is reached, then the antifuse resistance changes to $10^2$ ohms, with programming current limited to approximately 50 uA, and with programming time in the microsecond range. An antifuse may be programmed only once, and the nonvolatile new lower resistance state stored in a memory cell of the 3-D EPROM memory with the array region above underlying support circuits 110 in and on semiconductor substrate 105.

While U.S. Pat. No. 4,442,507 introduces the concept of 3-D EPROM memory arrays having all cell components and interconnections decoupled from a semiconductor substrate, and above support circuits, the approach is limited to OTP memories.

Prior art FIG. 2 illustrates a fabricated CMOS structure 200 and 200' including devices with a planar local interconnect metal layer and four (metal 1-metal 4) additional more-global planar stacked levels of conductors, and stacked contacts and filled via holes (contact studs) as illustrated the prior art reference Ryan, J. G. et al., "The evolution of interconnection technology at IBM", Journal of Research and Development, Vol. 39, No. 4, July 1995, pp. 371-381, the entire contents of which are incorporated herein by reference. Metal 5 is non-planar and is used to provide off-chip connections. Local interconnects and wiring layers metal 1, metal 2, metal 3, metal 4, and metal 5 may use Al(Cu), W, Mo, Ti, Cu for example. Tight metal pitches require planarization for both metals and oxides and near-vertical, zero overlap via studs typically formed using tungsten (W) as illustrated in FIG. 2. Extensive use of chemical-mechanical polishing (CMP) planarizing technology allows formation of structures 200 and 200'. CMP technology is also illustrated in U.S. Pat. No. 4,944,836, the entire contents of which are incorporated herein by reference, issued Jul. 31, 1990. CMP technology also was chosen for its ability to remove prior level defects.

U.S. Pat. No. 5,670,803, the entire contents of which are incorporated herein by reference, to co-inventor Bertin, discloses a 3-D SRAM array structure with simultaneously defined sidewall dimensions. This structure includes vertical sidewalls simultaneously defined by trenches cutting through multiple layers of doped silicon and insulated regions in order avoid (minimize) multiple alignment steps. These trenches cut through multiple semiconductor and oxide layers and stop on the top surface of a supporting insulator ($SiO_2$) layer between the 3-D SRAM array structure and an underlying semiconductor substrate. U.S. Pat. No. 5,670,803 also teaches in-trench vertical local cell interconnect wiring within a trench region to form a vertically wired 3-D SRAM cell. U.S. Pat. No. 5,670,803 also teaches through-trench vertical interconnect wiring through a trench region to the top surface of a 3-D SRAM storage cell that has been locally wired within a trench cell.

SUMMARY

The present invention provides nonvolatile nanotube diodes and nonvolatile nanotube blocks and systems using same and methods of making same.

Under one aspect, a non-volatile nanotube diode device includes first and second terminals; a semiconductor element including a cathode and an anode, and capable of forming a conductive pathway between the cathode and anode in response to electrical stimulus applied to the first conductive terminal; and a nanotube switching element including a nanotube fabric article in electrical communication with the semiconductive element, the nanotube fabric article disposed between and capable of forming a conductive pathway between the semiconductor element and the second terminal, wherein electrical stimuli on the first and second terminals causes a plurality of logic states.

One or more embodiments include one or more of the following features. In a first logic state of the plurality of logic states a conductive pathway between the first and second terminals is substantially disabled and in a second logic state of the plurality of logic states a conductive pathway between the first and second terminals is enabled. In the first logic state the nanotube article has a relatively high resistance and in the second logic state the nanotube article has a relatively low resistance. The nanotube fabric article includes a non-woven network of unaligned nanotubes. In the second logic state the non-woven network of unaligned nanotubes includes at least one electrically conductive pathway between the semiconductor element and the second terminal. The nanotube fabric article is a multilayered fabric. The nanotube fabric article includes a first plurality of nanotubes and a second plurality of additional nanoscopic material particles. In the second logic state the plurality of nanotubes provides at least one electrically conductive pathway between the semiconductor element and the second terminal. Above a threshold voltage between the first and second terminals, the semiconductor element is capable of flowing current from the anode to the cathode and below the threshold voltage between the first and second terminals the semiconductor element is not capable of flowing current from the anode to the cathode. In the first logic state, the conductive pathway between the anode and the second terminal is disabled. In the second logic state, the conductive pathway between the anode and the second terminal is enabled. A conductive contact interposed between and providing an electrical communication pathway between the nanotube fabric article and the semiconductor element. The first terminal is in electrical communication with the anode and the cathode is in electrical communication with the conductive contact of the nanotube switching element. In the second logic state, the device is capable of carrying electrical current substantially flowing from the first terminal to the second terminal. The first terminal is in electrical communication with the cathode and the anode is in electrical communication with the conductive contact of the nanotube switching element. When in the second logic state, the device is capable of carrying electrical current substantially flowing from the second terminal to the first terminal. The anode includes a conductive material and the cathode includes an n-type semiconductor material. The anode includes a p-type semiconductor material and the cathode includes a n-type semiconductor material.

Under another aspect, a two-terminal non-volatile state device includes: first and second terminals; a semiconductor field effect element having a source, a drain, a gate in electrical communication with one of the source and the drain, and a channel disposed between the source and the drain, the gate capable of controllably forming an electrically conductive pathway in the channel between the source and the drain; a nanotube switching element having a nanotube fabric article and a conductive contact, the nanotube fabric article disposed between and capable of forming an electrically conductive pathway between the conductive contact and the second terminal; wherein the first terminal is in electrical communication with one of the source and the drain, the other of the source and drain is in electrical communication with the conductive contact; and wherein a first set of electrical stimuli on the first and second conductive terminals causes a first logic state and a second set of electrical stimuli on the first and second conductive terminals causes a second logic state.

One or more embodiments include one or more of the following features. The first logic state corresponds to a relatively non-conductive pathway between the first and second terminals and the second logic state corresponds to a conductive pathway between the first and second terminals. The first set of electrical stimuli causes a relatively high resistance state in the nanotube fabric article and the second set of electrical stimuli causes a relatively low resistance state in the nanotube fabric article. The nanotube fabric article includes a non-woven network of unaligned nanotubes. The nanotube fabric article includes a multilayered fabric. In response to the second set of electrical stimuli, the non-woven network of unaligned nanotubes provides at least one electrically conductive pathway between the conductive contact and the semiconductor field-effect element. In response to the second set of electrical stimuli, a conductive pathway between the source and the drain is formed in the conductive channel. The semiconductor field effect element includes a PFET. The semiconductor field effect element includes a NFET. The source of the semiconductor field-effect element is in electrical communication with the first terminal and the drain is in electrical communication with the conductive contact of the nanotube switching element. The drain of the semiconductor field-effect element is in electrical communication with the first terminal and the source of the is in electrical communication with the conductive contact of the nanotube switching element.

Under another aspect, a voltage selection circuit includes: an input voltage source; an output voltage terminal and a reference voltage terminal; a resistive element; and a nonvolatile nanotube diode device including: first and second terminals; a semiconductor element in electrical communication with the first terminal; a nanotube switching element disposed between and capable of conducting electrical stimulus between the semiconductor element and the second terminal; wherein the nonvolatile nanotube diode device is capable of conducting electrical stimulus between the first and second terminals, wherein the resistive element is disposed between the input voltage source and the output voltage terminal, the nonvolatile nanotube diode device is disposed between and in electrical communication with the output voltage terminal and the reference voltage terminal, and wherein the voltage selection circuit is capable of providing a first output voltage level when, in response to electrical stimulus at the input voltage source and the reference voltage terminal, the nonvolatile nanotube diode substantially prevents the conduction of electrical stimulus between the first and second terminals and wherein the voltage selection circuit is capable of providing a second output voltage level when, in response to electrical stimulus at the input voltage source and the reference voltage terminal, the nonvolatile nanotube diode conducts electrical stimulus between the first and second terminals.

One or more embodiments include one or more of the following features. The semiconductor element includes an anode and a cathode, the anode in electrical communication with the first terminal and the cathode in communication with the nanotube switching element. The semiconductor element includes a field effect element having a source region in communication with the first terminal, a drain region in electrical communication with the nanotube switching element, a gate region in electrical communication with one of the source region and the drain region, and a channel region capable of controllably forming and unforming an electrically conductive pathway between the source and the drain in response to electrical stimulus on the gate region. The first output voltage level is substantially equivalent to the input voltage source. The second output voltage level is substantially equivalent to the reference voltage terminal. The nanotube switching element includes a nanotube fabric article capable of a high resistance state and a low resistance state. The high resistance state of the nanotube fabric article is substantially higher than the resistance of the resistive element and wherein the low resistance state of the nanotube fabric article is substantially lower than the resistance of the resistive element. The first output voltage level is determined, in part, by the relative resistance of the resistive element and the high resistance state of the nanotube fabric article, and wherein the second output voltage level is determined, in part, by the relative resistance of the resistive element and the low resistance state of the nanotube fabric article.

Under another aspect, a nonvolatile nanotube diode includes a substrate; a semiconductor element disposed over the substrate, the semiconductor element having an anode and a cathode and capable of forming an electrically conductive pathway between the anode and the cathode; a nanotube switching element disposed over the semiconductor element, the nanotube switching element including a conductive contact and a nanotube fabric element capable of a plurality of resistance states; and a conductive terminal disposed in spaced relation to the conductive contact, wherein the nanotube fabric element is interposed between and in electrical communication with the conductive contact and the conductive contact is in electrical communication with the cathode, and wherein in response to electrical stimuli applied to the anode and the conductive terminal, the nonvolatile nanotube diode is capable of forming an electrically conductive pathway between the anode and the conductive terminal.

One or more embodiments include one or more of the following features. The anode includes a conductor material and the cathode includes a semiconductor material. The anode material includes at least one of Al, Ag, Au, Ca, Co, Cr, Cu, Fe, Ir, Mg, Mo Na, Ni, Os, Pb, Pd, Pt, Rb, Ru, Ti, W, Zn, $CoSi_2$, $MoSi_2$, $Pd_2Si$, PtSi, $RbSi_2$, $TiSi_2$, $WSi_2$ and $ZrSi_2$. The semiconductor element includes a Schottky barrier diode. A second conductive terminal interposed between the substrate and the anode, the second conductive terminal in electrical communication with the anode, wherein in response to electrical stimuli at said second conductive terminal and the conductive terminal, the nonvolatile nanotube diode is capable of forming an electrically conductive pathway between said second conductive terminal and the conductive terminal. The anode includes a semiconductor material of a first type and the cathode region includes a semiconductor material of a second type. The semiconductor material of the first type is positively doped, the semiconductor material of the second type is negatively doped, and the semiconductor element forms a PN junction. The nanotube fabric element is substantially vertically disposed. The nanotube fabric element is substantially horizontally disposed. The nanotube fabric element includes a nonwoven multilayered fabric. The nanotube fabric element has a thickness between approximately 20 nm and approximately 200 nm. The conductive contact is disposed substantially coplanar to a lower surface of the nanotube fabric element and the conductive terminal is disposed substantially coplanar to an upper surface of the nanotube fabric element. The semiconductor element is a field effect transistor.

Under another aspect, a nonvolatile nanotube diode includes a substrate; a conductive terminal disposed over the substrate; a semiconductor element disposed over the conductive terminal, the semiconductor element having a cathode and an anode and capable of forming an electrically conductive pathway between the cathode and the anode; and a nanotube switching element disposed over the semiconductor element, the nanotube switching element including a conductive contact and nanotube fabric element capable of a plurality of resistance states, wherein the nanotube fabric element is interposed between and in electrical communication with anode and the conductive contact and cathode is in electrical communication with the conductive terminal, and wherein in response to electrical stimuli applied to the anode and the conductive terminal, the nonvolatile nanotube diode is capable of forming an electrically conductive pathway between the conductive terminal and the conductive contact.

One or more embodiments include one or more of the following features. The anode includes a conductor material and the cathode includes a semiconductor material. The anode material includes at least one of Al, Ag, Au, Ca, Co, Cr, Cu, Fe, Ir, Mg, Mo Na, Ni, Os, Pb, Pd, Pt, Rb, Ru, Ti, W, Zn, $CoSi_2$, $MoSi_2$, $Pd_2Si$, PtSi, $RbSi_2$, $TiSi_2$, $WSi_2$ and $ZrSi_2$. The semiconductor element includes a Schottky barrier diode. A second conductive terminal interposed between and providing an electrically conductive path between the anode and the patterned region of nonwoven nanotube fabric. The anode includes a semiconductor material of a first type and the cathode region includes a semiconductor material of a second type. The semiconductor material of the first type is positively doped, the semiconductor material of the second type is negatively doped, and the semiconductor element forms a PN junction. The nanotube fabric element is substantially vertically disposed. The nanotube fabric element is substantially horizontally disposed. The nanotube fabric element includes a layer of nonwoven nanotubes having a thickness between approximately 0.5 and approximately 20 nanometers. The nanotube fabric element includes a nonwoven multilayered fabric. The conductive contact is disposed substantially coplanar to a lower surface of the nanotube fabric element and the conductive terminal is disposed substantially coplanar to an upper surface of the nanotube fabric element. The semiconductor element includes a field effect transistor.

Under another aspect, a memory array includes a plurality of word lines; a plurality of bit lines; a plurality of memory cells, each memory cell responsive to electrical stimulus on a word line and on a bit line, each memory cell including: a two-terminal non-volatile nanotube switching device including a first and a second terminal, a semiconductor diode element, and a nanotube fabric article, the semiconductor diode and a nanotube article disposed between and in electrical communication with the first and second terminals, wherein the nanotube fabric article is capable of a plurality of resistance states, and wherein the first terminal is coupled to the one word line and the second terminal is coupled to the one bit line, the electrical stimulus applied to the first and second terminals capable of changing the resistance state of the nanotube fabric article; and a memory operation circuit operably coupled to each bit line of the plurality of bit lines and each word line of the plurality of word lines, said operation circuit capable of selecting each of the cells by activating at least one of the bit line and the word line coupled to that cell to apply a selected electrical stimulus to each of the corresponding first and second terminals, and said operation circuit further capable of detecting a resistance state of the nanotube fabric article of a selected memory cell and adjusting the electrical stimulus applied to each of the corresponding first and second terminals in response to the resistance state to controllably induce a selected resistance state in the nanotube fabric article, wherein the selected resistance state of the nanotube fabric article of each memory cell corresponds to an informational state of said memory cell.

One or more embodiments include one or more of the following features. Each memory cell nonvolatily stores the corresponding information state in response to electrical stimulus applied to each of the corresponding first and second terminals. The semiconductor diode element includes a cathode and an anode, the anode in electrical communication with the second terminal and the cathode in electrical communication with the nanotube switching element. The cathode includes a first semiconductor material and the anode includes a second semiconductor material. The semiconductor diode element includes a cathode and an anode, the cathode in electrical communication with the first terminal and the anode in electrical communication with the nanotube switching element. The cathode includes a first semiconductor material and the anode includes a second semiconductor material. The cathode includes a semiconductor material and the anode includes a conductive material and forms a conductive contact to the nanotube fabric article. A conductive contact interposed between the semiconductor diode element and the nanotube fabric article. The nanotube fabric article includes a network of unaligned nanotubes capable of providing at least one electrically conductive pathway between the first conductive contact and one of the first and second terminals. The nanotube fabric article includes a multilayered nanotube fabric. The multilayered nanotube article has a thickness that defines a spacing between the conductive contact and one of the first and second conductive terminals. The plurality of memory cells includes multiple pairs of stacked memory cells, wherein a first memory cell in each pair of stacked memory cells is disposed above and in electrical communication with a first bit line and the word line is disposed above and in electrical communication with the first memory cell; and wherein a second memory cell in each pair of stacked memory cells is disposed above and in electrical communication with the word line and a second bit line is disposed above and in electrical communication with the second memory cell. The resistance state of the nanotube article in the first memory cell is substantially unaffected by the resistance state of the nanotube article in the second memory cell and the resistance state of the nanotube article in the second memory cell is substantially unaffected by the resistance state of the nanotube article in the first memory cell. The resistance state of the nanotube article in the first memory cell is substantially unaffected by said operation circuit selecting the second memory cell and the resistance state of the nanotube article in the second memory cell is substantially unaffected by the resistance state by said operation circuit selecting the first memory cell. The resistance state of the nanotube article in the first memory cell is substantially unaffected by said operation circuit detecting a resistance state of the nanotube fabric article of the second memory cell and the resistance state of the nanotube article in the second memory cell is substantially unaffected by the resistance state by said operation circuit detecting a resistance state of the nanotube fabric article of the first memory cell. The resistance state of the nanotube article in the first memory cell is substantially unaffected by said operation circuit adjusting the electrical stimulus applied to each of the corresponding first and second terminals of the second memory cell and the resistance state of the nanotube article in the second memory cell is substantially unaffected by the resistance state by said operation circuit adjusting the electrical stimulus applied to each of the corresponding first and second terminals of the first memory cell. An insulating region and a plurality of conductive interconnects wherein the insulating region is disposed over the memory operation circuit, the plurality of memory cells are disposed over the insulating region, and the plurality of conductive interconnects operably couple the memory operation circuit to the plurality of bit lines and plurality of word lines. Adjusting the electrical stimulus includes incrementally changing the voltage applied to each of the corresponding first and second terminals. Incrementally changing the voltage includes applying voltage pulses. Amplitudes of subsequent voltage pulses are incrementally increased by approximately 200 mV. Adjusting the electrical stimulus includes changing the current supplied to at least one of the corresponding first and second terminals. Substantially removing electrical stimulus from the corresponding bit line and word line after controllably inducing the selected resistance state in the nanotube fabric article to substantially preserve the selected resistance state of the nanotube fabric article. Detecting the resistance state of the nanotube fabric article further includes detecting a variation over time of electrical stimulus on a corresponding bit line. Detecting the resistance state of the nanotube fabric article further includes detecting a current flow though a corresponding bit line. In each two terminal nonvolatile nanotube switching device, current is capable of flowing from the second terminal to the first terminal and substantially prevented from flowing from the first terminal to the second terminal. Current is capable of flowing from the second terminal to the first terminal when a threshold voltage is reached by applying electrical stimulus to each of the corresponding first and second terminals. The selected resistance state of the nanotube fabric article of each memory cell includes one of a relatively high resistance state corresponding to a first informational state of said memory cell and a relatively low resistance state corresponding to a second informational state of said memory cell. A third information state of each memory cell corresponds to a state in which current is capable of flowing from the second terminal to the first terminal and wherein a fourth information state of each memory cell corresponds to a state in which current is substantially prevented from flowing from the first terminal to the second terminal. The two-terminal non-volatile nanotube switching device is operable independently of the voltage polarity between the first and second terminals. The two-terminal non-volatile nanotube switching device is operable independently of the direction of current flow between the first and second terminals. The plurality of memory cells includes multiple pairs of stacked memory cells, wherein a first memory cell in each pair of stacked memory cells is disposed above and in electrical communication with a first bit line and the word line is disposed above and in electrical communication with the first memory cell; wherein an insulator material is disposed over the first memory cell; wherein a second memory cell in each pair of stacked memory cells is disposed above and in electrical communication with a second word line, the second word line disposed over the insulator material and wherein a second bit line is disposed above and in electrical communication with the second memory cell. The plurality of memory cells includes multiple pairs of stacked memory cells, wherein a first memory cell in each pair of stacked memory cells is disposed above and in electrical communication with a first bit line and the word line is disposed above and in electrical communication with the first memory cell; wherein an insulator material is disposed over the first memory cell; wherein a second memory cell in each pair of stacked memory cells is disposed above and in electrical communication with a second bit line, the second bit line disposed over the insulator material and wherein a second word line is disposed above and in electrical communication with the second memory cell.

Under another aspect, a method of making a nanotube switch includes: providing a substrate having a first conductive terminal; depositing a multilayer nanotube fabric over the first conductive terminal; and depositing a second conductive terminal over the multilayer nanotube fabric, the nanotube fabric having a thickness, density, and composition selected to prevent direct physical and electrical contact between the first and second conductive terminals.

One or more embodiments include one or more of the following features. Lithographically patterning the first and second conductive terminals and the multilayer nanotube fabric so as to each have substantially the same lateral dimensions. The first and second conductive terminals and the multilayer nanotube fabric each have a substantially circular lateral shape. The first and second conductive terminals and the multilayer nanotube fabric each have a substantially rectangular lateral shape. The first and second conductive terminals and the multilayer nanotube fabric each have lateral dimensions of between about 200 nm×200 nm and about 22 nm×22 nm. The first and second conductive terminals and the multilayer nanotube fabric each have a lateral dimension of between about 22 nm and about 10 nm. The first and second conductive terminals and the multilayer nanotube fabric each have a lateral dimension of less than 10 nm. The multilayer nanotube fabric has a thickness between about 10 nm and about 200 nm. The multilayer nanotube fabric has a thickness between about 10 nm and about 50 nm. The substrate includes a diode under the first conductive terminal, the diode being addressable by control circuitry. Lithographically patterning the first and second conductive terminals, the multilayer nanotube fabric, and the diode so as to each have substantially the same lateral dimensions. Providing a second diode over the second conductive terminal, depositing a third conductive terminal over the second diode, depositing a second multilayer nanotube fabric over the third conductive terminal, and depositing a fourth conductive terminal over the second multilayer nanotube fabric. Lithographically patterning the multilayer nanotube fabrics, the diodes, and the conductive terminals so as to each have substantially the same lateral dimensions. The diode includes a layer of N+ polysilicon, a layer of N polysilicon, and a layer of conductor. The diode includes a layer of N+ polysilicon, a layer of N polysilicon, and a layer of P polysilicon. Providing a diode over the second conductive terminal, the diode being addressable by control circuitry. Annealing the diode at a temperature exceeding 700° C. Lithographically patterning the first and second conductive terminals, the multilayer nanotube fabric, and the diode so as to each have substantially the same lateral dimensions. The substrate includes a semiconductor field effect transistor, at least a portion of which is under the first conductive terminal, the semiconductor field effect transistor being addressable by control circuitry. Depositing the multilayer nanotube fabric includes spraying nanotubes dispersed in a solvent onto the first conductive terminal. Depositing the multilayer nanotube fabric includes spin coating nanotubes dispersed in a solvent onto the first conductive terminal. Depositing the multilayer nanotube fabric includes depositing a mixture of nanotubes and a matrix material dispersed in a solvent onto the first conductive terminal. Removing the matrix material after depositing the second conductive terminal. The matrix material includes polypropylene carbonate. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$. Depositing a porous dielectric material on the multilayer nanotube fabric. The porous dielectric material includes one of a spin-on glass and a spin-on low-κ dielectric. Depositing a nonporous dielectric material on the multilayer nanotube fabric. The nonporous dielectric material includes a high-κ dielectric. The nonporous dielectric material includes hafnium oxide. Providing a word line in electrical communication with the second conductive terminal.

Under another aspect, a method of making a nanotube diode includes: providing a substrate having a first conductive terminal; depositing a multilayer nanotube fabric over the first conductive terminal; depositing a second conductive terminal over the multilayer nanotube fabric, the nanotube fabric having a thickness, density, and composition selected to prevent direct physical and electrical contact between the first and second conductive terminals; and providing a diode in electrical contact with one of the first and second conductive terminals.

One or more embodiments include one or more of the following features. Providing the diode after depositing the multilayer nanotube fabric. Annealing the diode at a temperature exceeding 700° C. Positioning the diode over and in electrical contact with the second conductive terminal. Positioning the diode under and in electrical contact with the first conductive terminal. Lithographically patterning the first and second conductive terminals, the multilayer nanotube fabric, and the diode so as to each have substantially the same lateral dimensions. The first and second conductive terminals, the multilayer nanotube fabric, and the diode each have a substantially circular lateral shape. The first and second conductive terminals, the multilayer nanotube fabric, and the diode each have a substantially rectangular lateral shape. The first and second conductive terminals and the multilayer nanotube fabric each have lateral dimensions of between about 200 nm×200 nm and about 22 nm×22 nm.

Under another aspect, a non-volatile nanotube switch includes a first conductive terminal; a nanotube block including a multilayer nanotube fabric, at least a portion of the nanotube block being positioned over and in contact with at least a portion of the first conductive terminal; a second conductive terminal, at least a portion of the second conductive terminal being positioned over and in contact with at least a portion of the nanotube block, wherein the nanotube block is constructed and arranged to prevent direct physical and electrical contact between the first and second conductive terminals; and control circuitry in electrical communication with and capable of applying electrical stimulus to the first and second conductive terminals, wherein the nanotube block is capable of switching between a plurality of electronic states in response to a corresponding plurality of electrical stimuli applied by the control circuitry to the first and second conductive terminals, and wherein, for each different electronic state of the plurality of electronic states, the nanotube block provides an electrical pathway of corresponding different resistance between the first and second conductive terminals.

One or more embodiments include one or more of the following features. Substantially the entire nanotube block is positioned over substantially the entire first conductive terminal, and wherein substantially the entire second conductive terminal is positioned over substantially the entire nanotube block. The first and second conductive terminals and the nanotube block each have a substantially circular lateral shape. The first and second conductive terminals and the nanotube block each have a substantially rectangular lateral shape. The first and second conductive terminals and the nanotube block each have a lateral dimension between about 200 nm and about 22 nm. The first and second conductive terminals and the nanotube block each have a lateral dimension between about 22 nm and about 10 nm. The first and second conductive terminals and the nanotube block each have lateral dimension of less than about 10 nm. The nanotube block has a thickness between about 10 nm and about 200 nm. The nanotube block has a thickness between about 10 nm and about 50 nm. The control circuitry includes a diode in direct physical contact with the first conductive terminal. The first conductive terminal is positioned over the diode. The diode is positioned over the second conductive terminal. The diode, the nanotube block, and the first and second conductive terminals have substantially the same lateral dimensions. The diode includes a layer of N+ polysilicon, a layer of N polysilicon, and a layer of conductor. The diode includes a layer of N+ polysilicon, a layer of N polysilicon, and a layer of P polysilicon. The control circuitry includes a semiconductor field effect transistor in contact with the first conductive terminal. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$. The nanotube block further includes a porous dielectric material. The porous dielectric material includes one of a spin-on glass and a spin-on low-κ dielectric. The nanotube block further includes a nonporous dielectric material. The nonporous dielectric material includes hafnium oxide.

Under another aspect, a high-density memory array includes: a plurality of word lines and a plurality of bit lines; a plurality of memory cells, each memory cell including: a first conductive terminal; a nanotube block over the first conductive terminal, the nanotube block including a multilayer nanotube fabric; a second conductive terminal over the nanotube block and in electrical communication with a word line of the plurality of word lines; and a diode in electrical communication with a bit line of the plurality of bit lines and one of the first and second conductive terminals, wherein the nanotube block has a thickness that defines a spacing between the first and second conductive terminals, and wherein a logical state of each memory cell is selectable by activation only of the bit line and the word line connected to that memory cell. The diode is positioned under the first conductive terminal. The diode is positioned over the second conductive terminal. The diode, the first and second conductive terminals, and the nanotube block all have substantially the same lateral dimensions. The diode, the first and second conductive terminals, and the nanotube block each have a substantially circular lateral shape. The diode, the first and second conductive terminals, and the nanotube block each have a substantially rectangular lateral shape. The diode, the first and second conductive terminals, and the nanotube block each have a lateral dimension between about 200 nm and about 22 nm. The memory cells are spaced from each other by between about 200 nm and about 22 nm. The first and second conductive terminals, and the nanotube block each have a lateral dimension between about 22 nm and about 10 nm. The memory cells of the array are spaced from each other by between about 220 nm and about 10 nm. Some memory cells of the array are laterally spaced relative to each other, and other memory cells of the array are stacked on top of each other. Some of the memory cells of the array that are stacked on top of each other share a bit line. Some of the memory cells of the array that are laterally spaced relative to each other share a word line. The plurality of word lines are substantially perpendicular to the plurality of bit lines. The thickness of the nanotube block is between about 10 nm and about 200 nm. The thickness of the nanotube block is between about 10 nm and about 50 nm.

Under another aspect, a high-density memory array includes: a plurality of word lines and a plurality of bit lines; a plurality of memory cells, each memory cell including: a first conductive terminal; a nanotube block over the first conductive terminal, the nanotube block including a multilayer nanotube fabric; a second conductive terminal over the nanotube block and in electrical communication with a bit line of the plurality of bit lines; and a diode in electrical communication with a word line of the plurality of word lines, wherein the nanotube block has a thickness that defines a spacing between the first and second conductive terminals, wherein a logical state of each memory cell is selectable by activation only of the bit line and the word line connected to that memory cell. The diode is positioned under the first conductive terminal. The diode is positioned over the second conductive terminal. The diode, the first and second conductive terminals, and the nanotube block all have substantially the same lateral dimensions. The diode, the first and second conductive terminals, and the nanotube block each have a substantially circular lateral shape. The diode, the first and second conductive terminals, and the nanotube block each have a substantially rectangular lateral shape. The diode, the first and second conductive terminals, and the nanotube block each have a lateral dimension between about 200 nm and about 22 nm. The memory cells are spaced from each other by between about 200 nm and about 22 nm. The diode, the first and second conductive terminals, and the nanotube block each have a lateral dimension between about 22 nm and about 10 nm. The memory cells of the array are spaced from each other by between about 220 nm and about 10 nm. Some memory cells of the array are laterally spaced relative to each other, and other memory cells of the array are stacked on top of each other. Some of the memory cells of the array that are stacked on top of each other share a bit line. Some of the memory cell of the array that are laterally spaced relative to each other share a word line. The plurality of word lines are substantially perpendicular to the plurality of bit lines. The thickness of the nanotube block is between about 10 nm and about 200 nm. The thickness of the nanotube block is between about 10 nm and about 50 nm.

Under another aspect, a high-density memory array includes: a plurality of word lines and a plurality of bit lines; a plurality of memory cell pairs, each memory cell pair including: a first memory cell including a first conductive terminal, a first nanotube element over the first conductive terminal, a second conductive terminal over the nanotube element, and a first diode in electrical communication with one of the first and second conductive terminals and with a first bit line of the plurality of bit lines; and a second memory cell including a third conductive terminal, a second nanotube element over the first conductive terminal, a fourth conductive terminal over the nanotube element, and a second diode in electrical communication with one of the third and fourth conductive terminals and with a second bit line of the plurality of bit lines, wherein the second memory cell is positioned over the first memory cell, and wherein the first and second memory cell share a word line of the plurality of word lines; wherein each memory cell pair of the plurality of memory cells is capable of switching between at least four different resistance states corresponding to four different logic states in response to electrical stimuli at the first and second bit lines and the shared word line.

Under another aspect, a high-density memory array includes: a plurality of word lines and a plurality of bit lines; a plurality of memory cell pairs, each memory cell pair including: a first memory cell including a first conductive terminal, a first nanotube element over the first conductive terminal, a second conductive terminal over the nanotube element, and a first diode in electrical communication with one of the first and second conductive terminals and with a first word line of the plurality of word lines; and a second memory cell including a third conductive terminal, a second nanotube element over the first conductive terminal, a fourth conductive terminal over the nanotube element, and a second diode in electrical communication with one of the third and fourth conductive terminals and with a second word line of the plurality of word lines, wherein the second memory cell is positioned over the first memory cell, and wherein the first and second memory cell share a bit line of the plurality of bit lines; wherein each memory cell pair of the plurality of memory cells is capable of switching between at least four different resistance states corresponding to four different logic states in response to electrical stimuli at the first and second word lines and the shared bit line.

Under another aspect, a nanotube diode includes: a cathode formed of a semiconductor material; and an anode formed of nanotubes, wherein the cathode and the anode are in fixed and direct physical contact; and wherein the cathode and anode are constructed and arranged such that sufficient electrical stimulus applied to the cathode and the anode creates a conductive pathway between the cathode and the anode.

One or more embodiments include one or more of the following features. The anode includes a non-woven nanotube fabric having a plurality of unaligned nanotubes. The non-woven nanotube fabric includes a layer of nanotubes having a thickness between approximately 0.5 and approximately 20 nanometers. The non-woven nanotube fabric includes a block of nanotubes. The nanotubes include metallic nanotubes and semiconducting nanotubes. The cathode includes an n-type semiconductor material. A Schottky barrier is formed between the n-type semiconductor material and the metallic nanotubes. A PN junction is formed between the n-type semiconductor material and the semiconducting nanotubes. A PN junction is formed between the n-type semiconductor material and the semiconducting nanotubes. The Schottky barrier and the PN junction provide electrically parallel communication pathways between the cathode and the anode. Further in electrical communication with a nonvolatile memory cell, the nanotube diode capable of controlling electrical stimulus to the nonvolatile memory cell. Further in electrical communication with a nonvolatile nanotube switch, the nanotube diode capable of controlling electrical stimulus to the nonvolatile nanotube switch. Further in electrical communication with an electrical network of switching elements, the nanotube diode capable of controlling electrical stimulus to the electrical network of switching elements. Further in communication with a storage element, the nanotube diode capable of selecting the storage element in response to electrical stimulus. The storage element is nonvolatile. Further in communication with an integrated circuit, the nanotube diode operable as a rectifier for the integrated circuit.

Under another aspect, a nanotube diode includes: a conductive terminal; a semiconductor element disposed over and in electrical communication with the conductive terminal, wherein the semiconductor element forms a cathode; and a nanotube switching element disposed over and in fixed electrical communication with the semiconductor element, wherein the nanotube switching element forms an anode, wherein the nanotube switching element includes a conductive contact and nanotube fabric element capable of a plurality of resistance states, and wherein the cathode and the anode are constructed and arranged such that in response to sufficient electrical stimuli applied to the conductive contact and the conductive terminal, the nonvolatile nanotube diode is capable of forming an electrically conductive pathway between the conductive terminal and the conductive contact.

One or more embodiments include one or more of the following features. The nanotube fabric element includes a patterned region of nanotubes and the semiconductor element includes an n-type semiconductor material. The patterned region of nanotubes includes metallic nanotubes and semiconducting nanotubes. A Schottky barrier is formed between the n-type semiconductor material and the metallic nanotubes including the patterned region of nanotubes. A PN junction is formed between the n-type semiconductor material and the semiconducting nanotubes including the patterned region of nanotubes. The Schottky barrier and the PN junction provide electrically parallel communication pathways between the conducting terminal and the nanotube fabric element. Further in electrical communication with a nonvolatile memory cell, the nanotube diode capable of controlling electrical stimulus to the nonvolatile memory cell. Further in electrical communication with a nonvolatile nanotube switch, the nanotube diode capable of controlling electrical stimulus to the nonvolatile nanotube switch. Further in electrical communication with an electrical network of switching elements, the nanotube diode capable of controlling electrical stimulus to the electrical network of switching elements. Further in communication with a storage element, the nanotube diode capable of selecting the storage element in response to electrical stimulus. The storage element is nonvolatile. Further in communication with an integrated circuit, the nanotube diode operable as a rectifier for the integrated circuit.

Under another aspect of the invention, a composite nonvolatile nanotube switch includes a first conductive terminal and a composite article comprising a plurality of nanoscopic particles, at least a portion of the article in electrical contact with at least a portion of the first conductive terminal. The switch includes a second conductive terminal, at least a portion of the second conductive terminal being in contact with at least a portion of the article, such that the article is physically and electrically interposed between the first and second conductive terminals and control circuitry in electrical communication with and capable of applying electrical stimulus to the first and second conductive terminals. The article is capable of switching among a plurality of electronic states in response to a corresponding plurality of electrical stimuli applied by the control circuitry to the first and second conductive terminals. For each different electronic state of the plurality of electronic states, the article provides an electrical pathway of corresponding different resistance between the first and second conductive terminals.

One or more embodiments include one or more of the following features. The plurality of nanoscopic particles has a predefined composition comprising a first quanity of nanotubes and a second quantity of additional nanoscopic particles, a ratio between the first quantity and the second quantity being predefined. The ratio of the first quantity to the second quantity is predefined in accordance with the type of nanotubes, the type of nanotubes including one or more of single-walled, multi-walled, semiconducting, and metallic. The ratio of the first quantity to the second quantity is predefined in accordance with at least one attribute of the additional nanoscopic particles, the at least one attribute including one or more of physical dimensions, material type, and uniformity among particles. The ratio of the first quantity to the second quantity is predefined to tune the switching among a plurality of electronic states in response to the corresponding plurality of electrical stimuli applied by the control circuitry.

One or more embodiments include one or more of the following features. Substantially the entire article is positioned over substantially the entire first conductive terminal, and substantially the entire second conductive terminal is positioned over substantially the entire article. The article comprises a substantially thin layer of the plurality of nanoscopic particles, the plurality of nanoscopic particles including carbon nanotubes. The plurality of nanoscopic particles further includes amorphous carbon and wherein the article comprises a mixture of said plurality of nanoscopic particles. The first conductive terminal comprises a portion of a first conductive trace and the second conductive terminal comprises a portion of a second conductive trace. The first conductive trace and the second conductive trace are aligned in an orientation substantially perpendicular to one another. The first and second conductive terminals and the nanotube article each have a lateral dimension between about 200 nm and about 10 nm. The first and second conductive terminals and the article each have lateral dimension of less than about 10 nm. The article has a thickness between about 10 nm and about 200 nm. The control circuitry includes a diode in direct physical contact with the first conductive terminal. The control circuitry includes a diode in direct physical contact with the second conductive terminal. The plurality of electronic states comprises a low resistance state and a high resistance state. The plurality of electronic states comprises three or more resistance states. The diode comprises a layer of N+ polysilicon, a layer of N polysilicon, and a layer of conductor. The diode comprises a layer of N+ polysilicon, a layer of N polysilicon, and a layer of P polysilicon. The control circuitry includes a semiconductor field effect transistor in contact with the first conductive terminal. The plurality of nanoscopic particles comprises an electrically conductive, active carbon material. The plurality of nanoscopic particles comprises an electrically non-conductive, active carbon material. The plurality of nanoscopic particles comprises an electrically non-conductive, inert additional material. The plurality of nanoscopic particles forming the article vary between electrically conductive and electrically non-conductive states in response to plurality of electrical stimuli applied by the control circuitry to the first and second conductive terminals. The plurality of nanoscopic particles comprise carbon having one or more allotropic forms. The one or more allotropic forms include amorphous carbon, graphite, graphene, Buckminsterfullerenes such as but not limited to C20, C26, C28, C36, C50, C60, C70, C72, C76, C84, C540, carbon nanotubes, diamond and combinations thereof. The article comprising the plurality of nanoscopic particles includes silicon oxide, silicon nitride, and mixtures thereof. The plurality of nanoscopic particles and the silicon oxide, silicon nitride, or mixtures thereof form either a substantially homogeneous mixture. The article is capable of switching among a plurality of electronic states is responsive to a corresponding plurality of electrical stimuli less than approximately 5V.

Under another aspect of the invention, a high-density composite memory array includes a plurality of word lines and a plurality of bit lines and a plurality of memory cells. Each memory cell includes: a first conductive terminal, a composite article in physical and electrical contact with the first conductive terminal, the article comprising a plurality of nanoscopic particles, a second conductive terminal in physical and electrical contact with the article and in electrical communication with a word line of the plurality of word lines and select circuitry in electrical communication with a bit line of the plurality of bit lines and one of the first and second conductive terminals. The article has a physical dimension that defines a spacing between the first and second conductive terminals such that the nanotube article is interposed between the first and second conducive terminals. A logical state of each memory cell is selectable by activation only of the bit line and the word line connected to that memory cell.

One or more embodiments include one or more of the following features. The plurality of nanoscopic particles comprises an electrically conductive, active carbon material. The plurality of nanoscopic particles comprises an electrically non-conductive, active carbon material. The plurality of nanoscopic particles comprises an electrically non-conductive, inert additional material. The plurality of nanoscopic particles vary between electrically conductive and electrically non-conductive in response to plurality of electrical stimuli applied by the control circuitry to the first and second conductive terminals. The first and second conductive terminals, and the article comprising a plurality of nanoscopic particles each have a lateral dimension between about 200 nm and about 10 nm. The select circuitry comprises one of a diode and a semiconductor field-effect transistor. Adjacent memory cells comprising the array are spaced from each other by between about 220 nm and about 10 nm. The plurality of nanoscopic particles include carbon having one or more allotropic forms. The one or more allotropic forms of carbon include amorphous carbon, graphite, graphene, Buckminster-fullerenes such as but not limited to C20, C26, C28, C36, C50, C60, C70, C72, C76, C84, C540, carbon nanotubes, diamond and combinations thereof. The article further comprises an additional material including at least one of silicon oxide, silicon nitride, and mixtures thereof. At least some memory cells of the array are laterally spaced relative to each other, and wherein other memory cells of the array are vertically stacked on top of each other. Some of the memory cells of the array that are vertically stacked on top of each other share a bit line. Some of the memory cells of the array that are laterally spaced relative to each other share a word line. The plurality of word lines are substantially perpendicular to the plurality of bit lines. The geometric dimension comprises a thickness of the composite nanotube article between about 10 nm and about 200 nm. For each memory cell, the article is capable of switching among a plurality of electronic states is responsive to a corresponding plurality of electrical stimuli less than approximately 5V.

Under another aspect of the invention, a method of making a composite nanoscopic particle switch, includes providing a substrate having a first conductive terminal and depositing a layer of nanoscopic particles over the conductive terminal. The method includes depositing a second conductive terminal over the layer of nanoscopic particles, the layer having a thickness, density, and composition of nanoscopic particles selected to prevent direct physical and electrical contact between the first and second conductive terminals.

One or more embodiments include one or more of the following features. The layer of nanoscopic particles has a predefined composition comprises a first quantity of nanotubes and a second quantity of additional nanoscopic particles, a ratio between the first quantity and the second quantity being predefined. The ratio of the first quantity to the second quantity is predefined in accordance with the type of nanotubes, the type of nanotubes including one or more of single-walled, multi-walled, semiconducting, and metallic. The ratio of the first quantity to the second quantity is predefined in accordance with at least one attribute of the additional nanoscopic particles, the at least one attribute including one or more of physical dimensions, material type, and uniformity among particles. The ratio of the first quantity to the second quantity is predefined to tune the composite nanoscopic particle switch to have an electrically controllable resistance between the first and second conductive terminals. Depositing a composite layer of nanoscopic particles comprises a single deposition step and wherein the composite layer of nanoscopic particles is a substantially thick layer.

One or more embodiments include one or more of the following features. The layer of nanoscopic particles comprises a substantially thin layer of nanotubes. The first conductive terminal comprises a portion of a first conductive trace and the second conductive terminal comprises a portion of a second conductive trace. The first conductive trace and the second conductive trace are aligned in an orientation substantially perpendicular to one another. The method includes patterning the second conductive terminal and the layer of nanoscopic particles such that the second conductive terminal and the layer of nanoscopic particles each have a lateral dimension between about 200 nm and about 10 nm. The method includes patterning the second conductive terminal and the layer of nanoscopic particles such that the second conductive terminal and the layer of nanoscopic particles each have a lateral dimension of less than about 10 nm. Depositing the layer of nanoscopic particles comprises providing one or more layers of composite nanotube fabric having a cumulative thickness between about 10 nm and about 200 nm.

One or more embodiments include one or more of the following features. The method includes providing control circuitry to access said nanoscopic particle switch, the control circuitry including a diode in direct physical contact with one of the first and second conductive terminals. The method includes providing stimulus circuitry to apply electrical stimulus to at least one of the first and second conductive terminals, the electrical stimulus selected to induce a plurality of electronic states in the nanoscopic particle switch. The plurality of electronic states comprises a low resistance state and a high resistance state. The electrical stimulus selected to induce a plurality of electronic states in the nanoscopic particle switch comprises an electrical stimuli of less than approximately 5V. The diode comprises a layer of N+ polysilicon, a layer of N polysilicon, and a layer of conductor. The diode comprises a layer of N+ polysilicon, a layer of N polysilicon, and a layer of P polysilicon. The method providing control circuitry to access said nanoscopic particle switch, the control circuitry including a field effect transistor in direct physical contact with one of the first and second conductive terminals. The layer of nanoscopic particles comprises an electrically conductive, active material. The layer of nanoscopic particles comprises an electrically non-conductive, active material. The layer of nanoscopic particles comprises an electrically non-conductive, inert additional material. The layer of nanoscopic particles varies in resistance between electrically conductive and electrically non-conductive in response to plurality of electrical stimuli applied by the control circuitry to the first and second conductive terminals. The layer of nanoscopic particles comprises carbon having one or more allotropic forms. The one or more allotropic forms include amorphous carbon, graphite, graphene, Buckminster-fullerenes such as but not limited to C20, C26, C28, C36, C50, C60, C70, C72, C76, C84, C540, carbon nanotubes, diamond and combinations thereof. The layer of nanoscopic particles further comprises nanoscopic elements having at least one of silicon oxide, silicon nitride, and mixtures thereof. Depositing the layer of nanoscopic particles comprises providing an additional material and subsequently providing a plurality of carbon nanotubes in the additional material to form a matrix. Depositing the layer of nanoscopic particles comprises providing a plurality of carbon nanotubes and subsequently providing an additional material around the carbon nanotubes to form a matrix.

Under another aspect of the invention, a non-volatile composite nanotube switch includes a first conductive terminal and a composite article comprising a first plurality of nanotubes and a second plurality of nanoscopic particles, the first plurality and the second plurality selected according to a predefined ratio, at least a portion of the article in electrical contact with the first conductive terminal. The switch includes a second conductive terminal in contact with at least a portion of the article, wherein the article is physically and electrically interposed between the first and second conductive terminals and control circuitry in electrical communication with and capable of applying electrical stimulus to the first and second conductive terminals. The article is capable of switching among a plurality of electronic states in response to a corresponding plurality of electrical stimuli applied by the control circuitry to the first and second conductive terminals. For each electronic state, the article provides an electrical pathway of corresponding resistance between the first and second conductive terminals.

One or more embodiments includes one or more of the following features. The predefined ratio is selected in accordance with at least one of the characteristics of the nanoscopic particles, the characteristics of the nanotubes characteristics of the plurality of electronic states, and the physical attributes of the composite article. The characteristics of the nanoscopic particles include at least one of uniformity among particles, material composition of particles, and physical dimensions of particles. The characteristics of the nanotubes include at least one of multi-walled characteristics, single-walled characteristics, semiconducting characteristics, and metallic characteristics. The characteristics of the plurality of electronic states includes at least one of a substantially low operating voltage, a substantially high resistance and a substantially low resistance. The physical attributes of the composite article includes a thickness of the composite article.

BRIEF DESCRIPTION OF THE DRAWINGS

In the Drawing:

FIGS. 68A-68I illustrate methods of fabrication of cathode-on-nanotube memory cross sectional structures with nonvolatile nanotube diodes that include nonvolatile nanotube block-based switches within vertical cell boundaries such as those illustrated in FIGS. 67 and 40, according to some embodiments.

FIGS. 84A-84B illustrate tables detailing various additional nanoscopic materials and corresponding attributes of those additional nanoscopic materials when used to form a mixed or composite nanoscopic material for use in various switching structures, according to some embodiments.

FIG. 86 illustrates a chart summarizing various configurations in which the mixed or composite nanoscopic material may be used in place of a nanotube fabric, according to some embodiments.

FIG. 88 illustrates a table showing typical applied electrical stimulus parameters, according to some embodiments.

FIG. 94 illustrates a table showing typical applied electrical stimulus parameters, for mixed or composite nanoscopic material elements, according to some embodiments.

FIG. 106 illustrates a table of various methods that may be used for forming various nonvolatile nanotube switches having various nanoscopic element stacks, according to certain embodiments.

FIG. 110 illustrates a handle wafer for forming various structures describe above, according to certain embodiments.

DETAILED DESCRIPTION

Figure 1:
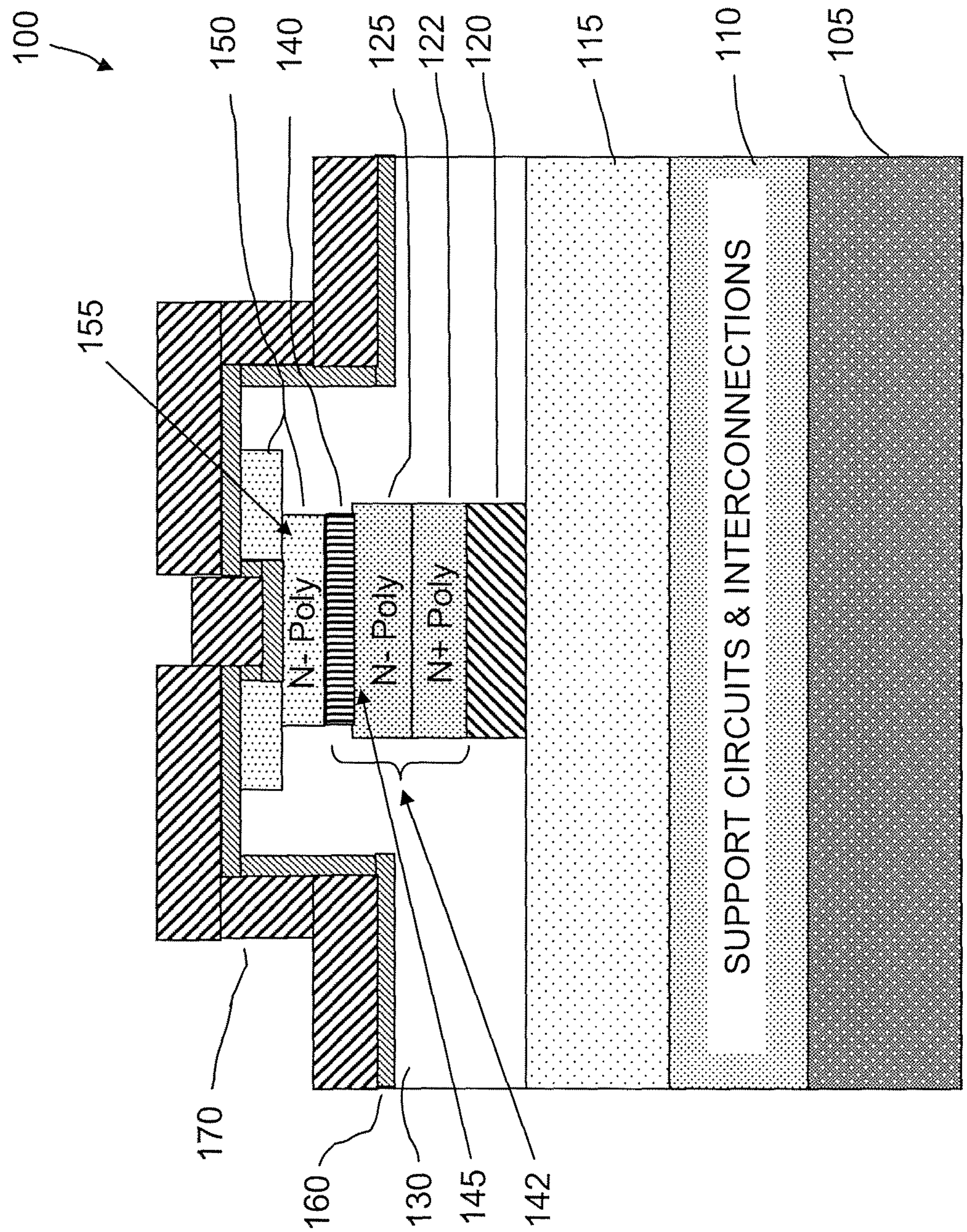
FIG. 1 illustrates a prior art adaptation of a 3D-EPROM cell in which the array is on an insulating layer above memory support circuits formed in and on an underlying semiconductor substrate.
Figure 2:
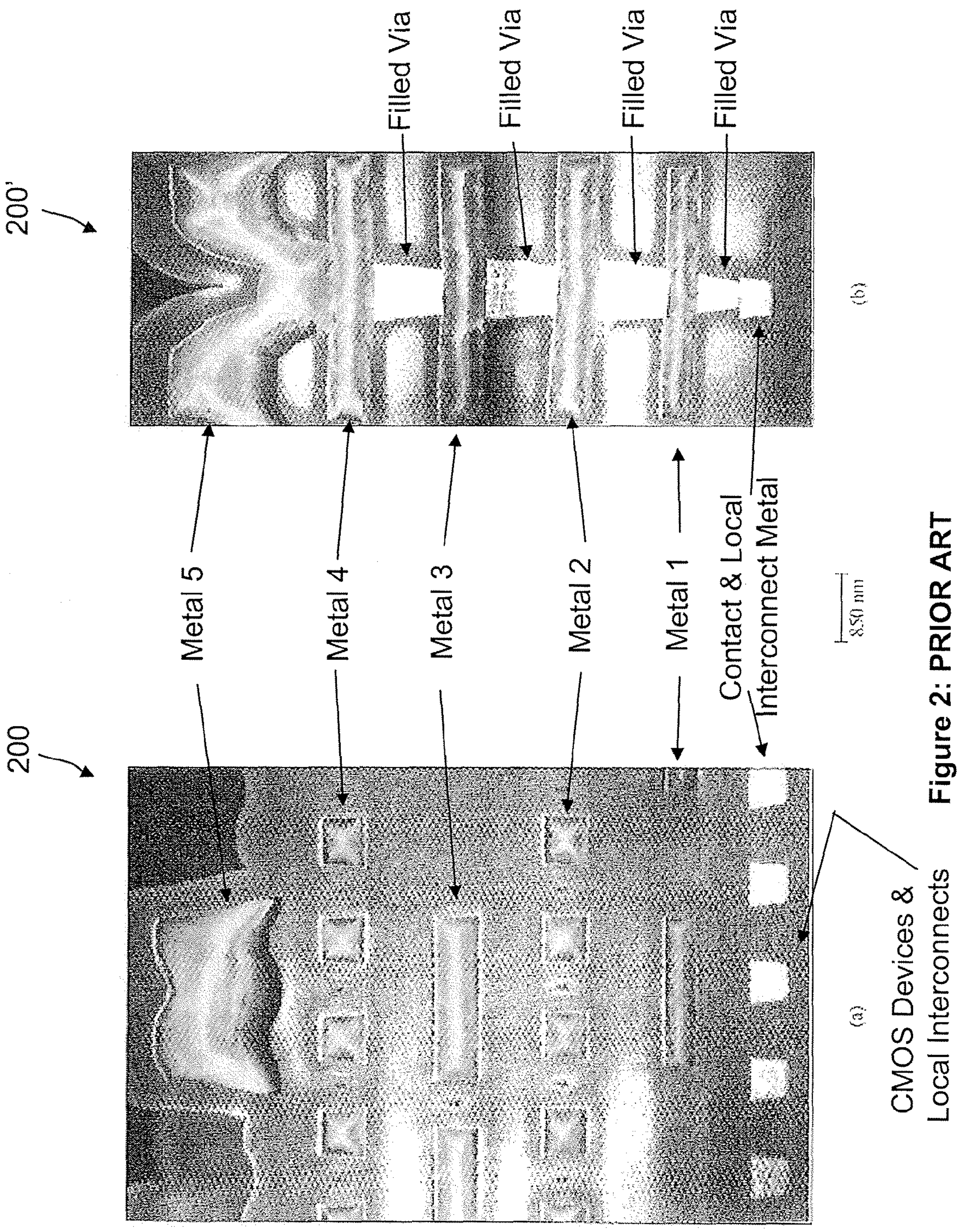
FIG. 2 illustrates prior art CMOS structure with planarized wiring and stacked vertical vias.

Embodiments of the present invention provide nonvolatile diodes and nonvolatile nanotube blocks and systems using same and methods of making same.

Some embodiments of the present invention provide 3-D cell structures that enable dense nonvolatile memory arrays that include nanotube switches and diodes, can write logic 1 and 0 states for multiple cycles, and are integrated on a single semiconductor (or other) substrate. It should be noted that such nonvolatile memory arrays may also be conFigured as NAND and NOR arrays in PLA, FPGA, and PLD configurations for performing stand-alone and embedded logic functions as well.

Some embodiments of the present invention provide diode devices having nonvolatile behavior as a result of diodes combined with nonvolatile nanotube components, and methods of forming such devices.

Some embodiments of the present invention also provide nanotube-based nonvolatile random access memories that include nonvolatile nanotube diode device cells having a relatively high density, and methods of forming such memory devices.

Some embodiments of the invention provide nonvolatile devices that combine nonvolatile nanotube switches (NV NT Switches), such as those described in U.S. patent application Ser. No. 11/280,786, with diodes in a nonvolatile nanotube diode (NV NT Diode) device. Suitable diodes include Schottky, PN, PIN, PDB (planar-doped-barrier), Esaki, LED (light emitting), laser and other diodes and FET diodes. Combinations of NV NT switches with PDB and Esaki diodes may be used in fast switching applications, while combinations of NV NT switches and LED and Laser diodes may be used in light (photon) sources for communications and display applications, as well as photon-based logic and memory applications. Nonvolatile nanotube diodes (NV NT Diodes) formed using various diode and NV NT Switch combinations, such as cathode-to-nanotube and anode-to-nanotube interconnections, are described. NV NT Diode operation is also described. Devices fabricated using NV NT Diodes are also described.

While in some embodiments, NV NT diodes are formed by combining NV NT switches and various diodes formed using silicon and metallurgies typical of CMOS processes, a wide variety of semiconductor materials and conductors may be used to form a variety of diodes in combination with a wide variety of conductors. Examples of semiconductor materials are Si, Ge, SiC, GaP, GaAs, GaSb, InP, InAs, InSb, ZnS, ZnSe, CdS, CdSe, CdTe for example. Schottky diodes may be formed by combining various semiconductor material with compatible conductors such as Al, Ag, Au, Au/Ti, Bi, Ca, Co, $CoSi_2$, Cr, Cu, Fe, In, Ir, Mg, Mo, $MoSi_2$, Na, Ni, $NiSi_2$, Os, Pb, Pd, $Pd_2Si$, Pt, PtSi, Rh, RhSi, Ru, Sb, Sn, Ti, $TiSi_2$, W, $WSi_2$, Zn, $ZrSi_2$, and others for example. LED and laser diodes may be formed using such semiconductor material as GaInAsPt, GaAsSb, InAsP, InGaAs, and many other combinations of materials that determine light emission wavelength.

Alternatively, FET diodes may be formed by combining a NV NT Switch and a three terminal FET with gate electrically connected to one of the two diffusion terminals to form a two terminal FET diode device. When combining a NV NT Switch and an FET diode, a nonvolatile nanotube diode may also be referred to as a nonvolatile nanotube FET-diode, abbreviated as NV NT FET-Diode, to highlight this difference with respect to Schottky, PN, PIN, and other diodes. However, differences between combinations of NV NT Switches and FET diodes and Schottky, PN, PIN and other diodes may not be highlighted and all may be referred to a NV NT Diode.

Embodiments of 2-D nonvolatile memories, both stand-alone and embedded in logic (processors for example), that use nonvolatile nanotube diodes (NV NT Diodes) as storage elements, are also described. These NV NT Diodes may be formed in and/or on a semiconductor substrate with memory support circuits and logic function and integrated on a single substrate such as a semiconductor chip or wafer to form 2-D memory and 2-D memory and logic functions.

Embodiments of 3-D architectures of nonvolatile memories, both stand-alone and embedded in logic, that use NV NT Diodes as 3-D cells for 3-D memory arrays that can write logic 1 and 0 states for multiple cycles, are also described. It should be noted that some embodiments of 3-D memories using arrays of NV NT diode cells are described with respect to memory arrays that are not fabricated in or on a semiconductor substrate, but are instead formed on an insulating layer above support circuits formed in and on a semiconductor substrate with interconnections between support circuits and the 3-D memory array.

NV NT Diode arrays can also be formed on a planar insulating surface, above support circuits with array interconnections through and on the insulating layer, in which the NV NT Diode arrays are formed using methods of fabrication in which array features are self-aligned in both X and Y directions such that array features are not increased in size to accommodate alignment requirements.

It should also be noted that presently available planarization techniques (chemical-mechanical planarization (CMP), for example) combined with Silicon-on-Insulator (SOI) technology and thin film transistor (TFT) technology enable 3-D memory arrays using NV NT Diodes as 3-D cells to be fabricated in planar dense stacked structures above a single substrate in which the substrate is not a semiconductor substrate. Combined planarization techniques and display-application-driven enhanced TFT technology enable non-semiconductor substrates such as glass, ceramic, or organic substrate as alternatives to using semiconductor substrates.

Methods of fabrication of various 3-D memories are described.

Although NV NT Diode-based nonvolatile memories are described, it should be noted that such nonvolatile memory arrays may also be conFigured as NAND and NOR arrays in PLA, FPGA, and PLD functions for performing stand-alone and embedded logic as well.

Two Terminal Nonvolatile Nanotube Diode Devices

Some embodiments provide a nonvolatile nanotube diode device that acts like a diode in its ability to direct electronic communication in a forward biased direction, and prevent communication in a reverse direction, if the nanotube diode is in a conductive (ON) mode (or state). However, if a nonvolatile nanotube diode device is in a nonconductive (OFF) mode (or state), then direct communication is prevented in either forward or reverse direction. The nonvolatile nanotube diode device conductive (ON) mode or nonconductive (OFF) mode is nonvolatile and is maintained without power supplied to the device. The mode of the nonvolatile nanotube diode device may be changed from ON to OFF or from OFF to ON by applying suitable voltage and current levels using a stimulus circuit.

Some embodiments of the nonvolatile device are formed by combining nonvolatile nanotube switches (NV NT Switches) described in U.S. patent application Ser. No. 11/280,786, U.S. patent application Ser. No. 11/835,612, entitled "Nonvolatile Resistive Memories Having Scalable Two-Terminal Nanotube Switches," filed on even date herewith, and/or U.S. patent application Ser. No. 11/835,613, entitled "Memory Elements and Cross Point Switches and Arrays of Same Using Nonvolatile Nanotube Blocks," filed on even date herewith, and diodes such as Schottky, PN, PIN, and other diodes and FET diodes to form a nonvolatile nanotube diode (NV NT Diode) device. In some embodiments, nonvolatile nanotube diodes (NV NT Diodes) are two terminal devices having one terminal in contact with one terminal of a nonvolatile nanotube switch and another terminal in contact with the anode or cathode of a diode. In some embodiments, a shared internal contact connects a second terminal of a nonvolatile nanotube switch with the cathode or anode of a diode to form the nonvolatile nanotube diode device.

Some embodiments of NV NT diodes are scalable to large nonvolatile array structures. Some embodiments use processes that are compatible with CMOS circuit manufacture. It should be noted that based on the principle of duality in semiconductor devices, P and N regions in the examples illustrated may be interchanged with corresponding changes in the polarity of applied voltages.

Nonvolatile Nanotube Diode Devices having the Cathode of the Diode Connected to one Terminal of the Nonvolatile Nanotube Switch; and other Nonvolatile Nanotube Diode Devices having the Anode of the Diode Connected to one Terminal of the Nonvolatile Nanotube Switch Nonvolatile nanotube switches (NV NT Switches) are described in detail in U.S. patent application Ser. No. 11/280,786, and are summarized briefly below. NV NT Switches include a patterned nanotube element and two terminals in contact with the patterned nanotube (nanofabric) element. Methods of forming nanotube fabrics and elements, and characteristics thereof, are described in greater detail in the incorporated patent references. Nonvolatile nanotube switch operation does not depend on voltage polarity, positive or negative voltages may be used. A first terminal may be at a higher or lower voltage with respect to a second terminal. There is no preferential current flow direction. Current may flow from a first to a second terminal or from a second to a first terminal.

Figure 3:
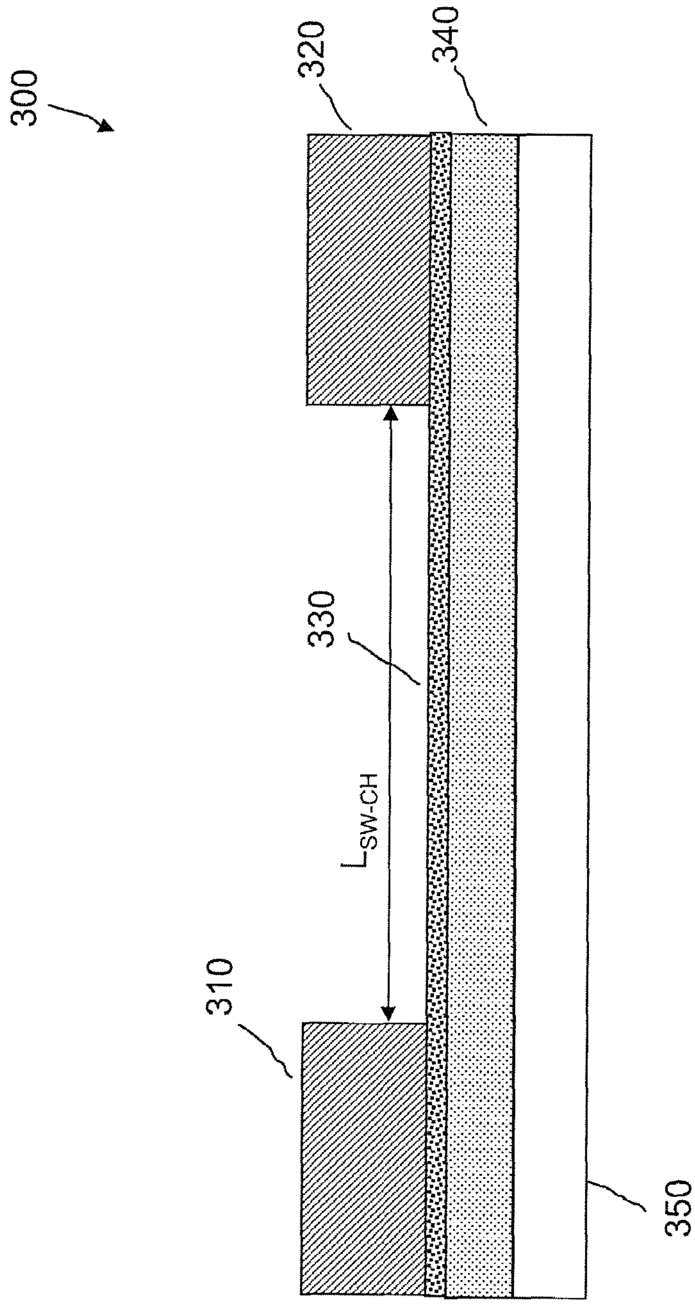
FIG. 3 illustrates an embodiment of a nonvolatile nanotube switch in an essentially horizontal orientation in which two terminals are deposited, each one at opposite ends of a patterned nanotube channel element.

FIG. 3 illustrates an embodiment of a NV NT Switch 300 including a patterned nanotube element 330 on insulator 340 which is supported by substrate 350. Terminals (conductive elements) 310 and 320 are deposited directly onto patterned nanotube element 330 and at least partially overlap opposite ends of patterned nanotube element 330. The nonvolatile nanotube switch channel length $L_{SW-CH}$ is the separation between 310 and 320. $L_{SW-CH}$ is important to the operation of nonvolatile nanotube switch 300 as described further below. Substrate 350 may be an insulator such as ceramic or glass, a semiconductor, or an organic rigid or flexible substrate. Substrate 350 may be also be organic, and may be flexible or stiff. Insulator 340 may be $SiO_2$, SiN, $Al_2O_3$, or another insulator material. Terminals (contacts) 310 and 320 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Figure 4:
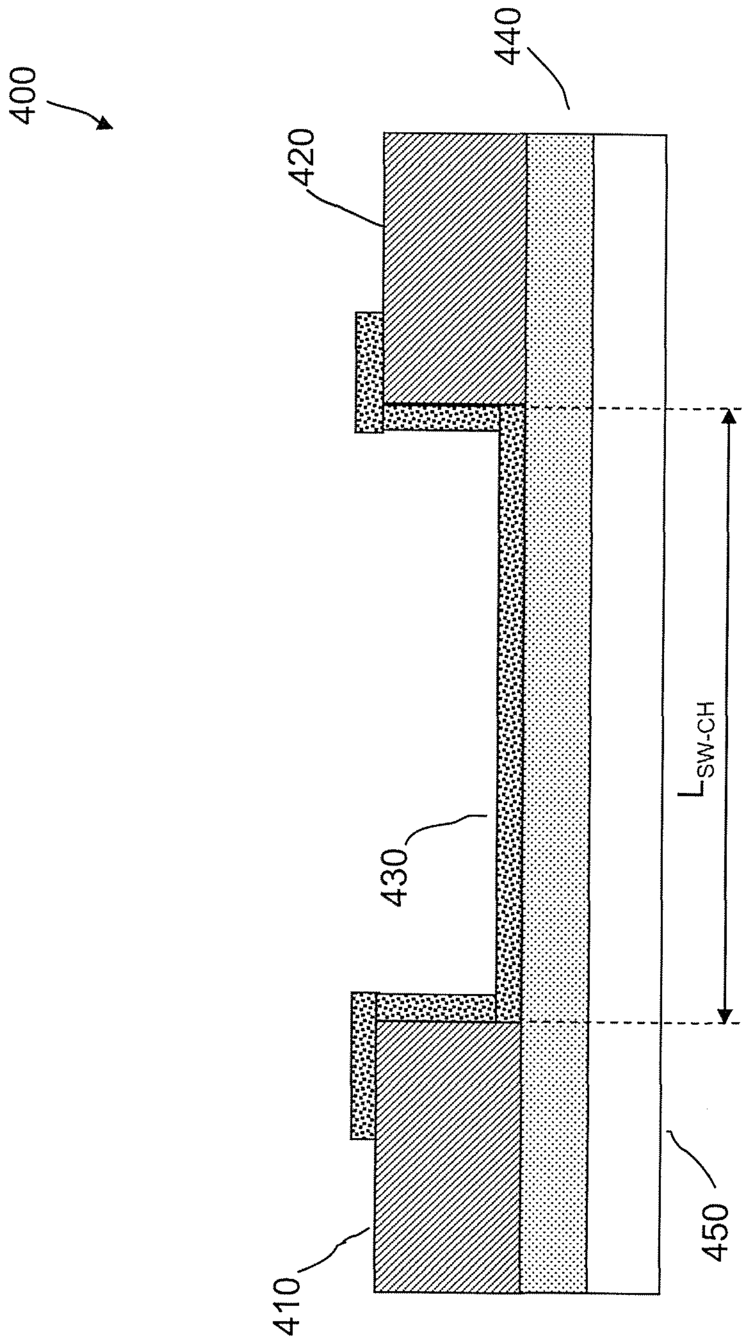
FIG. 4 illustrates an embodiment of a nonvolatile nanotube switch in an essentially horizontal orientation in which a conformal nanotube channel element is deposited on predefined terminal regions.

FIG. 4 illustrates an embodiment of a NV NT Switch 400 including patterned nanotube element 430 on insulator 440 which is supported by substrate 450. Patterned nanotube element 430 is a nonplanar conformal nanofabric that also partially overlaps and contacts terminals (conductive elements) 410 and 420 on top and side surfaces. Terminals (contacts) 410 and 420 are deposited and patterned directly onto substrate 450 prior to patterned nanotube element 430 formation. Patterned nanotube element 330 is formed using a conformal nanofabric that at least partially overlaps terminals 410 and 420. The nonvolatile nanotube switch channel length $L_{SW-CH}$ is the separation between terminal 410 and 420. $L_{SW-CH}$ is important to the operation of nonvolatile nanotube switch 400 as described further below. Substrate 450 may be an insulator such as ceramic or glass, a semiconductor, or an organic rigid or flexible substrate. Substrate 450 may be also be organic, and may be flexible or stiff. Insulator 440 may be $SiO_2$, SiN, $Al_2O_3$, or another insulator material. Terminals 410 and 420 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Figure 5:
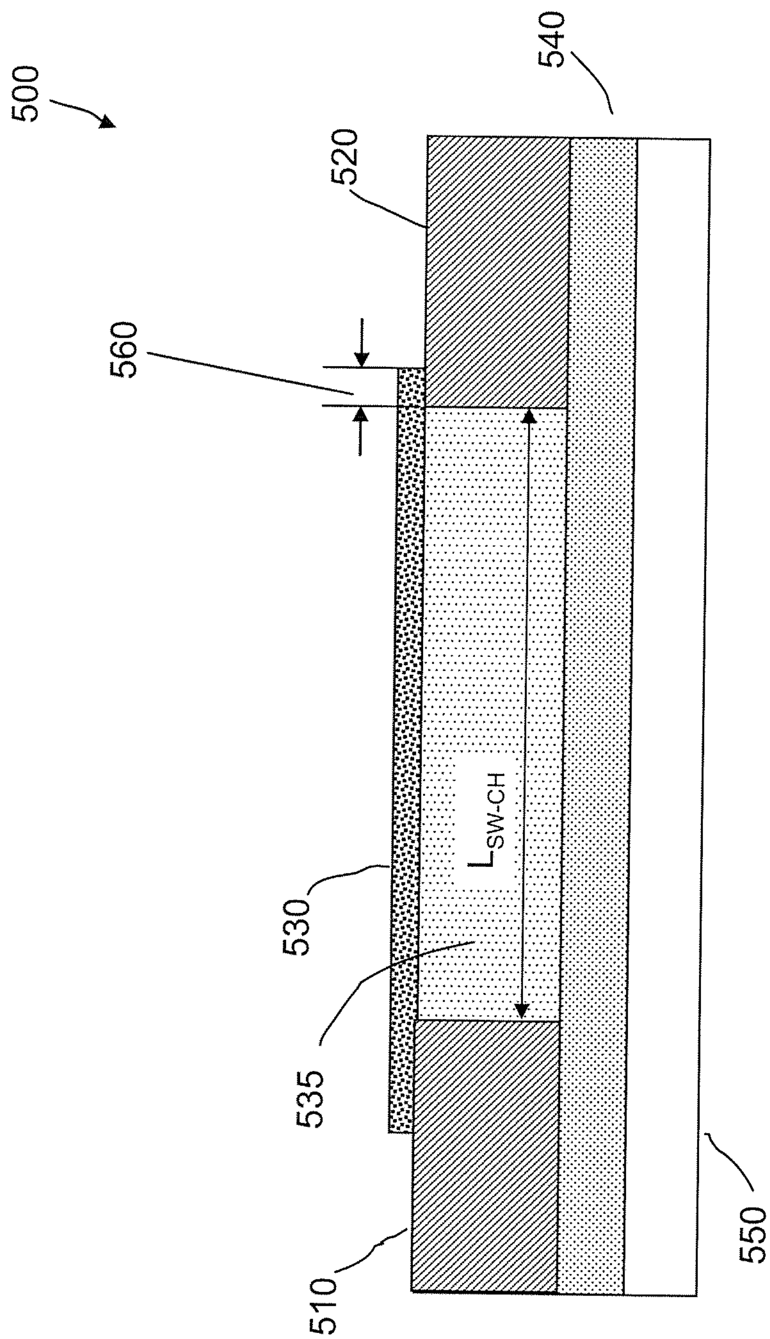
FIG. 5 illustrates an embodiment of a nonvolatile nanotube switch in which a nanotube channel element is deposited in an essentially horizontal orientation on predefined terminal regions that includes a coplanar insulator region between the terminals.

FIG. 5 illustrates an embodiment of a NV NT Switch 500 including patterned nanotube element 530 on insulator 535, which is on insulator 540, which is supported by substrate 550. Patterned nanotube element 530 is a nanofabric on a planar surface that also partially overlaps and contacts terminals (conductive elements) 510 and 520. Terminals (contacts) 510 and 520 are deposited and patterned directly onto substrate 550 prior to patterned nanotube element 530 formation. In alternate embodiments, terminals 510 and 520 may be deposited and pattered onto the insulator 535 instead of directly onto the substrate 550. Patterned nanotube element 530 to terminal 520 overlap distance 560 does not significantly change nonvolatile nanotube switch 500 operation. The nonvolatile nanotube switch channel length $L_{SW-CH}$ is the separation between terminal 510 and 520. $L_{SW-CH}$ is important to the operation of nonvolatile nanotube switch 500 as described further below. Substrate 550 may be an insulator such as ceramic or glass, a semiconductor, or an organic rigid or flexible substrate. Substrate 550 may be also be organic, and may be flexible or stiff. Insulators 535 and 540 may be $SiO_2$, SiN, $Al_2O_3$, or another insulator material. Terminals 510 and 520 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

In some embodiments, NV NT Switch 500 may be modified (not shown) to include a gap region in insulator 535 between a portion of nanotube element 530 and insulator 540 as described further in U.S. patent application Ser. No. (TBA), entitled “Nonvolatile Resistive Memories Having Scalable Two-Terminal Nanotube Switches,” and/or U.S. patent application Ser. No. (TBA), entitled “Memory Elements and Cross Point Switches and Arrays of Same Using Nonvolatile Nanotube Blocks,” filed on even date herewith. Without wishing to be bound by theory, it is believed that in the suspended region a reduced amount of heat is lost to the surrounding substrate, so smaller values of voltage and current may be required to heat the nanotubes to a temperature sufficient for switching to occur. Other mechanisms are possible.

Figure 6A:
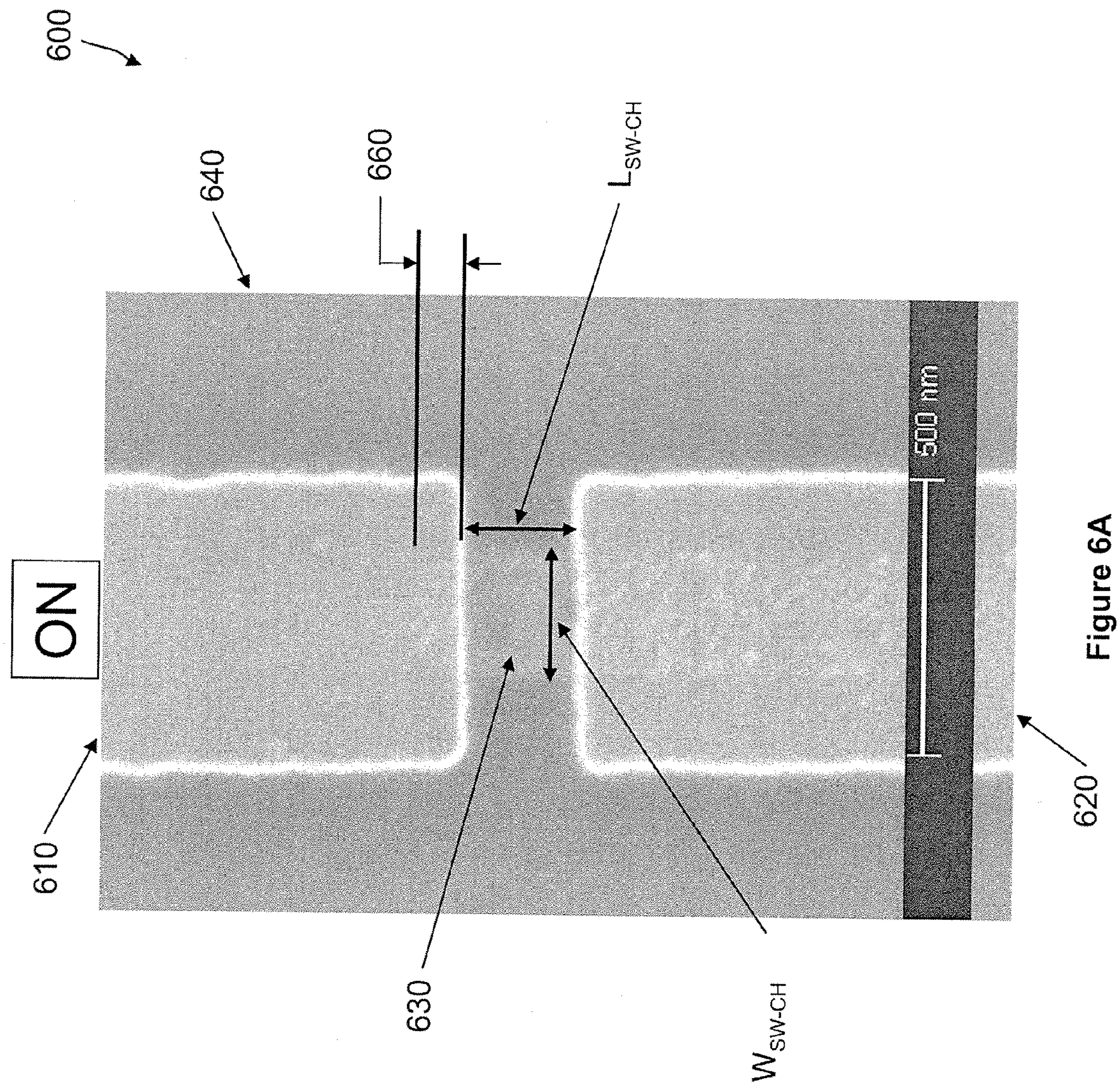
FIGS. 6A-6B illustrate an SEM views of embodiments of nonvolatile nanotube switches similar to the embodiment of a nonvolatile nanotube switch illustrated in FIG. 3 in an ON conducting state and in an OFF non-conducting state.

FIG. 6A illustrates a SEM image of an embodiment of a nonvolatile nanotube switch 600 prior to passivation and corresponding to nonvolatile nanotube switch 300 shown in cross sectional drawing 300 in FIG. 3. Nonvolatile nanotube switch 600 includes patterned nanotube (nanofabric) element 630, terminals (contacts) 610 and 620, and insulator 640. Exemplary nonvolatile nanotube switches 600 have been fabricated with terminal-to-terminal channel lengths ($L_{SW-CH}$) in the range of 250 nm to 22 nm thereby reducing nonvolatile nanotube switch size and lowering erase (write 0) voltages at shorter channel lengths, as illustrated further below. Programming (write 1) voltages typically remain lower than erase (write 0) voltages. Erase voltage measurements on nonvolatile nanotube switches of varying channel width (data not shown) indicate no significant dependence of erase voltage on device channel width as the channel width $W_{SW-CH}$ is varied from 500 to 150 nm. Erase voltage measurements on nonvolatile nanotube switches of varying nanofabric-to-contact terminal overlap lengths (data not shown) indicate no significant dependence of erase voltage on overlap lengths, such as overlap length 660 in FIG. 6A, as overlap lengths are varied from approximately 800 to 20 nm.

Figure 6B:
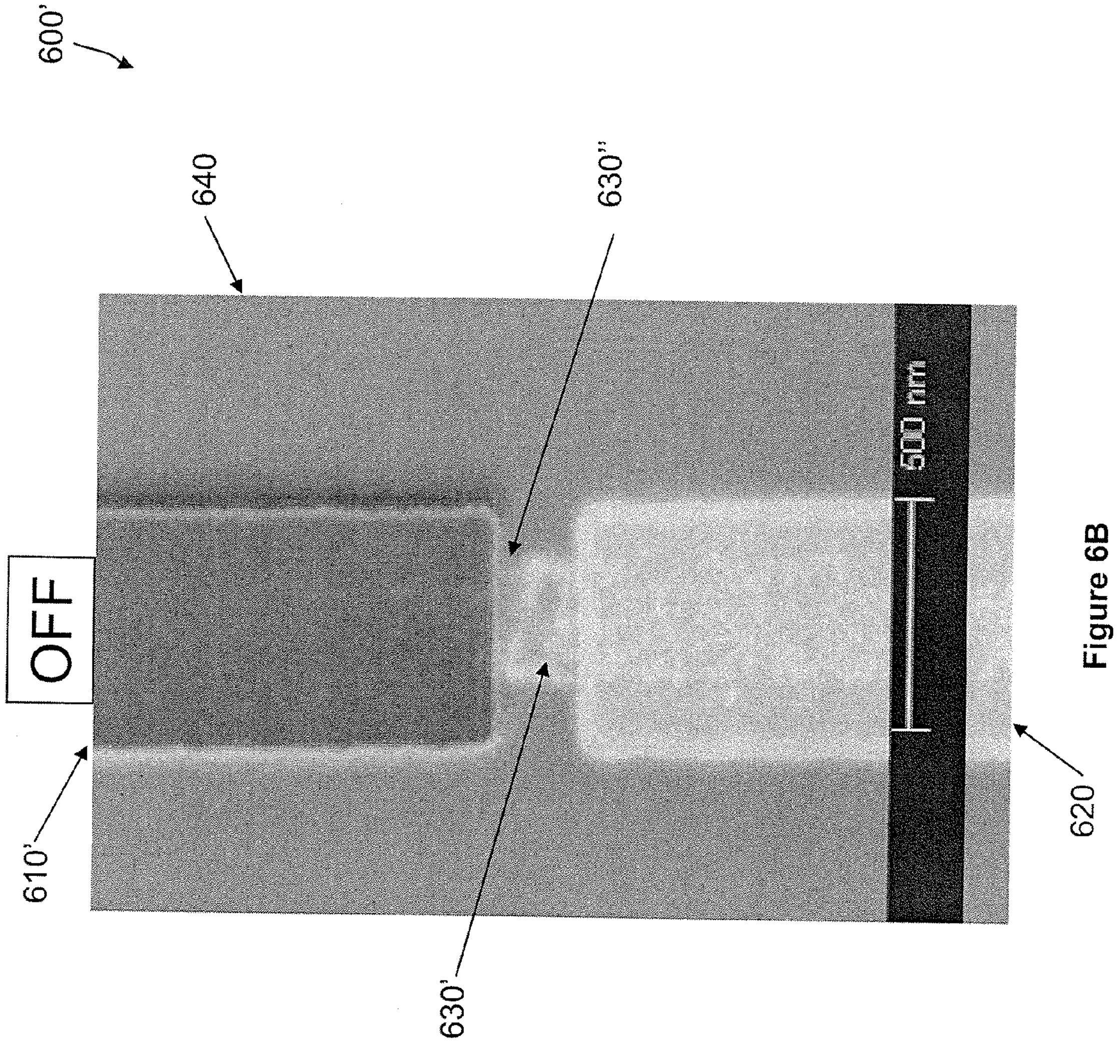

FIGS. 6A and 6B were obtained using SEM voltage contrast imaging of NV NT Switch 600 including patterned nanotube element 630 connected to terminals 610 and 620. With respect to FIG. 6A, NV NT Switch 600 is in an ON state such that voltage applied to terminal 620 is transmitted to terminal 610 by patterned nanotube element 630 in an electrically continuous ON state. FIG. 6B illustrates NV NT Switch 600', which corresponds to NV NT Switch 600 in the OFF state. In the OFF state, patterned nanotube element 630 is electrically discontinuous within itself and/or separates from one of the terminals 610, 620. SEM voltage contrast imaging of NV NT Switch 600' in FIG. 6B illustrates patterned nanotube element 630 in which patterned nanotube element region 630' appears to be electrically connected to terminal 620 (light region) and patterned nanotube element region 630" appears to be electrically connected to terminal 610' (dark region), but where patterned nanotube element regions 630' and 630" appear not to be electrically connected to each other, i.e., the patterned nanotube element 630 "breaks." Terminal 610' is dark since voltage applied to terminal 620 does not reach terminal 610' because of the apparent electrical discontinuity between patterned nanotube element regions 630' and 630". Note that terminal 610' is the same as terminal 610, except that it is not electrically connected to terminal 620 in NV NT Switch 600'.

Figure 7A:
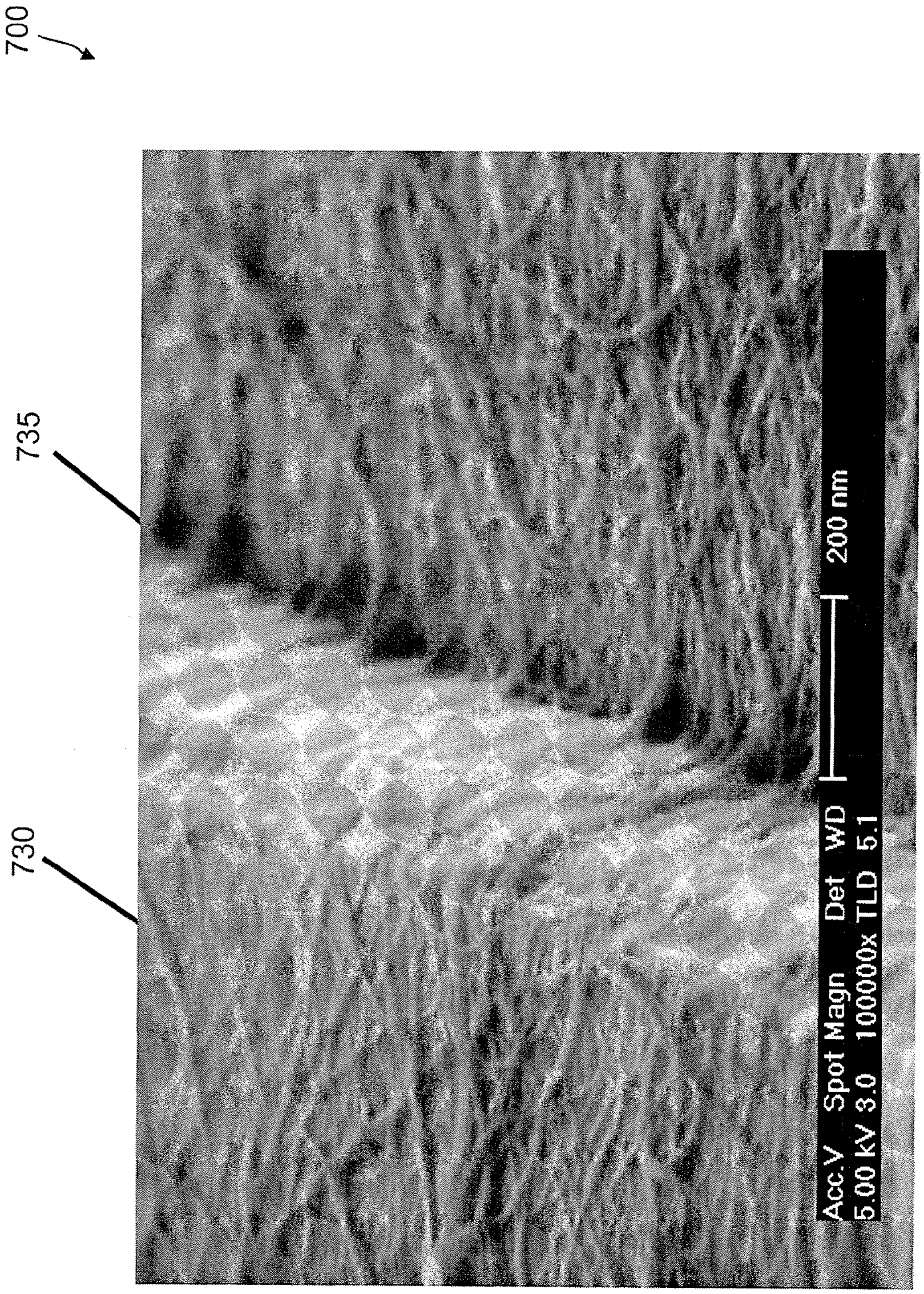
FIG. 7A illustrates an embodiment of a conformal nanofabric layer having an essentially vertical orientation over a stepped region.

Nonvolatile nanotube switch embodiment 600 illustrated in FIGS. 6A-6B is fabricated on a horizontal surface. In general, patterned nanotube elements can be fabricated using conformal patterned nanofabrics that may be oriented at various angles, without limitations, as described in greater detail in the incorporated patent references. FIG. 7A is an SEM image of exemplary structure 700 with nanofabric 730 conforming to an underlying step after deposition, with a vertical orientation 735 region. These conformal properties of nanofabrics may be used to fabricate vertically oriented nonvolatile nanotube switches with enhanced dimensional control and requiring less area (e.g. can be fabricated at greater density) as illustrated further below.

Figure 7B:
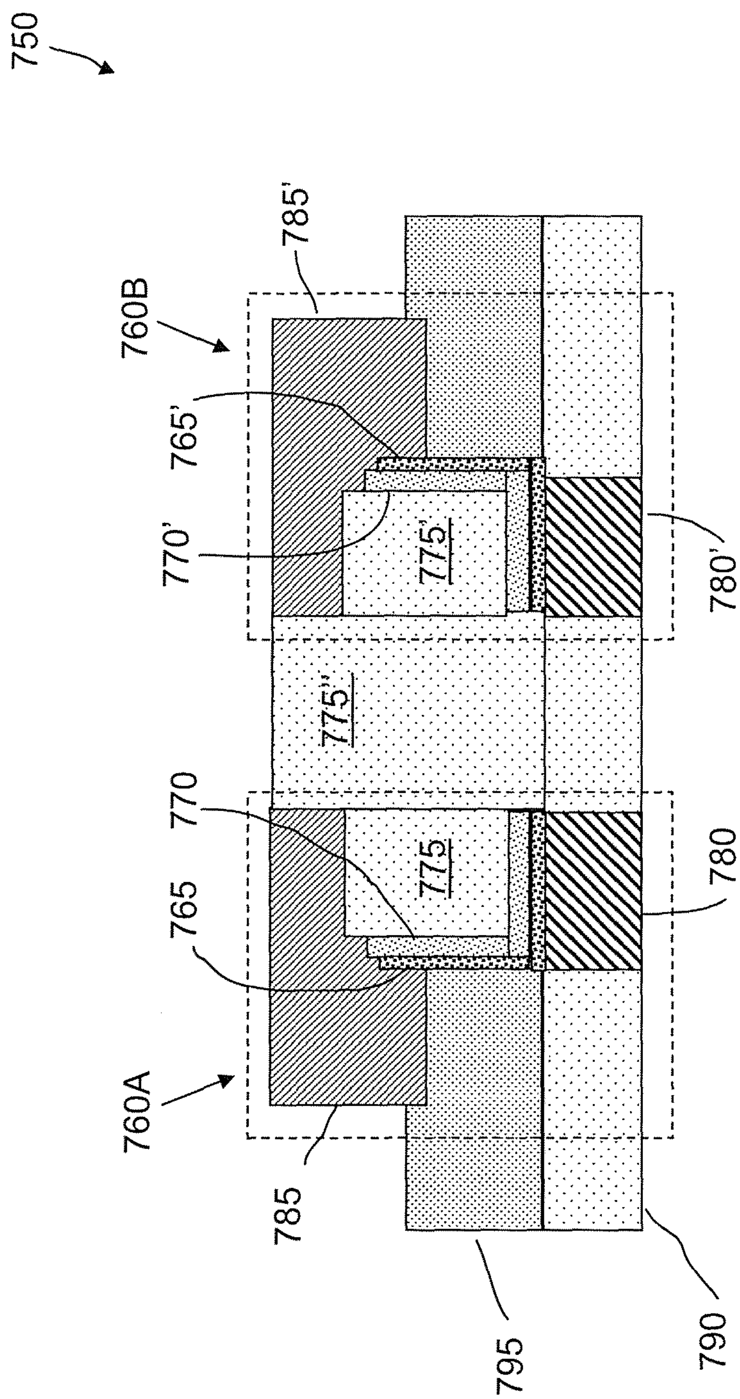
FIG. 7B is an embodiment of a representation of a 3-D memory cell cross section with a vertically-oriented nonvolatile nanotube switch storage element.

FIG. 7B is a representation of an embodiment of 3-D memory cell cross section 750 storage elements described in greater detail in U.S. patent application Ser. No. 11/280,786. 3D memory cell storage regions 760A and 760B are mirror image storage devices using nonvolatile nanotube switches with vertically-oriented nanotube elements 765 and 765'. Protective insulator materials 770 and 770', and 775, 775', and 775" are used to enhance the performance and reliability of nanotube elements 765 and 765', respectively. Memory cell storage regions 760A and 760B include lower contacts 780 and 780', respectively, and upper contacts 785 and 785', respectively. Upper contacts 785 and 785' include sidewall and top surface contact regions. Contacts 780 and 780' are embedded in insulator 790. Insulator 795 on the top surface of insulator 790 includes sidewall regions used to define the location of nanotube channel elements 765 and 765'.

Figure 8:
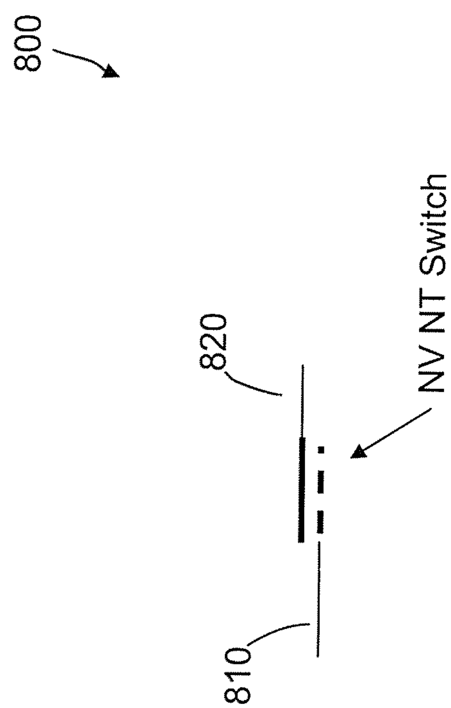
FIG. 8 illustrates a schematic representation of an embodiment of a nonvolatile nanotube switch.

FIG. 8 illustrates a nonvolatile nanotube switch 800 schematic representation of nonvolatile nanotube switches 300, 400, 500 and other nonvolatile nanotube switches (not shown) having that may include suspended regions and also may include horizontal, vertical, or other orientation, according to some embodiments. Two terminals (contacts) 810 and 820 are illustrated, and correspond, for example to terminals (contacts) 310 and 320 of NV NT Switch 300; 410 and 420 of NV NT Switch 400; and 510 and 520 of NV NT Switch 500 for example.

Figure 9A:
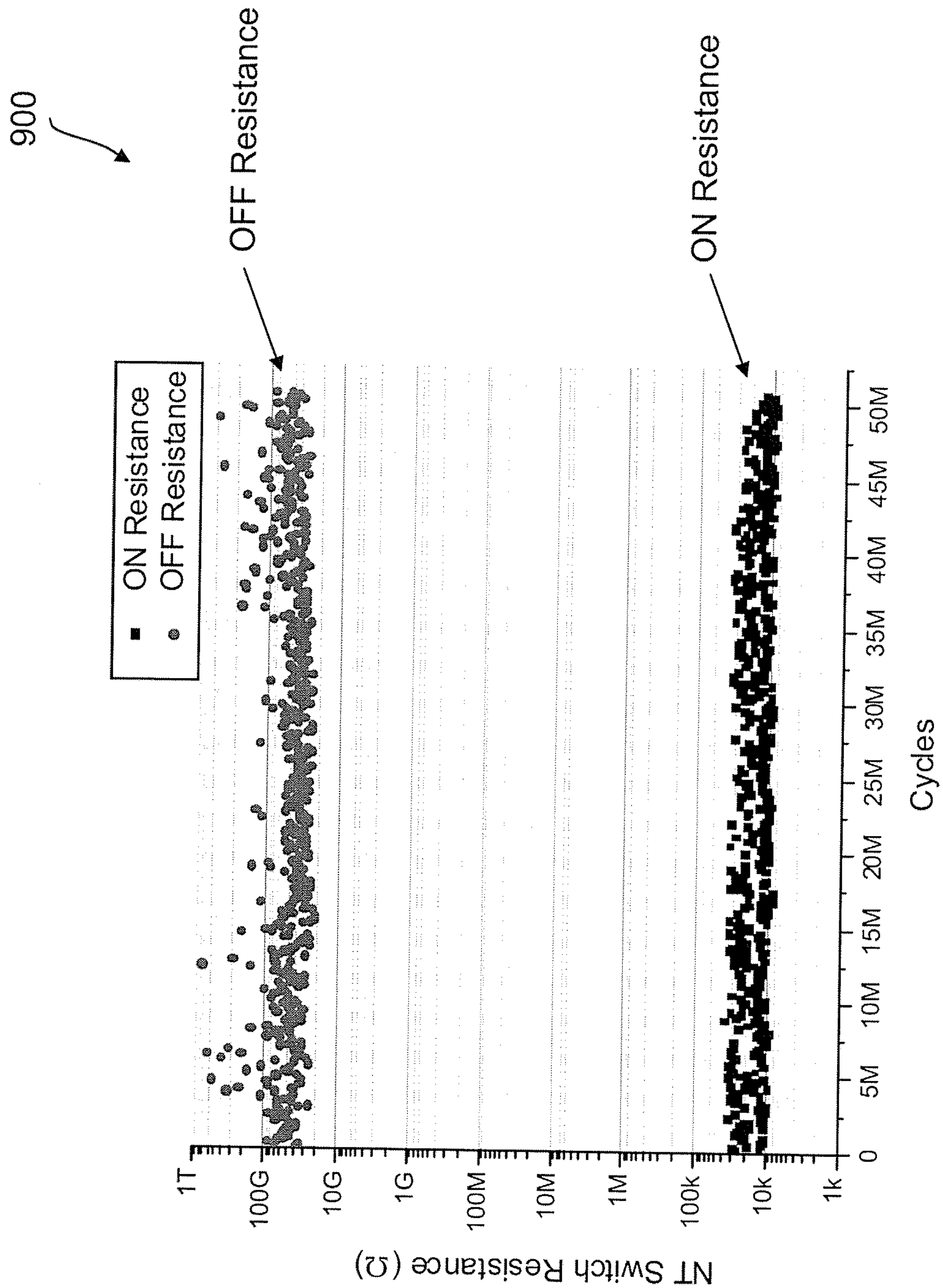
FIGS. 9A-9B illustrate ON and OFF resistance values for exemplary nanotube channel element channel lengths of 250 nm and 22 nm.

Laboratory testing results of individual fabricated nonvolatile nanotube switches, represented schematically by nonvolatile nanotube switch 800 illustrated in FIG. 8, are illustrated by graph 900 in FIG. 9A. Nonvolatile nanotube switch 800 switching results for more than 50 million ON/OFF cycles illustrated by graph 900 shows that the conducting state resistance (ON Resistance) is in the range of 10 kOhms to 50 kOhms, while the nonconducting state resistance (OFF Resistance) exceeds 10 GOhm, for greater than five orders of magnitude separation of resistance values between conducting and nonconducting states. Nonvolatile nanotube switch 800 has a patterned nanotube element with a channel length ($L_{SW-CH}$) of 250 nm. At channel lengths of 250 nm, nonvolatile nanotube switches have typical erase voltages of 8 volts and typical program voltages of 5 volts as described further below and in U.S. patent application Ser. No. 11/280,786 and U.S. patent application Ser. No. 11/835,613, entitled "Nonvolatile Resistive Memories Having Scalable Two-Terminal Nanotube Switches," filed on even date herewith.

Figure 9B:
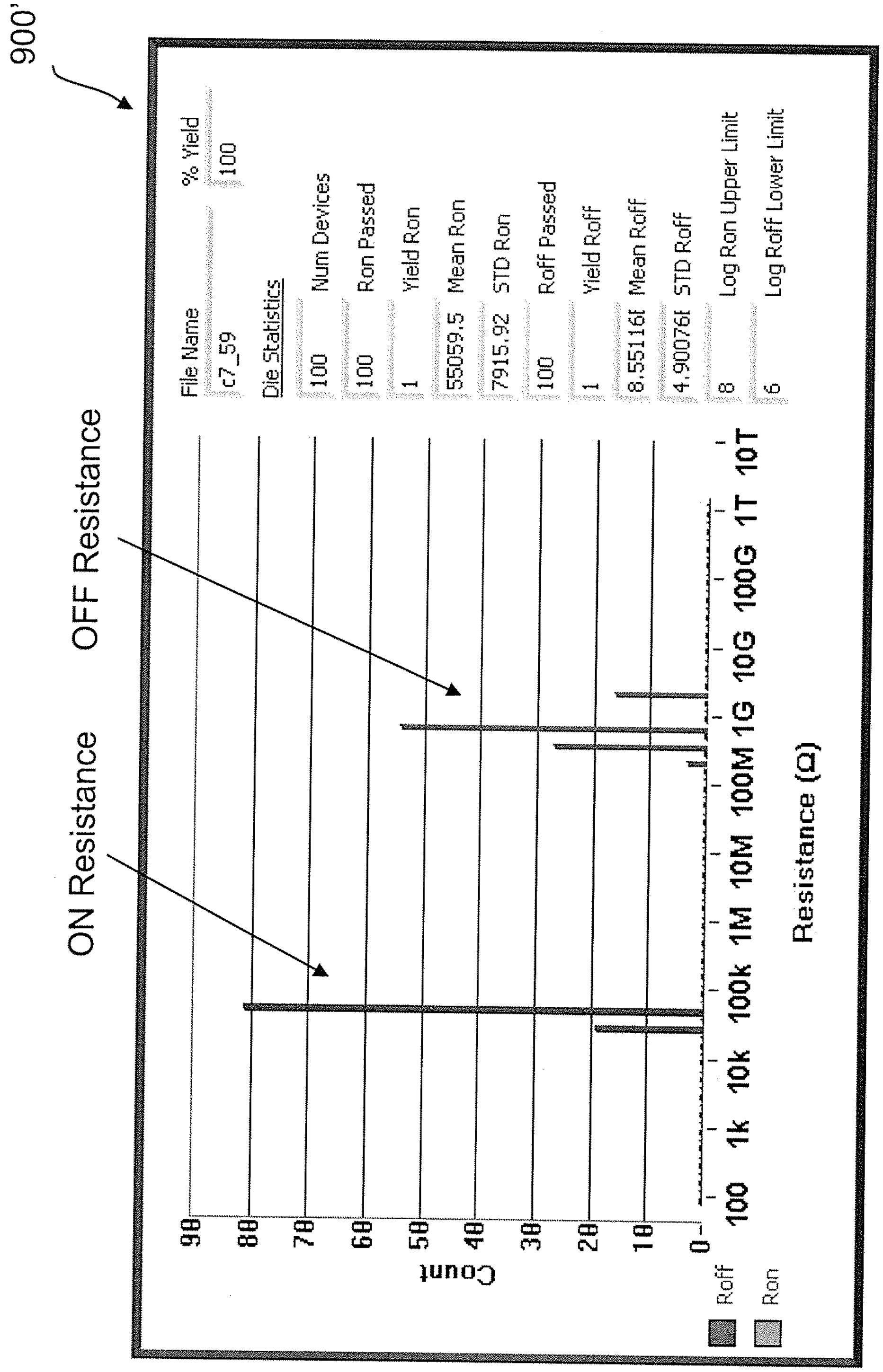

FIG. 9B illustrates cycling data 900' on fabricated devices having channel length of approximately 22 nm and channel width of approximately 22 nm. The cycling data is indicated by the count of completed cycles. Devices with channel lengths of approximately 20 nm typically have erase voltages in the 4 to 5 volt range. The particular devices characterized in FIG. 9B have an erase voltage of 5 Volts, a programming voltage of 4 Volts, and was subjected to 100 erase/program cycles. The ON resistance is well under 100 kOhms, and the OFF resistance is well above 100 MOhms.

Figure 10:
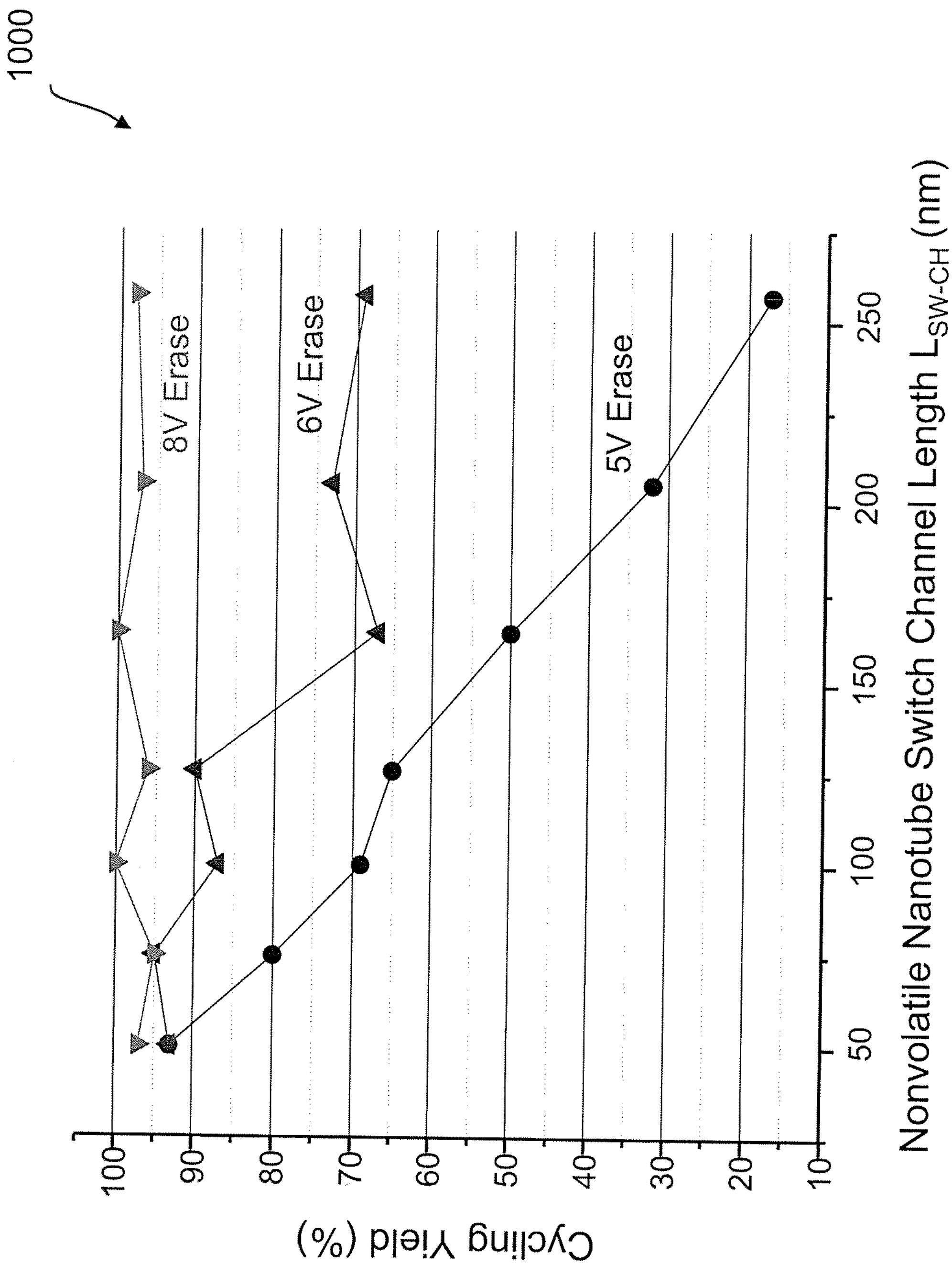
FIG. 10 illustrates nonvolatile nanotube switch erase voltage as a function of nonvolatile nanotube channel length for a plurality of exemplary nanotube switches.

FIG. 10 curves 1000 illustrate the voltage scaling effect of channel length $L_{SW-CH}$ reduction on erase voltage for a plurality of fabricated nonvolatile nanotube switches as $L_{SW-CH}$ is reduced from over 250 nm to 50 nm. $L_{SW-CH}$ refers to switch channel length as described with respect to FIGS. 3, 4, and 5. The effectiveness of channel length reduction is illustrated in terms of erase voltage as a function of channel length reduction and erase/program cycling yield, where each data point represents 22 devices and the number of ON/OFF erase/program cycles is five. Erase voltage is a strong function of channel length and is reduced (scaled) from 8 volts to 6 volts to 5 volts as the nonvolatile nanotube switch channel length is reduced from 250 to 50 nm as illustrated by curves 1000 shown in FIG. 10. Corresponding programming voltages (not shown) are less than erase voltages, typically in the range of 3 to 5 volts, for example. Erase voltage measurements on nonvolatile nanotube switches of varying channel width (data not shown) indicate no significant dependence of erase voltage on device channel width as the channel width is varied from 500 to 150 nm. Erase voltage measurements on nonvolatile nanotube switches of varying nanofabric-to-contact terminal overlap lengths (data not shown) indicate no significant dependence of erase voltage on overlap lengths, such as overlap length 660 in FIG. 6A, as overlap lengths are varied from approximately 800 to 20 nm.

Figure 11A:
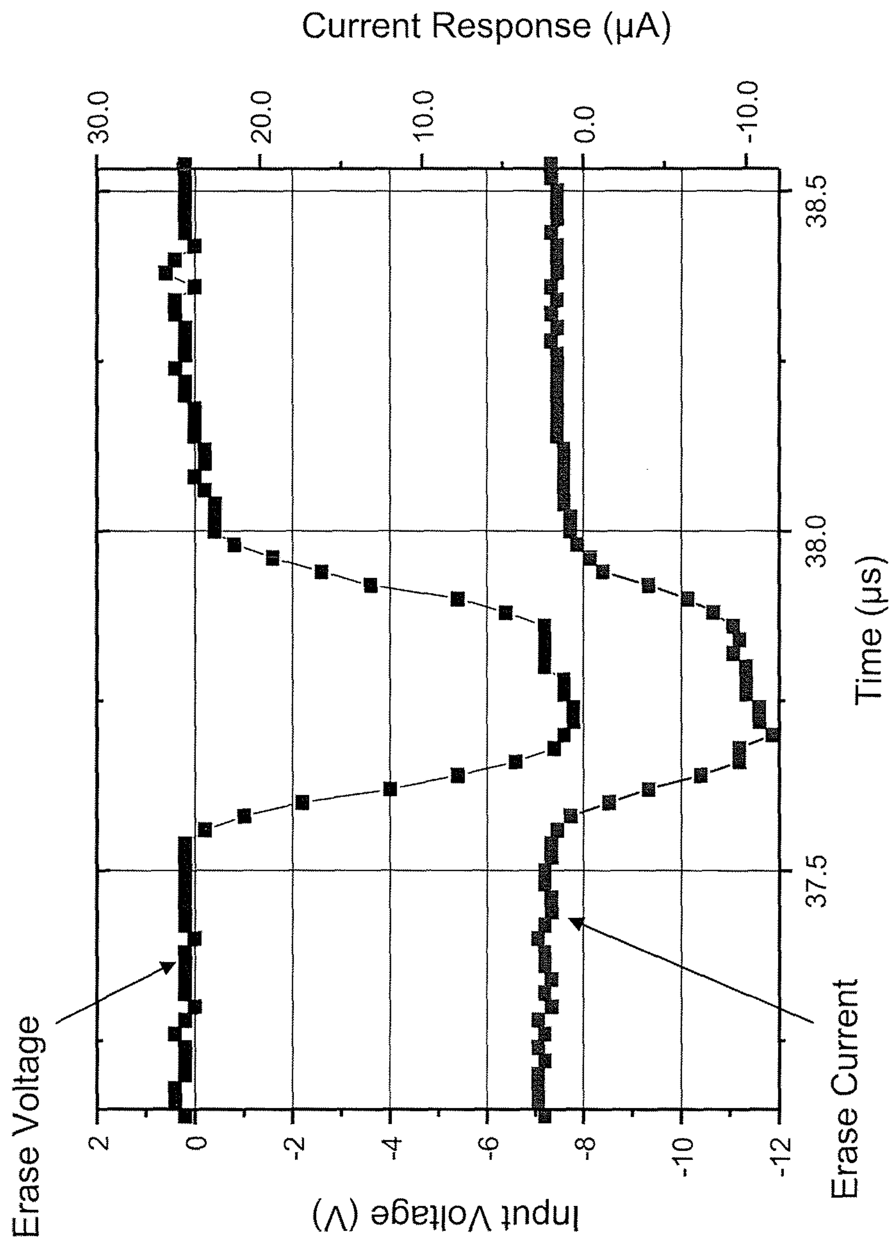
FIGS. 11A-11B illustrate nonvolatile nanotube switch voltage and current operational waveforms for erase, program, and read operating modes for an exemplary nanotube switch.

FIG. 11A shows exemplary erase waveforms 1100 of erase voltage and corresponding erase current as a function of time for a fabricated nonvolatile nanotube switch having a channel length of 250 nm with an erase voltage of 8 Volts and a corresponding erase current of 15 micro-Amperes. Note that a negative voltage was applied to the nonvolatile nanotube switch under test. Nonvolatile nanotube switches will work with positive or negative applied voltages and current flow in either direction. Erase currents are typically in the range of 1 to 50 uA, depending on the number of activated SWNTs in the patterned nanotube element in the channel region. Erase currents as the switch transitions from an ON state to an OFF state are typically not limited by a stimulus circuit.

Figure 11B:
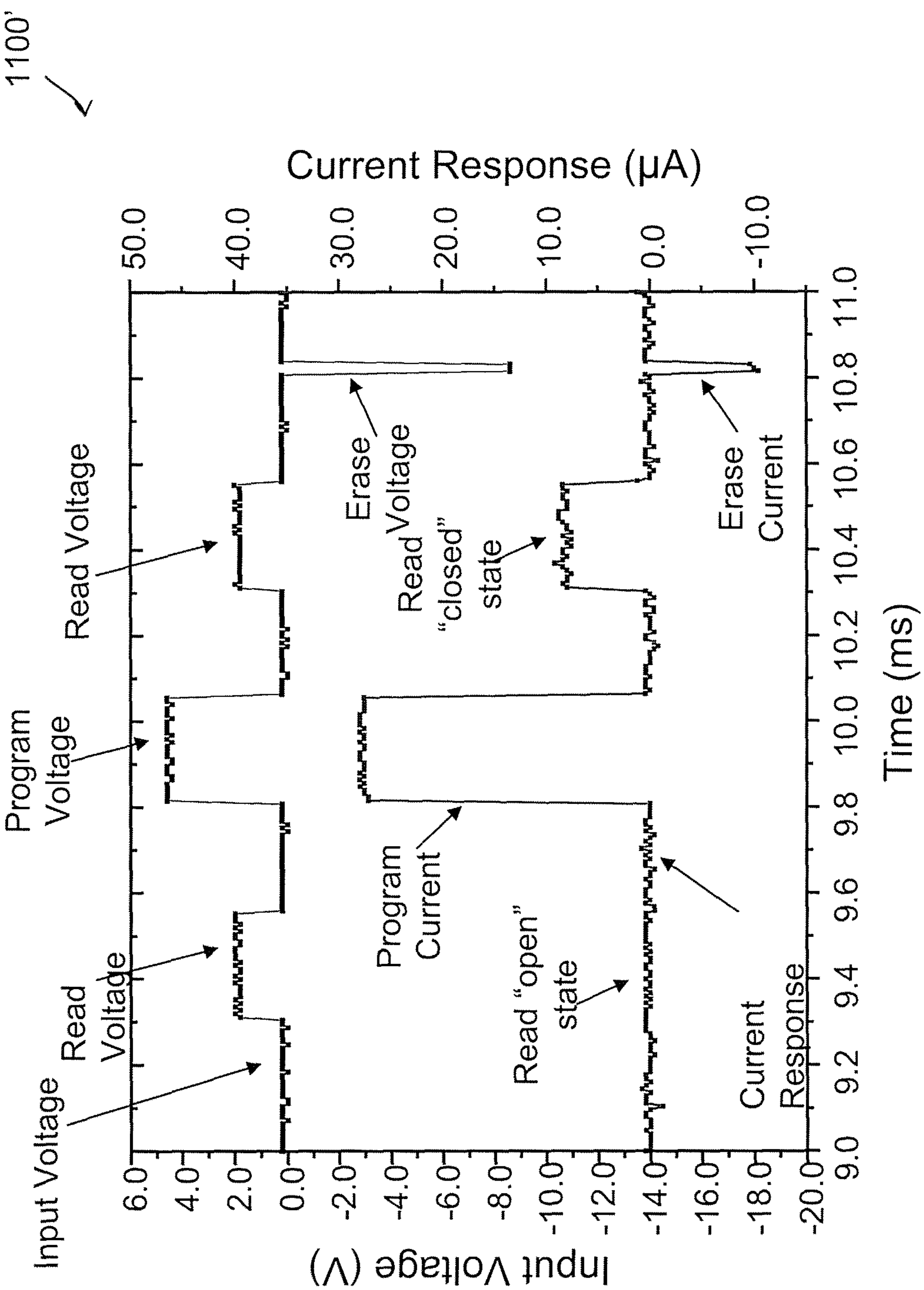

FIG. 11B shows exemplary waveforms 1100' of a full nonvolatile nanotube switch cycle including read, erase, and program operations. Erase waveforms show erase voltage and corresponding erase current as a function of time for a fabricated nonvolatile nanotube switch having a channel length of 250 nm, with an erase voltage of 8 Volts and a corresponding erase current of 10 micro-Amperes. Programming waveforms show program voltage and corresponding program current as a function of time for a nonvolatile nanotube switch having a channel length of 250 nm, with a program voltage of 5 Volts and a corresponding program current of 25 micro-Amperes. Programming currents as the switch transitions from an OFF state to an ON state are typically limited by the stimulus circuit to improve programming characteristics. Examples of programming current limitation using stimulus circuits are described in U.S. patent application Ser. No. 11/835,613, entitled "Nonvolatile Resistive Memories Having Scalable Two-Terminal Nanotube Switches," filed on even date herewith. The erase waveforms illustrated in FIG. 11A and the read, erase, and program waveform in FIG. 11B are described in more detail in U.S. patent application Ser. No. 11/280,786.

Nonvolatile nanotube switches may be fabricated to exhibit a wide range of ON Resistance values depending on switch channel length, and the number of individual nanotubes in the patterned nanotube (channel) element. Nonvolatile nanotube switches may exhibit ON Resistances in the 1 kOhm to 10 MOhm range, while OFF resistance is typically 100 MOhm or 1 GOhm or greater Nonvolatile nanotube diode devices are a series combination of a two terminal semiconductor diodes and two terminal nonvolatile nanotube switches similar to nonvolatile nanotube switches described further above with respect to FIGS. 3 to 11. Various diode types are described in the reference NG, K. K., "Complete Guide to Semiconductor Devices" Second Edition, John Wiley and Sons, 2002, the entire contents of which are incorporated herein by reference; Schottky diodes (Schottky-barrier diodes) are described in pp. 31-41; junction (PN) diodes are described in pp. 11-23; PIN diodes are described in pp. 24-41; light emitting diodes (LEDs) pp. 396-407. FET-diodes are described in the reference Baker, R. J. et al. "CMOS Circuit Design, Layout, and Simulation", IEEE Press, 1998, pp. 168-169, the entire contents of which are incorporated herein by reference.

NV NT Diode embodiments described further below typically use Schottky diodes, PN diodes and FET-diodes. However, other diode types such as PIN diodes may be combined with nonvolatile nanotube switches to form nonvolatile nanotube PIN-diodes that may enable or disable RF switching, attenuation and modulation, signal limiting, phase shifting, power rectification, and photodetection for example. Also, nonvolatile LED diodes may be combined with nonvolatile switches to form nonvolatile nanotube LED-diodes that enable or disable LED diodes and provide light output patterns stored as nonvolatile states in a nonvolatile nanotube LED-diode.

Schottky diodes typically have low forward-voltage drops, which is an advantage, and good high frequency characteristics. These characteristic plus ease of fabrication make Schottky diodes useful in a wide range of applications. A critical step in the fabrication is to prepare a clean surface for intimate contact of the metal to the semiconductor surface. Metal-on-silicon or metal silicides-on-silicon may also be used. Schottky diodes 142 illustrated in FIG. 1 and described further above and in the reference U.S. Pat. No. 4,442,507 used platinum to form a platinum silicide-on-silicon Schottky diode having a forward ON-voltage of approximately 0.4 volts and a reverse breakdown voltage of approximately 10 volts. Nonvolatile nanotube diodes described further below may be fabricated with nonvolatile nanotube switches and Schottky, PN, P-I-N, LED and other diodes such as FET-diodes in series depending on application requirements.

Figure 12:
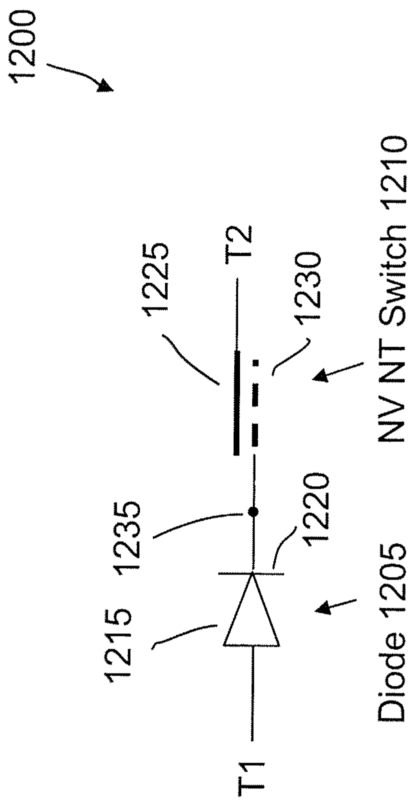
FIG. 12 illustrates a schematic diagram of an embodiment of a two terminal nonvolatile nanotube diode formed by a diode and a nonvolatile nanotube switch in series, with a cathode-to-nanotube electrical connection.

FIG. 12 illustrates an embodiment of a nonvolatile nanotube diode 1200 device formed by combining diode 1205 and nonvolatile nanotube switch 1210 in series. Terminal T1 is connected to anode 1215 of diode 1205 and terminal T2 is connected to contact 1225 of nonvolatile nanotube switch 1210. Cathode 1220 of diode 1205 is connected to contact 1230 of nonvolatile nanotube switch 1210 by contact 1235. The operation of nonvolatile nanotube diode 1200 will be explained further below.

Figure 13:
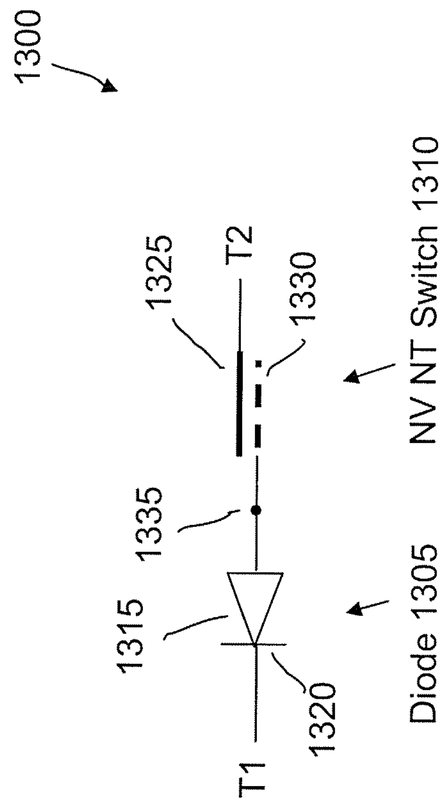
FIG. 13 illustrates a schematic diagram of an embodiment of a two terminal nonvolatile nanotube diode formed by a diode and a nonvolatile nanotube switch in series, with an anode-to-nanotube electrical connection.

FIG. 13 illustrates an embodiment of a nonvolatile nanotube diode 1300 device formed by combining diode 1305 and nonvolatile nanotube switch 1310 in series. Terminal Ti is connected to cathode 1320 of diode 1305 and terminal T2 is connected to contact 1325 of nonvolatile nanotube switch 1310. Anode 1315 of diode 1305 is connected to contact 1330 of nonvolatile nanotube switch 1310 by contact 1335.

Figure 14:
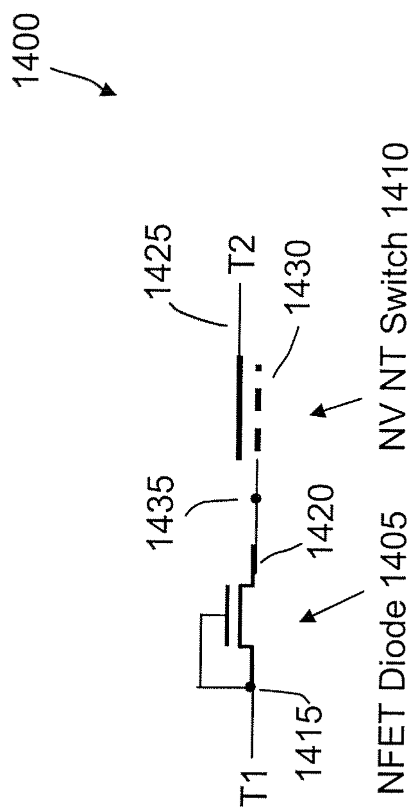
FIGS. 14 and 15 illustrate schematic diagrams of embodiments of two terminal nonvolatile nanotube diodes formed by NFET-diodes and a nonvolatile nanotube switches in series.

FIG. 14 illustrates an embodiment of a nonvolatile nanotube diode 1400 device formed by combining NFET diode 1405 and nonvolatile nanotube switch 1410 in series. Terminal T1 is connected to contact 1415 of NFET diode 1405 and terminal T2 is connected to contact 1425 of nonvolatile nanotube switch 1410. Contact 1415 is wired to both gate and a first diffusion region of an NFET to form a first NFET diode 1405 terminal. A second diffusion region 1420 forms a second terminal of NFET diode 1405. Second diffusion region 1420 of NFET diode 1405 is connected to contact 1430 of nonvolatile nanotube switch 1410 by contact 1435.

Figure 15:
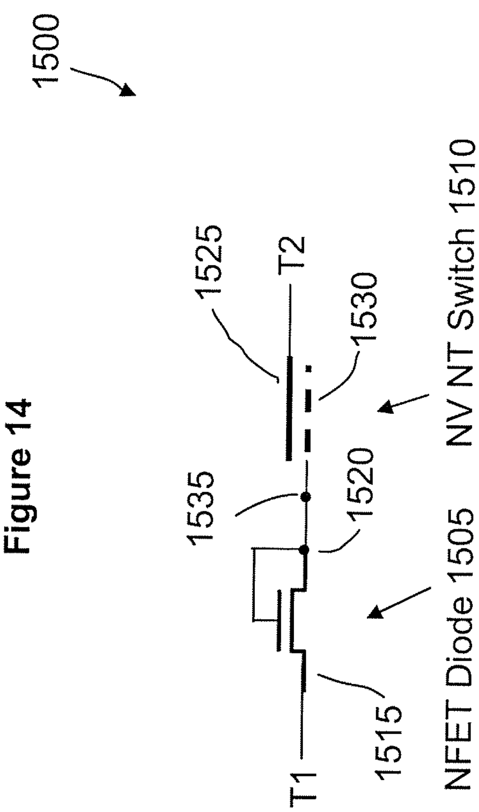

FIG. 15 illustrates an embodiment of a nonvolatile nanotube diode 1500 device formed by combining NFET diode 1505 and nonvolatile nanotube switch 1510 in series. Terminal T1 is connected to a first NFET diffusion terminal 1515 of NFET diode 1505 and terminal T2 is connected to contact 1525 of nonvolatile nanotube switch 1510. Contact 1520 is wired to both gate and a second diffusion region of an NFET to form a second NFET diode 1505 terminal. Contact 1520 of NFET diode 1505 is connected to contact 1530 of nonvolatile nanotube switch 1510 by contact 1535. The operation of nonvolatile nanotube diode 1200 will be explained further below.

Figure 16:
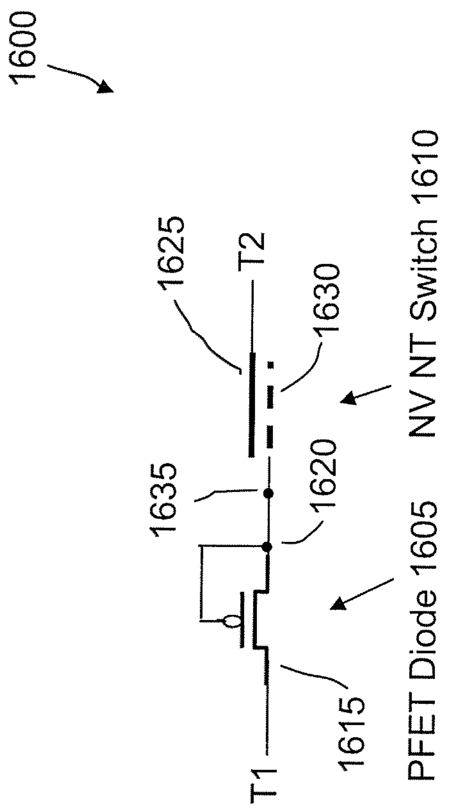
FIGS. 16 and 17 illustrate schematic diagrams of embodiments of two terminal nonvolatile nanotube diodes formed by PFET-diodes and a nonvolatile nanotube switches in series.

FIG. 16 illustrates an embodiment of a nonvolatile nanotube diode 1600 device formed by combining PFET diode 1605 and nonvolatile nanotube switch 1610 in series. Terminal T1 is connected to a first PFET diffusion terminal 1615 of PFET diode 1605 and terminal T2 is connected to contact 1625 of nonvolatile nanotube switch 1610. Contact 1620 is wired to both gate and a second diffusion region of a PFET to form a second PFET diode 1605 terminal. Contact 1620 of PFET diode 1605 is connected to contact 1630 of nonvolatile nanotube switch 1610 by contact 1635.

Figure 17:
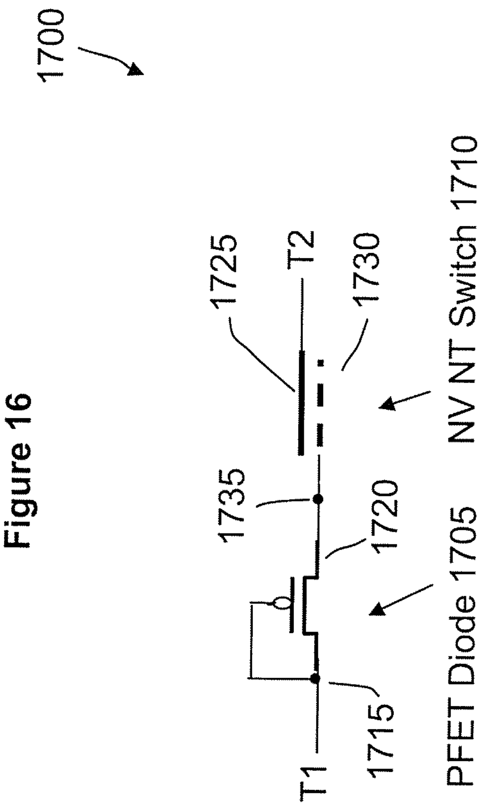

FIG. 17 illustrates an embodiment of a nonvolatile nanotube diode 1700 device formed by combining PFET diode 1705 and nonvolatile nanotube switch 1710 in series. Terminal T1 is connected to contact 1715 of PFET diode 1705 and terminal T2 is connected to contact 1725 of nonvolatile nanotube switch 1710. Contact 1715 is wired to both gate and a first diffusion region of a PFET to form a first PFET diode 1705 terminal. A second diffusion region 1720 forms a second terminal of PFET diode 1705. Second diffusion region 1720 of PFET diode 1705 is connected to contact 1730 of nonvolatile nanotube switch 1710 by contact 1735.

Operation of Nonvolatile Nanotube Diode Devices

Figure 18:
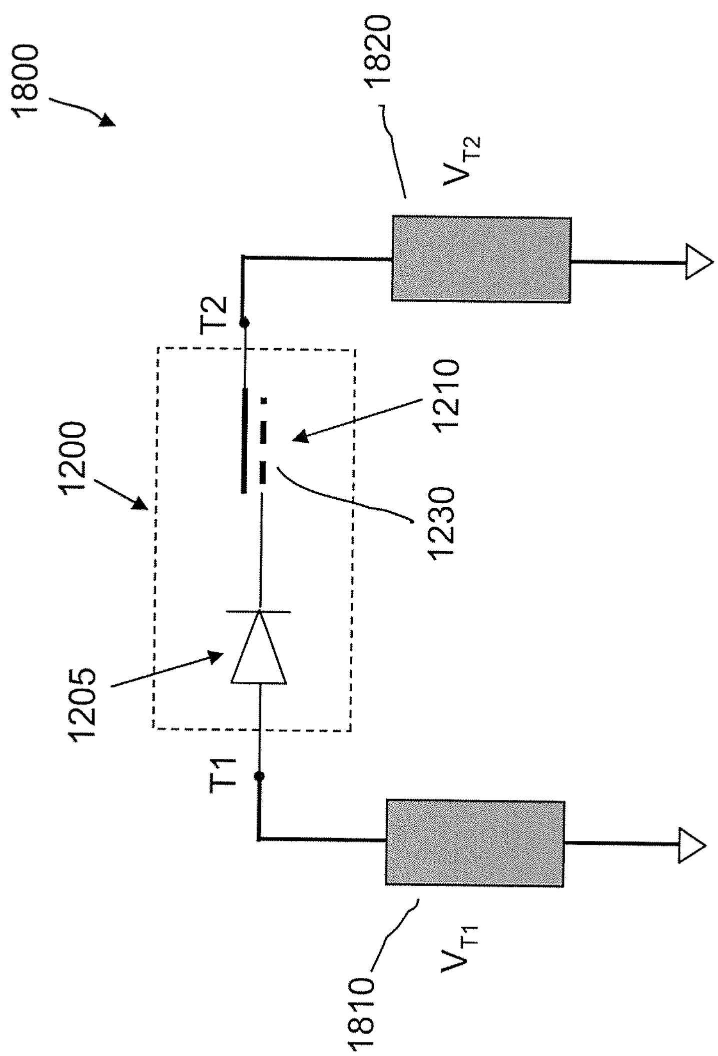
FIG. 18 illustrates an embodiment having the nonvolatile nanotube diode of FIG. 12 and two stimulus sources.

FIG. 18 illustrates an embodiment of a circuit 1800 in which stimulus circuit 1810 applies voltage $V_{T1}$ between terminal T1 of NV NT Diode 1200 and a reference terminal, ground for example, and stimulus circuit 1820 applies voltage $V_{T2}$ between terminal T2 of NV NT Diode 1200 and a reference terminal, ground for example. NV NT Diode 1200 is formed by diode 1205 and nonvolatile nanotube switch 1210 (having contact terminal 1230) in series as described further above with respect to FIG. 12.

Figure 19:
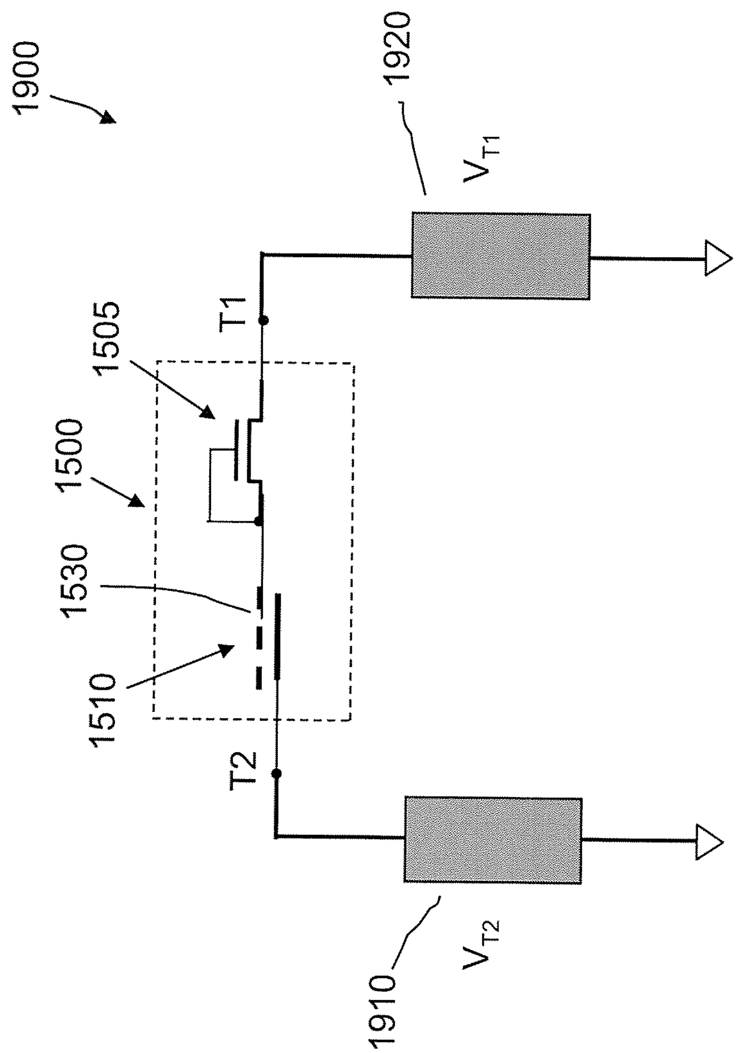
FIG. 19 illustrates an embodiment having the nonvolatile nanotube diode of FIG. 15 and two stimulus sources.

FIG. 19 illustrates an embodiment of a circuit 1900 in which stimulus circuit 1910 applies voltage $V_{T2}$ between terminal T2 of NV NT Diode 1500 (or NV NT FET-Diode 1500) and a reference terminal, ground for example, and stimulus circuit 1920 applies voltage $V_{T1}$ between terminal T1 of NV NT Diode 1500 and a reference terminal, ground for example. NV NT Diode 1500 is formed by FET diode 1505 and nonvolatile nanotube switch 1510 in series as described further above with respect to FIG. 15.

Figure 20A:
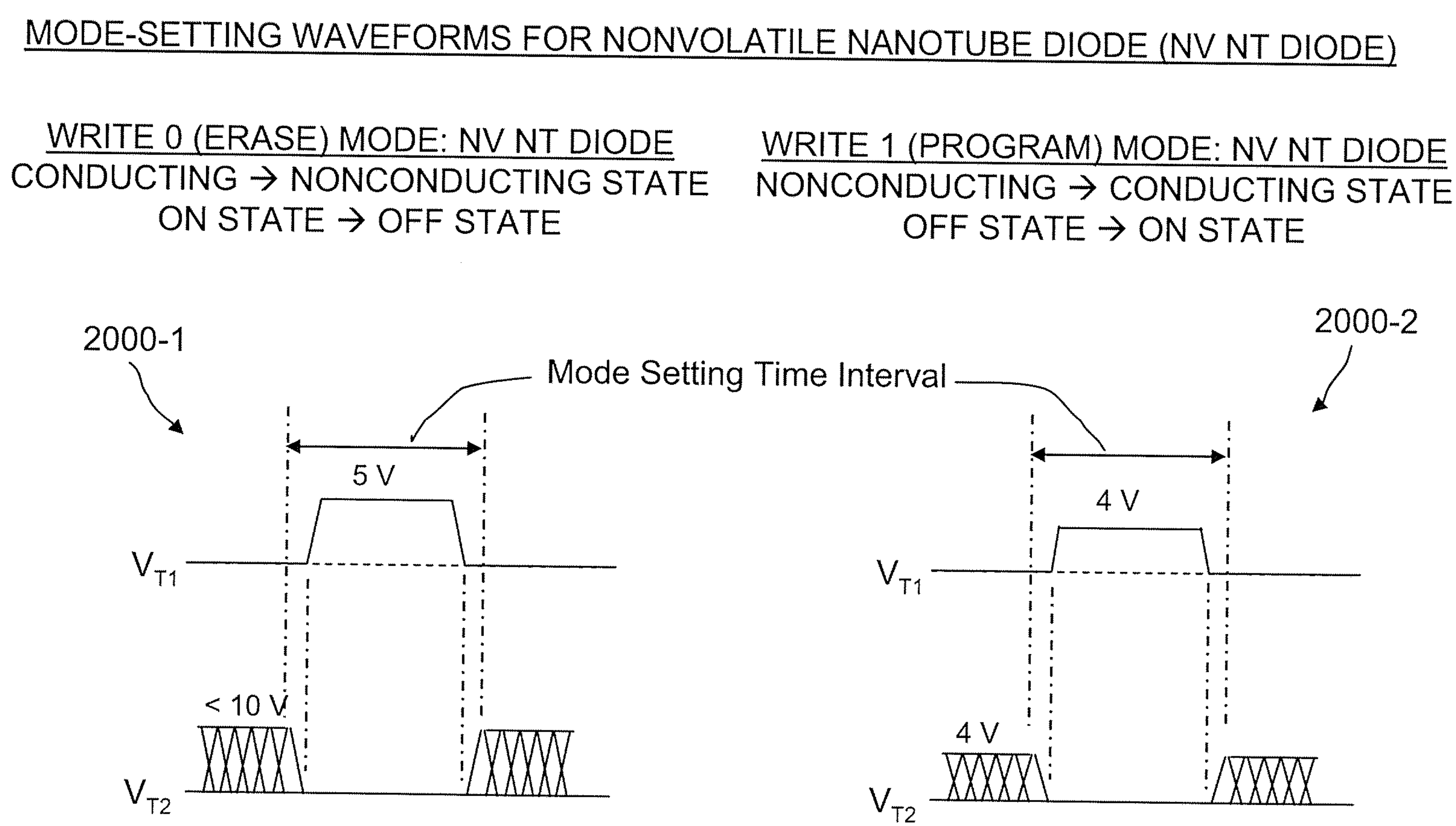
FIGS. 20A-20B illustrates mode setting waveforms for changing the nonvolatile state of nonvolatile nanotube diodes, according to some embodiments.

In an exemplary write 0 (erase) operation, referring to circuit 1800 in FIG. 18, nonvolatile nanotube diode 1200 transitions from an ON to an OFF state during a mode setting time interval when write 0 operation waveforms 2000-1 are applied as illustrated in FIG. 20A. Write 0 operation 2000-1 waveforms illustrate voltage $V_{T1}$ at a low voltage, zero volts for example, prior to initiating write 0 operation 2000-1. Voltage $V_{T2}$ may be at any voltage between zero volts and approximately 10 volts, where 10 volts is the approximate reverse bias breakdown voltage of NV NT Diode 1200. The reverse bias breakdown voltage of NV NT Diode 1200 is determined by the reverse breakdown voltage of diode 1205, which is assumed to be approximately 10 volts based on the reverse breakdown voltage of Schottky diode 142 illustrated in FIG. 1 and described in U.S. Pat. No. 4,442,507. Write 0 operation 2000-1 is not initiated by $V_{T2}$ because diode 1205 in a reverse biased mode has a high impedance which reduces voltage across and limits current flow through NV NT Switch 1210 such that write 0 operation 2000-1 voltage conditions of 4-5 volts across the terminals of NV NT Switch 1210 are not met and transition from an ON resistance state to an OFF resistance state does not take place. NV NT Switch 1210 ON resistance prior to the onset of an write 0 operation is typically in the range of 10 kOhm to 100 kOhm as illustrated in FIGS. 9A and 9B.

An exemplary write 0 operation 2000-1 during a mode setting time interval such as illustrated in FIG. 20A begins with a transition of voltage $V_{T2}$ to a low voltage such as ground. Next, voltage $V_{T1}$ transitions to an applied write 0 voltage of 5 volts. The applied write 0 voltage rise time may be relatively short such as less than 1 ns for example, or may be relatively long, in excess of 100 us for example. Stimulus circuit 1810 applies voltage $V_{T1}$ to terminal T1, and a voltage $V_{T1}$ minus the forward voltage of diode 1205 is applied to terminal 1230 of nonvolatile nanotube switch 1210. If the forward voltage bias drop of diode 1205 is assumer to be approximately 0.5 volts (similar to a forward voltage of approximately 0.4 volts for Schottky diodes used in U.S. Pat. No. 4,442,507), and since terminal T2 is held at ground, then a voltage of approximately 4.5 volts appears across NV NT Switch 1210. NV NT Switch 1210 transitions from an ON state to an OFF state if the erase threshold voltage of NV NT Switch 1210 is 4.5 volts (or less), for example. During write 0 operation 2000-1 current limiting is not required. Typical write 0 currents are less than 1 uA to 50 uA.

In an exemplary write 1 (program) operation, referring to circuit 1800 in FIG. 18, nonvolatile nanotube diode 1200 transitions from an OFF to an ON state during a mode setting time interval when write 1 operation waveforms 2000-2 are applied as illustrated in FIG. 20A. Write 1 operation 2000-2 waveforms illustrate voltage $V_{T1}$ at a low voltage; zero volts for example, prior to initiating write 0 operation 2000-2. NV NT Switch 1210 OFF resistance may be in the range of greater than 100 MOhm to greater than 10 GOhm as illustrated in FIGS. 9A and 9B. Hence, diode 1205 reverse biased resistance may be less than the NV NT Switch 1210 OFF resistance, and most of the applied write 1 voltage may appear across NV NT Switch 1210 terminals 1230 and T2 illustrated in FIG. 18. If voltage $V_{T2}$ transitions above the write 1 threshold voltage of NV NT Switch 1210, then an unwanted write 1 cycle may begin. As NV NT Switch 1210 resistance drops, back biased diode 1205 resistance become dominant and may prevent completion of a write 1 operation. However, in order to prevent a partial write 1 operation, $V_{T2}$ is limited to 4 volts for example.

An exemplary write 1 operation 2000-2 during a mode setting time interval such as illustrated in FIG. 20A begins with a transition of voltage $V_{T2}$ to a low voltage such as ground. Next, voltage $V_{T1}$ transitions to an applied write 1 voltage of 4 volts. The applied write 1 voltage rise time may be relatively short such as less than 1 ns for example, or may be relatively long, in excess of 100 μs for example. Stimulus circuit 1810 applies voltage $V_{T1}$ to terminal Ti, and a voltage $V_{T1}$ minus the forward voltage of diode 1205 is applied to terminal 1230 of NV NT Switch 1210. If the forward voltage bias drop of diode 1205 is similar to a forward voltage of approximately 0.4-0.5 volts such as Schottky diodes used in U.S. Pat. No. 4,442,507, and since terminal T2 is held at ground, then a voltage of approximately 3.5 volts appears across NV NT Switch 1210. NV NT Switch 1210 transitions from an OFF state to an ON state if the write 1 threshold voltage of NV NT Switch 1210 is 3.5 volts (or less), for example. During write 1 operation 2000-2 current limiting can be applied. Examples of stimulus circuits that include current limiting means are described in U.S. patent application Ser. No. (TBA), entitled "Nonvolatile Resistive Memories Having Scalable Two-Terminal Nanotube Switches," filed on even date herewith. Write 1 currents are typically limited to less than 1 uA to 50 uA.

Figure 20B:
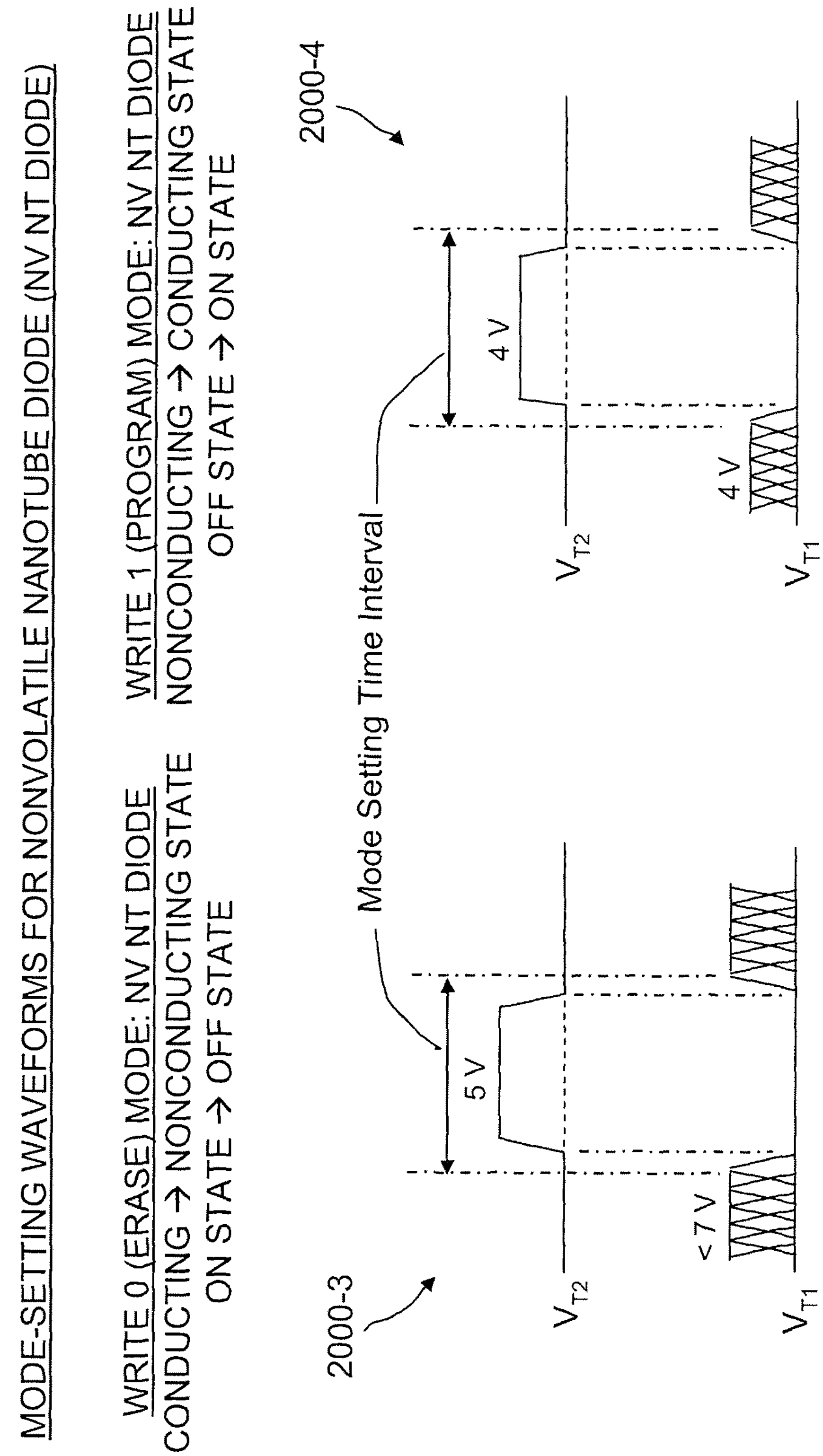

In an exemplary write 0 operation, referring to circuit 1900 in FIG. 19, nonvolatile nanotube diode 1500 (or NV NT FET-Diode 1500) transitions from an ON to an OFF state during a mode setting time interval when write 0 operation waveforms 2000-3 are applied as illustrated in FIG. 20B. Write 0 operation 2000-3 waveforms illustrate voltage $V_{T2}$ at a low voltage, zero volts for example, prior to initiating write 0 operation 2000-3. Voltage $V_{T1}$ may be at any voltage between zero volts and 7 volts, where 7 volts is the reverse bias breakdown voltage of NV NT Diode 1500. The reverse bias breakdown voltage of NV NT Diode 1500 is determined by the reverse breakdown voltage of FET diode 1505, which in this example is assumed to be 7 volts for an FET diode fabricated using a 0.18 um CMOS process. Write 0 operation 2000-3 is not initiated by $V_{T1}$ because FET diode 1505 in a reverse biased mode has a high impedance which reduces voltage across and limits current flow through NV NT Switch 1510 such that write 0 operation 2000-3 voltage conditions of 4-5 volts across the terminals of NV NT Switch 1510 are not met and transition from an ON resistance state to an OFF resistance state does not take place. NV NT Switch 1510 ON resistance prior to the onset of an write 0 operation is typically in the range of 10 kOhm to 100 kOhm as illustrated in FIGS. 9A and 9B.

An exemplary write 0 operation 2000-3 during a mode setting time interval such as illustrated in FIG. 20B begins with a transition of voltage $V_{T1}$ to a low voltage such as ground. Next, voltage $V_{T2}$ transitions to an applied write 0 voltage of 5 volts. The applied write 0 voltage rise time may be relatively short such as 1 ns for example, or may be relatively long, in excess of 100 us for example. Stimulus circuit 1910 applies voltage $V_{T2}$ to terminal T2, and a voltage $V_{T2}$ minus the forward voltage of FET diode 1505 is applied to terminal 1530 of nonvolatile nanotube switch 1510. One terminal of FET diode 1505 in circuit 1900 is connected to the lowest voltage in the circuit, ground in this example. Assuming the semiconductor substrate is also connected to ground, the FET diode 1505 threshold voltage is not increased by voltages applied to FET diode 1505 relative to a corresponding semiconductor substrate. Using semiconductor fabrication methods to control device characteristics such as oxide thickness and channel ion implantation dosage, FET diode 1505 turn-on voltage may be adjusted to be less than 0.5 volts. If the forward bias voltage drop of FET diode 1505 is less than 0.5 volts, then a voltage greater than 4.5 volts appears across NV NT Switch 1510. NV NT Switch 1510 transitions from an ON state to an OFF state if the write 0 threshold voltage of NV NT Switch 1510 is 4.5 volts (or less), for example. During write 0 operation 2000-3 current limiting is not required. Typical write 0 currents are less than 1 uA to 50 uA.

In an exemplary write 1 operation, referring to circuit 1900 in FIG. 19, nonvolatile nanotube diode 1500 (NV NT FET-Diode 1500) transitions from an OFF to an ON state during a mode setting time interval when write 1 operation waveforms 2000-4 are applied as illustrated in FIG. 20AB. Write 1 operation 2000-4 waveforms illustrate voltage $V_{T2}$ at a low voltage; zero volts for example, prior to initiating write 1 operation 2000-4. NV NT Switch 1510 OFF resistance may be in the range of greater than 100 MOhm to greater than 10 GOhm as illustrated in FIGS. 9A and 9B. Hence, FET diode 1505 reverse biased resistance may be less than the NV NT Switch 1510 OFF resistance, and most of the applied write 1 voltage may appear across NV NT Switch 1510 terminals 1530 and T2 illustrated in FIG. 19. If voltage $V_{T1}$ transitions above the write 1 threshold voltage of NV NT Switch 1510, then an unwanted write 1 cycle may begin. As NV NT Switch 1510 resistance drops, back biased FET diode 1505 resistance becomes dominant and may prevent completion of a write 1 operation. However, in order to prevent a partial write 1 operation, $V_{T1}$ is limited to 4 volts for example.

An exemplary write 1 operation 2000-4 during a mode setting time interval such as illustrated in FIG. 20B begins with a transition of voltage $V_{T1}$ to a low voltage such as ground. Next, voltage $V_{T2}$ transitions to an applied write 1 voltage of 4 volts. The applied write 1 voltage rise time may be relatively short such as less than 1 ns for example, or may be relatively long, in excess of 100 us for example. Stimulus circuit 1910 applies voltage $V_{T2}$ to terminal T2, and a voltage $V_{T2}$ minus the forward voltage of FET diode 1505 is applied to terminal 1530 of NV NT Switch 1510. One terminal of FET diode 1505 in circuit 1900 is connected to the lowest voltage in the circuit, ground in this example. Assuming the semiconductor substrate is also connected to ground, the FET diode 1505 threshold voltage is not increased by voltages applied to FET diode 1505 relative to a corresponding semiconductor substrate. Using semiconductor fabrication methods to control device characteristics such as oxide thickness and channel ion implantation dosage, FET diode 1505 turn-on voltage may be adjusted to be less than 0.5 volts. If the forward bias voltage drop of FET diode 1505 is less than 0.5 volts, then a voltage greater than 4.5 volts appears across NV NT Switch 1510. NV NT Switch 1510 transitions from an OFF state to an ON state if the write 1 threshold voltage of NV NT Switch 1510 is 3.5 volts (or less), for example. During write 1 operation 2000-4 current limiting can be applied. Examples of stimulus circuits that include current limiting means are described in U.S. patent application Ser. No. 11/835,613, entitled "Nonvolatile Resistive Memories Having Scalable Two-Terminal Nanotube Switches," filed on even date herewith. Write 1 currents are typically limited to less than 1 uA to 50 uA.

One alternative to using a stimulus circuit with current limiting is to design FET diode 1505 to limit current. That is, NV NT Diode 1500 has a built-in current limit determined by the design of sub-component FET Diode 1505. FET diode examples are shown in the reference Baker, R. et al., "CMOS Circuit Design, Layout, and Simulation", IEEE Press, 1998, pp. 165-171.

Figure 21A:
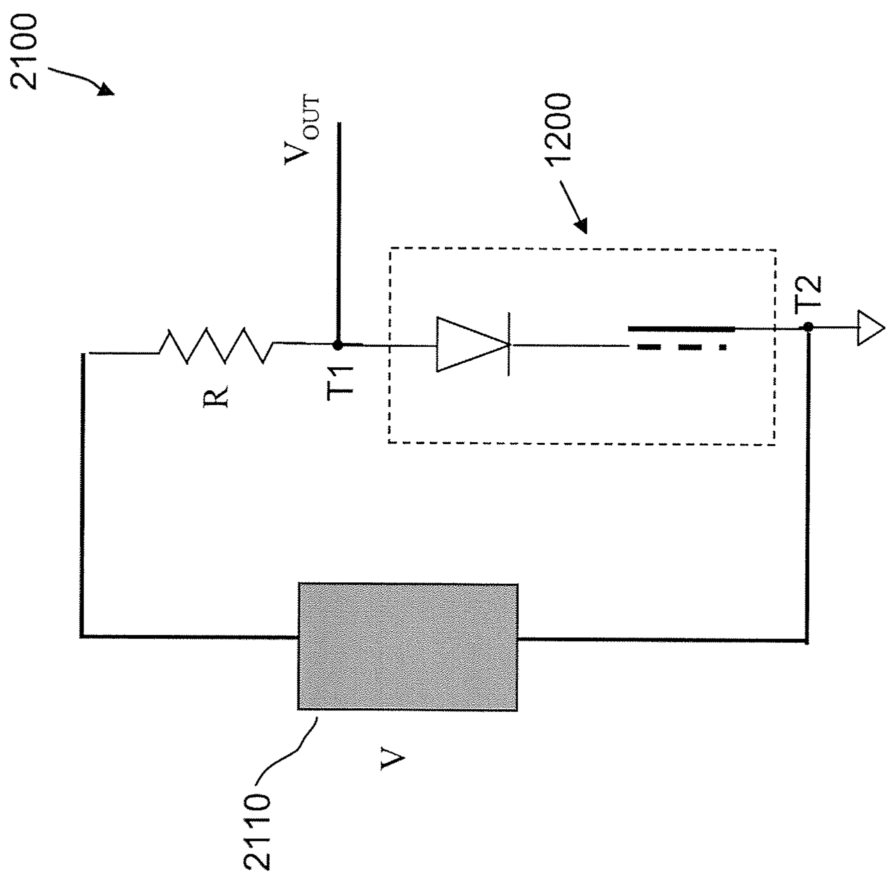
FIGS. 21A-21E illustrate a circuit and device electrical characteristics of nonvolatile nanotube diodes similar to the nonvolatile nanotube diode illustrated in FIG. 12, according to some embodiments.

FIG. 21A illustrates an embodiment of a circuit 2100 in which stimulus circuit 2110 applies voltage V to one terminal of resistor R. The other terminal of resistor R is connected to terminal T1 of NV NT Diode 1200. Terminal T2 of NV NT Diode 1200 is connected to a common reference voltage, ground for example. NV NT Diode 1200 is formed by a diode in series with a NV NT Switch as described further above with respect to FIG. 12. The output of circuit 2100 is terminal T1 voltage $V_{OUT}$.

Figure 21B:
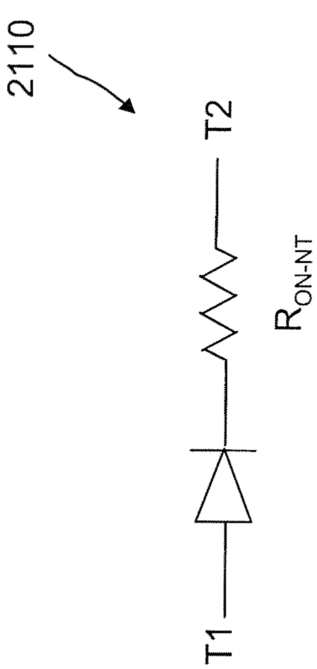
Figure 21C:
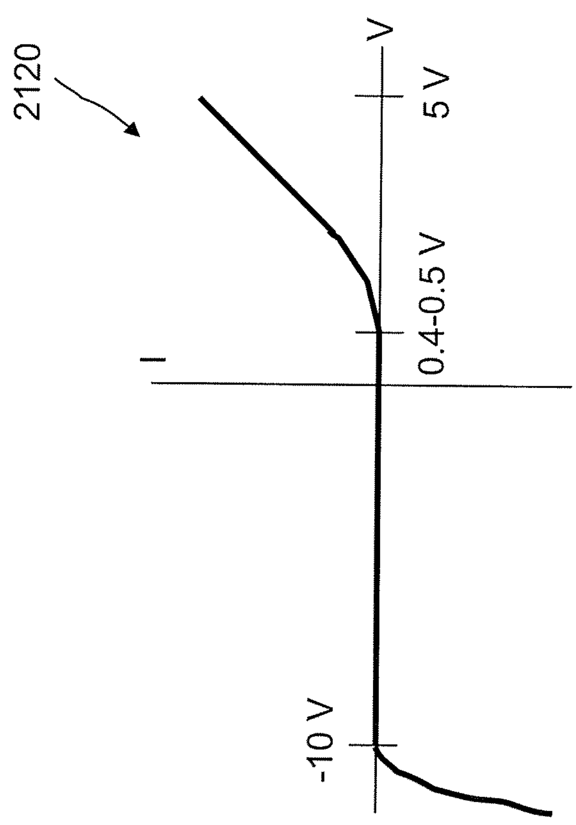

FIG. 21B illustrates equivalent circuit embodiment 2110 for NV NT diode 1200 in an ON state. Equivalent circuit 2110 corresponds to NV NT Switch 600 in the ON state as illustrated in FIG. 6A. FIG. 21C illustrates I-V electrical characteristics 2120 of nonvolatile nanotube diode 1200 in the ON state. The NV NT diode 1200 turn-on voltage is approximately 0.4 to 0.5 volts, for example. After turn-on, the slope of the I-V curve corresponds to the ON resistance of NV NT switch 1210, where $R_{ON\text{-}NT}$ is typically in the range of 10 k Ohms to 100 kOhms as illustrated in FIGS. 9A-9B. (Note that the I-V curve is graphed on scale of −10 volts to 5 volts.)

Figure 21D:
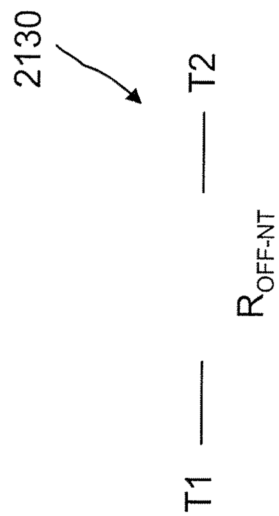
Figure 21E:
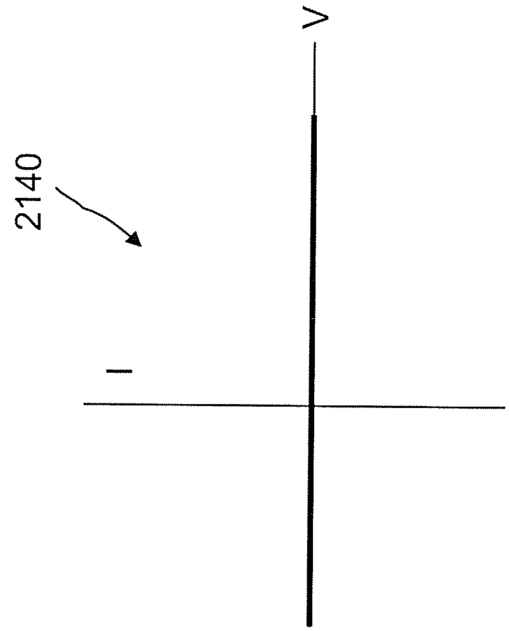

FIG. 21D illustrates equivalent circuit embodiment 2130 of NV NT diode 1200 in an OFF state. The equivalent circuit corresponds to NV NT Switch 600' in the OFF state as illustrated in FIG. 6B. FIG. 21E illustrates the I-V electrical characteristics 2140 of nonvolatile nanotube diode 1200 in the OFF state. I-V characteristic 2140 corresponds to $R_{OFF\text{-}NT}$ of greater than 100 MOhm for some NV NT switches, and greater than 10 GOhms for other NV NT switches illustrated in FIGS. 9A-9B.

Figure 22:
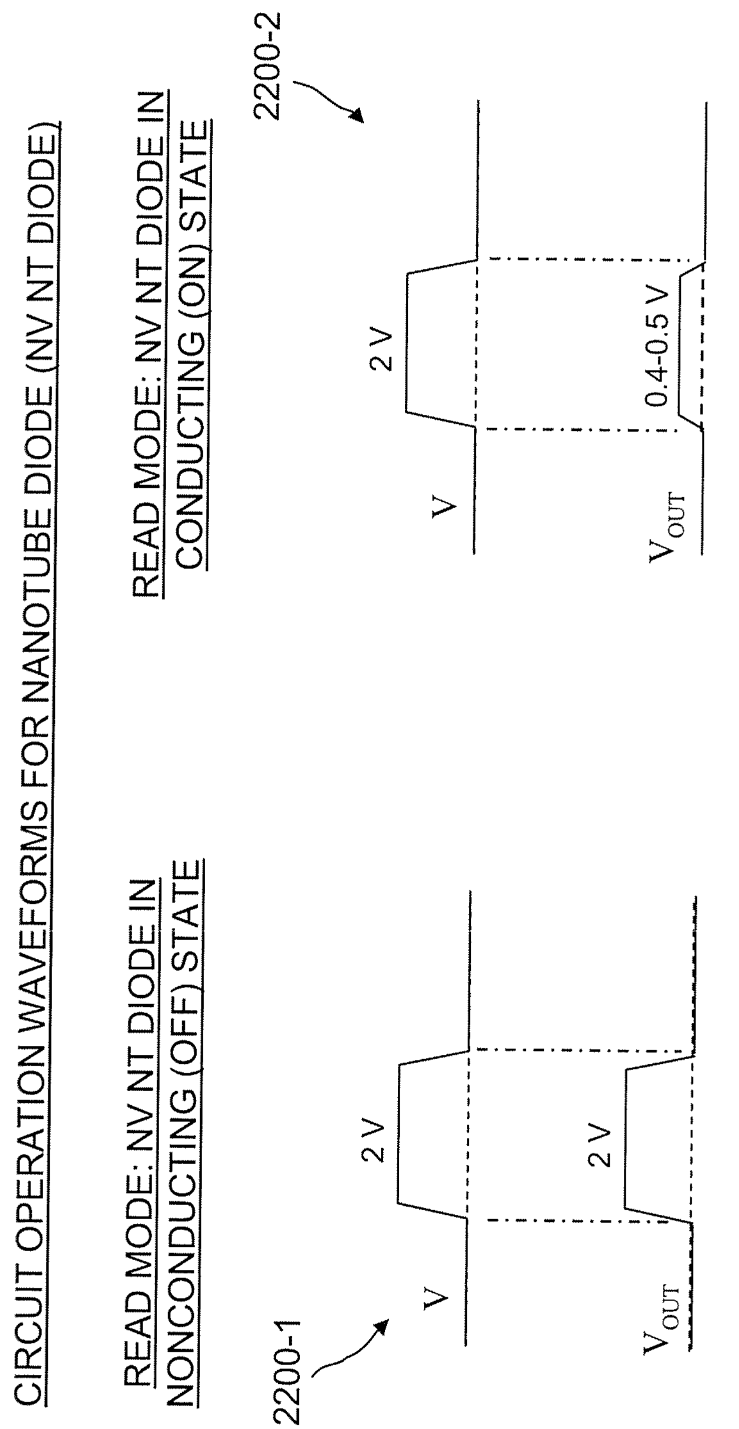
FIG. 22 illustrates circuit operating waveforms of the circuit shown in FIG. 21A, according to some embodiments.

In an exemplary read operation, referring to circuit 2100 in FIG. 21A, output voltage $V_{OUT}$ will be a high voltage if NV NT Diode 1200 is in a high OFF resistance state; and output voltage $V_{OUT}$ will be low if NV NT Diode 1200 is in a low ON resistance state as illustrated in FIG. 22. In this example, R is assumed to be much larger than the ON resistance of NV NT Diode 1200 and much smaller than the OFF resistance of NV NT Diode 1200. Since the ON resistance of NV NT Diode 1200 may be in the range of 10 kOhm to 100 kOhm and the OFF resistance of NV NT Diode 1200 may be greater than 100 MOhm to 10 GOhms and higher as described further above, then R may be chosen as 1 MOhm, for example.

In an exemplary read operation in which NV NT Diode 1200 is in an OFF state, the OFF resistance of NV NT Diode 1200 is much greater than resistance R and when applying read voltage waveforms 2200-1 illustrated in FIG. 22 to circuit 2100 results in a $V_{OUT}$ transition from zero to 2 volts when input V transitions from 0 to 2 volts. This is because resistance R of 1 M Ohm is much smaller than NV NT Diode 1200 resistance of 100 MOhms to 10 GOhms or more.

In an exemplary read operation in which NV NT Diode 1200 is in an ON state, the ON resistance of NV NT Diode 1200 is much less than resistance R and when applying read voltage waveforms 2200-2 illustrated in FIG. 22 to circuit 2100 results in a $V_{OUT}$ transition from zero to 0.4-0.5 volts when input V transitions from 0 to 2 volts. This is because resistance R of 1 M Ohm is larger than the ON resistance of NV NT Diode 1200. The low voltage value of $V_{OUT}$ is 0.4-0.5 volts because that is the forward voltage of NV NT Diode 1200. As explained further above, the forward voltage occurs because diode 1205 is a sub-component of NV NT Diode 1200 as explained further above with respect to FIGS. 12 and 21A-21E.

Figure 23A:
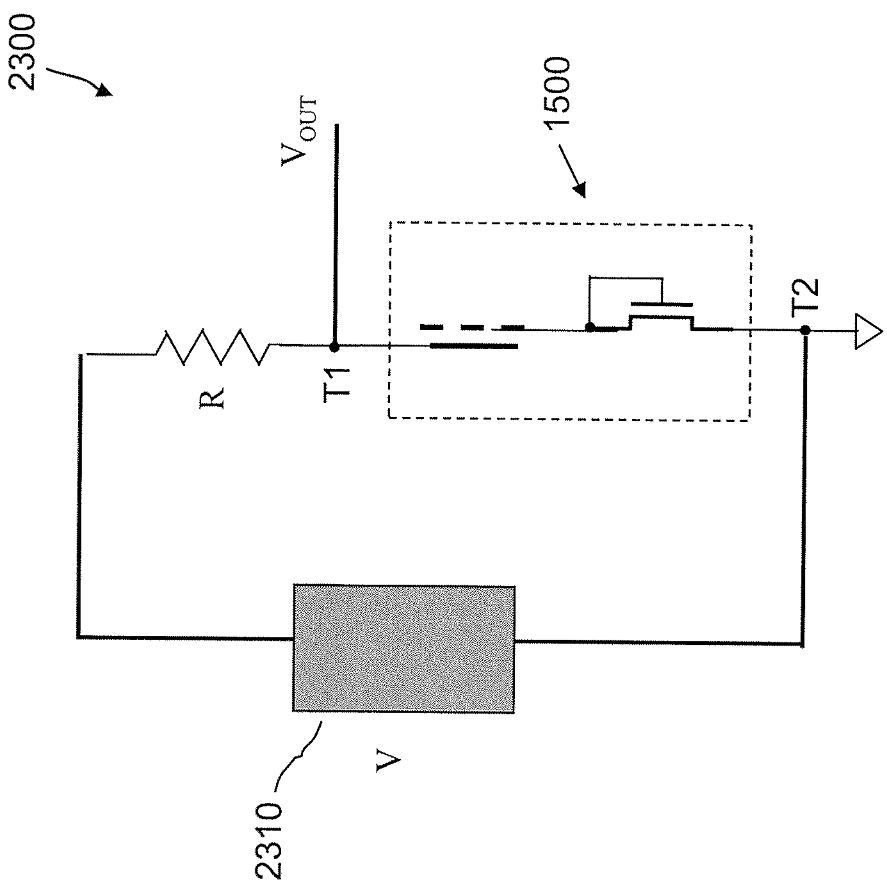
FIG. 23A illustrates an embodiment of a circuit using nonvolatile nanotube diodes similar to the nonvolatile nanotube diode illustrated in FIG. 15.

FIG. 23A illustrates an embodiment of a circuit 2300 in which stimulus circuit 2310 applies voltage V to one terminal of resistor R. The other terminal of resistor R is connected to terminal T1 of NV NT Diode 1500. Terminal T2 of NV NT Diode 1500 is connected to a common reference voltage, ground for example. NV NT Diode 1500 is formed by an FET diode in series with a NV NT Switch as described further above with respect to FIG. 15. The output of circuit 2300 is terminal T1 voltage $V_{OUT}$.

Figure 23B:
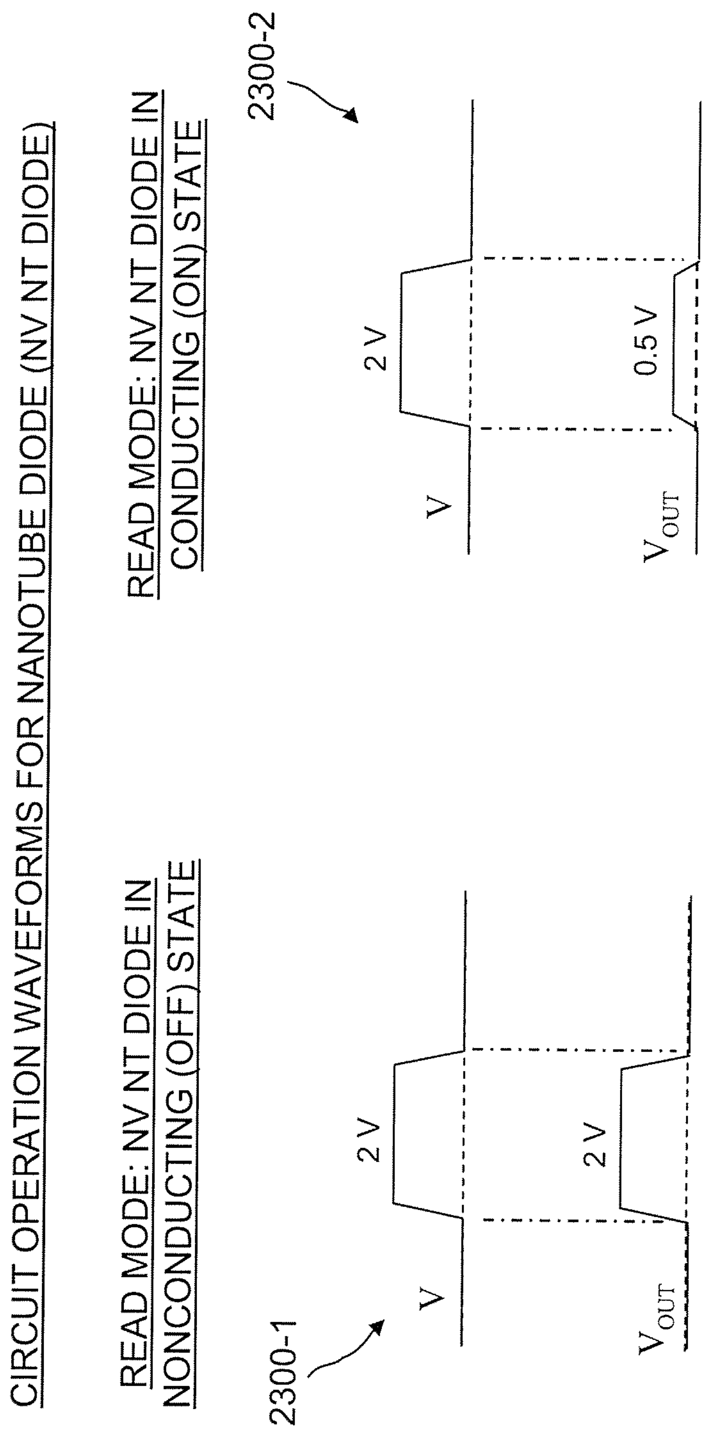
FIG. 23B illustrates circuit operating waveforms of the circuit shown in FIG. 23A, according to some embodiments.

In a read operation, referring to circuit 2300 in FIG. 23A, output voltage $V_{OUT}$ will be a high voltage if NV NT Diode 1500 (NV NT FET-Diode 1500) is in a high OFF resistance state; and output voltage $V_{OUT}$ will be low if NV NT Diode 1500 is in a low ON resistance state as illustrated in FIG. 23B. In this example, R is assumed to be much larger than the ON resistance of NV NT Diode 1500 and much smaller than the OFF resistance of NV NT Diode 1500. Since the ON resistance of NV NT Diode 1500 may be in the range of 10 kOhm to 100 kOhm and the OFF resistance of NV NT Diode 1500 may be greater than 100 MOhm to 10 GOhms and higher as described further above, then R may be chosen as 1 MOhm, for example.

In an exemplary read operation in which NV NT Diode 1500 is in an OFF state, the OFF resistance of NV NT Diode 1500 is much greater than resistance R and when applying read voltage waveforms 2300-1 illustrated in FIG. 23B to circuit 2300 results in a $V_{OUT}$ transition from zero to 2 volts when input V transitions from 0 to 2 volts. This is because resistance R of 1 M Ohm is much smaller than NV NT Diode 1500 resistance of 100 MOhms to 10 GOhms or more.

In an exemplary read operation in which NV NT Diode 1500 is in an ON state, the ON resistance of NV NT Diode 1500 is much less than resistance R and when applying read voltage waveforms 2300-2 illustrated in FIG. 23B to circuit 2300 results in a $V_{OUT}$ transition from zero to 0.5 volts when input V transitions from 0 to 2 volts. This is because resistance R of 1 M Ohm is larger than the ON resistance of NV NT Diode 1500. The low voltage value of $V_{OUT}$ is 0.5 volt because that is the forward voltage of NV NT Diode 1500. As explained further above, the forward voltage occurs because FET diode 1505 is a sub-component of NV NT Diode 1500.

Figure 24:
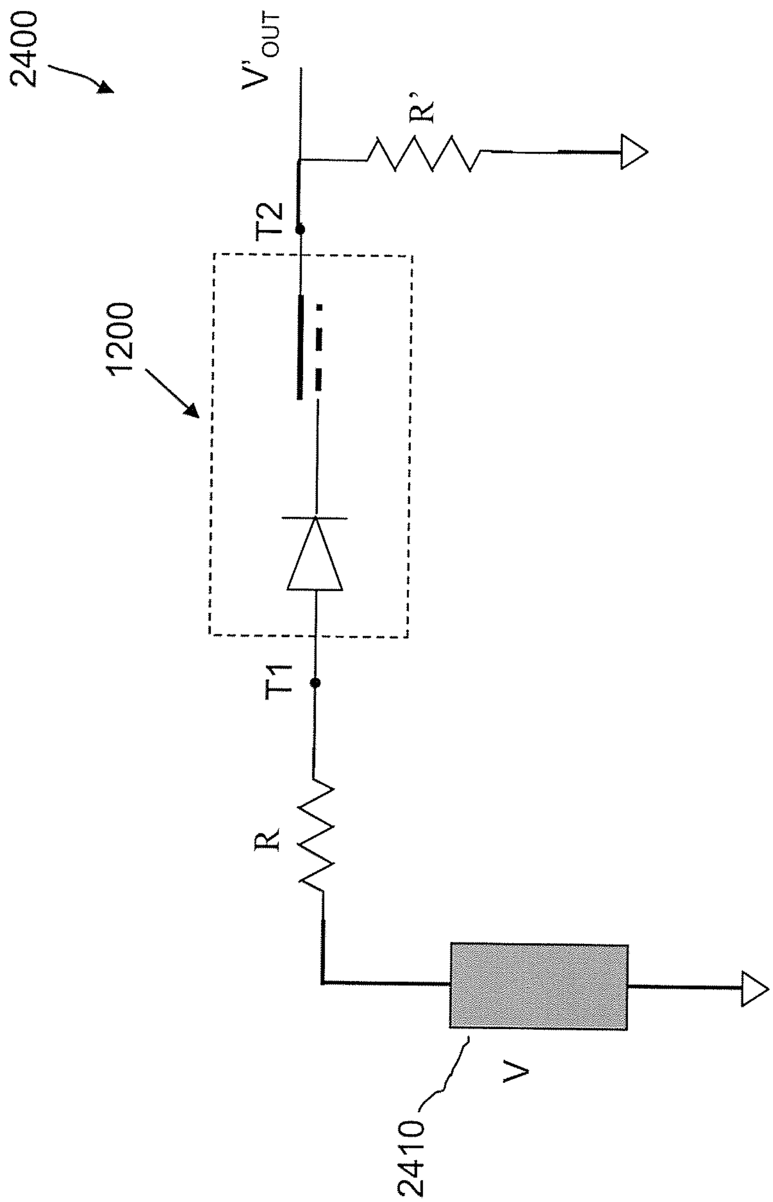
FIG. 24 illustrates an embodiment of a transfer circuit using a nonvolatile nanotube diode corresponding to the nonvolatile nanotube diode of FIG. 12.

FIG. 24 illustrates an embodiment of a circuit 2400 in which NV NT Diode 1200 includes a nonvolatile two terminal transfer device. Stimulus circuit 2410 applies voltage V to one terminal of resistor R. The other terminal of resistor R is connected to terminal T1 of NV NT Diode 1200. Terminal T2 of NV NT Diode 1200 is connected to one terminal of second resistor R' the other terminal of resistor R' is connected to a common reference voltage, ground for example. NV NT Diode 1200 is formed by a diode in series with a NV NT switch as described further above with respect to FIG. 12. An equivalent circuit and I-V characteristics for NV NT diode 1200 is illustrated in FIGS. 21A-21E. The output of circuit 2400 is terminal T2 voltage $V'_{OUT}$.

Figure 25:
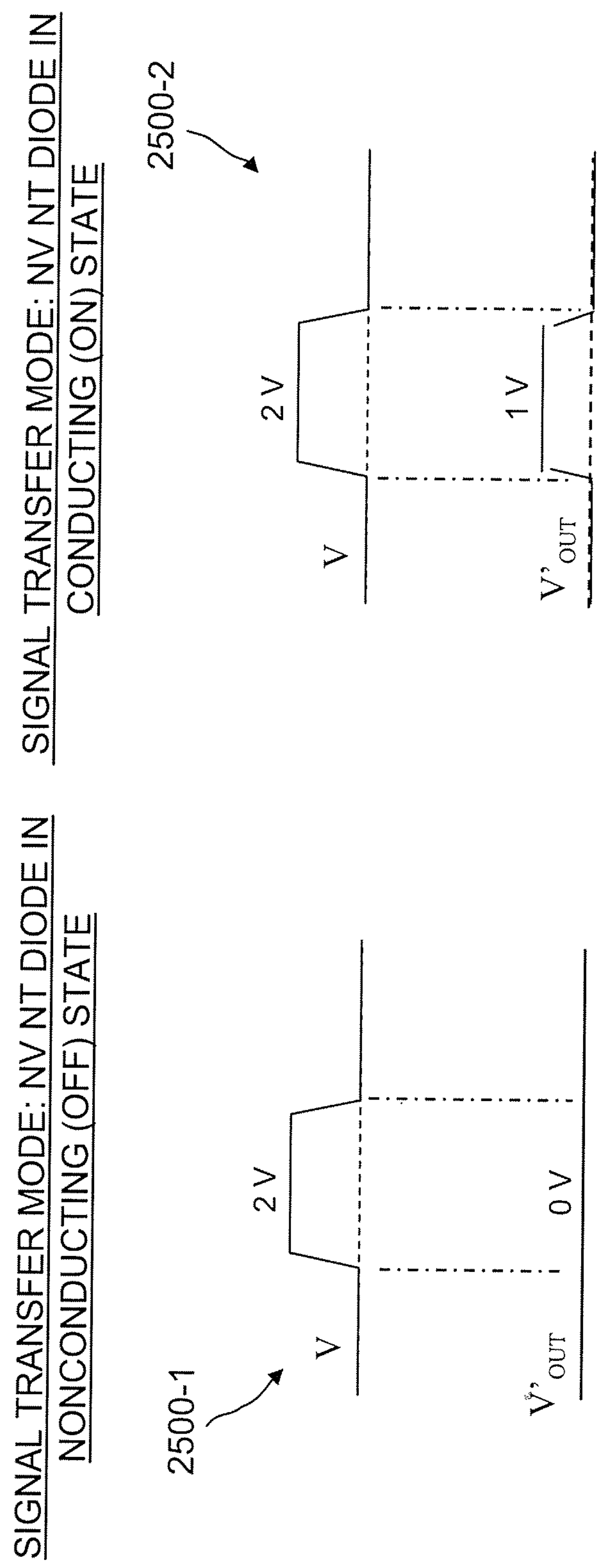
FIG. 25 illustrates the circuit operating waveforms of the circuit shown in FIG. 24, according to some embodiments.

In an exemplary signal transfer operation, referring to circuit 2400 in FIG. 24, output voltage $V_{OUT}$ will be a low voltage if NV NT Diode 1200 is in a high OFF resistance state; and output voltage $V_{OUT}$ will be high if NV NT Diode 1200 is in a low ON resistance state as illustrated in FIG. 25. In this example, R is assumed to be much larger than the ON resistance of NV NT Diode 1200 and much smaller than the OFF resistance of NV NT Diode 1200. Since the ON resistance of NV NT Diode 1200 may be in the range of 10 kOhm to 100 kOhm and the OFF resistance of NV NT Diode 1200 may be greater than 100 MOhm to 10 GOhms and higher as described further above, then R may be chosen as 1 MOhm, for example. In this example, resistor R' is assumed to be equal to resistor R.

In an exemplary signal transfer operation in which NV NT Diode 1200 is in an OFF state, the OFF resistance of NV NT Diode 1200 is much greater than resistance R and applying signal transfer voltage waveforms 2500-1 illustrated in FIG. 25 to circuit 2400 results in a $V_{OUT}$ remaining at approximately zero volts when input V transitions from 0 to 2 volts. This is because resistance R (in FIG. 24) of 1 M Ohm is much smaller than NV NT Diode 1200 resistance of 100 MOhms to 10 GOhms or more and voltage V appears across NV NT Diode 1200; resistor R' (in FIG. 24) is also 1 M Ohm.

In an exemplary signal transfer operation in which NV NT Diode 1200 is in an ON state, the ON resistance of NV NT Diode 1200 is much less than resistance R and applying read voltage waveforms 2500-2 illustrated in FIG. 25 to circuit 2400 results in voltage V dividing between two equal resistance values R and R' of 1 M Ohm. $V'_{OUT}$ transition from zero to approximately 1 volt when input V transitions from 0 to 2 volts. This is because resistance R of 1 M Ohm is larger than the ON resistance of NV NT Diode 1200, and with resistance R' also equal to 1 MOhm, signal transfer circuit 2400 with NV NT Diode 1200 in the ON state behaves as a 2:1 voltage divider.

Nonvolatile Memories using Nonvolatile Nanotube Diode (NV NT Diode) Devices as Cells A bit-selectable nonvolatile nanotube-based memory array described further below includes a plurality of memory cells, each cell receiving a bit line and a word line. Each memory cell includes a selection diode with anode and cathode terminals (nodes). Each cell further includes a two terminal nonvolatile nanotube switch device, the state of which manifests the logical state of the cell. The combined diode and nonvolatile nanotube switch is referred to as a nonvolatile nanotube diode (NT Diode) as described further above. Each memory cell is formed using one nonvolatile nanotube diode. The state of the nonvolatile nanotube switch-portion of the nonvolatile nanotube diode may be changed (cycled) between an ON resistance state and an OFF resistance state separated by at least one order of magnitude, but typically separated by two to five orders of magnitude. There is no practical limit to the number of times nonvolatile nanotube switches may be cycled between ON and OFF states.

Each memory cell may be formed using a nonvolatile nanotube diode with an internal cathode-to-nonvolatile nanotube switch connection, or a nonvolatile nanotube diode with an internal anode-to-nonvolatile nanotube switch connection, with a horizontal orientation, or with a vertical (three dimensional) orientation to maximize density. In order to further maximize density, memory arrays are integrated above support circuits and interconnections that are integrated in and on an underlying semiconductor substrate.

Nonvolatile Memories using NV NT Diode Devices with Cathode-to-NT Switch Connection In some embodiments, a nonvolatile nanotube diode (NV NT diode) is a two terminal nonvolatile device formed by two series devices, a diode (e.g., a two terminal Schottky or PN diode) in series with a two terminal nonvolatile nanotube switch (NV NT switch). Each of the two said series devices has one shared series electrical connection. A cathode-to-nanotube NV NT diode has the cathode terminal electrically connected to one of said two nonvolatile nanotube switch terminals. Said NV NT diode two terminal nonvolatile device has one available terminal connected to the anode of the Schottky or PN diode and the second available terminal connected to the free terminal of the NV NT switch. A schematic of an embodiment of a cathode-to-NT nonvolatile nanotube diode is illustrated in FIG. 12. PIN diodes, FET diodes, and other diode types may also be used.

In some embodiments, dense 3D memories may be formed using one NV NT diode per cell. Embodiments of memories using NV NT diodes with cathode-to-NT connections are illustrated schematically and memory operation is described further below. 3-D cell structures are illustrated including fabrication methods. Cells with NV NT diodes formed with NV NT switches with both vertical and horizontal orientations are illustrated further below.

Nonvolatile Systems and Circuits, with Same

Figure 26A:
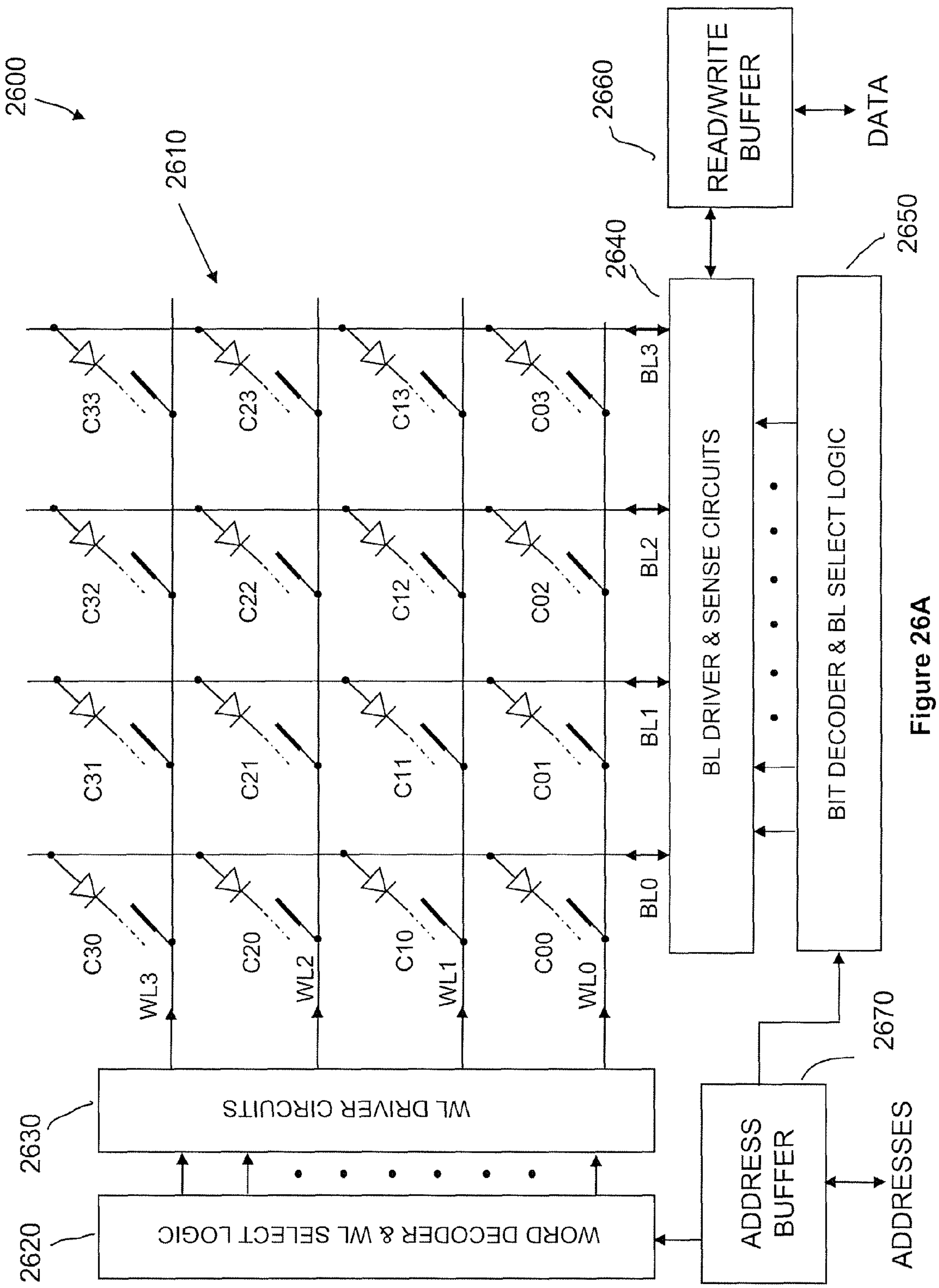
FIG. 26A schematically illustrates an embodiment of a memory schematic that uses nonvolatile nanotube diodes illustrated in FIG. 12 as nonvolatile memory cells.

One embodiment of a nonvolatile memory 2600 is illustrated in FIG. 26A. Memory 2600 includes memory array 2610 having cells C00 through C33 formed using nonvolatile nanotube diodes similar to nonvolatile nanotube diode 1200 (NV NT Diode 1200) having a diode-cathode-to-nonvolatile nanotube switch terminal connection such as that illustrated in FIG. 12. A diode similar to diode 1205 of NV NT Diode 1200 is used as a cell select device and a nonvolatile storage switch similar to NV NT Switch 1210 of NV NT Diode 1200 is used to store a nonvolatile ON (low resistance) state or a nonvolatile OFF (high resistance) state. ON and OFF states represent nonvolatile logic "1" or "0" states, respectively. Note that logic "1" and logic "0" state assignments with respect to low and high resistance states are arbitrary and may be reversed, for example.

Nonvolatile memory 2600 illustrated in FIG. 26A includes memory array 2610 having a matrix of NV NT Diode cells C00 through C33 similar to NV NT Diode 1200 as explained further above. Nonvolatile cell C00, as other cells in the array, includes one NV NT Diode referred to as NV NT Diode C00 which is similar to NV NT Diode 1200 illustrated further above. The anode of NV NT Diode C00 is connected to bit line BL0, and the other terminal of NV NT Diode C00, a NV NT Switch terminal, is connected to word line WL0.

In the illustrated embodiment, memory array 2610 is a 4-word line by 4-bit line 16 bit memory array that includes word lines WL0, WL1, WL2, and WL3 and bit lines BL0, BL1, BL2, and BL3. Word line driver circuits 2630 connected to word lines WL0 through WL3 and selected by word decoder and WL select logic 2620 provide stimulus during write 0, write 1, and read operations. BL driver and sense circuits 2640 provide data multiplexers (MUXs), BL drivers and sense amplifier/latches and are connected to bit lines BL0 through BL3 and selected by bit decoder and BL select logic 2650 provide stimulus during write 0, write 1, and read operation; that is receive data from memory array 2610 and transmit data to memory array 2610. Data in memory array 2610 is stored in a nonvolatile state such that power (voltage) supply to memory 2600 may be removed without loss of data. BL driver and sense circuits 2640 are also connected to read/write buffer 2660. Read/write buffer 2660 transmits data from memory array 2610 to read/write buffer 2660 which in turn transmits this data off-chip. Read/write buffer 2660 also accepts data from off-chip and transmits this data to BL driver and sense circuits 2640 that in turn transmit data to array 2610 for nonvolatile storage. Address buffer 2670 provides address location information.

For an exemplary write 0 operation along word line WL0, simultaneously erasing cells C00, C01, C02, and C03, data stored in cells C00-C03 may optionally be read prior to erase and data stored in corresponding sense amplifier/latches. Write 0 operations along word line WL0 proceeds with bit lines BL0, BL1, BL2, and B3 transitioning from zero to 5 volts, with bit line drivers controlled by corresponding BL drivers in BL driver and sense circuits 2640. Next, WL driver circuits 2630 drive word line WL0 from 5 volts to zero volts thus forward biasing NV NT Diodes C00, C01, C02, and C03 that form cells C00, C01, C02, and C03, respectively. A write 0 voltage of approximately 4.5 volts (erase voltage 5 volts minus NV NT diode turn on voltage of less than 0.5 volts as illustrated in FIG. 21) results in a transition from an ON state to an OFF state for NV NT Diodes in an ON state; NV NT Diodes in an OFF state remain in an OFF state. Thus after a write 0 operation along word line WL0, NV NT Diodes C00-C03 are all in an OFF state. Unselected word lines WL1, WL2, and WL3 all remain unselected and at 5 volts, and nonvolatile data stored in corresponding cells remains unchanged.

Note that while FIG. 26A illustrates a 4×4 memory array 2610, the array can be made arbitrarily large (e.g., to form an ~8 kB array), and the associated electronics modified appropriately.

Figure 26B:
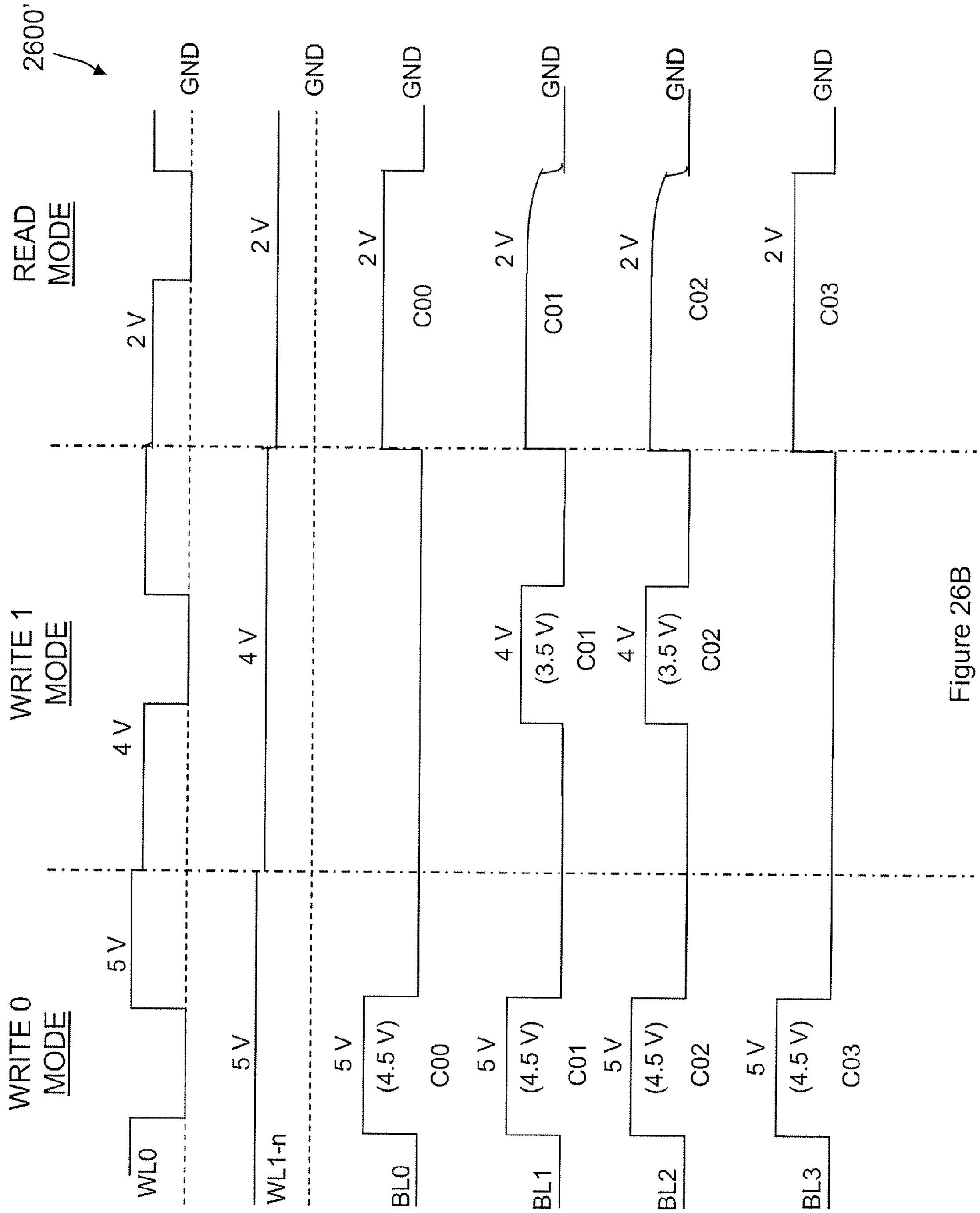
FIG. 26B illustrates operational waveforms for the memory illustrated in FIG. 26A, according to some embodiments.

The exemplary write 0 and write 1 operations illustrated in FIG. 26B are described with respect to write 0 (erase) voltages of 4.5 volts and write 1 (write) voltages of 3.5 volts applied across the two terminals of NV NT switches. However, with further reduction in NV NT switch channel length (below 20 nm), and/or improved nanotube element SWNT and/or MWNT materials, and/or improved device structures such NV NT switches that include suspended regions as described further above, write 0 and write 1 voltages may be reduced to the 1 to 3 volt range, or other ranges, for example.

In this example, an exemplary write operation is preceded by a write 0 operation as described further above. In other words, NV NT Diodes C00-C03 of respective corresponding cells C00-C03 begin the write operation in the OFF state. For an exemplary write 0 operation to cell C00 for example, in which a logic 0 state is to be stored, NV NT Diode C00 is to remain in the logic 0 high resistance state. Therefore, bit line BL0 is held at zero volts by corresponding BL driver and sense circuits 2640. Next, word line WL0 transitions from 4 volts to zero volts, with stimulus from WL drivers 2630. NV NT Diode C00 remains back biased during the write 0 operation and cell C00 remains in an OFF (high resistance) logic 0 state.

If NV NT Diode C00 is to transition from an OFF (high resistance state) to an ON (low resistance state) in a write 1 operation representing a logic 1, then bit line BL0 transitions from zero volts to 4 volts, with stimulus provided by corresponding BL drivers in BL driver and sense circuits 2640. Next, word line WL0 transitions from 4 volts to zero volts. A write 1 voltage of approximately 4 volts results in a voltage of 3.5 volts across the terminals of a corresponding NV NT switch sub-component of NV NT diode C00 (4 volts minus NV NT diode turn on voltage of less than 0.5 volts as illustrated in FIG. 21) results in a transition from an OFF state to an ON state for NV NT Diode C00.

For an exemplary read operation, from cells C00-C03 for example, the bit line drivers in BL driver and sense circuits 2640 precharge bit lines BL0-BL3 to a high voltage such as a read voltage of 2 volts, for example. The read bit line voltage is selected to be less than both write 0 and write 1 voltages to ensure that stored logic states (bits) are not disturbed (changed) during a read operation. Word line driver circuits 2630 drives word line WL0 from 2 volts to zero volts. If NV NT Diode C00 in cell C00 is in an OFF state (storing a logic 0) then bit lines BL0 is not discharged and remains at 2 volts. A corresponding sense amplifier/latch in BL driver and sense circuits 2640 stores a logic 0. However, if NV NT Diode C00 in cell C00 is in an ON state, then bit line BL0 is discharged. A corresponding sense amplifier/latch in BL driver and sense circuits 2640 detects the reduced voltage and latches a logic 1.

FIG. 26B illustrates examples of operational waveforms 2600' that may be applied to an embodiment of memory 2600 illustrated in FIG. 26A during write 0, write 1, and read operations (or modes). A pre-write 0 read operation may optionally be performed before a write 0 operation in order to record cell states along a selected word line, such as word line WL0, in corresponding latches. Cells C00, C01, C02, and C03 receive write 0 pulses (nearly) simultaneously. At the beginning of a write 0 operation, bit lines BL0, BL1, BL2, and BL3 transition from zero to 5 volts as illustrated by waveforms 2600' in FIG. 26B. Next, word line WL0 transitions from 5 volts to zero volts thereby forward-biasing NV NT Diodes C00-C03. Approximately 4.5 volts appears across the respective NV NT Switches in each of the NV NT Diodes because of a less than 0.5 volt forward-bias voltage drop. If the write 0 voltage of corresponding NV NT Switch is 4.5 volts (or less), then NV NT Diodes transition from an ON (low resistance) state to an OFF (high resistance) state; NV NT Diodes in an OFF state remain in an OFF state. Thus after a write 0 operation along word line WL0, NV NT Diodes C00-C03 are all in an OFF state. Unselected word lines WL1, WL2, and WL3 (e.g. $WL_{1-n}$) all remain unselected and at 5 volts.

In this example, a write operation is preceded by a write 0 operation as described further above with respect to FIG. 26A. In other words, for cells along word line WL0, NV NT Diodes C00-C03 are in an OFF state at the beginning of the write operation. For exemplary write operations illustrated by waveforms 2600', NV NT Diodes C00 and C03 are to remain in the OFF state for a write 0 operation, and NV NT Diodes C01 and C02 are to transition from an OFF state to an ON state in a write 1 operation.

Therefore, at the beginning of the write cycle, bit lines BL0 and BL3 remain at zero volts. Next, word line WL0 transitions from 4 volts to zero volts. NV NT Diodes C00 and C03 remain back biased during the write 0 operation, and therefore NV NT Diodes remain in the OFF state storing a logic 0 state.

Continuing the exemplary write cycle, cells C01 and C02 transition from an OFF to an ON state. Bit lines BL1 and BL2 transition from zero to 4 volts. Next, word line WL0 transitions from 4 volts to zero volts. NV NT Diodes C01 and C02 are forward biased during the write 1 operation and approximately 3.5 volts appear across NV NT Switches corresponding to NV NT Diodes C01 and C02. NV NT Diodes C01 and C02 transition from an OFF to an ON state storing a logic 1 state.

For an exemplary read operation as illustrated by waveforms 2600' in FIG. 26B, bit lines BL0, BL1, BL2, and BL3 are precharged to 2 volts, for example, and allowed to float. Then word line WL0 transitions from 2 volts to zero volts. Word lines WL1, WL2, and WL3 remain at 2 volts. For cells C00 and C03, bit line BL0 and BL3 voltage remains unchanged because NV NT Diodes C00 and C03 are in an OFF or high resistance state and bit line BL0 and BL3 capacitance cannot discharge to ground (zero volts). However, for cells C01 and C02, bit lines BL1 and BL2 discharge toward zero volts because NV NT Diodes C01 and C02 are in an ON or low resistance state and bit line capacitance for BL1 and BL2 can discharge toward ground (zero volts). For BL1 and BL2, corresponding sense amplifier/latches typically detect bit line voltage reduction in the 100 mV to 200 mV range, although this value may vary depending upon the particular characteristics (design) of the sense/latch circuit. Corresponding sense amplifier/latches in BL driver and sense circuits 2640 determine that BL1 and BL2 read voltages have changed and latch a logic 1 state corresponding to the ON state of NV NT Diodes C01 and C02 that form cells C01 and C02. Corresponding sense amplifier/latches in BL driver and sense circuits 2640 determine that BL0 and BL3 have not changed and latch a logic 0 state corresponding to the OFF state of NV NT Diodes C00 and C03 forming cells C00 and C03.

An Overview of 3-Dimensional Cell Structure Methods of Fabrication of Nonvolatile Memory Cells using NV NT Devices Nonvolatile nanotube diodes 1200 and 1300 (NV NT Diodes 1200, 1300), and nonvolatile nanotube diodes formed with FET diodes, referred to as NV NT Diodes 1400, 1500, 1600, and 1700 or also as NV NT FET-Diodes 1400, 1500, 1600, and 1700, may be used as cells and interconnected into arrays to form nonvolatile nanotube random access memory systems. Such arrays may also be used to fabricate nonvolatile array-based logic such as PLAs, FPGAs, PLDs and other such logic devices.

Figure 27A:
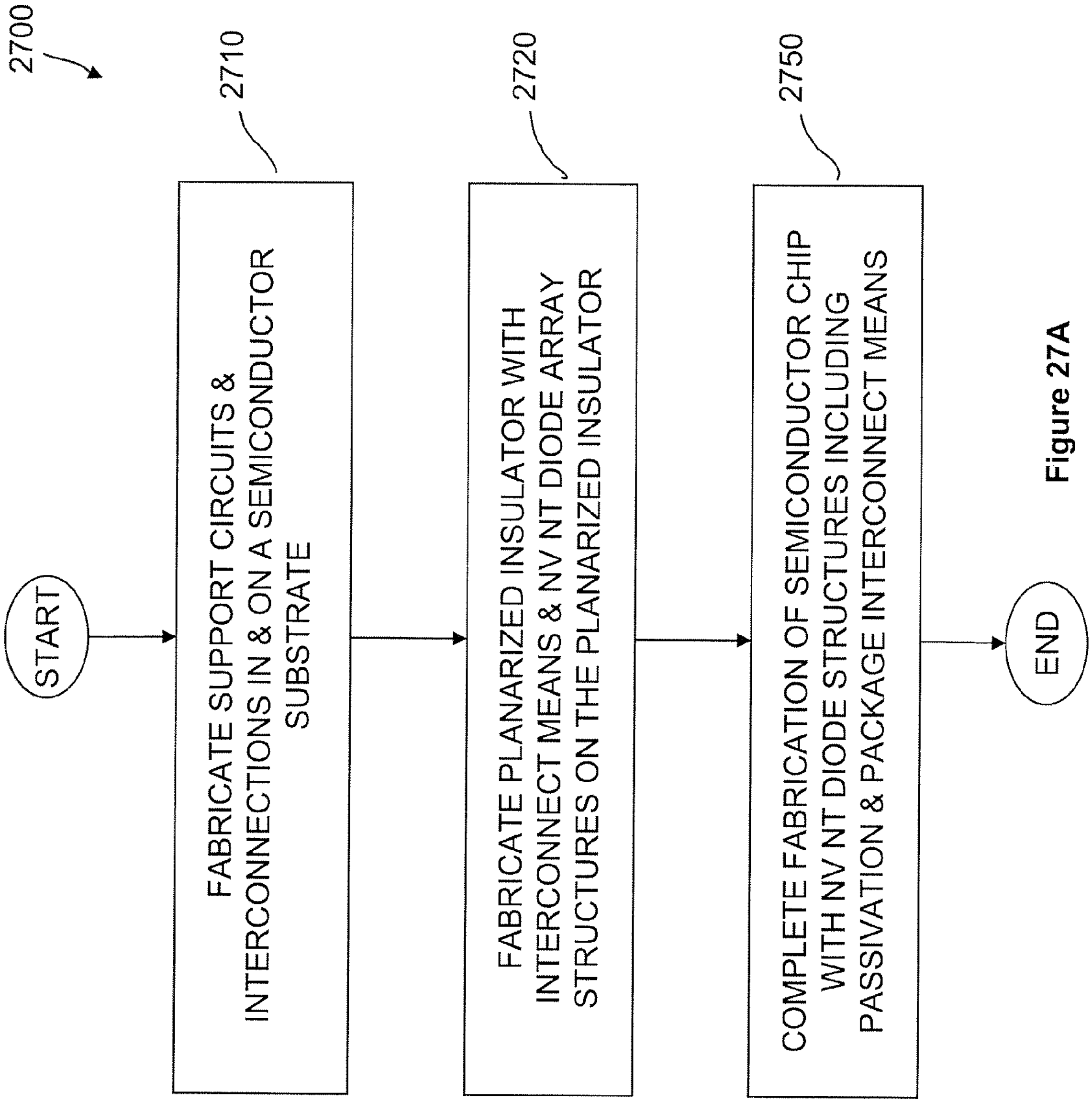
FIGS. 27A-27B illustrate methods of fabrication of memory cells using nonvolatile nanotube diodes similar to those illustrated schematically in FIG. 12, according to some embodiments.

FIG. 27A illustrates an overview of a method 2700 of fabricating some embodiments of the invention. While method 2700 is described further below with respect to nonvolatile nanotube diodes 1200 and 1300, method 2700 is sufficient to cover the fabrication of many of the nonvolatile nanotube diodes described further above. These methods 2700 may also be used to form logic embodiments based on NV NT diodes arranged as logic arrays such as NAND and NOR arrays with logic support circuits (instead of memory support circuits) as used in PLAs, FPGAs, and PLDs, for example.

In general, methods 2710 fabricate support circuits and interconnections in and on a semiconductor substrate. This includes NFET and PFET devices having drain, source, and gate that are interconnected to form memory support circuits such as, for example, circuits 2620, 2630, 2640, 2650, 2660, and 2670 illustrated in FIG. 26A. Such structures and circuits may be formed using known techniques that are not described in this application. Methods 2710 can be used to form a base layer using known methods of fabrication in and on which nonvolatile nanotube diode control devices and circuits are fabricated.

Methods 2720 depicted in FIG. 27A fabricate an intermediate structure including a planarized insulator with interconnect means and nonvolatile nanotube array structures on the planarized insulator surface. Interconnect means include vertically-oriented filled contacts, or studs, for interconnecting memory support circuits in and on a semiconductor substrate below the planarized insulator with nonvolatile nanotube diode arrays above and on the planarized insulator surface.

Word lines and bit lines can be used in 3D array structures as described further below to interconnect 3-D cells and form 3-D memories, and can be approximately orthogonal in an X-Y plane approximately parallel to underlying memory support circuits. Word line direction has been arbitrarily assigned as along the X axis and bit line direction has arbitrarily assigned as along the Y axis in Figures illustrating 3D array structures and 3D array structure methods of fabrication as described further below. The Z axis, approximately orthogonal to the X-Y plane, indicates the vertical direction of 3D cell orientation, in "vertical cell" embodiments such as those described in greater detail below.

Methods 2750 use industry standard fabrication techniques to complete fabrication of the semiconductor chip by adding additional wiring layers as needed, and passivating the chip and adding package interconnect means.

Figure 28A:
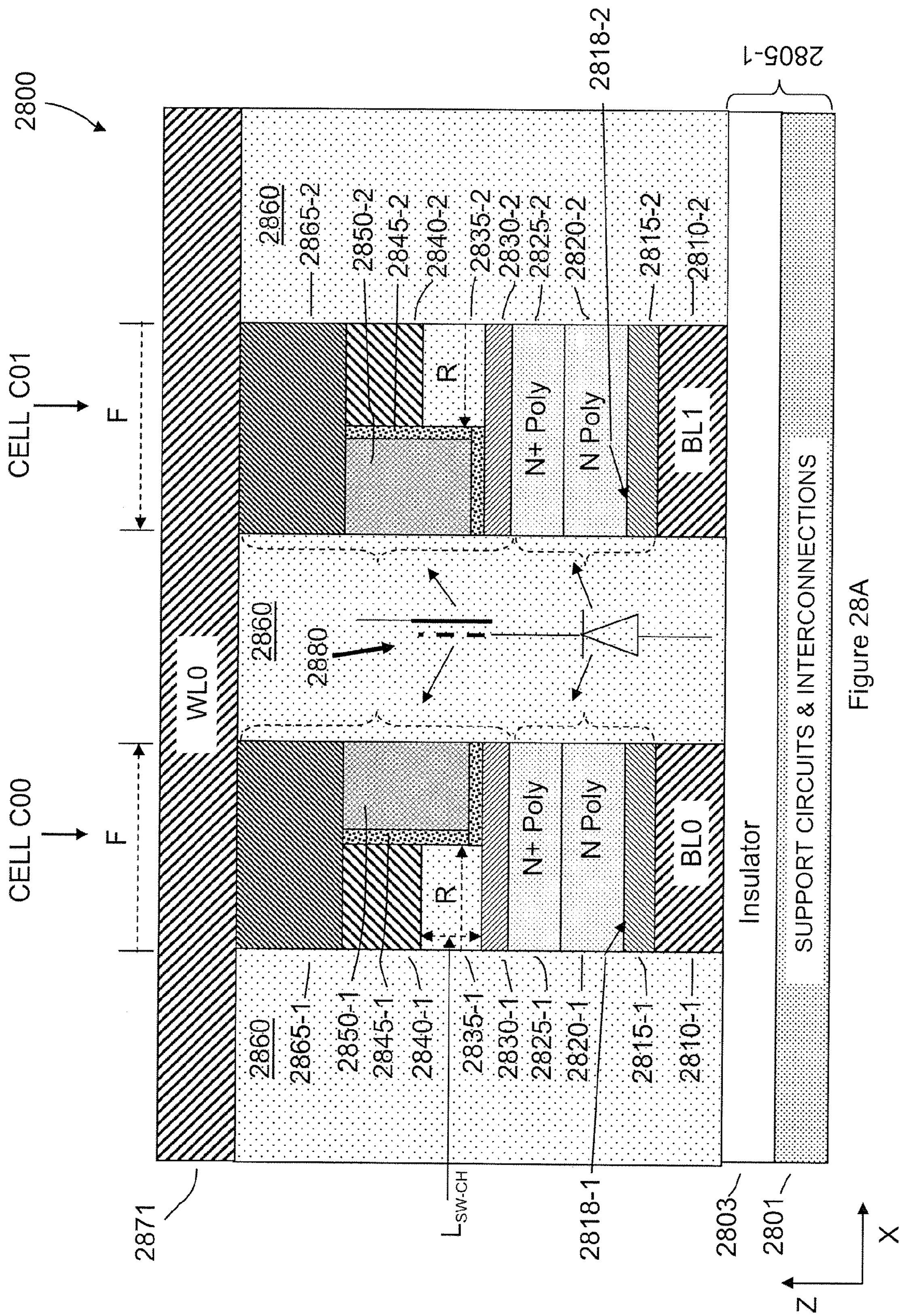
FIG. 28A illustrates a three dimensional cross section of an embodiment of a dense 3D cell structure formed with a cathode-to-nanotube nonvolatile nanotube diode with a Schottky diode in series with a vertically oriented nonvolatile nanotube switch within vertical cell boundaries.

3-Dimensional Cell Structure of Nonvolatile Cells using NV NT Devices having Vertically Oriented Diodes and Vertically Oriented NT Switches with Cathode-to-NT Switch Connection Once support circuits and interconnections in and on the semiconductor substrate are defined, methods can then be used to fabricate a nonvolatile nanotube diode array such as that illustrated in cross section 2800 above the support circuit and interconnect region as illustrated in FIG. 28A. FIG. 28A illustrates a cross section including cells C00 and C01 in one of several possible embodiments.

Methods 2710 described further above can be used to define support circuits and interconnections 2801.

Figure 27B:
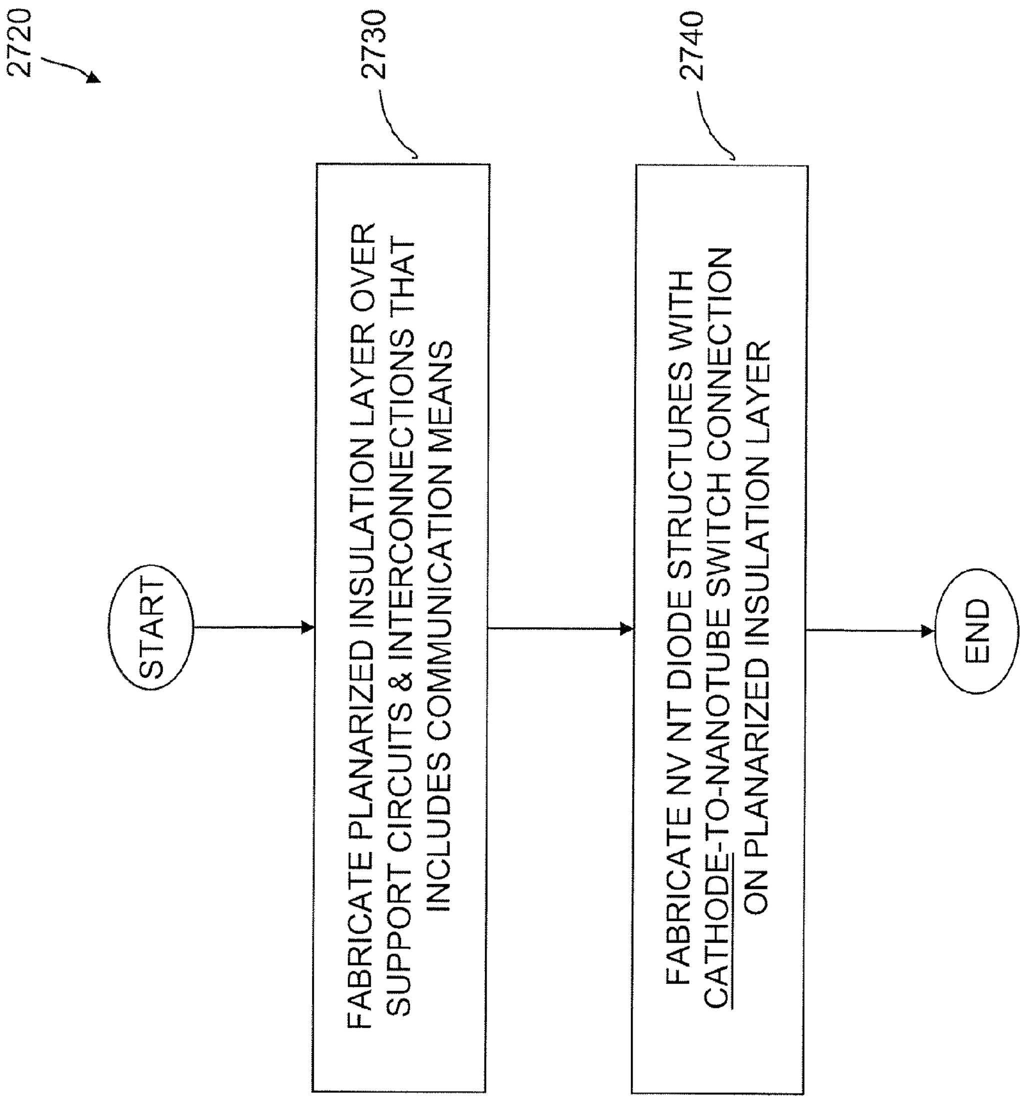

Next, methods 2730 illustrated in FIG. 27B deposit and planarize insulator 2803. Interconnect means through planar insulator 2803 (not shown in cross section 2800 but shown further below with respect to cross section 2800'' in FIG. 28C) may be used to connect metal array lines in 3-D arrays to corresponding support circuits and interconnections 2801. By way of example, bit line drivers in BL driver and sense circuits 2640 may be connected to bit line BL0 in array 2610 of memory 2600 illustrated in FIG. 26A. At this point in the fabrication process, methods 2740 may be used to form a memory array on the surface of insulator 2803, interconnected with memory array support structure 2805-1 illustrated in FIG. 28A.

Methods 2740 illustrated in FIG. 27B deposit and planarize metal, polysilicon, insulator, and nanotube elements to form nonvolatile nanotube diodes which, in this example, include multiple vertically oriented diode and vertically oriented nonvolatile nanotube switch series pairs. Individual cell outer dimensions are formed in a single etch step, each cell having a single NV NT Diode defined by a single trench etch step after layers, except the WL0 layer, have been deposited and planarized, in order to eliminate accumulation of individual layer alignment tolerances that would substantially increase cell area. Individual cell dimensions in the X direction are 1F (1 minimum feature) as illustrated in FIG. 28A, and also 1F in the Y direction (not shown) which is orthogonal to the X direction, with a periodicity in X and Y directions of 2F. Hence, each cell occupies an area of approximately $4F^2$. The vertically-oriented (Z direction) NV NT switch element (nanotube element) placement at R in the X direction is parallel to the trench-defined outer dimensions with R approximately equal to F/2 in this example, where NV NT switch (nanotube element) separation distance is controlled by self-aligned means described further below with respect to FIGS. 34A-34FF. Vertically-oriented NV NT switch element (nanotube element) placement in the Y direction is typically not critical and typically does not require self-alignment means.

Figure 28B:
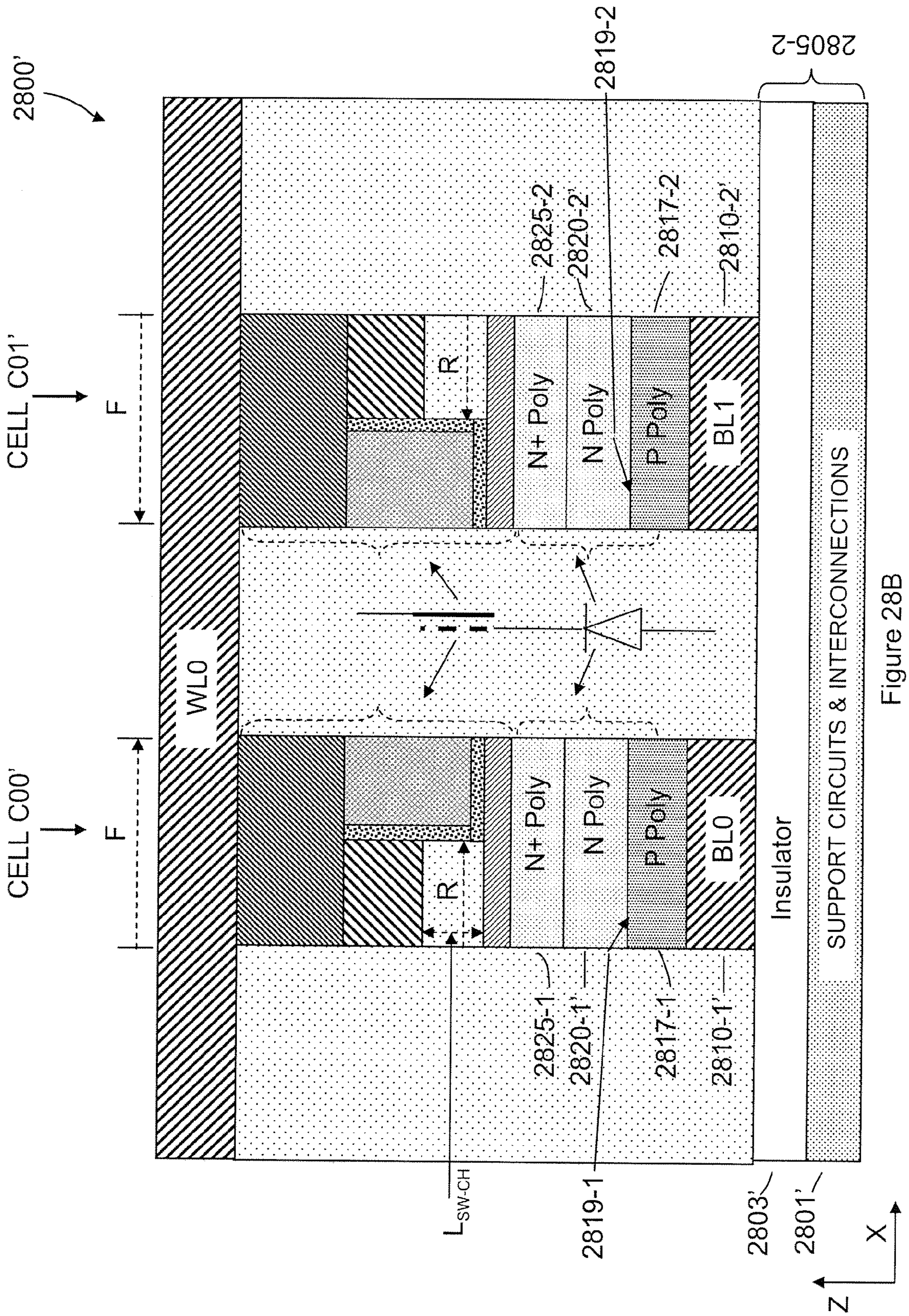
FIG. 28B illustrates a three dimensional cross section of an embodiment of a dense 3D cell structure formed with a cathode-to-nanotube nonvolatile nanotube diode with a PN diode in series with a vertically oriented nonvolatile nanotube switch within vertical cell boundaries.

Vertically oriented nanotube element placement R at approximately F/2 assumes nanotube film thickness that is much less than cell dimension F. For a 45 nm technology node, for example, a nanotube element in the thickness range of 0.5 nm to 10 nm, for example. Nanotube elements may be formed using a single nanotube layer, or may be formed using multiple layers. Such nanotube element layers may be deposited e.g., using spin-on coating techniques or spray-on coating techniques, as described in greater detail in the incorporated patent references. FIGS. 28A and 28B 3-D memory array structure embodiments and corresponding exemplary methods of fabrication illustrated with respect to FIGS. 34A-34FF show 3D array structures assuming vertically oriented nanotube elements placed at R, with R approximately equal to F/2. Such elements include a bottom contact, a sidewall contact, electrically separated by a vertically oriented nanotube element channel length $L_{SW-CH}$ as illustrated further below with respect to FIGS. 28A, 28B embodiments and corresponding FIG. 34A-34FF exemplary methods of fabrication.

In one possible variation, vertically oriented nanotube elements thickness may be too thick for placement at F/2 for cells with dimension F. For example, for a cell dimension F of 35 nm, for example, and a nanotube film thickness of 10-20 nm, placement of vertically oriented nanotube elements may be at F/3 for example, to accommodate both the nanotube element and a protective insulator as illustrated further below with respect to FIG. 39. Vertically oriented nanotube element with lower, sidewall, and upper contacts may still be used.

In another possible variation, a nanotube element thickness may be equal to the overall cell dimension F. For example, for a cell dimension F of 35 nm, a nanotube film thickness of 35 nm may be used. Or, for example, for a cell dimension F of 22 nm, a nanotube film thickness of 22 nm may be used. In this case the nanotube element contact structure may be modified such that the sidewall contact is eliminated and replaced by lower and upper contacts only as illustrated further below in FIG. 40. The thickness of the nanotube element need not be related in any particular way to the lateral cell dimension F.

In addition to the simultaneous definition of overall cell dimensions without multiple alignment steps, minimized memory cell size (area) also requires the self-aligned placement of device elements within said memory cell boundaries using sub-minimum dimensions, in this example, cell boundaries defined by isolation trenches. Cross sections 2800 and 2800' in FIGS. 28A and 28B, respectively, illustrate exemplary nonvolatile nanotube switches similar to cross section 750 illustrated in FIG. 7B, except that the nanotube channel element position R is self-aligned to isolation trenches that determine overall cell dimensions. Also, lower level, sidewall, and upper level contacts are all self-aligned and fit within isolation trench boundaries. Self-aligned placement of device elements within defined boundaries may be achieved by adapting sidewall spacer methods such as those disclosed in U.S. Pat. No. 4,256,514, the entire contents of which are incorporated herein by reference.

In some embodiments, methods fill trenches with an insulator and then planarize the surface. Then, methods deposit and pattern word lines on the planarized surface.

The fabrication of vertically-oriented 3D cells proceeds as follows, in some embodiments. Referring to FIG. 28A, methods deposit a bit line wiring layer on the surface of insulator 2803 having a thickness of 50 to 500 nm, for example, as described further below with respect to FIGS. 34A-34FF. Methods etch the bit line wiring layer and define individual bit lines such as bit line 2810-1 (BL0) and 2810-2 (BL1). Bit lines such as BL0 and BL1 are used as array wiring conductors and may also be used as anode terminals of Schottky diodes.

Alternatively, more optimum Schottky diode junctions 2818-1 and 2818-2 may be formed using metal or silicide contacts 2815-1 and 2815-2 in contact with N polysilicon regions 2820-1 and 2820-2, while also forming ohmic contacts with bit lines 2810-1 and 2810-2 as described further below with respect to FIGS. 34A-34FF. N polysilicon regions 2820-1 and 2820-2 may be doped with arsenic or phosphorus in the range of $10^{14}$ to $10^{17}$ dopant atoms/cm$^3$ for example, and may have a thickness range of 20 nm to 400 nm, for example. Contacts 2815-1 and 2815-2 may be in the thickness range of 10 nm to 500 nm, for example.

In some embodiments, the electrical characteristics of Schottky (and PN) diodes may be improved (low leakage, for example) by controlling the material properties of polysilicon, for example polysilicon deposited and patterned to form polysilicon regions 2820-1 and 2820-2. Polysilicon regions may have relatively large or relatively small grain boundary size that are determined by methods used in the semiconductor regions. SOI deposition methods used in the semiconductor industry may be used that result in polysilicon regions that are single crystalline (no longer polysilicon), or nearly single crystalline, for further electrical property enhancement such as low diode leakage currents.

Examples of contact and conductors materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

In some cases conductors such as Al, Au, W, Cu, Mo, Ti, and others may be used as both contact and conductors materials as well as anodes for Schottky Diodes, in which case separate optional Schottky anodes contacts such as 2815-1 and 2815-2 are not required and may be omitted. However, in other cases, optimizing anode material for lower forward voltage drop and lower diode leakage is advantageous. Schottky diode anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002m pp. 31-41, the entire contents of which are incorporated herein by reference.

Next, having completed Schottky diode select devices, methods form N+ polysilicon regions 2825-1 and 2825-2 to contact N polysilicon regions 2820-1 and 2820-2, respectively, and also to form contact regions for ohmic contacts to contacts 2830-1 and 2830-2. N+ polysilicon is typically doped with arsenic or phosphorous to $10^{20}$ dopant atoms/$cm^3$, for example, and has a thickness of 20 to 400 nm, for example.

Next, methods form a nonvolatile nanotube switch in each cell having one terminal common with cathode contacts 2830-1 and 2830-2 for example. In order to enhance the density of cells C00 and C01, the nanotube elements illustrated in FIG. 28A may be at least partially vertically oriented as illustrated in FIG. 7. Vertically oriented nanotube switches are described in greater detail in the incorporated patent references. Vertically oriented sidewalls including insulating and contact regions are formed prior to forming vertically oriented nanotube elements 2845-1 and 2845-2. Vertically oriented sidewalls are formed using self aligned methods at position R approximately equal to F/2. However, similar self aligned methods of fabrication may be used to place the vertically oriented sidewalls at any location, such as F/3, F/4, or any other desired location.

Methods of forming nanotube elements 2845-1 and 2845-2 can include first forming insulators 2835-1 and 2835-2 and sidewall contacts 2840-1 and 2840-2, in contact with corresponding insulators 2835-1 and 2835-2, by directionally etching an opening through both metal and insulator regions to form vertical sidewalls. The thickness of insulators 2835-1 and 2835-2 determine the nanotube element channel length as illustrated in FIG. 28A. Insulator 2835-1 and 2835-2 may range from less than 5 nm to greater than 250 nm. Vertical sidewalls of insulators 2835-1 and 2835-2 and sidewall contacts 2840-1 and 2840-2 are self aligned with respect to trench sidewalls that are etched later in the process using methods of fabrication described further below with respect to FIGS. 34A-34FF.

Next, methods form conformal nanotube elements 2845-1 and 2845-2 as described in greater detail in the incorporated patent references.

Then, methods form protective conformal insulator 2850-1 and 2850-2 on the surface of conformal nanotube elements 2845-1 and 2845-2, respectively.

Next, methods form an opening having an X dimension of approximately F and methods fill that opening with a conductor material forming upper level contacts 2865-1 and 2865-2 in contact with sidewall contacts 2840-1 and 2840-2, respectively. Methods to form upper level contacts 2865-1 and 2865-2 may be similar to methods disclosed in U.S. Pat. No. 4,944,836 and described further below with respect to FIGS. 34A-34FF.

Contacts 2865-1 and 2865-2 provide a conductive path between sidewall contacts 2840-1 and 2840-2, respectively, and word line 2871 (WL0) to be formed after completing the formation of cells C00 and C01.

Next, prior to the formation of word line 2871 (WL0), cell C00 and cell C01 dimensions can be defined by a trench etch through all layers in cell structure 2800, down to the top surface of insulator 2803.

Next, methods fill trench regions with an insulator 2860 and planarize the structure just prior to word line 2871 (WL0) deposition.

Then, methods deposit and pattern word line 2871 (WL0).

Nonvolatile nanotube diode 2880 schematic superimposed on cross section 2800 in FIG. 28A is an equivalent circuit that corresponds to nonvolatile nanotube diode 1200 in FIG. 12, one in each of cells C00 and C01. Cells C00 and C01 illustrated in cross section 2800 in FIG. 28A correspond to corresponding cells C00 and C01 shown schematically in memory array 2610 in FIG. 26A, and bit lines BL0 and BL1 and word line WL0 correspond to array lines illustrated schematically in memory array 2610.

Cross sectional view 2800' illustrated in FIG. 28B shows embodiments of memory array cells C00' and C01' that are similar to memory array cells C00 and C01 illustrated in FIG. 28A, except that NV NT Diodes C00' and NV NT Diodes C01' formed in corresponding cells C00' and C01' include a PN diodes having PN diode junctions 2819-1 and 2819-2 instead of a Schottky diodes having a Schottky diode junctions 2818-1 and 2818-2.

P polysilicon regions 2817-1 and 2817-2 form a diode-anode and N polysilicon regions 2820-10' and 2820-20' form a diode cathode that together (combined) form PN diodes with PN diode junctions 2819-1 and 2819-2. P polysilicon regions 2817-1 and 2817-2 also form ohmic or near-ohmic contacts with bit lines 2810-1' (BL0) and 2810-2' (BL1), respectively. N polysilicon regions 2820-1' and 2820-2' also form ohmic contact regions with N+ polysilicon regions 2825-1 and 2825-2. Other structures of cells C00' and C01' are similar to those illustrated and described with respect to cells C00 and C01, respectively.

Memory array support structure 2805-2 illustrated in FIG. 28B includes support circuits and interconnections 2801' and planarized insulator 2803' which are similar to memory support structure 2801 illustrated in FIG. 28A except for adjustments that may be required to accommodate memory cells having PN diode select means instead of Schottky diode select means.

Figure 28C:
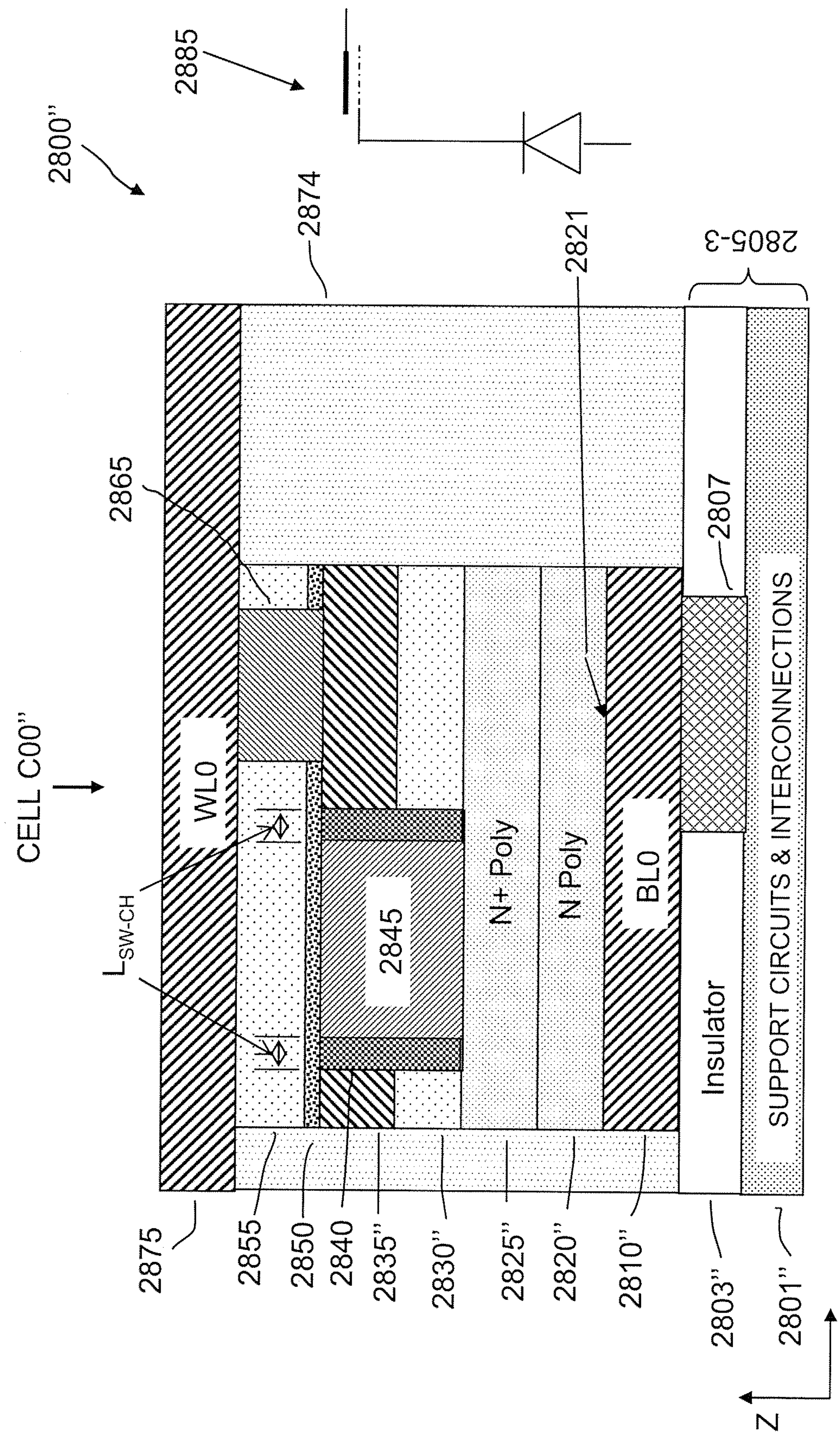
FIG. 28C illustrates a three dimensional cross section of an embodiment of a dense 3D cell structure formed with a cathode-to-nanotube nonvolatile nanotube diode with a Schottky diode in series with a horizontally oriented nonvolatile nanotube switch within vertical cell boundaries.

3-Dimensional Cell Structure of Nonvolatile Cells using NV NT Devices having Vertically Oriented Diodes and Horizontally Oriented NT Switches with Cathode-to-NT Switch Connection Methods 2720 illustrated in FIG. 27B can be used to deposit and planarize metal, polysilicon, insulator, and nanotube elements to form nonvolatile nanotube diodes with multiple vertically oriented diode and horizontally oriented nonvolatile nanotube switch series pairs as illustrated by cross section 2800" in FIG. 28C.

Cell C00" in the embodiment of FIG. 28C is formed on memory array support structure 2805-3, which includes support circuits and interconnections 2801" and planarized insulator 2803". Support circuits and interconnections 2801" is similar to support circuits and interconnections 2801 and planarized insulator 2803" is similar to planarized insulator 2803 in FIG. 28A, except for adjustments needed to accommodate differences in cell C00" with respect to cell C00. Also, cross section 2800" includes filled-via contact (stud) 2807 that interconnects bit line 2810" (BL0) with support circuits and interconnections 2801" circuits as illustrated in cross section 2800" of FIG. 28C. For example, filled via contact (stud) 2807 may connect bit line BL0 illustrated schematically in FIG. 26A with BL driver and sense circuits 2640.

Individual outer cell dimensions can be formed in a single etch step, each cell having a single NV NT Diode defined by a single trench etch step after layers, except the WL0 layer, have been deposited and planarized, in order to eliminate accumulation of individual layer alignment tolerances that may substantially increase cell area. Individual cell dimensions in the X direction are 2-3F (1F is minimum feature) as illustrated in FIG. 28C because horizontal nonvolatile nanotube switch orientation typically require more area than nonvolatile nanotube switches having a vertical orientation such as those illustrated in FIGS. 28A and 28B. Minimum Y direction (orthogonal to the X direction, not shown), dimensions of 1F in the Y direction are possible. Using cell periodicity in the X direction of 3-4F and periodicity in the Y direction of 2F, in some embodiments each cell occupies an area in the range of 6-8$F^2$ or larger. After trench fill with an insulator followed by planarization, word lines such as word line 2875 are deposited and patterned.

Cross section 2800" illustrated in FIG. 28C shows an embodiment of a memory array cell C00" that is similar to the memory array cell embodiment C00 illustrated in FIG. 28A, except that NV NT diode C00" forming cell C00" includes a horizontally oriented nonvolatile nanotube switch instead of the vertically oriented nonvolatile nanotube switch illustrated in cross section 2800 in FIG. 28A.

In FIG. 28C, cross section 2800" cell C00" select Schottky diode includes Schottky diode junction 2821 corresponding to Schottky diode junction 2818-1 in cross section 2800 of FIG. 28A. Schottky diode junction 2821 is formed by bit line 2810" (BL0) forming the anode and N polysilicon 2820" forming the cathode. An optional additional metal contact such as metal contact 2815-1 is not shown in cross section 2800" but may be added. N+ polysilicon region 2825" is added for contact to N polysilicon region 2820" and corresponds to N+ polysilicon region 2825-1 in FIG. 28A.

Methods can be used fabricate a nonvolatile nanotube switch having a horizontal (instead of a vertical) orientation and having one side of the nonvolatile nanotube switch in electrical (not physical) contact with N+ polysilicon region 2825" and the other side of the nonvolatile nanotube switch in electrical (not physical) contact with word line 2875.

First, methods deposit insulator 2830" and contact 2835". Then methods form an opening through both contact 2835" and insulator 2830" to expose the surface of N+ polysilicon region 2825".

Next, methods deposit a conformal insulating layer on the top, sidewall, and bottom of the underlying opening. Then, methods directional etch the conformal insulating layer thereby forming sidewall spacer 2840, whose thickness determines the channel length $L_{SW-CH}$ of the nonvolatile nanotube switch in cell C00". Cross section 2800" shows two $L_{SW-CH}$ regions. These two $L_{SW-CH}$ regions are electrically in parallel (not shown by cross section 2800"). Exemplary methods of fabrication are described further below with respect to FIGS. 35A-S.

Next, methods fill the opening with contact metal, followed by planarization, to form contact 2845, which forms an Ohmic contact to N+ polysilicon region 2825" and is isolated from contact 2835" regions by sidewall spacer 2840.

Next, methods deposit nanotube element 2850 on and in physical and electrical contact with contact 2845, spacers 2840, and sidewall contact 2835". The separation between contact 2845 and contact 2835", which is formed by the thickness of sidewall spacer 2840, determines the nonvolatile nanotube switch channel length $L_{SW-CH}$. Nanotube element 2850 may optionally be patterned as illustrated in FIG. 28C, or may be patterned as part of a later trench etch that determines final cell C00" dimensions. Exemplary methods of fabrication are described further below with respect to FIGS. 35A-35S.

Next, methods deposit insulator 2855.

Next, methods etch insulator 2855 forming an opening. Then, methods etch (remove) the exposed portion of nanotube element 2850, e.g., as described in greater detail in the incorporated patent references.

Next, the opening is filled with contact metal 2865. Methods form contact metal 2865 by metal deposition followed by planarization. Contact 2865 physically and electrically contacts both contact 2835" and nanotube element 2850.

Next, methods etch a trench through all layers, stopping on the surface of insulator 2803", thereby defining the dimensions of cell C00".

Next, methods deposit and planarize an insulating layer forming insulator 2874.

Then, methods deposit and pattern word line 2875 (WL0) completing cell C00". Exemplary methods of fabrication are described further below with respect to FIGS. 35A-35S.

Nonvolatile nanotube diode embodiment 2885 in FIG. 28C is an equivalent circuit that corresponds to nonvolatile nanotube diode 1200 in FIG. 12 in cell C00". Cell C00" corresponds to corresponding cell C00 shown schematically in the embodiment of the memory array 2610 illustrated in FIG. 26A, and bit line BL0 and word line WL0 correspond to array lines illustrated schematically in memory array 2610.

Nonvolatile Memories using NV NT Diode Devices with Anode-to-NT Switch Connection In some embodiments, a nonvolatile nanotube diode (NV NT diode) is a two terminal nonvolatile device formed by two series devices, a diode (e.g., a two terminal Schottky or PN diode) in series with a two terminal nonvolatile nanotube switch (NV NT switch). Each of the two said series devices has one shared series electrical connection. An anode-to-nanotube NV NT diode has the anode terminal electrically connected to one of said two nonvolatile nanotube switch terminals. Said NV NT diode two terminal nonvolatile device has one available terminal connected to the cathode of the Schottky or PN diode and the second available terminal connected to the free terminal of the NV NT switch. A schematic of an anode-to-NT nonvolatile nanotube diode is illustrated in FIG. 13. PIN diodes, FET diodes, and other diode types may also be used.

In some embodiments, dense 3D memories may be formed using one NV NT diode per cell. Embodiments of memories using NV NT diodes with anode-to-NT connections are illustrated schematically and memory operation is described further below. Exemplary 3-D cell structures are illustrated including fabrication methods. Exemplary cells with NV NT diodes formed with NV NT switches with vertically orientated switches are illustrated further below.

Nonvolatile Systems and Circuits, with Same

Figure 29A:
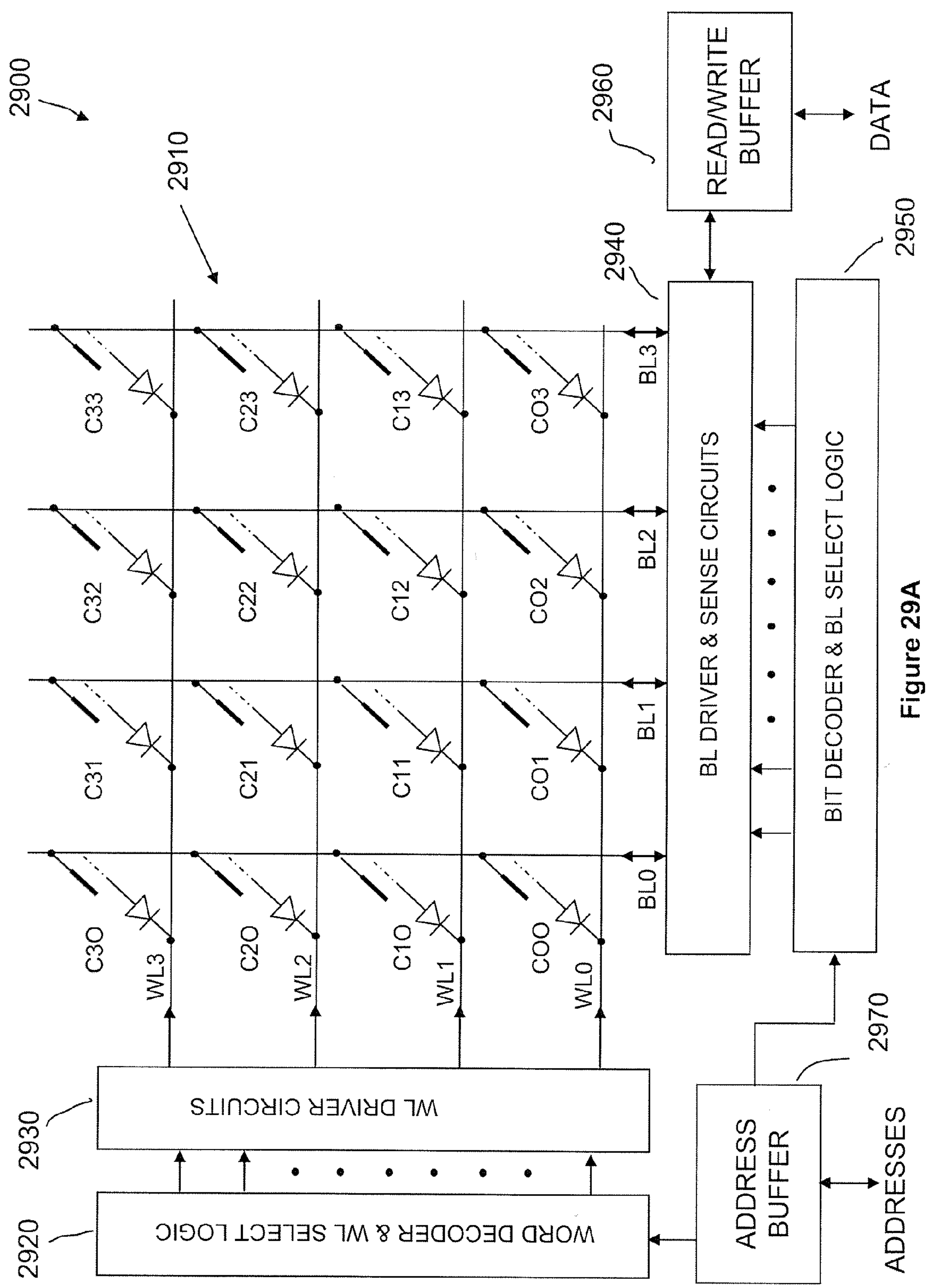
FIG. 29A schematically illustrates an embodiment of a memory schematic that uses nonvolatile nanotube diodes illustrated in FIG. 13 as nonvolatile memory cells.

One embodiment of a nonvolatile memory 2900 is illustrated in FIG. 29A. Memory 2900 includes memory array 2910 having cells C00 through C33 formed using nonvolatile nanotube diodes similar to nonvolatile nanotube diode 1300 (NV NT Diode 1300) formed using diode-anode-to-nonvolatile nanotube switch terminal connection such as that illustrated in FIG. 13. A diode similar to diode 1305 of NV NT Diode 1300 is used as a cell select device and a nonvolatile storage switch similar to NV NT Switch 1310 of NV NT Diode 1300 is used to store a nonvolatile ON (low resistance) state or a nonvolatile OFF (high resistance) state. ON and OFF states represent nonvolatile logic "1" or "0" states, respectively. Note that logic "1" and logic "0" state assignments with respect to low and high resistance states are arbitrary and may be reversed, for example.

Nonvolatile memory 2900 illustrated in FIG. 29A includes memory array 2910 having a matrix of NV NT Diode cells C00 through C33 similar to NV NT Diode 1300 as explained further above. Nonvolatile cell C00, as other cells in the array, includes one NV NT Diode referred to as NV NT Diode C00 which is similar to NV NT Diode 1300 illustrated further above. The cathode of NV NT Diode C00 is connected to word line WL0, and the other terminal of NV NT Diode C00, a NV NT Switch terminal, is connected to bit line BL0.

In the illustrated embodiment, memory array 2910 is a 4-word line by 4-bit line 16 bit memory array that includes word lines WL0, WL1, WL2, and WL3 and bit lines BL0, BL1, BL2, and BL3. Word line driver circuits 2930 connected to word lines WL0 through WL3 and selected by word decoder and WL select logic 2920 provide stimulus during write 0, write 1, and read operations. BL driver and sense circuits 2940 that provide data MUXs, BL drivers and sense amplifier/latches are connected to bit lines BL0 through BL3 and selected by bit decoder and BL select logic 2950 provide stimulus during write 0, write 1, and read operation; that is receive data from memory array 2910 and transmit data to memory array 2910. Data in memory array 2910 is stored in a nonvolatile state such that power (voltage) supply to memory 2900 may be removed without loss of data. BL driver and sense circuits 2940 are also connected to read/write buffer 2960. Read/write buffer 2960 transmits data from memory array 2910 to read/write buffer 2960 which in turn transmits this data off-chip. Read/write buffer 2960 also accepts data from off-chip and transmits this data to BL driver and sense circuits 2940 that in turn transmit data to array 2910 for nonvolatile storage. Address buffer 2970 provides address location information.

Note that while FIG. 29A illustrates a 4×4 memory array 2910, the array can be made arbitrarily large (e.g., to form an ~8 kB array), and the associated electronics modified appropriately.

For an exemplary write 0 operation along word line WL0, simultaneously erasing cells C00, C01, C02, and C03, data stored in cells C00-C03 may optionally be read prior to erase and data stored in corresponding sense amplifier/latches. Write 0 operation along word line WL0 proceeds with bit lines BL0, BL1, BL2, and B3 transitioning from zero to 5 volts, with bit line drivers controlled by corresponding BL drivers in BL driver and sense circuits 2940. Next, WL driver circuits 2930 drive word line WL0 from 5 volts to zero volts thus forward biasing NV NT Diodes C00, C01, C02, and C03 that form cells C00, C01, C02, and C03, respectively. A write 0 voltage of approximately 4.5 volts (write 0 voltage 5 volts minus NV NT diode turn on voltage of less than 0.5 volts) results in a transition from an ON state to an OFF state for NV NT Diodes in an ON state; NV NT Diodes in an OFF state remain in an OFF state. Thus after a write 0 operation along word line WL0, NV NT Diodes C00-C03 are all in an OFF state. Unselected word lines WL1, WL2, and WL3 all remain unselected and at 5 volts, and nonvolatile data stored in corresponding cells remains unchanged.

In this example, a write operation is preceded by a write 0 operation as described further above. In other words, NV NT Diodes C00-C03 of respective corresponding cells C00-C03 begin the write operation in the OFF state. For an exemplary write 0 operation to cell C00 for example, in which a logic 0 state is to be stored, NV NT Diode C00 is to remain in the logic 0 high resistance state. Therefore, bit line BL0 is held at zero volts by corresponding BL driver and sense circuits 2940. Next, word line WL0 transitions from 4 volts to zero volts, with stimulus from WL drivers 2930. NV NT Diode C00 remains back biased during the write 0 operation and cell C00 remains in an OFF (high resistance) logic 0 state.

If NV NT Diode C00 is to transition from an OFF (high resistance state) to an ON (low resistance state) in a write 1 operation representing a logic 1, then bit line BL0 transitions from zero volts to 4 volts, with stimulus provided by corresponding BL drivers in BL driver and sense circuits 2940. Next, word line WL0 transitions from 4 volts to zero volts. A write 1 voltage of approximately 4 volts results in a voltage of 3.5 volts across the terminals of a corresponding NV NT switch sub-component of NV NT diode C00 (4 volts minus NV NT diode turn on voltage of less than 0.5 volts) results in a transition from an OFF state to an ON state for NV NT Diode C00.

For an exemplary read operation, from cells C00-C03 for example, the bit line drivers in BL driver and sense circuits 2940 precharge bit lines BL0-BL3 to a high voltage such as a read voltage of 2 volts, for example. The read bit line voltage is selected to be less than both write 0 and write 1 voltages to ensure that stored logic states (bits) are not disturbed (changed) during a read operation. Word line driver circuits 2930 drives word line WL0 from 2 volts to zero volts. If NV NT Diode C00 in cell C00 is in an OFF state (storing a logic 0), then bit lines BL0 is not discharged and remains at 2 volts. A corresponding sense amplifier/latch in BL driver and sense circuits 2940 stores a logic 0. However, if NV NT Diode C00 in cell C00 is in an ON state, then bit line BL0 is discharged. A corresponding sense amplifier/latch in BL driver and sense circuits 2940 detects the reduced voltage and latches a logic 1.

Figure 29B:
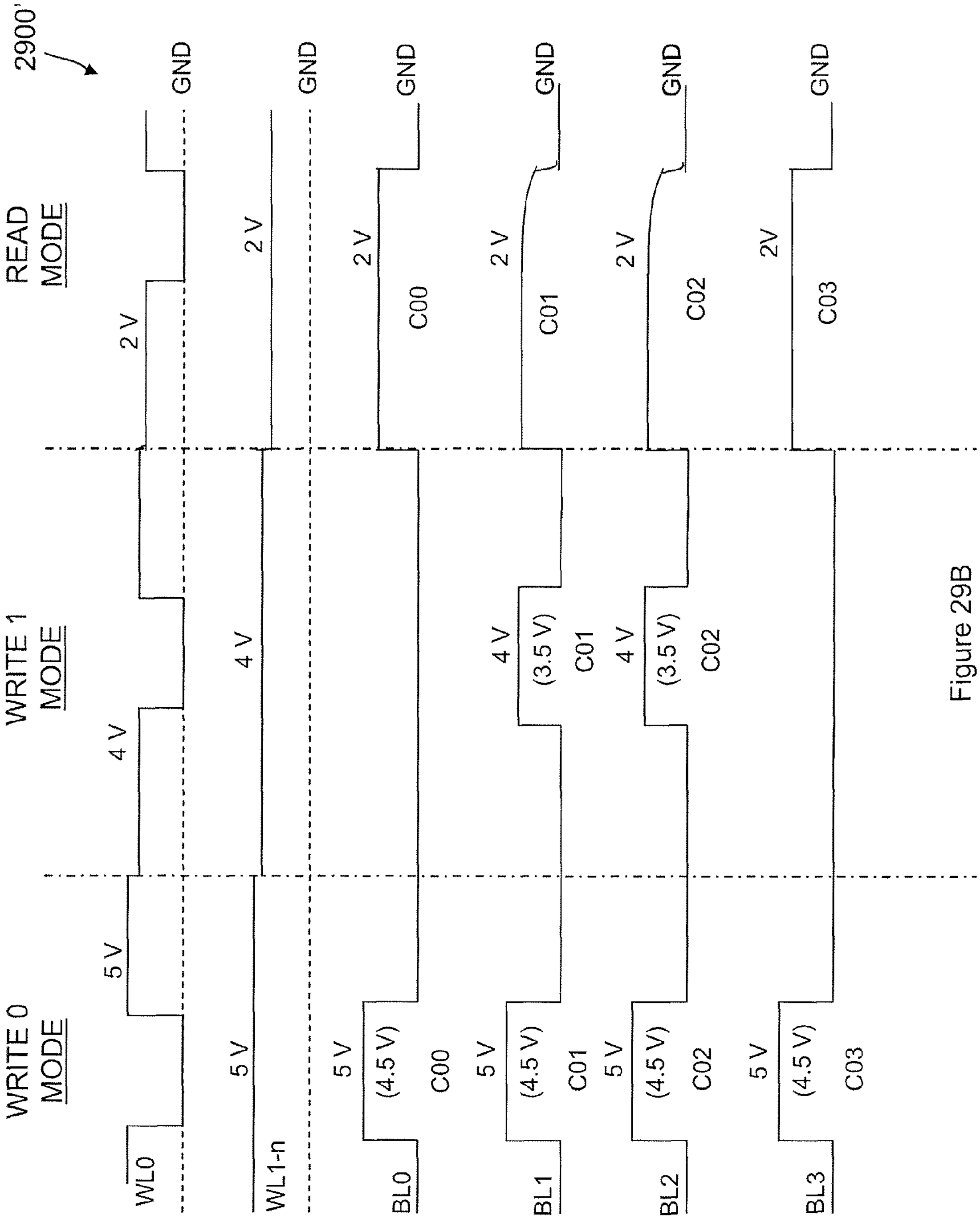
FIG. 29B illustrates operational waveforms for the memory illustrated in FIG. 29A, according to some embodiments.

FIG. 29B illustrates examples of operational waveforms 2900' that may be applied to the embodiment of memory 2900 illustrated in FIG. 29A during write 0, write 1, and read operations (or modes). A pre-write 0 read operation may optionally be performed before a write 0 operation in order to record cell states along a selected word line, such as word line WL0, in corresponding latches. Cells C00, C01, C02, and C03 receive write 0 pulses (nearly) simultaneously. At the beginning of an write 0 operation, bit lines BL0, BL1, BL2, and BL3 transition from zero to 5 volts as illustrated by waveforms 2900' in FIG. 29B. Next, word line WL0 transitions from 5 volts to zero volts thereby forward-biasing NV NT Diodes C00-C03. Approximately 4.5 volts appears across the respective NV NT Switches in each of the NV NT Diodes because of a less than 0.5 volt forward-bias voltage drop. If the write 0 voltage of corresponding NV NT Switch is 4.5 volts (or less), then NV NT Diodes transition from an ON (low resistance) state to an OFF (high resistance) state; NV NT Diodes in an OFF state remain in an OFF state. Thus after a write 0 operation along word line WL0, NV NT Diodes C00-C03 are all in an OFF state. Unselected word lines WL1, WL2, and WL3, ($WL_{1\text{-}n}$) all remain unselected and at 5 volts.

In this example, a write operation is preceded by a write 0 operation as described further above with respect to FIG. 29A. In other words, for cells along word line WL0, NV NT Diodes C00-C03 are in an OFF state at the beginning of the write operation. For exemplary write operations illustrated by waveforms 2900', NV NT Diodes C00 and C03 are to remain in the OFF state for a write 0 operation, and NV NT Diodes C01 and C02 are to transition from an OFF state to an ON state in a write 1 operation.

Therefore, at the beginning of the write (program) cycle, bit lines BL0 and BL3 remain at zero volts. Next, word line WL0 transitions from 4 volts to zero volts. NV NT Diodes COO and C03 remain back biased during the write 0 operation, and therefore NV NT Diodes remain in the OFF state storing a logic 0 state.

Continuing the exemplary write cycle, cells C01 and C02 transition from an OFF to an ON state. Bit lines BL1 and BL2 transition from zero to 4 volts. Next, word line WL0 transitions from 4 volts to zero volts. NV NT Diodes C01 and C02 are forward biased during the write 1 operation and approximately 3.5 volts appear across NV NT Switches corresponding to NV NT Diodes C01 and C02. NV NT Diodes C01 and C02 transition from an OFF to an ON state storing a logic 1 state.

For an exemplary read operation as illustrated by waveforms 2900' in FIG. 29B, bit lines BL0, BL1, BL2, and BL3 are precharged to 2 volts, for example, and allowed to float. Then word line WL0 transitions from 2 volts to zero volts. Word lines WL1, WL2, and WL3 remain at 2 volts. For cells C00 and C03, bit line BL0 and BL3 voltage remains unchanged because NV NT Diodes C00 and C03 are in an OFF or high resistance state and bit line BL0 and BL3 capacitance cannot discharge to ground (zero volts). However, for cells C01 and C02, bit lines BL1 and BL2 discharge toward zero volts because NV NT Diodes C01 and C02 are in an ON or low resistance state and bit line capacitance for BL1 and BL2 can discharge toward ground (zero volts). For BL1 and BL2, corresponding sense amplifier/latches typically detect bit line voltage reduction in the 100 mV to 200 mV range, although this value may vary depending upon the particular characteristics (design) of the sense/latch circuit. Corresponding sense amplifier/latches in BL driver and sense circuits 2940 determine that BL1 and BL2 read voltages have changed and latch a logic 1 state corresponding to the ON state of NV NT Diodes C01 and C02 that form cells C01 and C02. Corresponding sense amplifier/latches in BL driver and sense circuits 2940 determine that BL0 and BL3 have not changed and latch a logic 0 state corresponding to the OFF state of NV NT Diodes C00 and C03 forming cells C00 and C03.

Figure 30A:
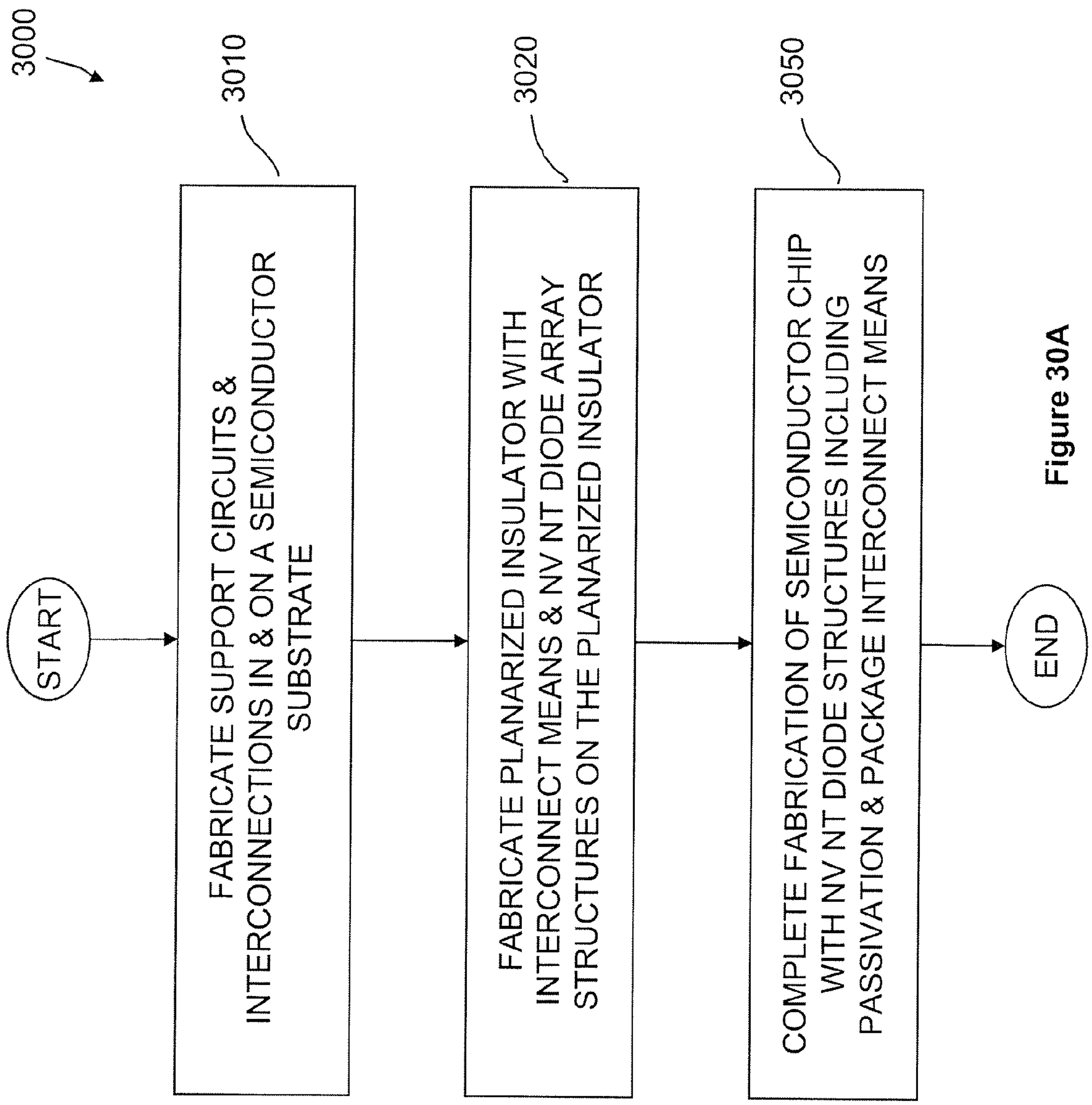
FIGS. 30A-30B illustrate methods of fabrication of memory cells using nonvolatile nanotube diodes similar to those illustrated schematically in FIG. 13, according to some embodiments.

3-Dimensional Cell Structure of Nonvolatile Cells using NV NT Devices having Vertically Oriented Diodes and Vertically Oriented NT Switches with Anode-to-NT Switch Connection FIG. 30A illustrates an exemplary method 3000 of fabricating embodiments of NV NT diodes having vertically oriented NT switches. While method 3000 is described further below with respect to nonvolatile nanotube diodes 1300 such as illustrated in FIG. 13, method 3000 is sufficient to cover the fabrication of many of the nonvolatile nanotube diode embodiments described further above. Note also that although methods 3000 are described below in terms of memory embodiments, methods 3000 may also be used to form logic embodiments based on NV NT diodes arranged as logic arrays such as NAND and NOR arrays with logic support circuits as used in PLAs, FPGAs, and PLDs, for example.

In general, methods 3010 fabricate support circuits and interconnections in and/or on a semiconductor substrate. This includes NFET and PFET devices having drain, source, and gate that are interconnected to form memory support circuits such as, for example, circuits 2920, 2930, 2940, 2950, 2960, and 2970 illustrated in FIG. 29A. Such structures and circuits may be formed using known techniques that are not described in this application. Methods 3010 can be used to form a base layer using known methods of fabrication in and on which nonvolatile nanotube diode control devices and circuits are fabricated.

Methods 3020 fabricate an intermediate structure including a planarized insulator with interconnect means and nonvolatile nanotube array structures on the planarized insulator surface. Interconnect means include vertically-oriented filled contacts, or studs, for interconnecting memory support circuits in and on a semiconductor substrate below the planarized insulator with nonvolatile nanotube diode arrays above and on the planarized insulator surface.

Word lines and bit lines can be used in 3D array structures as described further below to interconnect 3-D cells and form 3-D memories, and can be approximately orthogonal in an X-Y plane approximately parallel to underlying memory support circuits. Word line direction has been arbitrarily assigned as along the X axis and bit line direction has arbitrarily assigned as along the Y axis in Figures illustrating exemplary 3D array structures and 3D array structure methods of fabrication as described further below. The Z axis, approximately orthogonal to the X-Y plane, indicates the direction of 3D cell orientation.

Methods 3050 use industry standard fabrication techniques to complete fabrication of the semiconductor chip by adding additional wiring layers as needed, and passivating the chip and adding package interconnect means.

Figure 31A:
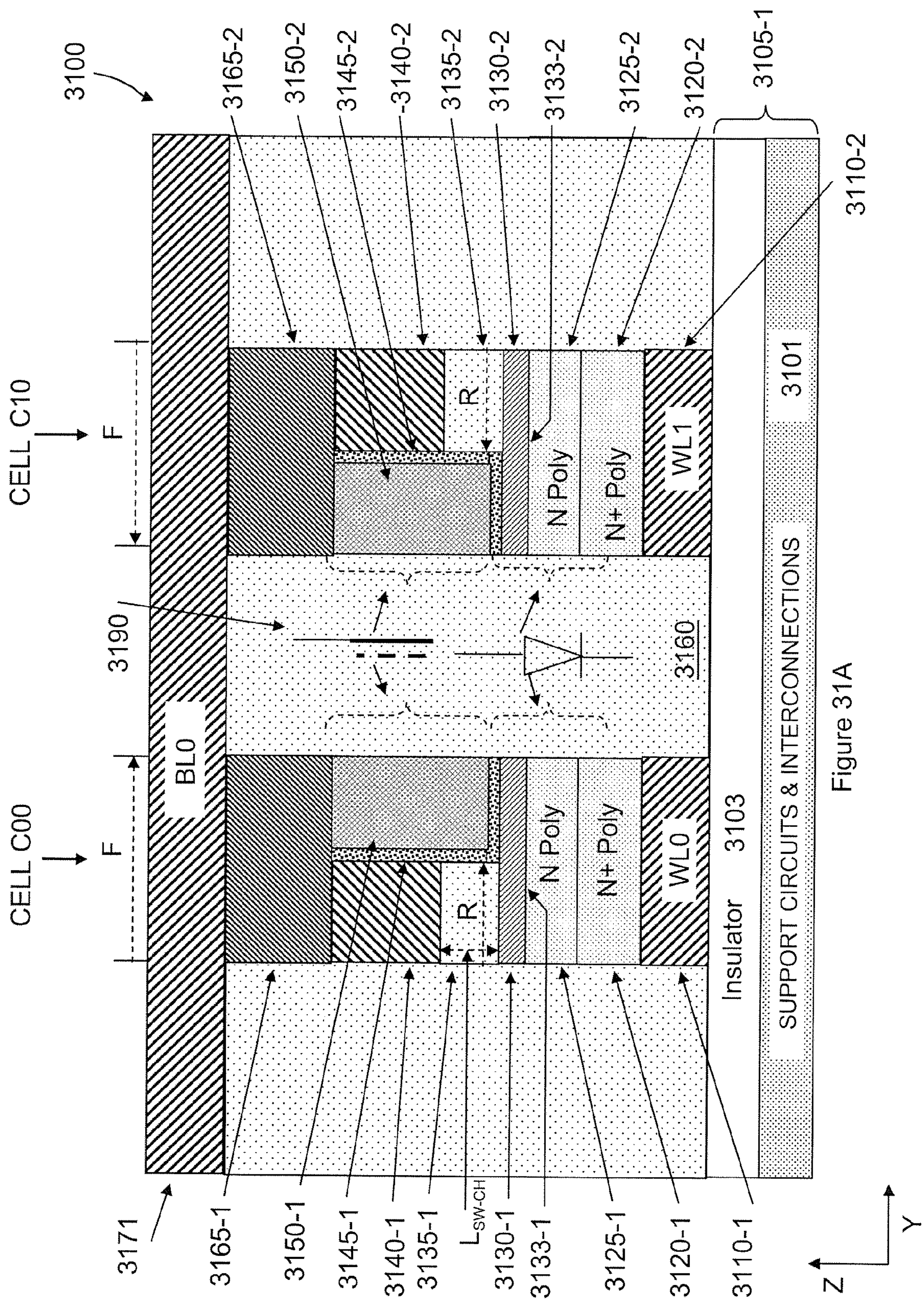
FIG. 31A illustrates a three dimensional cross section of an embodiment of a dense 3D cell structure formed with an anode-to-nanotube nonvolatile nanotube diode with a Schottky diode in series with a vertically oriented nonvolatile nanotube switch within vertical cell boundaries.

Once support circuits and interconnections in and on the semiconductor substrate are defined, methods then fabricate nonvolatile nanotube diode array such as that illustrated in cross section 3100 above the support circuit and interconnect region as illustrated in FIG. 31A. FIG. 31A illustrates a cross section including cells C00 and C10 in one of several possible embodiments.

Methods 3010 described further above are used to define support circuits and interconnections 3101.

Figure 30B:
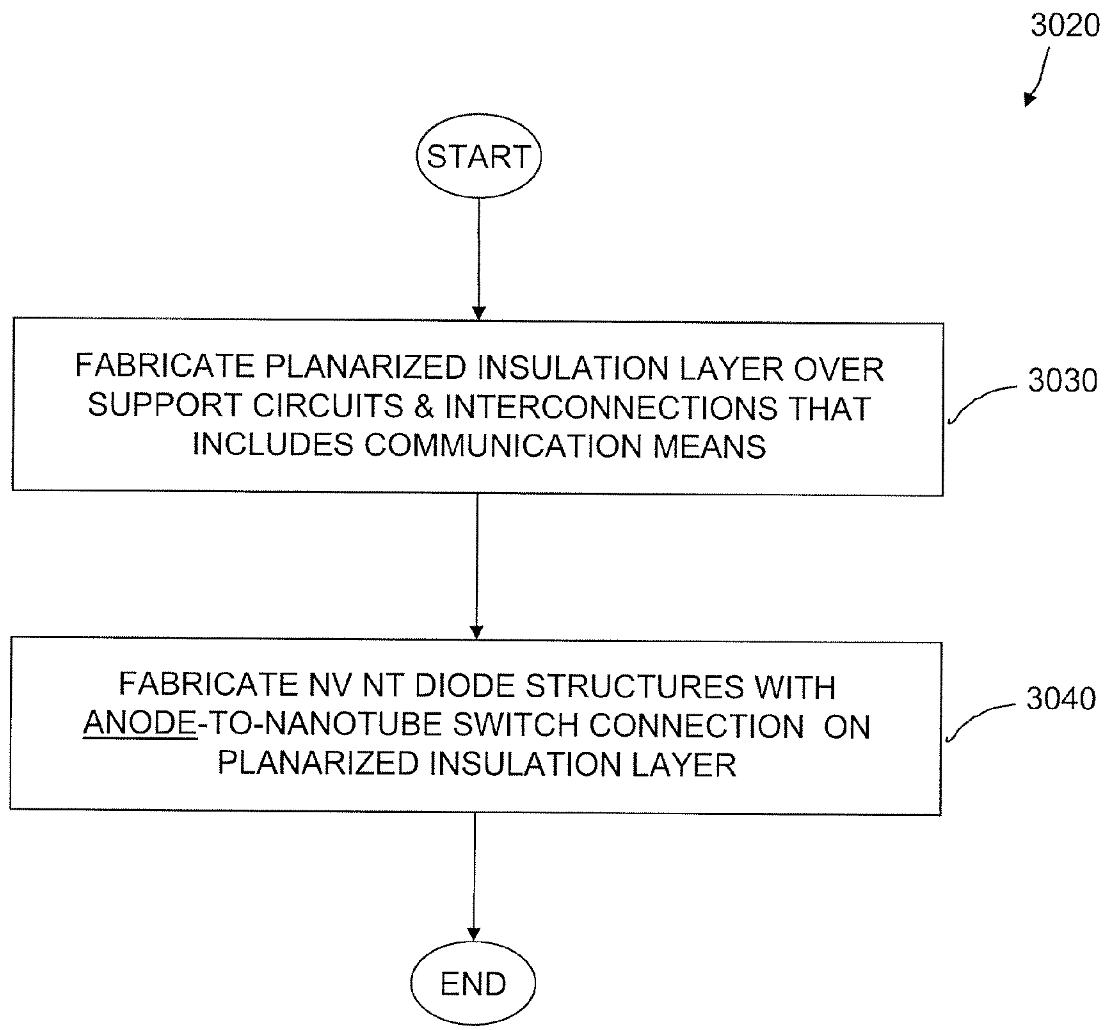

Next, methods 3030 illustrated in FIG. 30B deposit and planarize insulator 3103. Interconnect means through planar insulator 3103 (not shown in cross section 3100 but shown further above with respect to cross section 2800" in FIG. 28C) may be used to connect wiring metal lines in arrays to corresponding support circuits and interconnections 3101. By way of example, word line drivers in WL drivers 2930 may be connected to word line WL0 in array 2910 of memory 2900 illustrated in FIG. 29A. At this point in the fabrication process, methods may be used to form a memory array on the surface of insulator 3103, interconnected with of memory array support structure 3105-1 illustrated in FIG. 31A.

Methods 3040 illustrated in FIG. 30B deposit and planarize metal, polysilicon, insulator, and nanotube elements to form nonvolatile nanotube diodes which, in this example, include multiple vertically oriented diode and vertically oriented nonvolatile nanotube switch series pairs. Fabrication methods are described in more detail further below with respect to FIG. 36A-36FF. Individual cell outer dimensions can be formed in a single etch step, each cell having a single NV NT Diode defined by a single trench etch step after layers, except the BL0 layer, have been deposited and planarized, in order to eliminate accumulation of individual layer alignment tolerances that may substantially increase cell area. Individual cell dimensions in the Y direction are 1F (1 minimum feature) as illustrated in FIG. 31A, and also 1F in the X direction (not shown) which is orthogonal to the Y direction, with a periodicity in X and Y direction of 2F. Hence, each cell occupies an area of at least approximately $4F^2$. Nonvolatile nanotube diodes that form each cell are oriented in the Z (vertical) direction.

In addition to the simultaneous definition of overall cell dimensions without multiple alignment steps, in some embodiments reduced memory cell size (area) also requires the self-aligned placement of device elements within said memory cell boundaries.

Methods fill trenches with an insulator and then methods planarize the surface. Methods deposit and pattern bit lines on the planarized surface.

The fabrication of some embodiments of vertically-oriented 3D cells proceeds as follows. Methods deposit a word line wiring layer on the surface of insulator 3103 having a thickness of 50 to 500 nm, for example, as described further below with respect to FIGS. 36A-36FF. Methods etch the word line wiring layer and define individual word lines such as word lines 3110-1 (WL0) and 3110-2 (WL1). Word lines such as 3110-1 and 3110-2 are used as array wiring conductors and may also be used as individual cell contacts to N+ polysilicon regions 3120-1 and 3120-2. N+ polysilicon regions 3120-1 and 3120-2 contact cathodes formed by N polysilicon regions 3125-1 and 3125-2. Schottky diode junctions 3133-1 and 3133-2 may be formed using metal or silicide 3130-1 and 3130-2 regions in contact with N Polysilicon regions 3125-1 and 3125-2. N Polysilicon regions 3125-1 and 3125-2 may be doped with arsenic or phosphorus in the range of $10^{14}$ to $10^{17}$ dopant atoms/cm$^3$ for example, and may have a thickness range of 20 nm to 400 nm, for example. N+ polysilicon is typically doped with arsenic or phosphorous to $10^{20}$ dopant atoms/cm$^3$, for example, and has a thickness of 20 to 400 nm, for example.

Examples of contact and conductors materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

In some cases conductors such as Al, Au, W, Cu, Mo, Ti, and others may be used as anodes 3130-1 and 3130-2 for Schottky Diodes. However, in other cases, optimizing anode 3130-1 and 3130-2 material for lower forward voltage drop and lower diode leakage is advantageous. Schottky diode anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002m pp. 31-41, the entire contents of which are incorporated herein by reference.

At this point in the exemplary process Schottky diode select devices have been formed. Next, one nonvolatile nanotube switch is formed in each cell having one terminal common with anode metal 3130-1 and 3130-2 for example. In order to enhance the density of cells C00 and C10, the nanotube element in the corresponding nonvolatile nanotube switch is vertically oriented as illustrated in FIG. 31A with corresponding nanoswitch 700 illustrated in FIG. 7. Vertically oriented nanotube switches are described in greater detail in the incorporated patent references. Vertically oriented sidewalls including insulating and contact regions are formed prior to forming vertically oriented nanotube elements 3145-1 and 3145-2. Vertically oriented sidewalls are formed at R using self aligned methods, where R is approximately equal to F/2 in this example, however, similar self aligned methods of fabrication may be used to place the vertically oriented sidewalls at any location, such as F/3, F/4, or any other desired location.

Methods of forming nanotube elements 3145-1 and 3145-2 include first forming insulators 3135-1 and 3135-2 and contacts 3140-1 and 3140-2, in contact with corresponding insulators 3135-1 and 3135-2, by directionally etching an opening through both metal and insulator regions to form vertical sidewalls. Vertical sidewalls of insulators 3135-1 and 3135-2 and sidewall contacts 3140-1 and 3140-2 are self aligned with respect to trench sidewalls that are etched later in the process using methods of fabrication described further below with respect to FIGS. 36A-36FF. The thickness of insulators 3135-1 and 3135-2 determine the channel length $L_{SW-CH}$ as illustrated in FIG. 31A. Insulators 3135-1 and 3135-2 may range from less than 5 nm to greater than 250 nm, for example.

Next, methods form conformal nanotube elements 3145-1 and 3145-2 as described in greater detail in the incorporated patent references.

Then, methods form protective conformal insulator 3150-1 and 3150-2 on the surface of conformal nanotube elements 3145-1 and 3145-2, respectively.

Next, methods fill the opening with an insulating material and methods planarize the surface exposing the top surface of sidewall contacts 3140-1 and 3140-2.

Then, methods form contacts 3165-1 and 3165-2. Contacts 3165-1 and contacts 3165-2 provide a conductive path between sidewall contacts 3140-1 and 3140-2, respectively, and bit line 3171 (BL0) to be formed after completing the formation of cells C00 and C10. Contacts 3165-1 and 3165-2 correspond to the dimensions of a sacrificial layer used as a trench-etch masking layer of minimum dimension F prior to contacts 3165-1 and 3165-2 formation, as described further below with respect to FIG. 36A-36FF, that is self aligned to NV NT switch elements 3145-1 and 3145.

Then, methods etch trench regions, fill trenches with an insulator, and then planarize the surface to form insulator 3160 prior to contacts 3165-1 and 3165-2 formation described further below with respect to FIG. 36A-36FF.

Then, methods deposit and pattern bit line 3171 (BL0).

Nonvolatile nanotube diode 3190 schematic superimposed on cross section 3100 in FIG. 31A is an equivalent circuit that corresponds to nonvolatile nanotube diode 1300 in FIG. 13, one in each of cell C00 and C10. Cells C00 and C10 illustrated in cross section 3100 in FIG. 31A correspond to corresponding cells C00 and C10 shown schematically in memory array 2910 in FIG. 29A, and word lines WL0 and WL1 and bit line BL0 correspond to array lines illustrated schematically in memory array 2910.

Figure 31B:
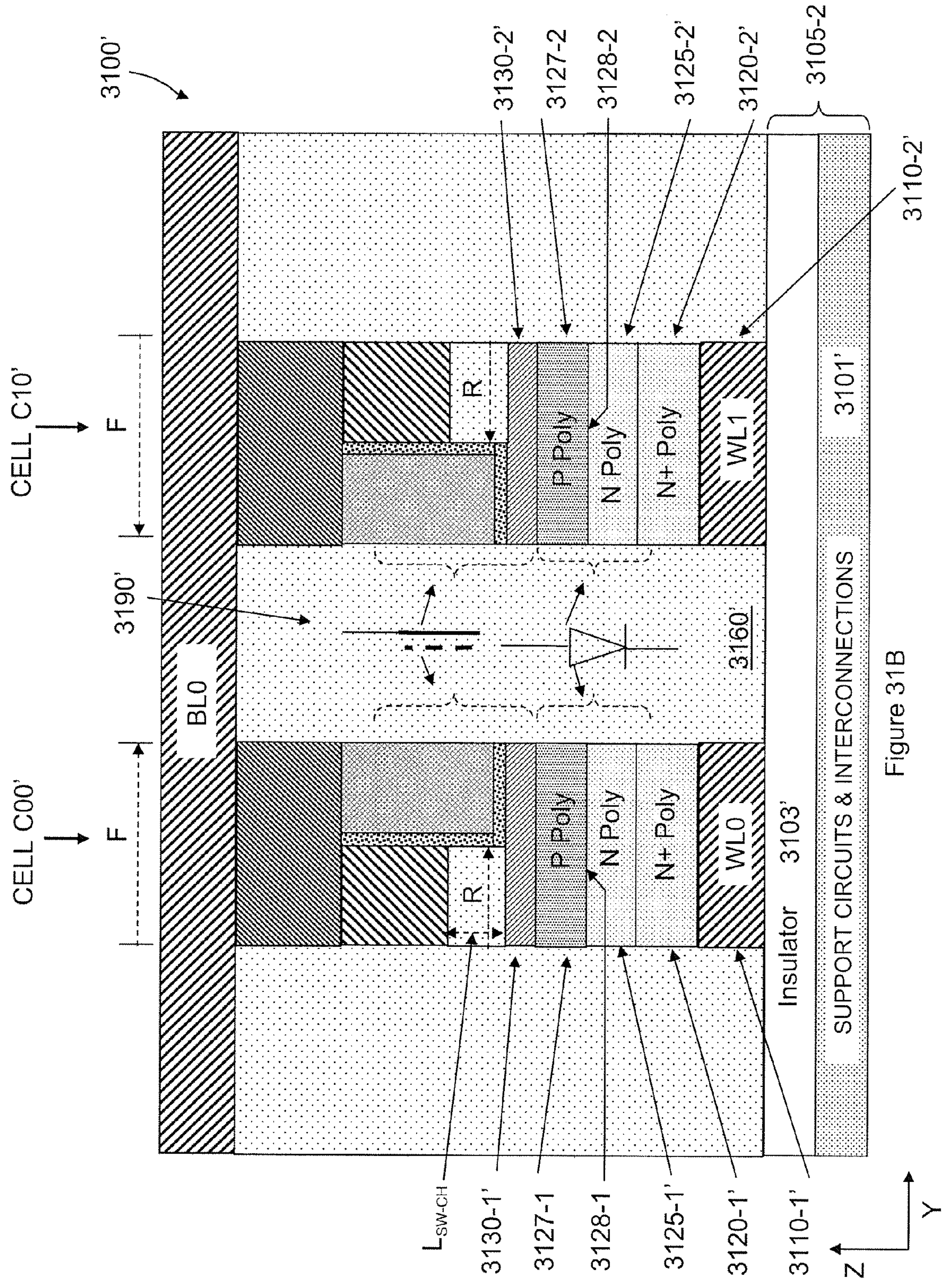
FIG. 31B illustrates a three dimensional cross section of an embodiment of a dense 3D cell structure formed with an anode-to-nanotube nonvolatile nanotube diode with a PN diode in series with a vertically oriented nonvolatile nanotube switch within vertical cell boundaries.

Cross section 3100' illustrated in FIG. 31B shows embodiments of memory array cells C00' and C10' that are similar to embodiments of memory array cells C00 and C10 illustrated in FIG. 31A, except that NV NT Diodes C00' and NV NT Diodes C10' formed in corresponding cells C00' and C10' include a PN diodes having PN diode junctions 3128-1 and 3128-2 instead of a Schottky diodes having a Schottky diode junctions 3133-1 and 3133-2. The cells are separated by insulating region 3160'.

P polysilicon regions 3127-1 and 3127-2 form an anode and N polysilicon regions 3125-10' and 3125-2' form a cathode that together form PN diodes with PN diode junctions 3128-1 and 3128-2. P polysilicon regions 3127-1 and 3127-2 also form ohmic or near-ohmic contacts with contact 3130-1' and 3130-2'. N polysilicon regions 3125-1' and 3125-2' also form ohmic contact regions with corresponding N+ polysilicon regions. Other structures of cells C00' and C10' are similar to those illustrated and described with respect to cells C00 and C10, respectively.

Memory array support structure 3105 of the embodiment illustrated in FIG. 31B includes support circuits and interconnections 3101' and planarized insulator 3103' which are similar to memory support structure 3101 illustrated in FIG. 31A except for adjustments that may be required to accommodate memory cells having PN diode select means instead of Schottky diode select means.

Nonvolatile nanotube diode 3190' is an equivalent circuit that corresponds to nonvolatile nanotube diode 1300 in FIG. 13, one in each of cell C00' and C10'. Cells C00' and C10' correspond to corresponding cells C00 and C10 shown schematically in memory array 2910 in FIG. 29A, and word lines WL0 and WL1 and bit line BL0 correspond to array lines illustrated schematically in memory array 2910.

Figure 31C:
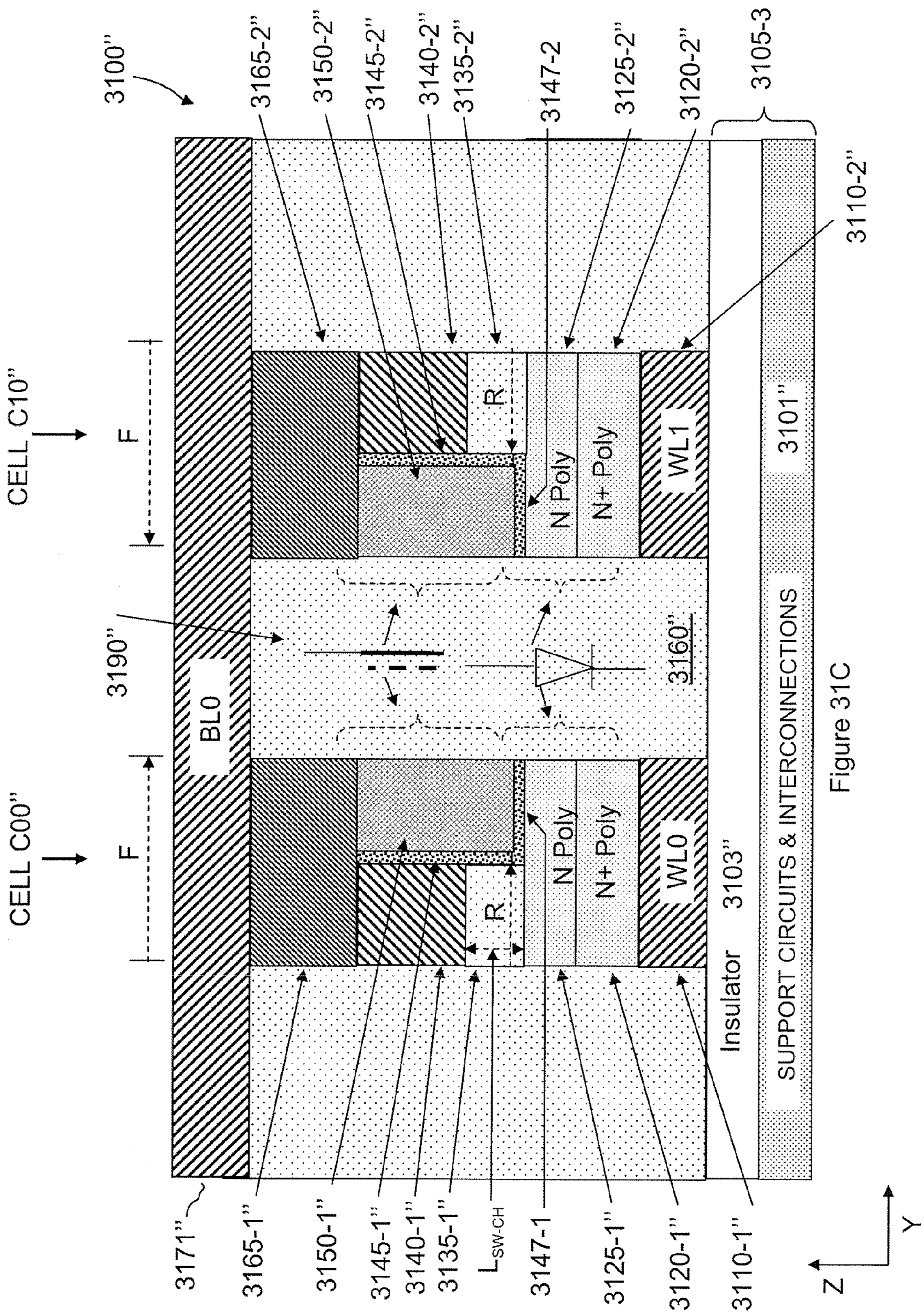
FIG. 31C illustrates a three dimensional cross section of an embodiment of a dense 3D cell structure formed with an anode-to-nanotube nonvolatile nanotube diode with a Schottky diode and PN diode in parallel and with both Schottky and PN parallel diodes in series with a vertically oriented nonvolatile nanotube switch within vertical cell boundaries.

Cross section 3100" illustrated in FIG. 31C shows embodiments of memory array cells C00" and C10" that are similar to the embodiments of memory array cells C00 and C10 illustrated in FIG. 31A, except that NV NT Diodes C00" and NV NT Diodes C10" formed in corresponding cells C00" and C101" include diode junctions 3147-1 and 3147-2 including both PN diode and Schottky diode junctions in parallel. The cells are separated by insulating region 3160" and surrounded with insulators 3135-1" and 3135-2".

P-type semiconductor nanotube elements, a subset of NT elements 3145-1" and 3145-2", in physical and electrical contact with N polysilicon regions 3125-1" and 3125-2" form a PN diode-anode and N polysilicon regions 3125-1" and 3125-2" form a cathode that together form PN diodes having PN diodes as part of combined PN and Schottky diode junctions 3147-1 and 3147-2. Metallic type nanotube elements, also a subset of NT elements 3145-1" and 3145-2", in physical and electrical contact with N polysilicon regions 3125-1" and 3125-2", form a Schottky diode-anode and N polysilicon regions 3125-1" and 3125-2" form a cathode for Schottky diodes having Schottky diode junctions as part of combined PN and Schottky diode junctions 3147-1 and 3147-2. Therefore, combined PN and Schottky diode junctions 3147-1 and 3147-2 are composed of PN-type diodes and Schottky-type diodes in parallel and are formed by nanotube elements 3145-1" and 3145-2" in contact with N polysilicon regions 3125-1" and 3125-2", respectively.

N polysilicon regions 3125-1" and 3125-2" also form ohmic contact regions with corresponding N+ polysilicon regions 3120-1" and 3120-2", respectively. Nanotube element 3145-1" and 3145-2" are also in physical and electrical contact with sidewall contacts 3140-1" and 3140-2". Sidewall contacts 3140-1" and 3140-2" are in contact with upper level contacts 3165-1" and 3165-2", respectively, which are in contact with bit line bit line 3171" (BL0). Formation of upper level contacts is briefly described further above with respect to FIG. 31A and in more detail further below with respect to FIGS. 36A-36FF. Other structures of cells C00" and C10" are similar to those illustrated and described with respect to cells C00 and C10, respectively.

Memory array support structure 3105-3 illustrated in the embodiment of FIG. 31C includes support circuits and interconnections 3101" and planarized insulator 3103" which are similar to memory support structure 3101 and planarized insulator 3103 illustrated in FIG. 31A except for adjustments that may be required to accommodate memory cells having PN diode select means and Schottky diode select means in parallel.

Nonvolatile nanotube diode 3190" is an equivalent circuit that corresponds to nonvolatile nanotube diode 1300 in FIG. 13, one in each of cell C00" and C10". Cells C00" and C10" illustrated in cross section 3100" in the embodiment of FIG. 31C correspond to corresponding cells C00 and C10 shown schematically in memory array 2910 in the embodiment of FIG. 29A, and word lines WL0 and WL1 and bit line BL0 correspond to array lines illustrated schematically in memory array 2910. Protective conformal insusulators are 3150-1" and 3150-2".

Figure 32:
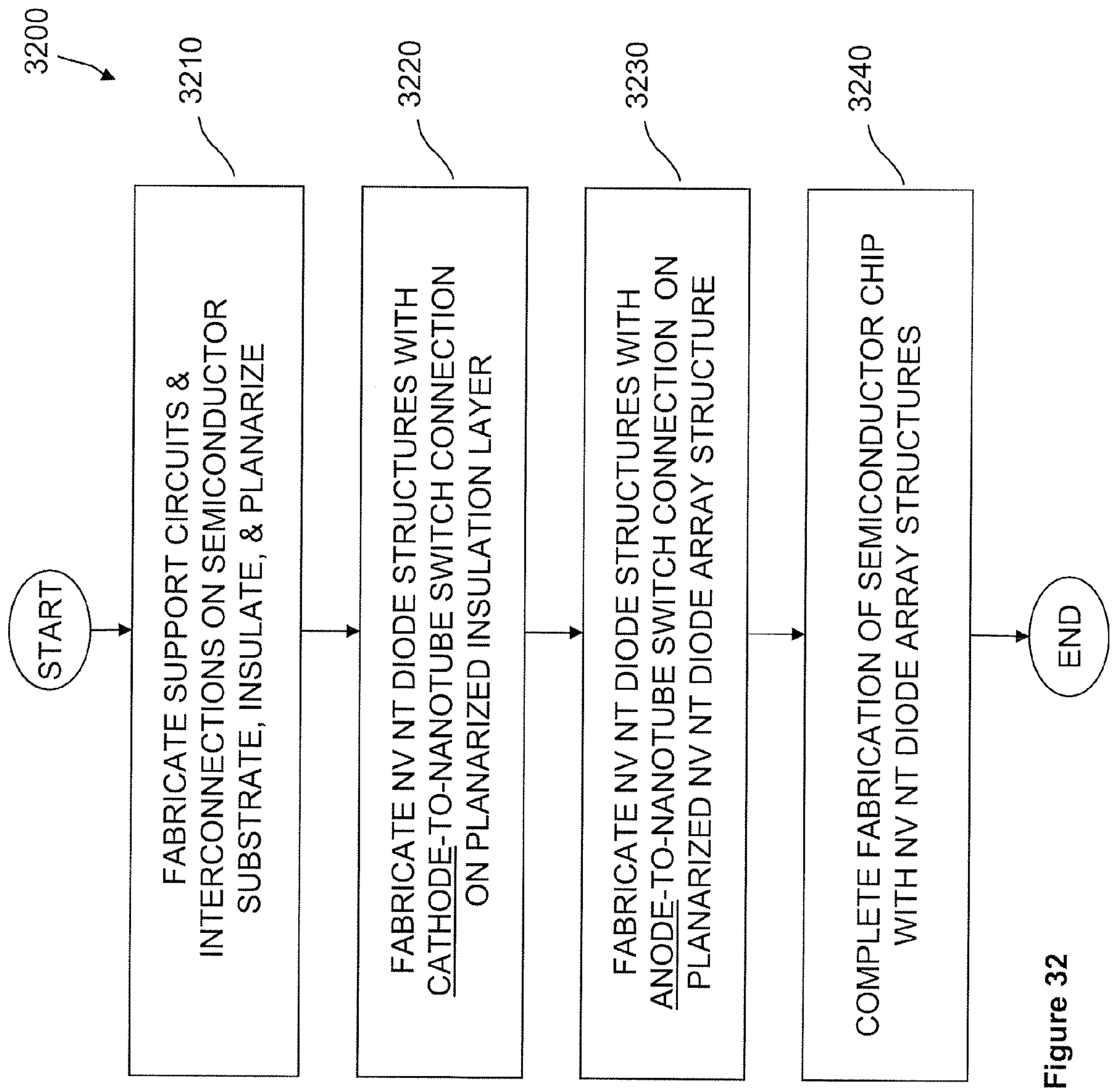
FIG. 32 illustrates methods of fabrication of stacked 3D memory arrays using both cathode-to-nanotube and anode-to-nanotube nonvolatile nanotube diodes similar to those illustrated schematically in FIGS. 12 and 13, according to some embodiments.

Nonvolatile Memories using NV NT Diode Device Stacks with both Anode-to-NT Switch Connections and Cathode-to-NT Switch Connections FIG. 32 illustrates an exemplary method 3200 of fabricating embodiments having two memory arrays stacked one above the other and on an insulating layer above support circuits formed below the insulating layer and stacked arrays, and with communications means through the insulating layer. While method 3200 is described further below with respect to nonvolatile nanotube diodes 1200 and 1300, method 3200 is sufficient to cover the fabrication of many of the embodiments of nonvolatile nanotube diodes described further above. Note also that although methods 3200 are described in terms of 3D memory embodiments, methods 3200 may also be used to form 3D logic embodiments based on NV NT diodes arranged as logic arrays such as NAND and NOR arrays with logic support circuits (instead of memory support circuits) as used in PLAs, FPGAs, and PLDs, for example.

Figure 33A:
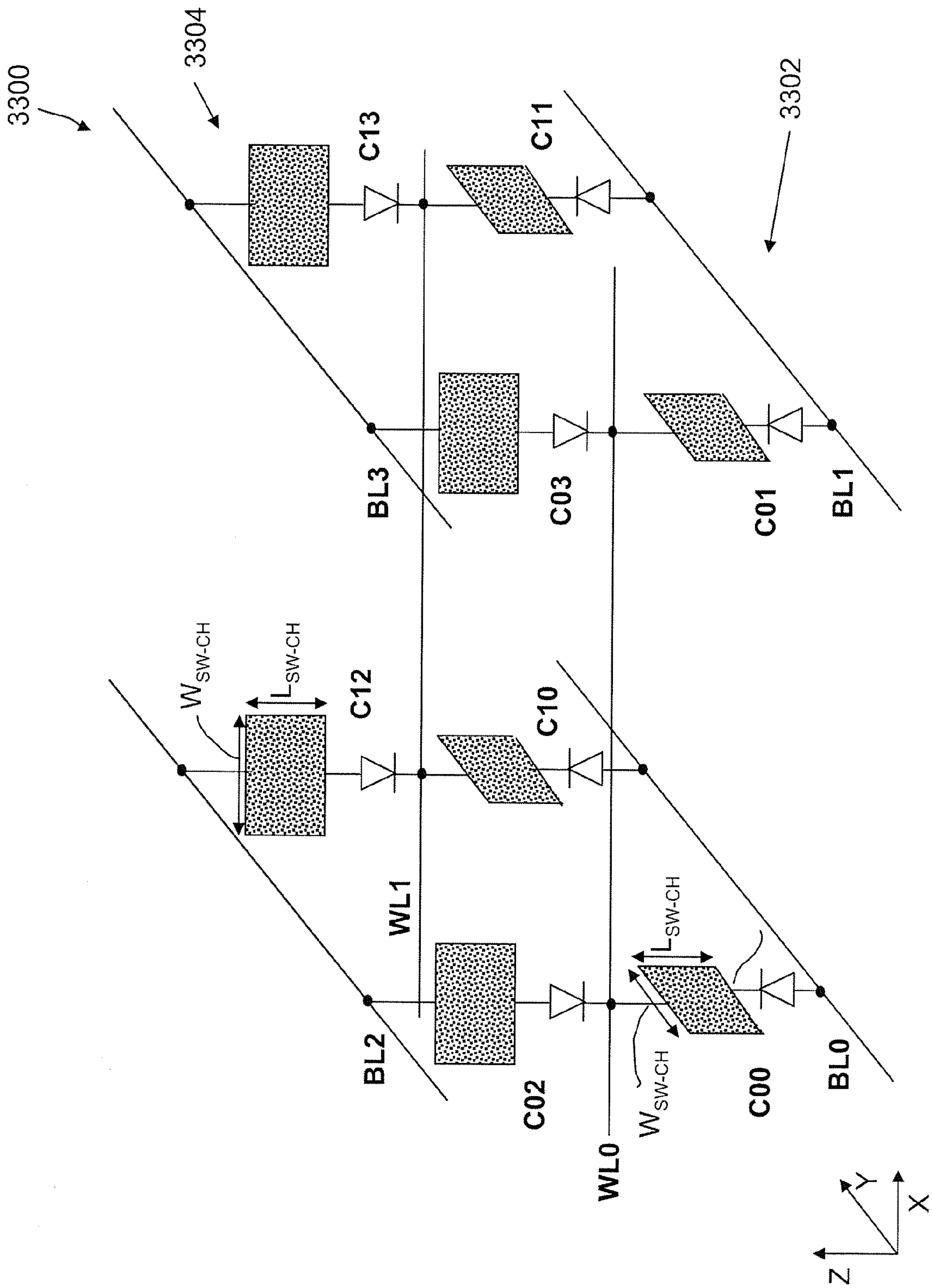
FIG. 33A illustrates a perspective view of an embodiment of two stacked 3D memory arrays using both cathode-to-nanotube and anode-to-nanotube 3D arrays.

FIG. 33A illustrates a 3D perspective drawing 3300 that includes an embodiment having a two-high stack of three dimensional arrays, a lower array 3302 and an upper array 3304. Lower array 3302 includes nonvolatile nanotube diode cells C00, C01, C10, and C11. Upper array 3304 includes nonvolatile nanotube diode cells C02, C12, C03, and C13. Word lines WL0 and WL1 are oriented along the X direction and bit lines BL0, BL1, BL2, and BL3 are oriented along the Y direction and are approximately orthogonal to word lines WL1 and WL2. Nanotube element channel length $L_{SW-CH}$ and channel width $W_{SW-CH}$ are shown in 3D perspective drawing 3300. Cross sections of embodiments that can be used as cells C00, C01, C02 and C03 are illustrated further below in FIG. 33B and FIG. 33C; and embodiments that can be used as cells C00, C02, C12, and C10 are illustrated further below in FIG. 33B'.

In general, methods 3210 fabricate support circuits and interconnections in and/or on a semiconductor substrate. This includes NFET and PFET devices having drain, source, and gate that can be interconnected to form memory (or logic) support (or select) circuits. Such structures and circuits may be formed using known techniques that are not described in this application. Methods 3210 are used to form a support circuits and interconnections 3301 layer as part of cross section 3305 illustrated in FIG. 33B and cross section 3305' illustrated in FIG. 33B' using known methods of fabrication in and on which nonvolatile nanotube diode control and circuits are fabricated. Support circuits and interconnections 3301 are similar to support circuits and interconnections 2801 and 3101 described further above, for example, but are modified to accommodate two stacked memory arrays. Note that while two-high stacked memory arrays are illustrated in FIGS. 33A-33D, more than two-high 3D array stacks may be formed (fabricated), including but not limited to 4-high and 8 high stacks for example.

Figure 33B:
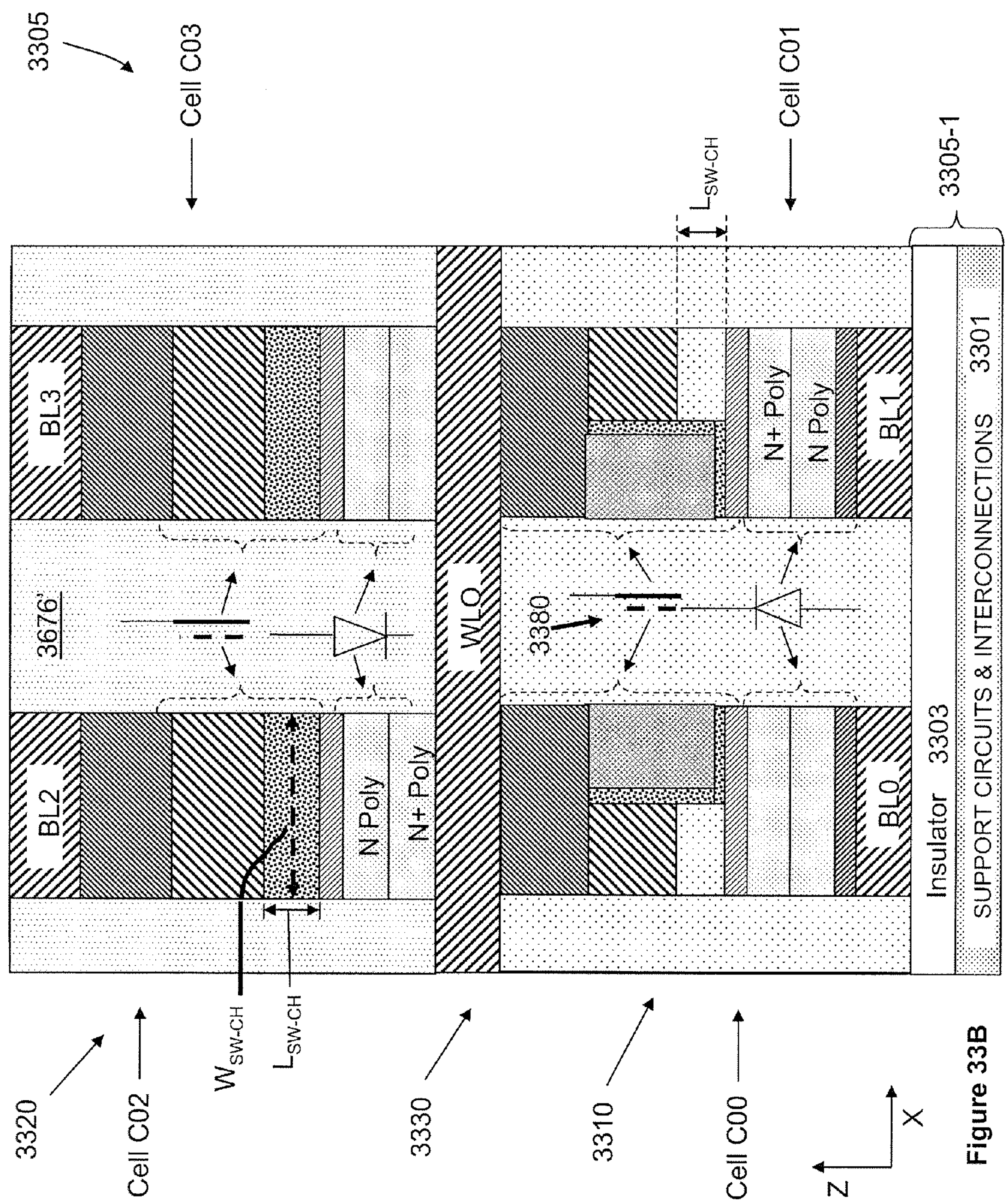
FIGS. 33B and 33B' illustrate cross sectional views of two embodiments of stacked 3D memory array structures with a shared word line.
Figure 33B:
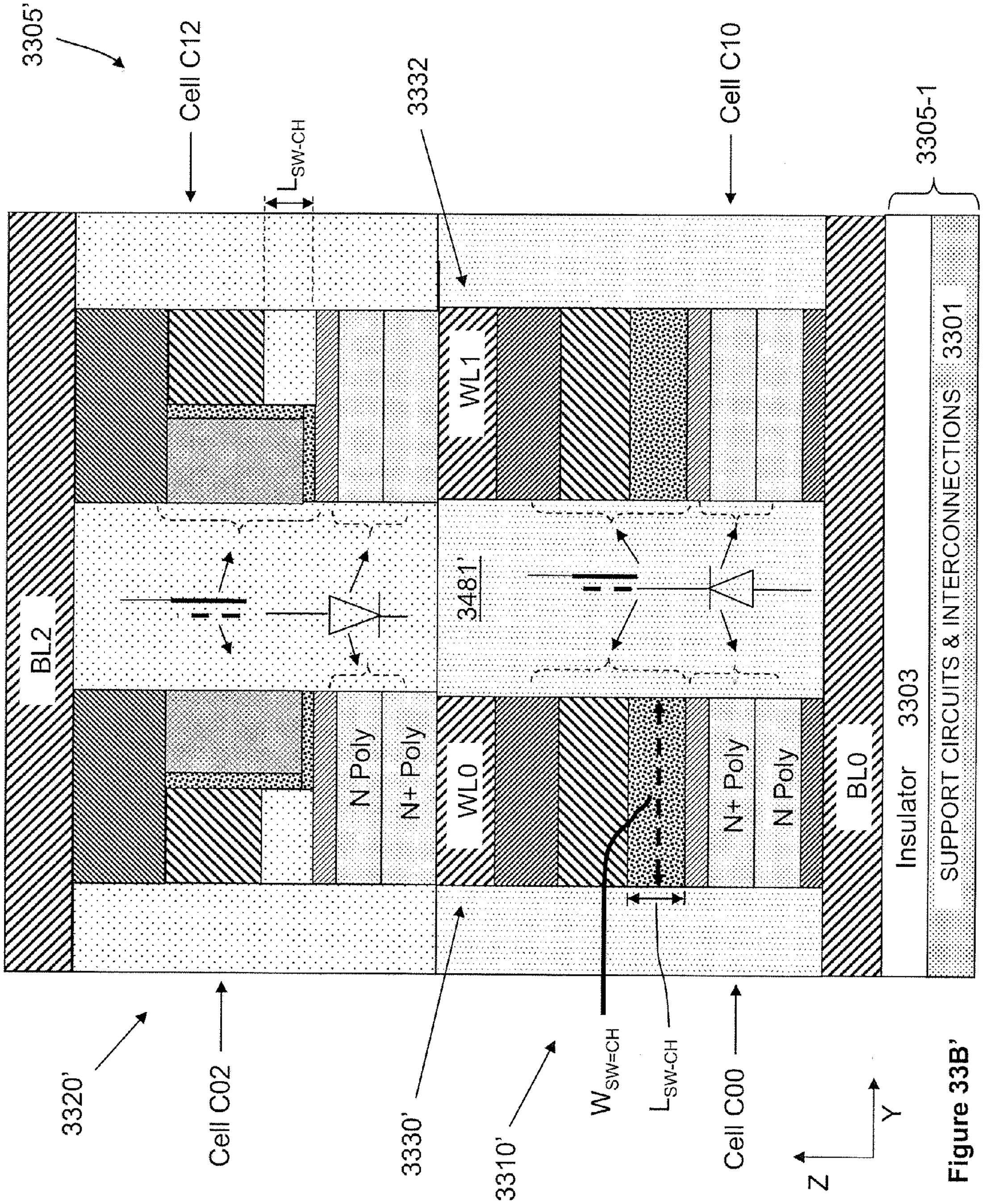

Next, methods 3210 are also used to fabricate an intermediate structure including a planarized insulator with interconnect means and nonvolatile nanotube array structures on the planarized insulator surface such as insulator 3303 illustrated in cross section 3305 in FIG. 33B and corresponding cross section 3305' in FIG. 33B'. Interconnect means include vertically-oriented filled contacts, or studs, for interconnecting memory support circuits in and on a semiconductor substrate below the planarized insulator with nonvolatile nanotube diode arrays above and on the planarized insulator surface. Planarized insulator 3303 is formed using methods similar to methods 2730 illustrated in FIG. 27B in which methods deposit and planarize insulator 3303. Interconnect means through planar insulator 3303 (not shown in cross section 3300) similar to contact 2807 illustrated in FIG. 28C may be used to connect array lines in first memory array 3310 and second memory array 3320 to corresponding support circuits and interconnections 3301 as described further below. Support circuits and interconnections 3301 and insulator 3303 form memory array support structure 3305-1.

Next, methods 3220, similar to methods 2740, are used to fabricate a first memory array 3310 using diode cathode-to-nanotube switches based on a nonvolatile nanotube diode array similar to a nonvolatile nanotube diode array cross section 2800 illustrated in FIG. 28A and corresponding methods of fabrication described further below with respect to FIGS. 34A-34FF.

Next, methods 3230 similar to methods 3040 illustrated in FIG. 30B, fabricate a second memory array 3320 on the planar surface of first memory array 3310, but using diode anode-to-nanotube switches based on a nonvolatile nanotube diode array similar to a nonvolatile nanotube diode array cross section 3100 illustrated in FIG. 31A and corresponding methods of fabrication described further below with respect to FIGS. 36A-36FF.

FIG. 33B illustrates cross section 3305 including first memory array 3310 and second memory array 3320, with both arrays sharing word line 3330 in common, according to some embodiments. Word lines such as 3330 can be defined (etched) during trench etch that defines memory array (cells) when forming array 3320. Cross section 3305 illustrates combined first memory array 3310 and second memory array 3320 in the word line, or X direction, with shared word line 3330 (WL0), four bit lines BL0, BL1, BL2, and BL3, and corresponding cells COO, C01, C02, and C03. The array periodicity in the X direction is 2F, where F is a minimum dimension for a technology node (generation).

FIG. 33B' illustrates cross section 3305' including first memory array 3310' and second memory array 3320' with both arrays sharing word lines 3330' and 3332 in common, according to some embodiments. Word line 3330' is a cross sectional view of word line 3330. Word lines such as 3330' and 3332 can be defined (etched) during a trench etch that defines memory array (cells) when forming array 3320'. Cross section 3305' illustrates combined first memory array 3310' and second memory array 3320' in the bit line, or Y direction, with shared word lines 3330' (WL0) and 3332 (WL1), two bit lines BL0 and BL2, and corresponding cells COO, C10, C02, and C12. The array periodicity in the Y direction is 2F, where F is a minimum dimension for a technology node (generation).

The memory array cell area of 1 bit for array 3310 can be down to $4F^2$ because of the 2F periodicity in the X and Y directions. The memory array cell area of 1 bit for array 3320 can be down to $4F^2$ because of the 2F periodicity in the X and Y directions. Because memory arrays 3320 and 3310 are stacked, the memory array cell area per bit can be down to $2F^2$. If four memory arrays (not shown) are stacked, then the memory array cell area per bit can be down to $1F^2$.

Referring again to FIG. 32, methods 3240 using industry standard fabrication techniques complete fabrication of the semiconductor chip by adding additional wiring layers as needed, and passivating the chip and adding package interconnect means.

Figure 33C:
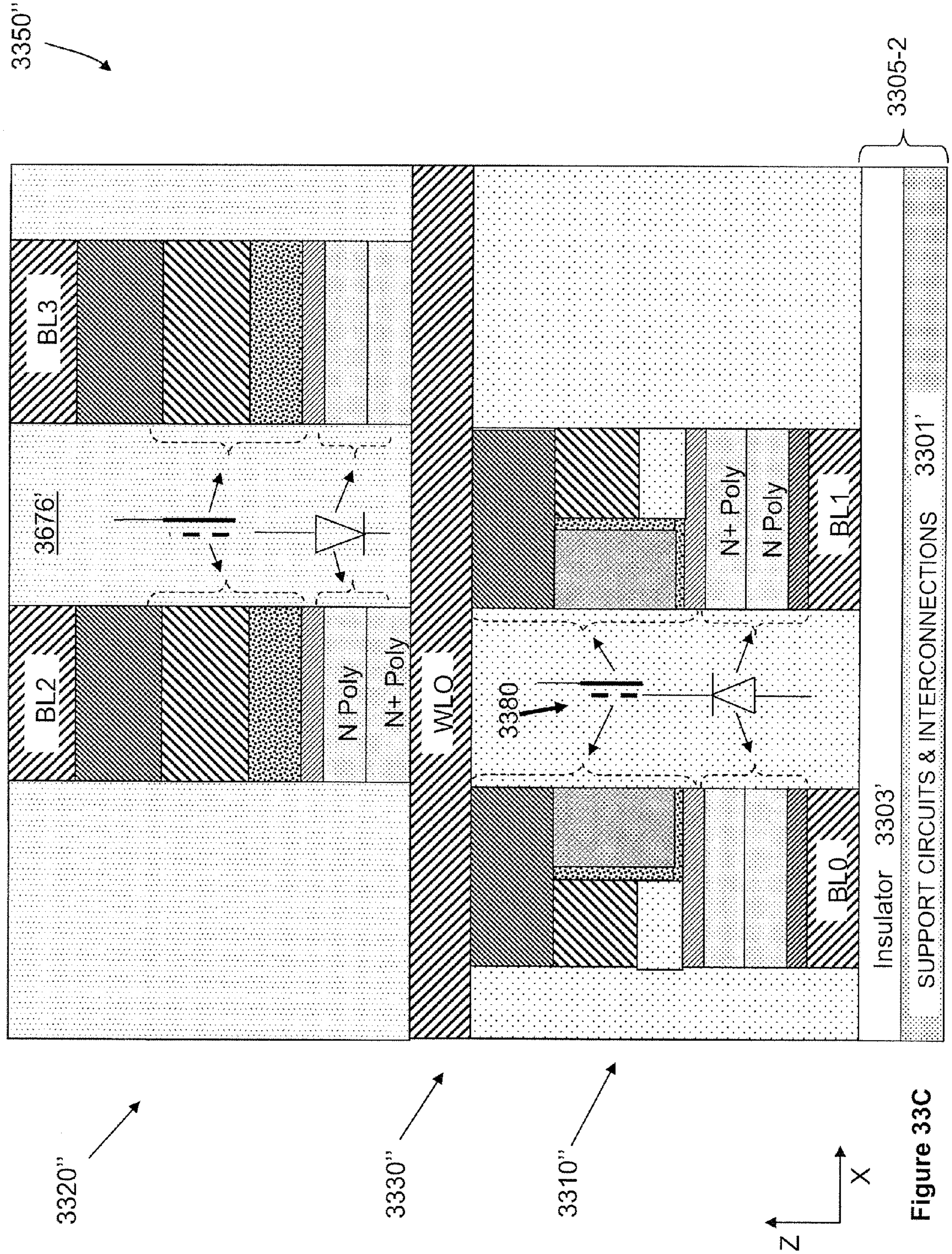
FIG. 33C illustrates a cross sectional view of an embodiment of a stacked 3D memory array structure which is a variation of the structure illustrated in FIG. 33B.

Cross section 3305 illustrated in FIG. 33B shows stacking of first memory array 3310 and second memory array 3320 with bit locations aligned in the vertical (Z) direction, according to some embodiments, however there may be interconnection and/or fabrication advantages to offsetting stacked memory arrays. FIG. 33C illustrates an embodiment having a cross section 3350" similar to cross section 3305 illustrated in FIG. 33B in which second memory array 3320" is translated by one cell location (a half-periodicity) relative to cells in first memory array 3310" and sharing word line 3330". Support circuits and interconnections 3301' and insulator 3303' form memory array support structure 3305-2 which is similar to memory array support structure 3305-1 illustrated in FIG. 33B.

In operation, the four stacked cells illustrated in FIG. 33B correspond to cell C00 and C01 cathode-to-nanotube cells illustrated schematically in memory array 2610 forming memory array 3310, and C02 and C03 anode-to-nanotube cells illustrated schematically in memory array 2910 forming memory array 3320. All four cells share common word line WL0 in memory array cross section 3300. Cells C00, C01, C02, and C03 are also shown in 3D perspective drawing 3300 illustrated in FIG. 33A. Memory array 3305 is approximately 2× denser on a per bit basis than memory arrays such as illustrated by cathode-to-NT cross section 2800 illustrated in FIG. 28A or anode-to-NT cross section 3100 illustrated in FIG. 31A for example. Additional word lines and bit lines (not shown) may be added to form a large memory array in the megabit and gigabit range. Word line WL0 and bit lines BL0, BL1, BL2, and BL3 operation is described further below in terms of waveforms 3375 illustrated in FIG. 33D with word line WL0 selected.

For an exemplary write 0 operation along word line WL0, simultaneously erasing cells C00, C01, C02, and C03, data stored in cells C00-C03 may optionally be read prior to erase and data stored in corresponding sense amplifier/latches. Write 0 operation along word line WL0 proceeds with bit lines BL0, BL1, BL2, and B3 transitioning from zero to 5 volts, with bit line voltages controlled by corresponding BL drivers. Next, WL driver circuits drive word line WL0 from 5 volts to zero volts thus forward biasing NV NT Diodes C00, C01, C02, and C03 that form cells C00, C01, C02, and C03, respectively. A write 0 voltage of approximately 4.5 volts (erase voltage 5 volts minus NV NT diode turn on voltage of less than 0.5 volts as illustrated in FIGS. 21A-21E) results in a transition from an ON state to an OFF state for NV NT Diodes in an ON state; NV NT Diodes in an OFF state remain in an OFF state. Thus after a write 0 operation along word line WL0, NV NT Diodes C00-C03 are all in an OFF state. Unselected word lines WL1, WL2, and WL3 (not shown in FIG. 33B) remain unselected and at 5 volts, and nonvolatile data stored in corresponding cells remains unchanged.

In this example, a write operation is preceded by a write 0 operation as described further above. In other words, NV NT Diodes C00-C03 of respective corresponding cells C00-C03 begin the write operation in the OFF state. For an exemplary write 0 operation to cells C00 and C03 for example, in which a logic 0 state is to be stored, NV NT Diodes C00 and C03 are to remain in the logic 0 high resistance state. Therefore, bit lines BL0 and BL3 are held at zero volts by corresponding BL driver and sense circuits. Next, word line WL0 transitions from 4 volts to zero volts, with stimulus from corresponding WL drivers. NV NT Diodes C00 and C03 remain back biased during the write 0 operation and cells C00 and C03 remain in an OFF (high resistance) logic 0 state.

If NV NT Diodes C01 and C02 are to transition from an OFF (high resistance state) to an ON (low resistance state) in a write 1 operation representing a logic 1, then bit lines BL1 and BL2 transition from zero volts to 4 volts, with stimulus provided by corresponding BL drivers. Next, word line WL0 transitions from 4 volts to zero volts. A write 1 voltage of approximately 4 volts results in a voltage of 3.5 volts across the terminals of corresponding NV NT switch sub-components of NV NT diode C01 and C02 (4 volts minus NV NT diode turn on voltage of less than 0.5 volts as illustrated in FIG. 21) and result in a transition from an OFF state to an ON state for NV NT Diodes C01 and C02.

For an exemplary read operation, from cells C00-C03 for example, corresponding bit line drivers in corresponding BL driver and sense circuits precharge bit lines BL0-BL3 to a high voltage such as a read voltage of 2 volts, for example. The read bit line voltage is selected to be less than both write 0 and write 1 voltages to ensure that stored logic states (bits) are not disturbed (changed) during a read operation. Word line drivers drive word line WL0 from 2 volts to zero volts. NV NT Diodes C00 and C03 in corresponding cells C01 and C03 are in an OFF state (storing a logic 0) and bit lines BL0 and BL3 are not discharged and remains at 2 volts. Corresponding sense amplifier/latches store corresponding logic 0 states. However, since NV NT Diode C01 and C02 in corresponding cells C01 and C02 are in an ON state, then bit lines BL1 and BL2 are discharged. Corresponding sense amplifier/latches detect a reduced voltage and latches store corresponding logic 1 states.

Note that the memory array illustrated in cross section 3350" of FIG. 33C can be operated similarly to memory array illustrated in cross section 3305 described further above with respect to FIG. 33B.

Methods of Fabricating Nonvolatile Memories using Nonvolatile Nanotube Diode (NV NT Diode) Devices as Cells Exemplary methods of fabricating embodiments of 3-dimensional cell structures of nonvolatile cells using NV NT devices having vertically oriented diodes and vertically oriented NV NT switches with cathode-to-NT switch connections such as illustrated by cross section 2800 illustrated in FIG. 28A and cross section 2800' illustrated in FIG. 28B are described further below with respect to FIGS. 34A-34FF.

Exemplary methods of fabricating embodiments of 3-dimensional cell structure of nonvolatile cells using NV NT Devices having vertically oriented diodes and horizontally oriented NV NT switches with cathode-to-NT switch connections such as illustrated by cross section 2800" illustrated in FIG. 28C are described further below with respect to FIGS. 35A-35S.

Exemplary methods of fabricating 3-dimensional cell structure embodiments of nonvolatile cells using NV NT devices having vertically oriented diodes and vertically oriented NV NT switches with anode-to-NT switch connections such as illustrated by cross section 3100 illustrated in FIG. 31A, cross section 3100' illustrated 31B, and cross section 3100" illustrated in FIG. 31C are described further below with respect to FIGS. 36A-FF.

Figure 34A:
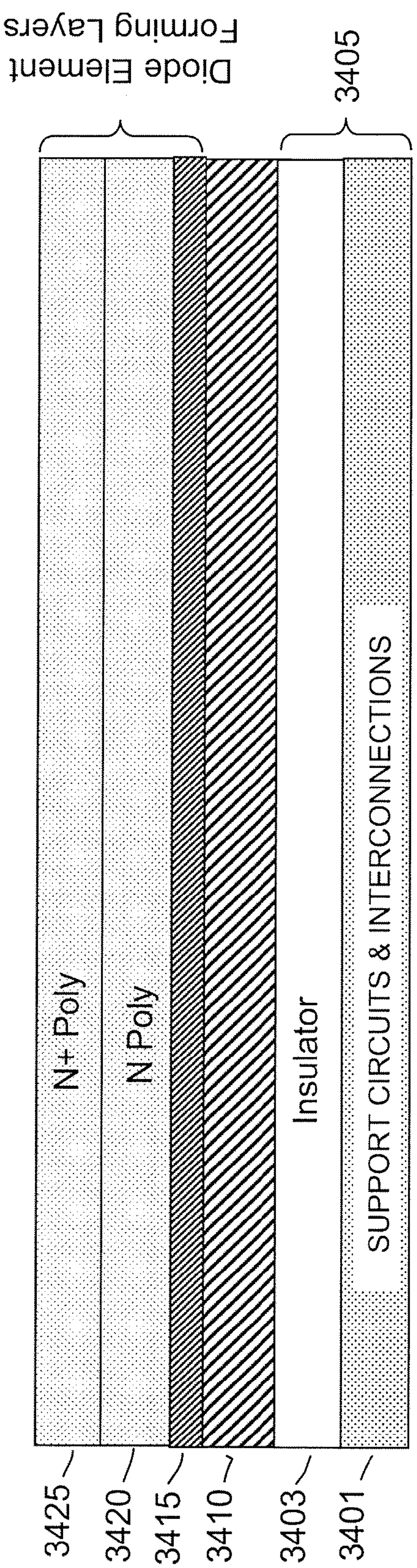
FIGS. 34A-34FF illustrate methods of fabrication for cathode-on-nanotube memory cross sectional structures with vertically oriented nonvolatile nanotube switches within vertical cell boundaries illustrated in FIGS. 28A and 28B, according to some embodiments.
Figure 34A:
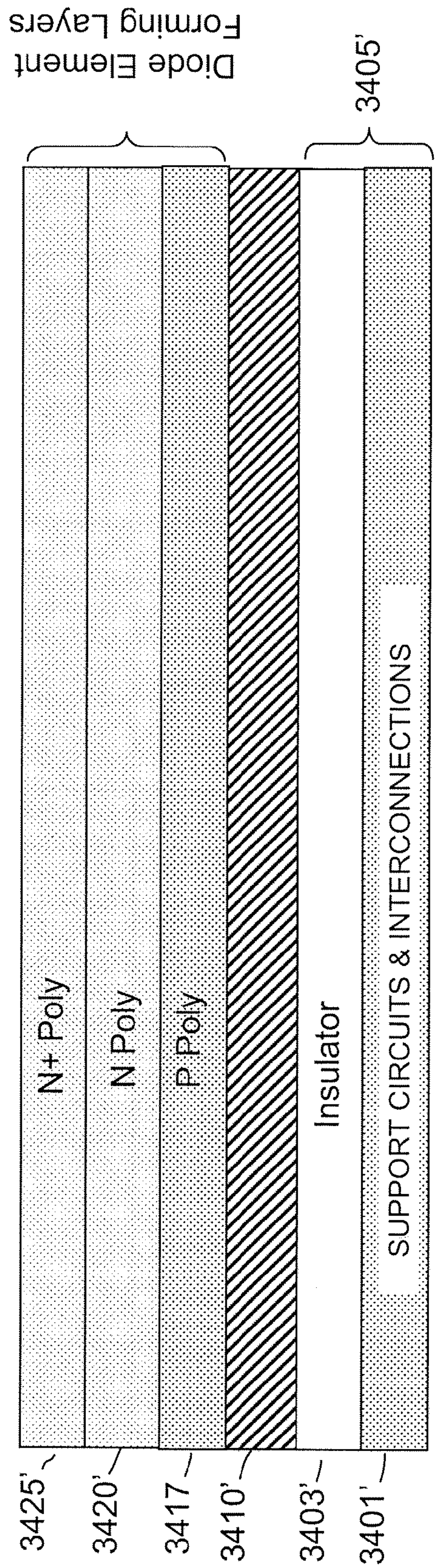

Exemplary methods of fabrication of embodiments of stacked arrays based on 3-dimensional cell structures of nonvolatile cells using NV NT Devices having vertically oriented diodes and vertically oriented NV NT switches using both cathode-to-NT Switch and anode-to-NT switch connected cell types, such as those shown in cross section 3300 illustrated in FIG. 33A, cross section 3300' illustrated in FIG. 33A', and cross section 3300' illustrated in FIG. 33B, are a combination of methods of fabrication described further below with respect to FIGS. 34A-FF and 36A-FF.

Methods of Fabricating Nonvolatile Memories using NV NT Diode Devices with Cathode-to-NT Switch Connection Methods 2700 illustrated in FIGS. 27A and 27B may be used to fabricate embodiments of memories using NV NT diode devices with cathode-to-NT switch connections for vertically oriented NV NT switches such as those shown in cross section 2800 illustrated in FIG. 28A and cross section 2800' illustrated in FIG. 28B as described further below with respect to FIGS. 34A-34FF. Structures such as cross section 2800 and 2800' may be used to fabricate, e.g., memory 2600 illustrated schematically in FIG. 26A.

Methods of fabricating cross sections 2800 and 2800' typically require critical alignments in X direction process steps. There are no critical alignments in the Y direction because in this example distance between trenches determines the width of the nanotube element. However, the width of the nanotube element may be formed to be less than the trench-to-trench spacing by using methods similar to those described further below with respect to the X direction. In the X direction, critical alignment requirements are eliminated by using methods that form self-aligned internal cell vertical sidewalls that define vertical nanotube channel element location, vertical channel element length ($L_{SW-CH}$), and form nanotube channel element contacts with respect to trench sidewalls that are etched later in the process to define outer cell dimensions using methods of fabrication described further below with respect to FIGS. 34A-34FF. In this example, NV NT diode cell structures occupy a minimum dimension F in the X and Y directions, where F is a minimum photolithographic dimension. In this example, the internal cell vertical sidewall is positioned (by self alignment techniques) at approximately R distance from trench sidewalls that are separated by distance F and that define outer cell dimensions as illustrated further below with respect to FIGS. 34A-34FF. FIGS. 34A-34FF is illustrated with a spacing R of approximately F/2. However, methods using self alignment techniques described further below with respect to FIGS. 34A-34FF may position a vertical sidewall at any location R within the cell region of width F using R values of F/4, F/3, F/2, 3F/4, etc for example.

Methods 2700 illustrated in FIGS. 27A and 27B may also be used to fabricate embodiments memories using NV NT diode devices with cathode-to-NT switch connections for horizontally oriented NV NT switches such as those shown in cross section 2800" illustrated in FIG. 28C as described further below with respect to FIGS. 35A-35S. Structures such as cross section 2800" also may be used to fabricate memory, e.g., memory 2600 illustrated schematically in FIG. 26A.

Methods of Fabricating 3-Dimensional Cell Structure of Nonvolatile Cells using NV NT Devices having Vertically Oriented Diodes and Vertically Oriented NT Switches with Cathode-to-NT Switch Connection Methods 2710 illustrated in FIG. 27A can be used to define support circuits and interconnects similar to those described with respect to memory 2600 illustrated in FIG. 26A as described further above. Methods 2710 apply known semiconductor industry techniques design and fabrication techniques to fabricated support circuits and interconnections 3401 in and/or on a semiconductor substrate as illustrated in FIG. 34A. Support circuits and interconnections 3401 include FET devices in a semiconductor substrate and interconnections such as vias and wiring above a semiconductor substrate.

Next, methods 2730 illustrated in FIG. 27B deposit and planarize insulator 3403 on the surface of support circuits and interconnections 3401 layer. Interconnect means through planar insulator 3403, not shown in FIG. 34A, are shown further below with respect to FIGS. 35A-35S. The combination of support circuits and interconnections 3401 and planarized insulator 3403 is referred to as memory support structure 3405 as illustrated in FIG. 34A.

Next, methods deposit a conductor layer 3410 on the planarized surface of insulator 3403 as illustrated in FIG. 34A, typically 50 to 500 nm thick, using known industry methods. Examples of conductors layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. In some cases materials such as those used in conductor layer 3410 may also be used as anodes for Schottky diodes, in which case a separate layer such as contact layer 3415 used to form anodes of Schottky diodes is not required and may be omitted from methods of fabrication.

Next, methods deposit a an optional conductive Schottky anode contact layer 3415 having a thickness range of 10 to 500 nm, for example, on the surface of conductor layer 3410. Anode contact layer 3415 may use similar materials to those used in forming conductor layer 3410 (or contact layer 3415 may be omitted entirely and conductor layer 3410 may be used to form a Schottky anode), or anode contact layer 3415 material may be chosen to optimize anode material for enhanced Schottky diode properties such lower forward voltage drop and/or lower diode leakage. Anode contact layer 3415 may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used.

Next, methods deposit an N polysilicon layer 3420 of thickness 10 nm to 500 nm on the surface of anode contact layer 3415. N polysilicon layer 3420 may be doped with arsenic or phosphorus in the range of $10^{14}$ to $10^{17}$ dopant atoms/$cm^3$, for example. N polysilicon layer 3420 may be used to form cathodes of Schottky diodes. In addition to doping levels, the polysilicon crystalline size (or grain structure) of N Polysilicon layer 3420 may also be controlled by known industry methods of deposition. Also, known industry SOI methods of deposition may be used that result in polysilicon regions that are single crystalline (no longer polysilicon), or nearly single crystalline.

Next, having completed memory support structure 3405, then deposited conductor layer 3410 which may be used as an array wiring layer, and then completed the deposition of Schottky diode forming layers 3415 and 3420, methods deposit N+ polysilicon layer 3425 on the surface of N polysilicon layer 3420 as illustrated in FIG. 34A in order to form an ohmic contact layer. N+ polysilicon layer 3425 is typically doped with arsenic or phosphorous to $10^{20}$ dopant atoms/$cm^3$, for example, and has a thickness of 20 to 400 nm, for example.

At this point in the process, remaining methods may be used to fabricate NV NT diode using Schottky diode-based cathode-to-NT switch structures such as those illustrated in FIG. 28A. However, as described further above with respect to FIG. 28B for example, NV NT diodes may be formed using PN diodes instead of Schottky diodes. Therefore, alternatively, a PN diode alternative fabrication method is illustrated in FIG. 34A'.

Methods 2700 described further above, and with respect to FIG. 34A, may also be used to describe the fabrication of FIG. 34A'. Support circuits and interconnections 3401' illustrated in FIG. 34A' correspond to support circuits and interconnections 3401 illustrated in FIG. 34A, except for possible small changes that may be introduced in individual circuits to accommodate differences in diode characteristics such as turn-on voltage, for example, between Schottky diodes and PN diodes.

Next, methods deposit planarized insulator 3403' on the surface of support circuits and interconnections 3401' as illustrated in FIG. 34A'. Planarized insulator 3403' corresponds to planarized insulator 3403 except for possible small changes that may be introduced in insulator 3403' to accommodate differences in diode characteristics. Memory support structure 3405' is therefore similar to support structures 3405 except for small changes that may be introduced in support circuits and interconnections 3401' and planarized insulator 3403' as described further above with respect to FIG. 34A'.

Next, methods deposit conductor layer 3410' in contact with the surface of planarized insulator 3403' as illustrated in FIG. 34A' which is similar in thickness and materials to conductor layer 3410 described further above with respect to FIG. 34A.

Next, methods deposit a P polysilicon layer 3417 of thickness 10 nm to 500 nm on the surface of conductor layer 3410' as illustrated in FIG. 34A'. P polysilicon layer 3417 may be doped with boron in the range of $10^{14}$ to $10^{17}$ dopant atoms/$cm^3$, for example. P polysilicon layer 3417 may be used to form anodes of PN diodes. In addition to doping levels, the polysilicon crystalline size of P Polysilicon layer 3417 may also be controlled by known industry methods of deposition. Also, known industry SOI methods of deposition may be used that result in polysilicon regions that are single crystalline (no longer polysilicon), or nearly single crystalline.

Next, methods deposit an N polysilicon layer 3420' of thickness 10 nm to 500 nm on the surface of P polysilicon layer 3417 that may be used to form cathodes of PN diodes. N polysilicon layer 3420' may be doped with arsenic or phosphorus in the range of $10^{14}$ to $10^{17}$ dopant atoms/$cm^3$, for example. In addition to doping levels, the polysilicon crystalline size (grain structure) of N Polysilicon layer 3420' may also be controlled by known industry methods of deposition. Also, known industry SOI methods of deposition may be used that result in polysilicon regions that are single crystalline (no longer polysilicon), or nearly single crystalline.

Next, having completed memory support structure 3405', then deposited conductor layer 3410' which may be used as an array wiring layer, and then completed the deposition PN diode forming layers 3417 and 3420', N+ polysilicon layer 3425' is deposited on N polysilicon layer 3420' in order to form an ohmic contact layer as illustrated in FIG. 34A'. N+ polysilicon layer 3425' is typically doped with arsenic or phosphorous to $10^{20}$ dopant atoms/$cm^3$, for example, and has a thickness of 20 to 400 nm, for example.

Descriptions of methods of fabrication continue with respect to Schottky-diode based structures described with respect to FIG. 34A to form NV NT diode cell structures corresponding to cross section 2800 illustrated in FIG. 28A. However, these methods of fabrication may also be applied to the PN diode-based structures described with respect to FIG. 34A' to form NV NT diode cell structures corresponding to cross section 2800' illustrated in FIG. 28B.

Figure 34B:
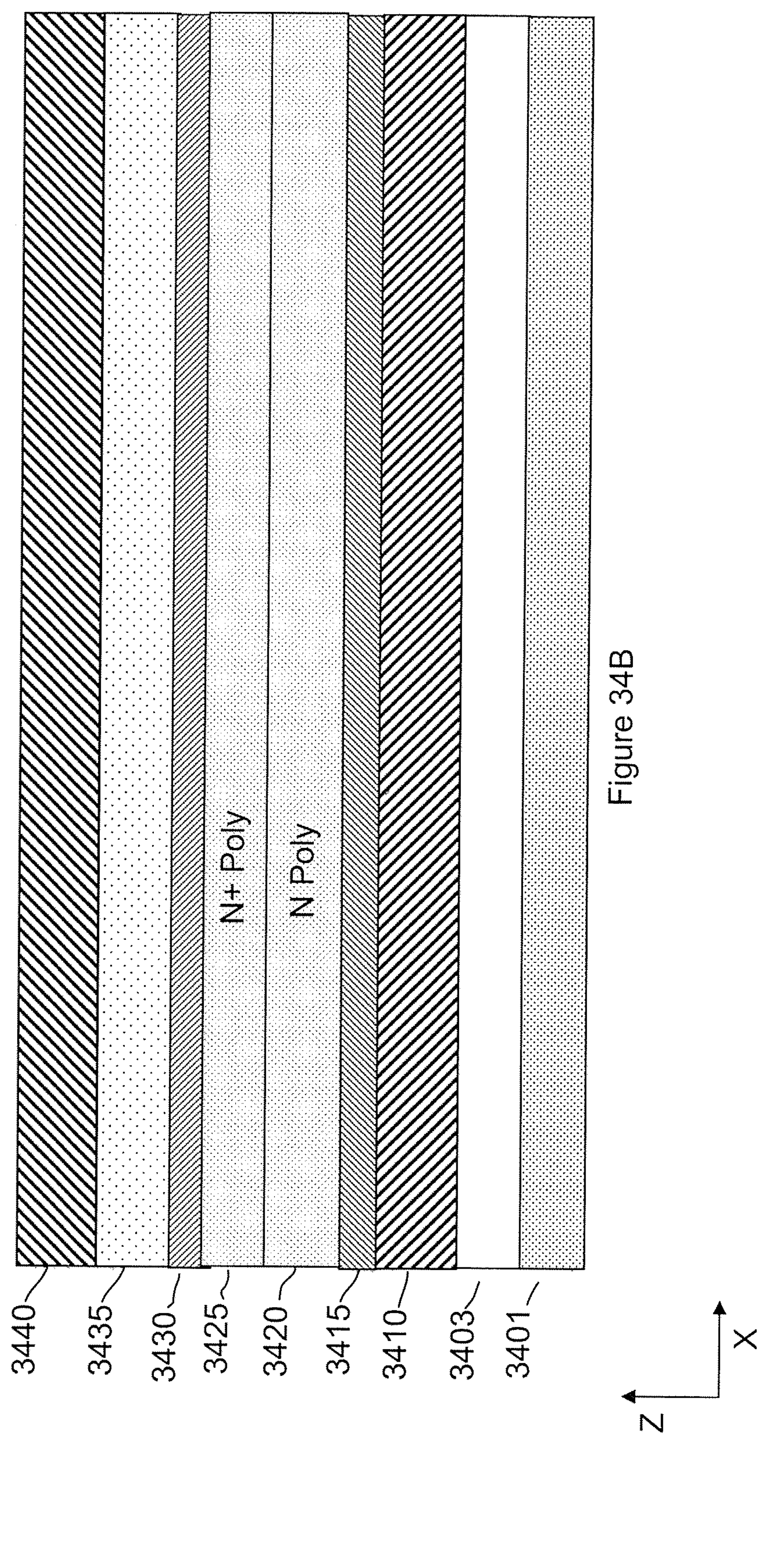

At this point in the fabrication process, methods deposit contact layer 3430 on the surface of N+ polysilicon layer 3425 as illustrated in FIG. 34B. Contact layer 3430 may be 10 to 500 nm in thickness, for example. Contact layer 3430 may be formed using Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, for example.

Next, methods deposit an insulator layer 3435 on contact layer 3430 as illustrated in FIG. 34B. The thickness of insulator layer 3435 may be well controlled and in some embodiments can be used to determine the channel length of vertically oriented nonvolatile nanotube switches as illustrated further below with respect to FIG. 34I. The thickness of insulator layer 3435 may vary in thickness from less than 5 nm to greater than 250 nm, for example. Insulator 3435 may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. U.S. patent application Ser. No. 11/280,786 includes some examples of various dielectric materials.

Next, methods deposit contact layer 3440 on insulator layer 3435 as illustrated in FIG. 34B. Contact layer 3440 may be in the range of 10 to 500 nm thick, for example, and may be formed using various conductor materials similar to materials described with respect to contact 3430 described further above.

Figure 34C:

Next methods deposit sacrificial layer 3441 on contact layer 3440 as illustrated in FIG. 34C. Sacrificial layer 3441 may be in the range of 10 to 500 nm thick, for example, and be formed using conductor, semiconductor, or insulator materials such as materials described further above with respect to contact layer 3430, semiconductor layers 3420 and 3425, and insulator layer 3435.

Next, methods deposit and pattern a masking layer such as masking layer 3442 deposited on the top surface of sacrificial layer 3441 as illustrated in FIG. 34C using known industry methods. The mask opening may be aligned to alignment marks in planar insulating layer 3403 for example; the alignment is not critical.

Figure 34D:
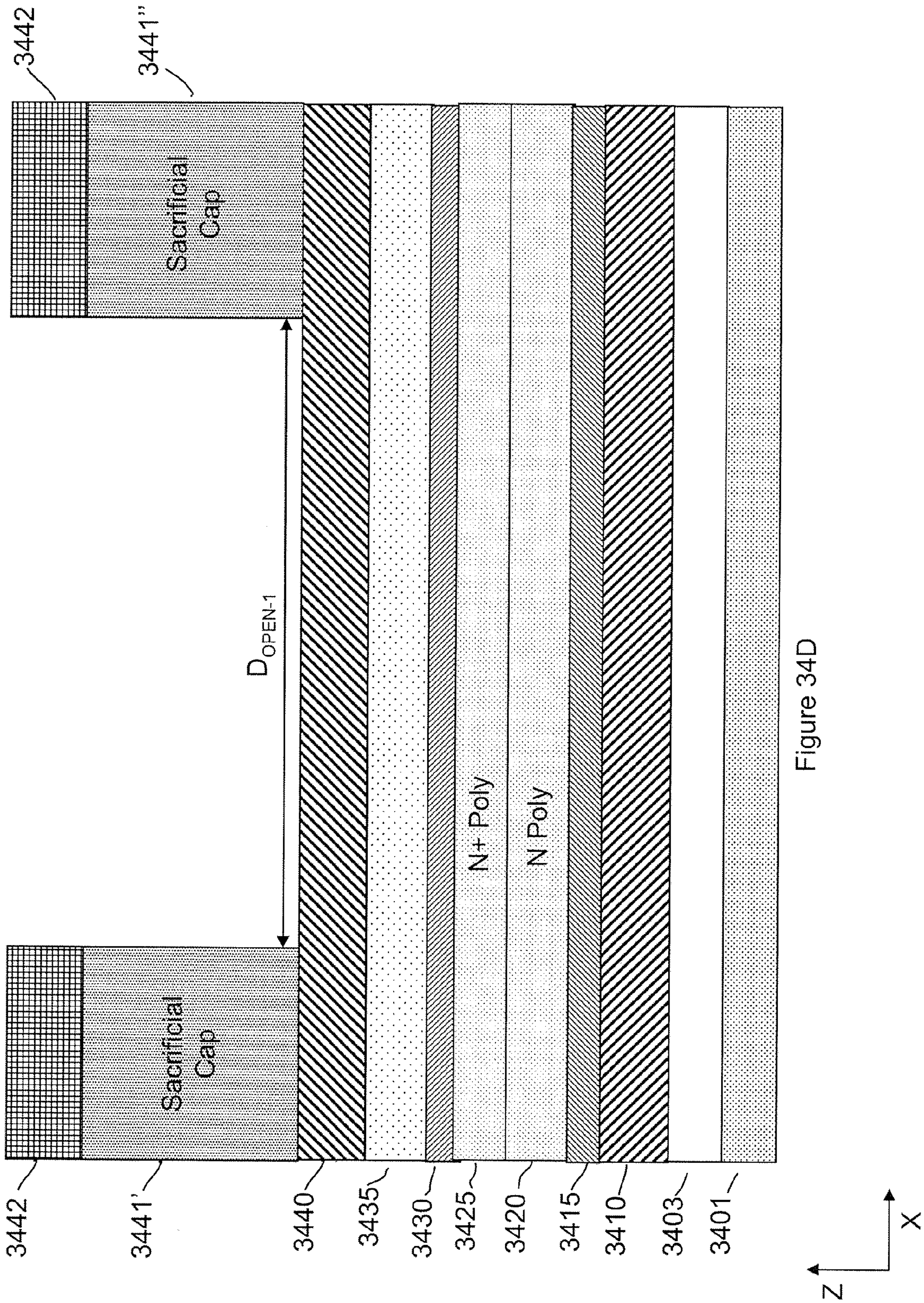

Then, methods directionally etch sacrificial layer 3441 to form an opening of dimension $D_{OPEN-1}$ in the X direction through sacrificial layer 3441 stopping at the surface of contact layer 3440 using known industry methods as illustrated in FIG. 34D. Two memory cells that include vertical nanotube channel elements self aligned and positioned with respect to vertical edges of sacrificial regions 3441' and 3441" are formed as illustrated further below. The dimension $D_{OPEN-1}$ in the X direction is approximately 3F, where F is a minimum photolithographic dimension. For a 65 nm technology node, $D_{OPEN-1}$ is 195 nm, which is a non-minimum and therefore non-critical dimension at any technology node. At this point in the process, sidewall spacer techniques are used to position vertical sidewalls at a distance R from the inner surfaces of sacrificial regions 3441' and 3441" as described further below.

Figure 34E:
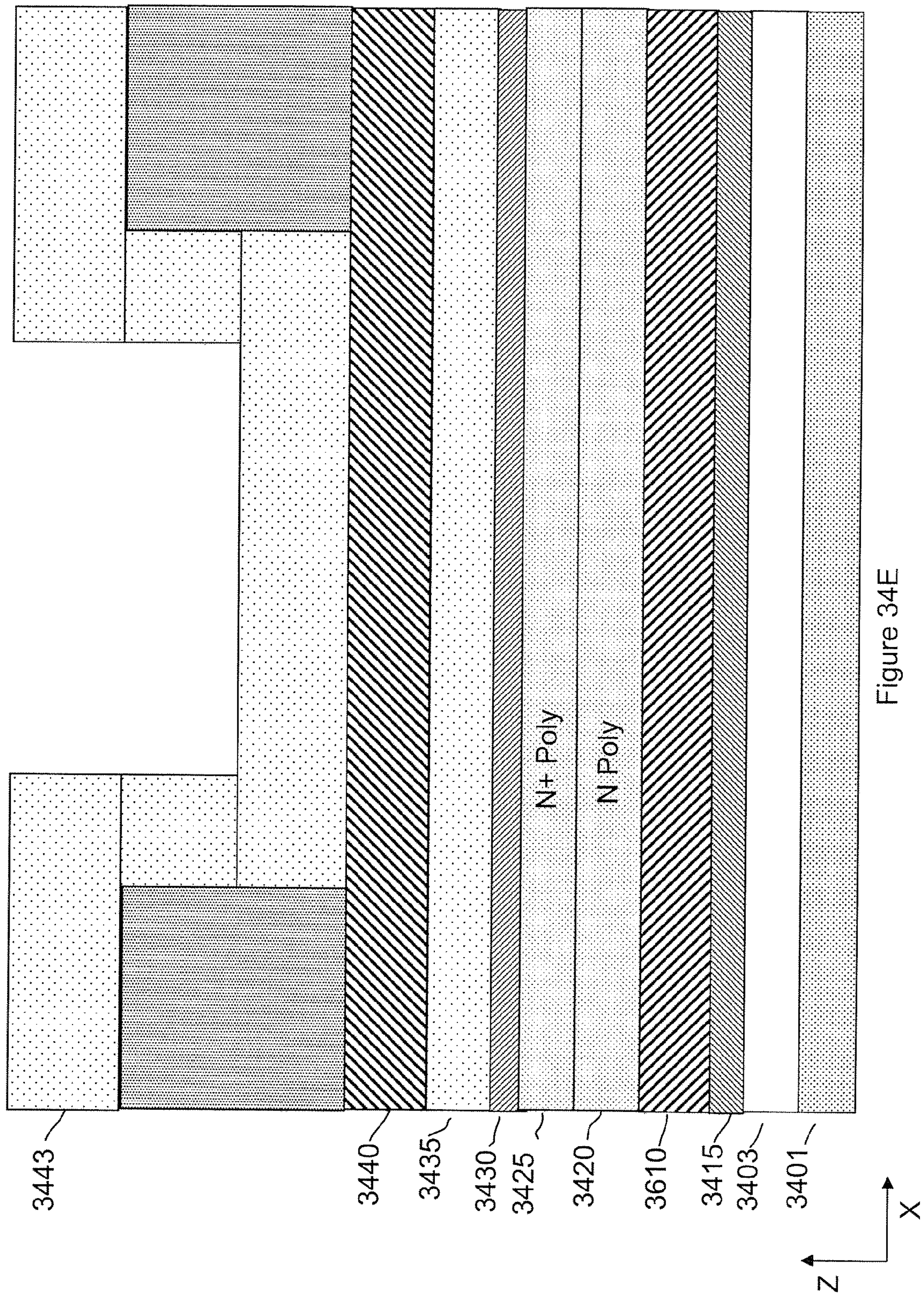

Next, methods deposit a conformal sacrificial layer 3443 as illustrated in FIG. 34E. In some embodiments, the thickness of conformal sacrificial layer 3443 is selected as R, which in this example is selected as approximately F/2. In this example, since R is approximately F/2, and since F is approximately 65 nm, then the thickness of conformal sacrificial layer 3443 is approximately 32.5 nm. Conformal sacrificial layer 3443 may be formed using conductor, semiconductor, or insulator materials similar to those materials used to form sacrificial layer 3441 described further above.

Figure 34F:
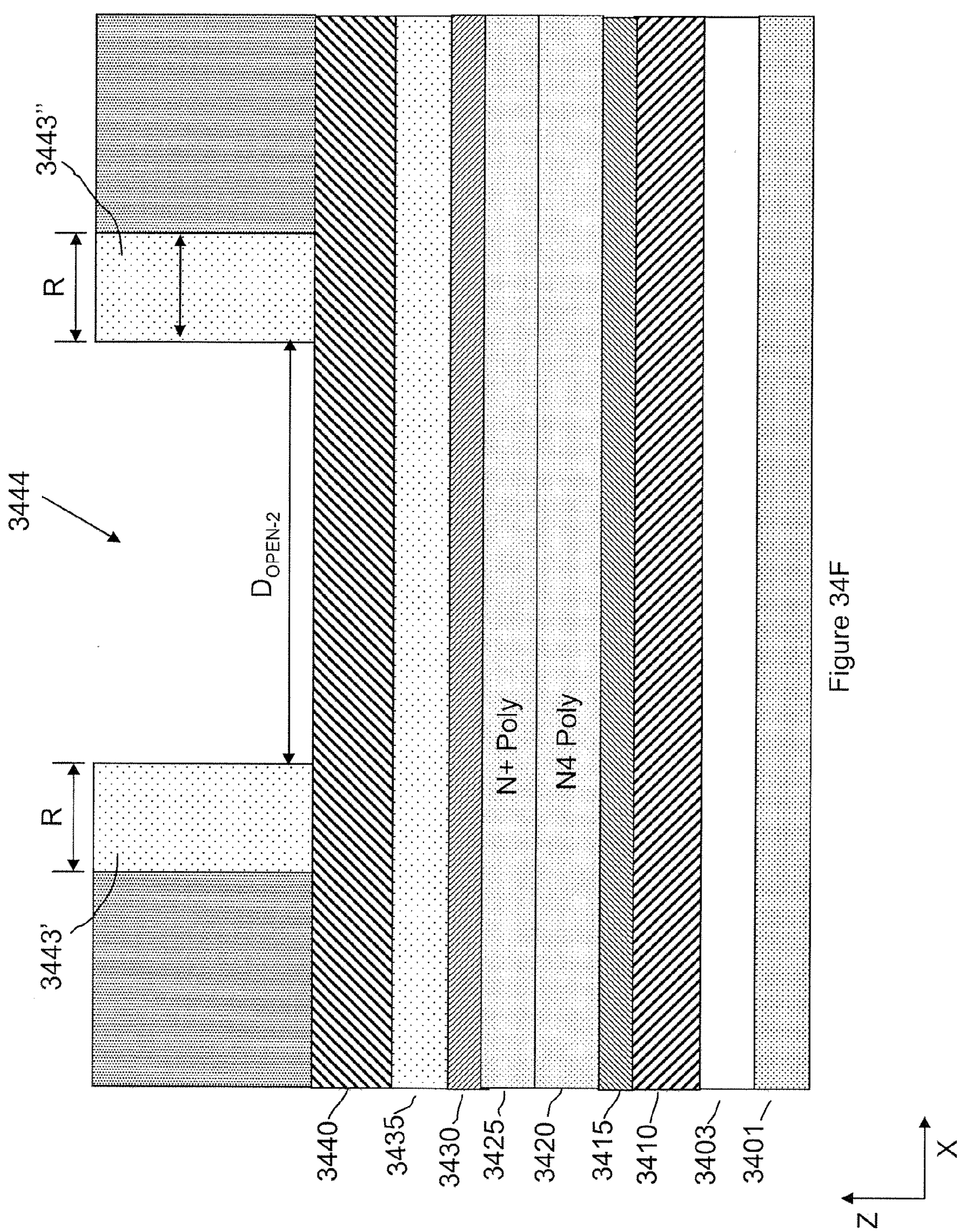

Next, methods directionally etch conformal sacrificial layer 3443 using reactive ion etch (RIE) for example, using known industry methods, forming opening 3444 of dimension $D_{OPEN-2}$ and sacrificial regions 3443' and 3443", both having vertical sidewalls self-aligned and separated from inner vertical sidewall of sacrificial regions 3441' and 3441", respectively, by a distance R in the X direction as illustrated in FIG. 34F. Distance R is approximately equal to F/2, or approximately 32.5 nm in this example. Dimension $D_{OPEN-2}$ of opening 3444 is approximately 2F, or approximately 130 nm for a 65 nm technology node, a non-critical dimension.

Figure 34G:
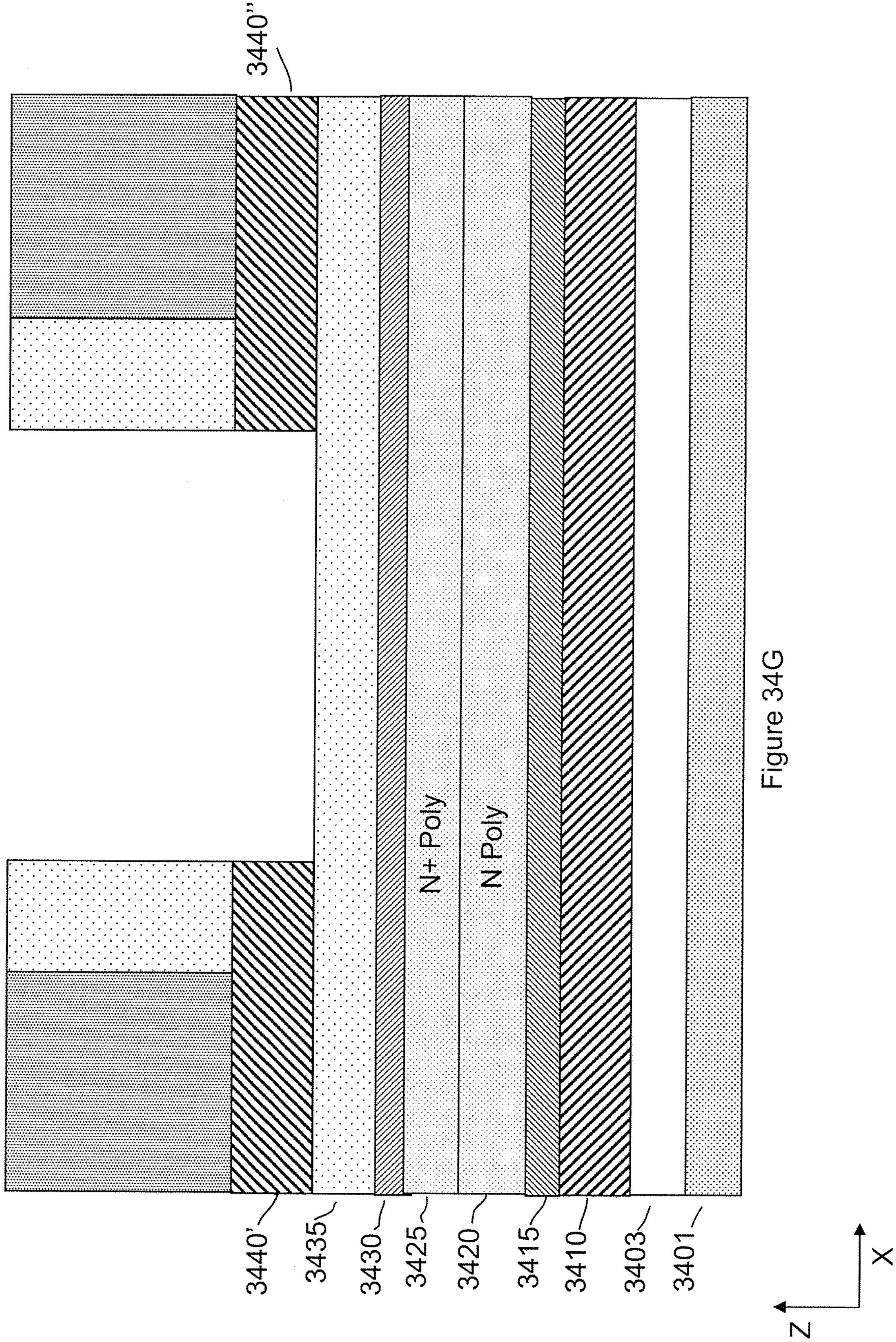

Next, methods directionally etch an opening through contact layer 3440 to the top surface of insulator layer 3435. Directional etching using RIE, for example, forms an opening of size $D_{OPEN-2}$ of approximately 2F (130 nm in this example) in contact layer 3440, and forms sidewall contact regions 3440' and 3440" as illustrated in FIG. 34G.

Figure 34H:
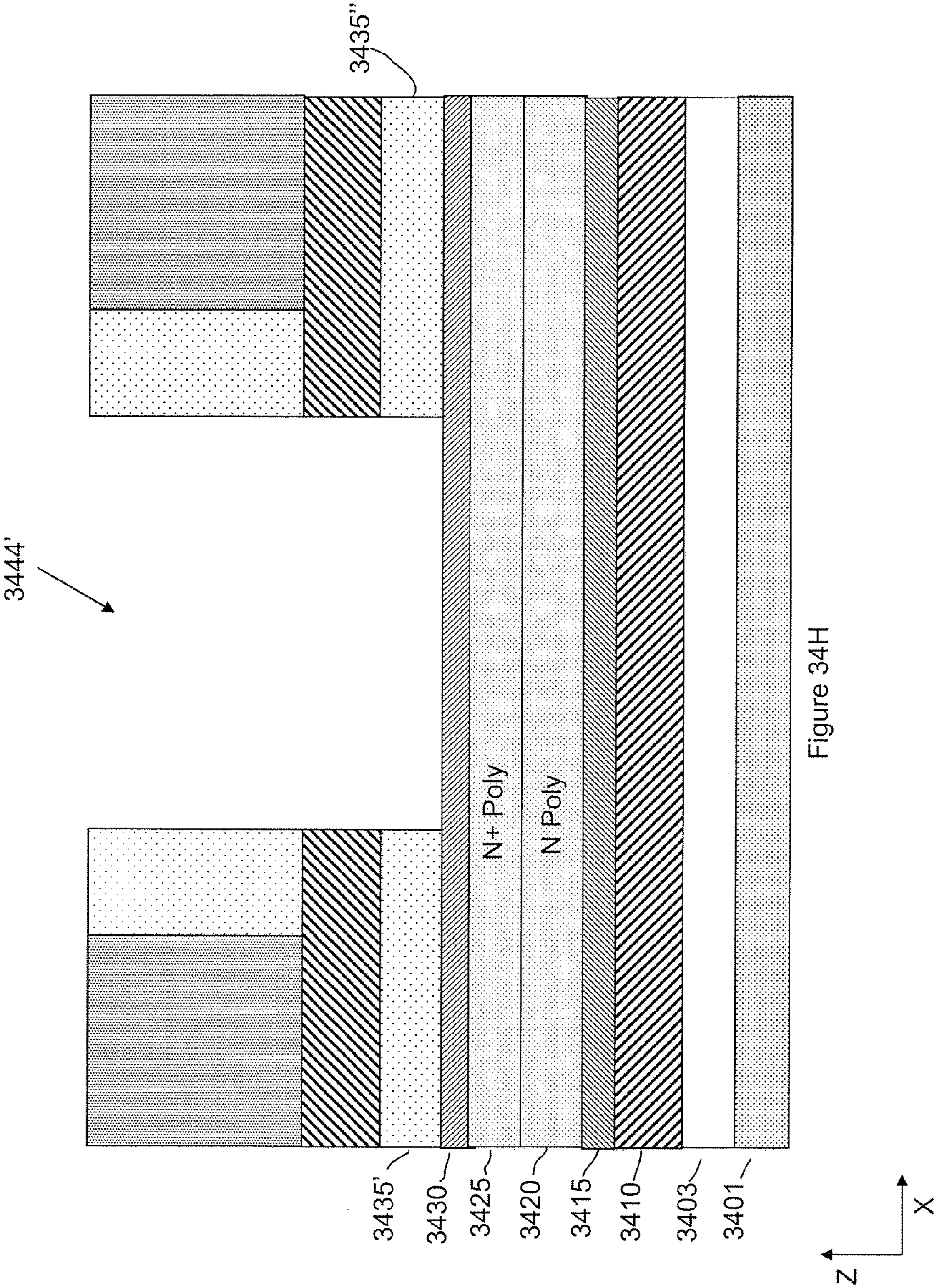

Next, methods directionally etch an opening through insulator layer 3435 to the top surface of contact layer 3430. Directional etching using RIE, for example, forms an opening 3444' of size $D_{OPEN-2}$ of approximately 2F (130 nm in this example) in insulator layer 3435, and forms insulator regions 3435' and 3435" as illustrated in FIG. 34H.

Figure 34I:
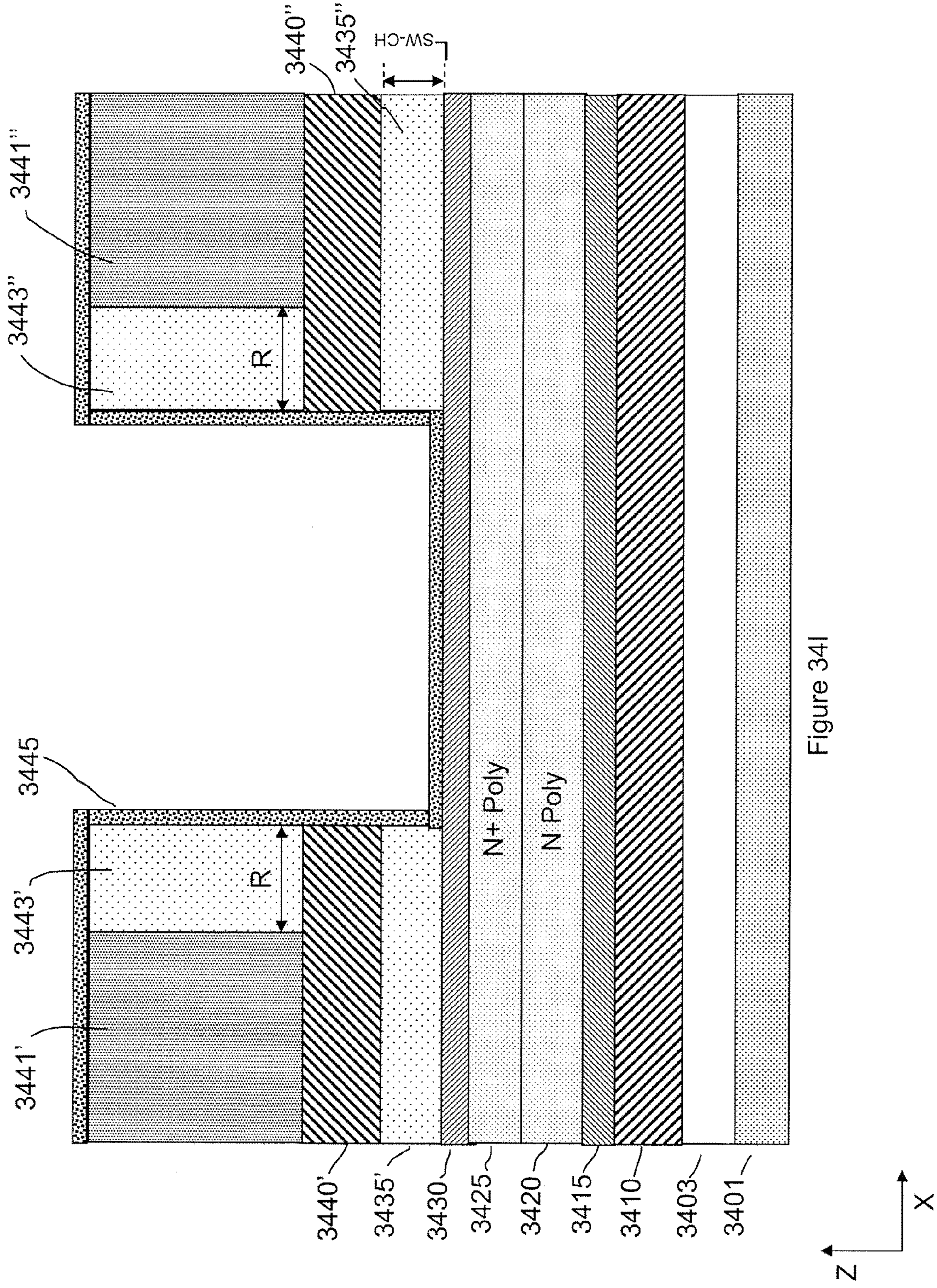

Next, methods deposit conformal nanotube element 3445 with vertical (Z) orientation on the sidewalls of opening 3444' as illustrated in FIG. 34I. The size of opening 3444' is approximately the same as the size of opening 3444. Conformal nanotube element 3445 may be 0.5 to 20 nm thick, for example, and may be fabricated as a single layer or as multiple layers using deposition methods such as spin-on and spray-on methods. Nanotube element methods of fabrication are described in greater detail in the incorporated patent references.

Since nanotube element 3445 is in contact with contact layer 3430 and the sidewalls of sidewall contact regions 3440' and 3440", separated by the thickness of insulator region 3435' and 3435", respectively, two nonvolatile nanotube switch channel regions are partially formed (channel width is not yet defined) having channel length $L_{SW-CH}$ in the Z direction corresponding to the thickness of insulator regions 3435' and 3435" in the range of 5 nm to 250 nm as illustrated in FIG. 34I. The vertical (Z-axis) portion of nanotube element 3445 is separated from the inner vertical sidewalls of sacrificial regions 3441' and 3441" by a self-aligned distance R. These partially formed vertical nonvolatile nanotube switches are similar to vertically oriented nonvolatile nanotube elements 765 and 765' of memory storage regions 760A and 760B, respectively, illustrated in FIG. 7B. Conformal nanotube element 3445 is also in contact with sacrificial regions 3443' and 3443" and sacrificial regions 3441' and 3441" as illustrated in FIG. 34I.

Figure 34J:
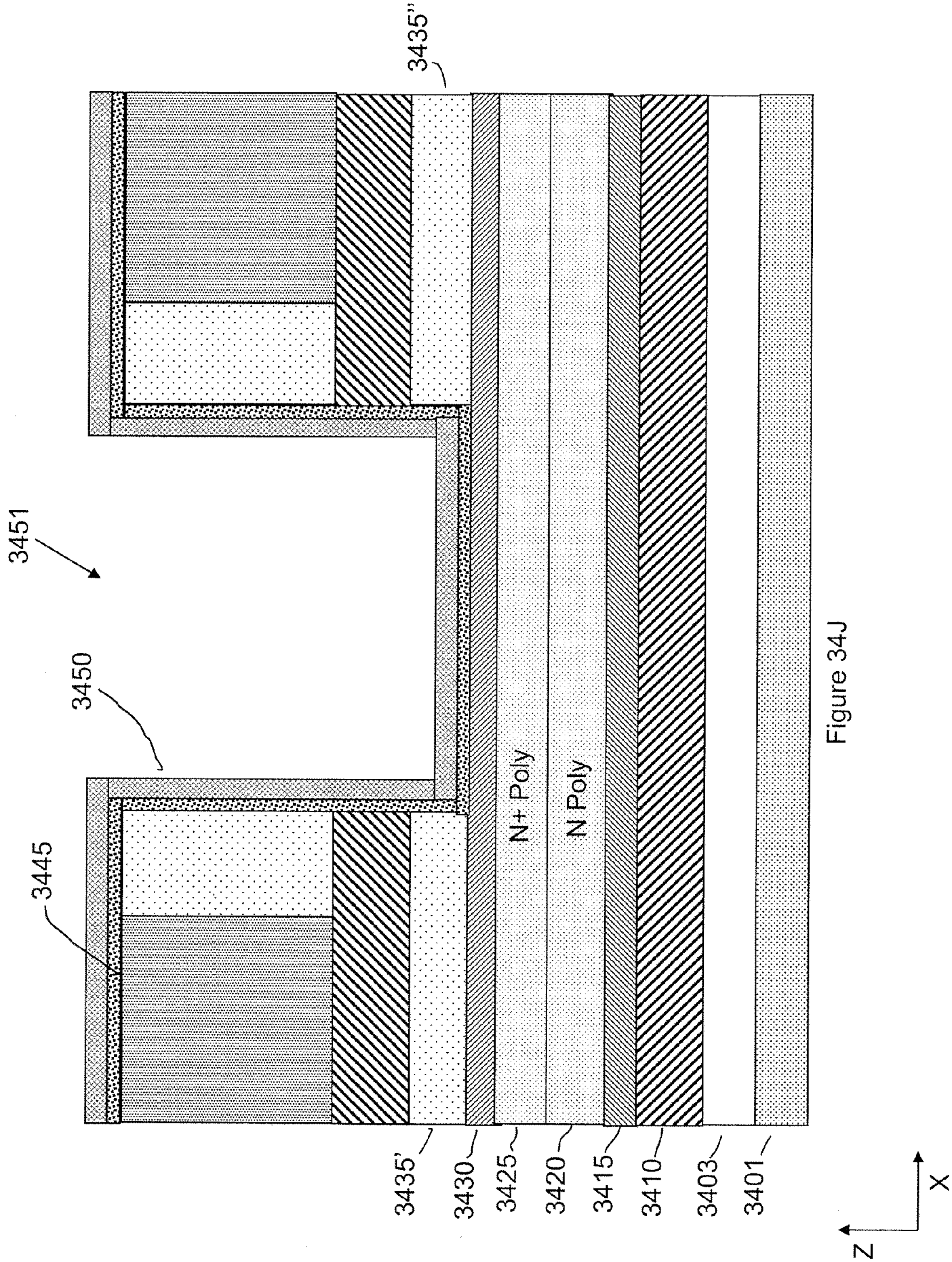

Next methods deposit conformal insulator layer 3450 on nanotube element 3445 as an insulating and protective layer and reduces opening 3444' to opening 3451 as illustrated in FIG. 34J. Opening 3451 is similar to opening 3444', except for the addition of conformal insulator 3450 and conformal nanotube element 3445. Conformal insulator 3450 may be 5 to 200 nm thick, for example, and may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Insulator 3450 is deposited to a thickness sufficient to ensure protection of nanotube element 3445 from high density plasma (HDP) deposition.

At this point in the process, it is desirable to partially fill opening 3451 by increasing the thickness of the bottom portion of insulator 3450 in the vertical (Z direction) on horizontal surfaces with little or no thickness increase on the sidewalls (vertical surfaces) of insulator 3450, forming insulator 3450'. Exemplary industry methods of using HDP deposition to fill openings with a dielectric layer are disclosed in U.S. Pat. No. 4,916,087, the entire contents of which are incorporated herein by reference, for example. However, U.S. Pat. No. 4,916,087 fills openings by depositing dielectric material on horizontal and vertical surfaces. Other methods of directional HDP insulator deposition may be used instead, e.g., by directionally depositing a dielectric material such that more than 90% of the insulator material is deposited on horizontal surfaces and less than 10% of the insulator material is deposited on vertical surfaces with good thickness control. A short isotropic etch may be used to remove insulator material deposited on vertical surfaces. The thickness of the additional dielectric material is not critical. The additional dielectric material may be the same as that of conformal insulator 3450 or may be a different dielectric material. Dielectric material selection with respect to nanotube elements is described in greater detail in U.S. patent application Ser. No. 11/280,786.

Figure 34K:
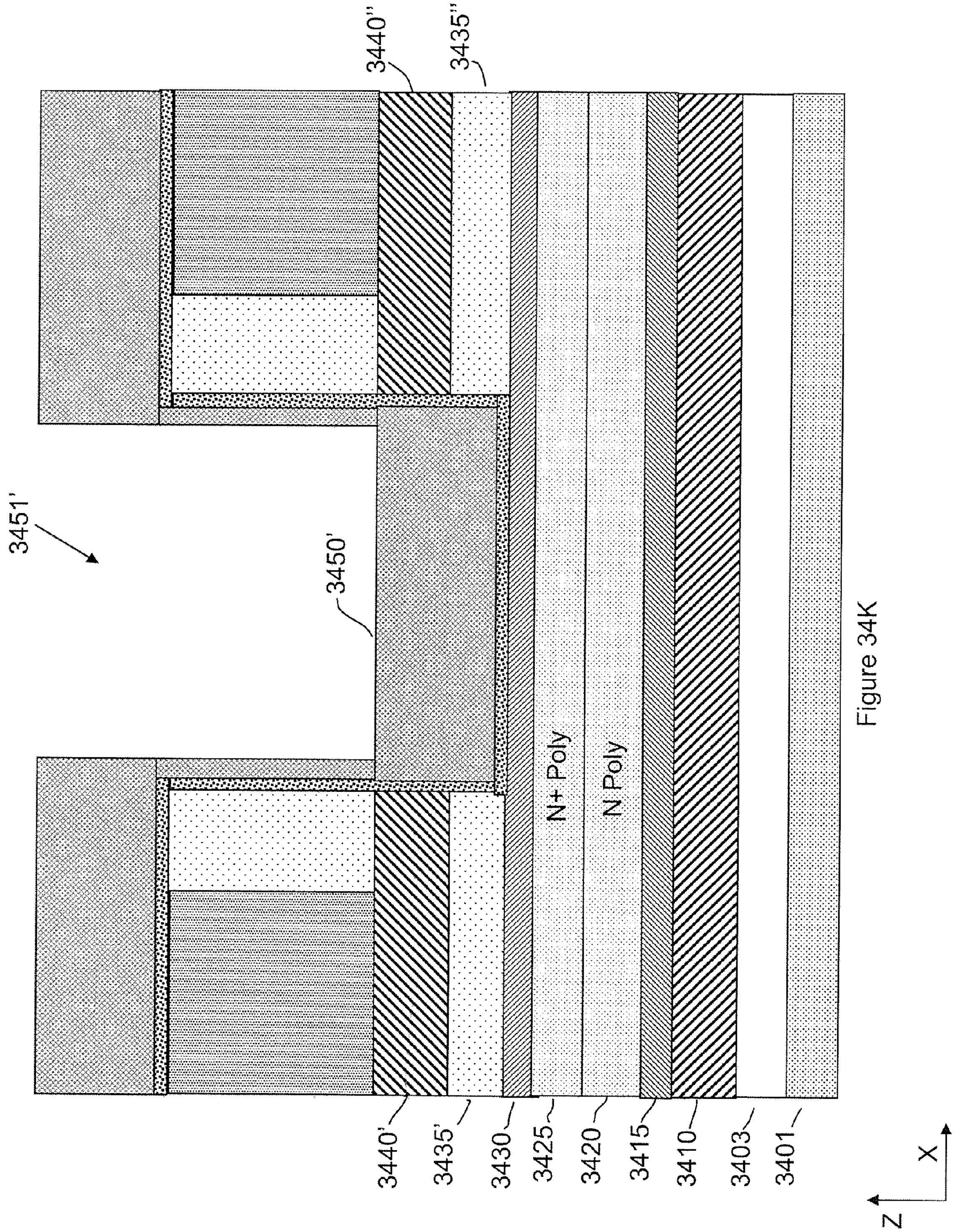

Next, methods directionally deposit an insulator material in opening 3451 using known industry methods such as selective HDP insulator deposition and increase insulator thickness primarily on horizontal surfaces as illustrated by insulator 3450' in opening 3451' and on top surfaces in FIG. 34K.

Figure 34L:
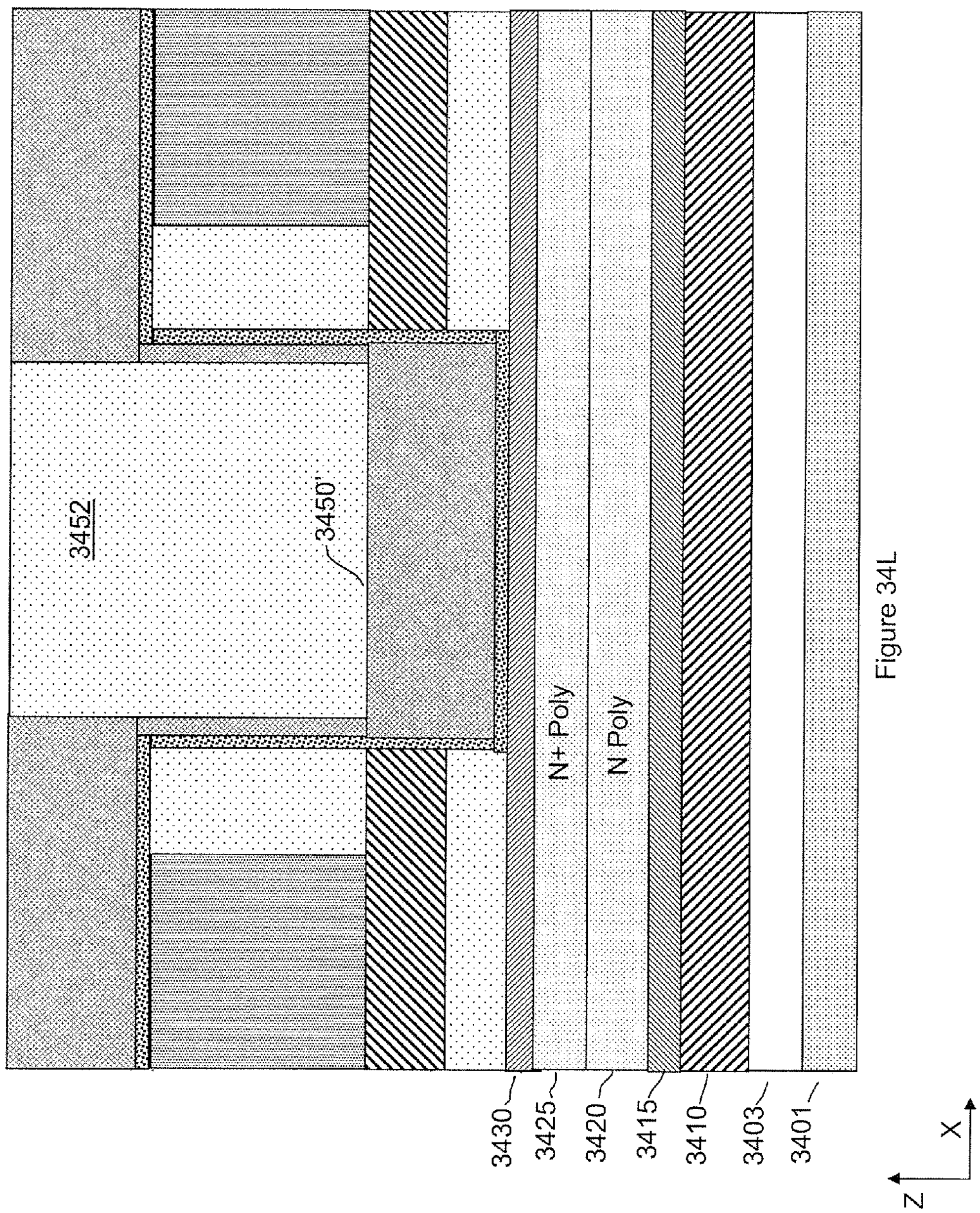

Next, methods deposit and planarize an insulator 3452 such as TEOS filling opening 3451' as illustrated in FIG. 34L.

Figure 34M:
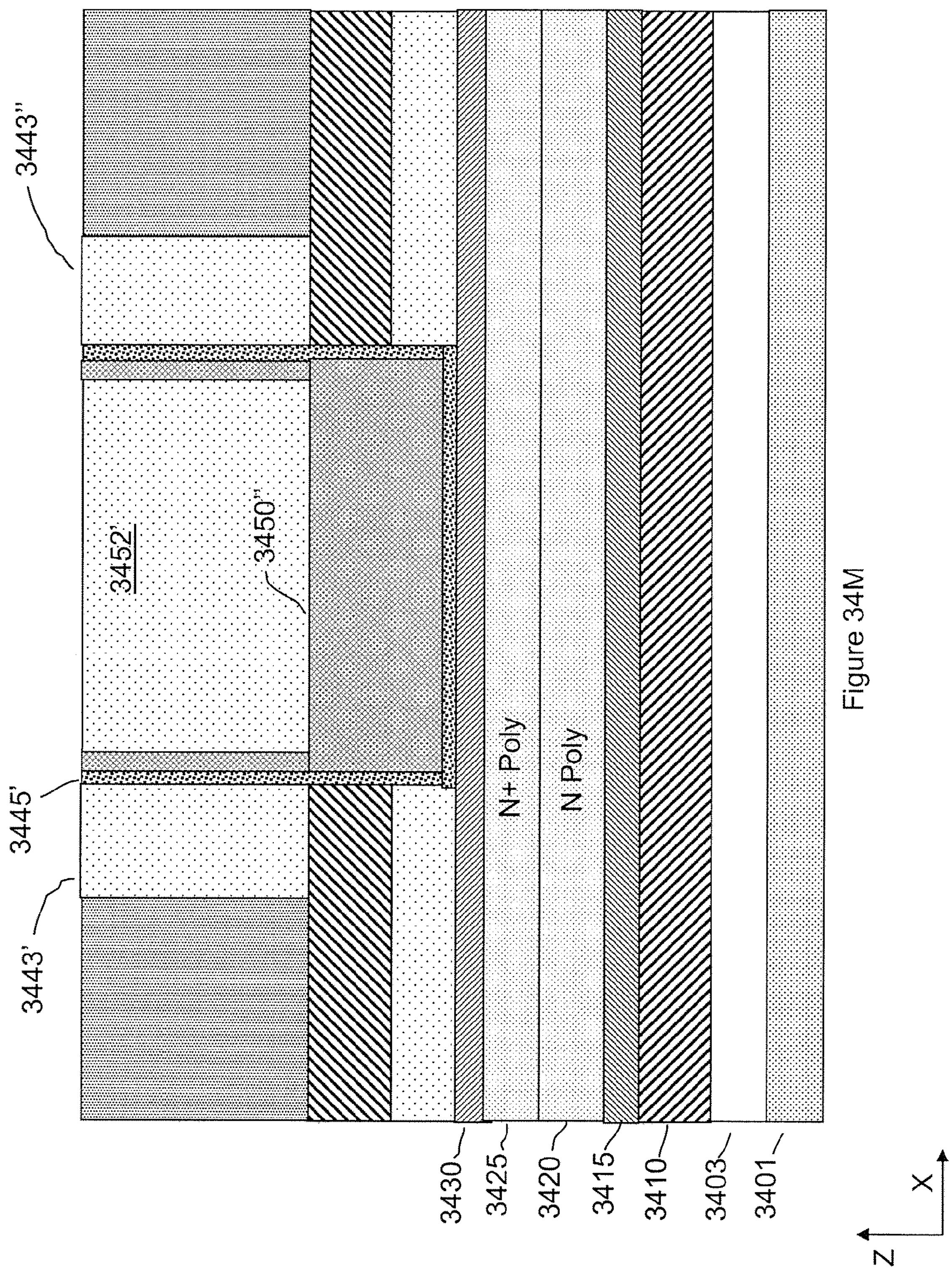

Next, methods planarize the structure illustrated in FIG. 34L in order to remove the top portion of insulator 3450' and the top portion of underlying nanotube element 3445 as illustrated in FIG. 34M. The top of sacrificial regions 3441', 3441", 3443', and 3443" may be used as CMP etch stop reference layers. Insulator 3450" is the same as insulator 3450' except that the top horizontal layer has been removed. Nanotube element 3445' is the same as nanotube element 3445 except that the top horizontal layer has been removed. Insulator 3452' is the same as insulator 3452 except that insulator thickness has been reduced.

Figure 34N:
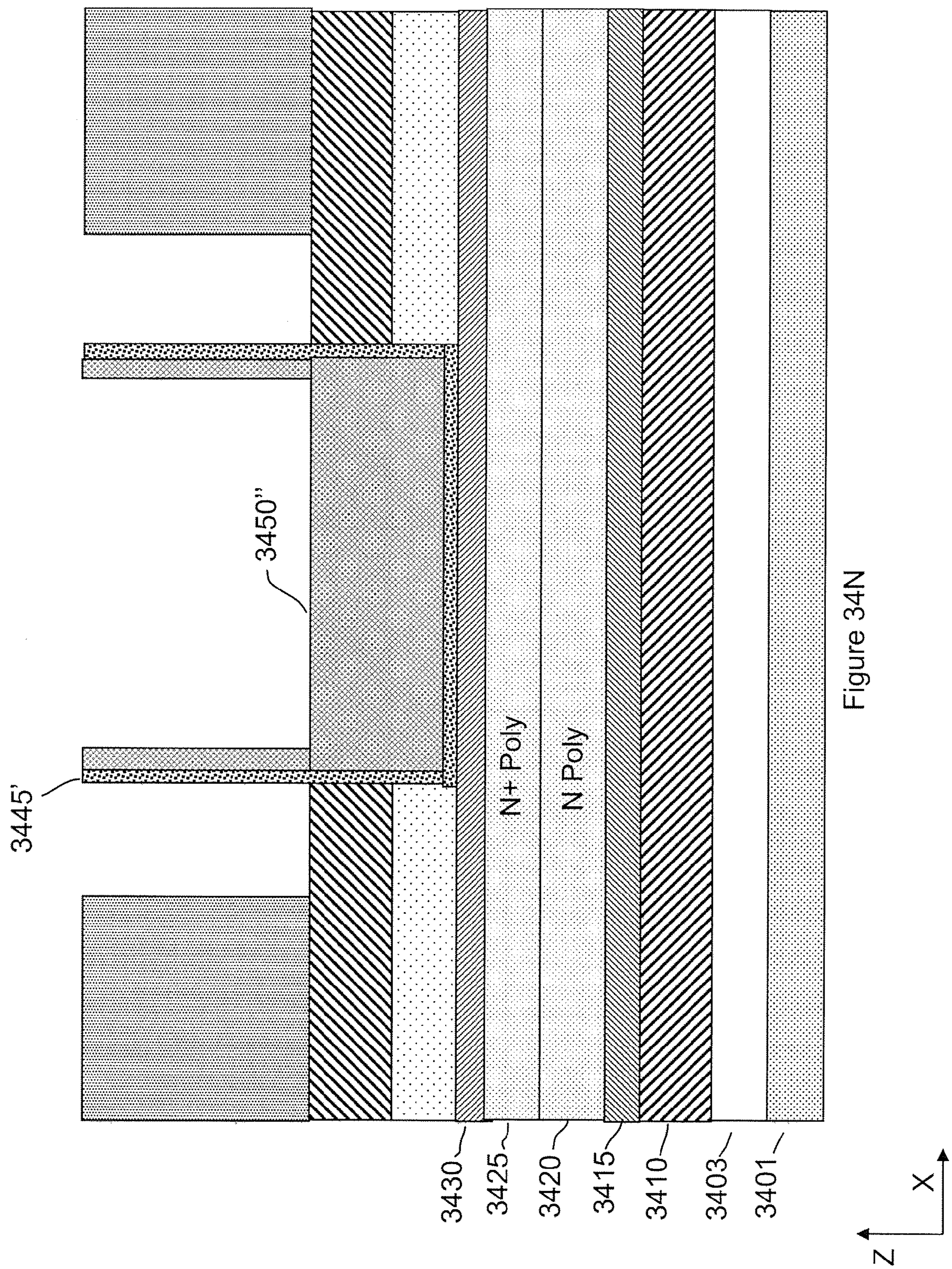

Next, methods etch (remove) sacrificial regions 3443' and 3443" and insulator 3452'. Exposed vertical sidewalls of nanotube element 3445' and conformal insulator 3450" remain as illustrated in FIG. 34N.

Figure 34O:
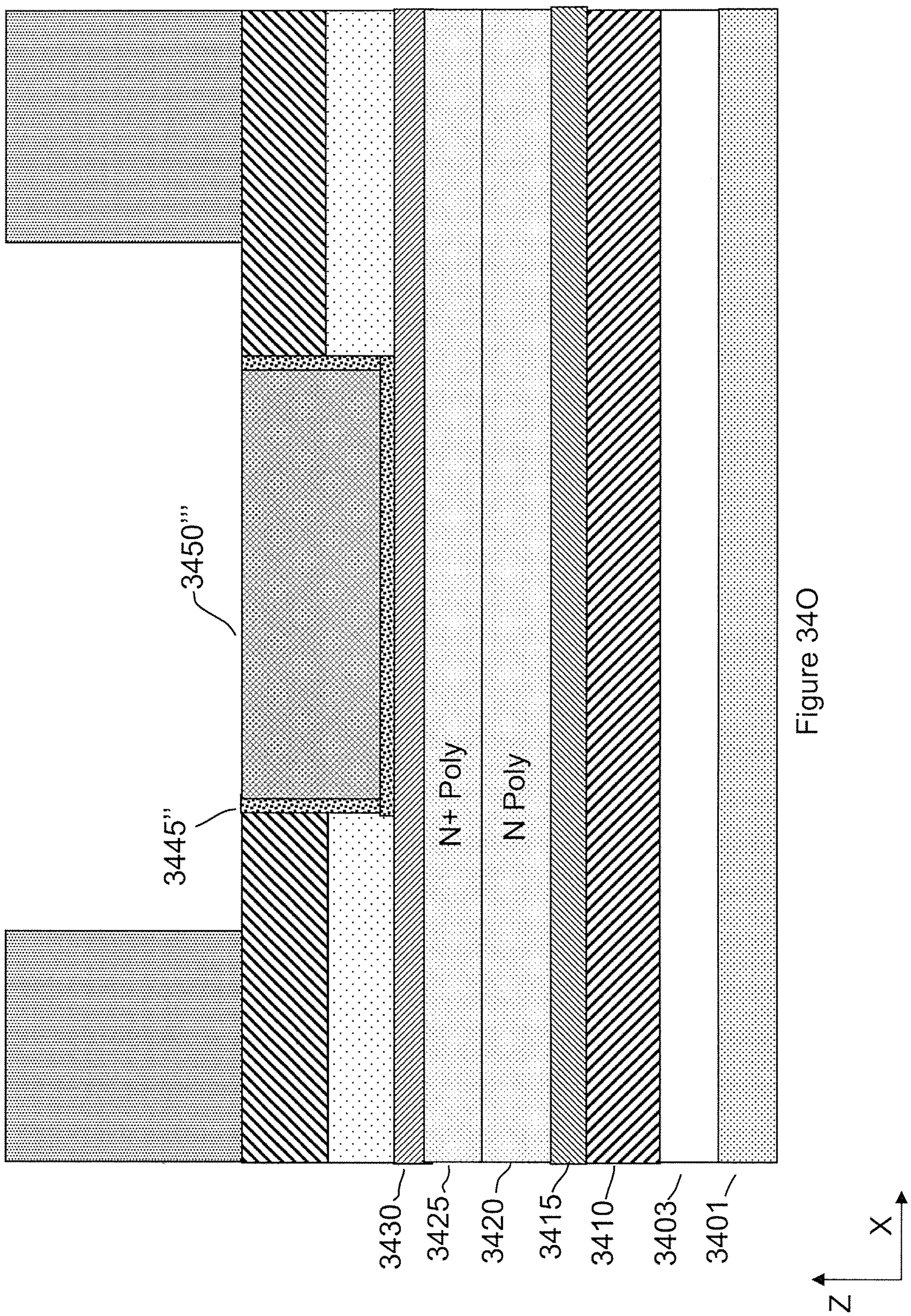

Next, methods etch (remove) the exposed portion of nanotube element 3445' forming nanotube element 3445" as illustrated in FIG. 34O. Methods of etching nanotube fabrics and elements are described in greater detail in the incorporated patent references.

Then, methods such as isotropic etch remove exposed portions of insulator 3450' to form insulator 3450'".

At this point in the process, sidewall spacer methods are applied as illustrated further below to form self aligned sacrificial regions to be replaced further along in the fabrication process as illustrated further below by a conductor material to form the upper portion of nanotube element contacts and also to define self aligned trench regions to be used to define self-aligned cell dimensions along the X direction as also illustrated further below. Using sidewall spacer methods to form self aligned structures without requiring masking and alignment results in minimum cell areas.

Figure 34P:
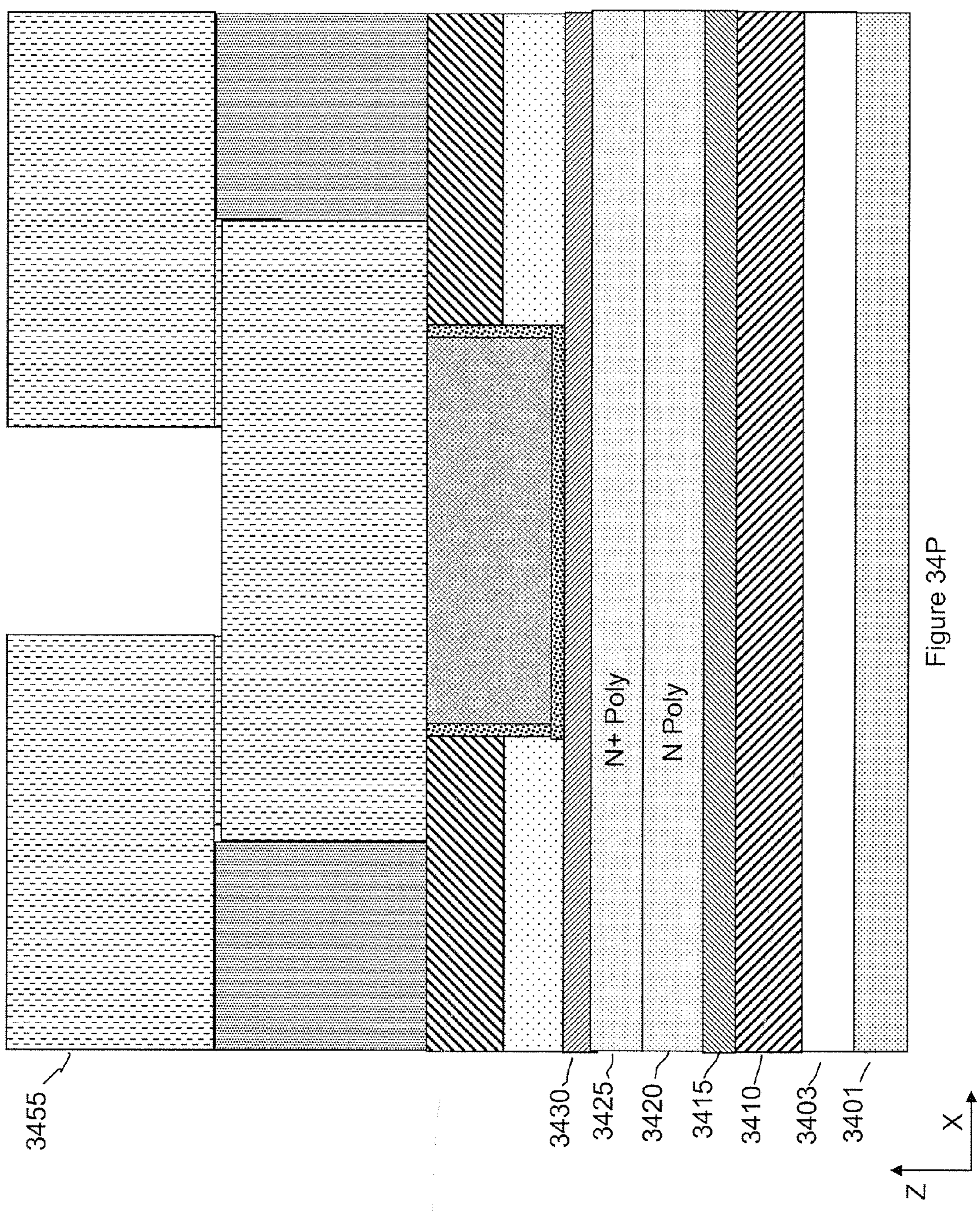
Figure 34Q:
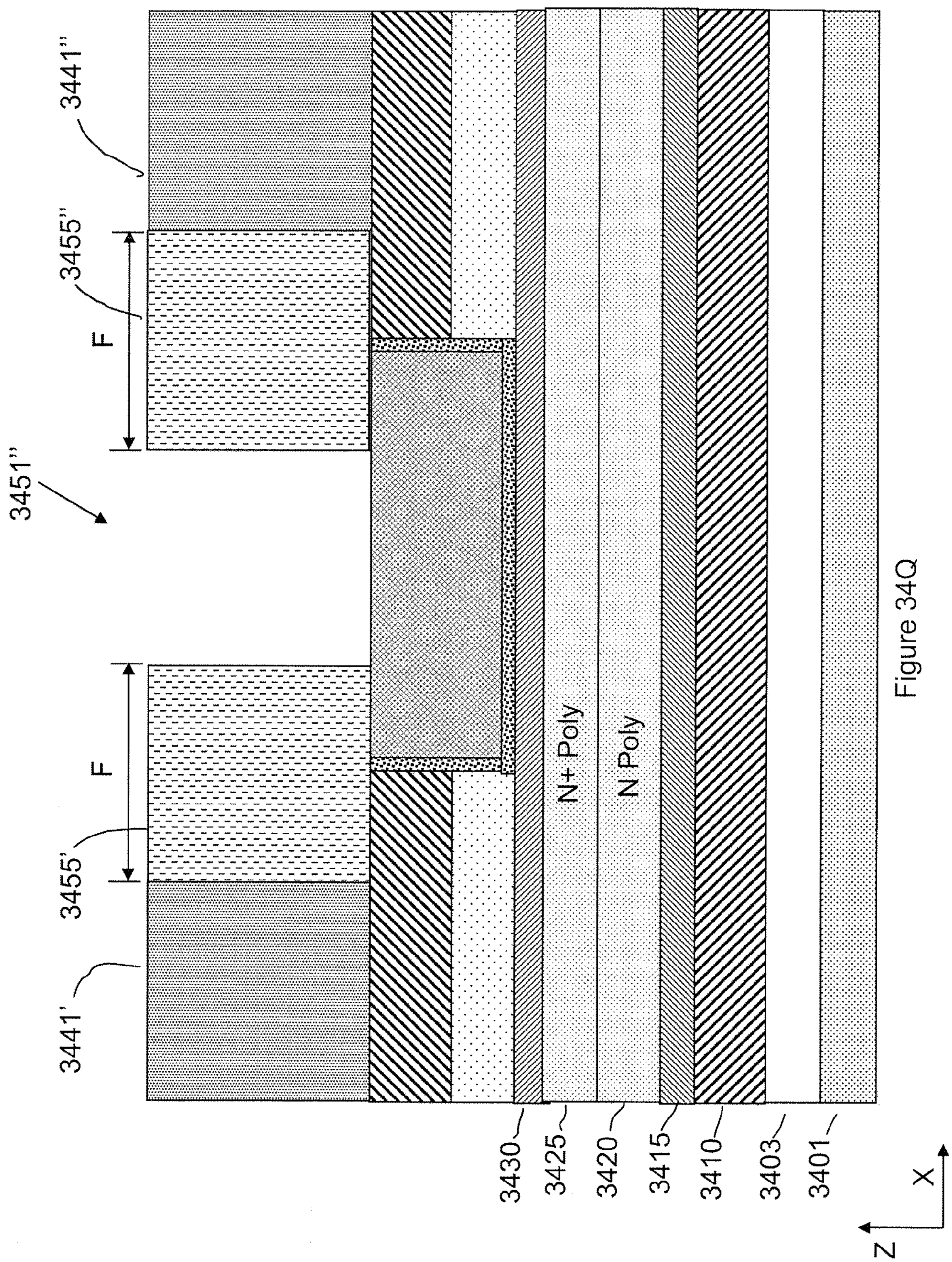

In this example, with respect to FIGS. 34P and 34Q, a self aligned sacrificial region of X dimension F is formed using methods similar to those used in FIGS. 34E and 34F. Next, methods deposit a conformal sacrificial layer 3455 as illustrated in FIG. 34P. The thickness of conformal sacrificial layer 3455 is selected as F. In this example, since F is approximately 65 nm, then the thickness of conformal sacrificial layer 3455 is approximately 65 nm. Conformal sacrificial layer 3455 may be formed using conductor, semiconductor, or insulator materials similar to those materials used to form sacrificial layers 3441 and 3443 described further above.

Next, methods directionally etch conformal sacrificial layer 3455 using reactive ion etch (RIE) for example, using known industry methods, forming opening 3451" of dimension approximately F, which in this example is approximately 65 nm as illustrated in FIG. 34Q. The inner sidewalls of opening 3451" are defined by sacrificial regions 3455' and 3455" and are self-aligned to the inner walls of sacrificial regions 3441' and 3441" and separated by a distance of approximately F. These inner walls will be used as illustrated further below to form one side of an upper portion of a nanotube contact region and define one side of a cell in the X direction.

Figure 34R:
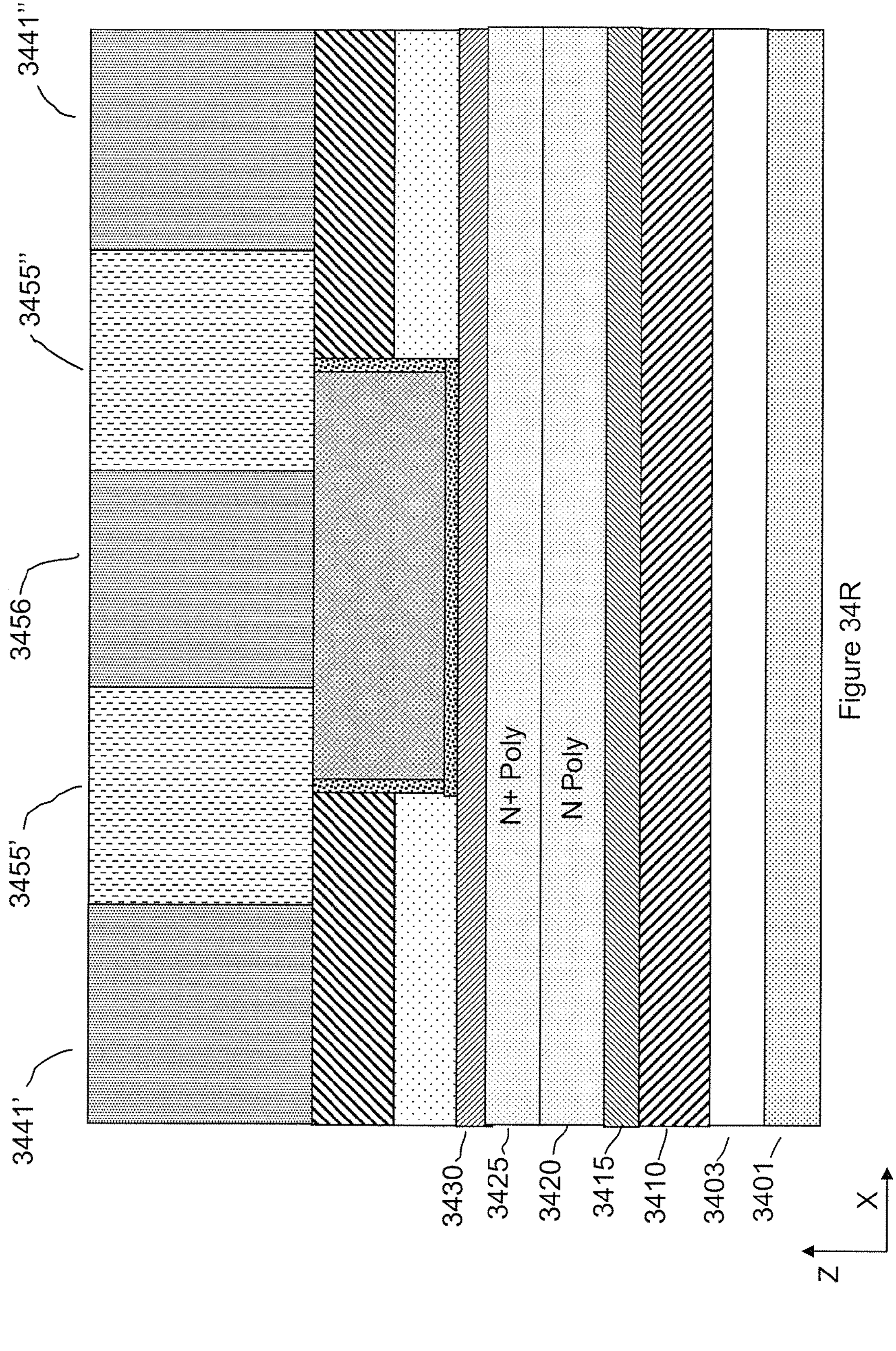

Next, methods deposit and planarize a sacrificial layer to form sacrificial region 3456 coplanar with sacrificial regions 3455', 3455", 3441', and 3441" as illustrated in FIG. 34R.

Figure 34S:
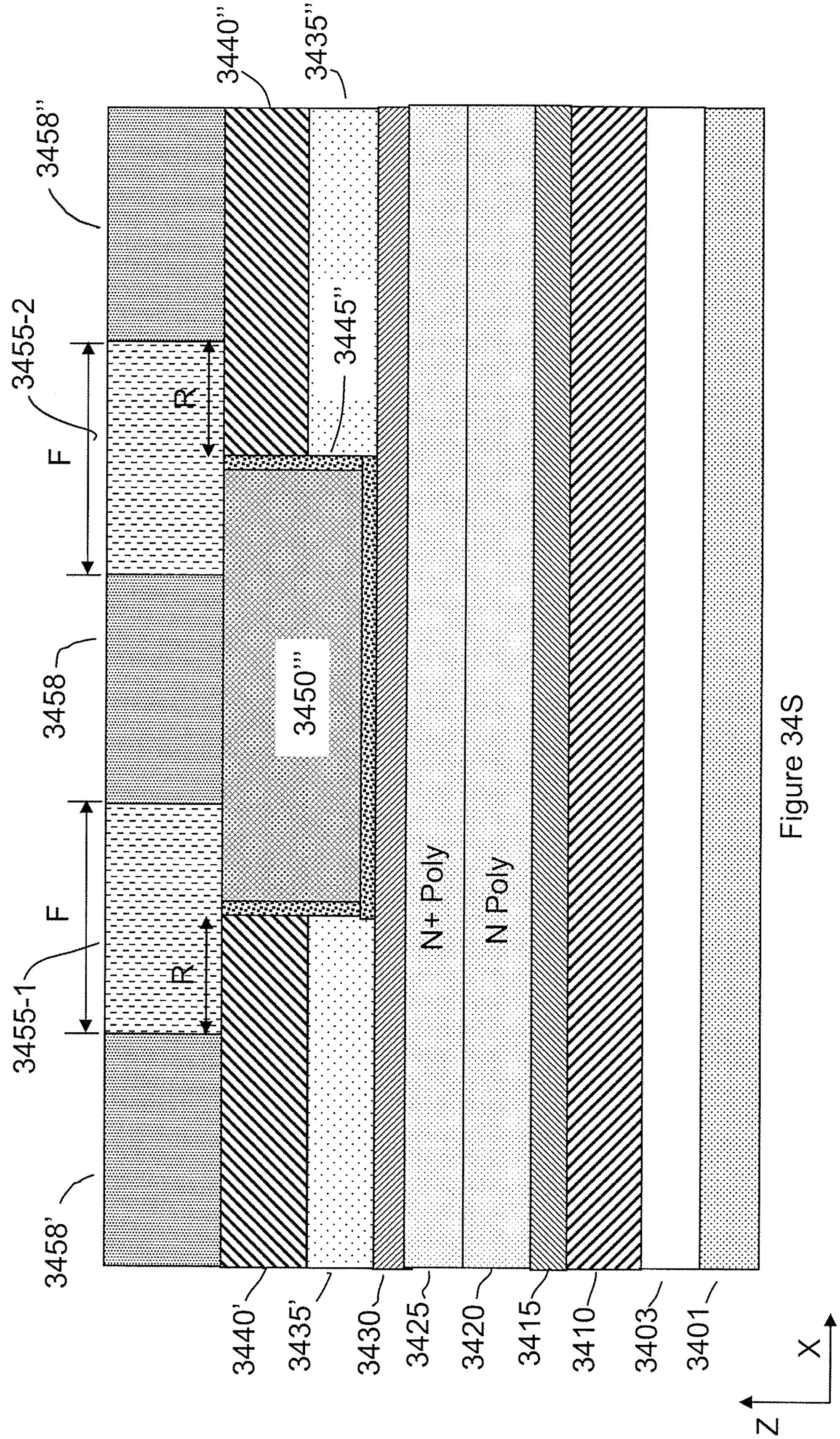

Next, methods apply CMP etching to reduce the thickness of sacrificial region 3456 to form sacrificial region 3458; the thickness of sacrificial regions 3455' and 3455" to form sacrificial regions 3455-1 and 3455-2, respectively; and the thickness of sacrificial regions 3441' and 3441" to form sacrificial regions 3458' and 3458", respectively as illustrated in FIG. 34S. Coplanar sacrificial regions 3458, 3458', 3458", 3455-1, and 3455-2 have thickness values in the range of 10 nm 200 nm, for example.

At this point in the process, sacrificial regions 3455-1 and 3455-2 may be used as masking layers for directional etching of trenches using methods that define outer cell dimensions along the X direction for 3D cells using one NV NT diode with cathode-to-nanotube connection. U.S. Pat. No. 5,670,803 to co-inventor Bertin discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may cut through multiple conductor, semiconductor, and oxide layers and stop on the top surface of a supporting insulator ($SiO_2$) layer between the 3D array structure and an underlying semiconductor substrate. Trench 3459 is formed first and then filled with an insulator and planarized. Then, trenches 3459', and 3459" are formed simultaneously and then filled and planarized as illustrated further below. Other corresponding trenches (not shown) are also etched when forming the memory array structure. Exemplary method steps that may be used to form trench regions 3459, 3459', and 3459" and then fill the trenches to form insulating trench regions are described further below.

Sacrificial regions 3458' and 3458" that define the location of trench regions 3459' and 3459" that are formed as described further below may be blocked with a sacrificial noncritical masking layer (not shown), while methods form trench 3469 using known directional selective etch methods such as reactive ion etch (RIE). Trench 3459 forms a first of two opposite vertical sidewalls in the X direction defining one side of NV NT diode cells. Alternatively, sacrificial region 3458 that defines the location of trench region 3459 that is formed further below may be etched selective to sacrificial regions 3458' and 3458" without requiring a noncritical masking layer.

Figure 34T:
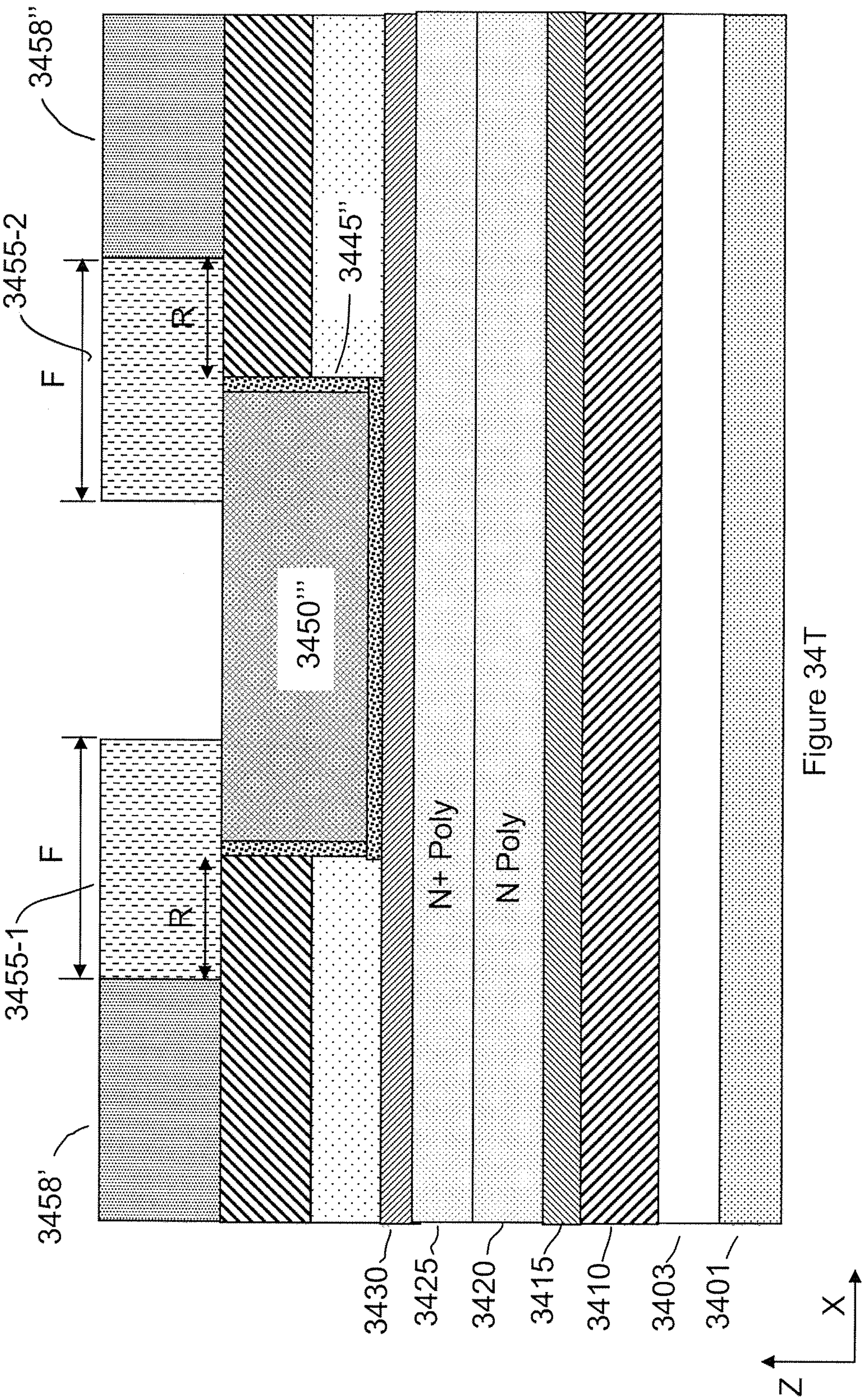

First, methods directionally selectively etch (remove) exposed regions (portions) of sacrificial region 3458 using known industry methods as illustrated in FIG. 34T.

Figure 34U:
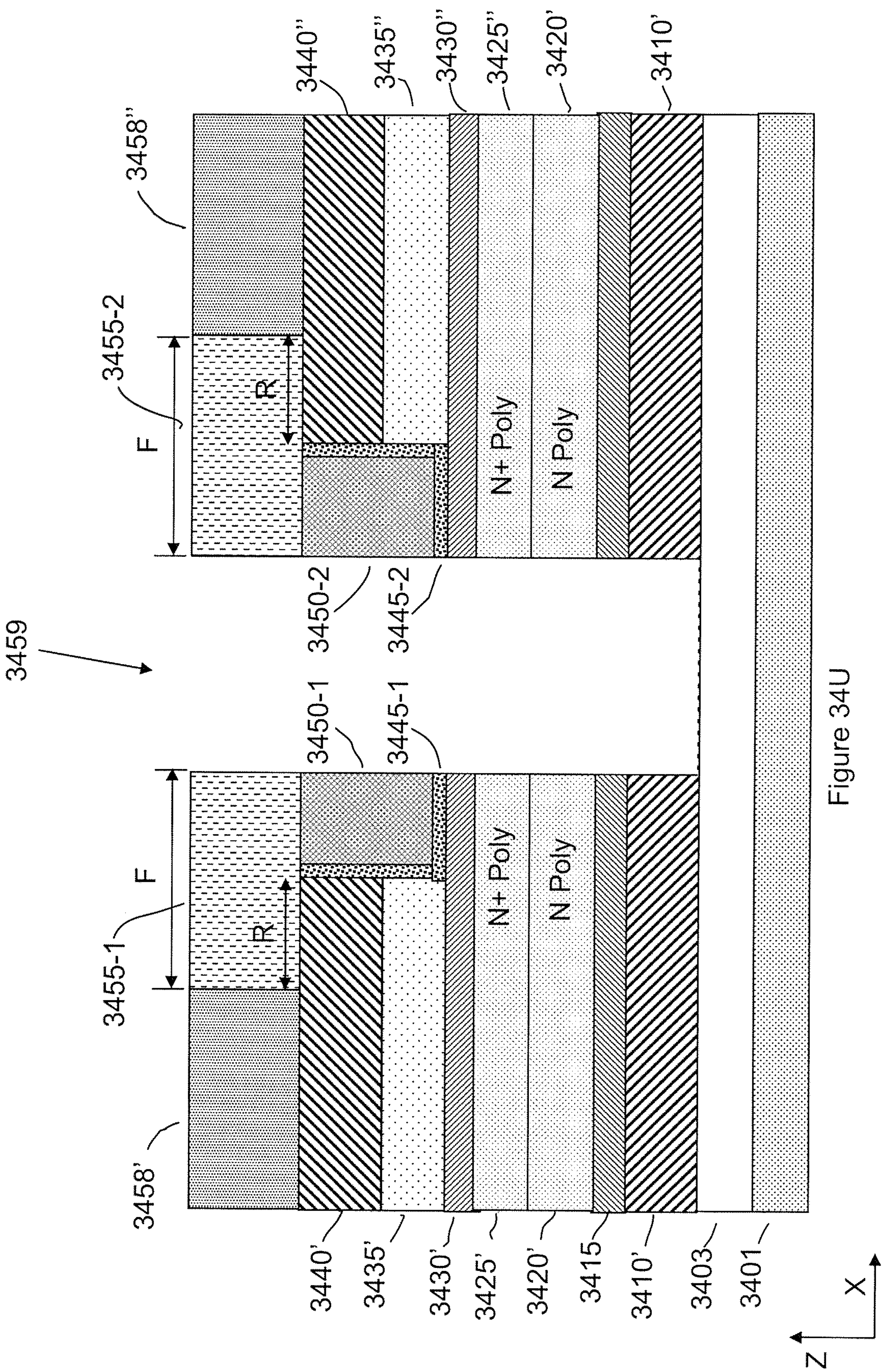

Next, methods selectively etch exposed regions (portions) of conformal insulator 3450'" using known industry methods and form conformal insulators 3450-1 and c3450-2 as illustrated in FIG. 34U.

Next, methods selectively etch exposed regions of nanotube element 3445" and form nanotube elements 3445-1 and 3445-2 as illustrated in FIG. 34U. Nanotube element methods of etching are described in greater detail in the incorporated patent references.

Next, methods selectively etch exposed regions of contact layer 3430 using known industry methods.

Next, methods selectively etch exposed regions of N+ polysilicon layer 3425 using known industry methods.

Next, methods selectively etch exposed regions of N polysilicon layer 3420 using known industry methods.

Next, methods selectively etch exposed regions of contact layer 3415 using known industry methods.

Then, methods etch exposed regions of conductor layer 3410 using known industry methods, forming trench 3459. Directional etching stops at the surface of planar insulator 3403.

Figure 34V:
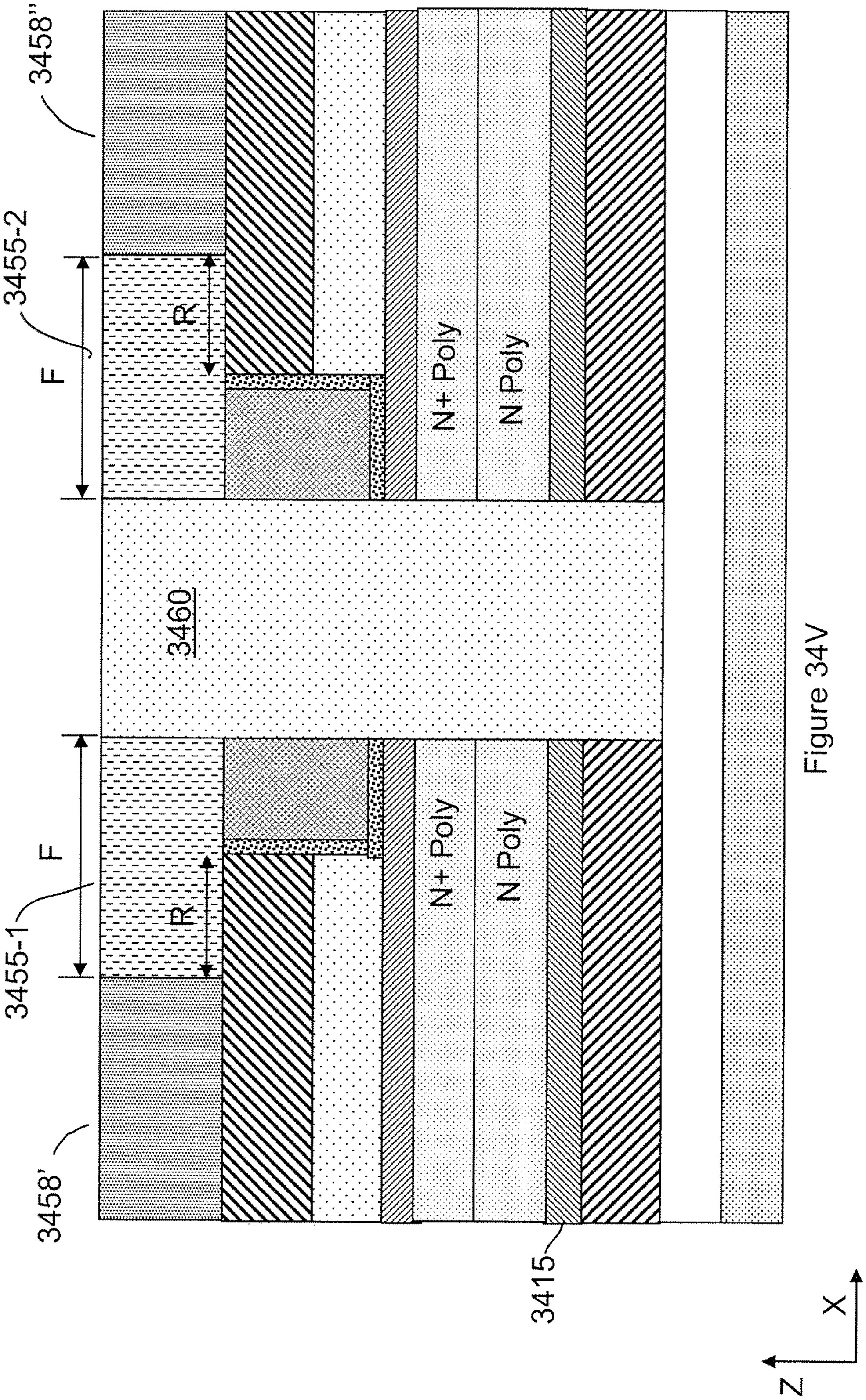

Next, methods fill and planarize trench 3459 with an insulator such as TEOS for example forming insulator 3460 using known industry methods as illustrated in FIG. 34V.

Next, methods form a noncritical mask region (not shown) over insulator 3460.

Figure 34W:
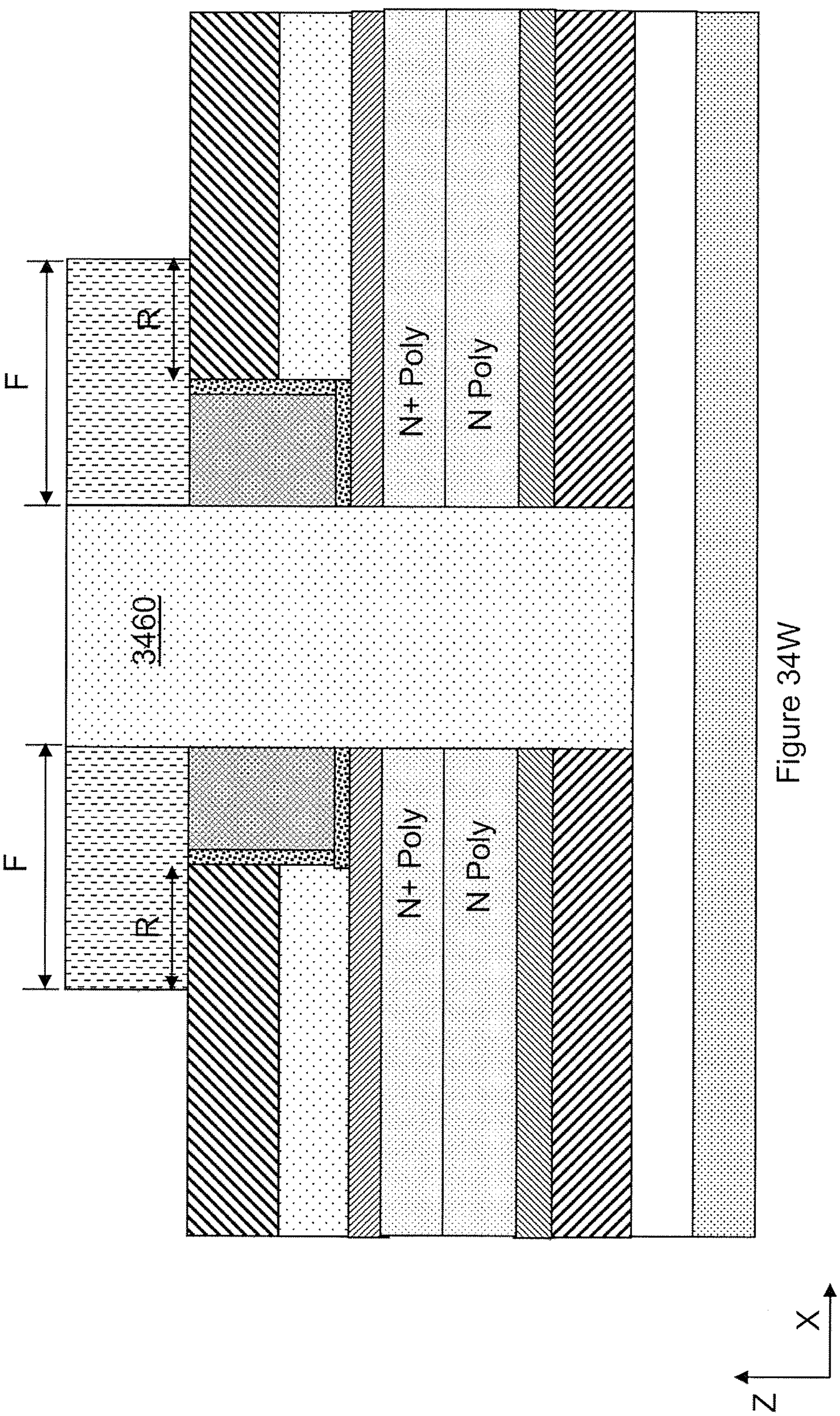

Next, sacrificial regions 3458' and 3458" are selectively etched (removed) as illustrated in FIG. 34W. With sacrificial regions 3458' and 3458" removed and with insulator 3460 protected by a mask layer (not shown), methods form trenches 3469' and 3469" using known directional selective etch techniques such as RIE. Trenches 3459' and 3459" form a second vertical (Z) sidewall in the X direction of NV NT diode cells.

Figure 34X:
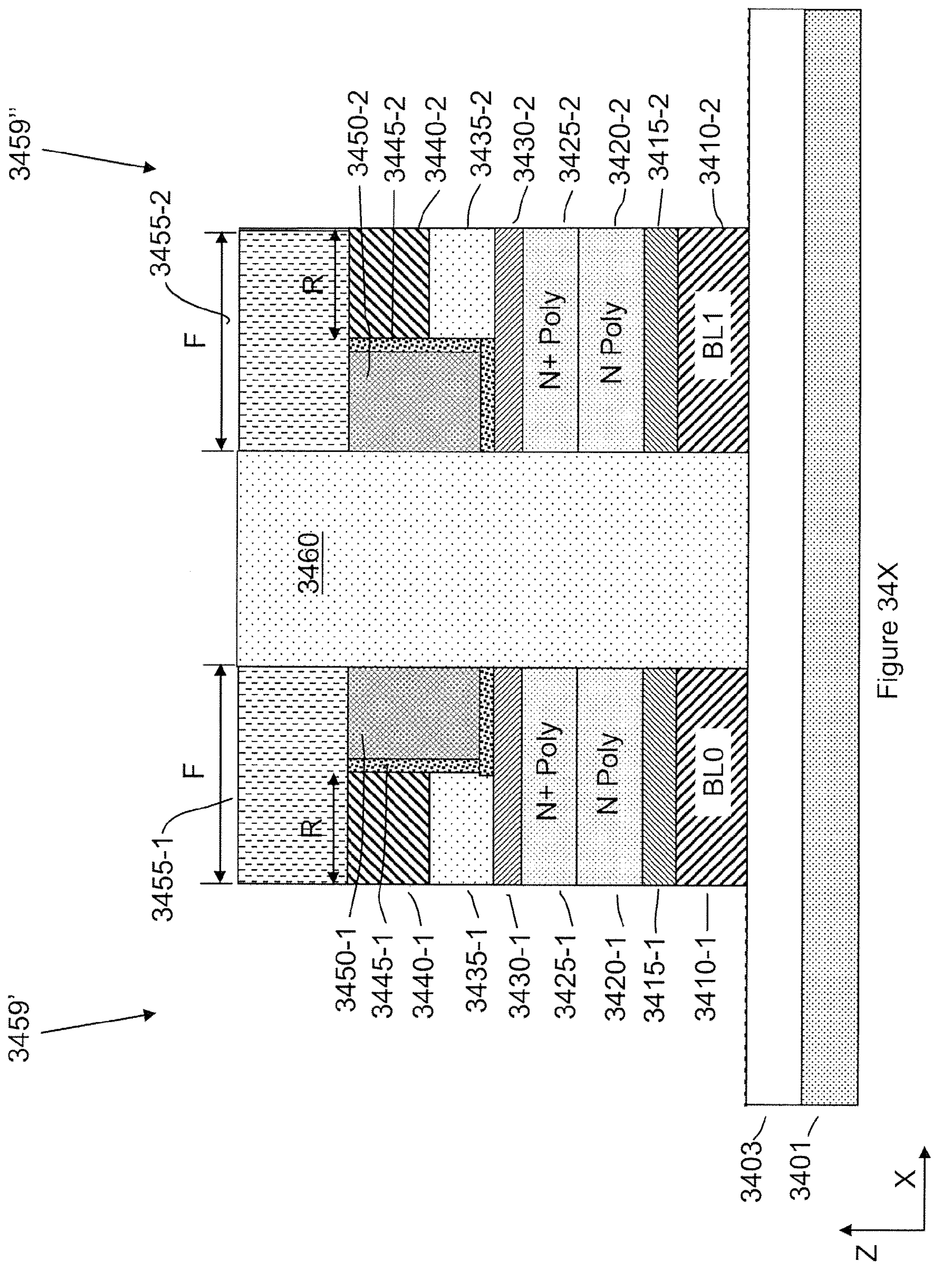

First, methods directionally selectively etch (remove) exposed portions of contact 3440' and 3440" using known industry methods and expose a portion of the top surface of semiconductor layers 3435' and 3435" and define contact 3440-1 and 3440-2 regions as illustrated in FIG. 34X.

Next, methods selectively etch exposed portions of insulator regions 3435' and 3435" using known industry methods and form insulator regions 3435-1 and 3435-2.

Next, methods selectively etch exposed portions of contact regions 3430' and 3430" using known industry methods and form contact regions 3430-1 and 3430-2.

Next, methods selectively etch exposed portions of N+ polysilicon layer 3425' and 3425" using known industry methods and form N+ polysilicon regions 3425-1 and 3425-2.

Next, methods selectively etch exposed portions of N polysilicon layer 3420' and 3420" using known industry methods and form N polysilicon regions 3420-1 and 3420-2 as illustrated in FIG. 34X.

Next, methods selectively etch exposed regions of contact layer 3415' and 3415" using known industry methods and form contact regions 3415-1 and 3415-2.

Then, methods selectively etch exposed portions of conductor layer 3410' and 3410" using known industry methods and form bit lines 3410-1 (BL0) and 3410-2 (BL1). Directional etching stops at the surface of planar insulator 3403 as illustrated in FIG. 34X.

Figure 34Y:
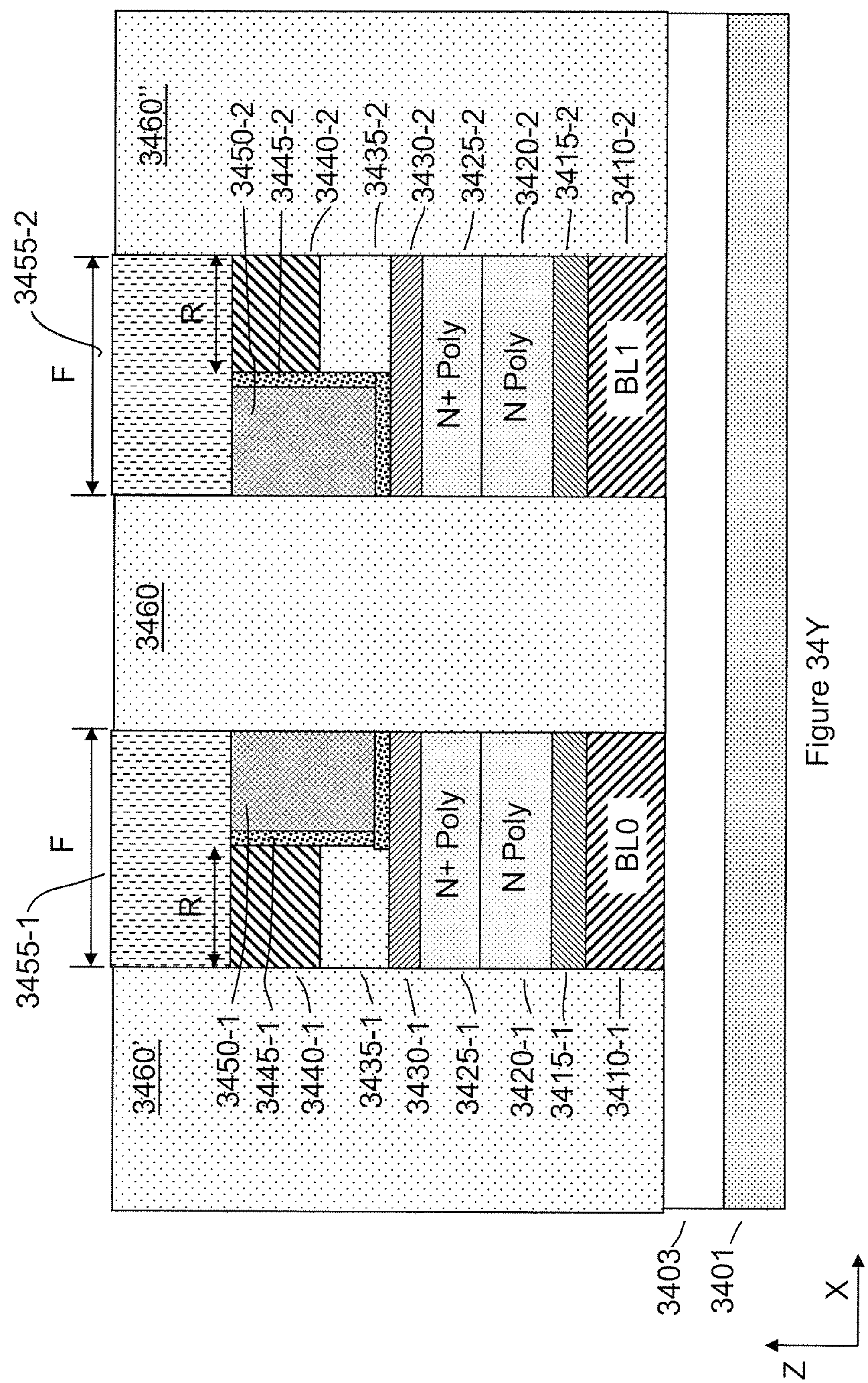

Next, methods deposit and planarize an insulator such as TEOS and fill trench openings 3459' and 3459" with insulators 3460' and 3460", respectively, as illustrated in FIG. 34Y.

Next, methods etch (remove) sacrificial regions 3455-1 and 3455-2.

Figure 34Z:
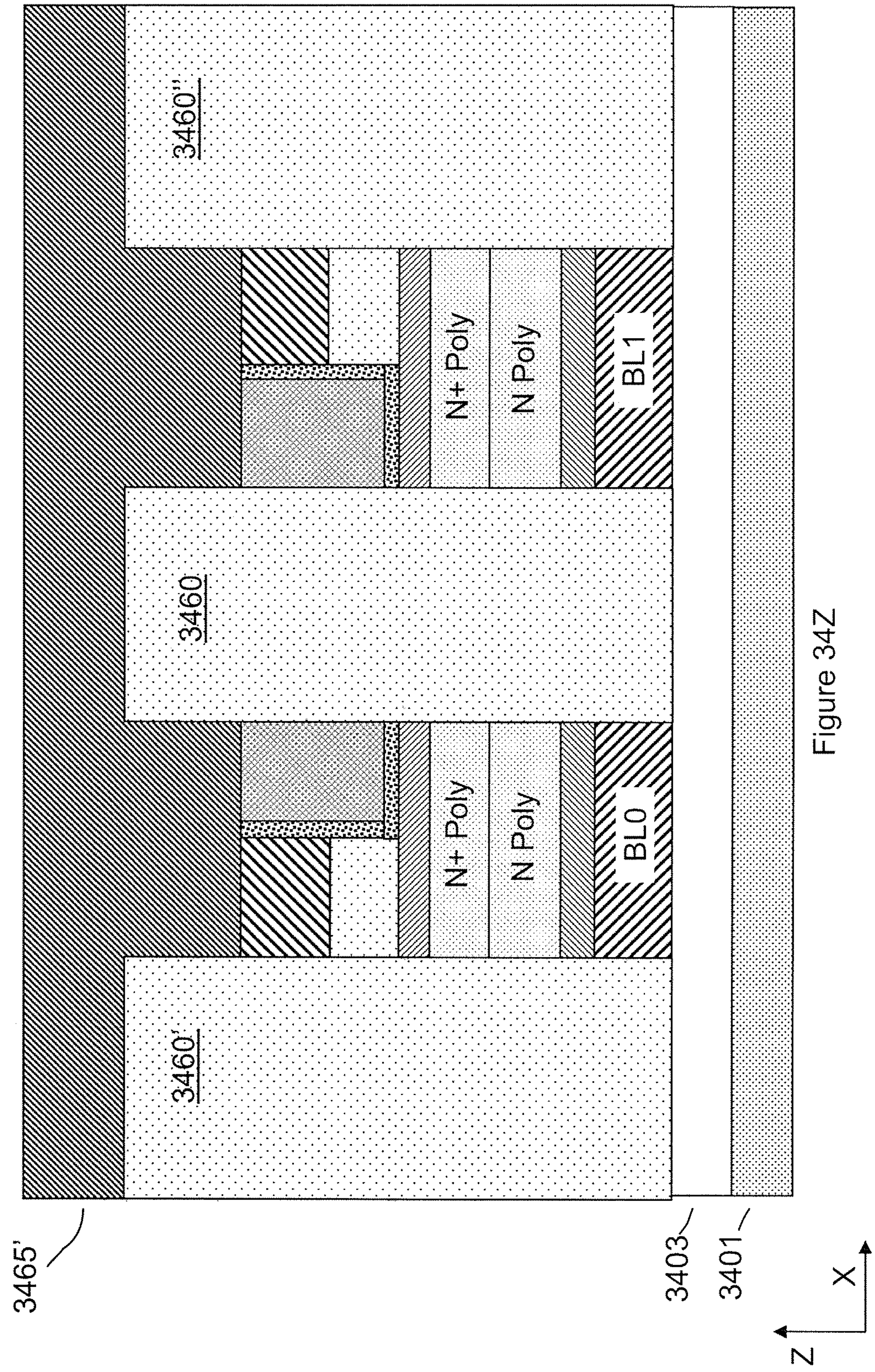
Figure 34A:
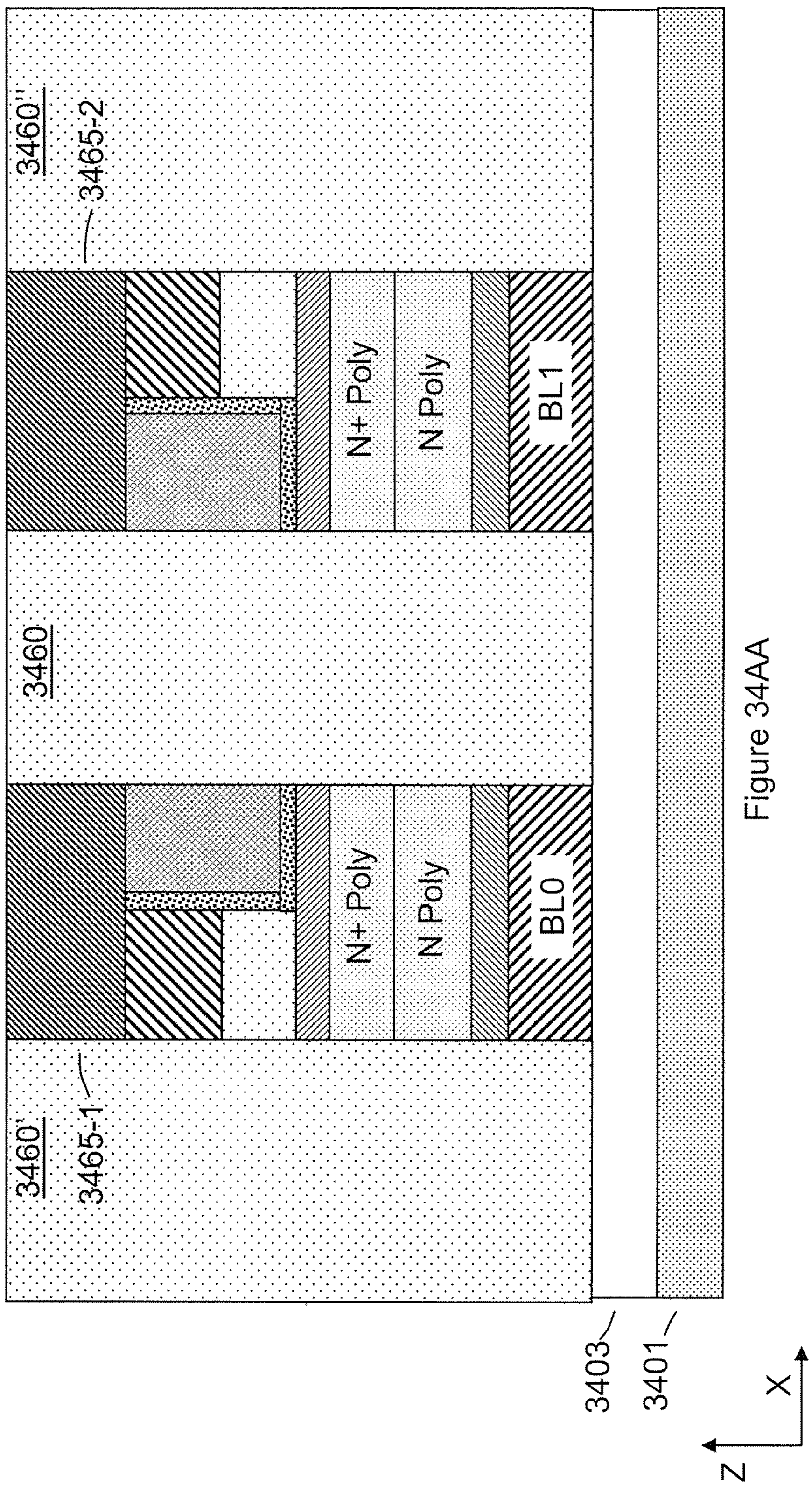
Figure 34B:
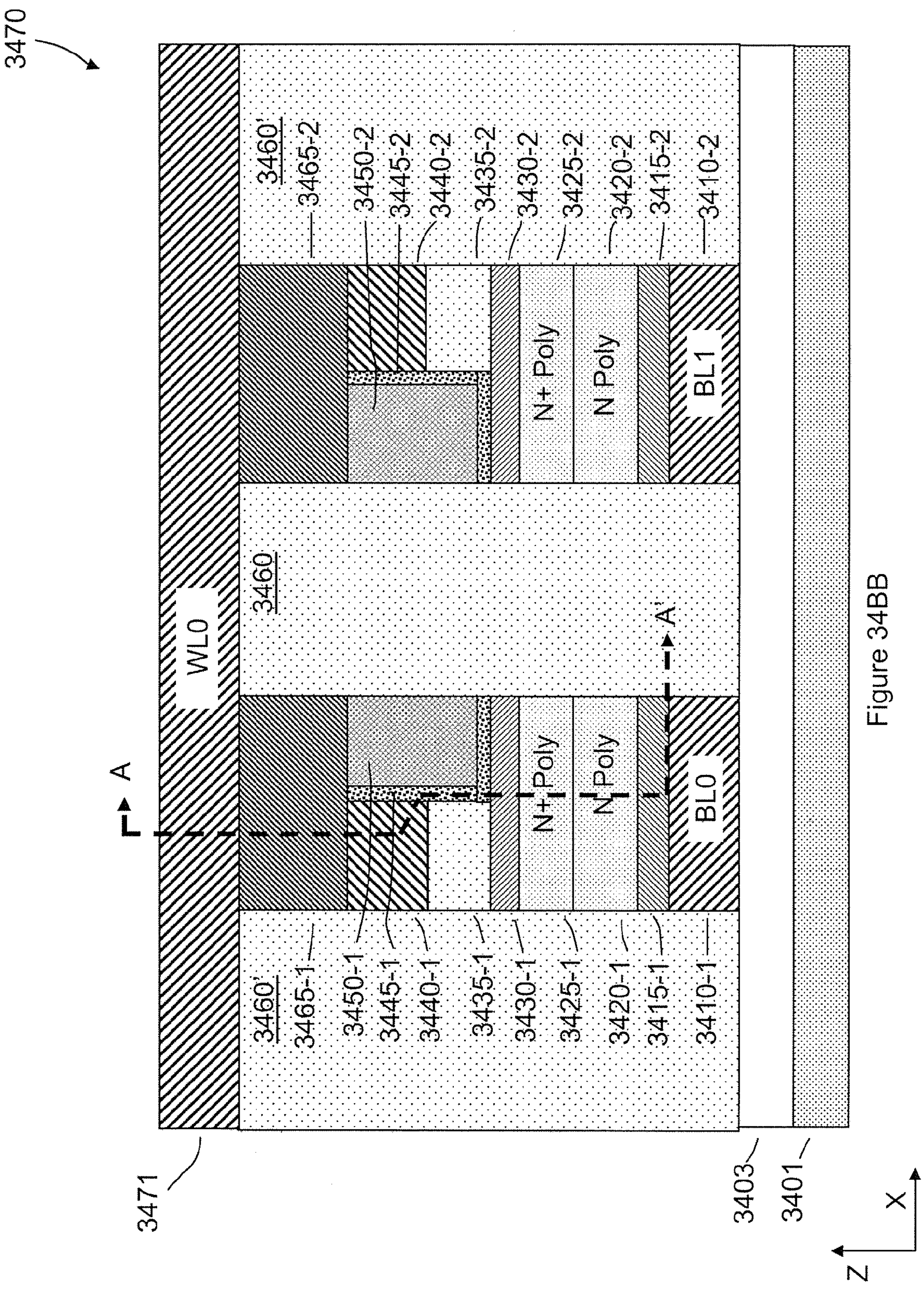
Figure 34C:
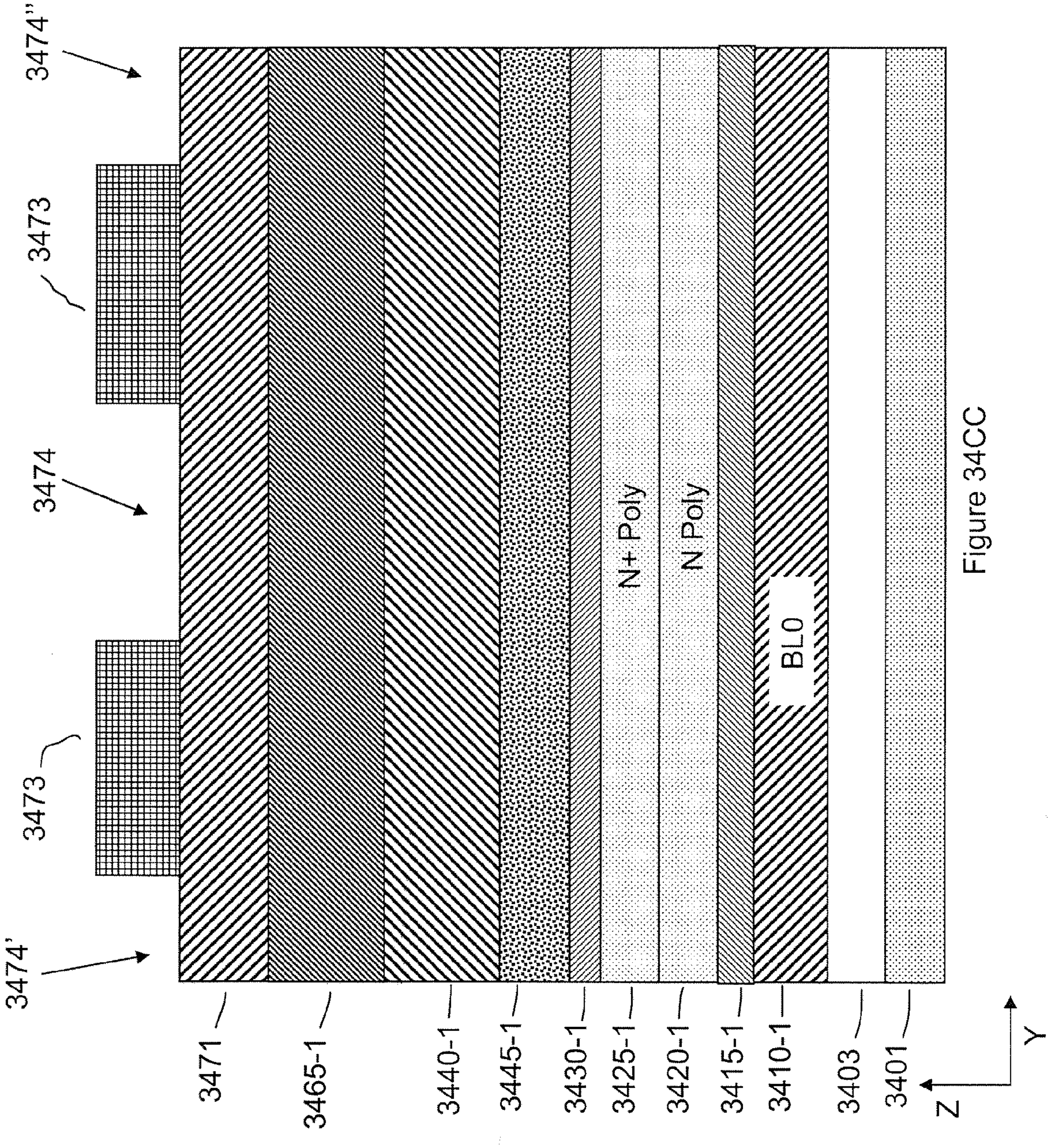
Figure 34D:
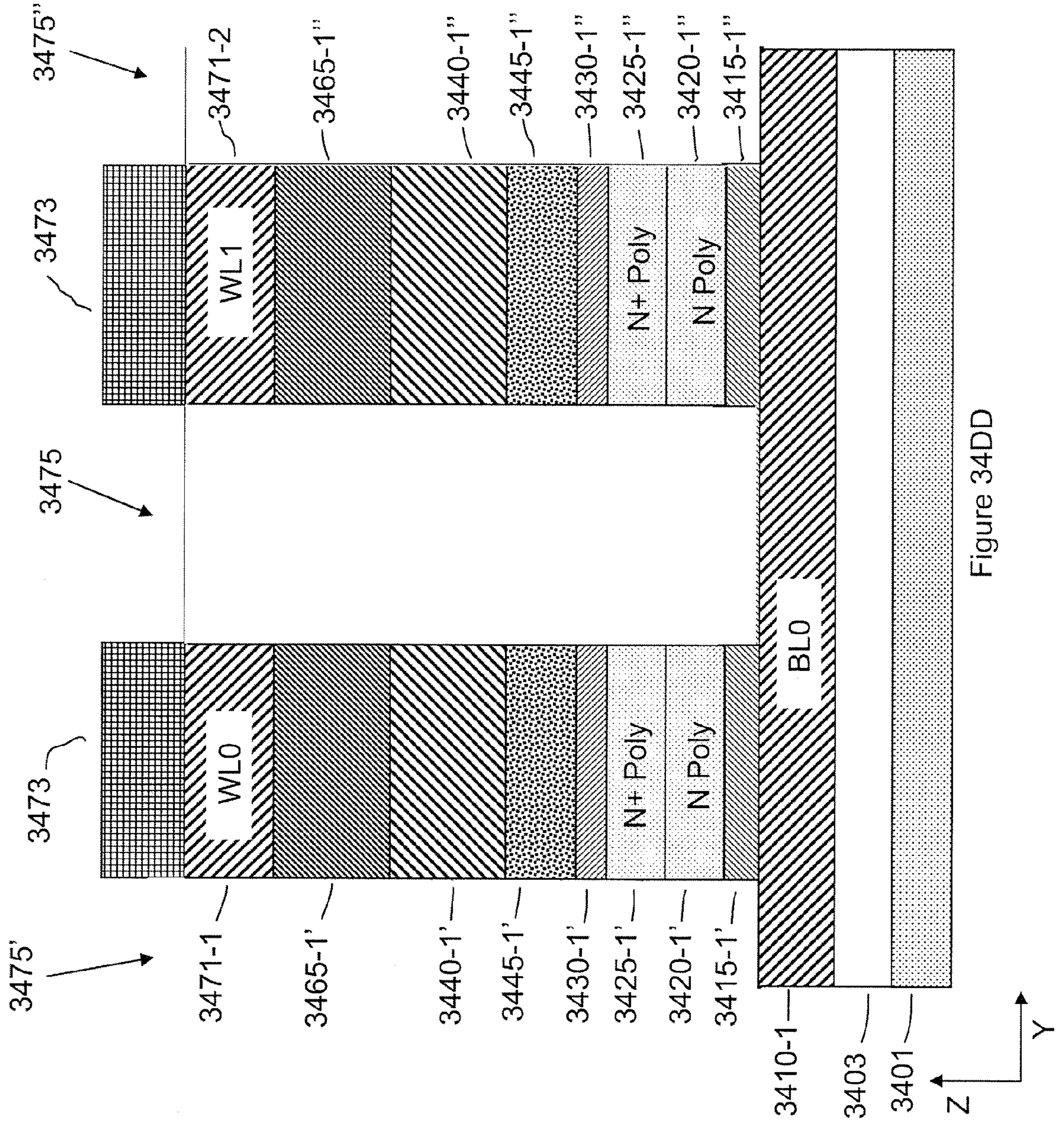
Figure 34E:
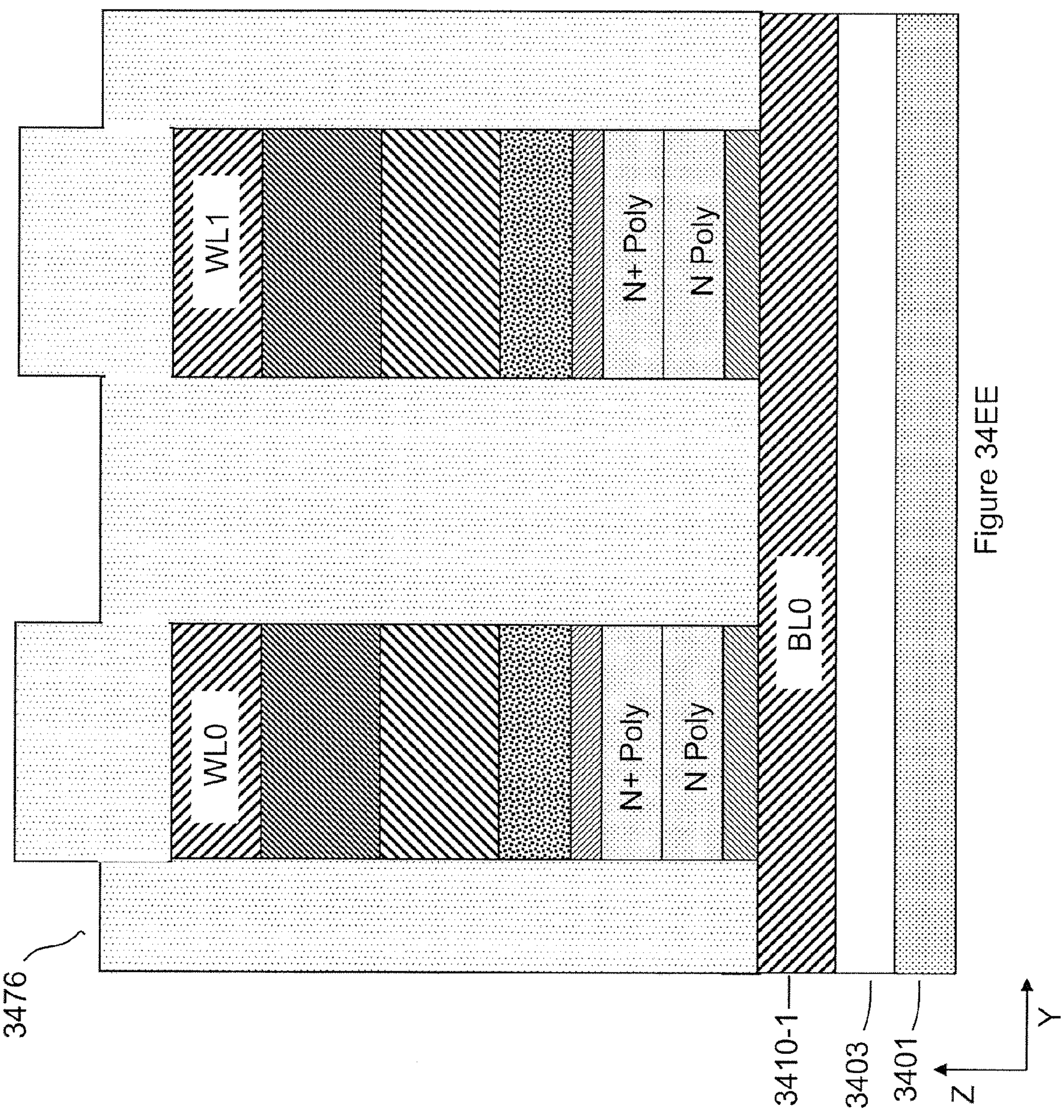
Figure 34F:
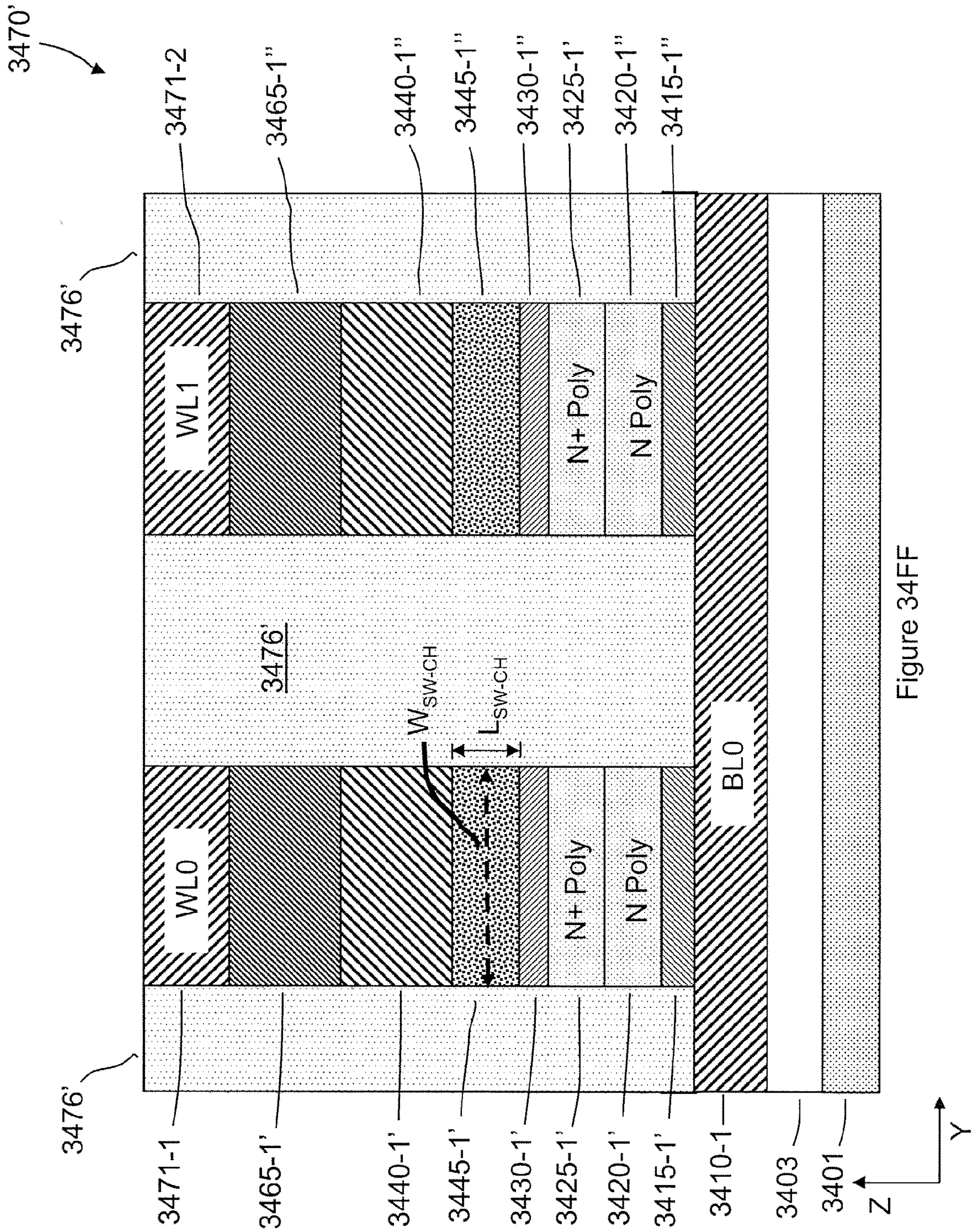

Next, methods deposit and planarize conductor 3465' to form upper layer contacts 3465-1 and 3465-2 as illustrated in FIGS. 34Z and 34AA.

Next, methods deposit and planarize conductive layer 3471 using known industry methods to form cross section 3470 as illustrated in FIG. 34BB. Cross section 3470 corresponds to cross section 2800 illustrated in FIG. 28A. The methods described further above form a cross section (not shown) corresponding to cross section 2800' illustrated in FIG. 28B if process fabrication begins with FIG. 34A' instead of FIG. 34A.

At this point in the process, cross section 3470 illustrated in FIG. 34BB has been fabricated, and includes NV NT diode cell dimensions of 1F (where F is a minimum feature size) defined in the X direction as well as corresponding array bit lines. Next, cell dimensions used to define dimensions in the Y direction are formed by directional trench etch processes similar to those described further above with respect to cross section 3470 illustrated in FIG. 34BB. Trenches used to define dimensions in the Y direction are approximately orthogonal to trenches used to define dimensions in the X direction. In this example, cell characteristics in the Y direction do not require self alignment techniques described further above with respect to X direction dimensions. Cross sections of structures in the Y direction are illustrated with respect to cross section A-A' illustrated in FIG. 34BB.

Next, methods deposit and pattern a masking layer such as masking layer 3473 on the surface of word line layer 3471 as illustrated in FIG. 34CC. Masking layer 3473 may be non-critically aligned to alignment marks in planar insulator 3403. Openings 3474, 3474', and 3474" in mask layer 3473 determine the location of trench directional etch regions, in this case trenches are approximately orthogonal to bit lines such as bit line 3410-1 (BL0).

Next, methods form trenches 3475, 3475', and 3475" corresponding to openings 3474, 3474', and 3474", respectively, in masking layer 3473. Trenches 3475, 3475', and 3475" form two sides of vertical sidewalls in the Y direction defining two opposing sides of NV NT diode cells as illustrated in FIG. 34DD.

Then, methods directionally selectively etch (remove) exposed portions of word line layer 3471 illustrated in FIG. 34DD using known industry methods to form word lines 3471-1 (WL0) and 3471-2 (WL1) illustrated in FIG. 34DD.

Next, methods selectively etch exposed portions of contact region 3465-1 illustrated in FIG. 34CC using known industry methods to form contacts 3465-1' and 3465-1" as illustrated in FIG. 34DD.

Next, methods selectively etch exposed portions of contact region 3440-1, nanotube element 3455-1, and conformal insulator 3450-1 illustrated in FIG. 34BB using known industry methods to form contacts 3440-1' and 3440-1", conformal insulator regions (not shown in FIG. 34DD cross section A-A'), and nanotube elements 3445-1' and 3445-1" as illustrated in FIG. 34DD.

Next, methods selectively etch exposed regions of insulators 3435-1, nanotube element 3455-1, and conformal insulator 3450-1 illustrated in FIG. 34BB using known industry methods to form insulator regions and conformal insulator regions (not shown in FIG. 34DD cross section A-A') and nanotube elements 3445-1' and 3445-1" illustrated in FIG. 34DD.

Next, methods selectively etch exposed portions of contact regions 3430-1 and 3430-2 illustrated in FIGS. 34BB and 34CC using known industry methods and form contacts 3430-1' and 3430-1" illustrated in FIG. 34DD (cross section A-A').

Next, methods selectively etch exposed portions of N+ polysilicon regions 3425-1 and 3425-2 illustrated in FIG. 34BB using known industry methods and form N+ polysilicon regions 3425-1' and 3425-1" illustrated in FIG. 34DD (cross section A-A').

Next, methods selectively etch exposed portions of N polysilicon regions 3420-1 and 3420-2 illustrated in FIG. 34BB using known industry methods and form N polysilicon regions 3420-1' and 3420-1" illustrated in FIG. 34DD (cross section A-A').

Then, methods selectively etch exposed portions of contact regions 3415-1 and 3415-2 illustrated in FIG. 34BB using known industry methods and form insulators 3415-1' and 3415-1" illustrated in FIG. 34DD (cross section A-A'). Directional etching stops at the surface of bit line 3410-1.

Next, methods deposit insulator 3476 using known industry methods as illustrated in FIG. 34EE. Insulator 3476 may be TEOS, for example.

Then, methods planarize insulator 3476 to form insulator 3476' using known industry methods and form cross section 3470' illustrated in FIG. 34FF. Cross section 3470' illustrated in FIG. 34FF and cross section 3470 illustrated in FIG. 34BB are two cross sectional representations of the same passivated NV NT diode vertically oriented cell. Cross section 3470 illustrated in FIG. 34BB corresponds to cross section 2800 illustrated in FIG. 28A.

At this point in the process, cross sections 3470 and 3470' illustrated in FIGS. 34BB and 34FF, respectively, have been fabricated, nonvolatile nanotube element vertically-oriented channel length $L_{SW-CH}$ and horizontally-oriented channel width $W_{SW-CH}$ are defined, including overall NV NT diode cell dimensions of 1F in the X direction and 1F in the Y direction, as well as corresponding bit and word array lines. Cross section 3470 is a cross section of two adjacent vertically oriented cathode-to-nanotube type nonvolatile nanotube diode-based cells in the X direction and cross section 3470' is a cross section of two adjacent vertically oriented cathode-to-nanotube type nonvolatile nanotube diode-based cells in the cells in the Y direction. Cross sections 3470 and 3470' include corresponding word line and bit line array lines. The nonvolatile nanotube diodes form the steering and storage elements in each cell illustrated in cross sections 3470 and 3470' each occupy a 1F by 1F area. The spacing between adjacent cells is 1F so the cell periodicity can be as low as 2F in both the X and Y directions. Therefore one bit can occupy an area of as low as $4F^2$. At the 65 nm technology node, for example, the cell area is less than 0.02 $um^2$.

Methods of Fabricating 3-Dimensional Cell Structure of Nonvolatile Cells using NV NT Devices having Vertically Oriented Diodes and Horizontally Oriented NT Switches with Cathode-to-NT Switch Connection Methods 2710 illustrated in FIG. 27A can be used to define support circuits and interconnects similar to those described with respect to memory 2600 illustrated in FIG. 26A as described further above. Exemplary methods 2710 apply known semiconductor industry design and fabrication techniques to fabricated support circuits and interconnections 3501 in and on a semiconductor substrate as illustrated in FIG. 35A. Support circuits and interconnections 3501 can include, for example, FET devices in a semiconductor substrate and interconnections such as vias and wiring above a semiconductor substrate.

Next, methods 2730 illustrated in FIG. 27B deposit and planarize insulator 3503 on the surface of support circuits and interconnections 3501 layer.

Figure 35A:
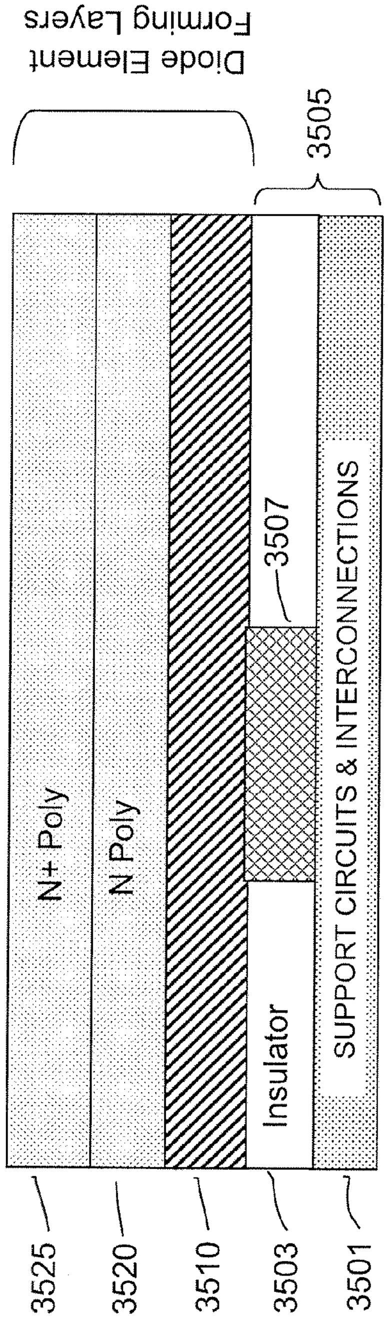
FIGS. 35A-35S illustrate methods of fabrication for cathode-on-nanotube memory cross sectional structures with horizontally oriented nonvolatile nanotube switches within vertical cell boundaries illustrated in FIG. 28C, according to some embodiments.

Next, methods form interconnect contact 3507 through planar insulator 3503 as illustrated in FIG. 35A. Contact 3507 through planar insulator 3503 is in contact with support circuits and interconnections 3501. The combination of support circuits and interconnections 3501 and planarized insulator 3503 is referred to as memory support structure 3505 as illustrated in FIG. 35A.

Next, methods deposit a conductor layer 3510 on the planarized surface of insulator 3503 as illustrated in FIG. 35A, typically 50 to 500 nm thick, using known industry methods. Contact 3507 through planar insulator 3503 connects conductor layer 3510 with support circuits and interconnections 3501. Examples of conductor layer 3510 and contact 3507 materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Materials such as those used in conductor layer 3410 may be used to form array lines and also to form anodes for Schottky diodes.

Next, methods deposit an N polysilicon layer 3520 of thickness 10 nm to 500 nm on the surface of conductor 3510. N polysilicon layer 3520 may be doped with arsenic or phosphorus in the range of $10^{14}$ to $10^{17}$ dopant atoms/$cm^3$, for example. N polysilicon layer 3520 may be used to form cathodes of Schottky diodes. In addition to doping levels, the polysilicon crystalline size (or grain structure) of N Polysilicon layer 3420 may also be controlled by known industry methods of deposition. Also, known industry SOI methods of deposition may be used that result in polysilicon regions that are single crystalline (no longer polysilicon), or nearly single crystalline.

Next, methods deposit N+ polysilicon layer 3525 on the surface of N polysilicon layer 3520 as illustrated in FIG. 35A in order to form an ohmic contact layer. N+ polysilicon layer 3525 is typically doped with arsenic or phosphorous to $10^{20}$ dopant atoms/$cm^3$, for example, and has a thickness of 20 to 400 nm, for example.

Figure 35B:
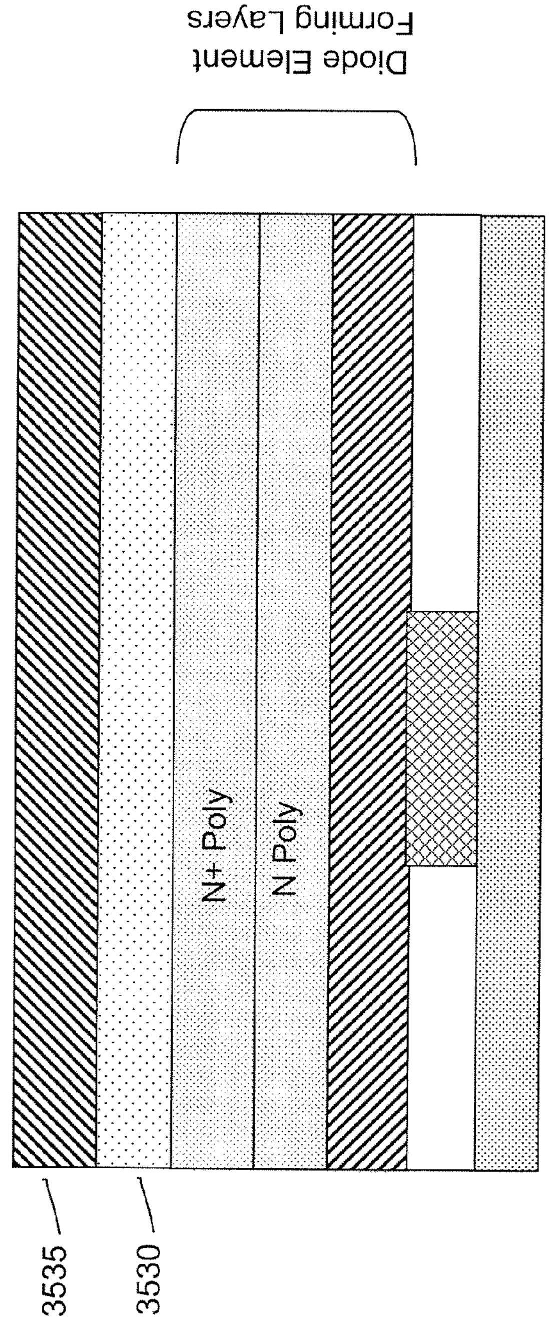

Next, methods deposit an insulator layer 3530 on N+ layer 3525 as illustrated in FIG. 35B. The thickness of insulator layer 3530 may vary in thickness from 10 nm to greater than 400 nm, for example. Insulator 3530 may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. U.S. patent application Ser. No. 11/280,786 gives some examples of various dielectric materials.

At this point in the fabrication process, methods deposit contact layer 3535 on the surface of insulator layer 3530 as illustrated in FIG. 35B. Contact layer 3535 may be 10 to 500 nm in thickness, for example. Contact layer 3535 may be formed using Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, for example.

Figure 35C:
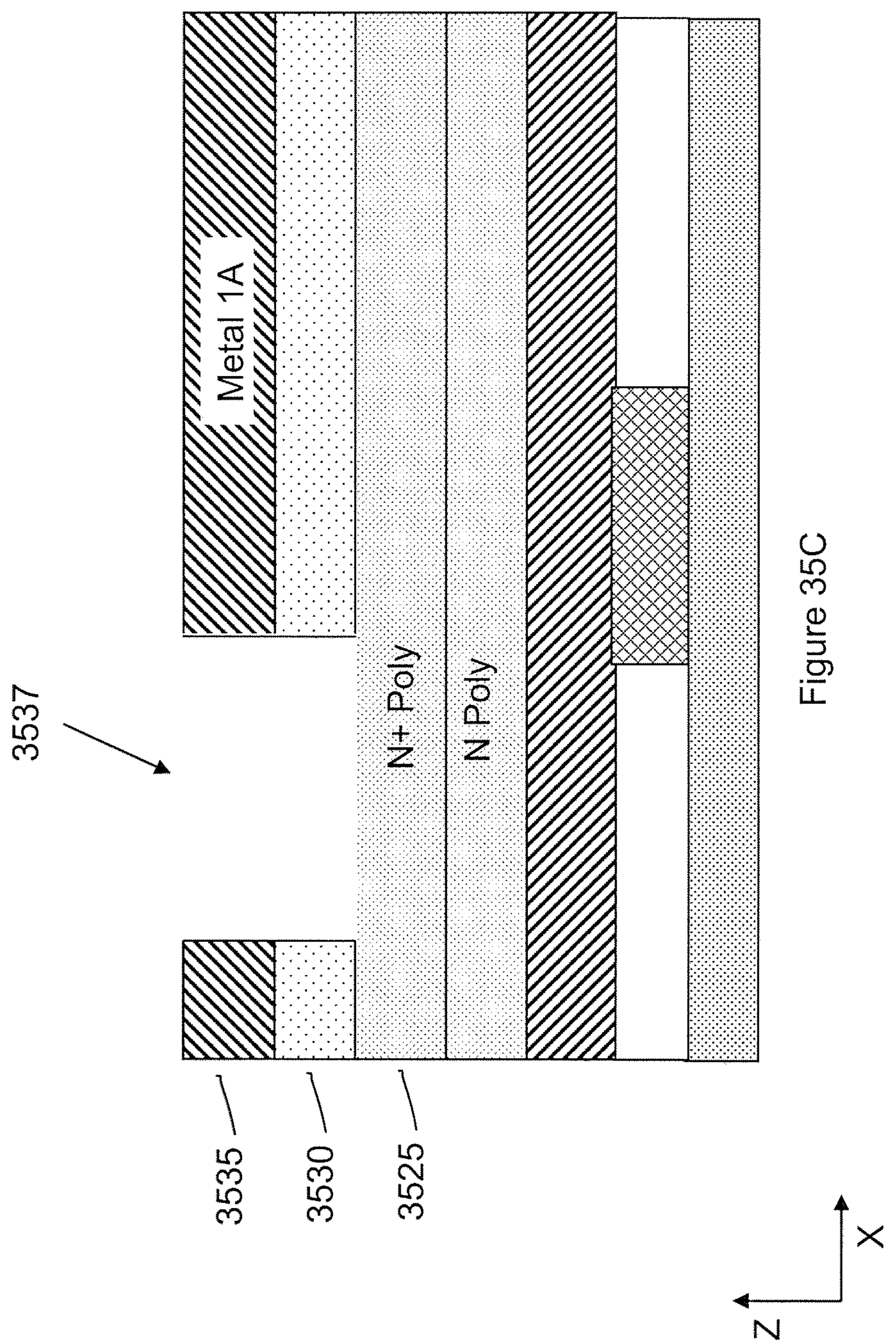
Figure 35D:
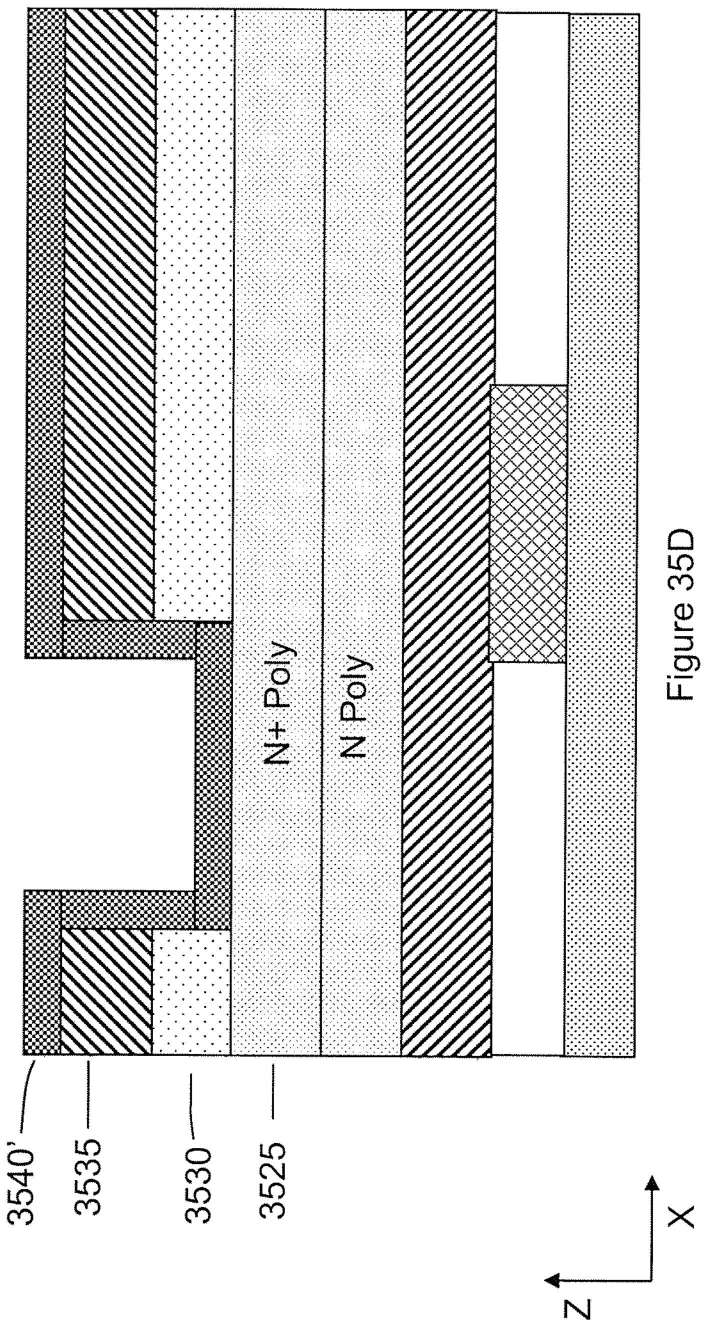

Next, methods directionally etch opening 3537 through contact layer 3535 and insulator layer 3530 to the top surface of N+ polysilicon layer 3525 as illustrated in FIG. 35C. Directional etching may use RIE, for example Next methods deposit conformal insulator layer 3540' in contact with surface regions of contact 3535 and N+ polysilicon layer 3525 and on exposed sidewall surface regions of contact 3535 and insulator 3530 as illustrated in FIG. 35D. Conformal insulator 3540' may be 5 to 250 nm thick, for example, and may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Insulator 3540' is deposited to a thickness that forms nanotube element channel length regions as described further below with respect to 351 and insulates a contact described further below with respect to FIG. 35G from contact with contact 3535.

Figure 35E:
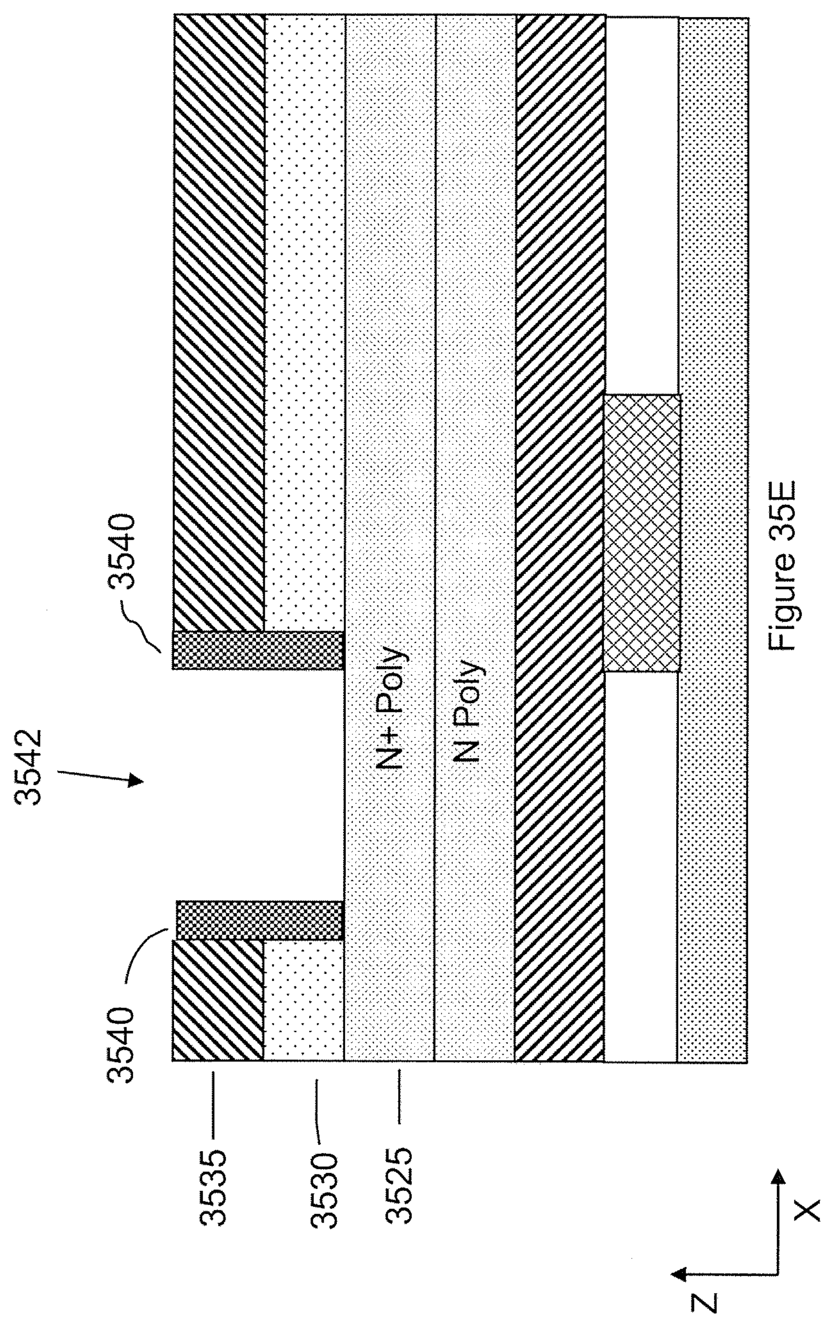

Next, methods directionally etch insulator 3540' using known industry methods such as RIE and form sidewall spacer regions 3540 illustrated in FIG. 35E that define nanotube element channel length as described further below with respect to FIG. 35I.

Figure 35F:
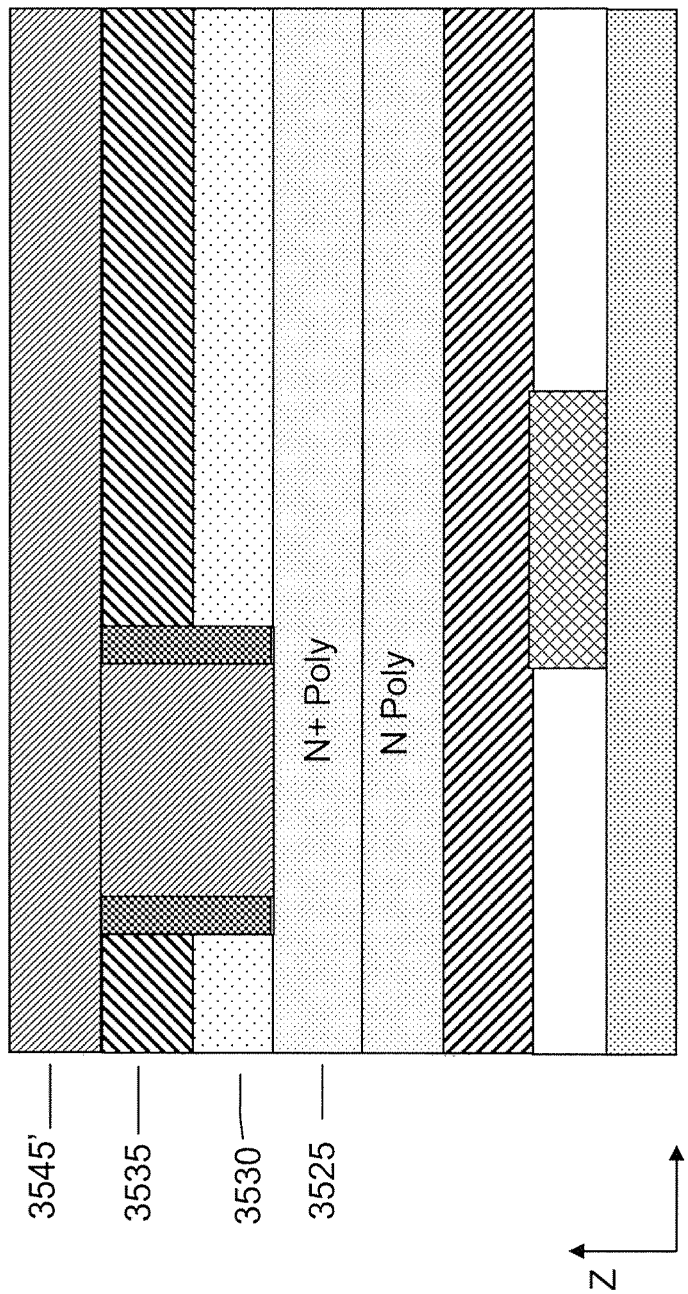
Figure 35G:
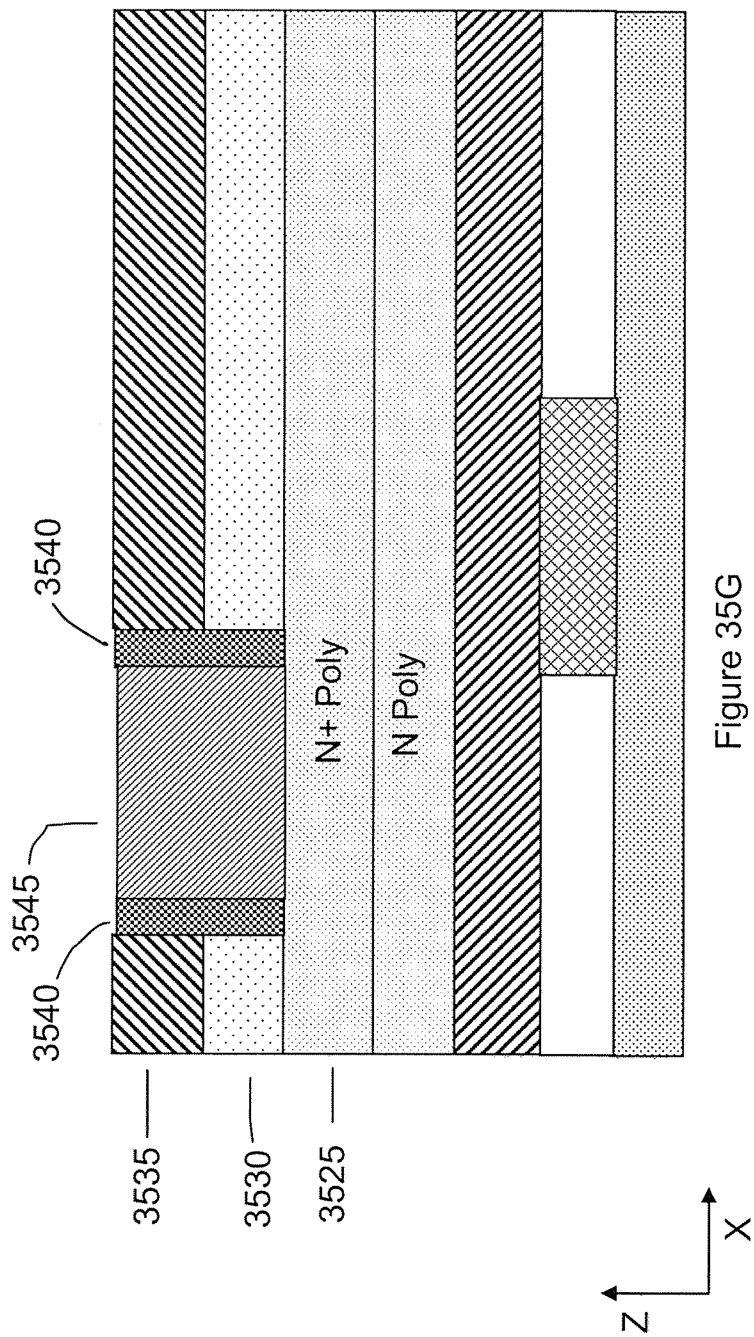

Next, methods deposit and planarize conductor 3545' to form contact 3545 as illustrated in FIGS. 35F and 35G.

Figure 35H:
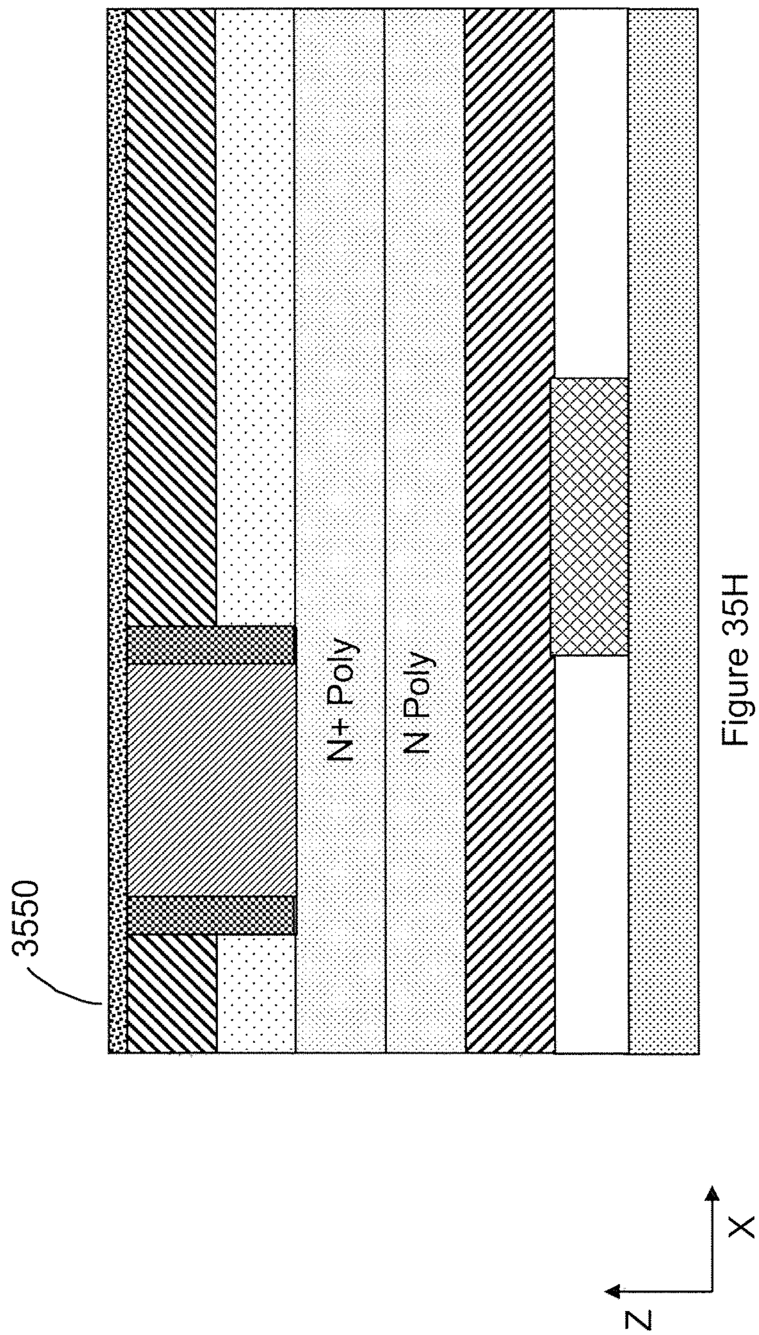

Next, methods deposit conformal nanotube element 3550 on a coplanar surface formed by contact 3535, sidewalls 3540, and contact 3545 as illustrated in FIG. 35H. Conformal nanotube element 3550 may be 0.5 to 20 nm thick, for example, and may be fabricated as a single layer or as multiple layers using deposition methods such as spin-on and spray-on methods. Nanotube element methods of fabrication are described in the incorporated patent references.

Figure 35I:
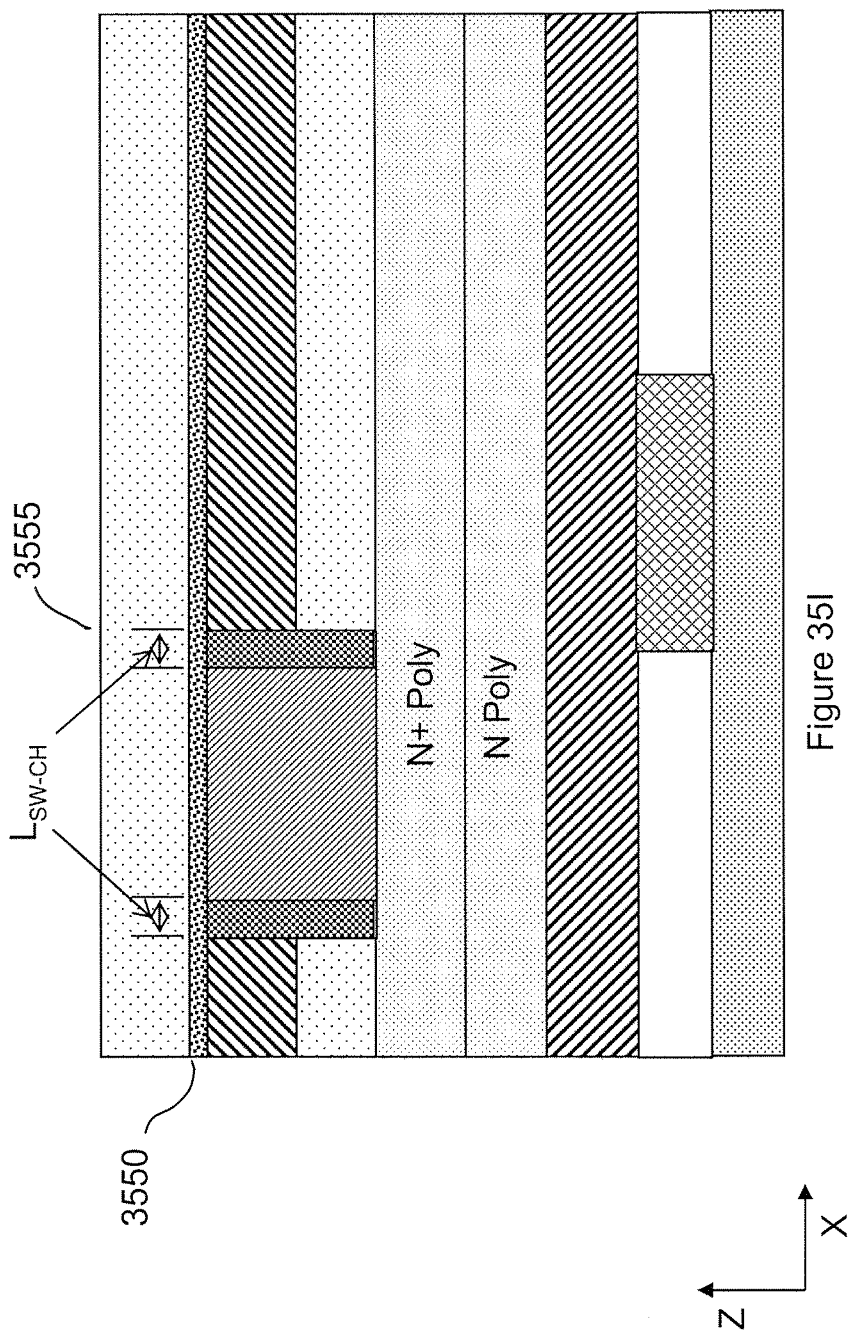

Next, methods deposit insulator layer 3555 on nanotube element 3550 as an insulating and protective layer as illustrated in FIG. 35I. The channel length $L_{SW-CH}$ Of nanotube element 3550 is defined by the surface dimension of sidewall spacers 3540. Insulator layer 3555 may be 5 to 200 nm thick, for example, and may be formed from any appropriate known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Dielectric material selection with respect to nanotube elements is described in U.S. patent application Ser. No. 11/280, 786.

Figure 35J:
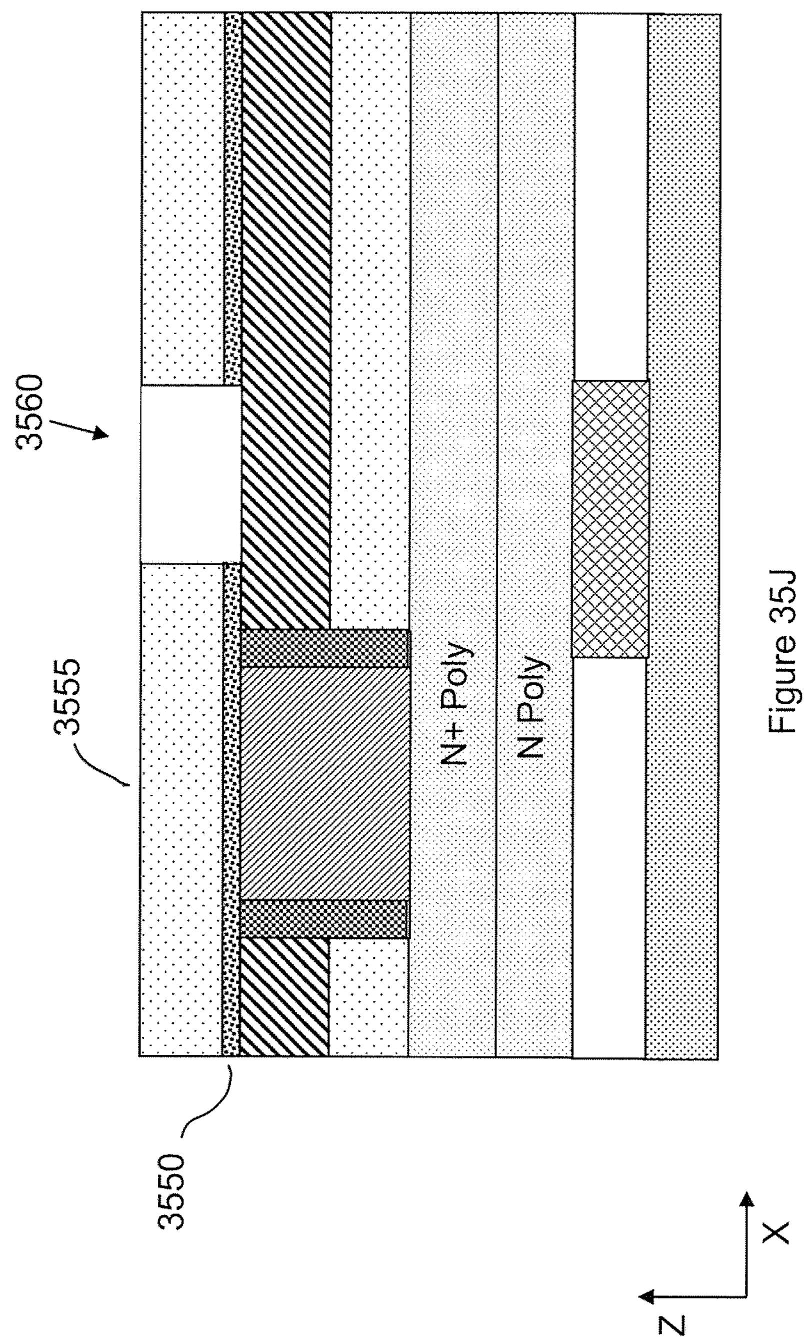

Next, methods pattern and etch opening 3560 as illustrated in FIG. 35J to the top of contact 3535. Methods etch a portion of opening 3560 using known industry methods. Methods then etch the exposed region of nanotube element 3550 using ashing, for example, or other means described in the incorporated patent references.

Figure 35K:
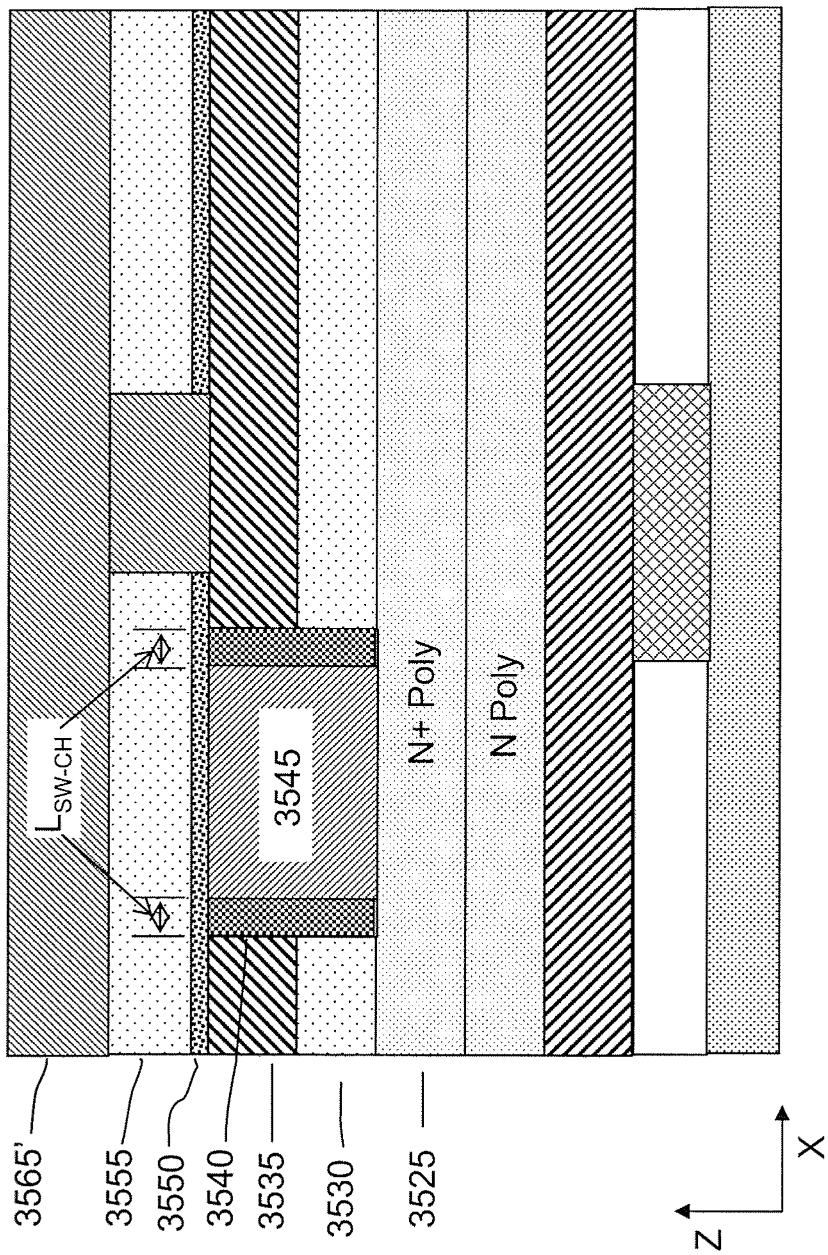
Figure 35L:
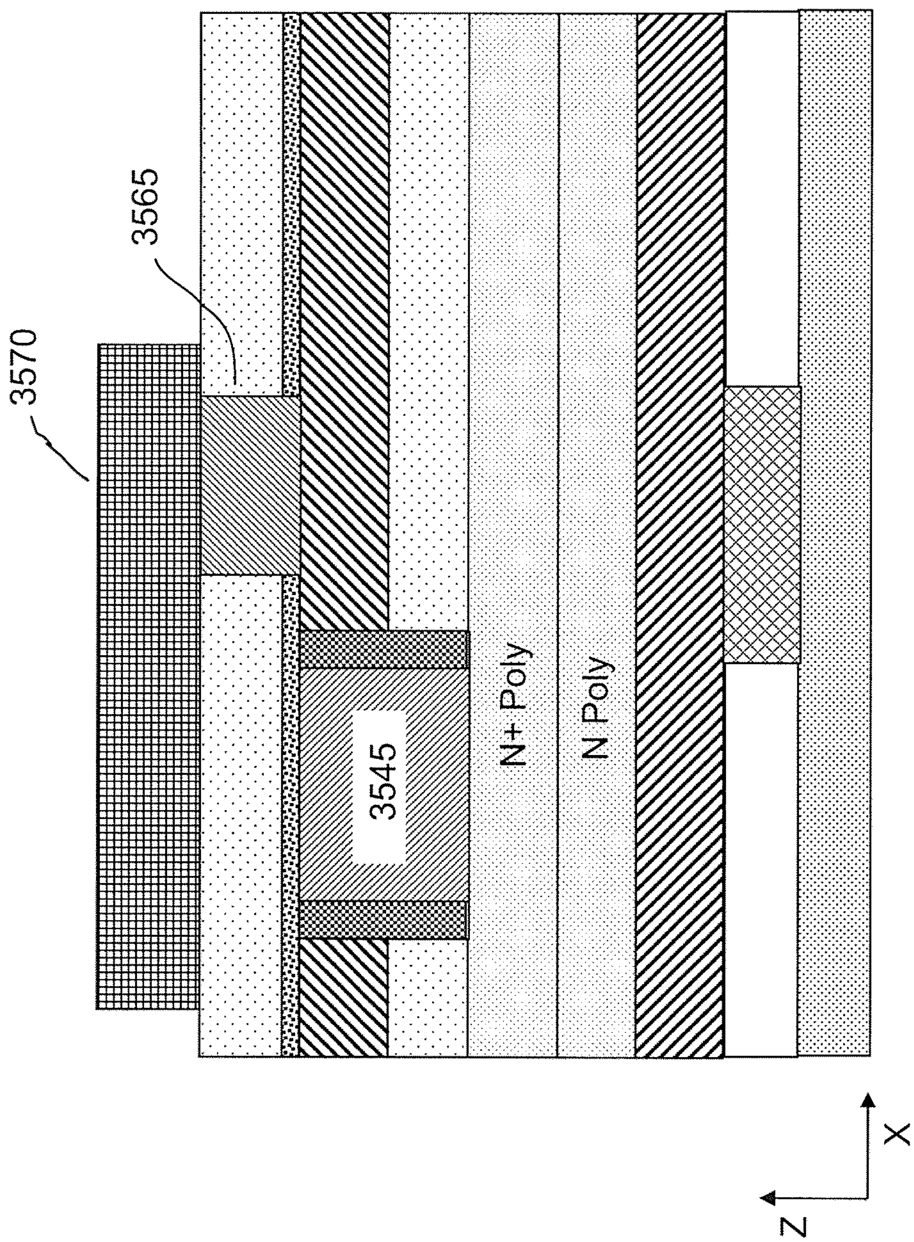

Next, methods deposit and planarize conductor 3565' to form contact 3565 as illustrated in FIGS. 35K and 35L.

Next, masking layer 3570 is patterned in the X direction as illustrated in FIG. 35L and defines the openings for directional selective trench etching to form trench regions 3572 and 3572' described further below with respect to FIG. 35M.

Next, methods selectively etch exposed portions of insulator 3555 using known industry methods and form insulator region 3555'.

Figure 35M:
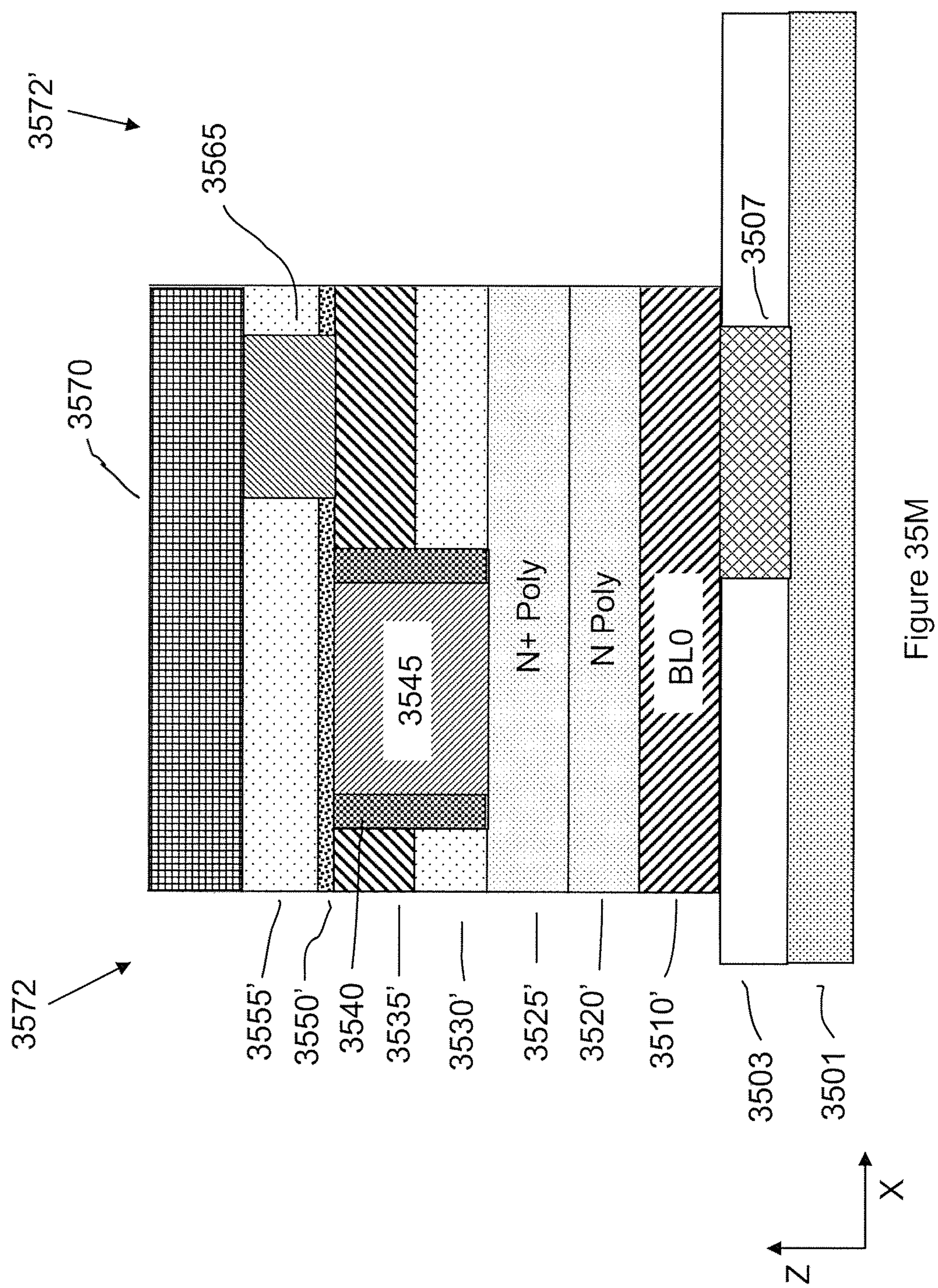

Next, methods selectively etch exposed regions of nanotube element 3550 and form nanotube element 3550' as illustrated in FIG. 35M. Nanotube element methods of etching are described in greater detail in the incorporated patent references.

Next, methods selectively etch exposed portions of contact 3535 using know industry methods and form contact region 3535'.

Next, methods selectively etch exposed portions of insulator 3530 and form insulator region 3530'.

Next, methods selectively etch exposed portions of N+ polysilicon layer 3525 using known industry methods and form N+ polysilicon region 3525'.

Next, methods selectively etch exposed portions of N polysilicon layer 3520 using known industry methods and form N polysilicon region 3520' as illustrated in FIG. 35M.

Then, methods selectively etch exposed portions of conductor layer 3510 using known industry methods and forms bit line 3510' (BL0). Directional etching stops at the surface of planar insulator 3503 as illustrated in FIG. 35M.

Figure 35N:
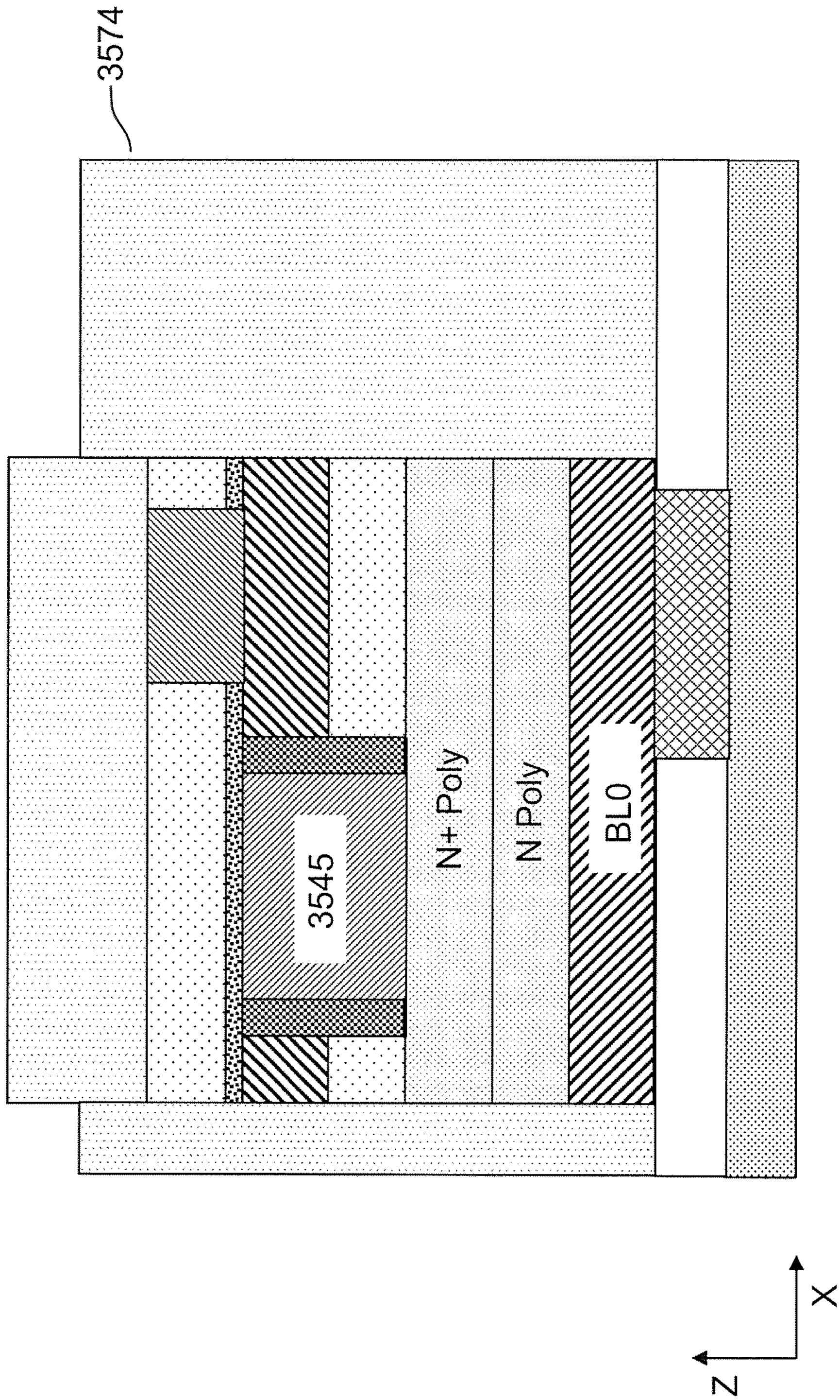
Figure 35O:
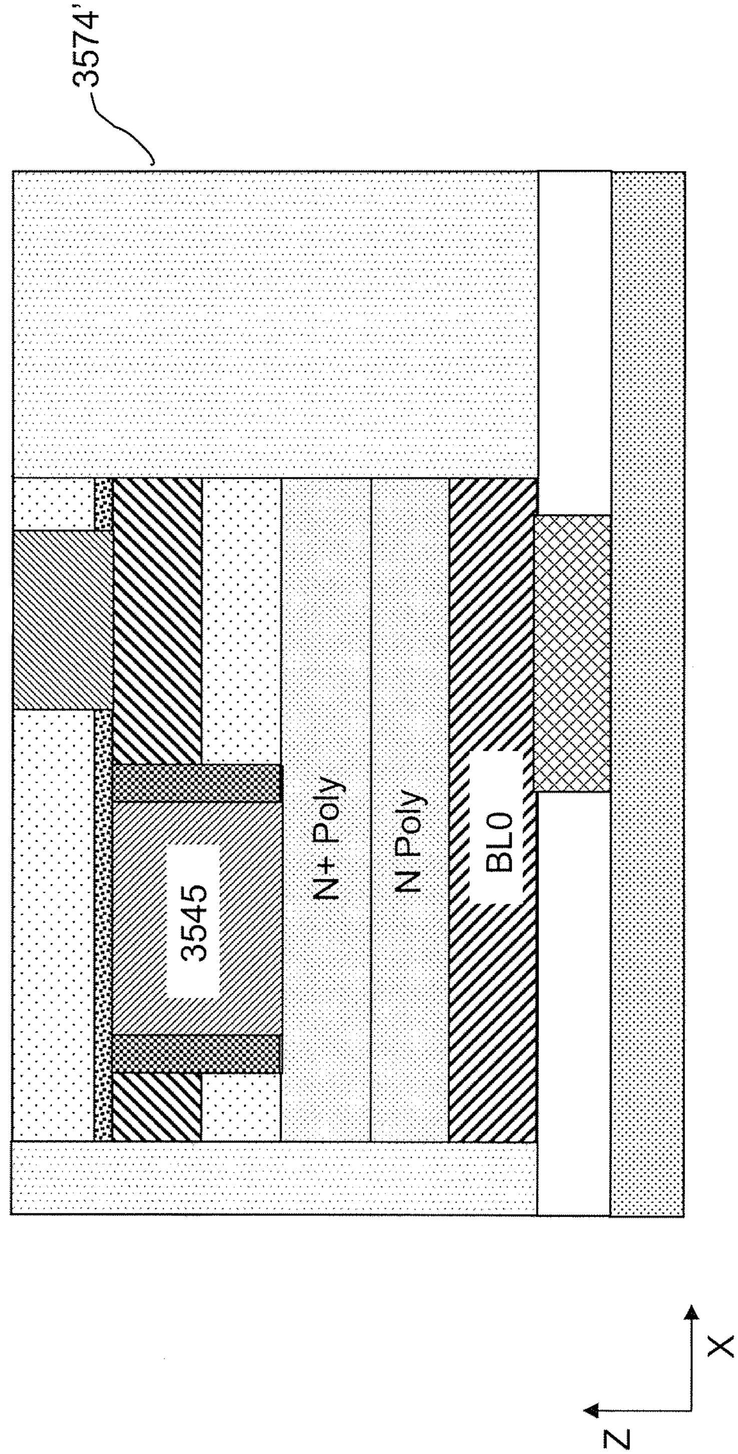

Next, methods deposit an insulator 3574 such as TEOS, for example, to fill trench openings 3572 and 3572' and then methods planarize insulator 3574 to form insulator 3574' as illustrated in FIGS. 35N and 35O.

Figure 35P:
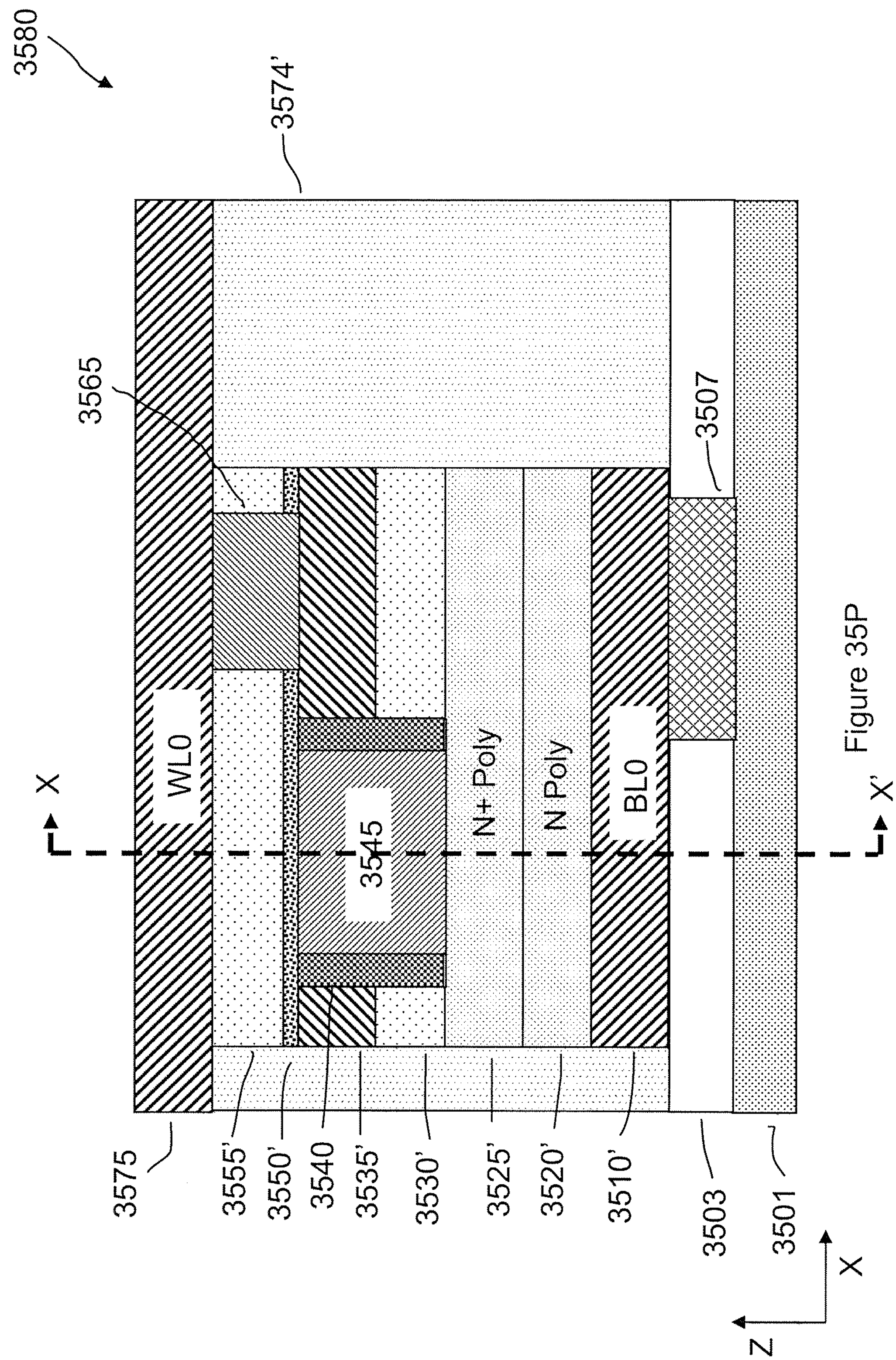

Next, methods deposit and planarize conductive layer 3575 corresponding to array word line WL0 using known industry methods to form cross section 3580 as illustrated in FIG. 35P. Cross section 3580 corresponds to cross section 2800" illustrated in FIG. 28C. Word line WL0 orientation is along the X direction, and bit line BL0 orientation is along the Y axis as shown further below.

At this point in the process, cross section 3580 illustrated in FIG. 35P has been fabricated, and includes NV NT diode cell dimensions of 2-3F (where F is a minimum feature size) defined in the X direction as well as corresponding array bit lines. Next, cell dimensions used to define dimensions in the Y direction are formed by directional trench etch processes similar to those described further above with respect to cross section 3580 illustrated in FIG. 35P. Trenches used to define dimensions in the Y direction are approximately orthogonal to trenches used to define dimensions in the X direction. Cross sections of structures in the Y direction are illustrated with respect to cross section X-X' illustrated in FIG. 35P.

Figure 35Q:
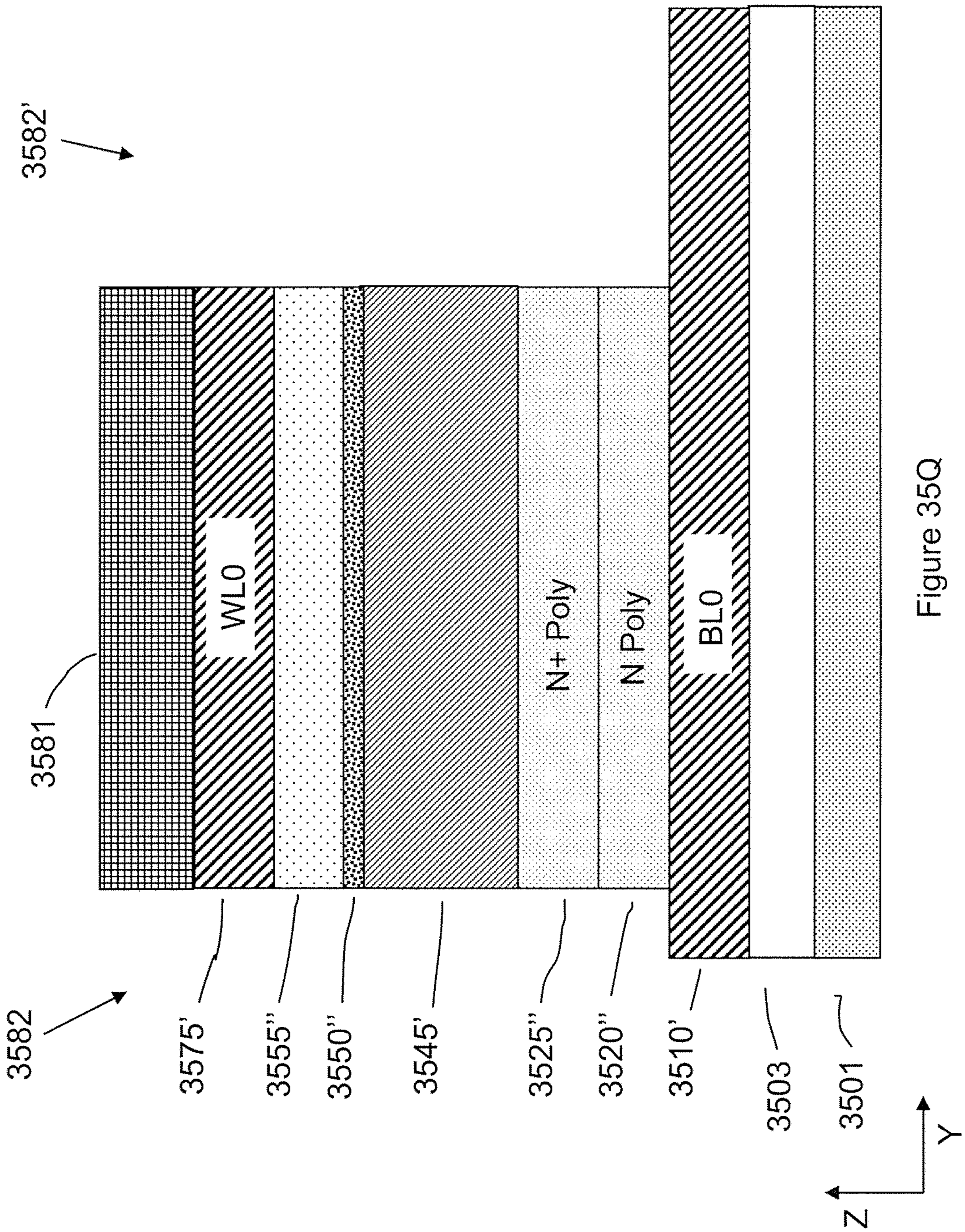

Next, methods deposit and pattern a masking layer such as masking layer 3581 on the surface of word line layer 3575' as illustrated in FIG. 35Q. Masking layer 3581 may be non-critically aligned to alignment marks in planar insulator 3503. Openings in mask layer 3581 determine the location of trench directional etch regions, in this case trenches are approximately orthogonal to bit lines such as bit line 3510' (BL0).

Next, methods form trenches 3582 and 3582' corresponding to openings in masking layer 3581. Trenches 3582 and 3582' form two sides of vertical sidewalls in the Y direction defining two opposing sides of NV NT diode cells as illustrated in FIG. 35Q.

Next, methods directionally selectively etch (remove) exposed portions of word line layer 3575 illustrated in FIG. 35P using known industry methods to form word line 3575' (WL0) illustrated in FIG. 35Q (cross section X-X').

Next, methods selectively etch exposed portions of insulator 3555' as illustrated in FIG. 35Q (cross section X-X') and also selectively etch exposed portions of contact 3565 (not shown in FIG. 35Q) using known industry methods to form insulator region 3555" as illustrated in FIG. 35Q and also to form a modified contact 3565 not shown in FIG. 35Q (cross section X-X'), Next, methods selectively etch (remove) exposed portions of nanotube element 3550' forming nanotube element 3550" as illustrated in FIG. 35Q. Nanotube element methods of etching are described in greater detail in the incorporated patent references.

Next, methods selectively etch exposed portions of contact 3545 forming contact 3545' as illustrated in FIG. 35Q (cross section X-X'); methods also selectively etch exposed portions of sidewall spacers 3540 to form modified sidewall spacers 3440 not illustrated in FIG. 35Q; and methods also selectively etch exposed portions of contact 3535 to form modified contacts 3535 not illustrated in FIG. 35Q.

Next, methods selectively etch exposed portions of insulator 3530' to form a modified insulator 3530' not illustrated in FIG. 35Q (cross section X-X').

Next, methods selectively etch exposed portions of N+ polysilicon regions 3525' illustrated using known industry methods and form N+ polysilicon region 3525" illustrated in FIG. 35Q (cross section X-X').

Next, methods selectively etch exposed portions of N polysilicon regions 3520' illustrated using known industry methods and form N+ polysilicon region 3520" illustrated in FIG. 35Q (cross section X-X'). Directional selective etch stops at the surface of bit line 3510' (BL0).

Figure 35R:
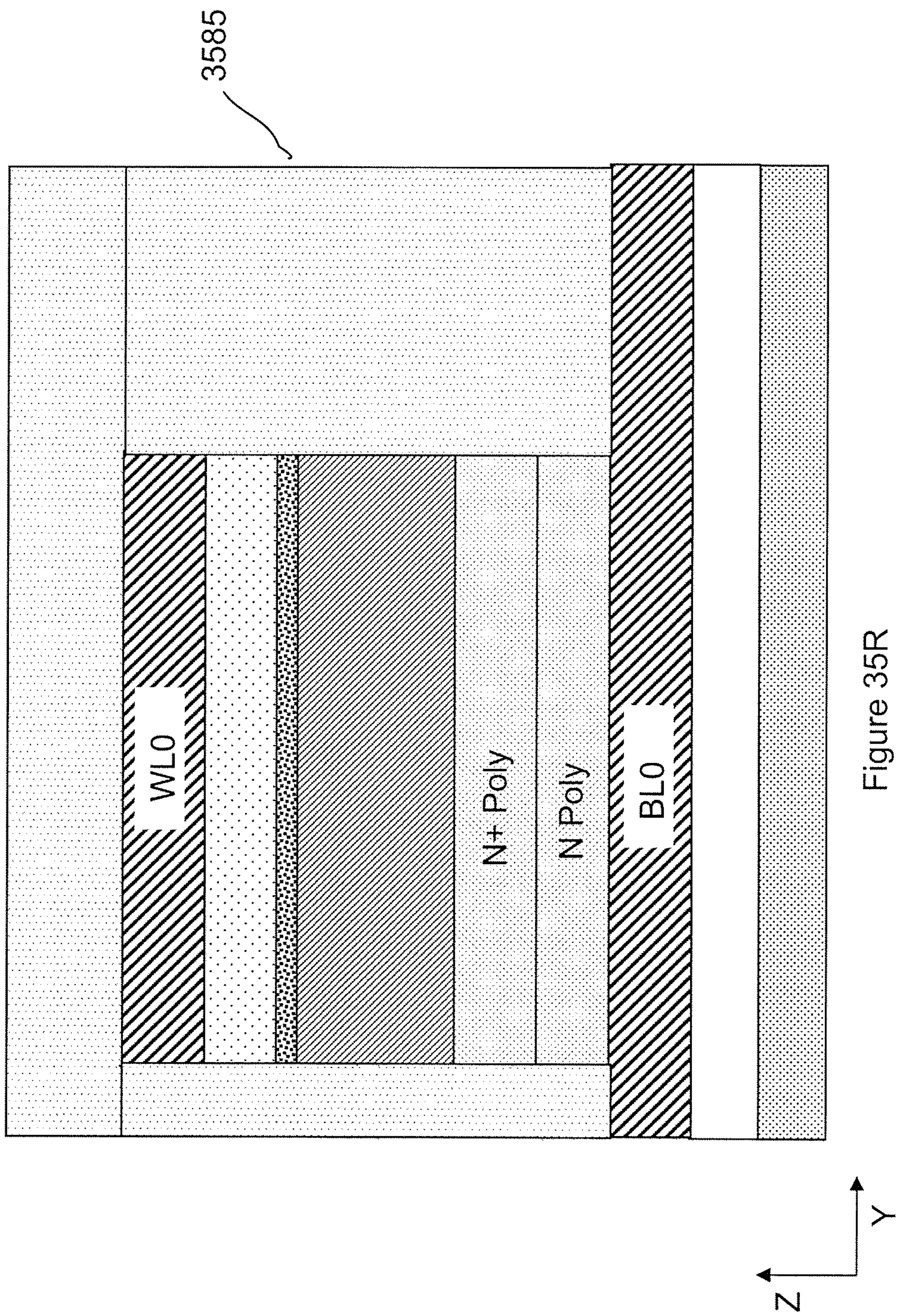

Next, methods deposit insulator 3585 using known industry methods as illustrated in FIG. 35R. Insulator 3585 may be TEOS, for example.

Figure 35S:
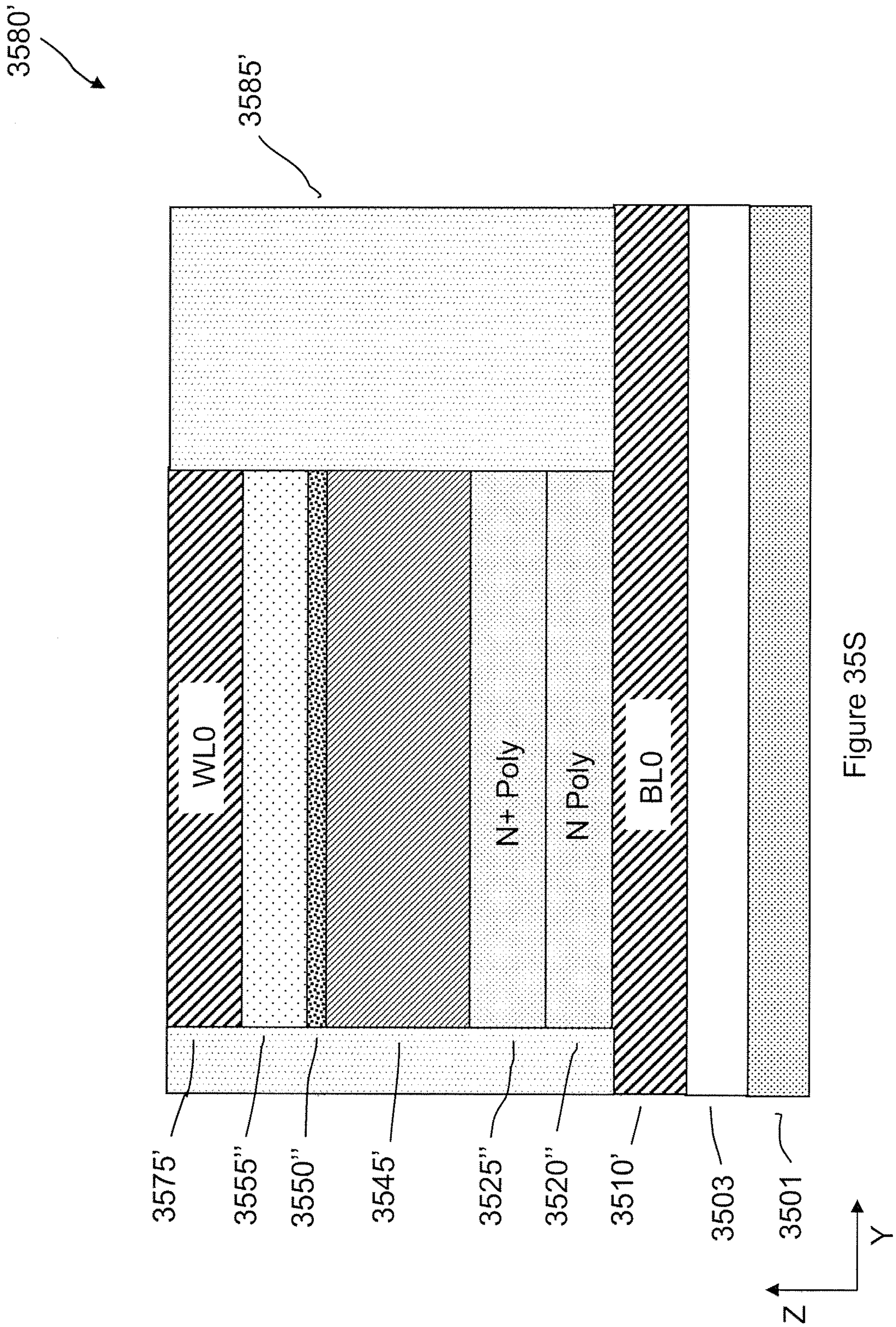

Then, methods planarize insulator 3585 to form insulator 3585' using known industry methods and form cross section 3580' illustrated in FIG. 35S. Cross section 3580' illustrated in FIG. 35S and cross section 3580 illustrated in FIG. 35P are two cross sectional representations of the same embodiment of a passivated NV NT diode with a vertically oriented diode and a horizontally nonvolatile nanotube switch. Cross section 3480 illustrated in FIG. 35P corresponds to cross section 2800" illustrated in FIG. 28C.

Methods of Fabricating Nonvolatile Memories using NV NT Diode Devices with Anode-to-NT Switch Connection Exemplary methods 3000 illustrated in FIGS. 30A and 30B may be used to fabricate embodiments of memories using NV NT diode devices with anode-to-NT switch connections for vertically oriented NV NT switches such as those shown in cross section 3100 illustrated in FIG. 31A, cross section 3100' illustrated in FIG. 31B, and cross section 3100" illustrated in FIG. 31C as described further below with respect to FIG. 36. Structures such as cross section 3000, 3000', and 3000" may be used to fabricate memory 2900 illustrated schematically in FIG. 29A.

Exemplary methods of fabricating cross sections 3000, 3000', and 3000" can be performed using critical alignments in Y direction process steps. There are no critical alignments in the X direction because in this example distance between trenches determines the width of the nanotube element. However, the width of the nanotube element may be formed to be less than the trench-to-trench spacing by using methods similar to those described further below with respect to the Y direction. In the Y direction, critical alignment requirements can be eliminated by using methods that form self-aligned internal cell vertical sidewalls that define vertical nanotube channel element location, vertical channel element length ($L_{SW\_CH}$), and form nanotube channel element contacts with respect to trench sidewalls that are etched later in the process to define outer cell dimensions using methods of fabrication described further below with respect to FIG. 36. In this example, NV NT diode cell structures occupy a minimum dimension F in the X and Y directions, where F is a minimum photolithographic dimension. In this example, the internal cell vertical sidewall is positioned (by self alignment techniques) at approximately R distance from trench sidewalls that are separated by distance F and that define outer cell dimensions as illustrated further below with respect to FIGS. 36A-36FF. FIGS. 36A-36FF are illustrated with a spacing R of approximately F/2. However, methods using self alignment techniques, such as those described further below with respect to FIG. 36A-36FF, may position a vertical sidewall at any location R within the cell region of width F using R values of F/4, F/3, F/2, 3F/4, etc for example. In some embodiments, R is not related in any particular way to F.

Methods of Fabricating 3-Dimensional Cell Structure of Nonvolatile Cells using NV NT Devices having Vertically Oriented Diodes and Vertically Oriented NT Switches with Anode-to-NT Switch Connection Exemplary methods 3010 illustrated in FIG. 30A can be used to define support circuits and interconnects similar to those described with respect to memory 2900 illustrated in FIG. 29A as described further above. Methods 3010 apply known semiconductor industry techniques design and fabrication techniques to fabricated support circuits and interconnections 3601 in and on a semiconductor substrate as illustrated in FIG. 36A. Support circuits and interconnections 3601 include FET devices in a semiconductor substrate and interconnections such as vias and wiring above a semiconductor substrate.

Next, methods 3030 illustrated in FIG. 30B deposit and planarize insulator 3603 on the surface of support circuits and interconnections 3601 layer. Interconnect means through planar insulator 3603, not shown in FIG. 36A, are shown further above with respect to FIGS. 35A-35S. The combination of support circuits and interconnections 3601 and planarized insulator 3603 is referred to as memory support structure 3605 as illustrated in FIG. 34A.

Figure 36A:
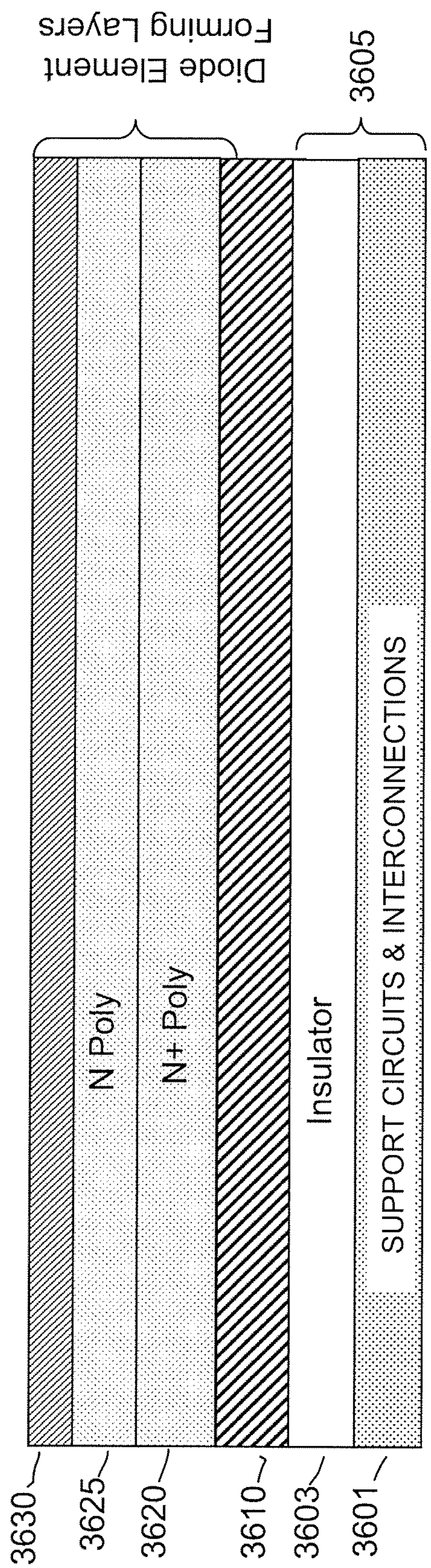
FIGS. 36A-36FF illustrate methods of fabrication for anode-on-nanotube memory cross sectional structures with vertically oriented nonvolatile nanotube switches within vertical cell boundaries illustrated in FIGS. 32A, 32B and 32C, according to some embodiments.
Figure 36A:
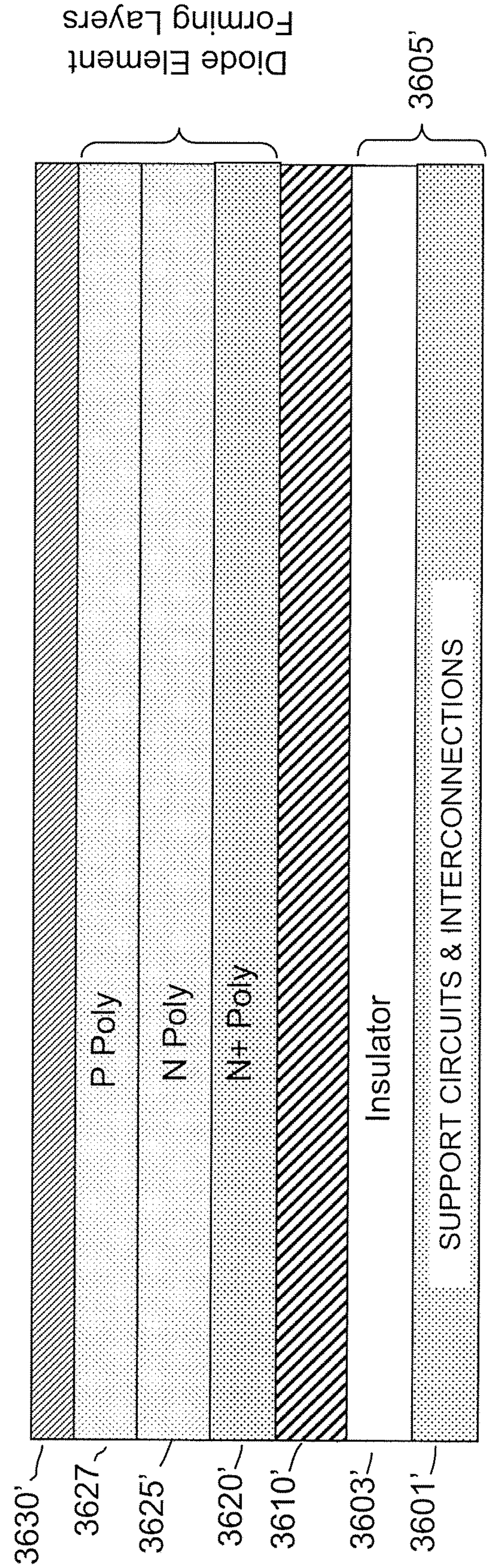
Figure 36A:
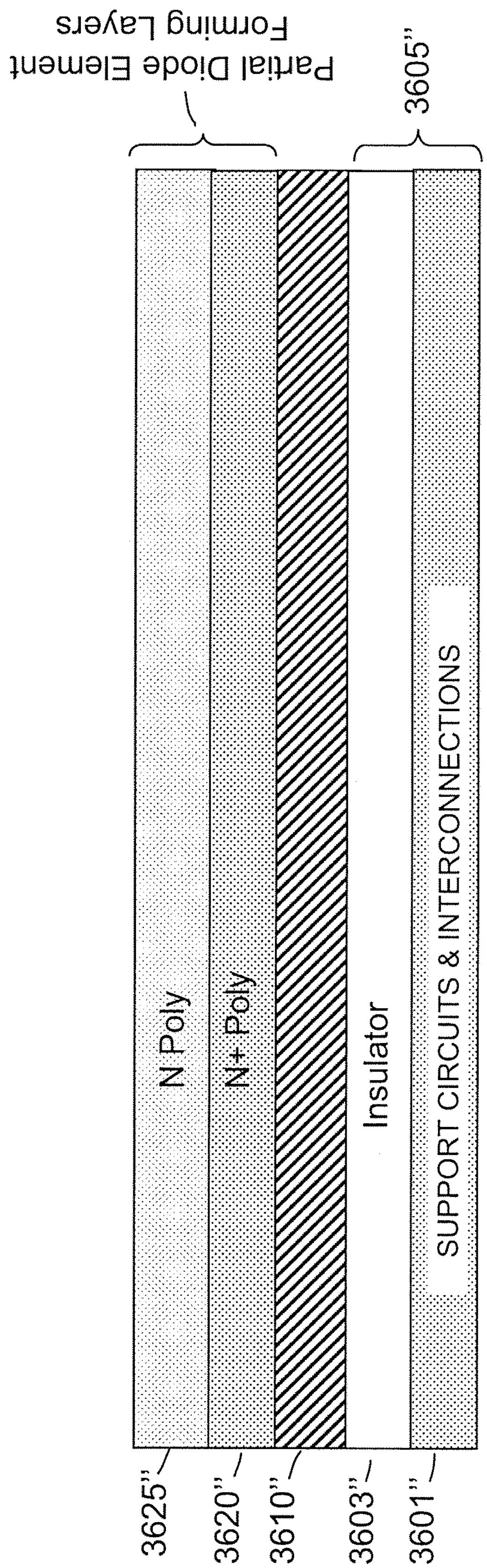

Next, methods deposit a conductor layer 3610 on the planarized surface of insulator 3603 as illustrated in FIG. 36A, typically 50 to 500 nm thick, using known industry methods. Examples of conductors layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Next, methods deposit N+ polysilicon layer 3620 on the surface of conductor layer 3610 as illustrated in FIG. 36A in order to form an ohmic contact layer. N+ polysilicon layer 3620 is typically doped with arsenic or phosphorous to $10^{20}$ dopant atoms/cm$^3$, for example, and has a thickness of 20 to 400 nm, for example.

Next, methods deposit an N polysilicon layer 3625 of thickness 10 nm to 500 nm on the surface of N+ polysilicon layer 3620. N polysilicon layer 3625 may be doped with arsenic or phosphorus in the range of $10^{14}$ to $10^{17}$ dopant atoms/cm$^3$, for example. N polysilicon layer 3625 may be used to form cathodes of Schottky diodes. In addition to doping levels, the polysilicon crystalline size (or grain structure) of N polysilicon layer 3625 may also be controlled by known industry methods of deposition. Also, known industry SOI methods of deposition may be used that result in polysilicon regions that are single crystalline (no longer polysilicon), or nearly single crystalline.

Next, methods deposit contact layer 3630 on the surface of N polysilicon layer 3625 forming a Schottky diode anode layer. Contact layer 3630 may also be used to form lower level contacts for nanotube elements as illustrated further below with respect to FIG. 36I. Contact layer 3630 may have a thickness range of 10 to 500 nm, for example. Contact layer 3630 may use similar materials to those used in forming conductor layer 3610; or contact layer 3630 material may be chosen to optimize anode material for enhanced Schottky diode properties such lower forward voltage drop and/or lower diode leakage. Anode contact layer 3630 may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used; or contact layer 3630 may be formed in layers to include conductive material for forming optimized Schottky diode characteristics on a lower layer and conductive materials to optimize ohmic contact to nanotube elements on an upper layer.

At this point in the process, remaining methods may be used to fabricate NV NT diode using Schottky diode-based anode-to-NT switch structures such as those illustrated in FIG. 31A. However, as described further above with respect to FIG. 31B for example, NV NT diodes may be formed using PN diodes instead of Schottky diodes. Therefore, alternatively, a PN diode alternative fabrication method is illustrated in FIG. 34A'.

Methods 3000 described further above, and with respect to FIG. 36A, may also be used to describe the fabrication of FIG. 36A'. Support circuits and interconnections 3601' illustrated in FIG. 36A' correspond to support circuits and interconnections 3601 illustrated in FIG. 36A, except for possible small changes that may be introduced in individual circuits to accommodate differences in diode characteristics such as turn-on voltage, for example, between Schottky diodes and PN diodes.

Next, methods deposit planarized insulator 3603' on the surface of support circuits and interconnections 3601' as illustrated in FIG. 36A'. Planarized insulator 3603' corresponds to planarized insulator 3603 except for possible small changes that may be introduced in insulator 3603' to accommodate differences in diode characteristics. Memory support structure 3605' is therefore similar to support structures 3605 except for small changes that may be introduced in support circuits and interconnections 3601' and planarized insulator 3603' as described further above with respect to FIG. 36A'.

Next, methods deposit conductor layer 3610' in contact with the surface of planarized insulator 3603' as illustrated in FIG. 36A' which can be similar in thickness and materials to conductor layer 3610 described further above with respect to FIG. 36A.

Next, methods deposit N+ polysilicon layer 3620' on the surface of conductor layer 3610' as illustrated in FIG. 36A' in order to form an ohmic contact layer. N+ polysilicon layer 3620' is typically doped with arsenic or phosphorous to $10^{20}$ dopant atoms/cm$^3$, for example, and has a thickness of 20 to 400 nm, for example.

Next, methods deposit an N polysilicon layer 3625' of thickness 10 nm to 500 nm on the surface of N+ polysilicon layer 3620'. N polysilicon layer 3625' may be doped with arsenic or phosphorus in the range of $10^{14}$ to $10^{17}$ dopant atoms/cm$^3$, for example. N polysilicon layer 3625' may be used to form cathodes of Schottky diodes. In addition to doping levels, the polysilicon crystalline size (or grain structure) of N polysilicon layer 3625' may also be controlled by known industry methods of deposition. Also, known industry SOI methods of deposition may be used that result in polysilicon regions that are single crystalline (no longer polysilicon), or nearly single crystalline.

Next, methods deposit a P polysilicon layer 3627 of thickness 10 nm to 500 nm on the surface of N polysilicon layer 3625' as illustrated in FIG. 36A'. P polysilicon layer 3627 may be doped with boron in the range of $10^{14}$ to $10^{17}$ dopant atoms/cm$^3$, for example. P polysilicon layer 3627 may be used to form anodes of PN diodes. In addition to doping levels, the polysilicon crystalline size of P Polysilicon layer 3627 may also be controlled by known industry methods of deposition. Also, known industry SOI methods of deposition may be used that result in polysilicon regions that are single crystalline (no longer polysilicon), or nearly single crystalline.

Next, methods deposit contact layer 3630' on the surface of P polysilicon layer 3627 forming an ohmic contact between contact layer 3630' and P polysilicon layer 3627. Contact layer 3630' may also be used to form lower level contacts for nanotube elements as illustrated further below with respect to FIG. 36I.

At this point in the process, remaining methods may be used to fabricate NV NT diode using PN diode-based anode-to-NT switch structures such as those illustrated in FIG. 31B. However, as described further above with respect to FIG. 31C for example, NV NT diodes may be formed using both Schottky diodes and PN diodes in parallel. Therefore, alternatively, a combined parallel Schottky diode and PN diode alternative fabrication method is illustrated in FIG. 34A".

Methods 3000 described further above, and with respect to FIG. 36A, may also be used to describe the fabrication of FIG. 36A". Support circuits and interconnections 3601" illustrated in FIG. 36A" correspond to support circuits and interconnections 3601 illustrated in FIG. 36A, except for possible small changes that may be introduced in individual circuits to accommodate differences in diode characteristics such as turn-on voltage, for example, between Schottky diodes and combined parallel Schottky diode and PN diodes.

Next, methods deposit conductor layer 3610" in contact with the surface of planarized insulator 3603" as illustrated in FIG. 36A" which is similar in thickness and materials to conductor layer 3610 described further above with respect to FIG. 36A.

Next, methods deposit N+ polysilicon layer 3620" on the surface of conductor layer 3610" as illustrated in FIG. 36A" in order to form an ohmic contact layer. N+ polysilicon layer 3620" is typically doped with arsenic or phosphorous to $10^{20}$ dopant atoms/cm$^3$, for example, and has a thickness of 20 to 400 nm, for example.

Next, methods deposit an N polysilicon layer 3625" of thickness 10 nm to 500 nm on the surface of N+ polysilicon layer 3620". N polysilicon layer 3625" may be doped with arsenic or phosphorus in the range of $10^{14}$ to $10^{17}$ dopant atoms/cm$^3$, for example. N polysilicon layer 3625" may be used to form cathodes of both Schottky diodes and PN diodes in parallel. In addition to doping levels, the polysilicon crystalline size (or grain structure) of N polysilicon layer 3625" may also be controlled by known industry methods of deposition. Also, known industry SOI methods of deposition may be used that result in polysilicon regions that are single crystalline (no longer polysilicon), or nearly single crystalline.

At this point in the process, remaining methods may be used to fabricate NV NT diodes using Schottky diodes and PN diode in parallel to form anode-to-NT switch structures such as those illustrated in FIG. 31C. Schottky diodes and PN diodes in parallel may be formed as illustrated further below with respect to FIG. 36I if contact layer 3630 is omitted from the structure.

Schottky diodes and PN diodes in parallel are formed because a nanotube element such as nanotube element 3645 illustrated further below with respect to FIG. 36I, if contact layer 3630 is omitted from the structure, would be in contact with N poly layer 3625. P-type semiconductor nanotube elements, a subset of NT elements 3645, would be in physical and electrical contact with N polysilicon layer 3625, and would form PN diode-anodes and N polysilicon layer 3625 form cathodes that together form PN diodes. Metallic type nanotube elements, also a subset of NT elements 3645, would also be in physical and electrical contact with N polysilicon layer 3625, and would form Schottky diode-anodes and N polysilicon layer 3625 would form cathodes for Schottky diodes having Schottky diode junctions as part of combined PN and Schottky diode junctions in parallel.

Descriptions of methods of fabrication continue with respect to Schottky-diode based structures described with respect to FIG. 36A to form NV NT diode cell structures corresponding to cross section 3100 illustrated in FIG. 31A. However, these methods of fabrication may also be applied to the PN diode-based structures described with respect to FIG. 36A' to form NV NT diode cell structures corresponding to cross section 3100' illustrated in FIG. 31B. Also, these methods of fabrication may also be applied to structures with respect to FIG. 36A" to form NV NT diode cell structure corresponding to cross section 3100" illustrated in FIG. 31C.

Figure 36B:
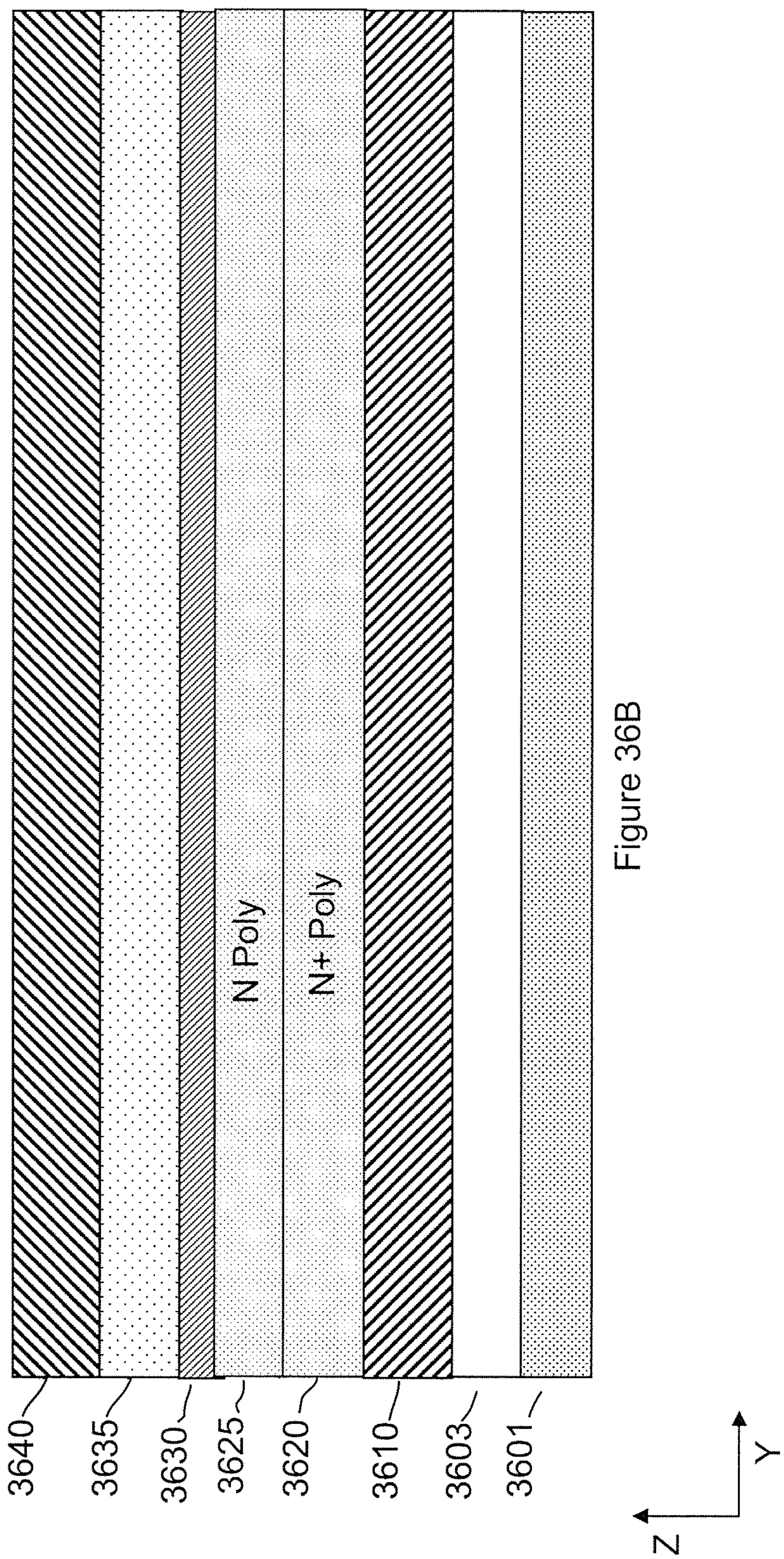

At this point in process, fabrication continues by using methods to deposit an insulator layer 3635 on contact layer 3630 as illustrated in FIG. 36B. The thickness of insulator layer 3635 may be well controlled and used to determine the channel length of vertically oriented nonvolatile nanotube switches as illustrated further below with respect to FIG. 36I. The thickness of insulator layer 3635 may vary in thickness from less than 5 nm to greater than 250 nm, for example. Insulator 3635 may be formed from any appropriate known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. U.S. patent application Ser. No. 11/280,786 includes some examples of various dielectric materials.

Next, methods deposit contact layer 3640 on insulator layer 3635 as illustrated in FIG. 36B. Contact layer 3640 may be in the range of 10 to 500 nm thick, for example, and may be formed using various conductor materials similar to materials described with respect to contact 3630 described further above.

Figure 36C:
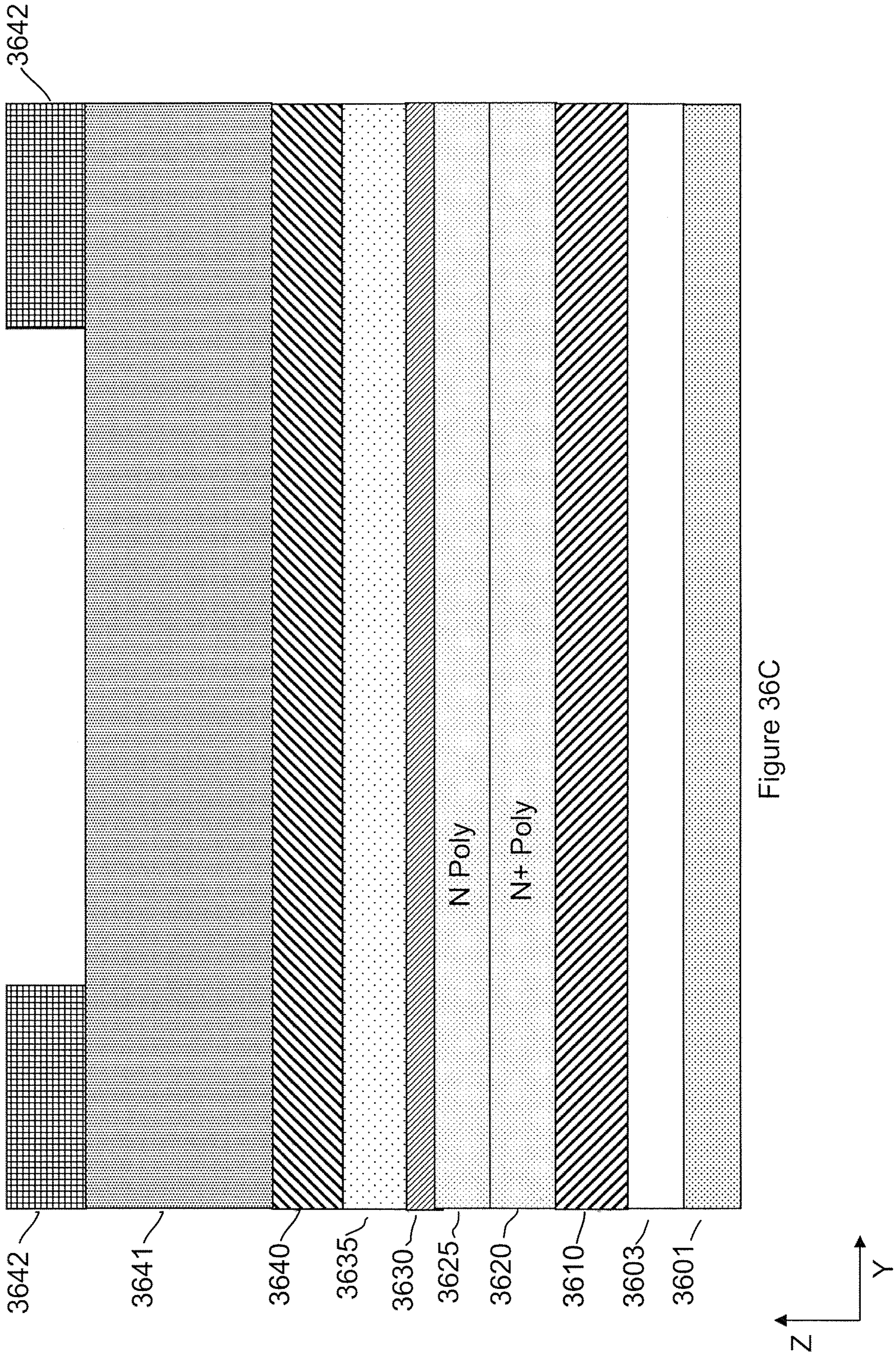

Next methods deposit sacrificial layer 3641 on contact layer 3640 as illustrated in FIG. 36C. Sacrificial layer 3641 may be in the range of 10 to 500 nm thick and be formed using conductor, semiconductor, or insulator materials such as materials described further above with respect to contact layer 3630, semiconductor layers 3620 and 3625, and insulator layer 3635.

Next, methods deposit and pattern a masking layer such as masking layer 3642 deposited on the top surface of sacrificial layer 3641 as illustrated in FIG. 36C using known industry methods. The mask opening may be aligned to alignment marks in planar insulating layer 3603 for example; the alignment is not critical.

Figure 36D:
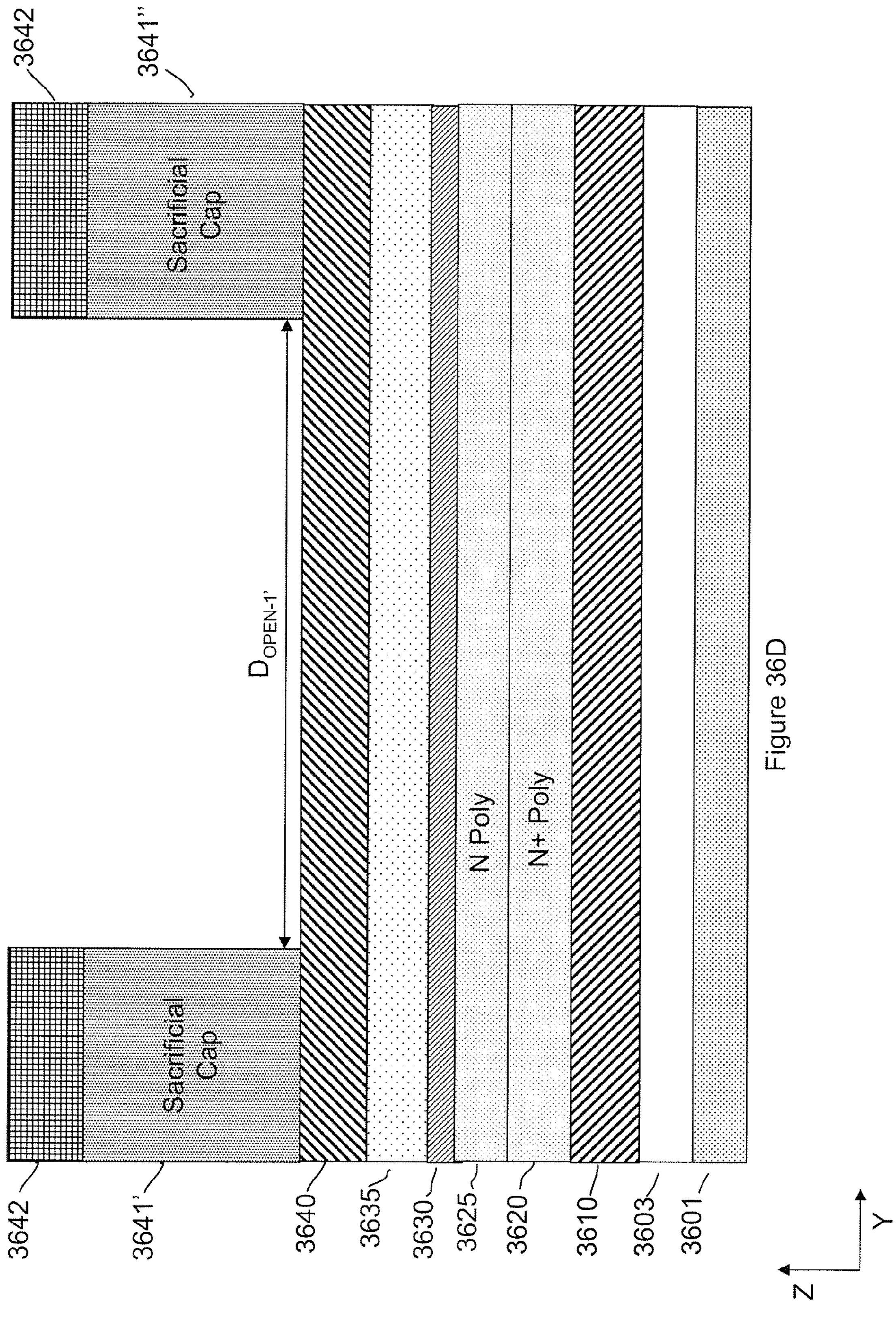

Then, methods directionally etch sacrificial layer 3641 to form an opening of dimension $D_{OPEN\text{-}1'}$ in the Y direction through sacrificial layer 3641 stopping at the surface of contact layer 3640 using known industry methods as illustrated in FIG. 36D. Two memory cells that include vertical nanotube channel elements self aligned and positioned with respect to vertical edges of sacrificial regions 3641' and 3641" are formed as illustrated further below. The dimension $D_{OPEN\text{-}1'}$ in the Y direction is approximately 3F, where F is a minimum photolithographic dimension. For a 65 nm technology node, $D_{OPEN\text{-}1'}$ is 195 nm, which is a non-minimum and therefore non-critical dimension at any technology node. At this point in the process, sidewall spacer techniques are used to position vertical sidewalls at a distance R from the inner surfaces of sacrificial regions 3641' and 3641" as described further below.

Figure 36E:
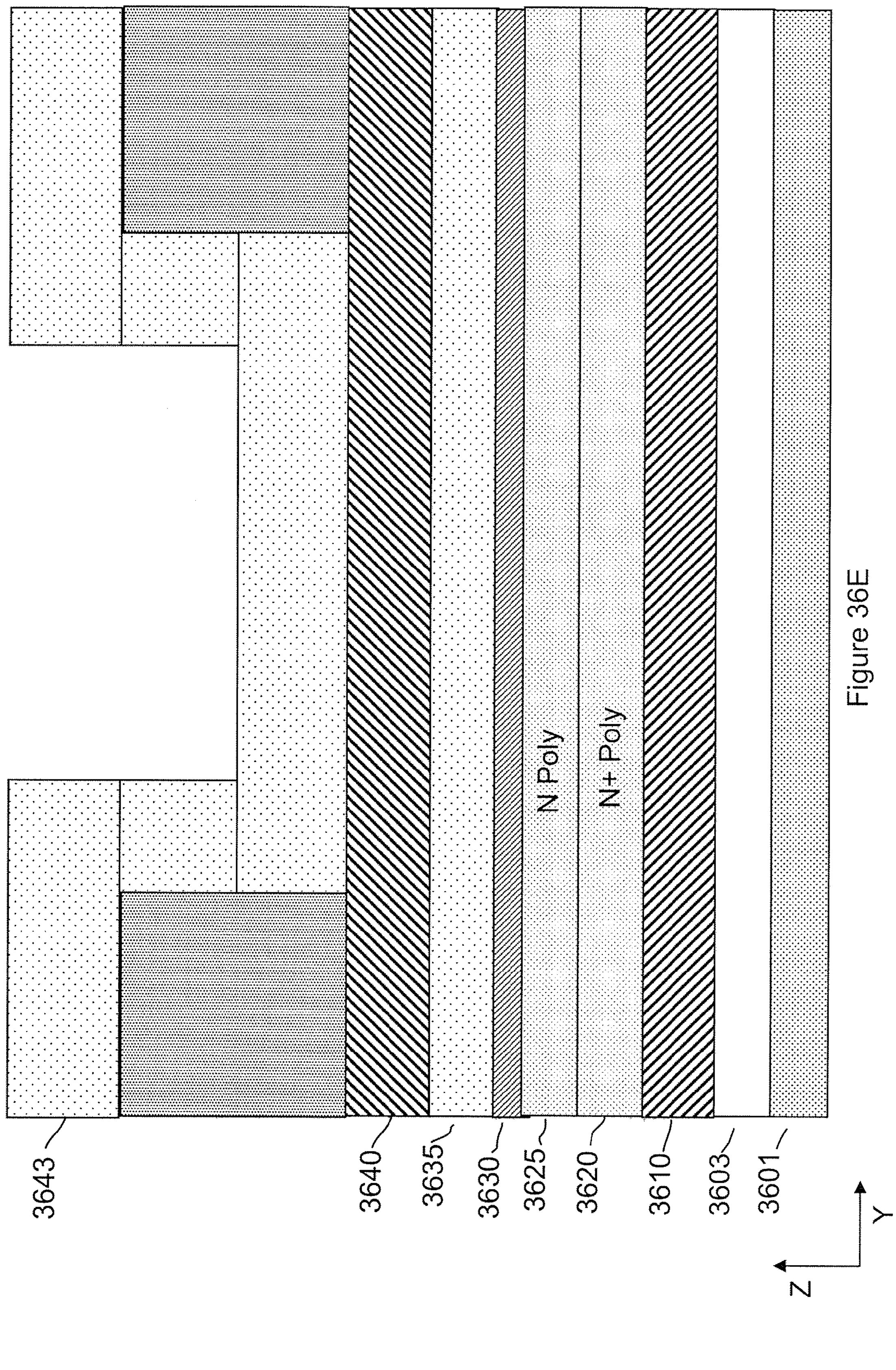

Next, methods deposit a conformal sacrificial layer 3643 as illustrated in FIG. 36E. The thickness of conformal sacrificial layer 3643 can be selected as R, which in this example is selected as approximately F/2. In this example, since R is approximately F/2, and since F is approximately 65 nm, then the thickness of conformal sacrificial layer 3643 is approximately 32.5 nm. Conformal sacrificial layer 3643 may be formed using conductor, semiconductor, or insulator materials similar to those materials used to form sacrificial layer 3641 described further above.

Figure 36F:
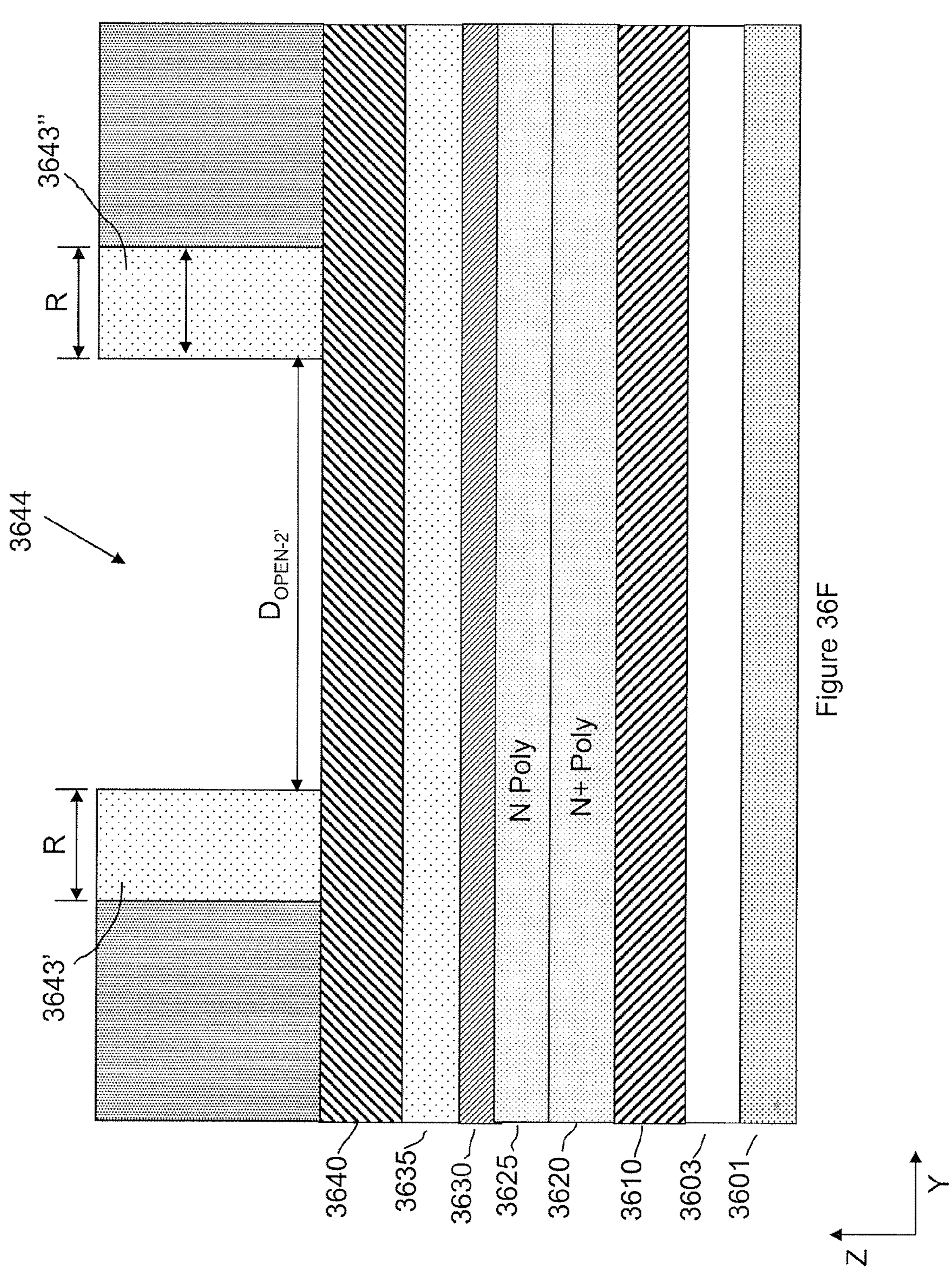

Next, methods directionally etch conformal sacrificial layer 3643 using reactive ion etch (RIE) for example, using known industry methods, forming opening 3644 of dimension $D_{OPEN\text{-}2'}$ and sacrificial regions 3643' and 3643", both having vertical sidewalls self-aligned and separated from inner vertical sidewall of sacrificial regions 3641' and 3641", respectively, by a distance R in the Y direction as illustrated in FIG. 36F. Distance R is approximately equal to F/2, or approximately 32.5 nm in this example. Dimension $D_{OPEN\text{-}2'}$ of opening 3644 is approximately 2F, or approximately 130 nm for a 65 nm technology node, a non-critical dimension.

Figure 36G:
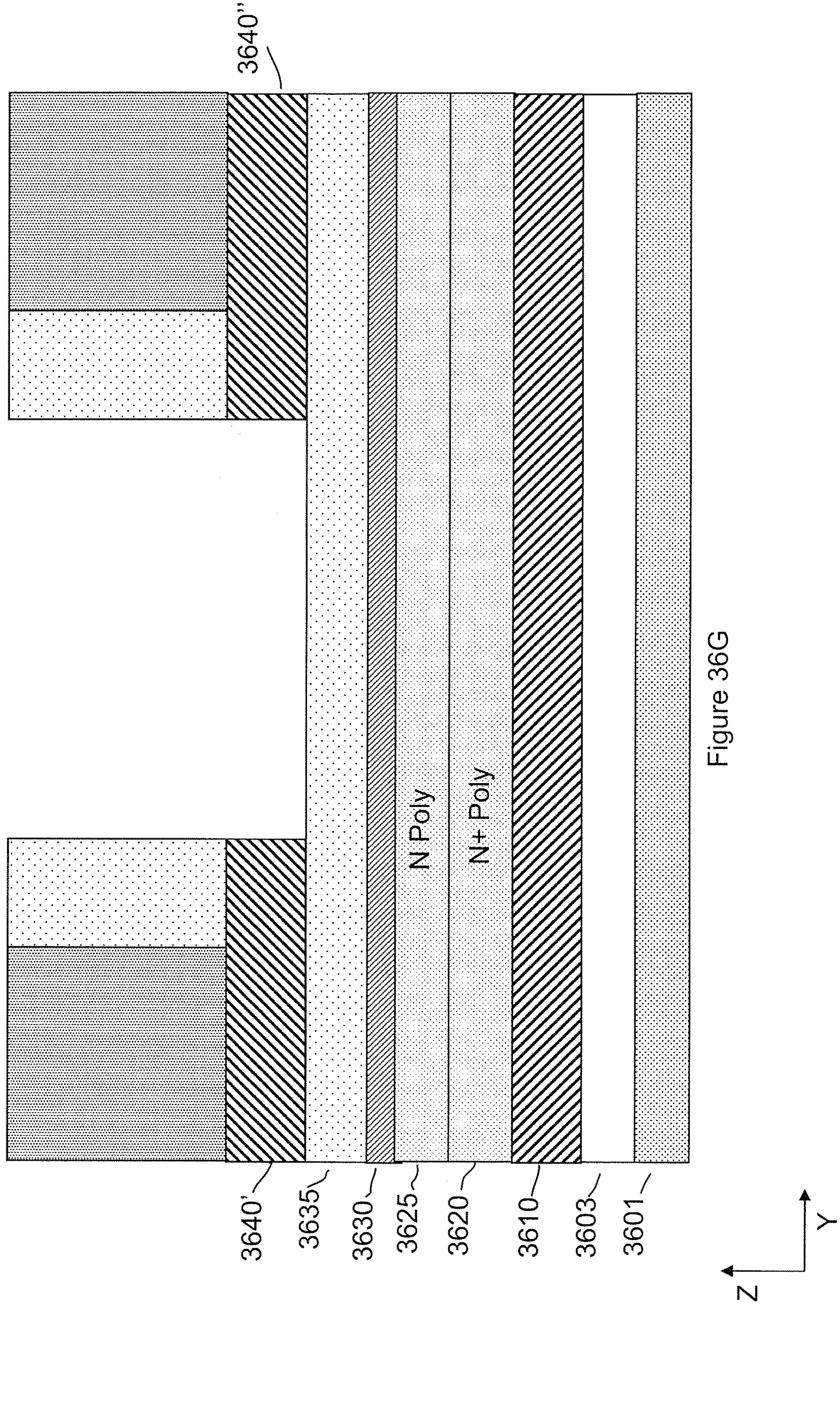

Next, methods directionally etch an opening through contact layer 3640 to the top surface of insulator layer 3635. Directional etching using RIE, for example, forms an opening of size $D_{OPEN\text{-}2'}$ of approximately 2F (130 nm in this example) in contact layer 3640, and forms sidewall contact regions 3640' and 3640" as illustrated in FIG. 36G.

Figure 36H:
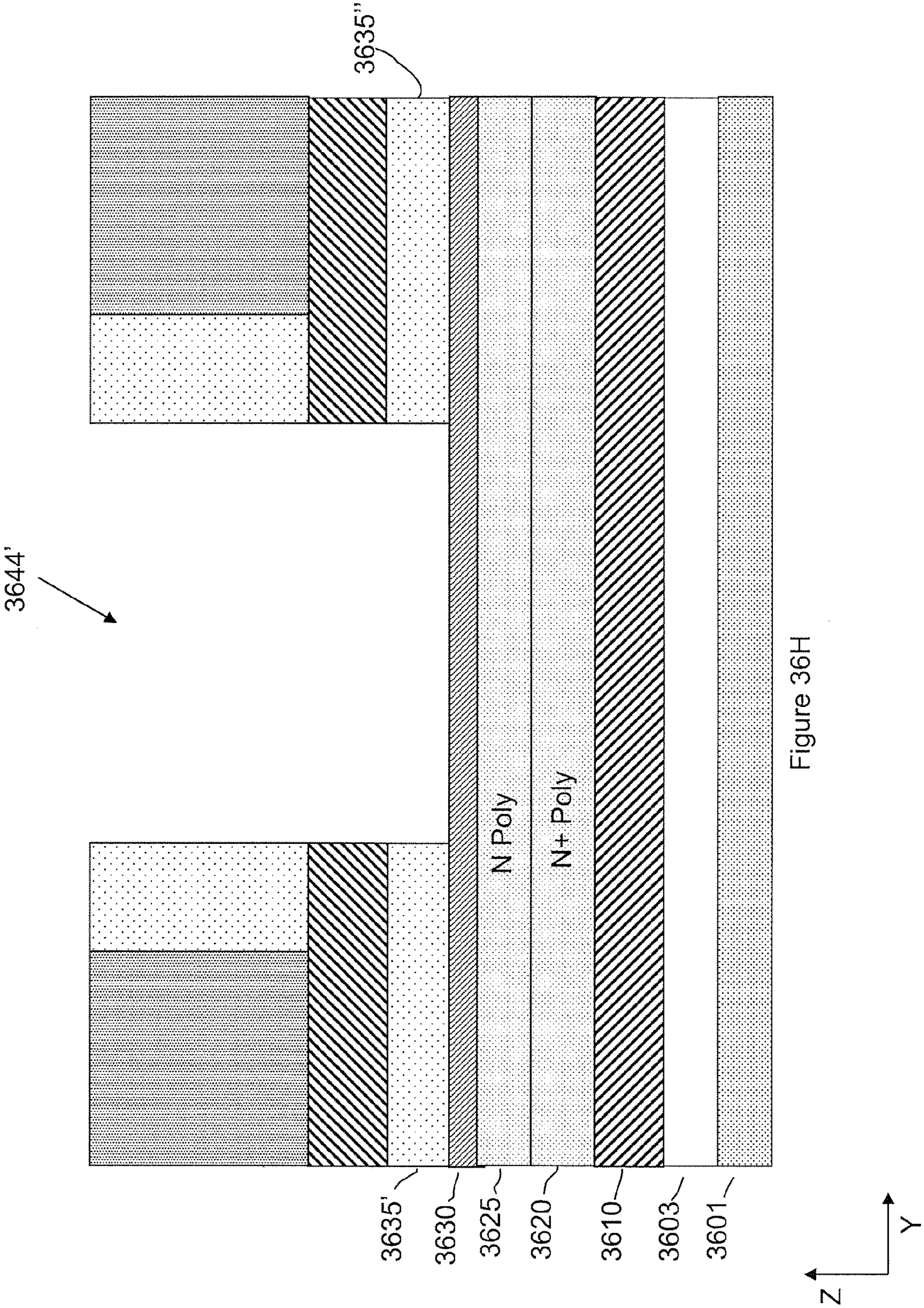

Next, methods directionally etch an opening through insulator layer 3635 to the top surface of contact layer 3630. Directional etching using RIE, for example, forms an opening 3644' of size $D_{OPEN\text{-}2'}$ of approximately 2F (130 nm in this example) in insulator layer 3635, and forms insulator regions 3635' and 3635" as illustrated in FIG. 36H.

Figure 36I:
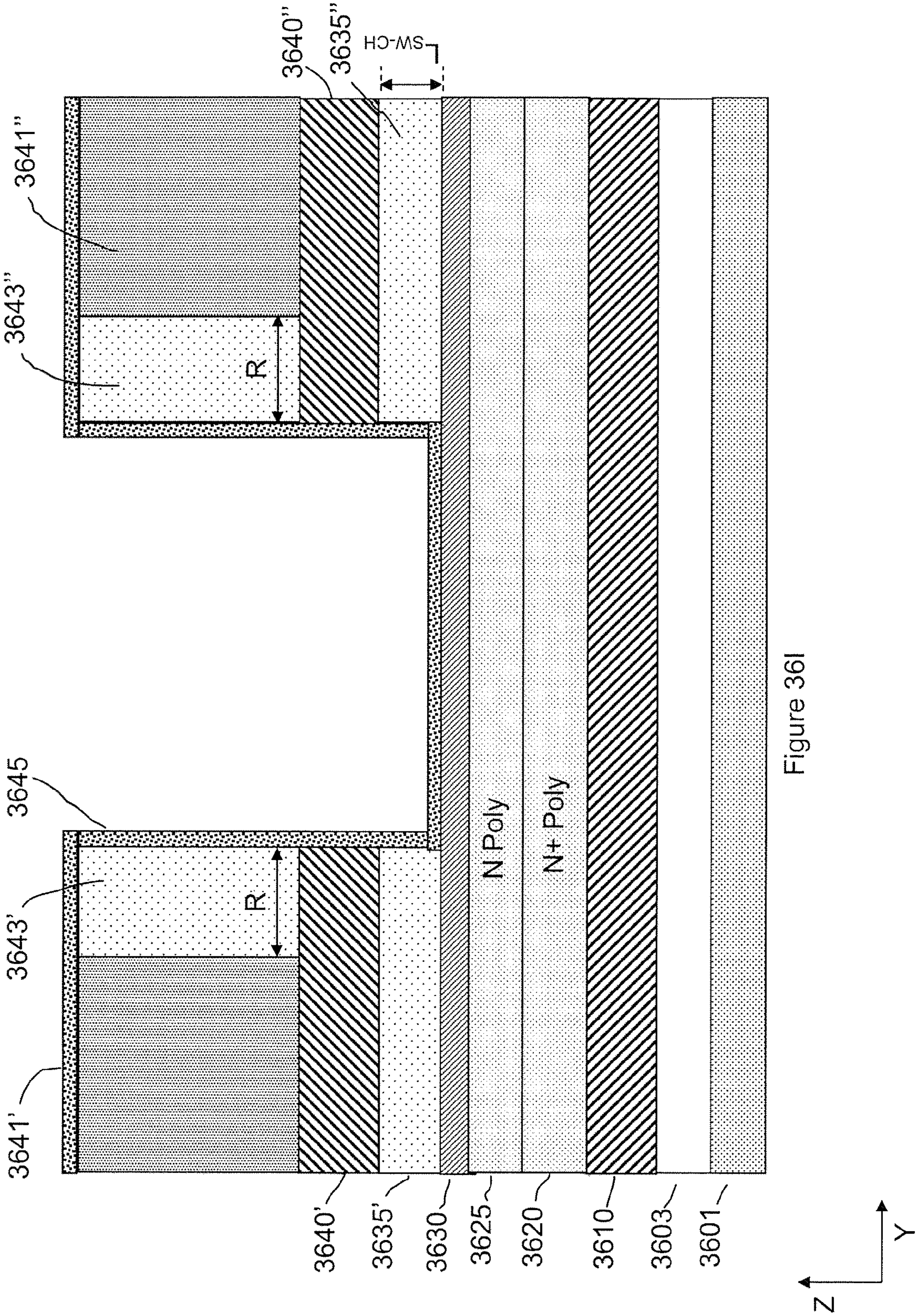

Next, methods deposit conformal nanotube element 3645 with vertical (Z) orientation on the sidewalls of opening 3644' as illustrated in FIG. 36I. The size of opening 3644' is approximately the same as the size of opening 3644. Conformal nanotube element 3645 may be 0.5 to 20 nm thick, for example, and may be fabricated as a single layer or as multiple layers using deposition methods such as spin-on and spray-on methods. Nanotube element methods of fabrication are described in greater detail in the incorporated patent references.

Since nanotube element 3645 is in contact with contact layer 3630 and the sidewalls of sidewall contact regions 3640' and 3640", separated by the thickness of insulator region 3635' and 3635", respectively, two nonvolatile nanotube switch channel regions are partially formed (channel width is not yet defined) having channel length $L_{SW\text{-}CH}$ in the Z direction corresponding to the thickness of insulator regions 3635' and 3635" in the range of 5 nm to 250 nm as illustrated in FIG. 36I. The vertical (Z-axis) portion of nanotube element 3645 is separated from the inner vertical sidewalls of sacrificial regions 3641' and 3641" by a self-aligned distance R. These partially formed vertical nonvolatile nanotube switches are similar to vertically oriented nonvolatile nanotube elements 765 and 765' of memory storage regions 760A and 760B, respectively, illustrated in FIG. 7B. Conformal nanotube element 3645 is also in contact with sacrificial regions 3643' and 3643" and sacrificial regions 3641' and 3641" as illustrated in FIG. 36I.

Figure 36J:
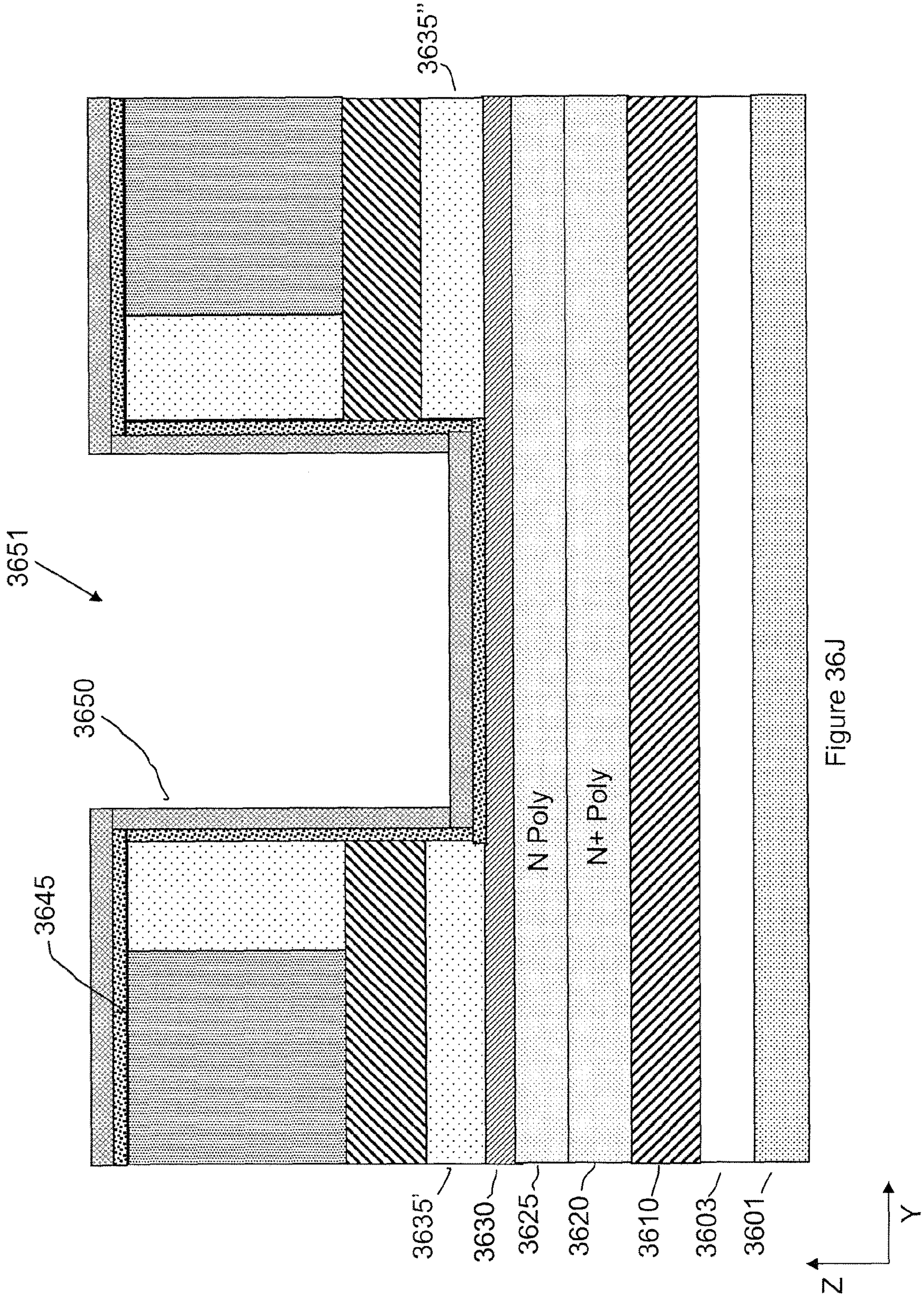

Next methods deposit conformal insulator layer 3650 on nanotube element 3645 as an insulating and protective layer and reduces opening 3644' to opening 3651 as illustrated in FIG. 36J. Opening 3651 is similar to opening 3644', except for the addition of conformal insulator 3650 and conformal nanotube element 3645. Conformal insulator 3650 may be 5 to 200 nm thick, for example, and may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Insulator 3650 is deposited to a thickness sufficient to ensure protection of nanotube element 3645 from high density plasma (HDP) deposition.

At this point in the process, it is desirable to partially fill opening 3651 by increasing the thickness of the bottom portion of insulator 3650 in the vertical (Z direction) on horizontal surfaces with little or no thickness increase on the sidewalls (vertical surfaces) of insulator 3650 as described above. The thickness of the additional dielectric material is not critical. The additional dielectric material may be the same as that of conformal insulator 3650 or may be a different dielectric material. Dielectric material selection with respect to nanotube elements is described in greater detail in U.S. patent application Ser. No. 11/280,786.

Figure 36K:
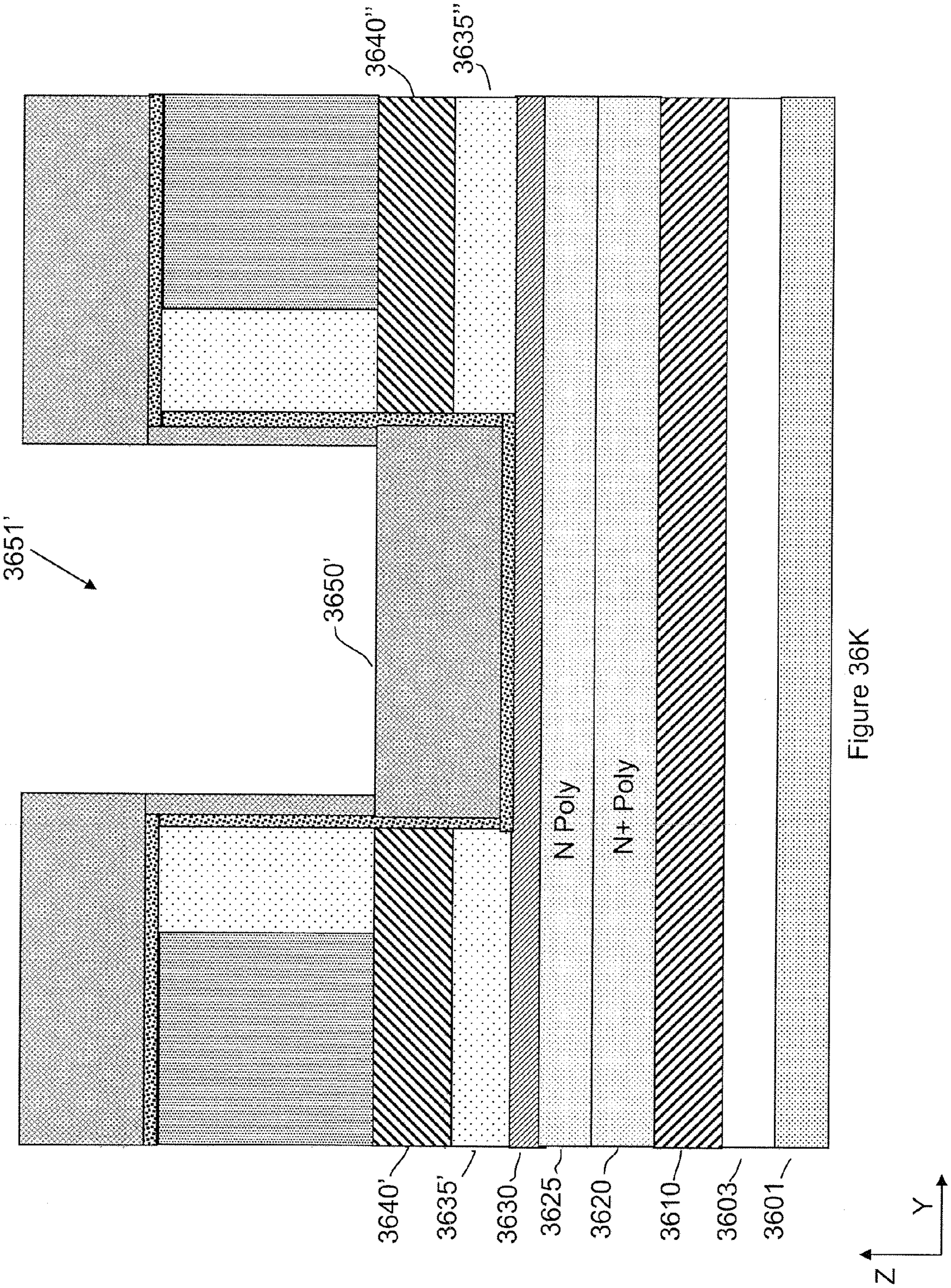

Next, methods directionally deposit an insulator material in opening 3651 using known industry methods such as directional HDP insulator deposition and increase insulator thickness primarily on horizontal surfaces as illustrated by insulator 3650' in opening 3651 and on top surfaces in FIG. 36K, forming opening 3651'.

Figure 36L:
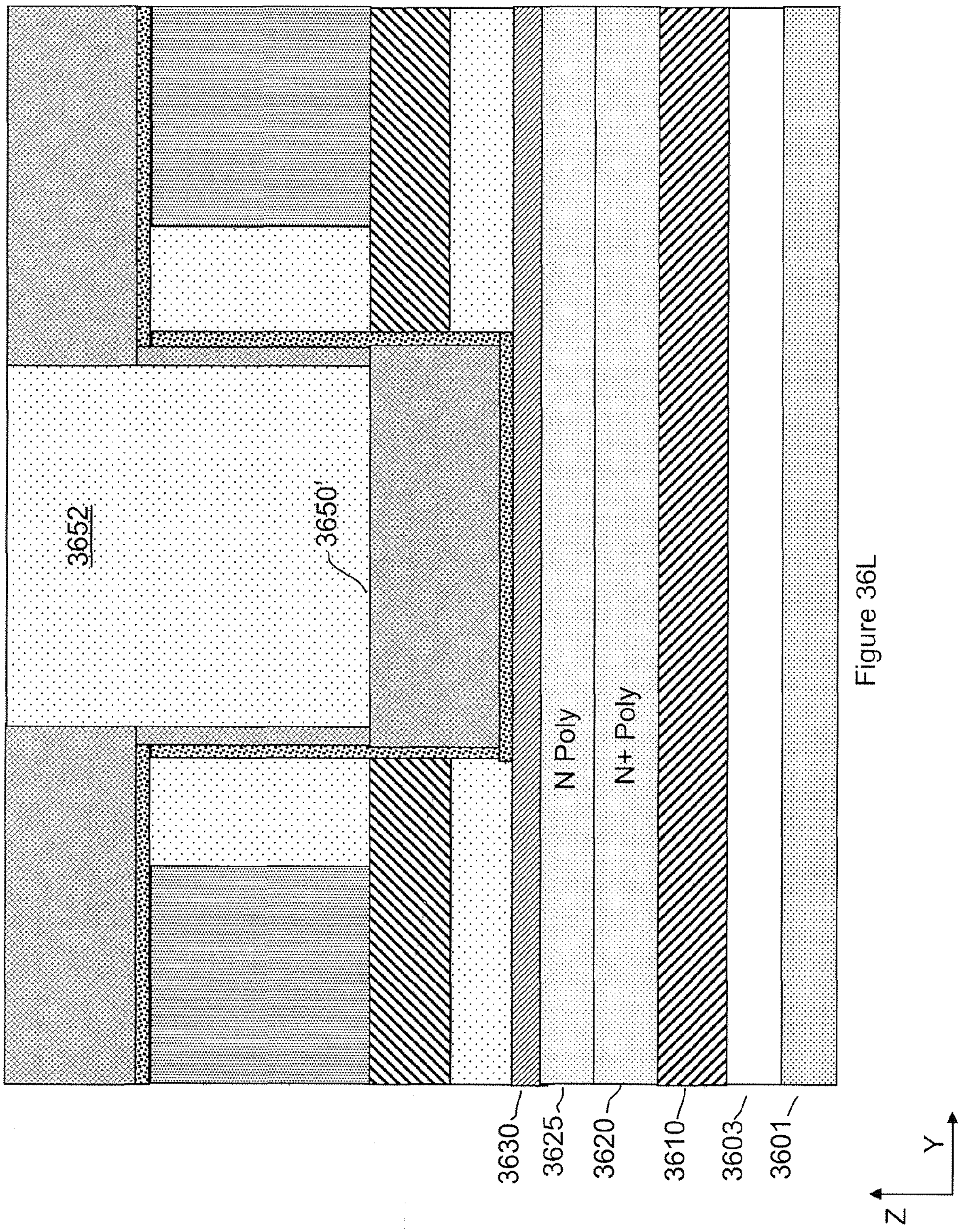

Next, methods deposit and planarize an insulator 3652 such as TEOS filling opening 3651' as illustrated in FIG. 36L.

Figure 36M:
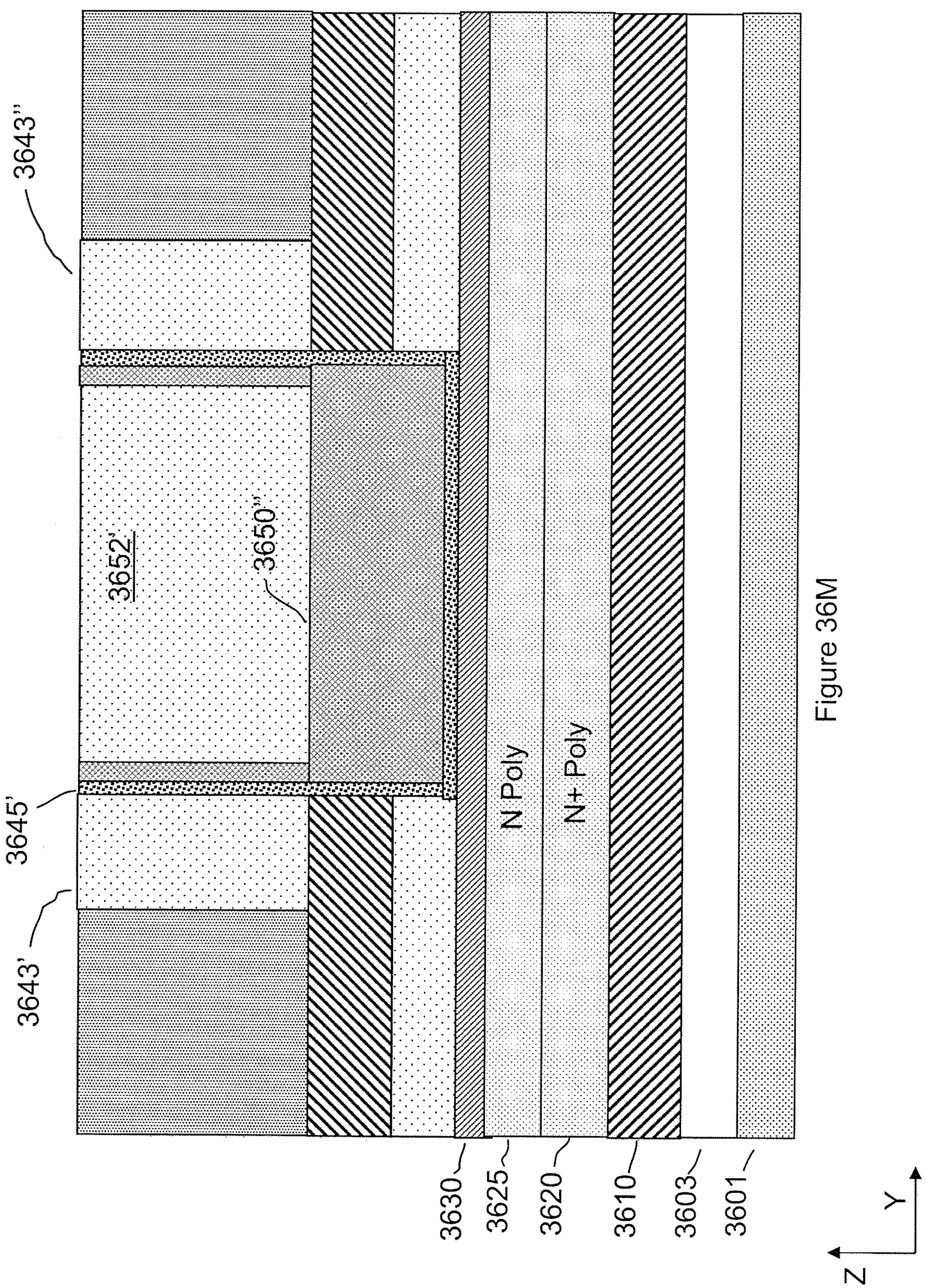

Next, methods planarize the structure illustrated in FIG. 36L in order to remove the top portion of insulator 3650' and the top portion of underlying nanotube element 3645 as illustrated in FIG. 36M. The top of sacrificial regions 3641', 3641", 3643', and 3643" may be used as CMP etch stop reference layers. Insulator 3650" is the same as insulator 3650' except that the top horizontal layer has been removed. Nanotube element 3645' is the same as nanotube element 3645 except that the top horizontal layer has been removed. Insulator 3652' is the same as insulator 3652 except that insulator thickness has been reduced.

Figure 36N:
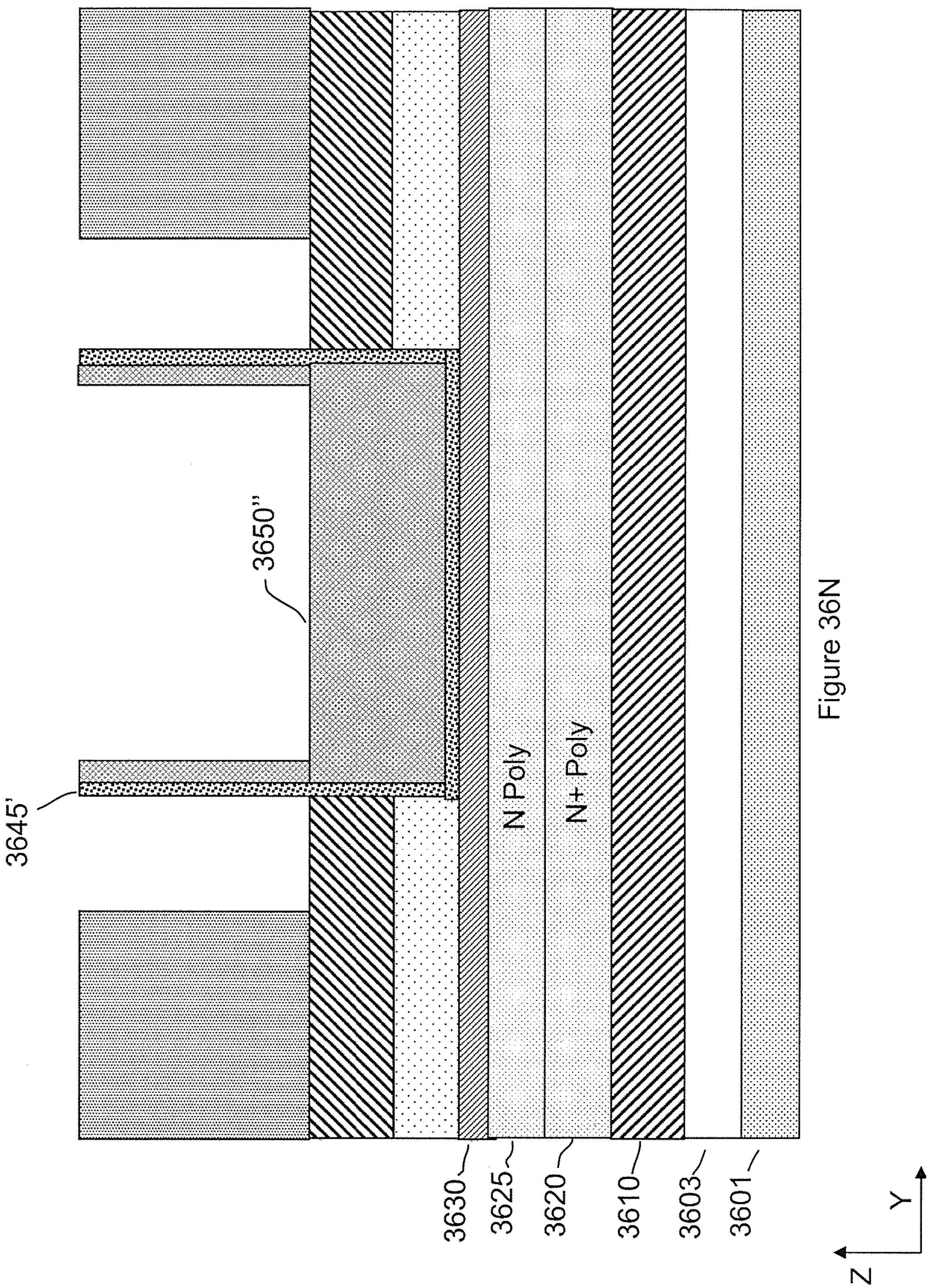

Next, methods etch (remove) sacrificial regions 3643' and 3643" and insulator 3652'. Exposed vertical sidewalls of nanotube element 3645' and conformal insulator 3650" remain as illustrated in FIG. 36N.

Figure 36O:
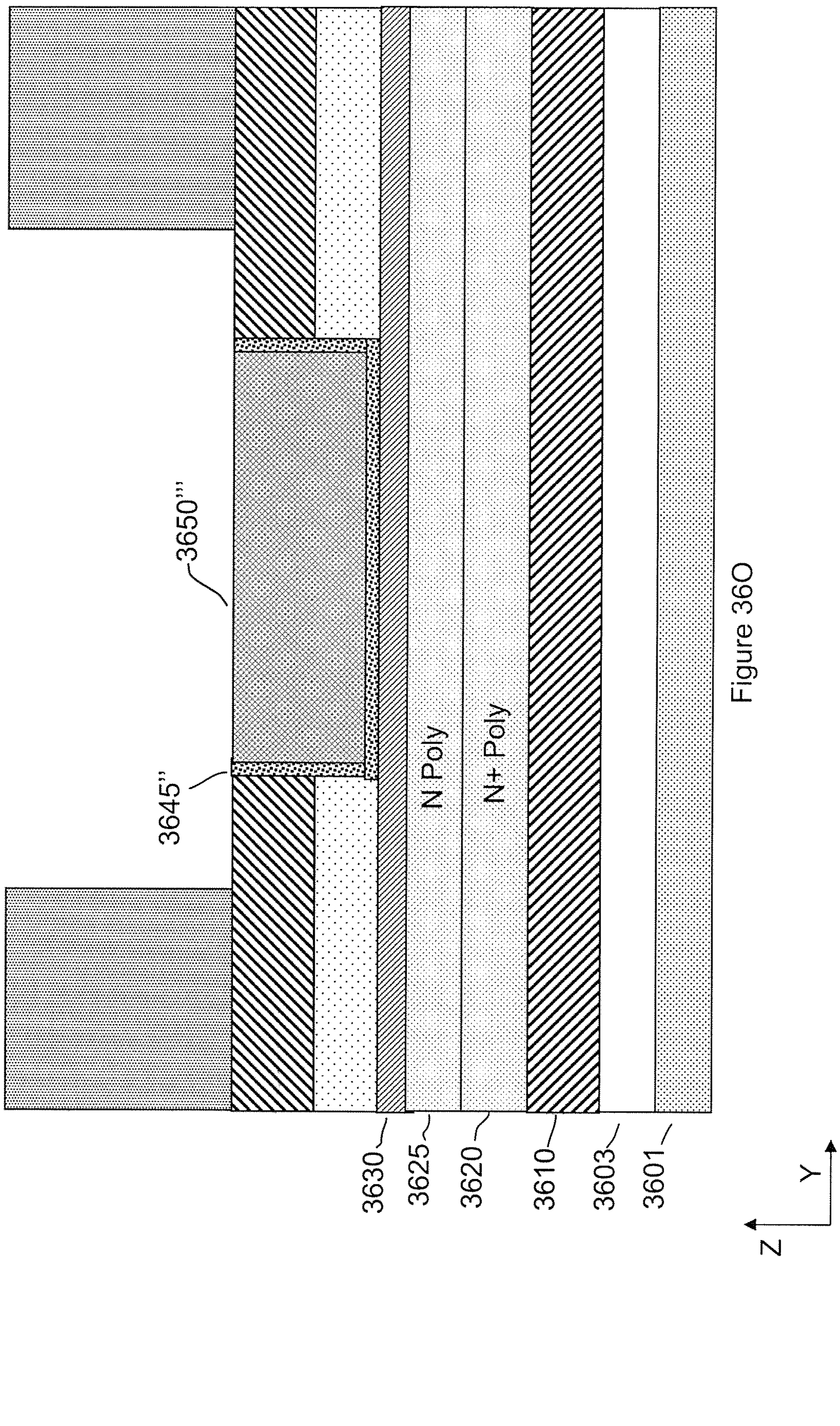

Next, methods etch (remove) the exposed portion of nanotube element 3645' forming nanotube element 3645" as illustrated in FIG. 36O. Methods of forming nanotube elements are described in greater detail in the incorporated patent references.

Then, methods such as isotropic etch remove exposed portions of insulator 3650' to form insulator 3650'" as illustrated in FIG. 36O.

At this point in the process, sidewall spacer methods are applied as illustrated further below to form self aligned sacrificial regions to be replaced further along in the fabrication process as illustrated further below by a conductor material to form the upper portion of nanotube element contacts and also to define self aligned trench regions to be used to define self-aligned cell dimensions along the Y direction as also illustrated further below. Using sidewall spacer methods to form self aligned structures without requiring masking and alignment can result in cell areas of reduced size.

Figure 36P:
Figure 36Q:
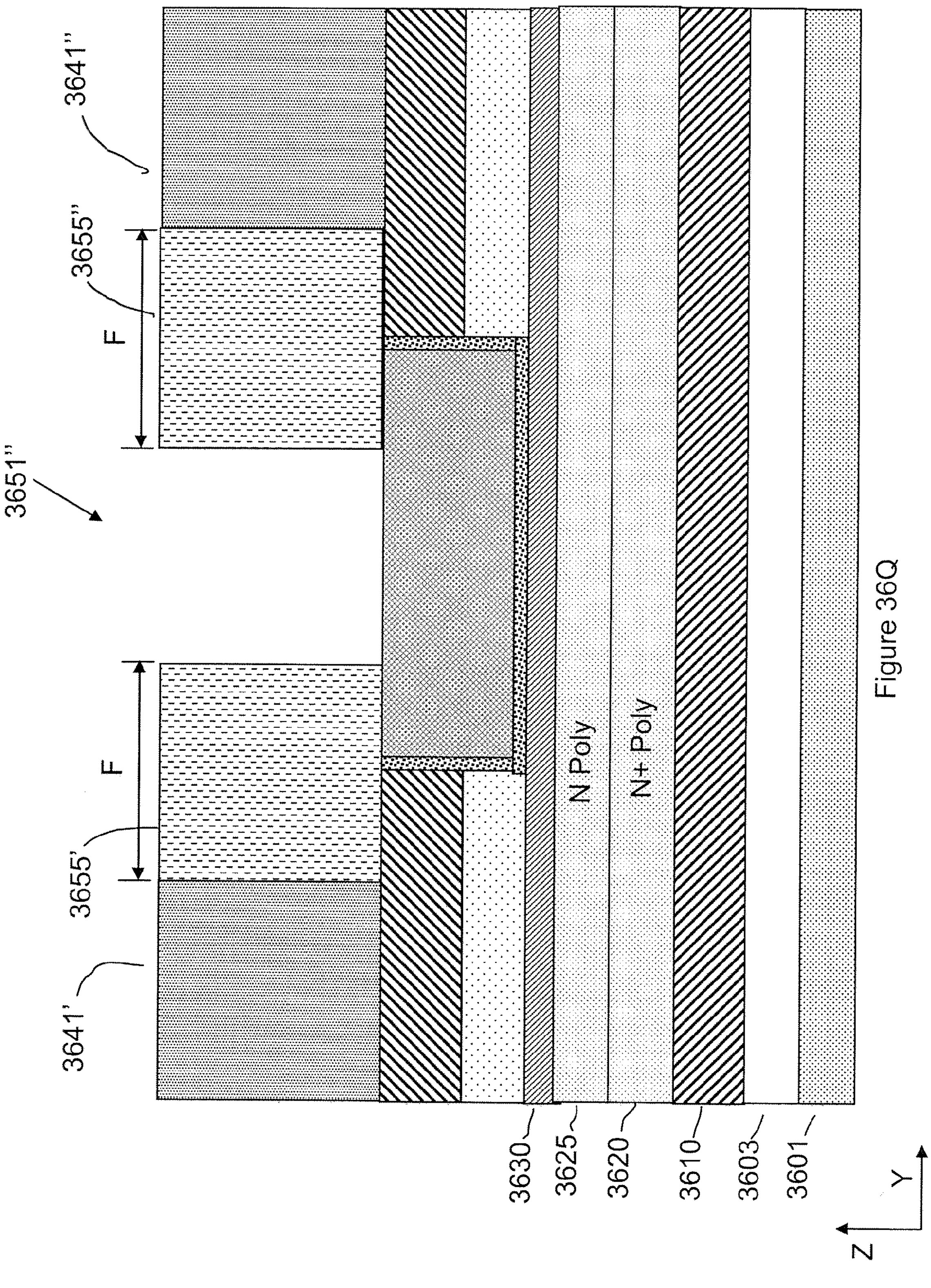

In this example, with respect to FIGS. 36P and 36Q, a self aligned sacrificial region of X dimension F is formed using methods similar to those used in FIGS. 36E and 36F. Next, methods deposit a conformal sacrificial layer 3655 as illustrated in FIG. 36P. The thickness of conformal sacrificial layer 3655 is selected as F. In this example, since F is approximately 65 nm, then the thickness of conformal sacrificial layer 3655 is approximately 65 nm. Conformal sacrificial layer 3655 may be formed using conductor, semiconductor, or insulator materials similar to those materials used to form sacrificial layers 3641 and 3643 described further above.

Next, methods directionally etch conformal sacrificial layer 3655 using reactive ion etch (RIE) for example, using known industry methods, forming opening 3651" of dimension approximately F, which in this example is approximately 65 nm as illustrated in FIG. 36Q. The inner sidewalls of opening 3651" are self-aligned to the inner walls of sacrificial regions 3641' and 3641" and separated by a distance of approximately F. These inner walls will be used as illustrated further below to form one side of an upper portion of a nanotube contact region and define one side of a cell in the Y direction.

Figure 36R:
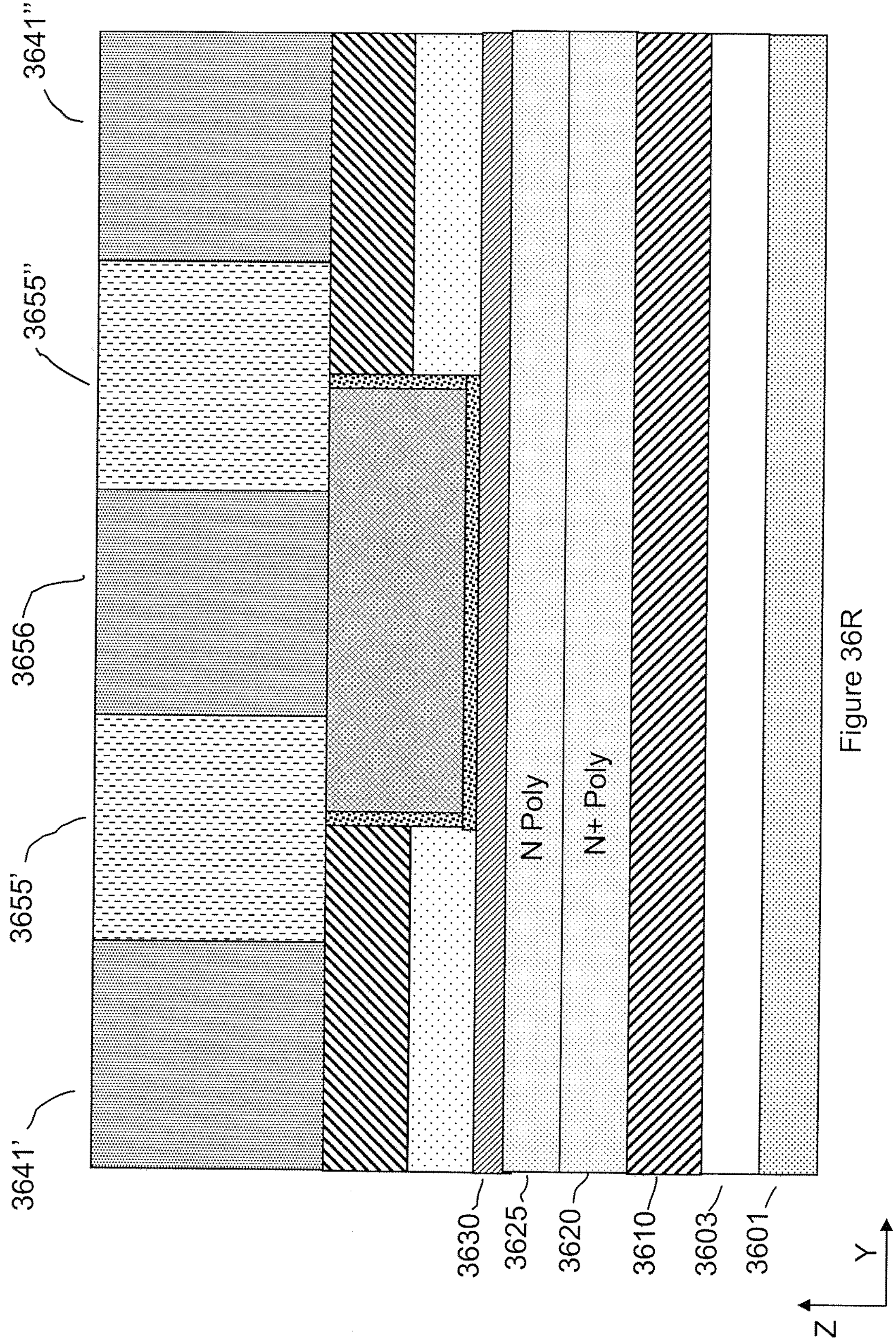

Next, methods deposit and planarized a sacrificial layer to form sacrificial region 3656 coplanar with sacrificial regions 3655', 3655", 3641', and 3641" as illustrated in FIG. 36R.

Figure 36S:
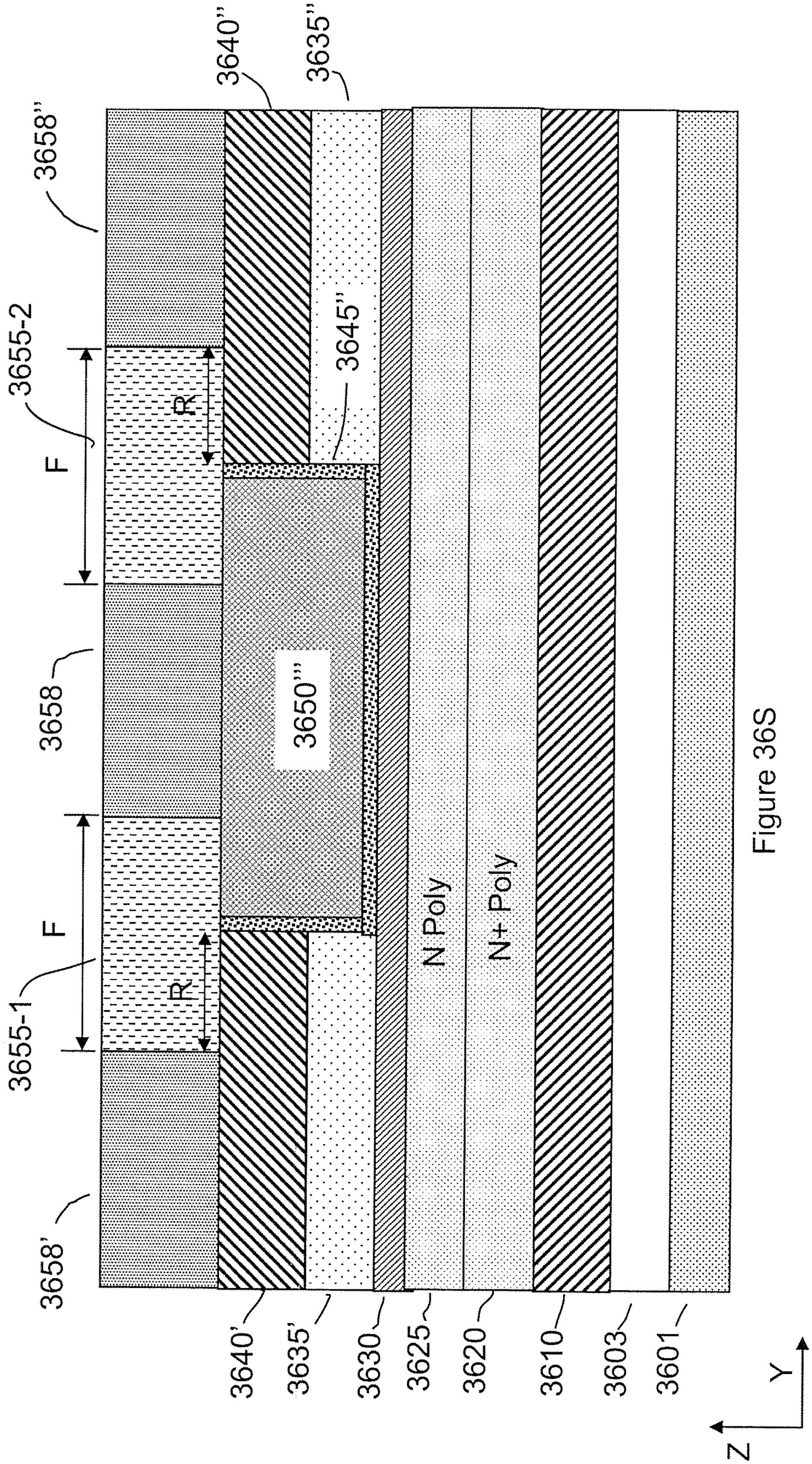

Next, methods apply CMP etching to reduce the thickness of sacrificial region 3656 to form sacrificial region 3658; the thickness of sacrificial regions 3655' and 3655" to form sacrificial regions 3655-1 and 3655-2, respectively; and the thickness of sacrificial regions 3641' and 3641" to form sacrificial regions 3658' and 3658", respectively as illustrated in FIG. 36S. Coplanar sacrificial regions 3658, 3658', 3658", 3655-1, and 3655-2 have thickness values in the range of 10 nm 200 nm, for example.

At this point in the process, sacrificial regions 3655-1 and 3655-2 may be used as masking layers for directional etching of trenches using methods that define outer cell dimensions along the Y direction for 3D cells using one NV NT diode with cathode-to-nanotube connection. Trench 3659 is formed first and then filled with an insulator and planarized. Then, trenches 3659', and 3659" are formed simultaneously and then filled and planarized as illustrated further below. Other corresponding trenches (not shown) are also etched when forming the memory array structure. Exemplary method steps that may be used to form trench regions 3659, 3659', and 3659" and then fill the trenches to form insulating trench regions are described further below.

Sacrificial regions 3658' and 3658" that define the location of trench regions 3659' and 3659" that are formed as described further below may be blocked with a sacrificial noncritical masking layer (not shown), while methods form trench 3659 using known directional selective etch methods such as reactive ion etch (RIE). Trench 3659 forms a first of two opposite vertical sidewalls in the Y direction defining one side of NV NT diode cells. Alternatively, sacrificial region 3658 that defines the location of trench region 3659 that is formed further below may be etched selective to sacrificial regions 3658' and 3658" without requiring a noncritical masking layer.

Figure 36T:
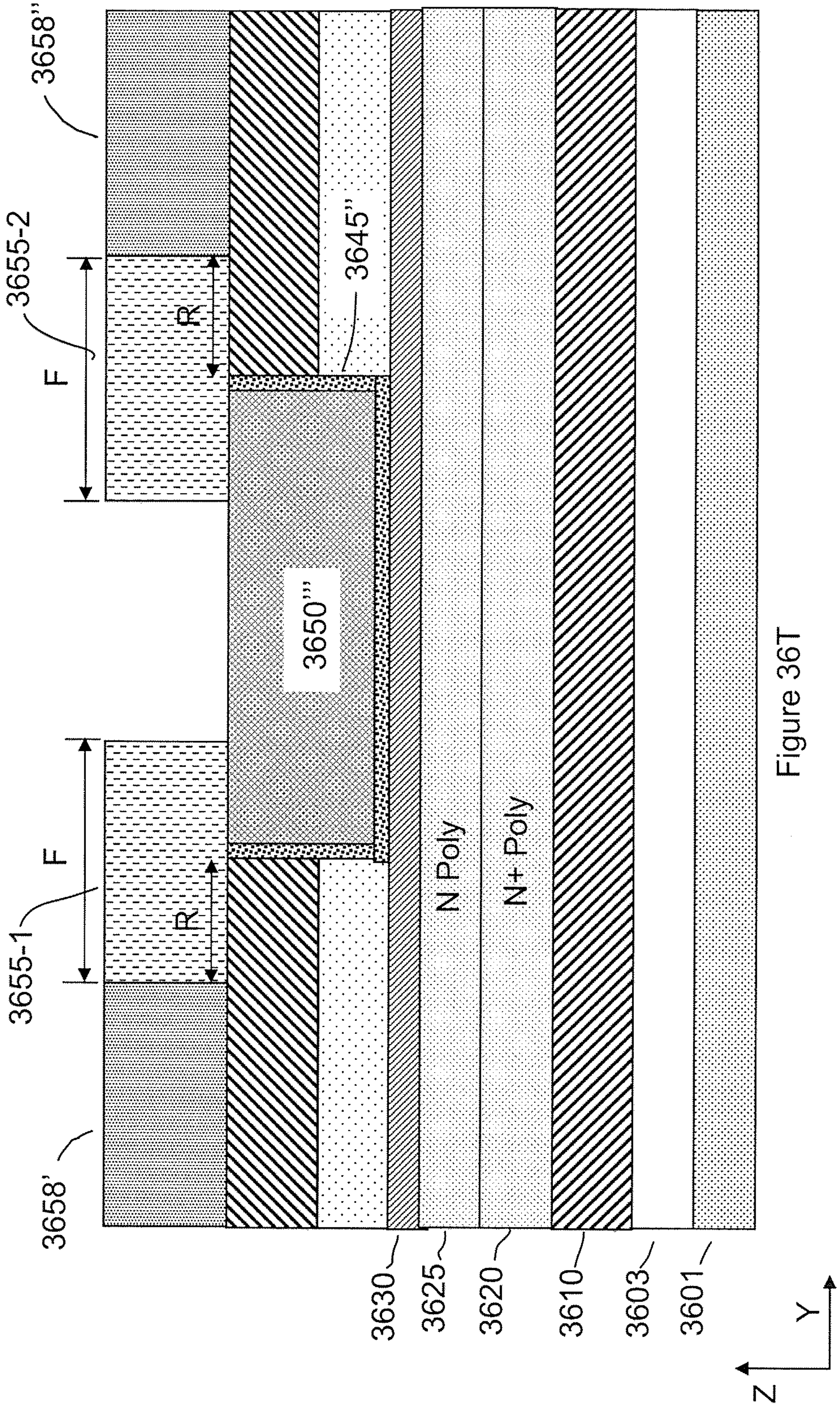

First, methods directionally selectively etch (remove) exposed regions (portions) of sacrificial region 3658 using known industry methods as illustrated in FIG. 36T.

Figure 36U:
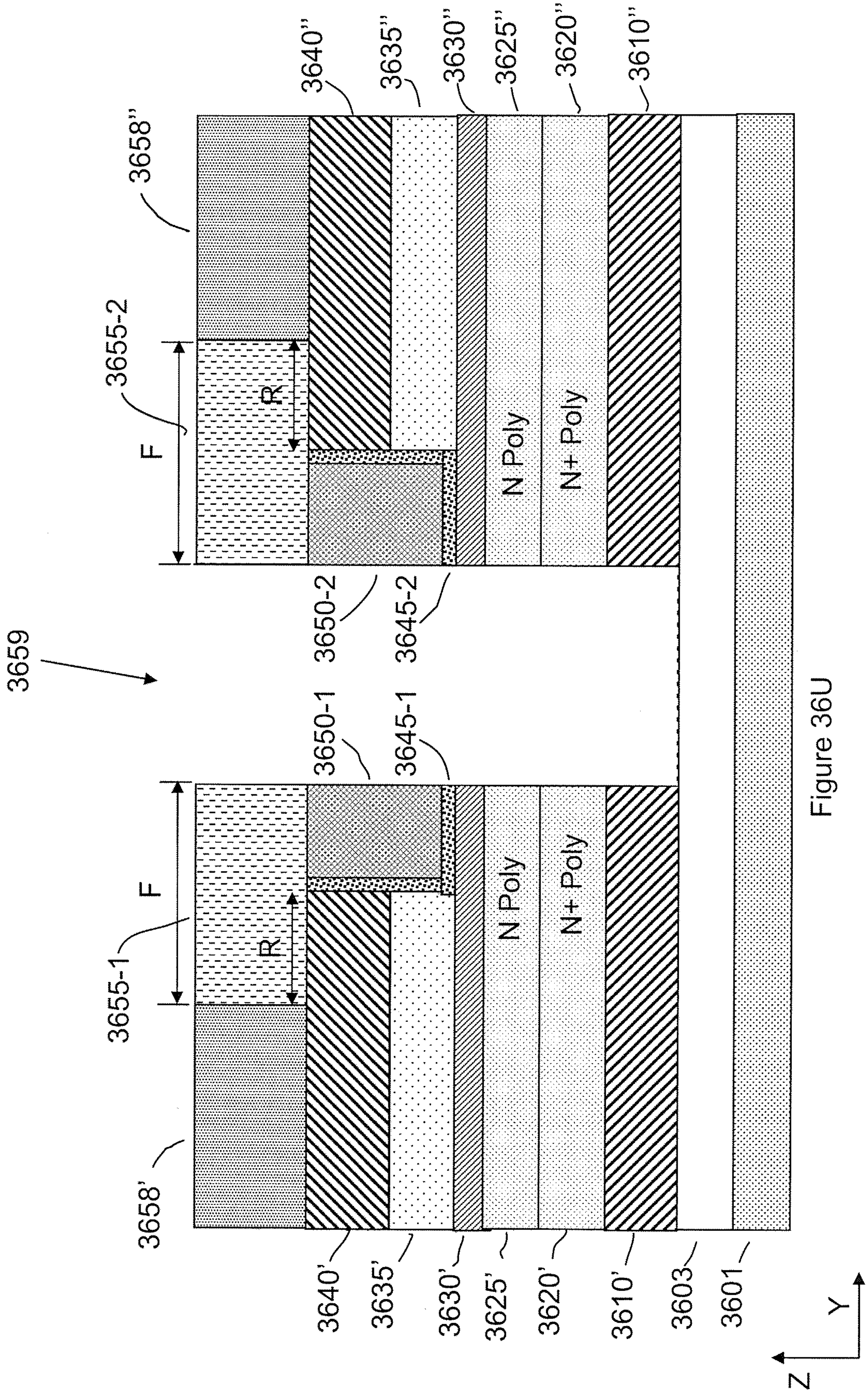

Next, methods selectively etch exposed regions (portions) of conformal insulator 3650'" using known industry methods and form conformal insulators 3650-1 and 3650-2 as illustrated in FIG. 36U.

Next, methods selectively etch exposed regions of nanotube element 3645" and form nanotube elements 3645-1 and 3645-2 as illustrated in FIG. 36U. Nanotube element methods of etching are described in greater detail in the incorporated patent references.

Next, methods selectively etch exposed regions of contact layer 3630 using known industry methods forming contact layer regions 3630' and 3630".

Next, methods selectively etch exposed regions of N polysilicon layer 3625 forming regions 3625' and 3625" using known industry methods.

Next, methods selectively etch exposed regions of N+ polysilicon layer 3620 forming regions 3620' and 3620" using known industry methods.

Then, methods etch exposed regions of conductor layer 3610 using known industry methods forming conductor regions 3610' and 3610". Directional etching stops at the surface of planar insulator 3603.

Figure 36V:
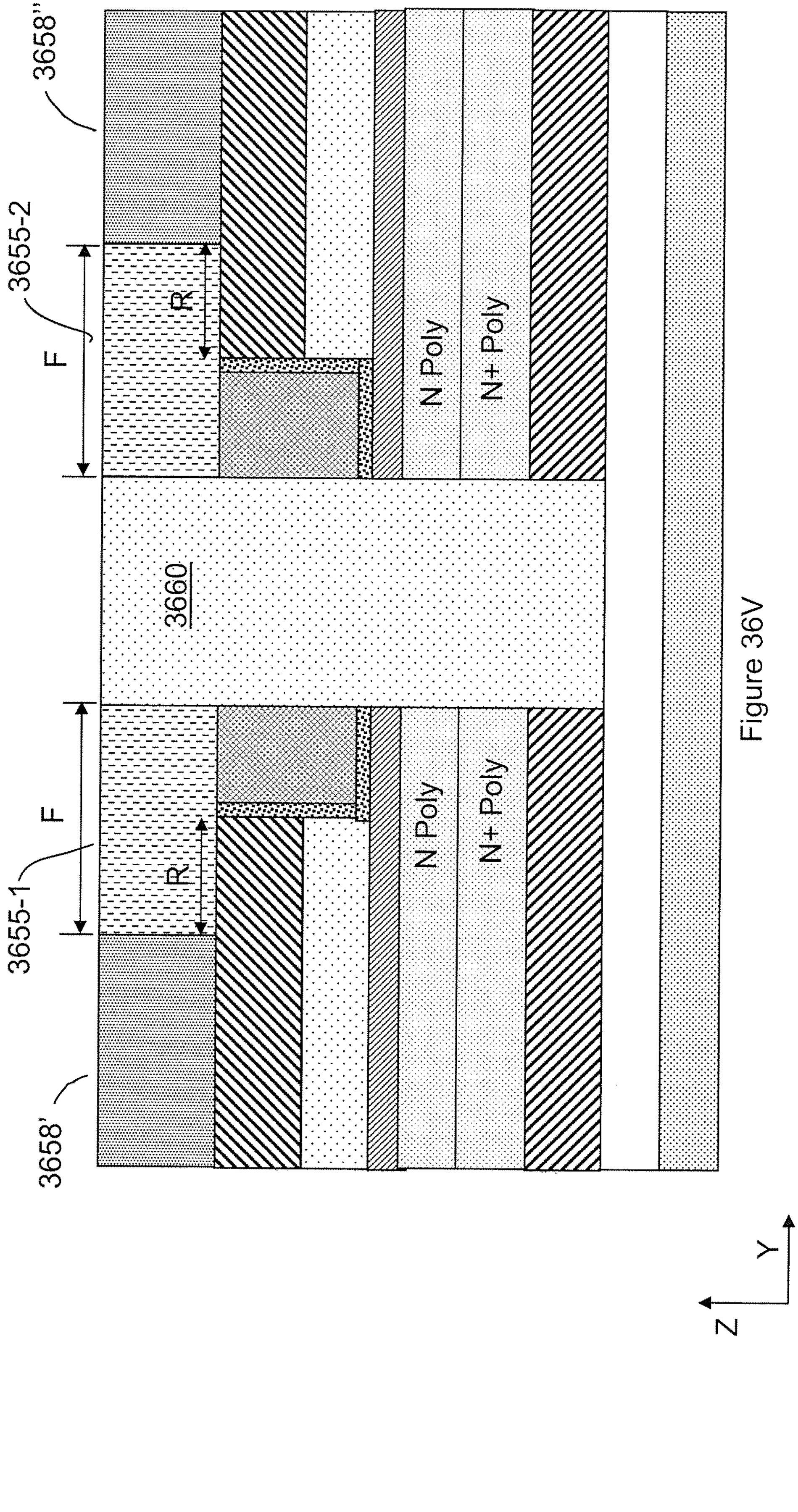

Next, methods fill and planarize trench 3659 with an insulator such as TEOS for example and forming insulator 3660 using known industry methods as illustrated in FIG. 36V.

Next, methods form a noncritical mask region (not shown) over insulator 3660.

Figure 36W:
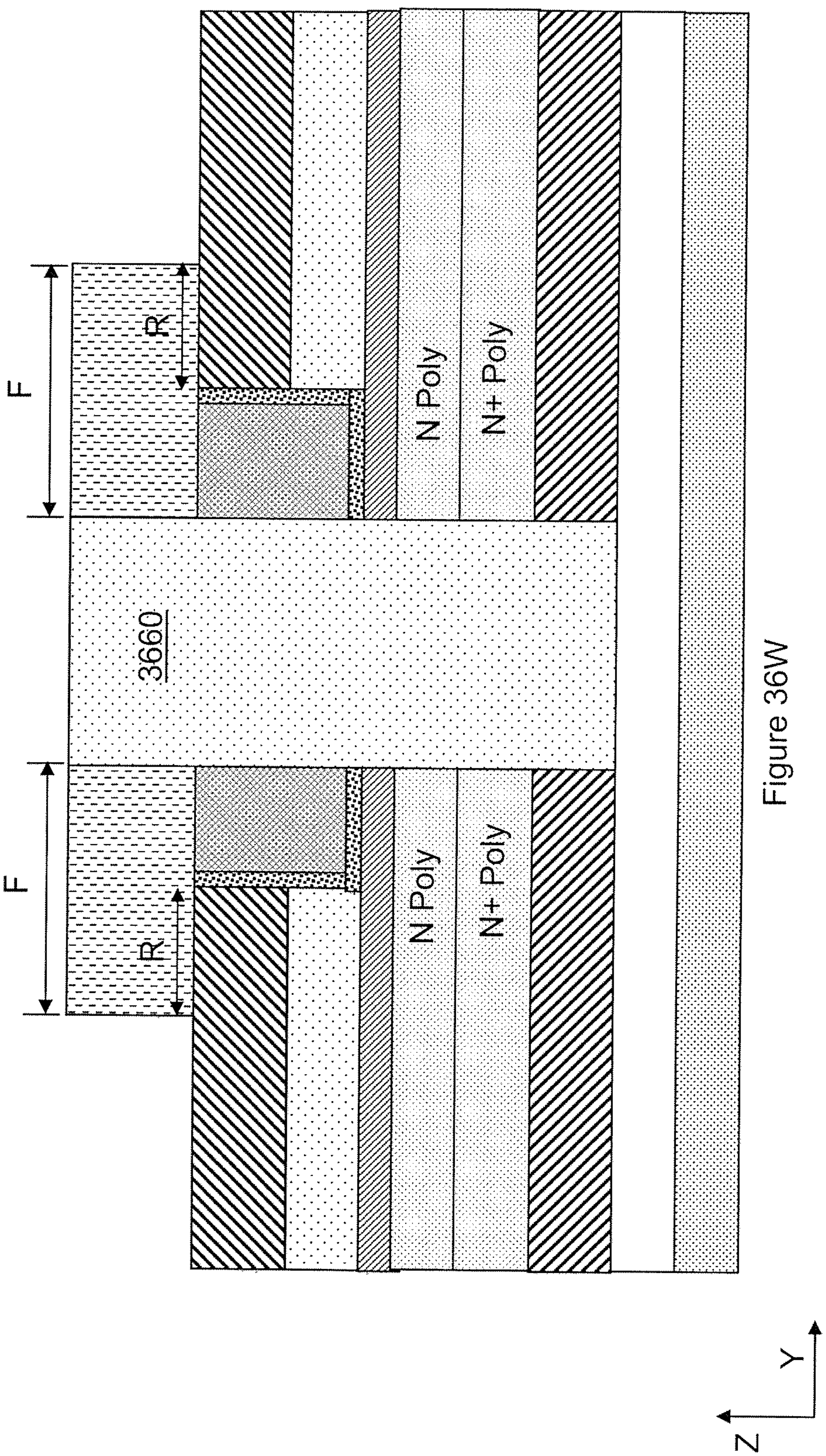

Next, sacrificial regions 3658' and 3658" are selectively etched as illustrated in FIG. 36W. With sacrificial regions 3658' and 3658" removed and with insulator 3660 protected by a mask layer (not shown), methods form trenches 3659' and 3659" using known directional selective etch techniques such as RIE as shown in FIG. 36 X. Trenches 3659' and 3659" form a second vertical (Z) sidewall in the Y direction of NV NT diode cells.

Figure 36X:
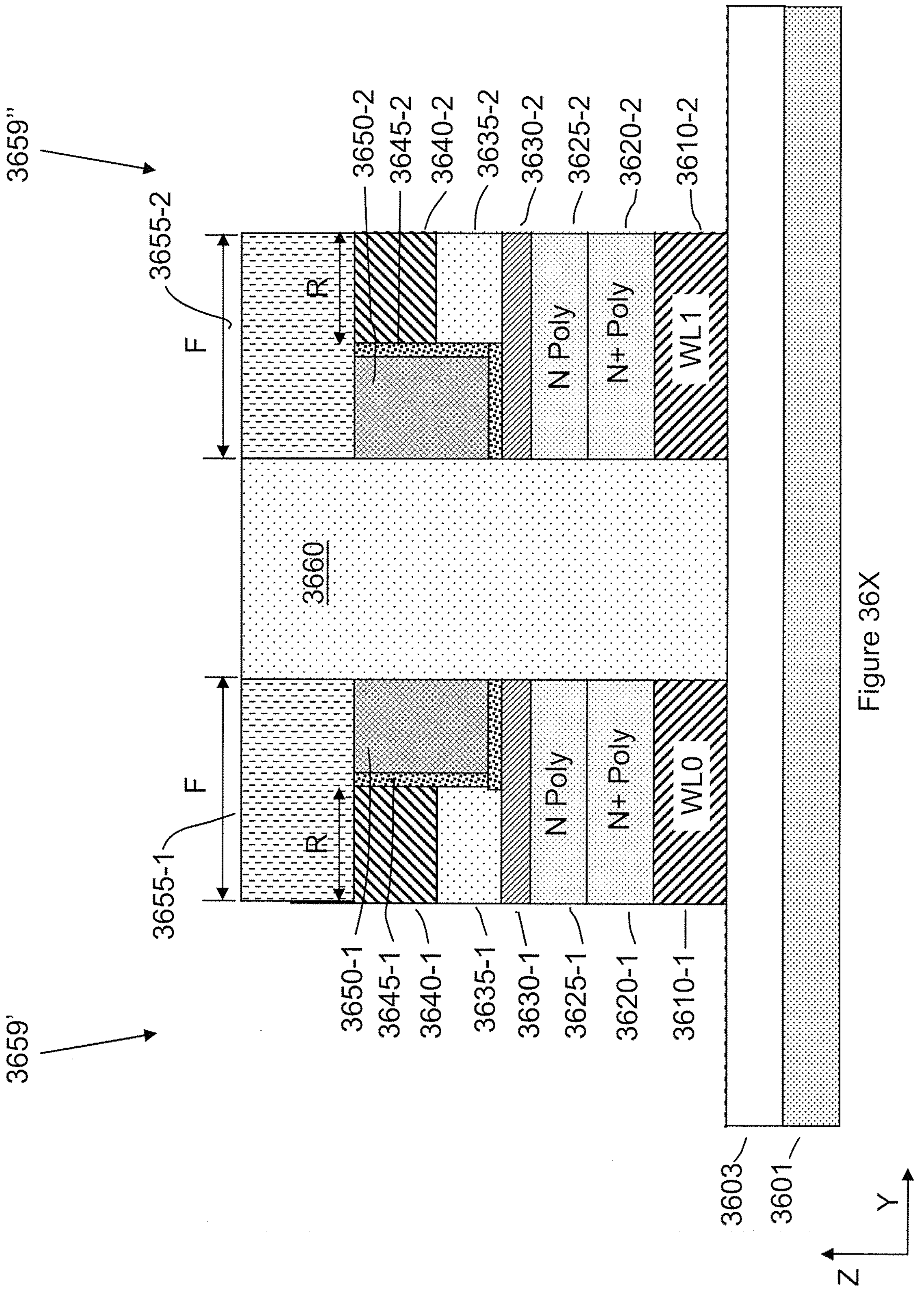

To form trenches 3659' and 3659", methods directionally selectively etch (remove) exposed portions of contact 3640' and 3640" using known industry methods and expose a portion of the top surface of insulator layers 3635' and 3635" and define contact 3640-1 and 3640-2 regions as illustrated in FIG. 36X.

Next, methods selectively etch exposed portions of insulator regions 3635' and 3635" using known industry methods and form insulator regions 3635-1 and 3635-2.

Next, methods selectively etch exposed portions of contact regions 3630' and 3630" using know industry methods and form contact regions 3630-1 and 3630-2.

Next, methods selectively etch exposed portions of N polysilicon layer 3625' and 3625" using known industry methods and form N polysilicon regions 3625-1 and 3625-2.

Next, methods selectively etch exposed portions of N+ polysilicon layer 3620' and 3620" using known industry methods and form N+ polysilicon regions 3620-1 and 3620-2 as illustrated in FIG. 36X.

Then, methods selectively etch exposed portions of conductor layer 3410' and 3410" using known industry methods and form word lines 3610-1 (WL0) and 3610-2 (WL1). Directional etching stops at the surface of planar insulator 3603 as illustrated in FIG. 36X.

Figure 36Y:
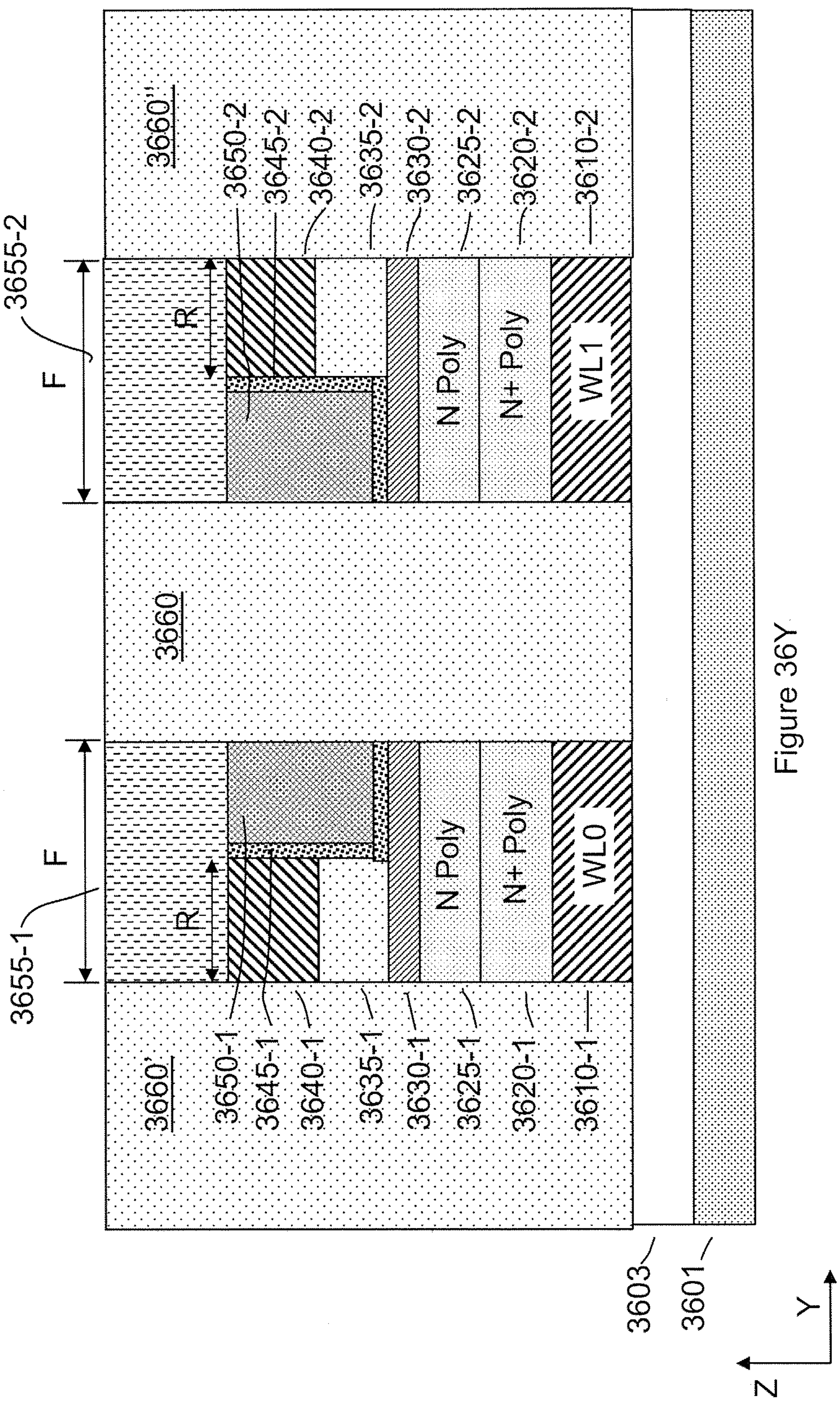

Next, methods deposit and planarize an insulator such as TEOS and fill trench openings 3659' and 3659" with insulators 3660' and 3660", respectively, as illustrated in FIG. 36Y.

Next, methods etch (remove) sacrificial regions 3655-1 and 3655-2.

Figure 36Z:
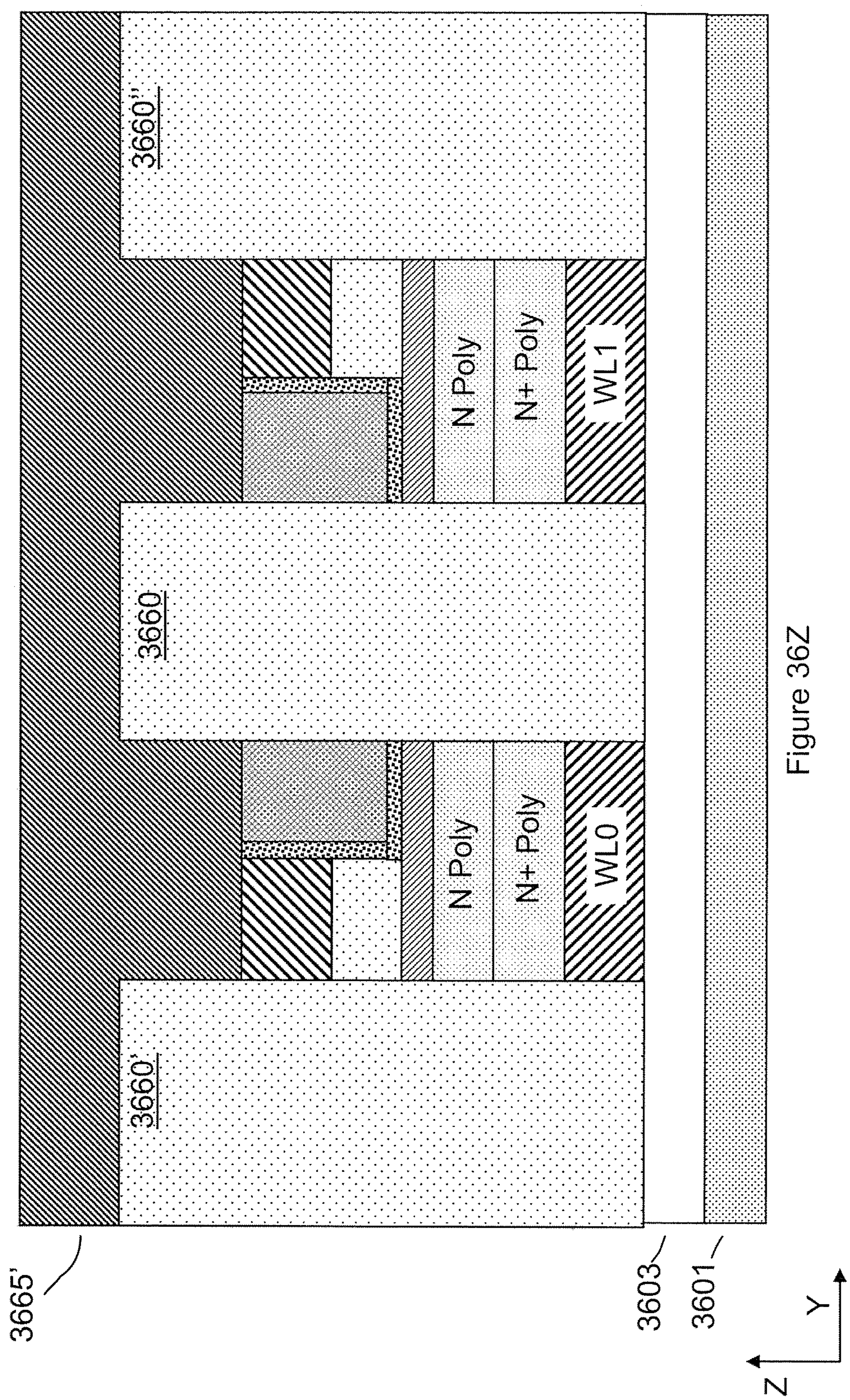
Figure 36A:
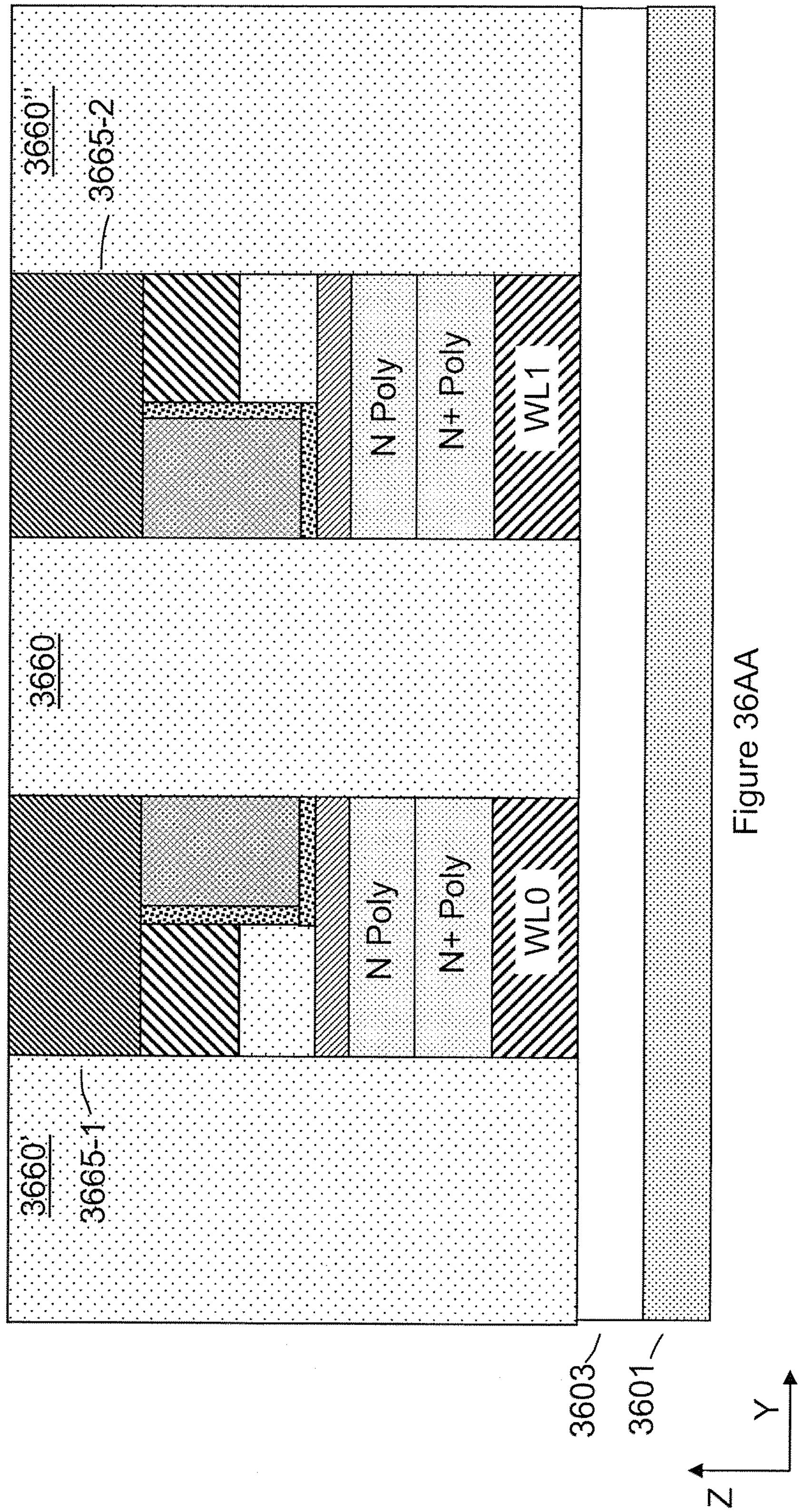
Figure 36B:
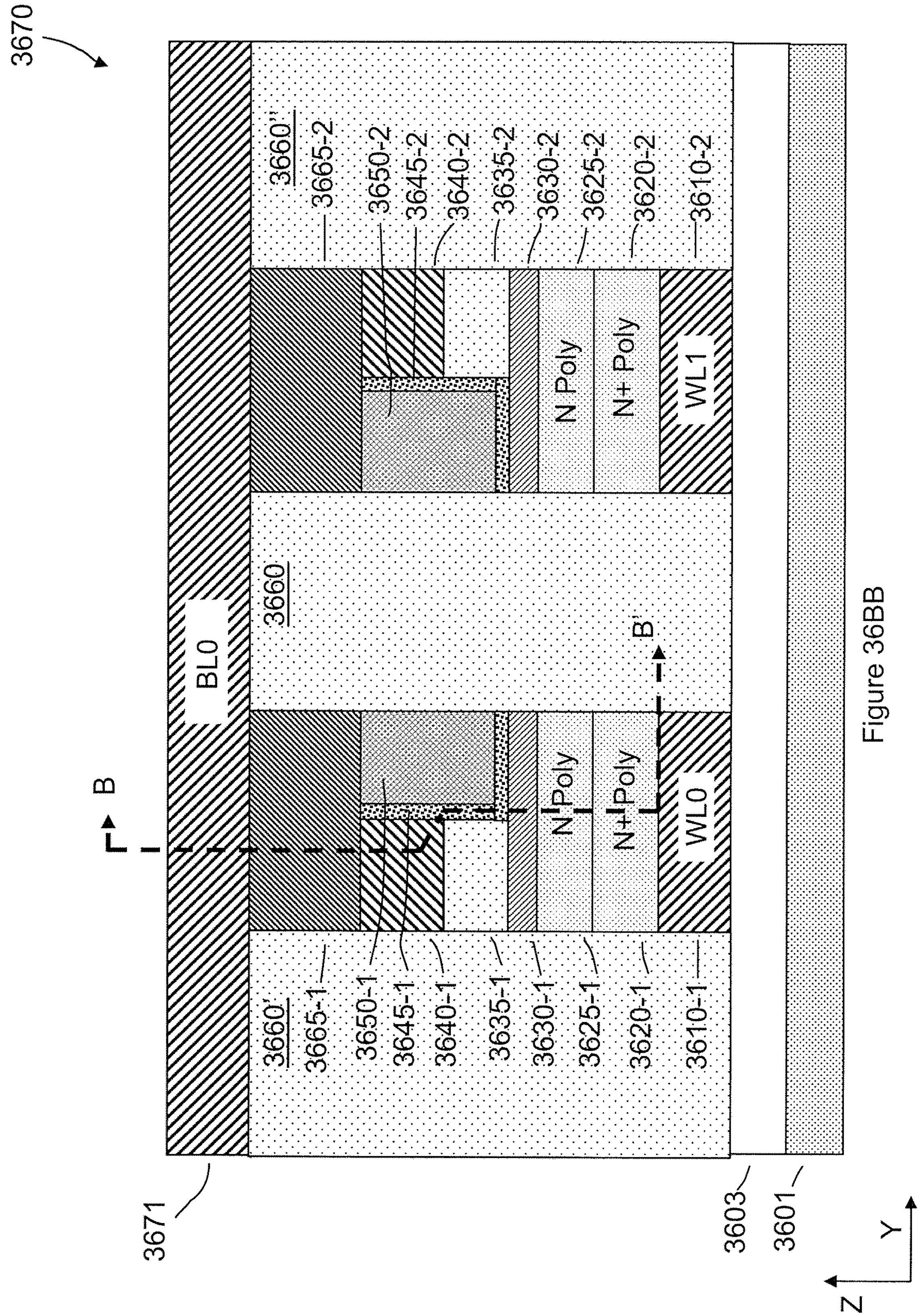
Figure 36C:
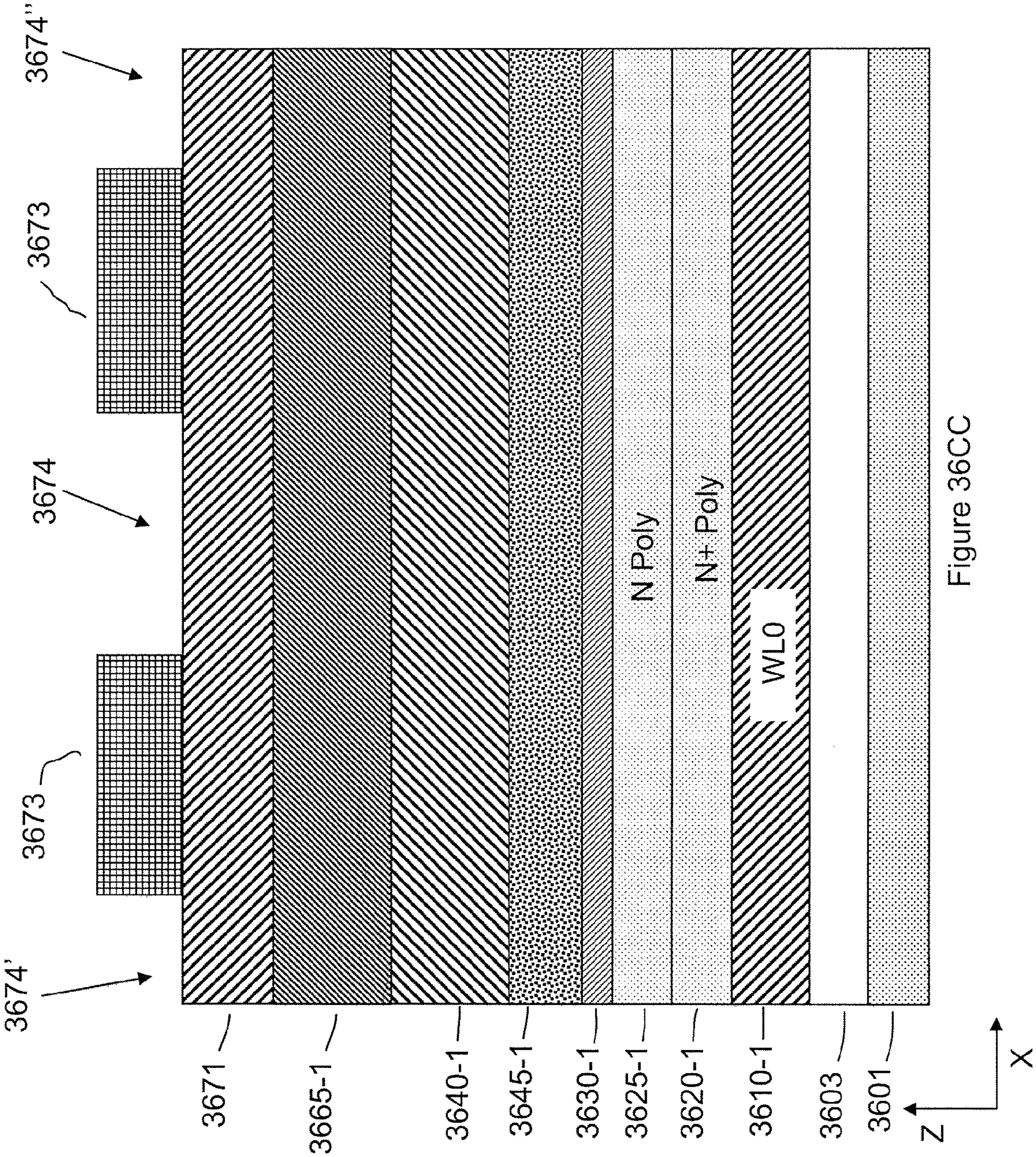
Figure 36D:
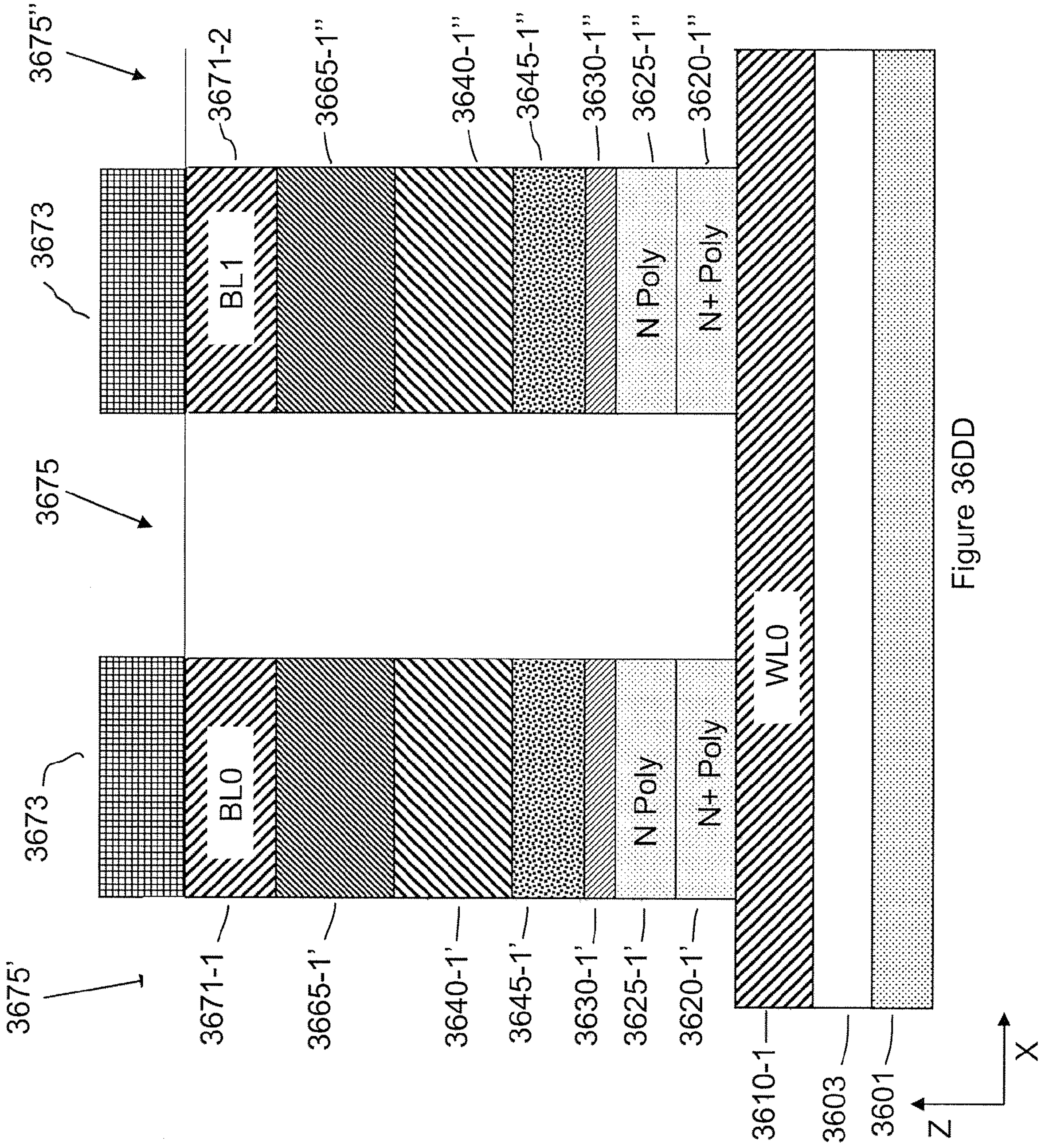
Figure 36E:
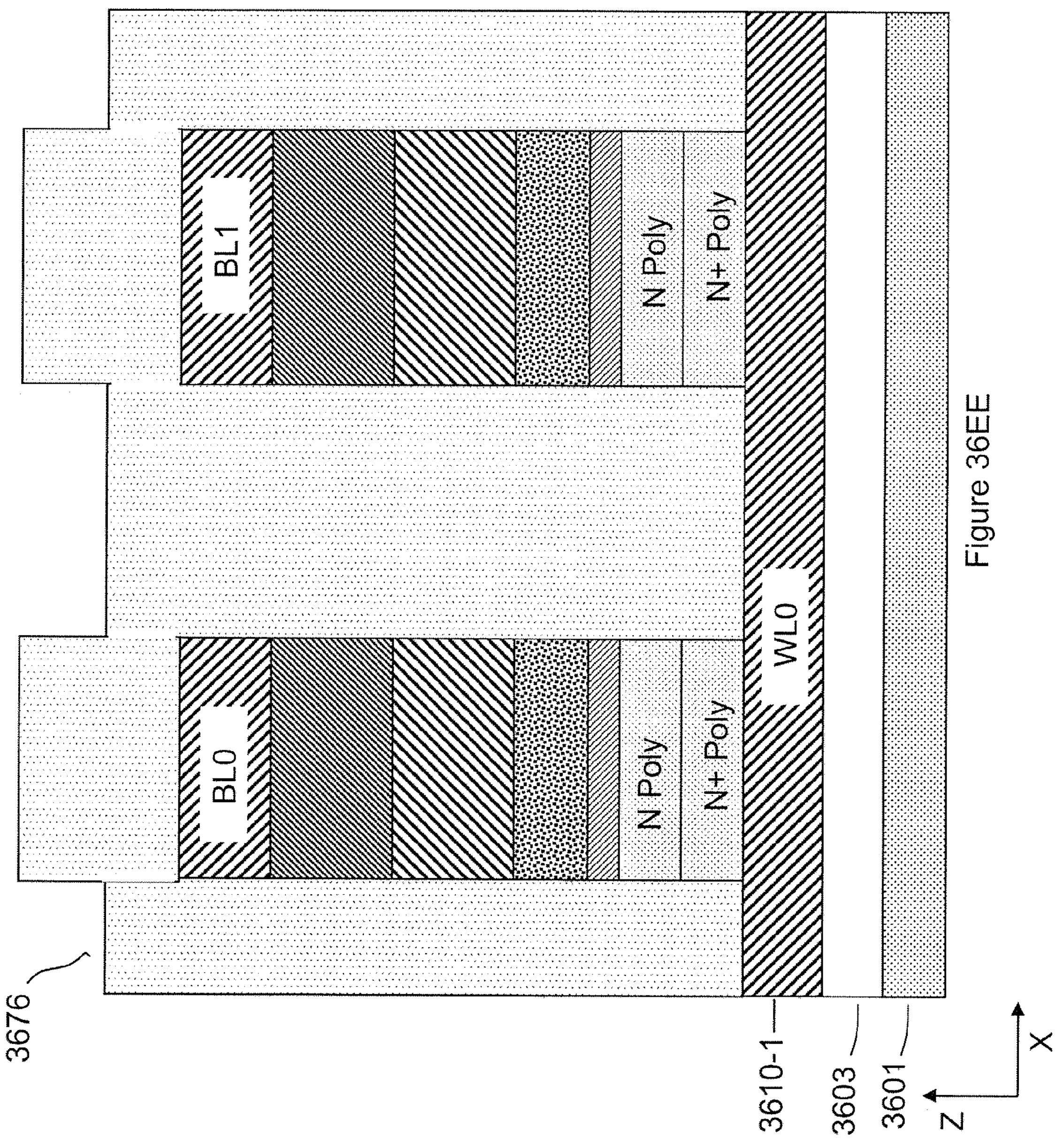
Figure 36F:
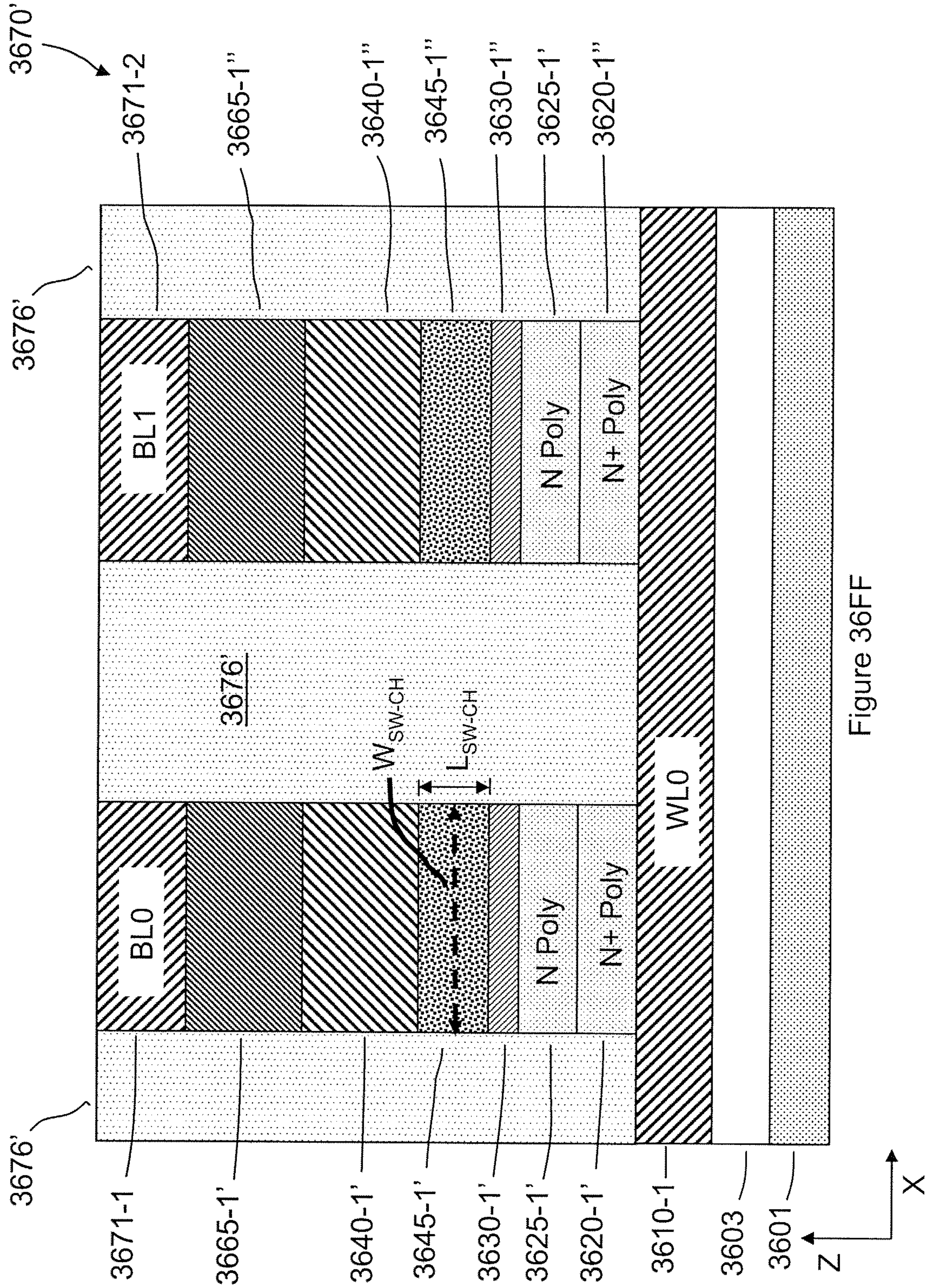

Next, methods deposit and planarize conductor 3665' to form upper layer contacts 3665-1 and 3665-2 as illustrated in FIGS. 36Z and 36AA and 36CC.

Next, methods deposit and planarize conductive layer 3671 using known industry methods to form cross section 3670 as illustrated in FIG. 36BB. Cross section 3670 corresponds to cross section 3100 illustrated in FIG. 31A. In some embodiments, methods described further above form a cross section (not shown) corresponding to cross section 3100' illustrated in FIG. 31B if process fabrication begins with FIG. 34A' instead of FIG. 34A. Also, in some embodiments, methods described further above form a cross section (not shown) corresponding to cross section 3100" illustrated in FIG. 31C if process fabrication begins with FIG. 34A".

At this point in the process, cross section 3670 illustrated in FIG. 36BB has been fabricated, and includes NV NT diode cell dimensions of 1F (where F is a minimum feature size) defined in the Y direction as well as corresponding array bit lines. Next, cell dimensions used to define dimensions in the X direction are formed by directional trench etch processes similar to those described further above with respect to cross section 3670 illustrated in FIG. 36BB. Trenches used to define dimensions in the X direction are approximately orthogonal to trenches used to define dimensions in the Y direction. In this example, cell characteristics in the X direction do not require self alignment techniques described further above with respect to Y direction dimensions. Cross sections of structures in the X direction are illustrated with respect to cross section B-B' illustrated in FIG. 36BB.

Next, methods deposit and pattern a masking layer such as masking layer 3673 on the surface of bit line conductor layer 3671 as illustrated in FIG. 36CC. Masking layer 3673 may be non-critically aligned to alignment marks in planar insulator 3603. Openings 3674, 3674', and 3674" in mask layer 3673 determine the location of trench directional etch regions, in this case trenches are approximately orthogonal to bit lines such as word line 3410-1 (WL0).

Next, methods form trenches 3675, 3675', and 3675" corresponding to openings 3674, 3674', and 3674", respectively, in masking layer 3673. Trenches 3675, 3675', and 3675" form two sides of vertical sidewalls in the X direction defining two opposing sides of NV NT diode cells as illustrated in FIG. 36DD.

Methods directionally selectively etch (remove) exposed portions of bit line conductive layer 3671 illustrated in FIG. 36DD using known industry methods to form bit lines 3671-1 (BL0) and 3671-2 (BL1) illustrated in FIG. 36DD.

Next, methods selectively etch exposed portions of contact regions 3665-1 and 3665-2 illustrated in FIG. 36CC using known industry methods to form contacts 3665-1' and 3665-1" as illustrated in FIG. 36DD.

Next, methods selectively etch exposed portions of contact regions 3640-1 and 3640-2, nanotube elements 3645-1 and 3645-2, and conformal insulators 3650-1 and 3650-2 illustrated in FIG. 36BB using known industry methods to form contacts 3640-1' and 3640-1", conformal insulator regions (not shown in FIG. 36DD cross section B-B'), and nanotube elements 3645-1' and 3645-1" as illustrated in FIG. 36DD.

Next, methods selectively etch exposed regions of insulators 3635-1 and 3635-2 using known industry methods to form insulator regions 3635-1' and 3635-1" illustrated in FIG. 36DD.

Next, methods selectively etch exposed portions of contact regions 3630-1 and 3630-2 illustrated in FIGS. 36BB and 36CC using known industry methods and form contacts 3630-1' and 3630-1" illustrated in FIG. 36DD (cross section B-B')

Next, methods selectively etch exposed portions of N polysilicon regions 3625-1 and 3625-2 illustrated in FIG. 36BB using known industry methods and form N polysilicon regions 3625-1' and 3625-1" illustrated in FIG. 36DD (cross section B-B').

Next, methods selectively etch exposed portions of N+ polysilicon regions 3620-1 and 3620-2 illustrated in FIG. 36BB using known industry methods and form N+ polysilicon regions 3620-1' and 3620-1" illustrated in FIG. 36DD (cross section B-B'). Directional etching stops at the surface of word line 3610-1 (WL0).

Next, methods deposit insulator 3676 using known industry methods as illustrated in FIG. 36EE. Insulator 3676 may be TEOS, for example.

Then, methods planarize insulator 3676 to form insulator 3676' using known industry methods and form cross section 3670' illustrated in FIG. 36FF. Cross section 3670' illustrated in FIG. 36FF and cross section 3670 illustrated in FIG. 36BB are two cross sectional representation of the same embodiment of a passivated NV NT diode vertically oriented cell. Cross section 3670 illustrated in FIG. 36BB corresponds to cross section 3100 illustrated in FIG. 31A.

At this point in the process, cross sections 3670 and 3670' illustrated in FIGS. 36BB and 36FF, respectively, have been fabricated, nonvolatile nanotube element vertically-oriented channel length $L_{SW-CH}$ and horizontally-oriented channel width $W_{SW-CH}$ are defined, including overall NV NT diode cell dimensions of 1F in the Y direction and 1F in the X direction, as well as corresponding bit and word array lines. Cross section 3670 is a cross section of two adjacent vertically oriented anode-to-nanotube type nonvolatile nanotube diode-based cells in the Y direction and cross section 3670' is a cross section of two adjacent vertically oriented anode-to-nanotube type nonvolatile nanotube diode-based cells in the cells in the X direction. Cross sections 3670 and 3670' include corresponding word line and bit line array lines. The nonvolatile nanotube diodes form the steering and storage elements in each cell illustrated in cross sections 3670 and 3670' and each occupy a 1F by 1F area. The spacing between adjacent cells is 1F so the cell periodicity is 2F in both the X and Y directions. Therefore one bit occupies an area of $4F^2$. At the 65 nm technology node, the cell area is less than 0.02 $um^2$.

Methods of Fabricating Nonvolatile Memories using NV NT Diode Device Stacks with both Anode-to-NT Switch Connections and Cathode-to-NT Switch Connections Some embodiments of methods of fabricating stacked memory arrays are shown in methods 3200 illustrated in FIG. 32 and described further above. First, methods 3210 fabricate support circuits and interconnections on semiconductor substrate, then insulate and planarize as described further above with respect to FIGS. 34 and 36.

Next, cathode-on-nanotube methods of fabrication to form lower array 3310 illustrated FIG. 33B and corresponding lower array 3310' illustrated in FIG. 33B' are described further above with respect to FIG. 34.

Next, anode-on-nanotube methods of fabrication to form upper array 3320 illustrated in FIG. 33B and corresponding upper array 3320' with shared word line 3330 and corresponding word line 3330' are described further above with respect to FIG. 36. The only difference is that methods illustrated in FIG. 36 are applied on the planarized top surface of lower array 3310 and 3310' with shared word line wiring shared between both lower and upper arrays. Element 3380 is an insulating region.

Nonvolatile 3D Memories using Vertically-Oriented Nonvolatile Nanotube Switches having Nanotube Elements of Varying Configurations for Enhanced Performance and Density Vertically-oriented cathode-to-NT and anode-to-NT nonvolatile nanotube diode-based 3D structures described further above illustrate a thin nanotube element, where these thin nanotube elements are typically less than 10 nm thick (1-5 nm, for example), and thin relative to horizontal dimensions of the nonvolatile nanotube diode cell boundaries. Cathode-to-nanotube nonvolatile nanotube diode examples are illustrated in cross section 2800 in FIG. 28A and cross section 3470 illustrated in FIG. 34BB. Anode-to-nanotube nonvolatile nanotube diode examples are illustrated in cross section 3100 illustrated in FIG. 31A and cross section 3670 illustrated in FIG. 36BB. Nonvolatile nanotube switches that form the data storage portion of nonvolatile nanotube diodes are the same for cathode-on-NT and anode-on-NT diodes. Therefore, cell structures described further below illustrating various nonvolatile nanotube switch configurations show the select (steering) diode portion of nonvolatile nanotube device structures in schematic form.

FIGS. 6A-6B and 7A-7B illustrate horizontally and vertically-oriented nanotube (nanofabric) layers, respectively, composed of networks of nanotubes forming nanotube (nanofabric) layers and nanotube elements when patterned. As cell dimensions are reduced, from approximately 150 to 20 nm for example, the number of nanotubes in contact with nanotube terminals (contacts) is reduced for the same nanotube density (nanotubes per unit area). In order to compensate for reduced numbers of nanotube-to-smaller terminal connections, the nanotube density (nanotubes per unit area) may be increased by optimizing individual layer deposition and by depositing multiple nanotube layers using spin-on and/or spray-on nanotube deposition techniques as described in greater detail in the incorporated patent references. The result is that nanotube (nanofabric) layers and patterned nanotube elements may increase in thickness as cell dimensions decrease. Nanotube (nanofabric) layer enhancement is described further below with respect to FIG. 38.

Structural (geometrical) details described further below illustrate various options for nonvolatile nanotube switches. Nonvolatile nanotube switches of various thicknesses may be formed within isolation trench-defined cell boundaries using nanotube elements of varying thickness in order to optimized nonvolatile nanotube switch properties as illustrated further below with respect to FIGS. 37, 39, and 40.

Nonvolatile nanotube switches of various thicknesses may also be formed within isolation trench regions, outside isolation trench-defined cell boundaries, using nanotube elements of varying thickness as illustrated further below with respect to FIGS. 42A-42H and 43A-43B.

Nonvolatile nanotube switches of various thicknesses may also be formed both within isolation trench-defined cell boundaries and within isolation trench regions as illustrated further below with respect to FIG. 44A-44B.

Twice (2×) the storage density may be achieved without stacking arrays, as described further above with respect to FIG. 33, by storing two bits per 3D cell using two nonvolatile nanotube switches that share one select (steering) diode as illustrated further below with respect to FIGS. 45 and 46.

Figure 37:
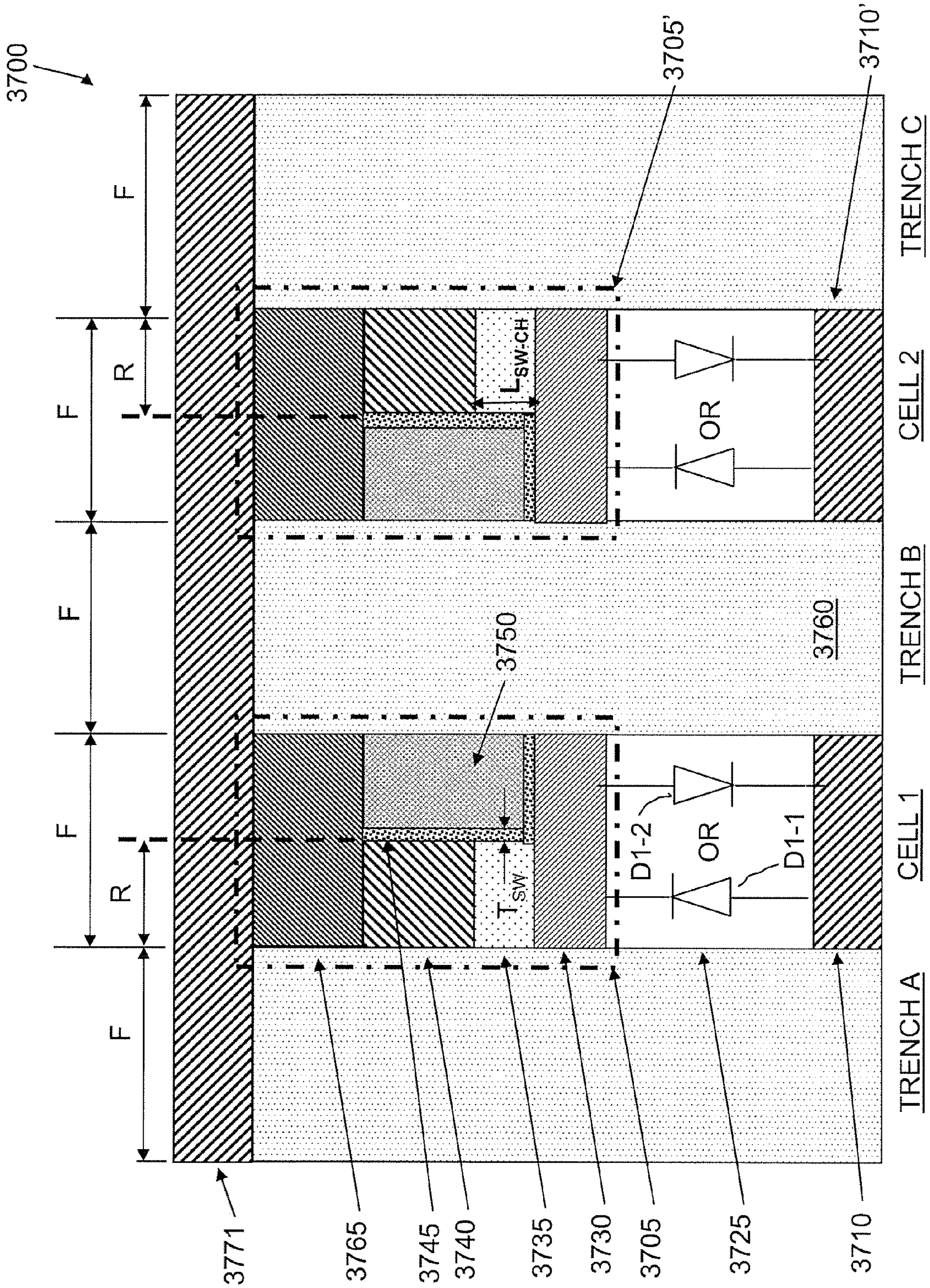
FIG. 37 illustrates a three dimensional cross section of an embodiment of a dense 3D cell structure formed with a cathode-to-nanotube or anode-to-nanotube nonvolatile nanotube diode, with the diode portion of the structure represented schematically in series with a near-cell-centered placement of a vertically oriented nonvolatile nanotube switch within vertical cell boundaries.

Nonvolatile 3D Memories using Vertically-Oriented Nonvolatile Nanotube Switches having Nanotube Elements of Varying a Thicknesses FIG. 37 illustrates cross section 3700 that includes two mirror image cells, cell 1 and cell 2 and insulating trenches A, B, and C forming the boundaries of cells 1 and 2. Cells 1 and 2 are vertically-oriented nonvolatile nanotube diodes. The select (steering) diode portion is represented schematically using schematic representation 3725 by diodes D1-1 and D1-2; the nonvolatile nanotube switch storage elements are illustrated in mirror image cross sections. Select (steering) diode D1-1 combined with nonvolatile nanotube switch 3705 forms a cathode-on-NT nonvolatile nanotube diode cell; select (steering) diode D1-2 combined with nonvolatile nanotube switch 3705 forms an anode-on-NT nanotube diode cell. Nonvolatile nanotube switch 3705' in cell 2 is a mirror image of nonvolatile nanotube switch 3705 in cell 1. Cross section 3700 will be described primarily with respect to cell 1 and nonvolatile nanotube switch 3705.

Cross section 3700 illustrated in FIG. 37 is illustrated with relatively thin nanotube element 3745 in contact with a vertical sidewall located at a distance R of approximately F/2, where F is a minimum dimension for the corresponding technology node. Cross section 3700 illustrated in FIG. 37 corresponds to cross section 2800 in FIG. 28 and cross section 3470 illustrated in FIG. 34BB if select (steering) diode D1-1 is chosen, and cross section 3700 corresponds to cross section 3100 in FIG. 31A and cross section 3670 in FIG. 36BB if select (steering) diode D1-2 is selected. In both cases nonvolatile nanotube switch 3705 is the same.

For cell 1 formed using diode D1-1, array line 3710 illustrated in cross section 3700 corresponds to array bit line 2810-1 shown in cross section 2800 illustrated in FIG. 28A; diode D1-1 illustrated schematically in FIG. 37 corresponds to a Schtottky diode with junction 2818-1 and corresponding structures in FIG. 28A. However, diode D1-1 may also correspond to a PN diode with junction 2819-1 and corresponding structures illustrated in FIG. 28B. Lower level contact 3730 illustrated in FIG. 37 corresponds to lower level contact 2830-1 illustrated in FIG. 28A; insulator 3735 corresponds to insulator 2835-1 used to define nanotube element channel length $L_{SW-CH}$; sidewall contact 3740 corresponds to sidewall contact 2840-1; nanotube element 3745 corresponds to nanotube element 2845-1; upper level contact 3765 corresponds to upper level contact 2865-1; insulator 3750 corresponds to insulator 2850-1; and array line 3771 corresponds to array word line 2871.

For cell 1 formed using diode D1-2, array line 3710 illustrated in cross section 3700 corresponds to array word line 3110-1 shown in cross section 3100 illustrated in FIG. 31A; diode D1-2 illustrated schematically in FIG. 37 corresponds to a Schtottky diode with junction 3133-1 and corresponding structures in FIG. 31A. However, diode D1-2 may also correspond to a PN diode with junction 3128-1 and corresponding structures illustrated in FIG. 31B. Also, diode D1-2 may also correspond to combined Schottky and PN diode with junction 3147-1 and corresponding structures illustrated in FIG. 31C. Lower level contact 3730 illustrated in FIG. 37 corresponds to lower level contact 3130-1 illustrated in FIG. 31A; insulator 3735 corresponds to insulator 3135-1 used to define nanotube element channel length $L_{SW-CH}$; sidewall contact 3740 corresponds to sidewall contact 3140-1; nanotube element 3745 corresponds to nanotube element 3145-1; upper level contact 3765 corresponds to upper level contact 3165-1; insulator 3750 corresponds to insulator 3150-1; and array line 3771 corresponds to array bit line 3171.

Figure 38:
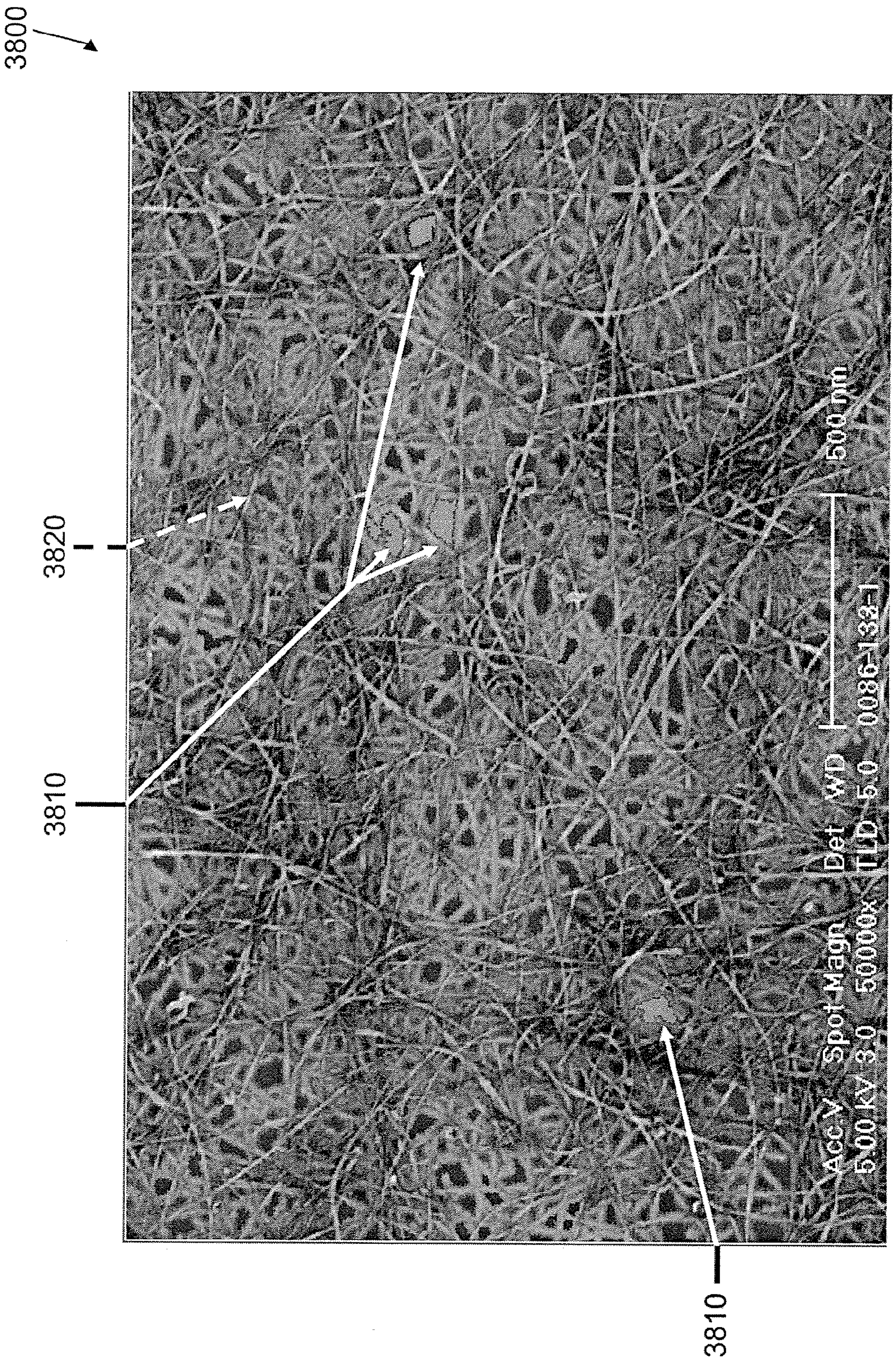
FIG. 38 illustrates an embodiment of a nanotube layer formed on a substrate by spray-on methods with relatively small void areas.

Networks of nanotubes forming relatively thin nanotube (nanofabric) layers and corresponding nanotube elements typically have a nanotube density of approximately 500 nanotubes per square micrometer ($um^2$). Nanotube layers and corresponding nanotube element typically include voids, regions between nanotubes. Void areas may be relatively large, greater than 0.0192 $um^2$ for example, or may be relatively small, less than 0.0192 $um^2$ for example. As cell dimensions are reduced, nanotube density is increased with a corresponding decrease in void area and an increase in nanotube layer and corresponding nanotube element thickness. FIGS. 6A-6B and 7A-7B illustrate relatively thin nanotube element 630 and relatively thin nanotube layer 700, respectively, applied on a substrate by spin-on methods at a nanotube density of up to 500 nanotubes per $um^2$ with relatively large void areas. FIG. 38 illustrates nanotube layer 3800 formed on a substrate by spray-on methods with relatively small void areas. For example, nanotube layer 3800 has no voids greater than 0.0192 $um^2$. Nanotube layer 3800 also has no void areas between 0.0096 and 0.0192 $um^2$; no void areas between 0.0048 and 0.0096 $um^2$; a relatively small number of void areas 3810 between 0.0024 and 0048 $um^2$; with most void areas such as void area 3820 less than 0.0024 $um^2$.

For a technology node (generation) with F approximately 45 nm and a nanotube element thickness of approximately 10 nm for example, the location R of a vertical sidewall may be at approximately F/2 or approximately 22 nm as illustrated by nanotube element 3745 of nonvolatile nanotube switch 3705 in cross section 3700 illustrated in FIG. 37. In this case, sidewall contact 3740 is approximately 22 nm and insulator 3750 is approximately 13 nm. A region of upper level contact 3765 to sidewall contact 3740 is approximately 22 nm. A region of lower level contact 3730 to nanotube element 3745 is approximately 22 nm.

Figure 39:
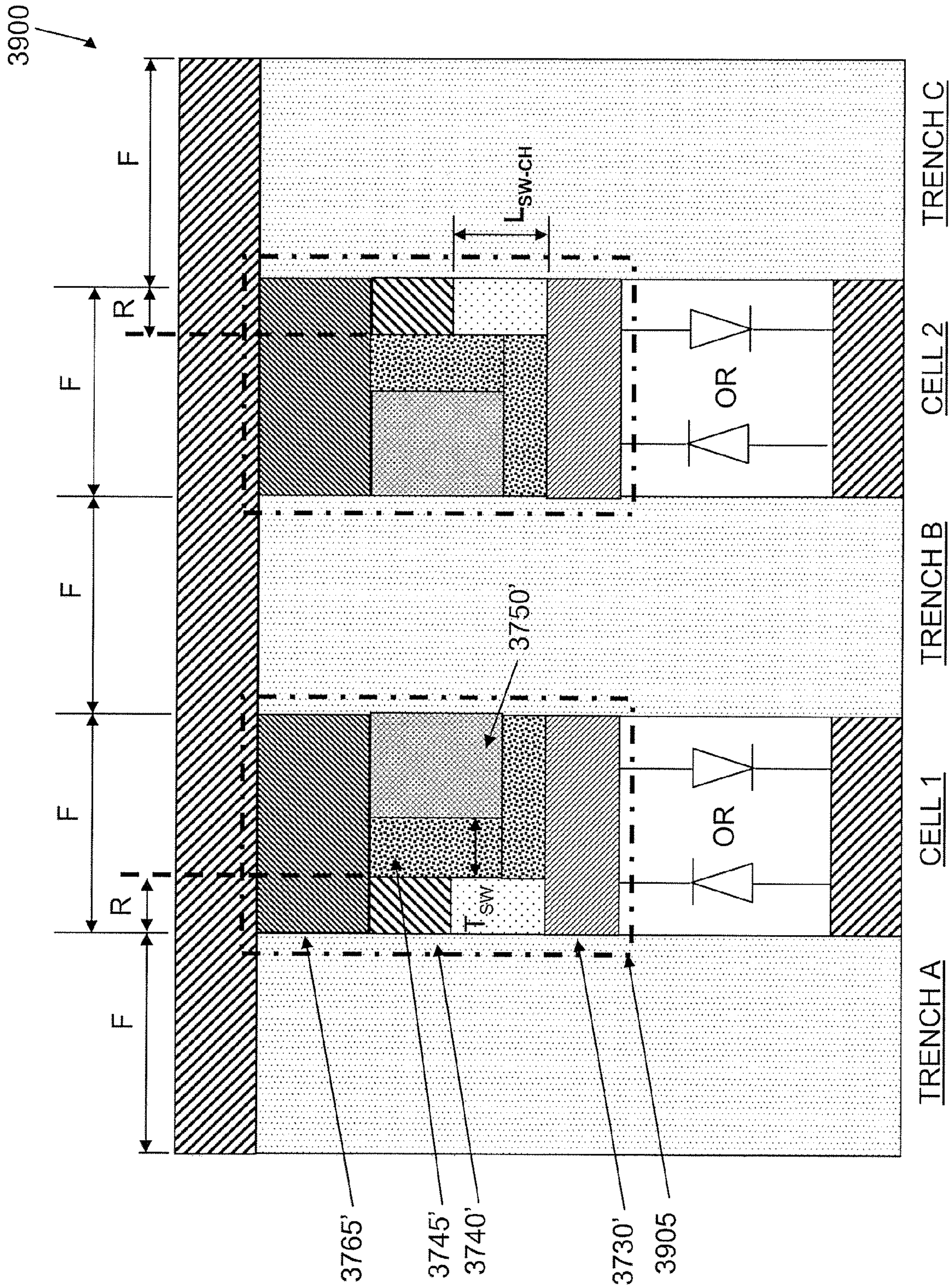
FIG. 39 illustrates an embodiment similar to that shown in FIG. 37 with a thicker nonvolatile nanotube switch including a nanotube element with off-cell-centered placement within vertical cell boundaries.

FIG. 39 illustrates cross section 3900 and includes nonvolatile nanotube switch 3905 in which the thickness of nanotube element 3745' is substantially greater than the thickness of nanotube element 3745 illustrated in FIG. 37. Nonvolatile nanotube switch structures 3705 and 3905 are fabricated using self aligned methods of fabrication as described further above with respect to FIGS. 34 and 36. For a technology node (generation) with F approximately 32 nm and a nanotube element thickness of approximately 15 nm for example, the location R of a vertical sidewall may be at approximately F/3 or approximately 10 nm as illustrated by nanotube element 3745' of nonvolatile nanotube switch 3905 in cross section 3900 illustrated in FIG. 39. In this case, sidewall contact 3740' is approximately 10 nm and insulator 3750' is approximately 7 nm. A region of upper level contact 3765' to sidewall contact 3740' is approximately 10 nm. A region of lower level contact nanotube element 3745' is approximately 22 nm.

Figure 40:
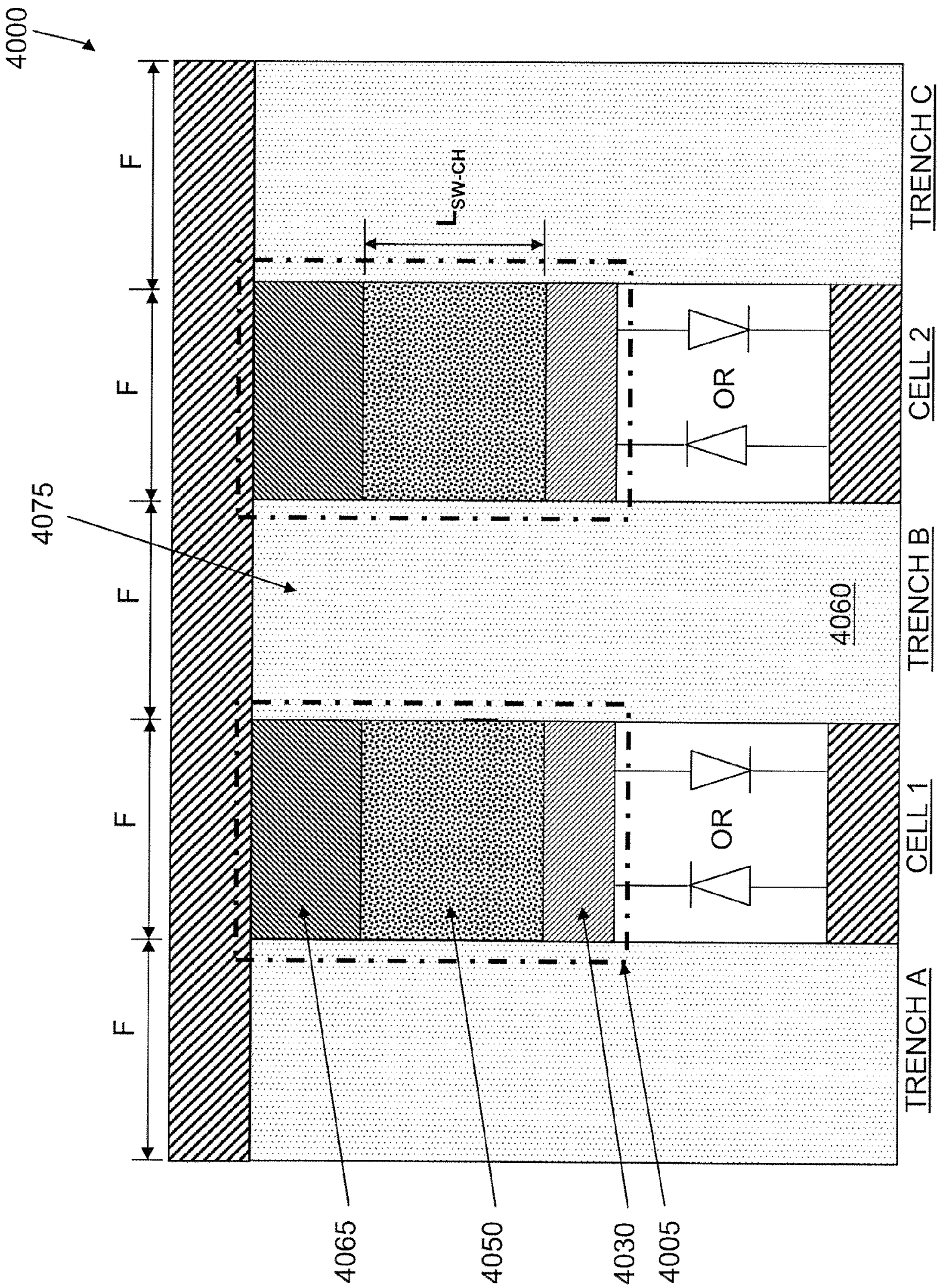
FIG. 40 illustrates a three dimensional cross section of an embodiment of a dense 3D cell structure formed with a cathode-to-nanotube or anode-to-nanotube nonvolatile nanotube diode, with the diode portion of the structure represented schematically in series with a nonvolatile nanotube switch including a nanotube element within vertical cell boundaries and filling the region within the cell boundaries.

FIG. 40 illustrates cross section 4000 and includes nanotube switch 4005 in which the thickness of nanotube element 4050 is equal to the cell dimension F. In this example, nanotube element 4050 may be deposited by spray-on methods of fabrication for example. For a technology node (generation) with F approximately 22 nm and a nanotube element thickness of approximately 22 nm for example, the nanotube region fills the available cell region. A sidewall contact is eliminated and lower level contact 4030 and upper level contact 4065 form the two terminal (contact) regions to nanotube 4050.

Nonvolatile 3D Memories using Vertically-Oriented Nonvolatile Nanotube Switches having Nanotube Elements within Trench Isolation Regions FIGS. 37, 39, and 40 described further above show that as technology nodes (generations) reduce minimum dimensions F, and nanotubes elements increase thickness to reduce void areas, in some embodiments nanotube elements may eventually fill the region available within the insulating trench-defined cell region and thus prevent further increase in nanotube element thickness. It is possible to continue to increase nanotube element overall thickness by also forming nanotube elements within the insulating trench region as illustrated further below. Alternatively, nanotube elements may be placed wholly outside the insulating trench region and not within the cell boundaries as illustrated further below.

Figure 41B:
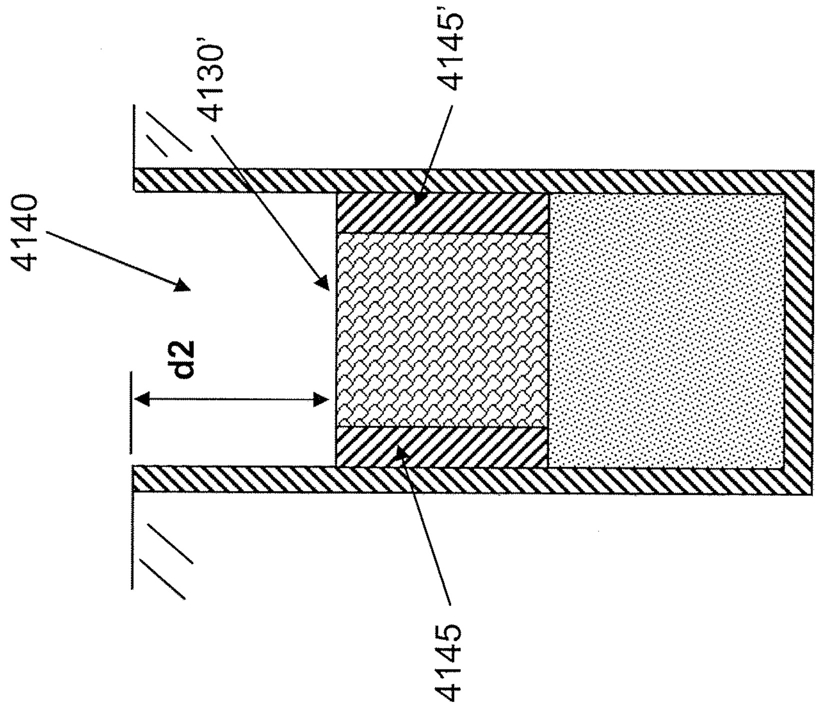
FIGS. 41A-41B illustrate a representation of a method of forming controlled shapes within and on vertical sidewalls of concave (trench) structures, according to some embodiments.
Figure 41A:
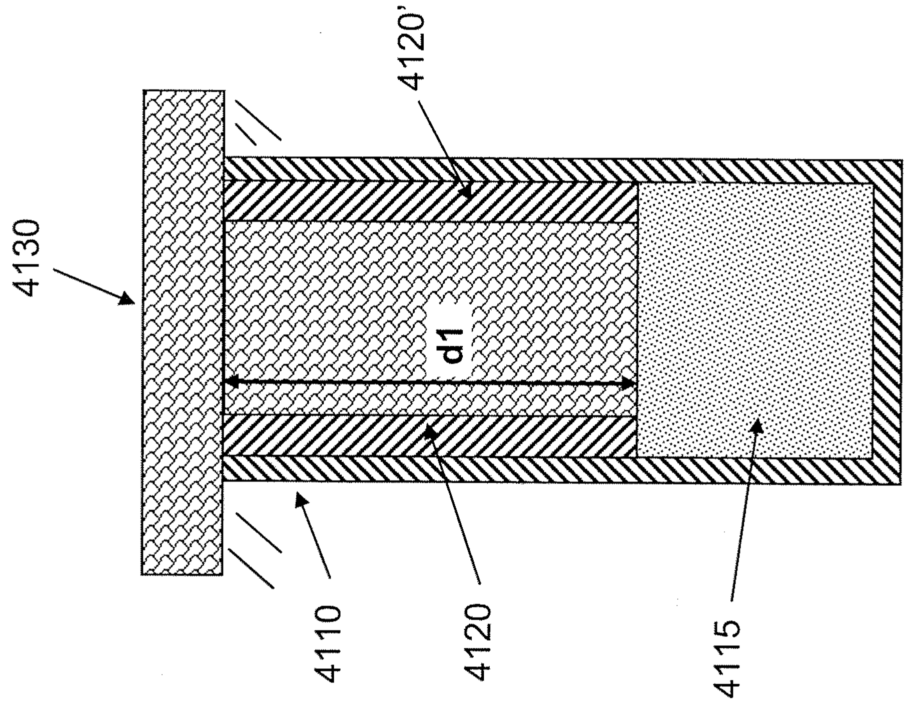

FIGS. 41A-41B are representations of a process for selectively forming vertical sidewall elements of controlled dimensions within and on a vertical sidewall of a concave (trench) structure as described in U.S. Pat. No. 5,096,849, the entire contents of which are incorporated herein by reference, to co-inventor Bertin. The process described in U.S. Pat. No. 5,096,849 includes filling a trench with resist material to be removed, or alternatively, filling a trench with an insulator, for example, that remains in the trench region. Next, RIE is used to precisely remove the resist or insulator to a controlled depth d1 as measured from a top surface reference. Then, a conformal layer of a material of controlled thickness is deposited. Next, RIE is use to remove the conformal layer on horizontal surfaces leaving the conformal layer on the vertical sidewall of the trench. Next, a second resist or insulator fills the remaining trench opening. Next, RIE is used to precisely remove the sidewall film and resist or insulator to a controlled depth of d2. At this point in the process vertical sidewall elements of vertical dimension d1-d2 and controlled thickness have been formed. If the trench is filled with resist, the resist may be removed. If the trench is filled with an insulator material, the insulator material may remain in the trench. Then, the trench is filled with an insulator and planarized.

FIG. 41A illustrates a representation of a trench with outer walls 4110. A lower portion of the trench is filled with an insulator 4115, $SiO_2$ for example, whose top surface is at a controlled depth d1 from the trench surface. A conformal layer is deposited and RIE removes conformal layer material on horizontal surfaces leaving partially completed vertical elements 4120 and 4120'. A resist or insulator 4130 fills the trench region above the top surface of resist or insulator 4115.

FIG. 41B illustrates a representation of FIG. 41A after using RIE to remove resist or insulator material 4130 and then vertical sidewall elements 4120 and 4120' to a controlled depth d2 (indicated by etched region 4140) and forming filled region 4130' and vertical sidewall elements 4145 and 4145'. Vertical sidewall elements 4145 and 4145' are of vertical dimensions d1-d2 and controlled known thickness defined by the thickness of the conformal layer material. Resist or insulator 4130' may be removed or may be left in place. Then, trench opening may be filled with insulating material and planarized.

FIGS. 42A-42H illustrates methods of fabrication used to adapt the elements of U.S. Pat. No. 5,096,849 illustrated in FIG. 41 to form nanotube elements within isolation trenches described further above with respect to FIGS. 28A-28C, 31A-31C, 33A-33D, 34A-34FF, 36A-36FF, 37, 39, and 40.

Figure 42B:
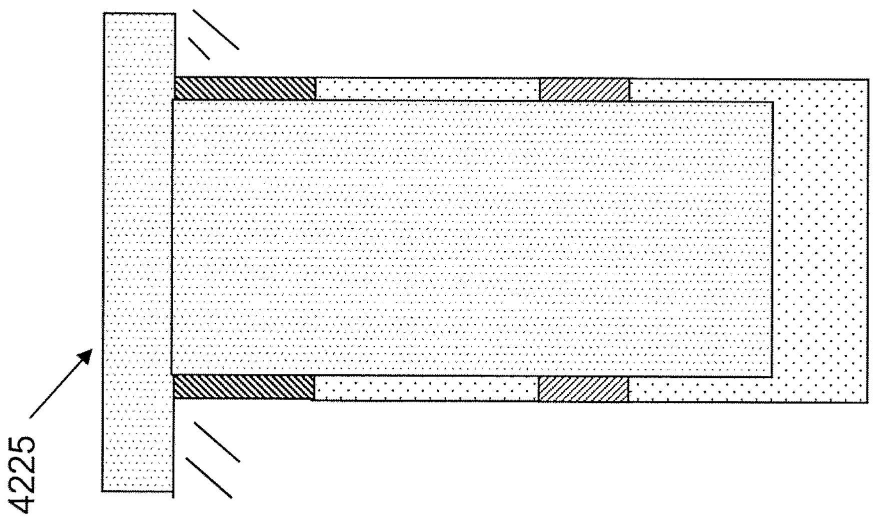
FIGS. 42A-42H illustrate methods of fabricating nonvolatile nanotube switches having nanotube elements outside cell boundary regions and within and on vertical sidewalls of trench structures, according to some embodiments.
Figure 42A:
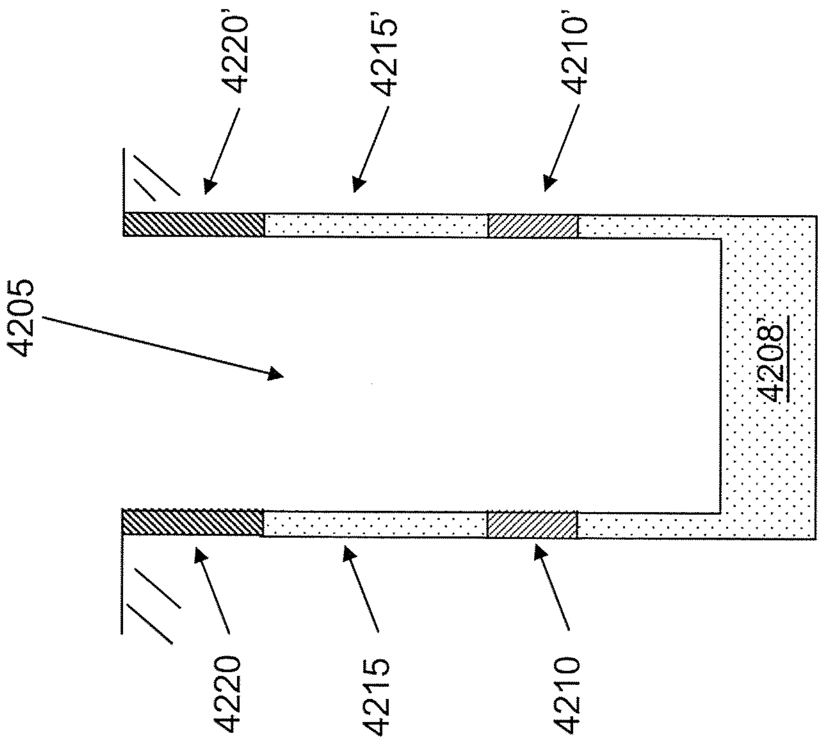
Figure 42D:
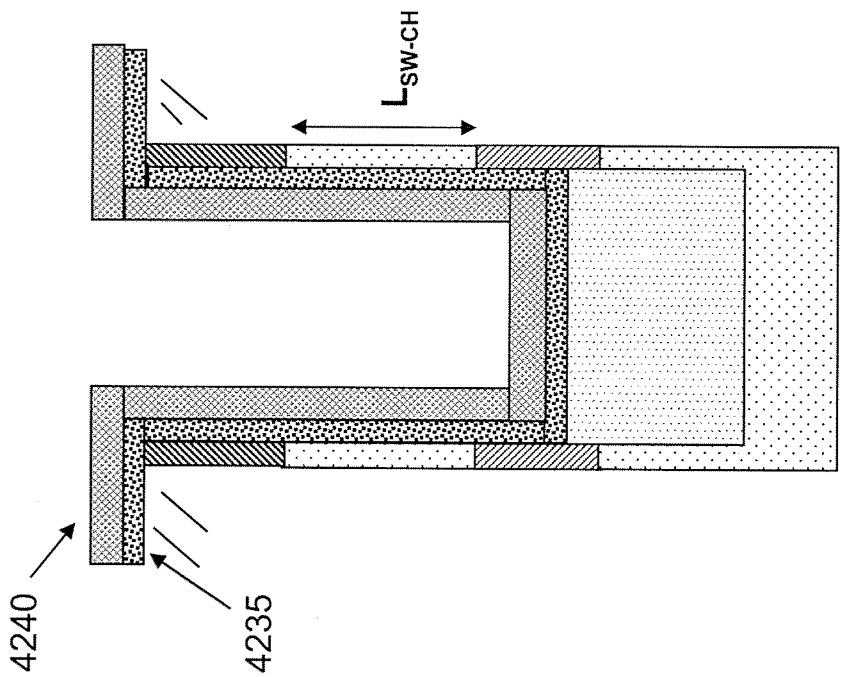

FIG. 42A illustrates an opening 4205 formed in an insulation trench using methods such as a selective controlled etch using RIE, for example, with sidewall regions defining vertical surfaces of lower level contacts 4210 and 4210', upper level contacts 4220 and 4220', and insulator 4215 and 4215' between respective upper and lower level contacts, where the thickness of insulator 4215 and 4215' define the channel length $L_{SW\text{-}CH}$ of nanotube elements as shown further below in FIG. 42D.

First, methods fill trench opening 4205 with an insulator 4225, TEOS for example as illustrated in FIG. 42B.

Figure 42C:
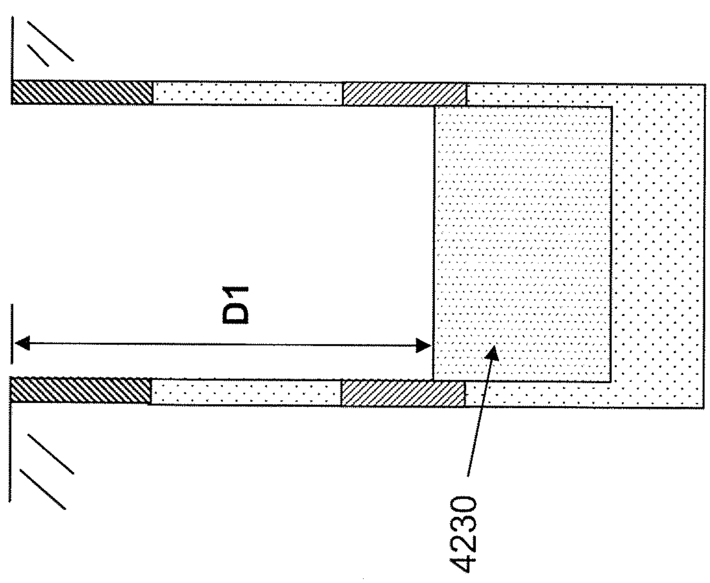

Next, methods selectively etch insulator 4225 using a selective and controlled RIE etch to a depth D1 from a surface reference as illustrated in FIG. 42C. Insulator 4225 is removed leaving behind defined section of insulating material 4230.

Next, methods deposit conformal nanotube layer 4235 using methods described in greater detail in the incorporated patent references. At this point in the process, channel length $L_{SW\text{-}CH}$ is defined as illustrated in FIG. 42D.

Then, methods deposit a protective conformal insulator layer 4240 as illustrated in FIG. 42D. Conformal insulator 4240 may be 5 to 50 nm thick, for example, and may be formed from any appropriate known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example, such as described in U.S. patent application Ser. No. 11/280,786. Insulator 4240 is deposited to a thickness sufficient to ensure protection of nanotube element 4235 from RIE etching.

Figure 42F:
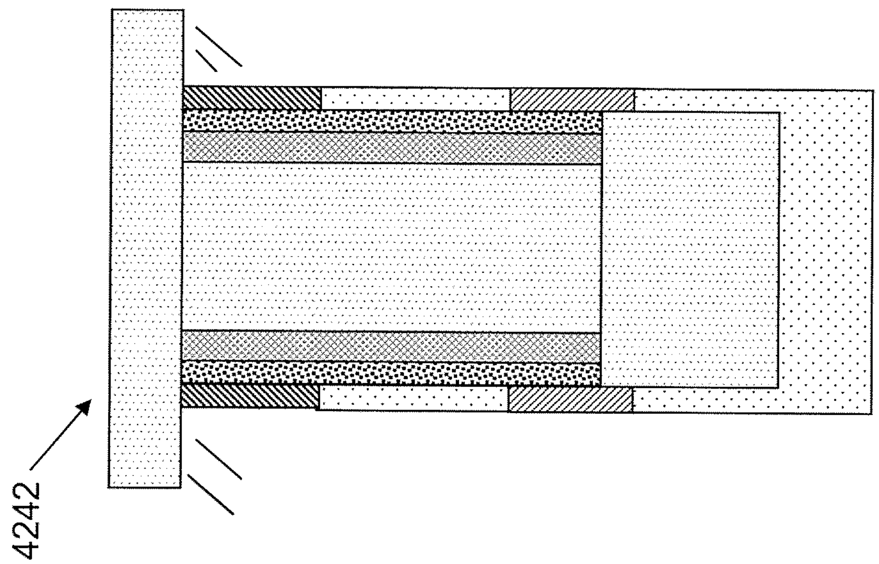
Figure 42E:
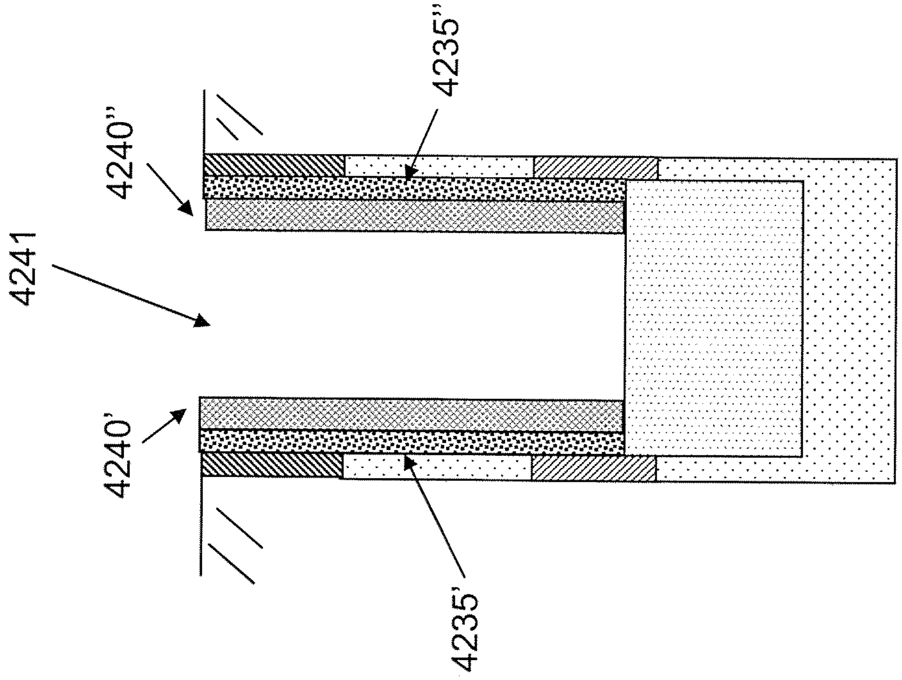

Next, methods directly etch conformal insulator 4240 and nanotube layer 4235 using RIE and remove conformal layer material on top horizontal surfaces and bottom horizontal surfaces at the bottom of trench opening 4241, leaving partially completed vertical elements 4240', 4240", 4235', and 4235" as illustrated in FIG. 42E.

Next methods fill trench opening 4241 with insulator 4242 such as TEOS for example as illustrated in FIG. 42F.

Figure 42H:
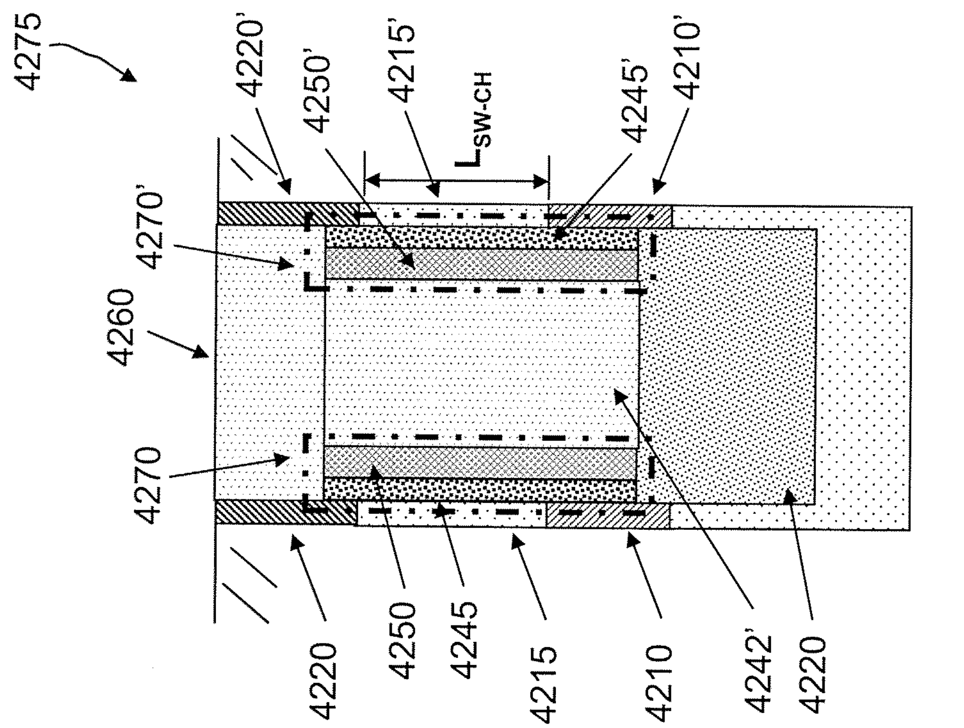
Figure 42G:
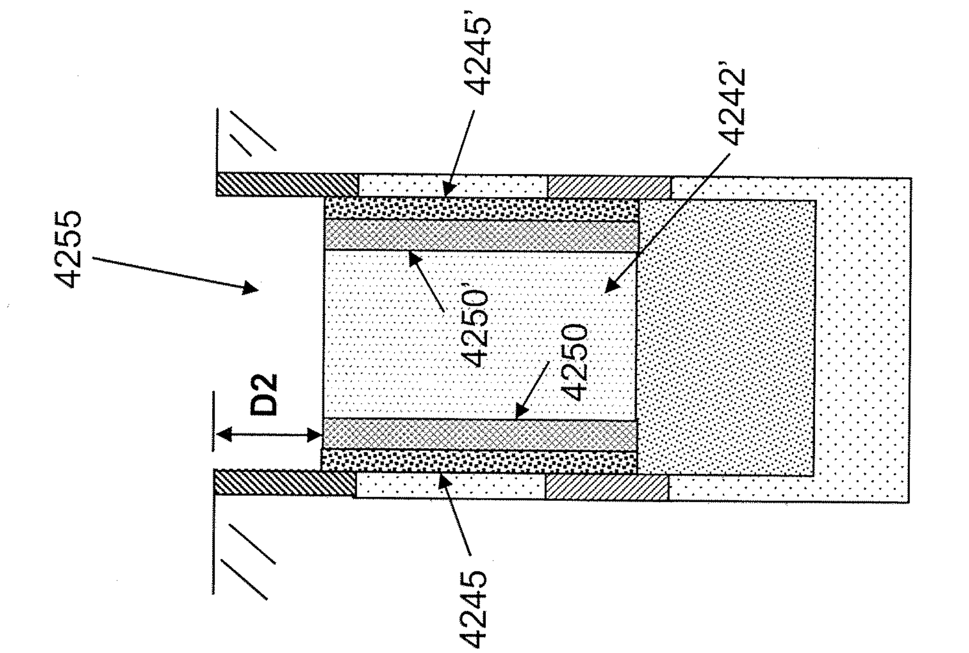

Next, methods selectively etch insulator 4242, conformal insulators 4240' and 4240", and nanotube elements 4235' and 4235" using a selective and controlled RIE etch to a depth D2 from a surface reference as illustrated in FIG. 42G. At this point in the process, insulator 4242' is formed; nanotube elements 4245 and 4245' are formed; conformal insulator 4250 and 4250' are formed, and trench opening 4255 remains.

Then, methods fill trench opening 4255 with an insulator such as TEOS and methods planarize to form insulator 4260. At this point in the process cross section 4275 is formed, including nanotube channel elements 4270 and 4270'. Nanotube channel element 4270 includes nanotube element 4245 and conformal insulator 4250, and nanotube channel element 4270' includes nanotube element 4245' and conformal insulator 4250'. Nanotube channel elements 4270 and 4270' are in contact with a portion of vertical sidewalls of an upper level contact and a lower level contact, and are also in contact with an insulating layer that defines $L_{SW\text{-}CH}$. For example, nanotube channel element 4270 is in contact with upper level contact 4220, lower level contact 4210, and insulator 4215, and nanotube channel element 4270' is in contact with upper level contact 4220', lower contact 4210', and insulator 4215'.

Figure 43A:
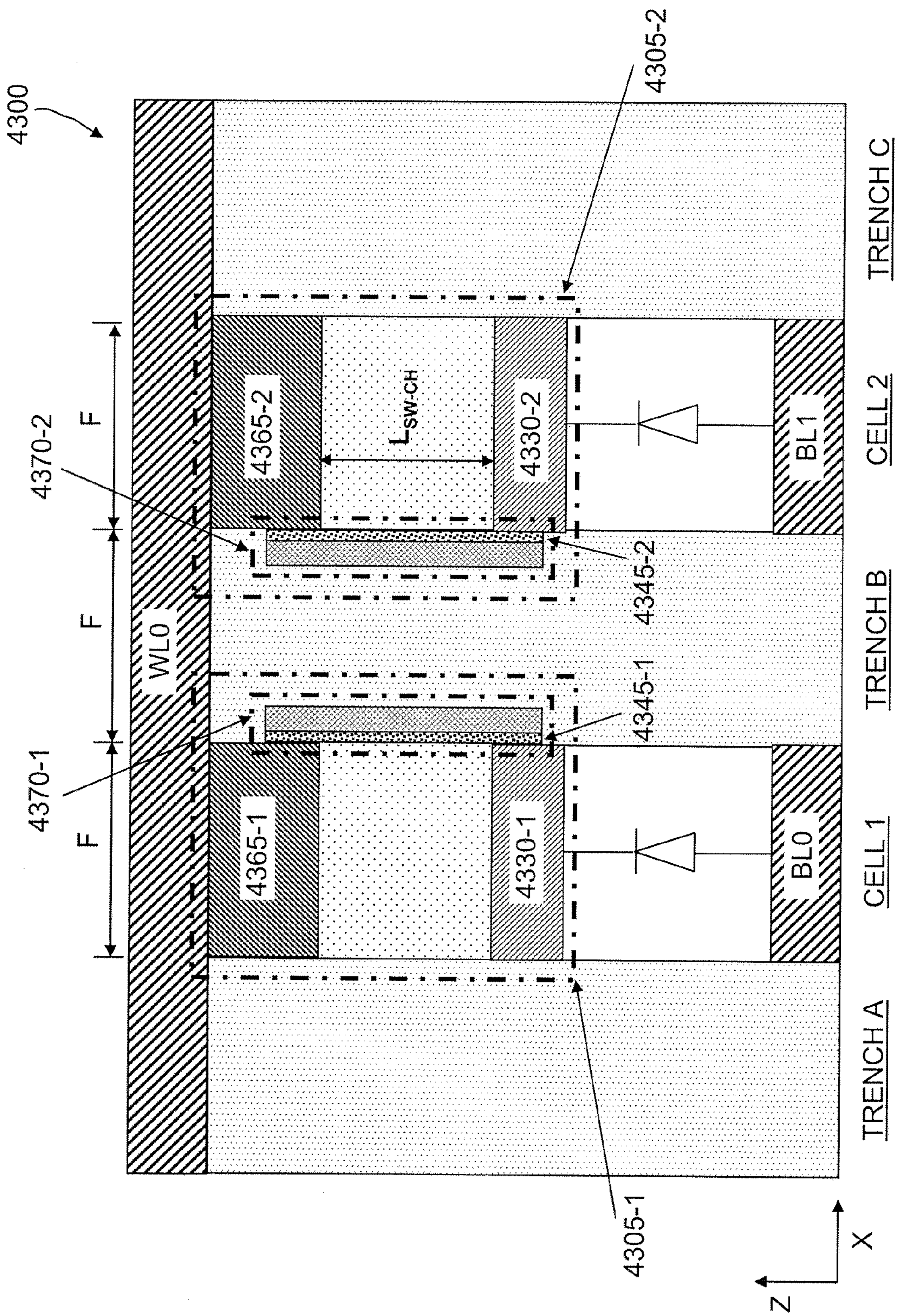
FIGS. 43A-43C illustrate embodiments of nonvolatile nanotube switches having nanotube elements of varying thickness outside cell boundary regions and within and on vertical sidewalls of trench structures.
Figure 43B:
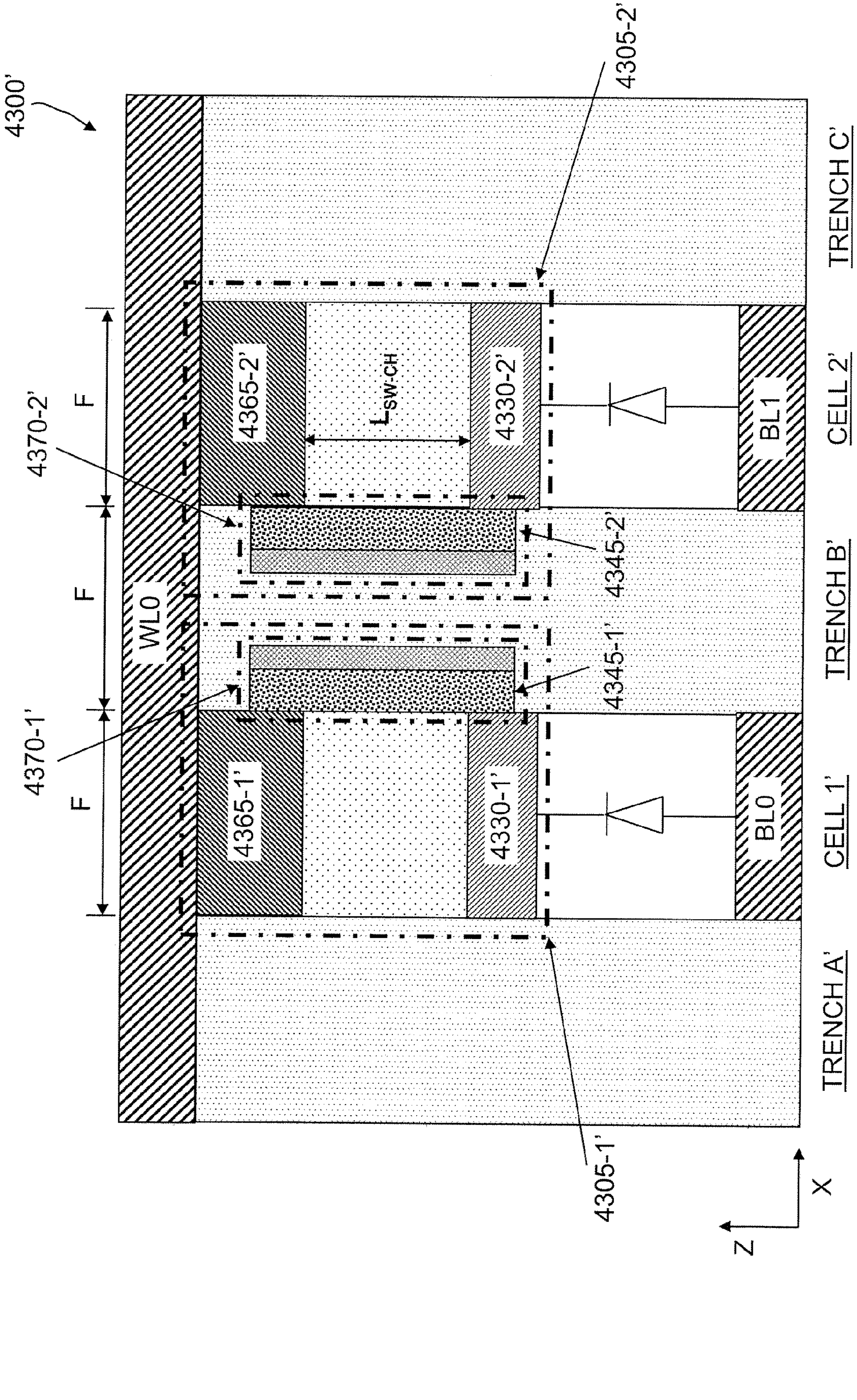
Figure 43C:
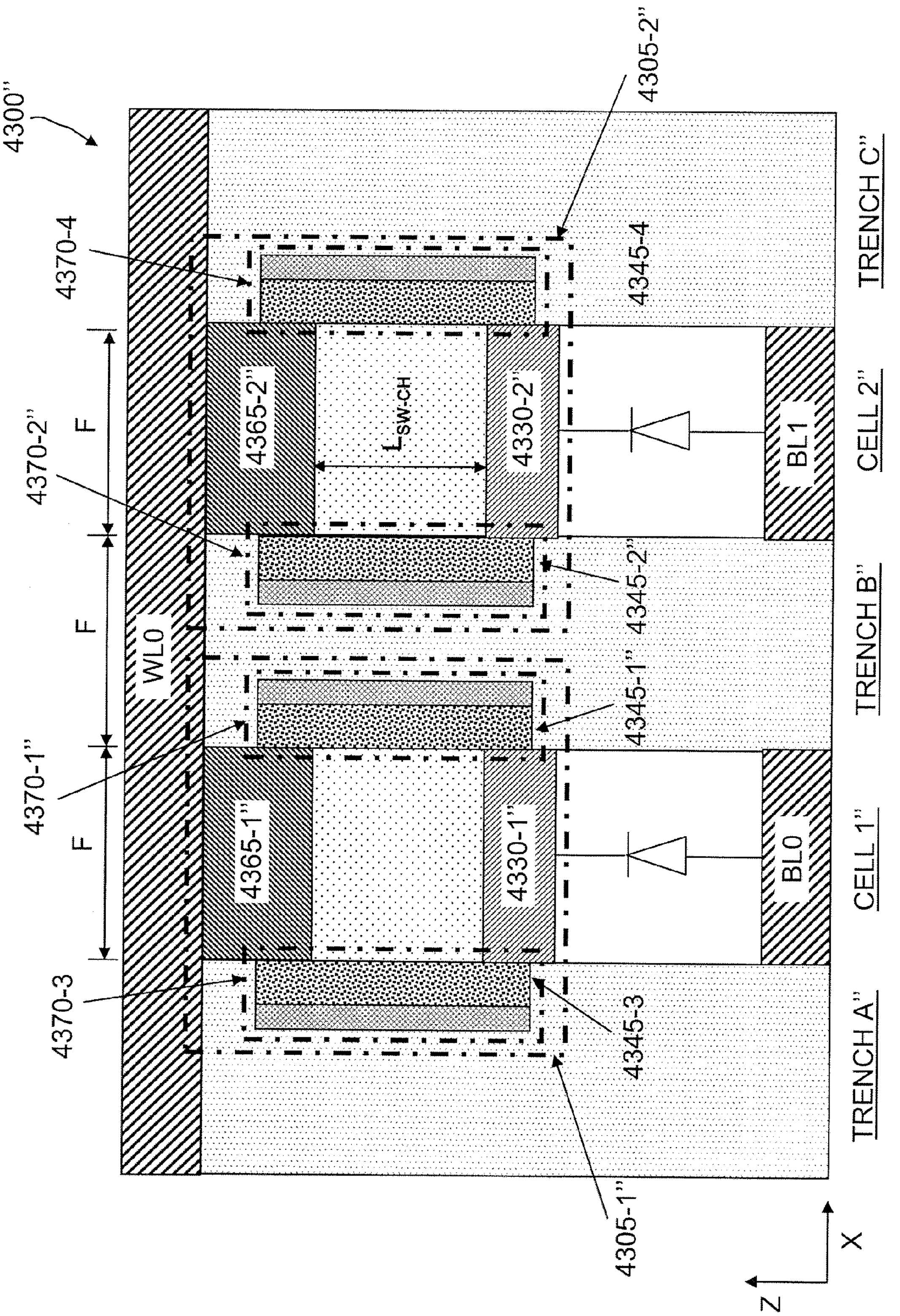

Nantotube channel elements 4270 and 4270' may be used instead of nanotube element 3745 illustrated in FIG. 37 and nanotube element 3745' illustrated in FIG. 39 to form new nonvolatile nanotube switch structures as illustrated in FIGS. 43A, 43B, and 43C. New cell structures may be cathode-on-NT or anode-on-NT type cells. FIGS. 43A, 43B, and 43C are shown for cathode-on-NT type cells for ease of comparison with FIG. 28A and FIGS. 34A-34FF described further above.

FIG. 43A illustrates cross section 4300 in which nonvolatile nanotube channel element storage devices are positioned within isolating trench B as illustrated by nonvolatile channel element 4370-1 positioned on the sidewall of a region of cell 1 and 4370-2 positioned on a region of cell 2, which correspond to nonvolatile channel element 4270 and 4270', respectively, illustrated by cross section 4275 in FIG. 42H. Cross section 4300 illustrated in FIG. 43A shows relatively thin nanotube elements 4345-1 and 4345-2 that may be, e.g., less than 10 nm thick. Nanotube element 4345-1 of nanotube channel element 4370-1 includes sidewall contacts to lower level contact 4330-1 and upper level contact 4365-1 of cell 1. Nonvolatile nanotube switch 4305-1 is formed by lower level contact 4330-1 and upper level contact 4365-1, both in contact with nanotube element 4345-1 of nanotube channel element 4370-1. Nanotube element 4345-2 of nanotube channel element 4370-2 includes sidewall contacts to lower level contact 4330-2 and upper level contact 4365-2 of cell 2. Nonvolatile nanotube switch 4305-2 is formed by lower level contact 4330-2 and upper level contact 4365-2, both in contact with nanotube element 4345-2 of nanotube channel element 4370-2. Cell 1 and cell 2 are greater than minimum dimension F in the X direction, however, overall cell periodicity remains 2F and array density remains unchanged.

FIG. 43B illustrates cross section 4300' in which nonvolatile nanotube channel element storage devices are positioned within isolating trench B' as illustrated by nonvolatile channel element 4370-1' positioned on the sidewall of a region of cell 1' and 4370-2' positioned on a region of cell 2', which correspond to nonvolatile channel element 4270 and 4270', respectively, illustrated by cross section 4275 in FIG. 42H. Cross section 4300' illustrated in FIG. 43B shows relatively thick nanotube elements 4345-1' and 4345-2' that may be, e.g., 15 nm thick. Nanotube element 4345-1' of nanotube channel element 4370-1' includes sidewall contacts to lower level contact 4330-1' and upper level contact 4365-1' of cell 1'. Nonvolatile nanotube switch 4305-1' is formed by lower level contact 4330-1' and upper level contact 4365-1', both in contact with nanotube element 4345-1' of nanotube channel element 4370-1'. Nanotube element 4345-2' of nanotube channel element 4370-2' includes sidewall contacts to lower level contact 4330-2' and upper level contact 4365-2' of cell 2'. Nonvolatile nanotube switch 4305-2' is formed by lower level contact 4330-2' and upper level contact 4365-2', both in contact with nanotube element 4345-2' of nanotube channel element 4370-2'. Cell 1' and cell 2' are greater than minimum dimension F in the X direction, however, overall cell periodicity remains 2F and array density remains unchanged.

FIG. 43C illustrates cross section 4300" in which nonvolatile nanotube channel element storage devices are positioned within isolating trench A", trench B", and trench C" as illustrated by nonvolatile channel elements 4370-1" and 4370-3 positioned on sidewalls of regions of cell 1" and nonvolatile channel elements 4370-2" and 4370-4 positioned on sidewalls of regions of cell 2". Cross section 4300" illustrated in FIG. 43C shows relatively thick channel elements 4345-1", 4345-2", 4345-3, and 4345-4 that may be, e.g., 15 nm thick. Nanotube elements of nanotube channel element 4370-1" and 4370-3 include sidewall contacts to lower level contact 4330-1" and upper level contact 4365-1" of cell 1". Nonvolatile nanotube switch 4305-1" is formed by lower level contact 4330-1" and upper level contact 4365-1", both in contact with nanotube elements 4345-1" and 4345-3 of nanotube channel elements 4370-1" and 4370-3, respectively, for an effective channel element thickness of 30 nm, for example. Nanotube elements of nanotube channel element 4370-2" and 4370-4 include sidewall contacts to lower level contact 4330-2" and upper level contact 4365-2" of cell 2". Nonvolatile nanotube switch 4305-2" is formed by lower level contact 4330-2" and upper level contact 4365-2", both in contact with nanotube elements 4345-2" and 4345-4 of nanotube channel elements 4370-2" and 4370-4, respectively, for an effective channel element thickness of 30 nm, for example. Cell 1" and cell 2" are greater than minimum dimension F in the X direction, however, overall cell periodicity remains 2F and array density remains unchanged. As cells become much smaller, e.g., 22 nm and even less, then the number of nanotube elements between contacts decreases and the resistance goes up. There are limits to the nanotube density per layer that can be achieved. Therefore, it can be useful to find ways to add layers of nanotubes to try to keep the number of nanotubes nearly the same (if possible) by putting more nanotube layers in parallel. In other words, the nanotube elements can be scaled to keep up with semiconductor scaling.

Non volatile 3D Memories using Vertically-Oriented Nonvolatile Nanotube Switches having Nanotube Elements Stacked Above Steering (Select) Diodes and within Trench Isolation Regions Nanotube elements included in nonvolatile nanotube switches may be incorporated within cell boundaries defined by isolation trenches as described further above with respect to FIGS. 37 and 39, and also with respect to structures illustrated in FIGS. 28A-28C and 31A-31C and with respect to methods of fabrication described with respect to FIGS. 34A-34FF and 36A-36FF. Also, nanotube elements included in nonvolatile nanotube switches may also be incorporated within isolation trench regions and outside cell boundaries as described further above with respect to FIGS. 43A-43C and methods of fabrication described with respect to FIGS. 42A-42H. However, it is possible to combine nanotube elements within cell boundaries and other nanotube elements in isolation trenches outside cell boundaries to form nonvolatile nanotube switches that include both types of nanotube configurations. As cells become much smaller, e.g., 22 nm and even less, then the number of nanotube elements between contacts decreases and the resistance goes up. There are limits to the nanotube density per layer that can be achieved. Therefore, it can be useful to find ways to add layers of nanotubes to try to keep the number of nanotubes nearly the same (if possible) by putting more nanotube layers in parallel. In other words, the nanotube elements can be scaled to keep up with semiconductor scaling.

Figure 44A:
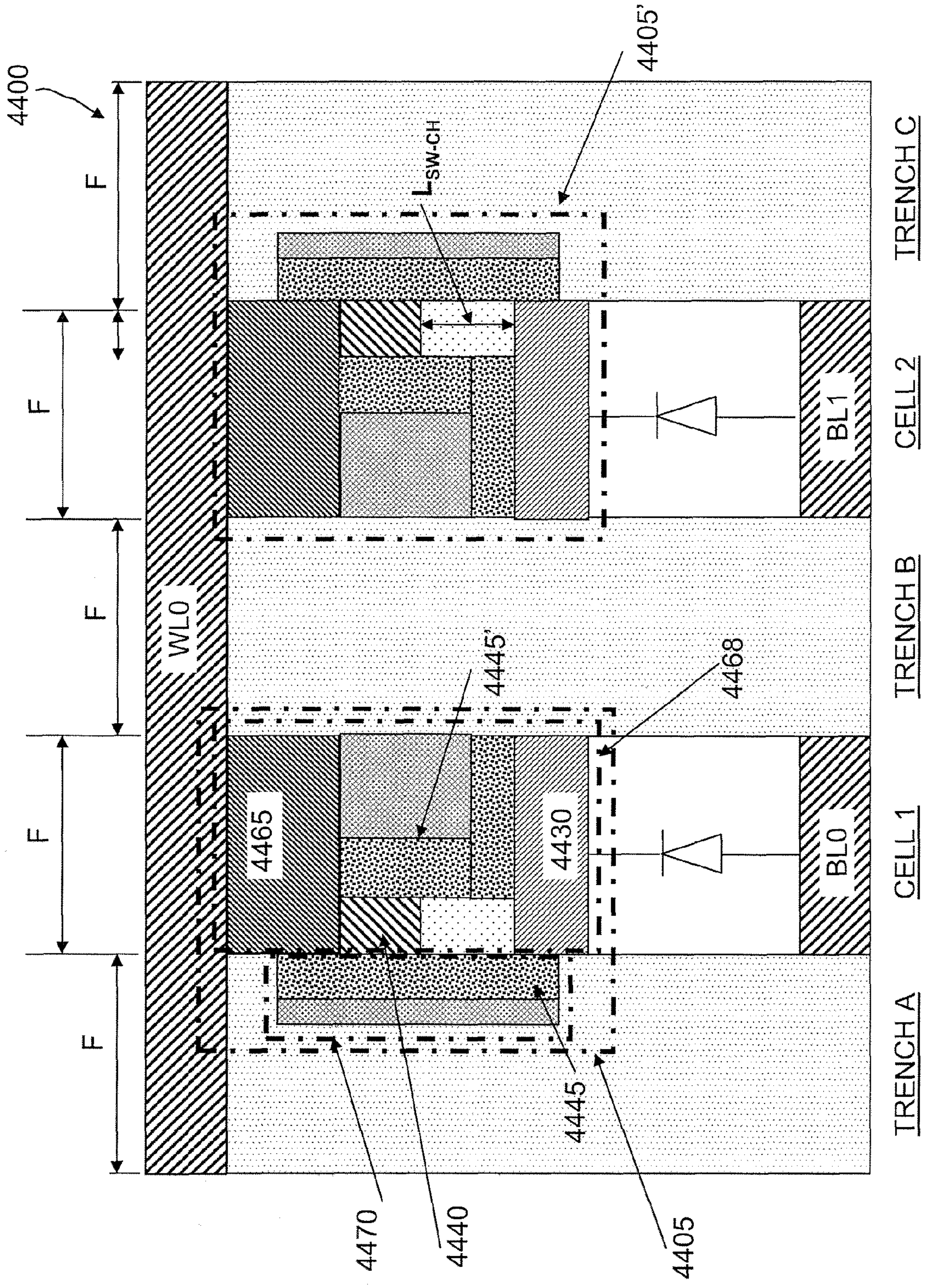
FIGS. 44A-44B illustrate embodiments of nonvolatile nanotube switches having nanotube elements of varying thickness both within cell boundary cell regions and outside cell boundary cell regions, but within and on vertical sidewalls of trench structures.

FIG. 44A illustrates cell 1 and mirror image cell 2 with nonvolatile nanotube switches 4405 and 4405'. Since cell 2 is a mirror image of cell 1, only cell 1 will be described in detail. Nonvolatile nanotube switch 4405 is formed by combining nonvolatile nanotube switch 4468 corresponding to nonvolatile nanotube switch 3905 illustrated in FIG. 39 and nanotube channel element 4470 corresponding to nanotube channel element 4370-3 illustrated in FIG. 43C. Nonvolatile nanotube switch 4405 may be formed by first forming nonvolatile nanotube switch 4468 using methods of fabrication described further above with respect to FIGS. 34A-34FF. Next, nanotube channel element 4470 is formed using methods of fabrication described with respect to FIGS. 42A-42H. Nanotube element 4445 of nanotube channel element 4470 shares lower level contact 4430 with nanotube element 4445', and shares sidewall contact 4440 and upper level contact 4465 with nanotube element 4445'. Both nanotube element 4445 and 4445' have approximately the same channel length $L_{SW-CH}$, in the range of less than 5 nm to greater than 250 nm for example. Thickness values of nanotube element 4445 and 4445' may be different values. In this example, minimum dimension F is assumed to be 32 nm and the thickness of each nanotube element may be 15 nm for an effective thickness of 30 nm for combined nanotube elements 4445 and 4445'. The effective thickness 30 nm of combined nanotube elements 4445 and 4445' is approximately equal to the cell dimension F of 32 nm because nanotube elements are used both inside the cell boundaries, and outside the cell boundaries, within isolation trench regions. While this example illustrates cathode-on-NT type cells, anode-on-NT cells may also be formed.

Nanotube elements included in nonvolatile nanotube switches may be incorporated within cell boundaries defined by isolation trenches as described further above with respect to FIG. 40. Also, nanotube elements included in nonvolatile nanotube switches may also be incorporated within isolation trench regions and outside cell boundaries as described further above with respect to FIGS. 43A-43C and methods of fabrication described with respect to FIGS. 42A-42H. However, it is possible to combine nanotube elements within cell boundaries and other nanotube elements in isolation trenches outside cell boundaries to form nonvolatile nanotube switches that include both types of nanotube configurations.

Figure 44B:
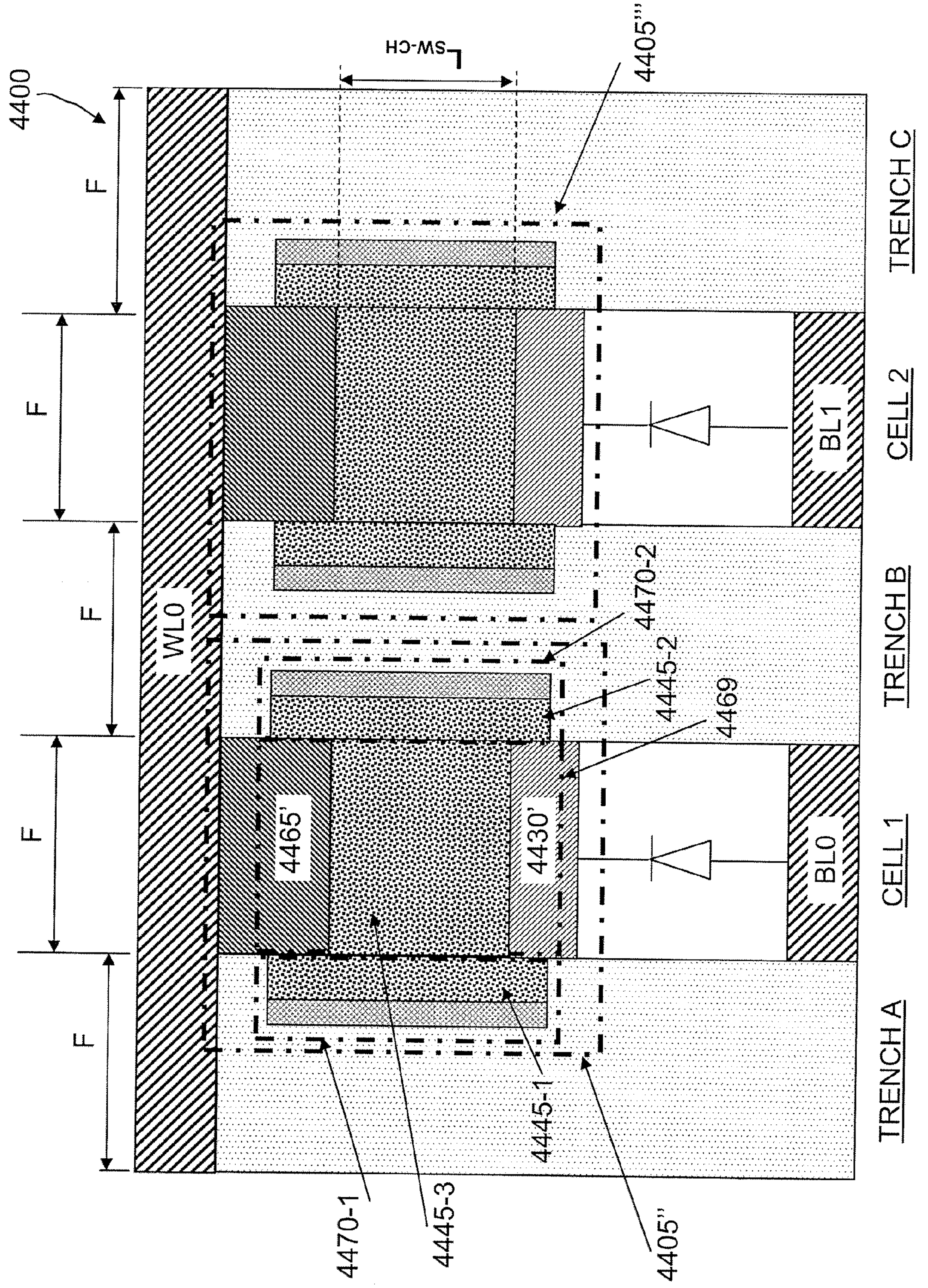

FIG. 44B illustrates cell 1 and cell 2 with nonvolatile nanotube switches 4405" and 4405 '". Since cell 2 is of the same as cell 1, only cell 1 will be described in detail. Nonvolatile nanotube switch 4405" is formed by combining nonvolatile nanotube switch 4469 corresponding to nonvolatile nanotube switch 4050 illustrated in FIG. 40 and nanotube channel elements 4470-1 and 4470-2 corresponding to nanotube channel element 4370-3 and 4370-1", respectively, illustrated in FIG. 43C. Nonvolatile nanotube switch 4405" may be formed by first forming nonvolatile nanotube switch 4469 using methods of fabrication similar to those of FIG. 40. Next, nanotube channel elements 4470-1 and 4470-2 are formed using methods of fabrication described with respect to FIG. 42. Nanotube elements 4445-1 of nanotube channel element 4470-1 and nanotube element 4445-2 of nanotube channel element 4470-2 share lower level contact 4430 with nanotube element 4445-3, and share upper level contact 4465 with nanotube element 4445-3. Nanotube elements 4445-1, 4445-2 and 4445-3 have approximately the same channel length $L_{SW-CH}$, in the range of less than 5 nm to greater than 150 nm for example. Thickness values of nanotube elements 4445-1, 4445-2, and 4445-3 may be different values. In this example, minimum dimension F is assumed to be 22 nm and the thickness of nanotube elements 4445-1 and 4445-2 may be 6 nm each and nanotube element 4445-3 may be 22 nm for a combined effective thickness of 34 nm for combined nanotube elements 4445-1, 4445-2, and 4445-3. The effective thickness 34 nm of combined nanotube elements 4445-1, 4445-2, and 4445-3 is approximately 50% greater than cell dimension F of 22 nm because nanotube elements are used both inside the cell boundaries, and outside the cell boundaries, within isolation trench regions. While this example illustrates cathode-on-NT type cells, anode-on-NT cells may also be formed. As cells become much smaller, e.g., 22 nm and even less, then the number of nanotube elements between contacts decreases and the resistance goes up. There are limits to the nanotube density per layer that can be achieved. Therefore, it can be useful to find ways to add layers of nanotubes to try to keep the number of nanotubes nearly the same (if possible) by putting more nanotube layers in parallel. In other words, the nanotube elements can be scaled to keep up with semiconductor scaling.

Nonvolatile 3D Memories Storing Two Bits per Cell using Two Vertically-Oriented Nonvolatile Nanotube Switches Sharing a Single Steering (Select) Diode FIGS. 33A-33D illustrate two stacked memory arrays, one cathode-on-NT type array and the other an anode-on-NT type array to double bit density. Each cell in the stack has one select (steering) diode and one nonvolatile nanotube switch. Cells described above with respect to FIGS. 43C and 44A-44B use two nanotube elements per cell connected in parallel to increase effective nanotube element thickness. However, with two nanotube elements per cell, it is possible double bit density by storing two data states (bits) in the same cell in two nanotube elements that share one select (steering) diode without necessarily stacking two arrays as described further above with respect to FIGS. 33A-33D.

Figure 45:
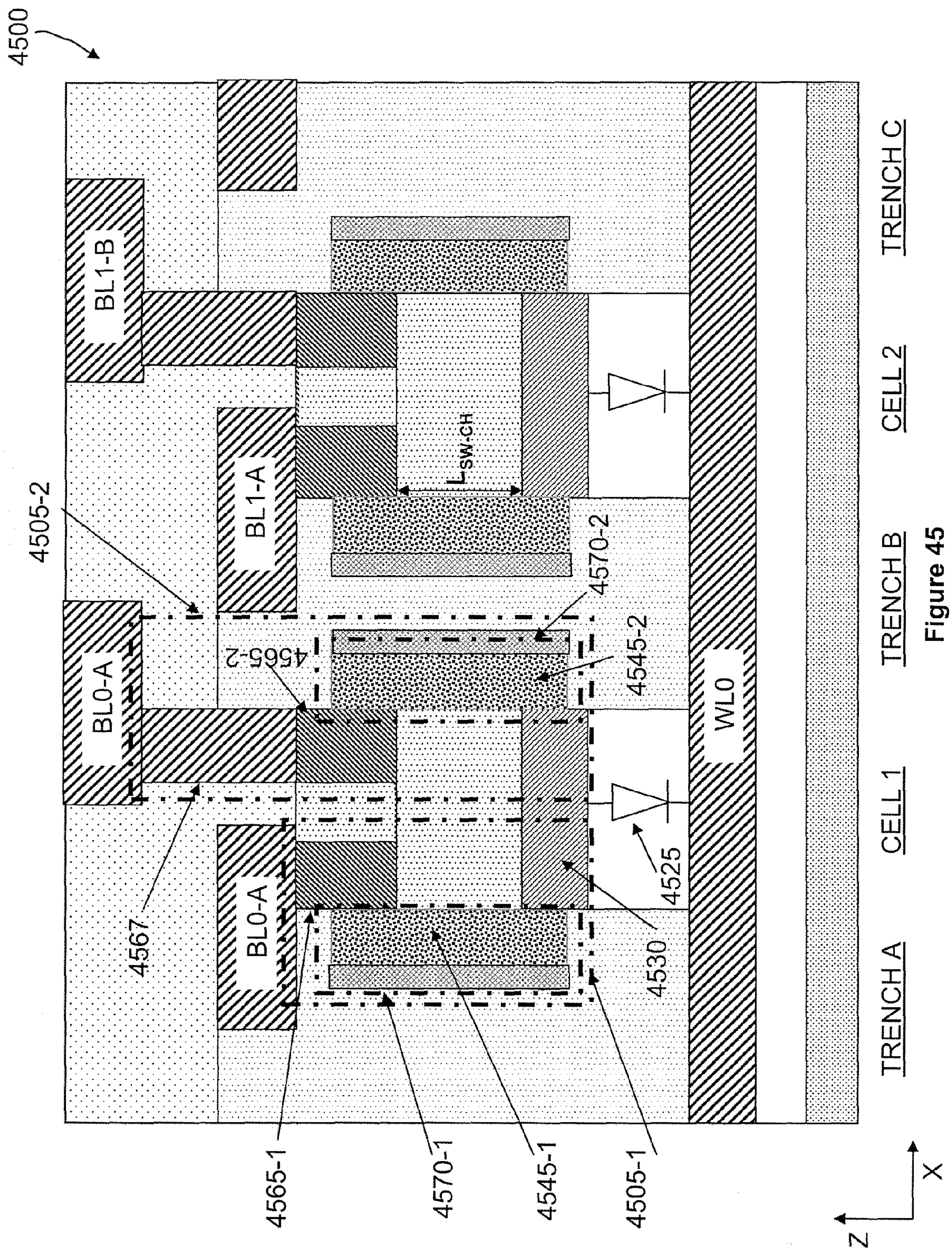
FIG. 45 illustrates a variation of the embodiments of FIGS. 43A-43C in which two nonvolatile nanotube switches share a single select (steering) diode to form a double dense 3D memory array without stacking two arrays as illustrated in FIGS. 33B, 33B', and 33C.

Memory array cross section 4500 illustrated in FIG. 45 shows cell 1 and cell 2 with identical nonvolatile nanotube switches. Since cell 1 and cell 2 are the same, only cell 1 will be described in detail. FIG. 45 illustrates cell 1 which stores two bits. One select (steering) diode 4525 connects word line WL0 and lower level contact 4530. Cell 1 includes the two nonvolatile nanotube switches 4505-1 and 4505-2 both sharing select (steering) diode 4525.

Nanotube channel element 4570-1 is formed within trench A and is similar to nanotube channel element 4370-3 illustrated in FIG. 43C. Nanotube element 4545-1 is in contact with shared lower level contact 4530 and upper level contact 4565-1. Upper level contact 4565-1 is in contact with bit line BL0-A. Nanotube element 4545-1 may store information via its resistance state.

Nanotube channel element 4570-2 is formed within trench B. Nanotube element 4545-2 is in contact with shared lower level contact 4530 and upper level contact 4565-2. Upper level contact 4565-2 is in contact with via 4567 which is in contact with bit line BL0-B. Nanotube element 4545-2 may also store information via its resistance state.

Cell 1 includes nonvolatile nanotube switch 4505-1 storing one bit, for example, and nonvolatile nanotube switch 4505-2 also storing one bit, for example such that cell 1 stores two bits, for example. Cross section 4500 illustrated in FIG. 45 illustrates a 3D memory array that stores two bits per cell, one bit in nonvolatile nanotube switch 4505-1 and the other bit in nonvolatile nanotube switch 4505-2. Memory array cross section 4500 illustrated in FIG. 45 has the same density as stacked arrays shown in FIGS. 33A-33C without requiring the stacking of two separate arrays. While this example illustrates anode-on-NT type cells, cathode-on-NT cells may also be used instead.

FIG. 45 illustrates a modified version of FIG. 43C in which sub-minimum upper level contacts 4565-1 and 4565-2 and contact via 4567 are formed using methods of fabrication corresponding to self aligned spacer techniques, sacrificial shapes, and fill and planarization techniques to form sub-minimum insulator and conductor regions as described further above with respect to FIGS. 36A-36FF. More specifically, self aligned spacer techniques are described further above with respect to FIGS. 36E and 36F; formation of sub-minimum sacrificial layers is described with respect to FIGS. 36P through 36S; and formation of minimum and sub-minimum contact regions is described with respect to FIGS. 36Y, 36Z, and 36AA.

FIGS. 33A-33C illustrate two stacked arrays, one cathode-on-NT type array and the other an anode-on-NT type array to double bit density. Each cell in the stack has one select (steering) diode and one nonvolatile nanotube switch. Cells described above with respect to FIGS. 43C and 44A-B use two nanotube elements per cell connected in parallel to increase effective nanotube element thickness. However, with two nanotube elements per cell, it is possible double bit density by storing two data states (bits) in the same cell in two nanotube elements that share one select (steering) diode without having to stack two arrays as described further above with respect to FIGS. 33A-33C.

Figure 46:
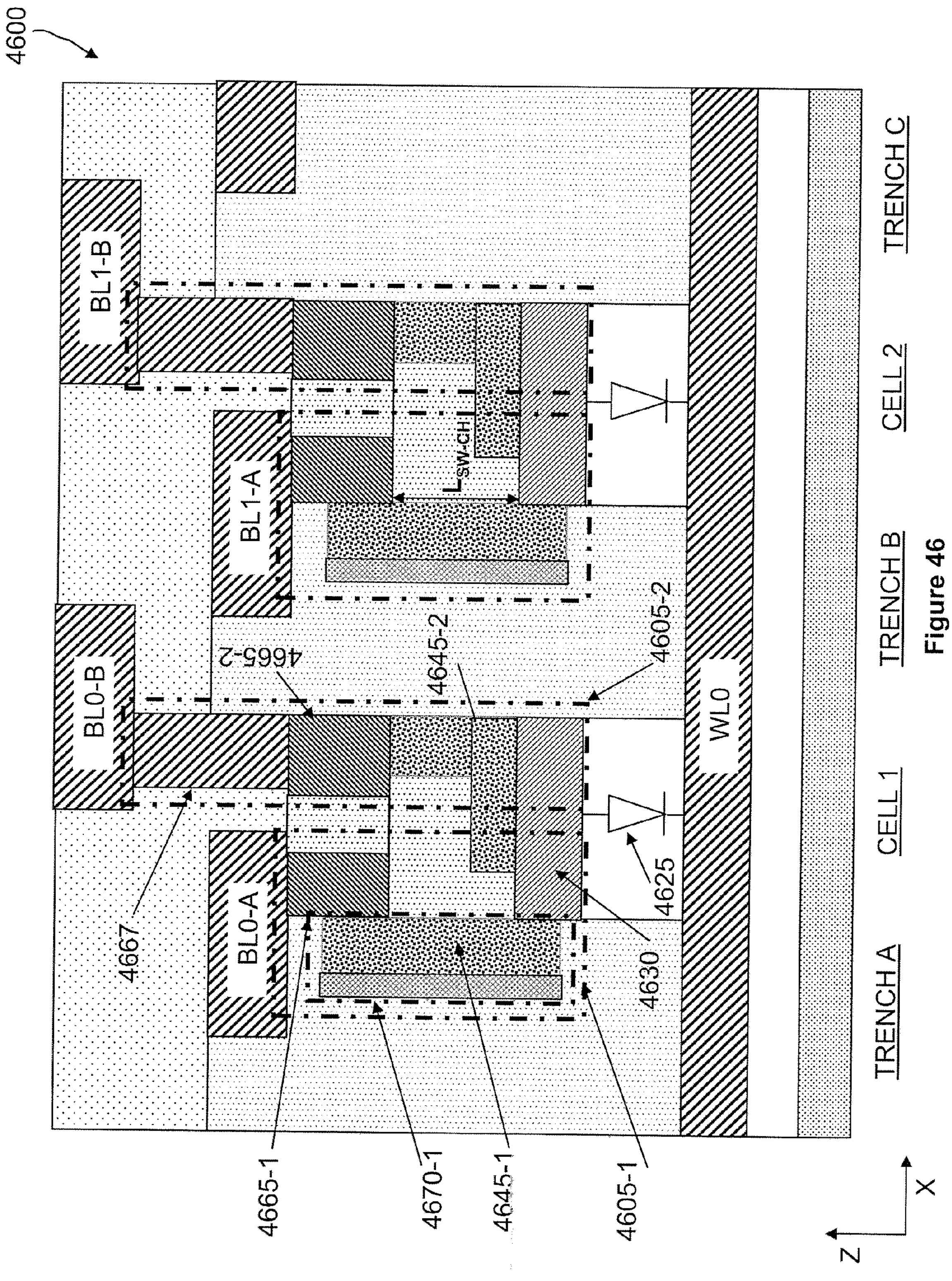
FIG. 46 illustrates a variation the embodiments of FIGS. 44A-44B in which two nonvolatile nanotube switches share a single select (steering) diode to form a double dense 3D memory array without stacking two arrays as illustrated in FIGS. 33B, 33B', and 33C.

Memory array cross section 4600 illustrated in FIG. 46 shows cell 1 and cell 2 with identical nonvolatile nanotube switch configurations. Since cell 1 and cell 2 are the same, only cell 1 will be described in detail. FIG. 46 illustrates cell 1 which stores two bits, for example. One select (steering) diode 4625 connects word line WL0 and lower level contact 4630. Cell 1 includes the two nonvolatile nanotube switches 4605-1 and 4605-2 both sharing select (steering) diode 4625.

Nanotube channel element 4670-1 is formed within trench A and is similar to nanotube channel element 4470 illustrated in FIG. 44A. Nanotube element 4645-1 is in contact with shared lower level contact 4630 and upper level contact 4665-1. Upper level contact 4665-1 is in contact with bit line BL0-A. Nanotube element 4645-1 may store information via its resistance state.

Nanotube element 4645-2 is part of nonvolatile nanotube switch 4605-2 which is formed inside cell 1 boundaries as described further above with respect to nonvolatile nanotube 4468 illustrated in FIG. 44A, except for modified upper level contact structures described further below. Nanotube element 4645-2 is in contact with shared lower level contact 4630 and upper level contact 4665-2. Upper level contact 4665-2 is in contact with via 4667 which is in contact with bit line BL0-B. Nanotube element 4645-2 may also store information via its resistance state.

Cell 1 includes nonvolatile nanotube switch 4605-1 storing one bit, for example, and nonvolatile nanotube switch 4605-2 also storing one bit, for example, such that cell 1 stores two bits, for example. Cross section 4600 illustrated in FIG. 46 illustrates a 3D memory array that can store two bits per cell, one bit in nonvolatile nanotube switch 4605-1 and the other bit in nonvolatile nanotube switch 4605-2, for example. Memory array cross section 4600 illustrated in FIG. 46 has the same density as stacked arrays shown in FIGS. 33A-33C without requiring the stacking of two separate arrays. While this example illustrates anode-on-NT type cells, cathode-on-NT cells may also be used instead.

FIG. 46 illustrates a modified version of FIGS. 44A-44B in which sub-minimum upper level contacts 4665-1 and 4665-2 and contact via 4667 are formed using methods of fabrication corresponding to self aligned spacer techniques, sacrificial shapes, and fill and planarization techniques to form sub-minimum insulator and conductor regions as described further above with respect to FIGS. 36A-36FF. More specifically, self aligned spacer techniques are described further above with respect to FIGS. 36E and 36F; formation of sub-minimum sacrificial layers is described with respect to FIGS. 36P through 36S; and formation of minimum and sub-minimum contact regions is described with respect to FIGS. 36Y, 36Z, and 36AA.

Nonvolatile 3D Memory using Horizontally-Oriented Self-Aligned End-Contacted Nanotube Elements Stacked Above Steering (Select) Diodes FIG. 40 illustrates cross section 4000 and includes nanotube switch 4005 in which the thickness of nanotube element 4050 may be equal to the cell dimension F. In general, there is no need for the thickness of the nanotube element to be related in any particular way to the lateral dimensions of the cell. In this example, nanotube element 4050 may be deposited by spray-on methods of fabrication for example. For a technology node (generation) with F approximately 22 nm and a nanotube element thickness of approximately 22 nm for example, the nanotube region fills the available cell region. A sidewall contact is eliminated and Lower level contact 4030 and upper level contact 4065 form the two terminal (contact) regions to nanotube 4050. Vertical channel length $L_{SW\text{-}CH}$ is determined by the separation between upper layer contact 4065 and lower layer contact 4030. While cross section 4000 achieves high levels of 3D cell density, scaling of channel length $L_{SW\text{-}CH}$ is limited because nanotube element 4050 is porous. In some embodiments, $L_{SW\text{-}CH}$ must maintain a separation of hundreds of nanometers to ensure no shorting occurs between upper level contact 4065 and lower level contact 4030 through the nanotube element. However, various methods and configurations can be used in order to reduce the thickness of the nanotube element, and thus $L_{SW\text{-}CH}$, while still preventing shorting between the upper and lower level contacts. Some of exemplary methods and configurations for achieving this are described in greater detail below.

Figure 47:
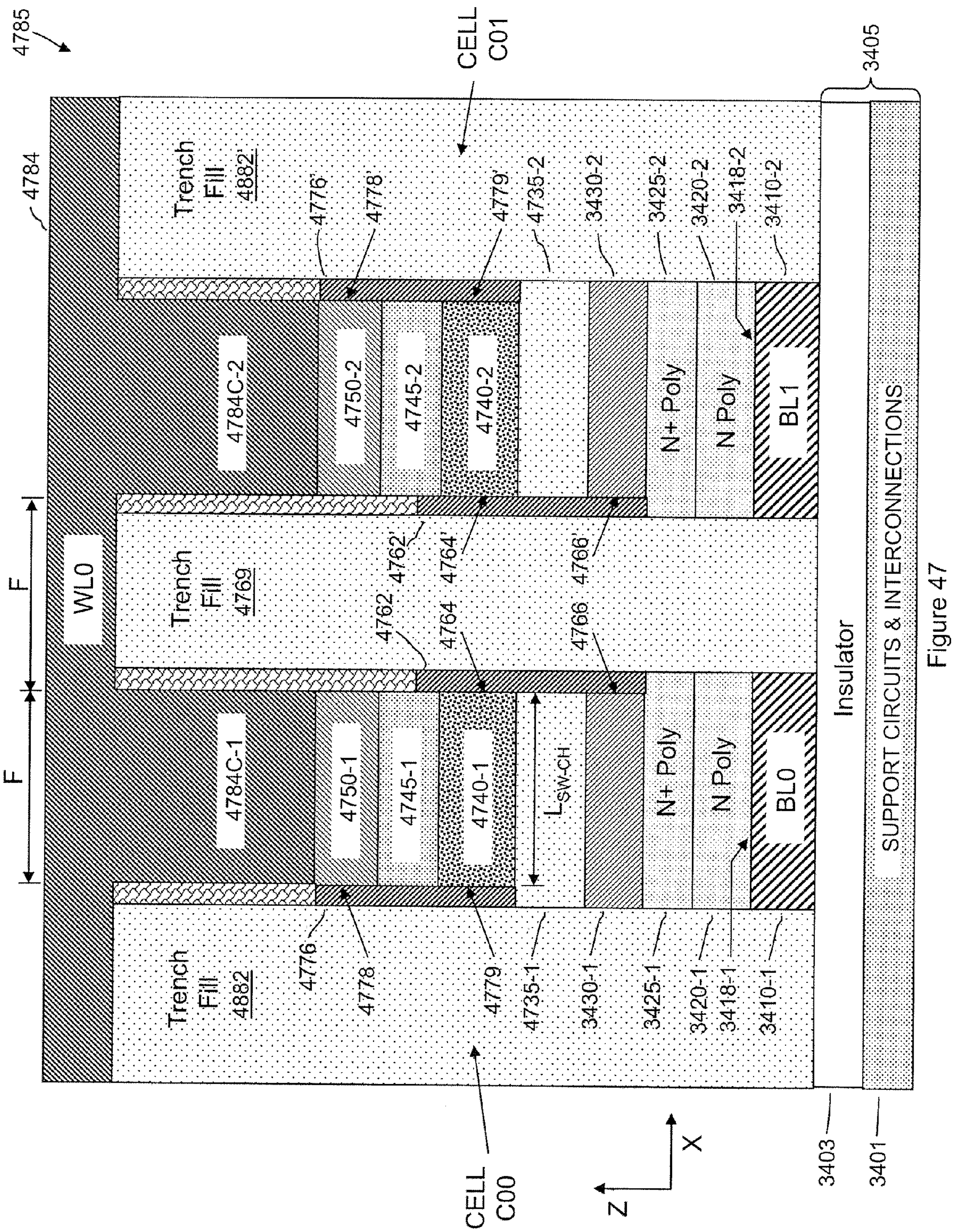
FIG. 47 illustrates a three dimensional cross section of an embodiment of a dense 3D cell structure formed with a cathode-to-NT nonvolatile nanotube diode with a Schottky diode in series with a horizontally-oriented self-aligned end-contacted nanotube switch connected to contact regions using trench sidewall wiring.

Cross section 4785 illustrated in FIG. 47 shows horizontally-oriented nonvolatile nanotube elements separated from upper level contacts and lower level contacts by insulating regions. Nanotube element end-contacts are used to connect nanotube elements with corresponding upper level contacts on one end and corresponding lower level contacts on the other end using trench sidewall wiring. This structure enables cell scaling in nanotube element channel length ($L_{SW\text{-}CH}$), channel width ($W_{SW\text{-}CH}$), and height (thickness). Methods of fabrication of cathode-on-NT 3D memory arrays are described in FIGS. 48A-48BB.

Figure 49:
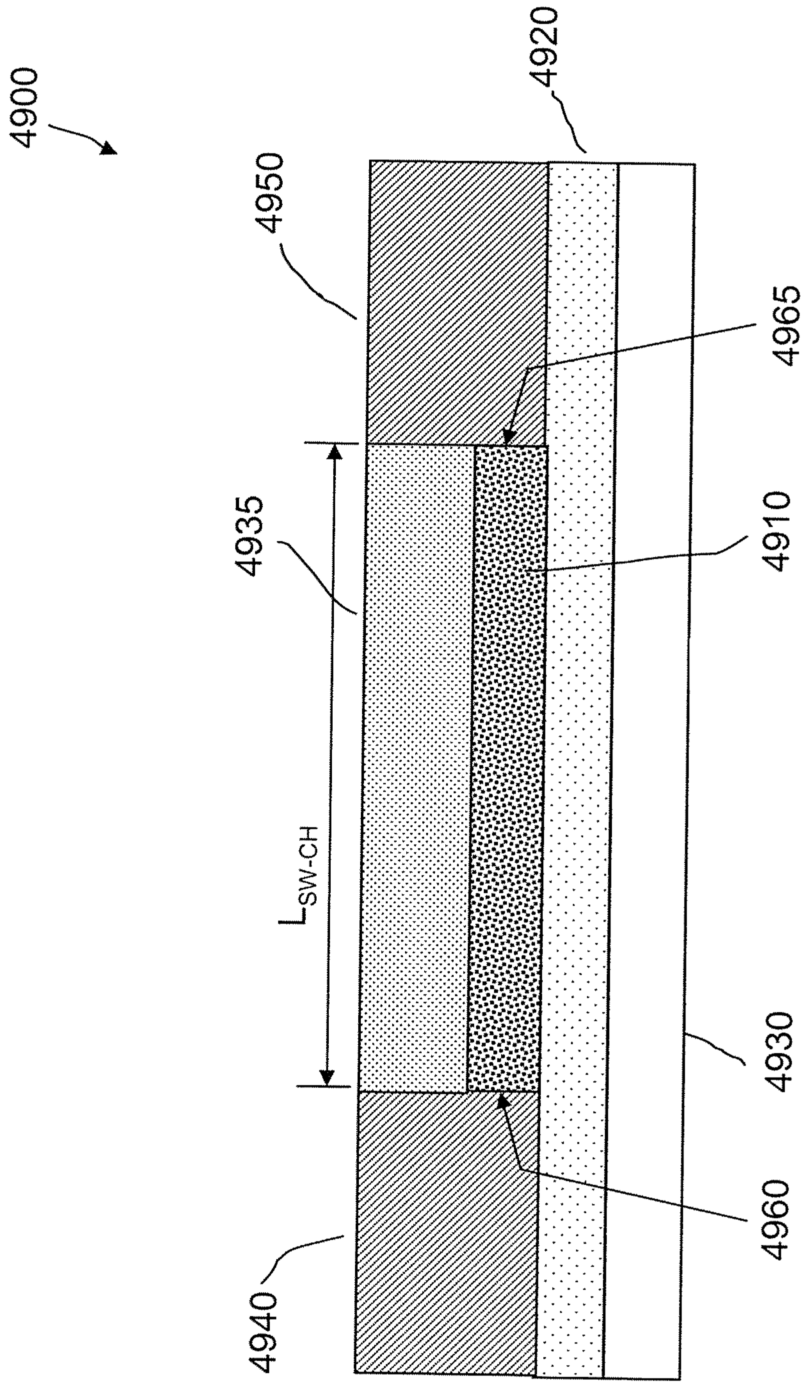
FIG. 49 illustrates an embodiment of a nonvolatile nanotube switch in an essentially horizontal orientation in which two terminals are provided at opposite ends of a patterned nanotube channel element, and only contacting said nanotube element end regions.
Figure 50:
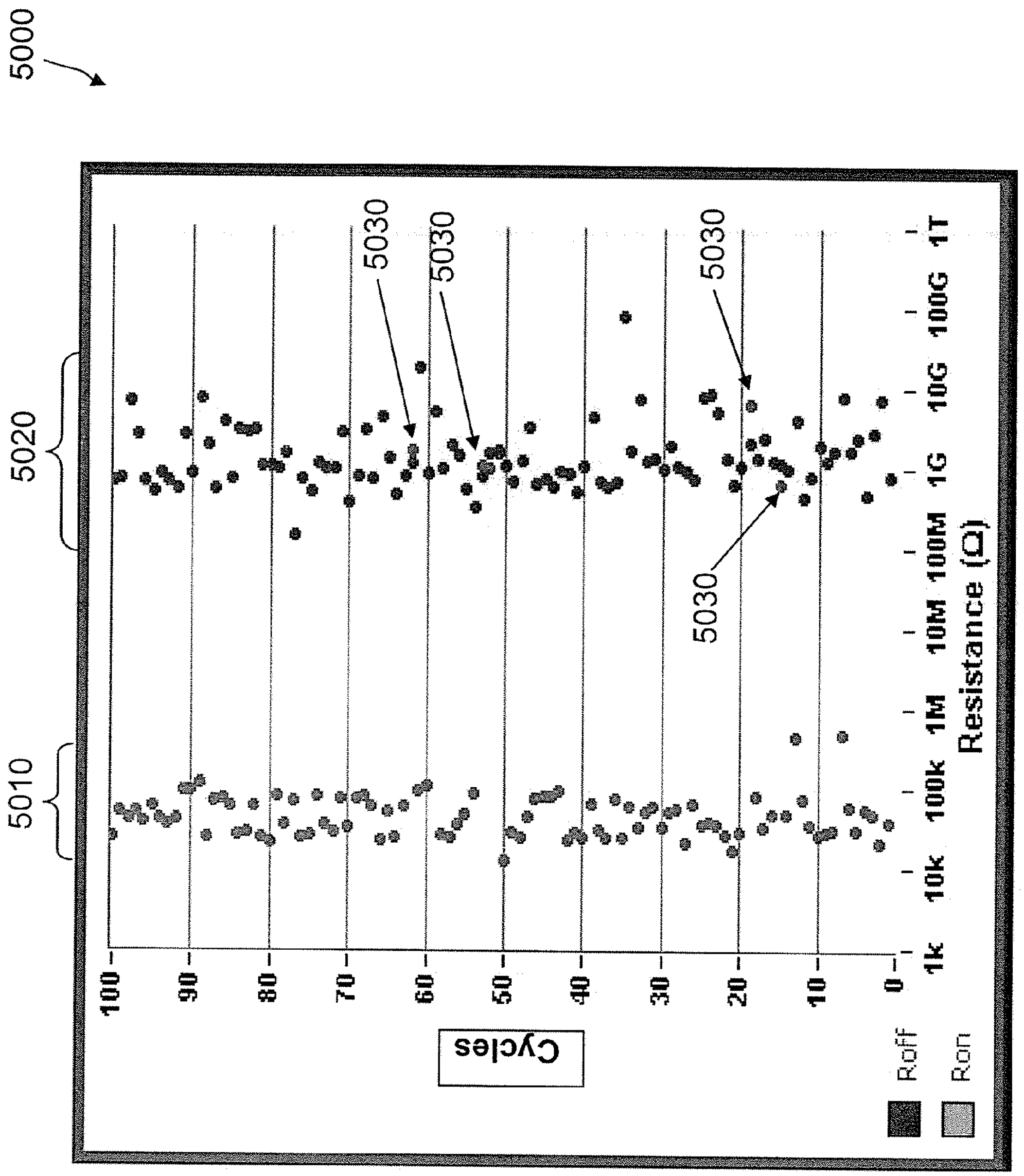
FIG. 50 illustrates the operation of the switch of FIG. 49, according to some embodiments.

FIG. 49 depicts a nonvolatile nanotube switch using end-contacts. FIG. 50 illustrates the operation of the end-contacted nonvolatile nanotube switch depicted in FIG. 49.

Figure 51:
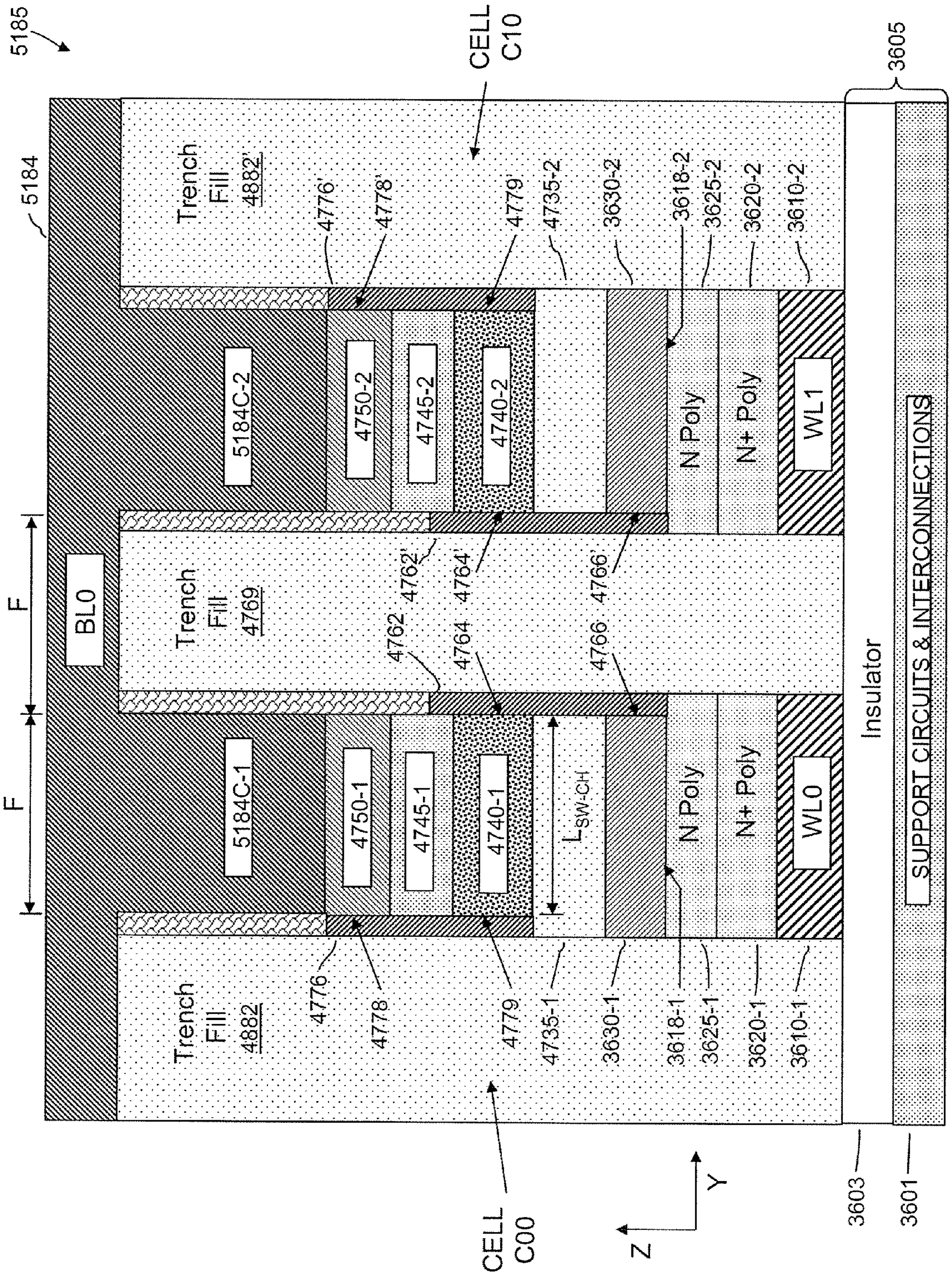
FIGS. 51 and 52 illustrate corresponding three dimensional cross sections of embodiments of dense 3D cell structures formed with an anode-to-NT nonvolatile nanotube diode with a Schottky diode in series with a horizontally-oriented self-aligned end-contacted nanotube switch connected to contact regions using trench sidewall wiring.
Figure 52:
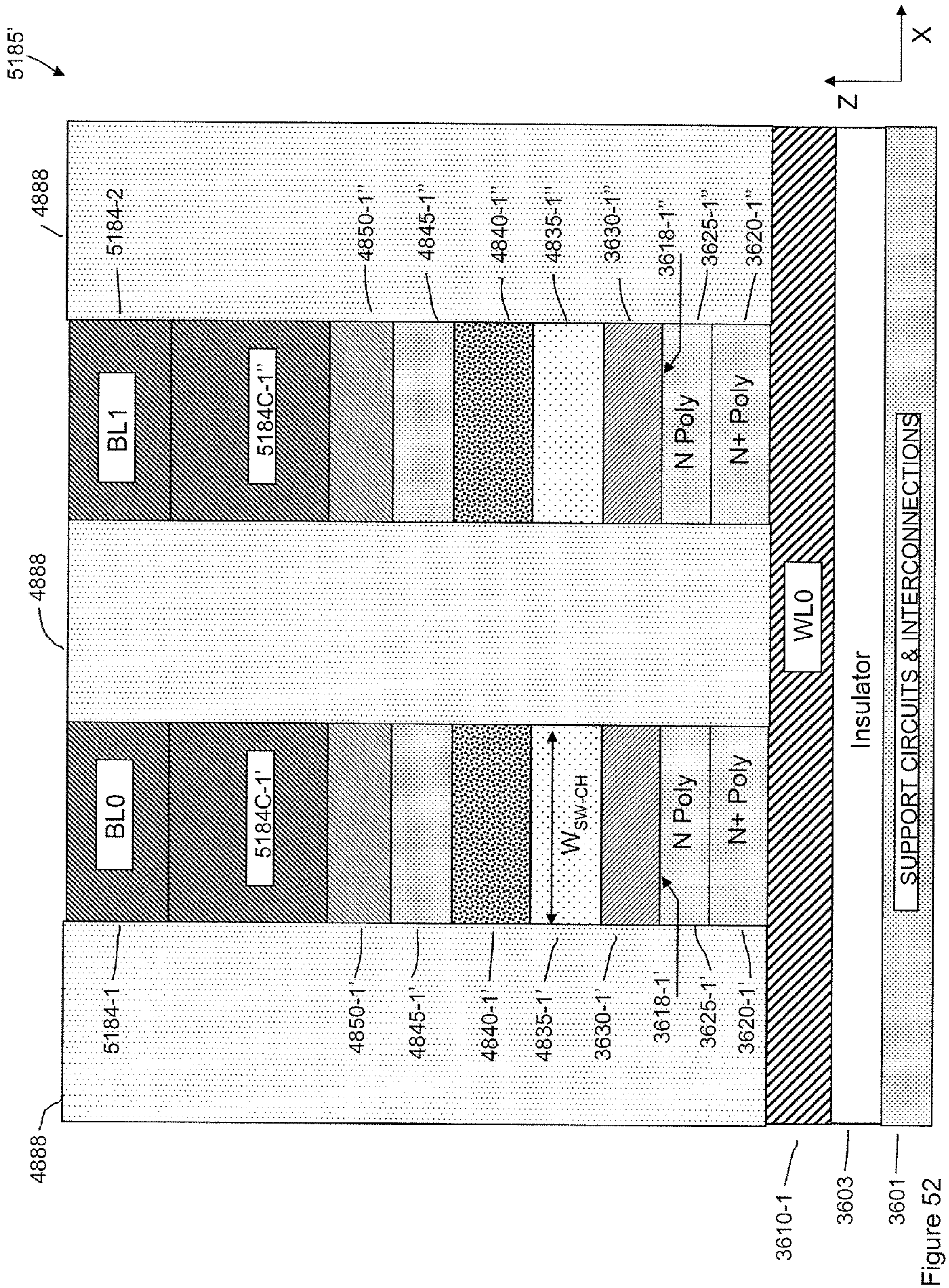

FIGS. 51 and 52 show cross sections of nanotube element end-contacted switches used in anode-on-NT 3D memory arrays.

Figure 48A:
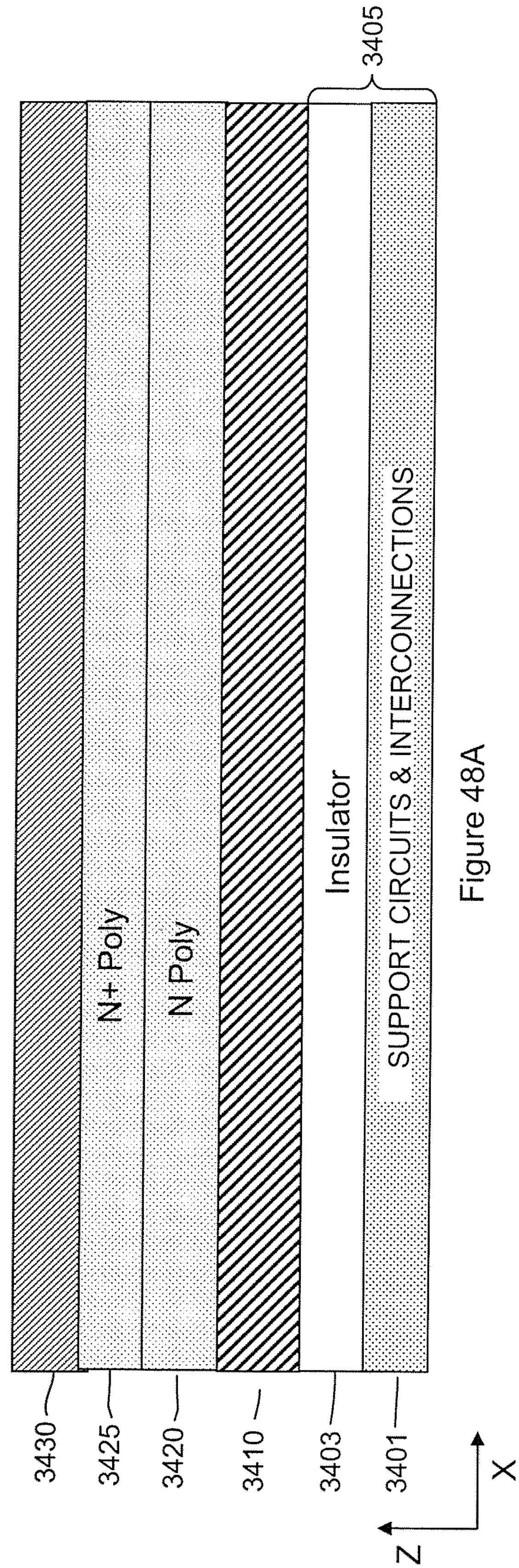
FIGS. 48A-48BB illustrate a method of fabrication of the structure in FIG. 47 using a trench fill conductor approach to generating trench sidewall wiring, according to some embodiments.
Figure 48B:
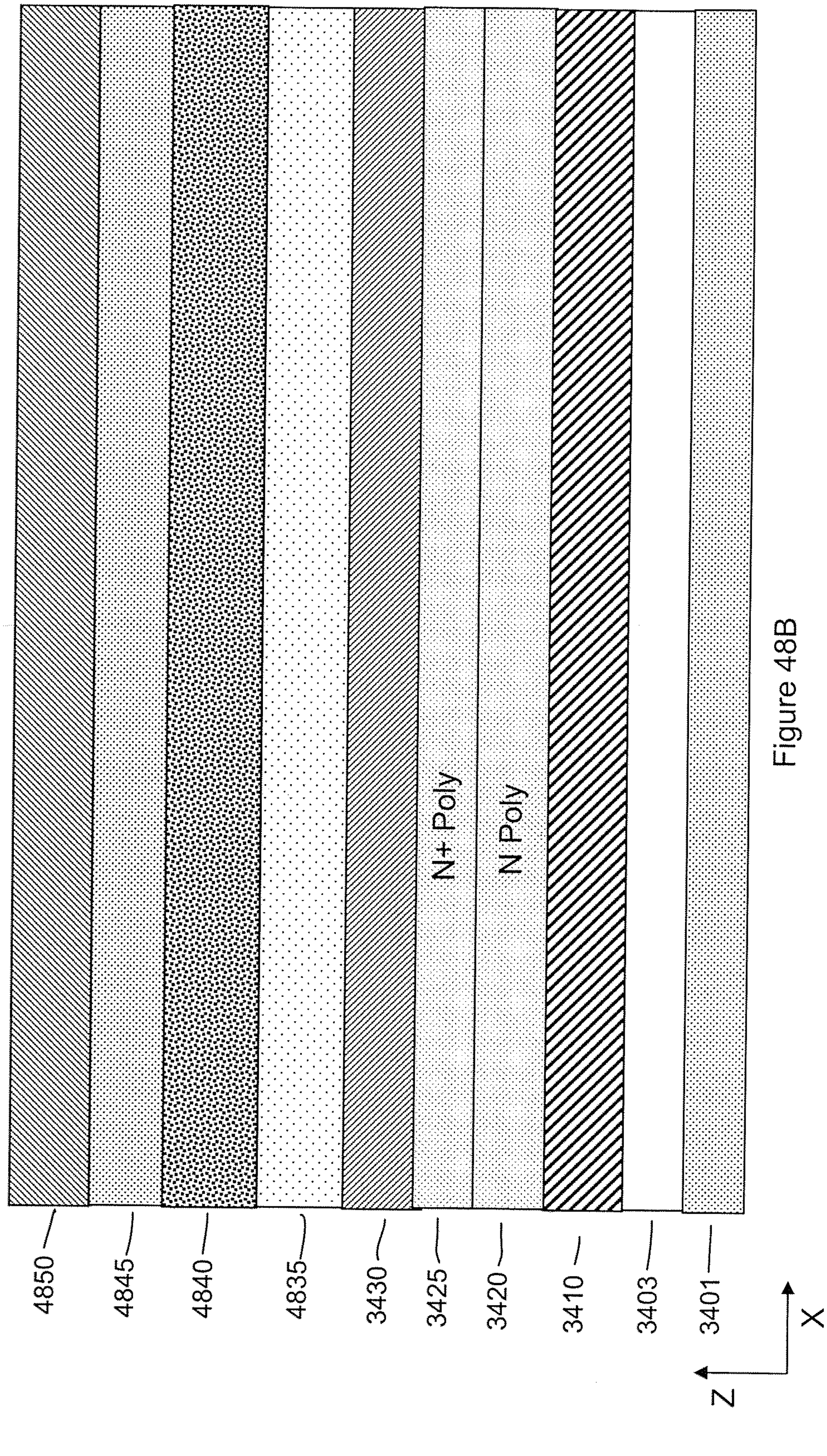
Figure 53:
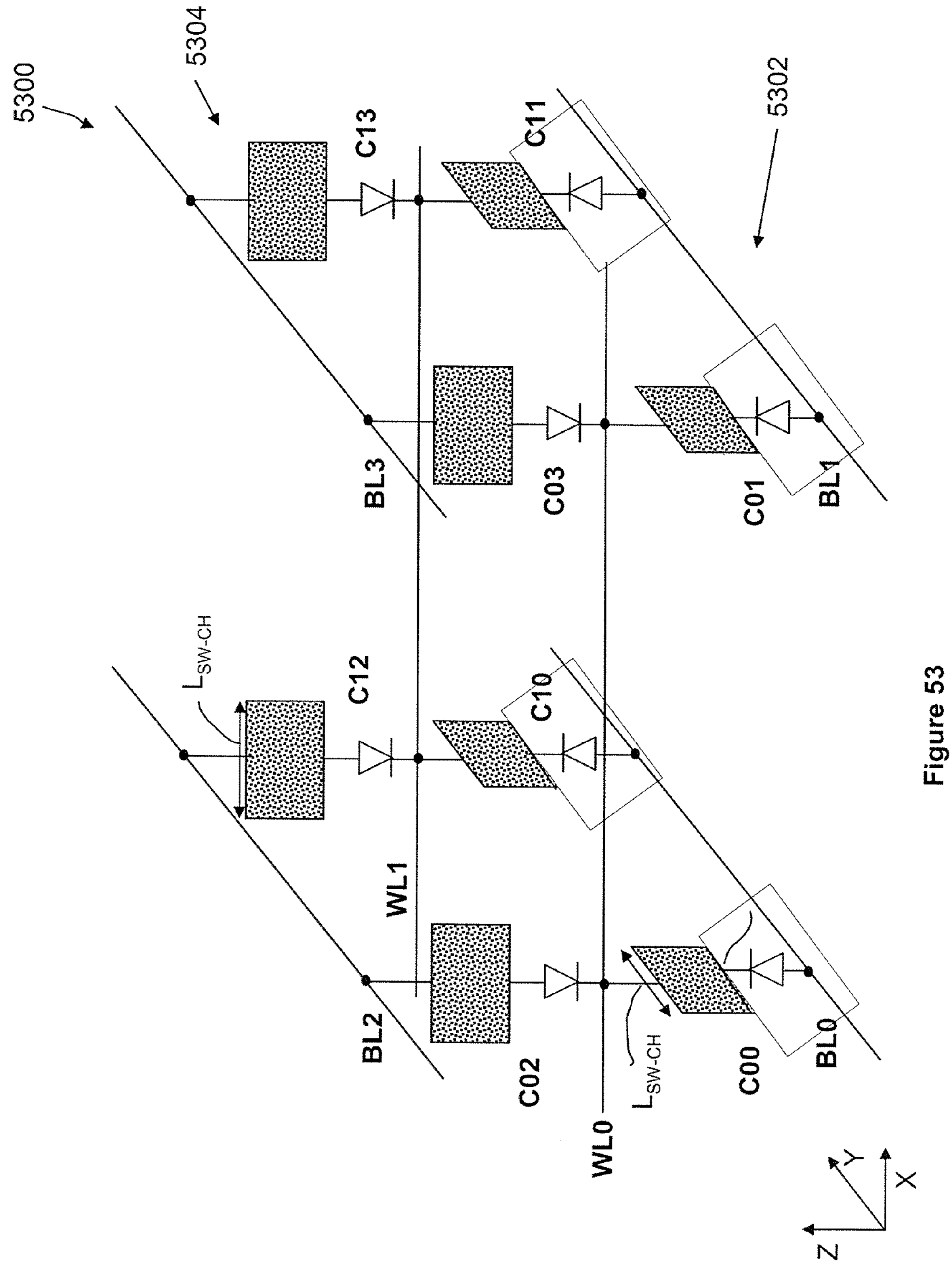
FIG. 53 illustrates a perspective view of an embodiment of stacked two-high memory array using cathode-on-NT and anode-on-NT stacked arrays.
Figure 54A:
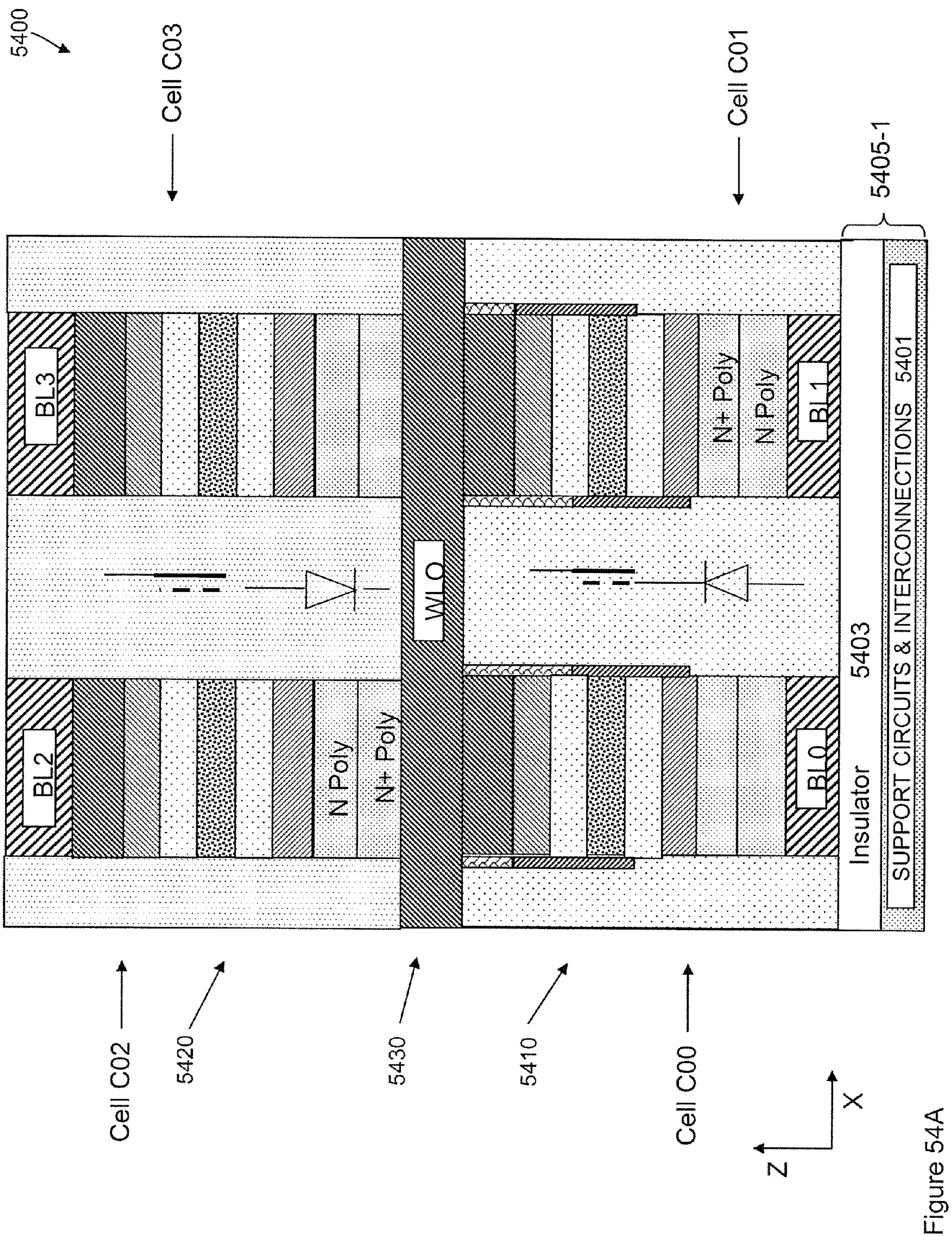
FIGS. 54A-54B illustrate cross sections of embodiments of two high memory arrays using the 3D memory structures of FIGS. 47, 48, 51, and 52.
Figure 54B:
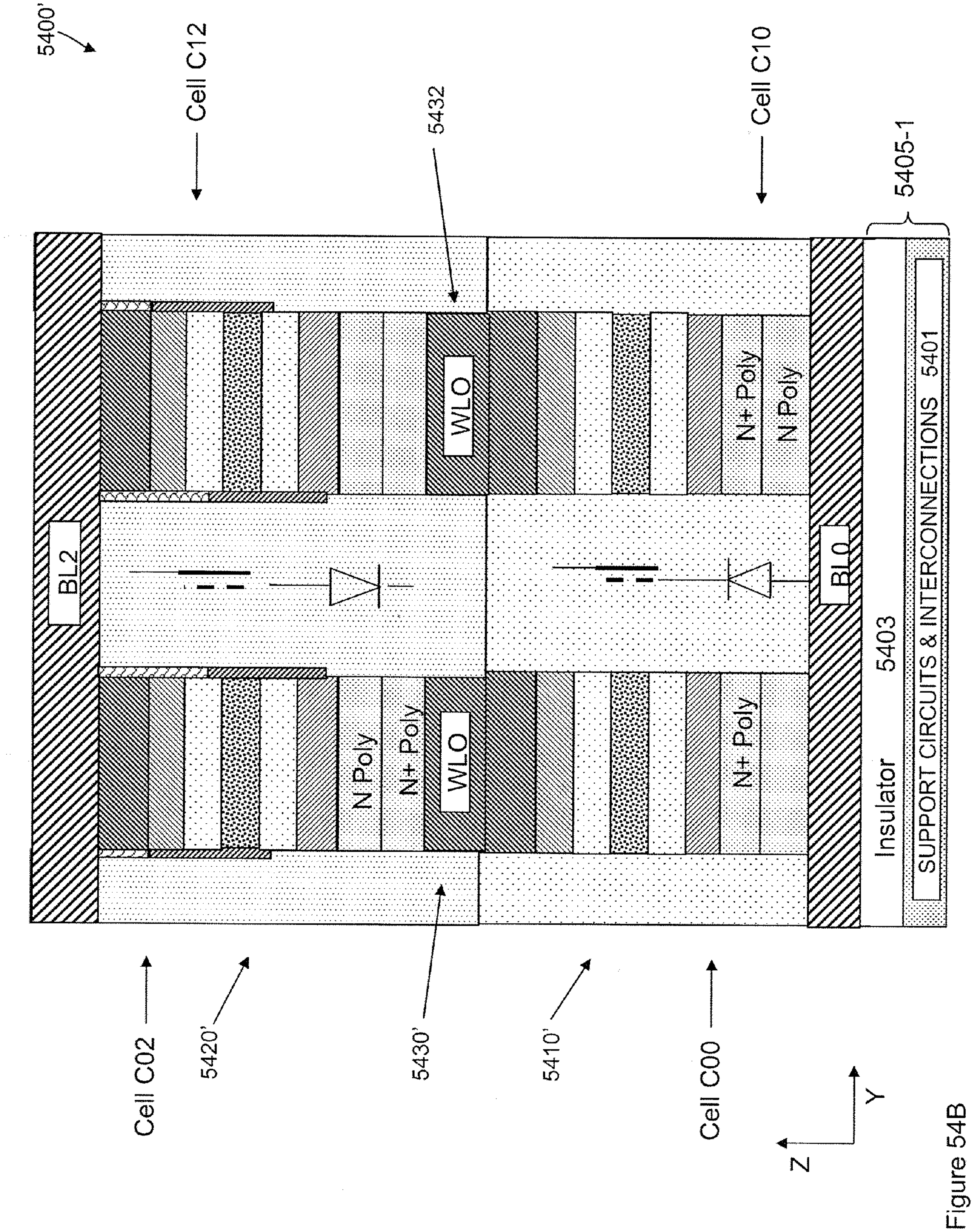

FIGS. 53 and 54A and 54B illustrated a two-high memory stack using combinations of cathode-on-NT and anode-on-nanotube 3D memory arrays based on new 3D cells described in FIGS. 47, 48A-48BB, 51, and 52.

FIGS. 55A-55F illustrate structures and corresponding methods of fabrication for trench sidewall wiring formed using conformal conductors in the trench region. Methods of fabrication used with FIGS. 48A-48BB use a conductor trench fill approach when forming trench sidewall wiring.

3-Dimensional Cell Structure of Nonvolatile Cells using NV NT Devices having Vertically Oriented Diodes and Horizontally Oriented Self Aligned NT Switches using Conductor Trench-Fill for Cathode-on-NT Switch Connections FIG. 47 illustrates cross section 4785 including cells C00 and C01 in a 3-D memory embodiment. Nanotube layers are deposited horizontally on a planar insulator surface above previously defined diode-forming layers as illustrated in FIGS. 34A and 34B shown further above. Self-alignment methods, similar to self-alignment methods described further above with respect to FIGS. 34A-34FF and 36A-36FF, determine the dimensions and locations of trenches used to define cell boundaries. Self-aligned trench sidewall wiring connects horizontally-oriented nanotube elements with vertically-oriented diodes and also with array wiring.

Methods 2710 described further above with respect to FIG. 27A are used to define support circuits and interconnections 3401.

Next, methods 2730 illustrated in FIG. 27B deposit and planarize insulator 3403. Interconnect means through planar insulator 3403 (not shown in cross section 4785 but shown above with respect to cross section 2800" in FIG. 28C) may be used to connect metal array lines in 3-D arrays to corresponding support circuits and interconnections 3401. By way of example, bit line drivers in BL driver and sense circuits 2640 may be connected to bit lines BL0 and BL1 in array 2610 of memory 2600 illustrated in FIG. 26A described further above, and in cross section 4785 illustrated in FIG. 47. At this point in the fabrication process, methods 2740 may be used to form a memory array on the surface of insulator 3403, interconnected with memory array support structure 3405-1 illustrated in FIG. 47.

Methods 2740 illustrated in FIG. 27B deposit and planarize metal, polysilicon, insulator, and nanotube elements to form nonvolatile nanotube diodes which, in this example, include multiple vertically oriented diode and horizontally-oriented nonvolatile nanotube switch series pairs. Individual cell boundaries are formed in a single etch step, each cell having a single NV NT Diode defined by a single trench etch step after layers, except the WL0 layer, have been deposited and planarized, in order to eliminate accumulation of individual layer alignment tolerances that would substantially increase cell area. Individual cell dimensions in the X direction are F (1 minimum feature) as illustrated in FIG. 47, and also F in the Y direction (not shown) which is orthogonal to the X direction, with a periodicity in X and Y directions of 2F. Hence, each cell occupies an area of approximately $4F^2$.

Vertically-oriented (Z direction) trench sidewall cell wiring on a first cell sidewall connects a vertically-oriented diode and one end of a horizontally-oriented nanotube element; and vertically-oriented trench sidewall cell wiring on a second cell sidewall connects the other end of the horizontally-oriented nanotube element with array wiring. Exemplary methods of forming vertically-oriented trench sidewall cell wiring may be adapted from methods of patterning shapes on trench sidewalls such as methods disclosed in U.S. Pat. No. 5,096,849, the entire contents of which are incorporated herein by reference. Horizontally-oriented NV NT switch element (nanotube element) dimensions in the X and Y direction are defined by trench etching. There are no alignment requirements for the nanotube elements in the X or Y direction. Nanotube element thickness (Z direction) is typically in the 5 to 40 nm range. However, nanotube element thickness may be any desired thickness, less than 5 nm or greater than 40 nm for example.

Horizontally-oriented nanotube elements may be formed using a single nanotube layer, or may be formed using multiple layers. Such nanotube element layers may be deposited e.g., using spin-on coating techniques or spray-on coating techniques, as described in greater detail in the incorporated patent references. FIG. 47 illustrates 3-D memory array cross section 4785 in the X direction and corresponds to methods of fabrication illustrated with respect to FIG. 48. Nanotube element length dimension $L_{SW\text{-}CH}$ and width dimension $W_{SW\text{-}CH}$ are determined by etched trench wall spacing. If trench wall spacing is substantially equal to minimum technology node dimension F in both X and Y direction, then for technology nodes 90 nm, 65 nm, 45 nm, and 22 nm for example, $L_{SW\text{-}CH}$ and $W_{SW\text{-}CH}$ will be approximately 90 nm, 65 nm, 45 nm, and 22 nm for example.

Methods fill trenches with an insulator; and then methods planarize the surface. Then, methods deposit and pattern word lines on the planarized surface.

The fabrication of vertically-oriented 3D cells illustrated in FIG. 47 proceeds as follows. Methods deposit a bit line wiring layer on the surface of insulator 3403 having a thickness of 50 to 500 nm, for example, as described further below with respect to FIG. 48. Fabrication of the vertically-oriented diode portion of structure 4785 is the same as in FIGS. 34A and 34B described further above and are incorporated in methods of fabrication described with respect to FIG. 48. Methods etch the bit line wiring layer and define individual bit lines such as bit line conductors 3410-1 (BL0) and 3410-2 (BL1). Bit lines such as BL0 and BL1 are used as array wiring conductors and may also be used as anode terminals of Schottky diodes. Alternatively, Schottky diode junctions 3418-1 and 3418-2 may be formed using metal or silicide contacts (not shown) in contact with N polysilicon regions 3420-1 and 3420-2, while also forming ohmic contacts with bit line conductors 3410-1 and 3410-2, N polysilicon regions 3420-1 and 3420-2 may be doped with arsenic or phosphorus in the range of $10^{14}$ to $10^{17}$ dopant atoms/$cm^3$ for example, and may have a thickness range of 20 nm to 400 nm, for example.

FIG. 47 illustrates a cathode-to-NT type NV NT diode formed with Schottky diodes. However, PN or PIN diodes may be used instead of Schottky diodes as described further below with respect to FIG. 48A.

The electrical characteristics of Schottky (and PN, PIN) diodes may be improved (low leakage, for example) by controlling the material properties of polysilicon, for example polysilicon deposited and patterned to form polysilicon regions 3420-1 and 3420-2. Polysilicon regions may have relatively large or relatively small grain boundary sizes that are determined by methods used in the semiconductor regions. For example, SOI deposition methods used in the semiconductor industry may be used that result in polysilicon regions that are single crystalline (no longer polysilicon), or nearly single crystalline, for further electrical property enhancement such as low diode leakage currents.

Examples of contact and conductors materials include elemental metals such as Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

In some cases conductors such as Al, Au, W, Cu, Mo, Ti, and others may be used as both contact and conductors materials as well as anodes for Schottky Diodes. However, in other cases, optimizing anode material for lower forward voltage drop and lower diode leakage is advantageous. Schottky diode anode materials may be added (not shown) between conductors 3410-1 and 3410-2 and polysilicon regions 3420-1 and 3420-2, respectively. Such anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002m pp. 31-41, the entire contents of which are incorporated herein by reference.

Next, having completed Schottky diode select devices, methods form N+ polysilicon regions 3425-1 and 3425-2 to contact N polysilicon regions 3420-1 and 3420-2, respectively, and also to form contact regions for ohmic contacts to contacts 3430-1 and 3430-2. N+ polysilicon is typically doped with arsenic or phosphorous to $10^{20}$ dopant atoms/$cm^3$, for example, and has a thickness of 20 to 400 nm, for example. N and N+ polysilicon region dimensions are defined by trench etching near the end of the process flow.

Next, methods form planar insulating regions 4735-1 and 4735-2 on the surface of lower level contact (contact) 3430-1 and 3430-2, respectively, typically $SiO_2$ for example, with a thickness of 20 to 500 nm for example and X and Y dimensions defined by trench etching near the end of the process flow.

Next, methods form horizontally-oriented nanotube elements 4740-1 and 4740-2 on the surface of insulator regions 4735-1 and 4735-2, respectively, having nanotube element length and width defined by trench etching near the end of the process flow and insulated from direct contact with lower level contacts 3430-1 and 3430-2, respectively. In order to improve the density of cells C00 and C01, nanotube elements 4740-1 and 4740-2 illustrated in FIG. 47 are horizontally-oriented with trench-defined end-contacts 4764 and 4779 in contact with nanotube element 4740-1, and end-contacts 4764' and 4779' in contact with nanotube element 4740-2 as described further below. Horizontally-oriented nanotube elements and methods of making same are described in greater detail in the incorporated patent references.

Then, methods form protective insulators 4745-1 and 4745-2 on the surface of conformal nanotube elements 4740-1 and 4740-2, respectively, with X and Y dimensions defined by trench etching near the end of the process flow. Exemplary methods of forming protective insulator 4745-1 and 4745-2 are described further below with respect to FIG. 48B.

Next, methods form upper level contacts 4750-1 and 4750-2 on the surface of protective insulators 4745-1 and 4745-2, respectively, with X and Y dimensions defined by trench etching near the end of the process flow.

Next, methods form (etch) trench openings of width F form inner sidewalls of cells COO and C01 and corresponding upper and lower level contacts, nanotube elements, and insulators described further above.

Next, methods form sidewall vertical wiring 4762 and 4762'. Vertical sidewall wiring 4762 forms and connects end-contact 4764 of nanotube element 4740-1 with end-contact 4766 of lower level contact 3430-1; vertical sidewall wiring 4762' forms and connects end-contact 4764' of nanotube element 4740-2 with end-contact 4766' of lower level contact 3430-2.

Next, methods complete trench formation (etching) to the surface of insulator 3403.

Next, methods fill trench opening with an insulator such as TEOS and planarize the surface to complete trench fill 4769.

Next, methods form (etch) trench openings of width F that form outer sidewalls of cells C00 and C01 and corresponding upper and lower level contacts, nanotube elements, and insulators described further above.

Next, methods form sidewall vertical wiring 4776 and 4776'. Vertical sidewall wiring 4776 forms and connects end-contact 4778 of nanotube element 4740-1 with the end-contact region of upper level contact 4750-1; vertical sidewall wiring 4776' forms and connects end-contact 4778' of nanotube element 4740-2 with the end-contact region of upper level contact 4850-2.

Next, methods complete trench formation (etching) to the surface of insulator 3403.

Next, methods fill trench openings with an insulator such as TEOS and planarize the surface to complete trench fill 4882 and 4882'.

Next, methods directionally etch and form word line contacts 4784C-1 and 4784C-2 on the surface of upper level contacts 4750-1 and 4750-2, respectively, by depositing and planarizing a word line layer.

Next, methods pattern word line 4784.

Nonvolatile nanotube diodes forming cells C00 and C01 correspond to nonvolatile nanotube diode 1200 in FIG. 12, one in each of cells C00 and C01. Cells C00 and C01 illustrated in cross section 4785 in FIG. 47 correspond to corresponding cells C00 and C01 shown schematically in memory array 2610 in FIG. 26A, and bit lines BL0 and BL1 and word line WL0 correspond to array lines illustrated schematically in memory array 2610.

Methods 2700 illustrated in FIGS. 27A and 27B may be used to fabricate memories using NV NT diode devices with cathode-to-NT switch connections for horizontally-oriented self-aligned NV NT switches such as those shown in cross section 4785 illustrated in FIG. 47 as described further below with respect to FIG. 48. Structures such as cross section 4785 may be used to fabricate memory 2600 illustrated schematically in FIG. 26A.

Methods of Fabricating 3-Dimensional Cell Structure of Nonvolatile Cells using NV NT Devices having Vertically Oriented Diodes and Horizontally-Oriented Self Aligned NT Switches Using Conductive Trench-Fill for Cathode-to-NT Switch Connection Methods 2710 illustrated in FIG. 27A are used to define support circuits and interconnects similar to those described with respect to memory 2600 illustrated in FIG. 26A as described further above. Methods 2710 apply known semiconductor industry techniques design and fabrication techniques to fabricated support circuits and interconnections 3401 in and on a semiconductor substrate as illustrated in FIG. 48A. Support circuits and interconnections 3401 include FET devices in a semiconductor substrate and interconnections such as vias and wiring above a semiconductor substrate. FIG. 48A corresponds to FIG. 34A illustrating a Schottky diode structure, except that an optional conductive Schottky anode contact layer 3415 shown in FIG. 34A is not shown in FIG. 48A. Note that FIG. 34A' may be used instead of FIG. 34A' as a starting point if a PN diode structure is desired. If N polysilicon layer 3417 in FIG. 34A' were replaced with an intrinsically doped polysilicon layer instead (not shown), then a PIN diode would be formed instead of a PN diode. Therefore, while the structure illustrated in FIG. 48A illustrates a Schottky diode structure, the structure may also be fabricated using either a PN diode or a PIN diode.

Methods of fabrication for elements and structures for support circuits and interconnections 3401, insulator 3403, memory array support structure 3405, conductor layer 3410, N polysilicon layer 3420, N+ polysilicon layer 3425, and lower level contact layer 3430 illustrated in FIG. 48A are described further above with respect to FIGS. 34A and 34B.

Next, methods of fabrication deposit insulator layer 4835 as illustrated in FIG. 48B on the surface of lower level contact layer 3430. Insulator layer 4835 is typically $SiO_2$ with a thickness range of 20 to 500 nm for example.

Next, methods deposit a horizontally-oriented nanotube layer 4840 on the planar surface of insulator layer 4835 as illustrated in FIG. 48B. Horizontally-oriented nanotube layer 4840 may be formed using a single nanotube layer, or may be formed using multiple nanotube layers. Such nanotube layers may be deposited e.g., using spin-on coating techniques or spray-on coating techniques, as described in greater detail in the incorporated patent references.

Next, methods form protective insulator layer 4845 on the surface on nanotube layer 4840 as illustrated in FIG. 48B. Protective insulator layer 4845 may be formed using appropriate material known in the CMOS industry, including, but not limited to: PVDF (Polyvinylidene Fluoride), Polyimide, PSG (Phosphosilicate glass) oxide, Orion oxide, LTO (planarizing low temperature oxide), sputtered oxide or nitride, flowfill oxide, ALD (atomic layer deposition) oxides. CVD (chemical vapor deposition) nitride may also be used, and these materials may be used in conjunction with each other, e.g., a PVDF layer or mixture of PVDF and other copolymers may be placed on top of nanotube layer 4840 and this complex may be capped with ALD $Al_2O_3$ layer, however any non-oxygen containing high temperature polymers could be used as passivation layers. In some embodiments passivation materials such as PVDF may be mixed or formulated with other organic or dielectric materials such as PC7 to generate specific passivation properties such as to impart extended lifetime and reliability. Various materials and methods are described in U.S. patent application Ser. No. 11/280,786.

At this point in the fabrication process, methods deposit upper level contact layer 4850 on the surface of insulator layer 4845 as illustrated in FIG. 48B. Upper level contact layer 4850 may be 10 to 500 nm in thickness, for example. Upper level contact layer 4850 may be formed using Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, for example.

Figure 48C:
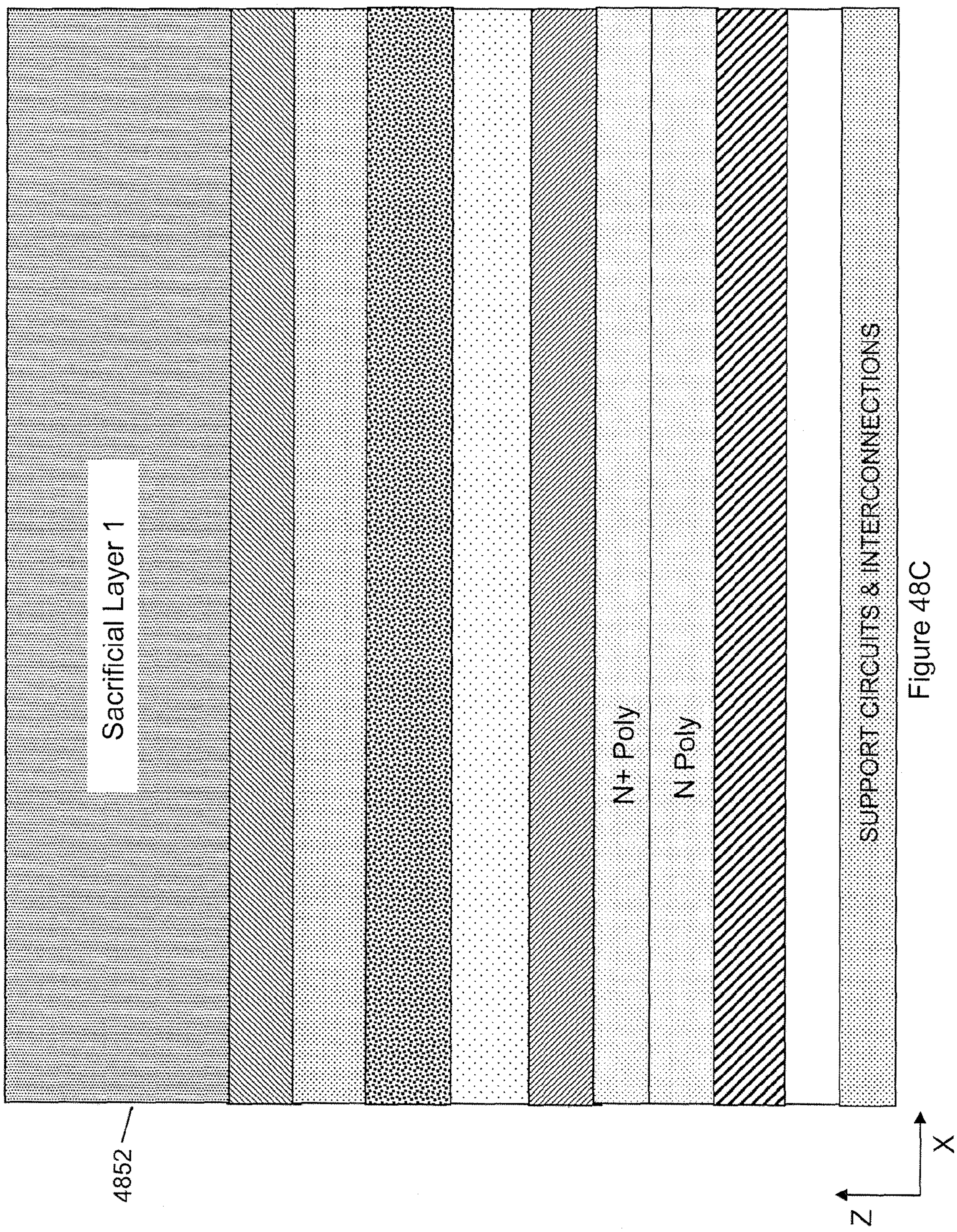

Next methods deposit sacrificial layer 4852 (sacrificial layer 1) on upper level contact layer 4850 as illustrated in FIG. 48C. Sacrificial layer 4852 may be in the range of 10 to 500 nm thick and be formed using conductor, semiconductor, or insulator materials such as materials described further above with respect to lower level contact layer 3430, semiconductor layers 3420 and 3425, and insulator layers 4835 and 4845.

Next, methods deposit and pattern a masking layer (not shown) deposited on the top surface of sacrificial layer 4852 using known industry methods. The mask opening may be aligned to alignment marks in planar insulating layer 3403 for example; the alignment is not critical.

Figure 48D:
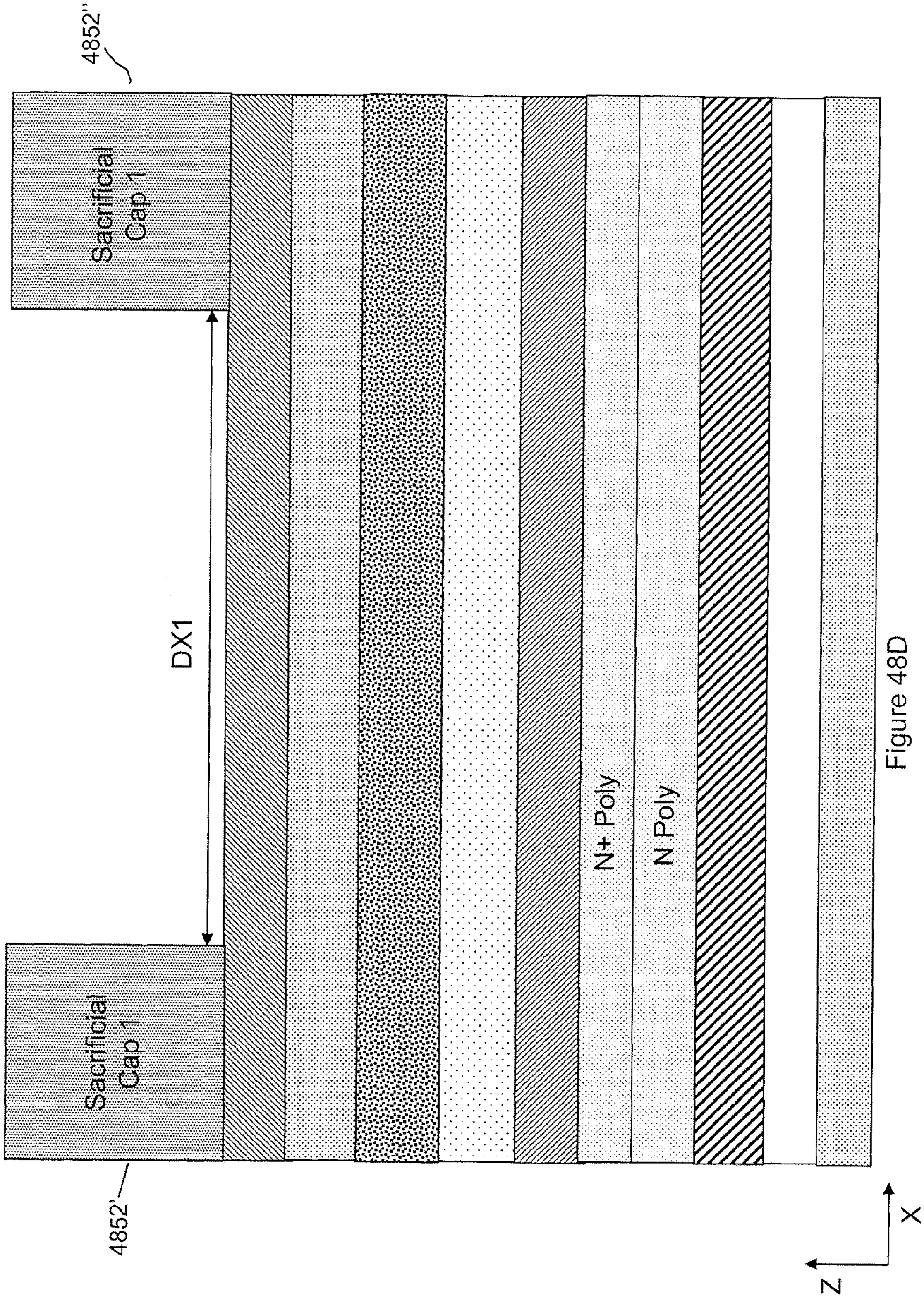

Then, methods directionally etch sacrificial layer 4852 to form an opening of dimension DX1 through sacrificial layer 4852 stopping at the surface of upper level contact layer 4850 using known industry methods as illustrated in FIG. 48D. Two memory cells that include horizontal nanotube channel elements self aligned and positioned with respect to vertical edges of sacrificial cap 1 region 4852' and sacrificial cap 1 region 4852" are formed as illustrated further below. The dimension DX1 is approximately 3F, where F is a minimum photolithographic dimension. For a 65 nm technology node, DX1 is approximately 195 nm; for a 45 nm technology node, DX1 is approximately 135 nm; and for a 22 nm technology node, DX1 is approximately 66 nm. These DX1 dimensions are much larger than the technology minimum dimension F and are therefore non-critical dimensions at any technology node.

Figure 48E:
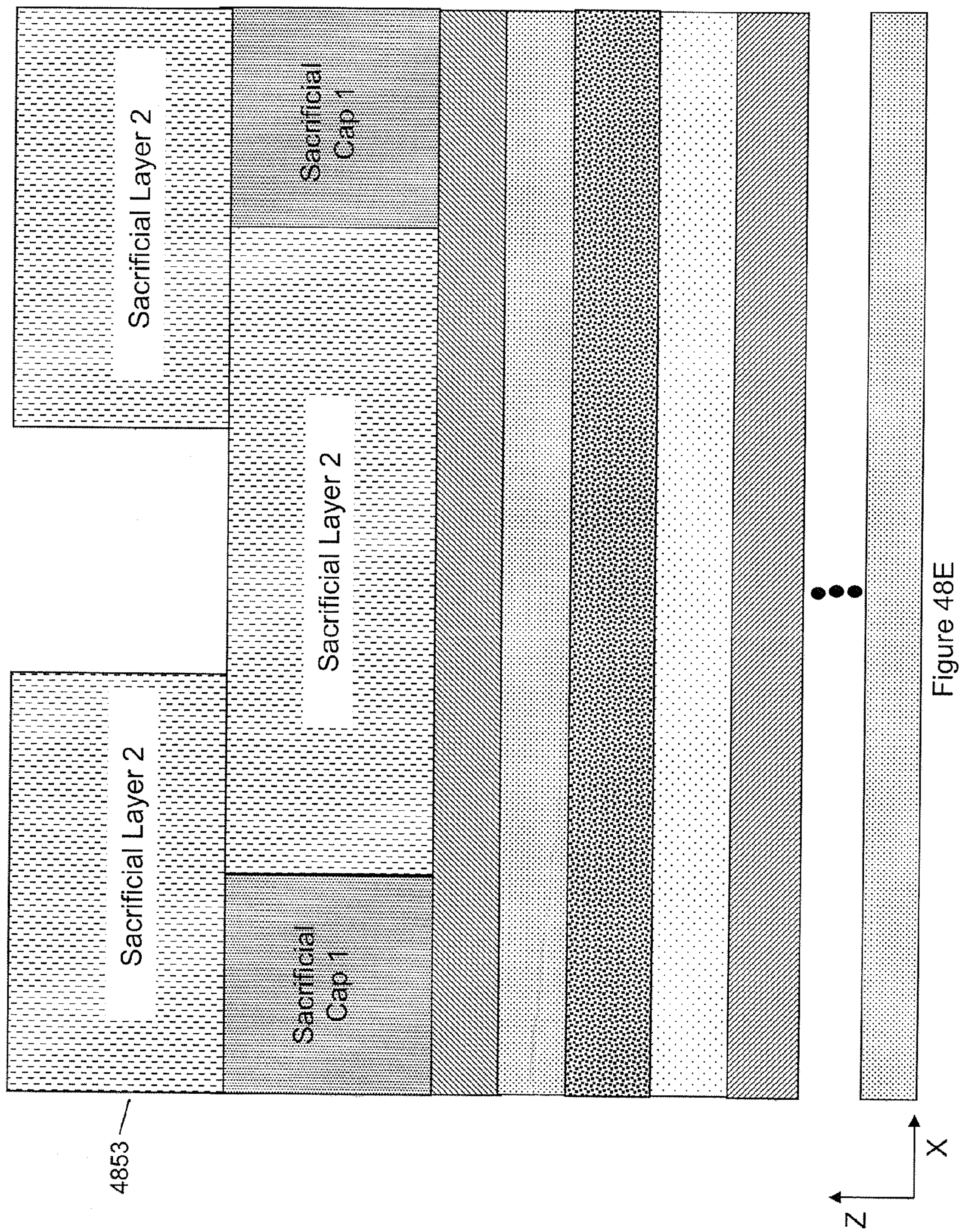

Next, methods deposit a second conformal sacrificial layer 4853 (sacrificial layer 2) as illustrated in FIG. 48E. The thickness of conformal sacrificial layer 4853 is selected as F. In this example, if F is 45 nm, then the thickness of conformal sacrificial layer 4853 is approximately 45 nm; if F is 22 nm, then the thickness of conformal sacrificial layer 4853 is approximately 22 nm. Conformal sacrificial layer 4853 may be formed using conductor, semiconductor, or insulator materials similar to those materials used to form sacrificial layer 4852 described further above.

Figure 48F:
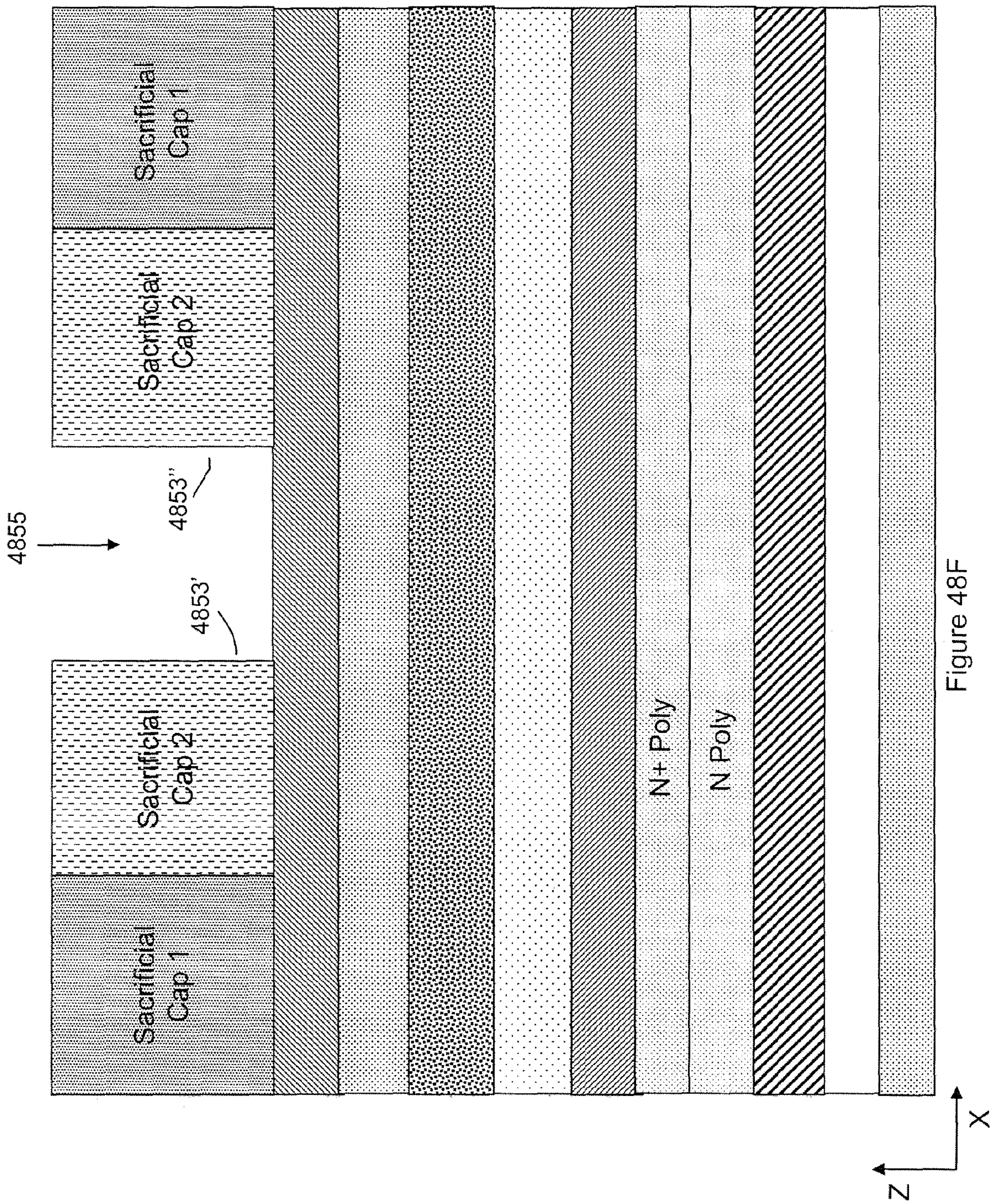

Next, methods directionally etch conformal sacrificial layer 4853 using reactive ion etch (RIE) for example, using known industry methods, forming opening 4855 of dimension approximately F, which in this example may be in a range of 22 to 45 nm as illustrated in FIG. 48F. The inner sidewalls of second sacrificial cap 2 region 4853' and second sacrificial cap 2 region 4953" in opening 4855 are self-aligned to the inner walls of sacrificial regions 4852' and 4852" and separated by a distance of approximately F.

Figure 48G:
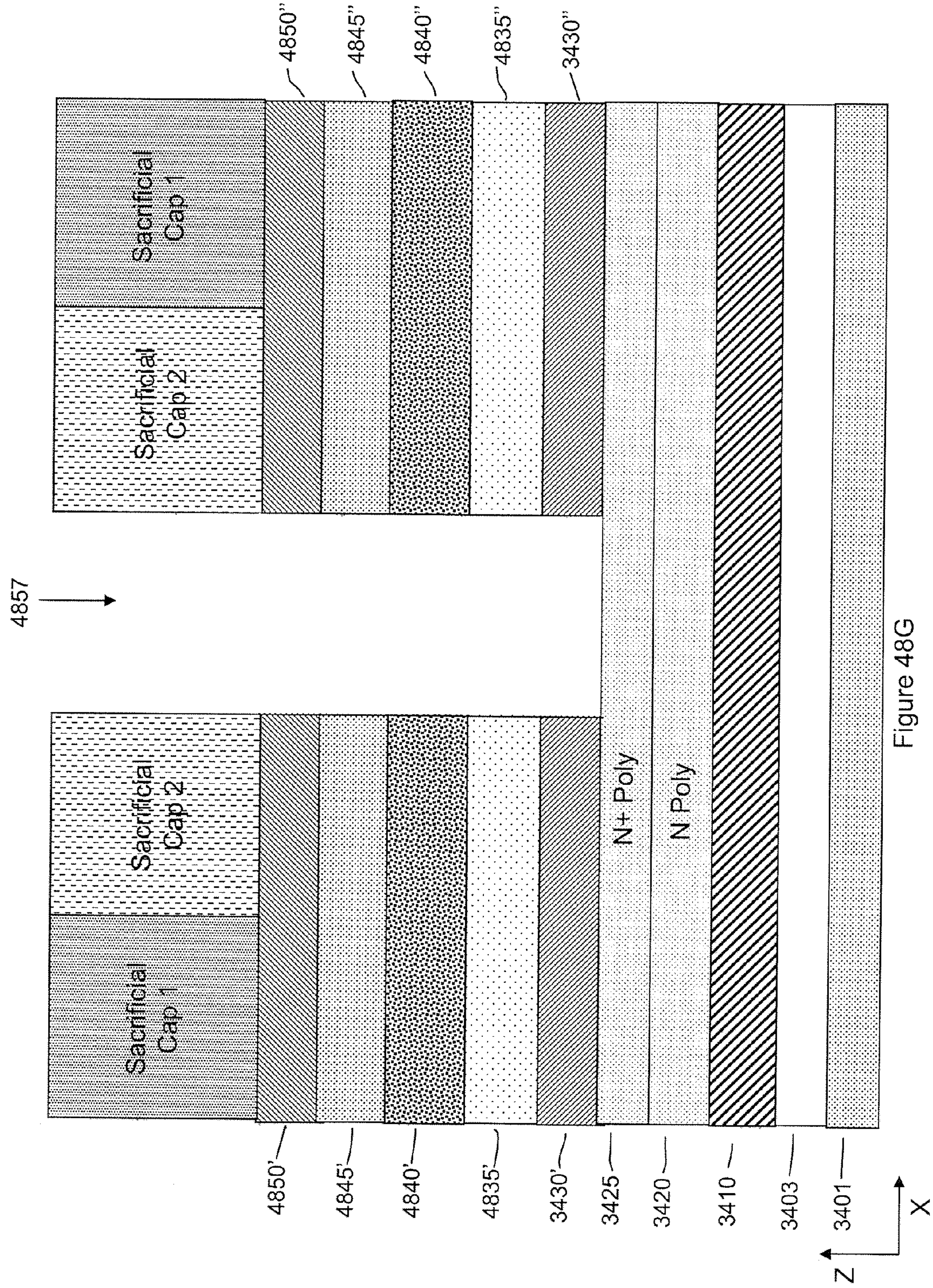

At this point in the process, sacrificial regions 4853' and 4853" may be used as masking layers for directional etching of trenches using methods that define a cell boundary along the X direction for 3D cells using one NV NT diode with an internal cathode-to-nanotube connection per cell. U.S. Pat. No. 5,670,803, the entire contents of which are incorporated herein by reference, to co-inventor Bertin, discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may cut through multiple conductor, semiconductor, and oxide layers as described further above with respect to trench formation in FIGS. 34A-34FF and 36A-36FF. In this example, selective directional trench etch (RIE) removes exposed areas of upper level contact layer 4850 to form upper level contact regions 4850' and 4850"; removes exposed areas of protective insulator layer 4845 to form protective insulator regions 4845' and 4845"; removes exposed areas of nanotube layer 4840 to form nanotube regions 4840' and 4840"; removes exposed areas of insulating layer 4835 to form insulating regions 4835' and 4835"; removes exposed areas of lower level contact layer 3430 to form lower level contact regions 3430' and 3430"; and selective directional etch stops on the top surface of N+ polysilicon layer 3425, forming trench opening 4857 as illustrated in FIG. 48G.

Figure 48H:
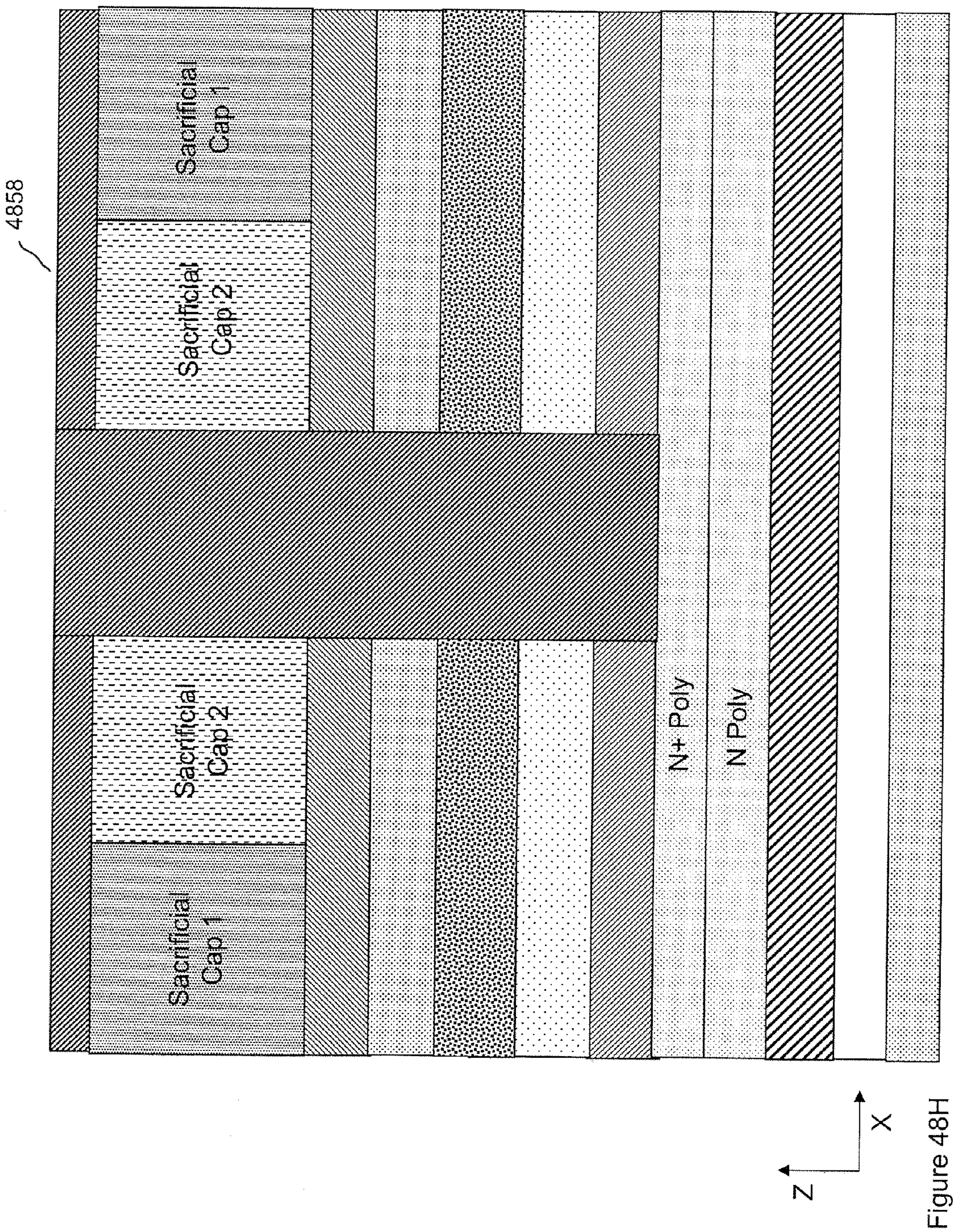

Next, methods such as evaporation or sputtering fill trench 4857 with conductor material 4858 as illustrated in FIG. 48H. Examples of conductor layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Conductor material is formed into sidewall wiring regions as illustrated further below. Because wiring distances are short, the sheet resistance of resulting trench sidewall wiring is not a concern. Nanotube contact resistance values between trench sidewall wiring and the ends of nanotube regions 4840' and 4840", nanotube contact resistance variations, and nanotube contact resistance reliability are useful criteria in selecting conductor type. Nanotube regions of larger cross sectional areas typically result in lower overall contact resistance because of multiple parallel nanotubes. Trench sidewall contacts to both nanotube end regions and lower level metal sidewall regions are used to form a cell cathode-to-NT connection. A nonvolatile nanotube switch with end-only contacts is described further below with respect to FIGS. 49 and 50.

Figure 48I:
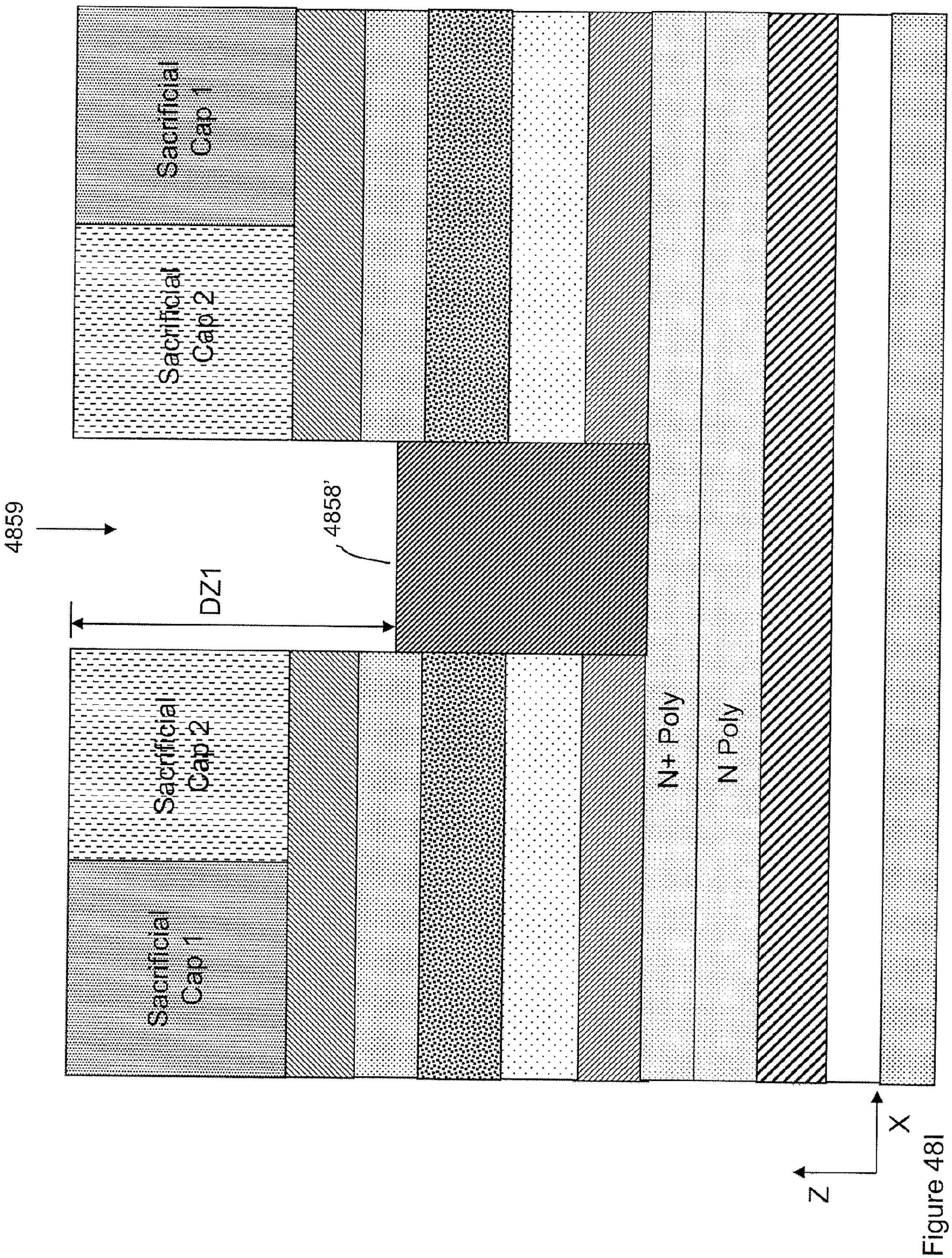

Next, methods selectively directionally etch conductor 4858 to a depth DZ1 below the top surface of sacrificial cap 2 regions 4853' and 4853" as illustrated in FIG. 48I. DZ1 is selected to ensure full contact of nanotube end regions while not contacting upper level contact regions. At this point in the process, the sidewalls of conductor 4858' are in electrical contact with one end of nanotube region 4840' and one end of lower level conductor 3430', and also in electrical contact with one end of nanotube region 4840" and one end of lower level conductor 3430". Two separate sidewall wiring regions can be formed as illustrated further below. Conductor 4858' is partially removed leaving behind region 4859.

Figure 48J:
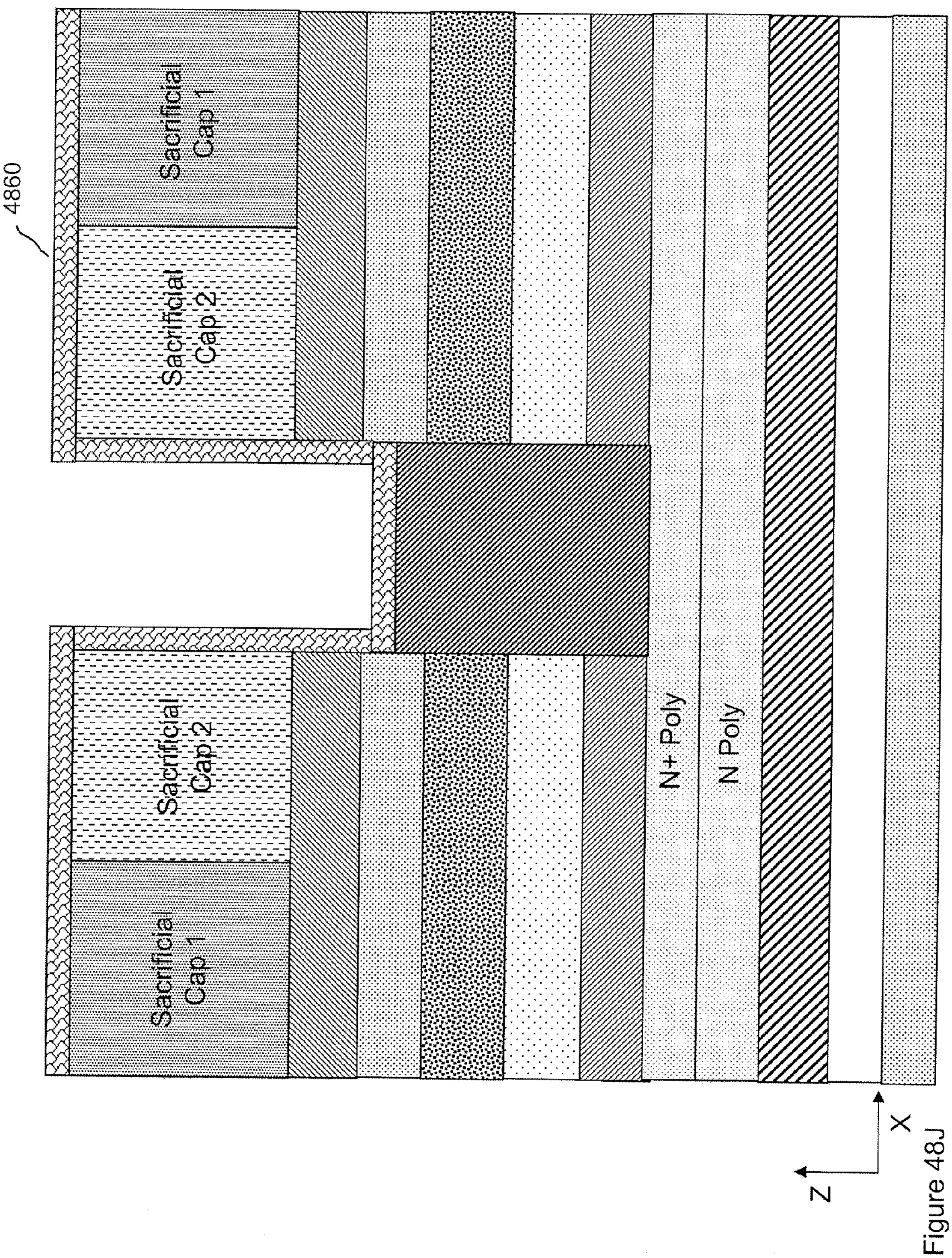

Next, methods deposit a conformal insulator layer 4860 as illustrated in FIG. 48J. Conformal insulator 4860 may be 5 to 50 nm thick, for example, and may be formed from any appropriate known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example, such as described in U.S. patent application Ser. No. 11/280,786. Insulator 4860 is deposited to a film thickness that determines the thickness of trench sidewall wiring as described further below.

Figure 48K:
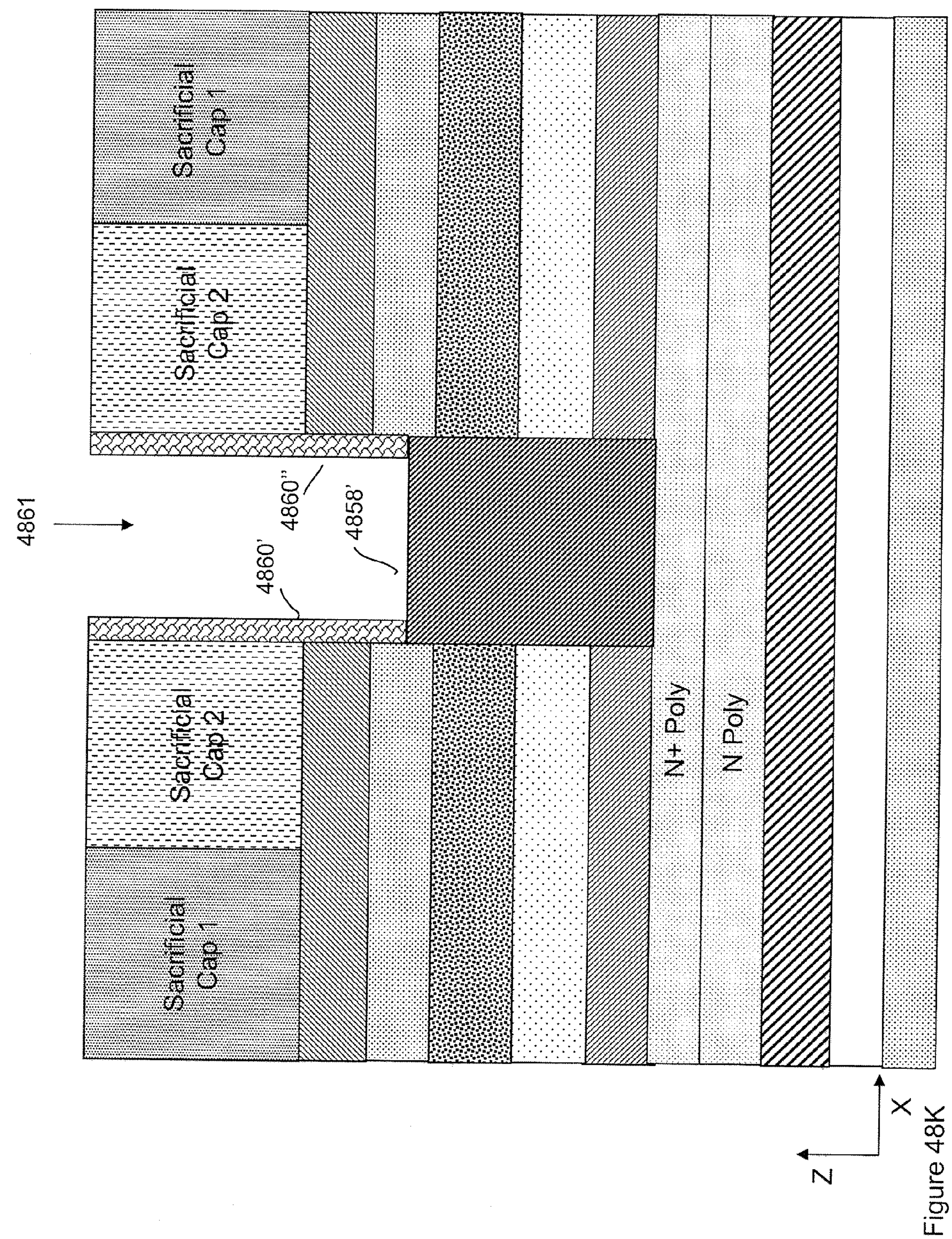

Next, methods directly etch conformal insulator 4860 using RIE and remove conformal layer material on top horizontal surfaces and bottom horizontal surfaces at the bottom of trench opening to form trench opening 4861 with sidewall insulators 4860' and 4860" and conductor 4858' as illustrated in FIG. 48K.

Figure 48L:
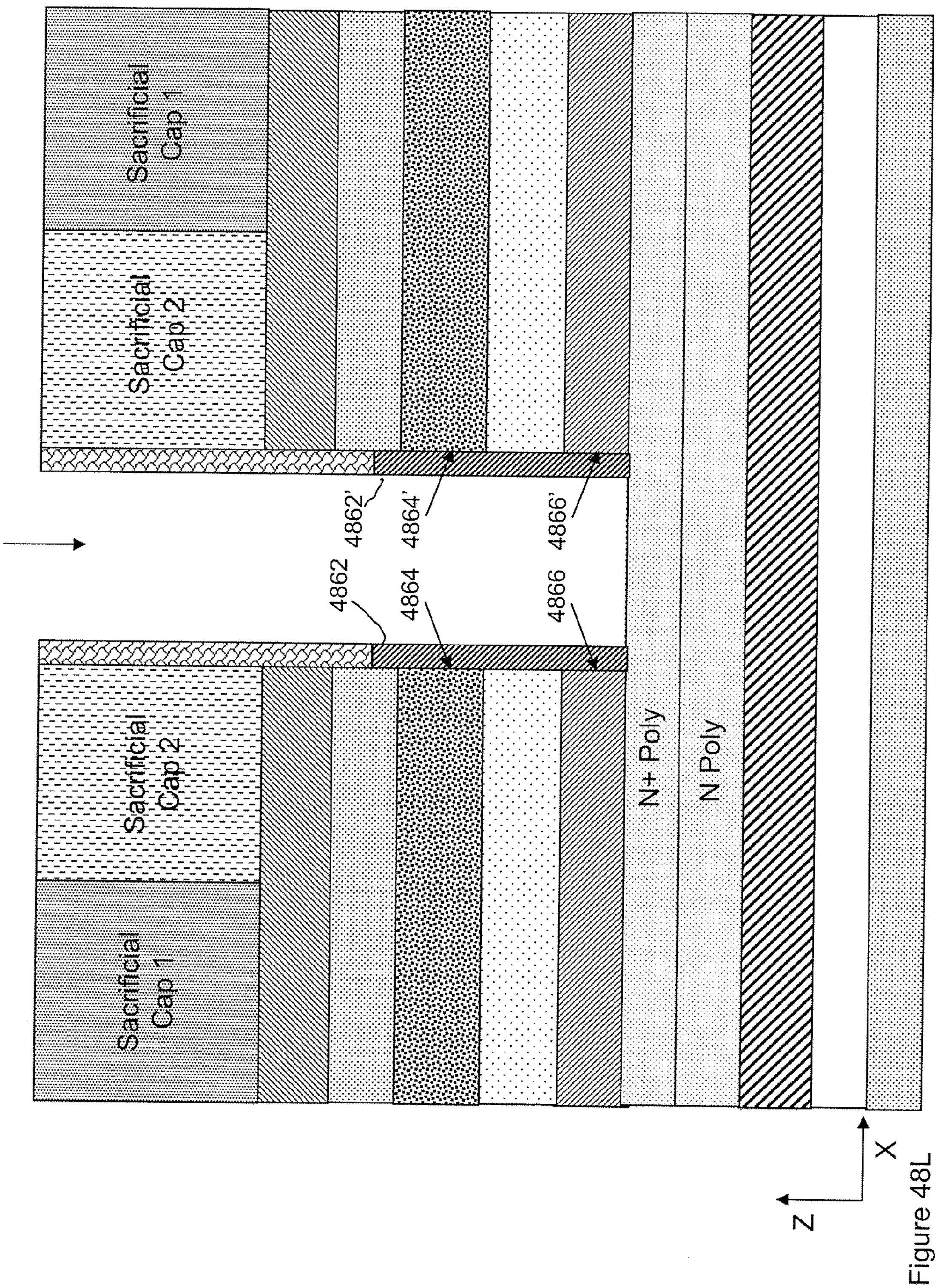

Next, methods directionally etch conductor 4858' using sidewall insulators 4860' and 4860" as masking regions and stop at the top surface of N+ polysilicon layer 3425 as illustrated in FIG. 48L. The thickness of sidewall insulators 4860' and 4860" determine the thickness of trench sidewall wiring regions as illustrated below. Trench sidewall wiring 4862 is formed, which forms contact 4864 between trench sidewall wiring 4862 and one end of nanotube region 4840'. Trench sidewall wiring 4862 also forms contact 4866 with one sidewall (end) of lower level contact 3430'. Trench sidewall wiring 4862' is formed, which forms contact 4864' between trench sidewall wiring 4862' and one end of nanotube region 4840". Trench sidewall wiring 4862' also forms contact 4866' with one sidewall (end) of lower level contact 3430".

Figure 48M:
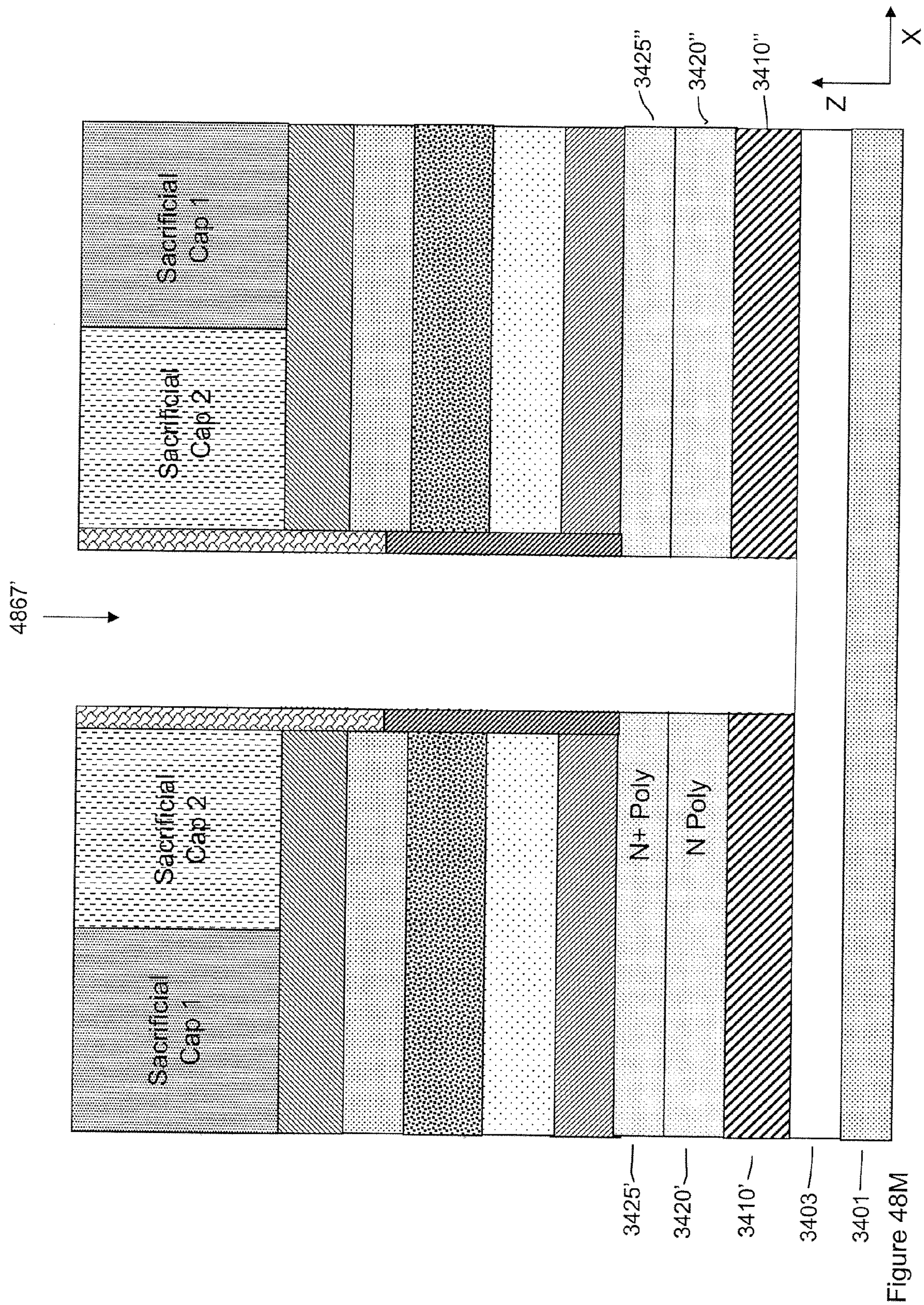

Next, methods directionally etch exposed areas of N+ polysilicon layer 3425 to form N+ polysilicon regions 3425' and 3425"; exposed areas of polysilicon layer 3420 to form N polysilicon regions 3420' and 3420"; and exposed areas of conductor layer 3410 to form conductor regions 3410' and 3410", stopping at the surface of insulator 3403. Sidewall insulators 4860' and 4860" and trench sidewall conductors 4862 and 4862' are used for masking. Directional etching stops at the top surface of insulator 3403 forming trench opening 4867' as illustrated in FIG. 48M.

Figure 48N:
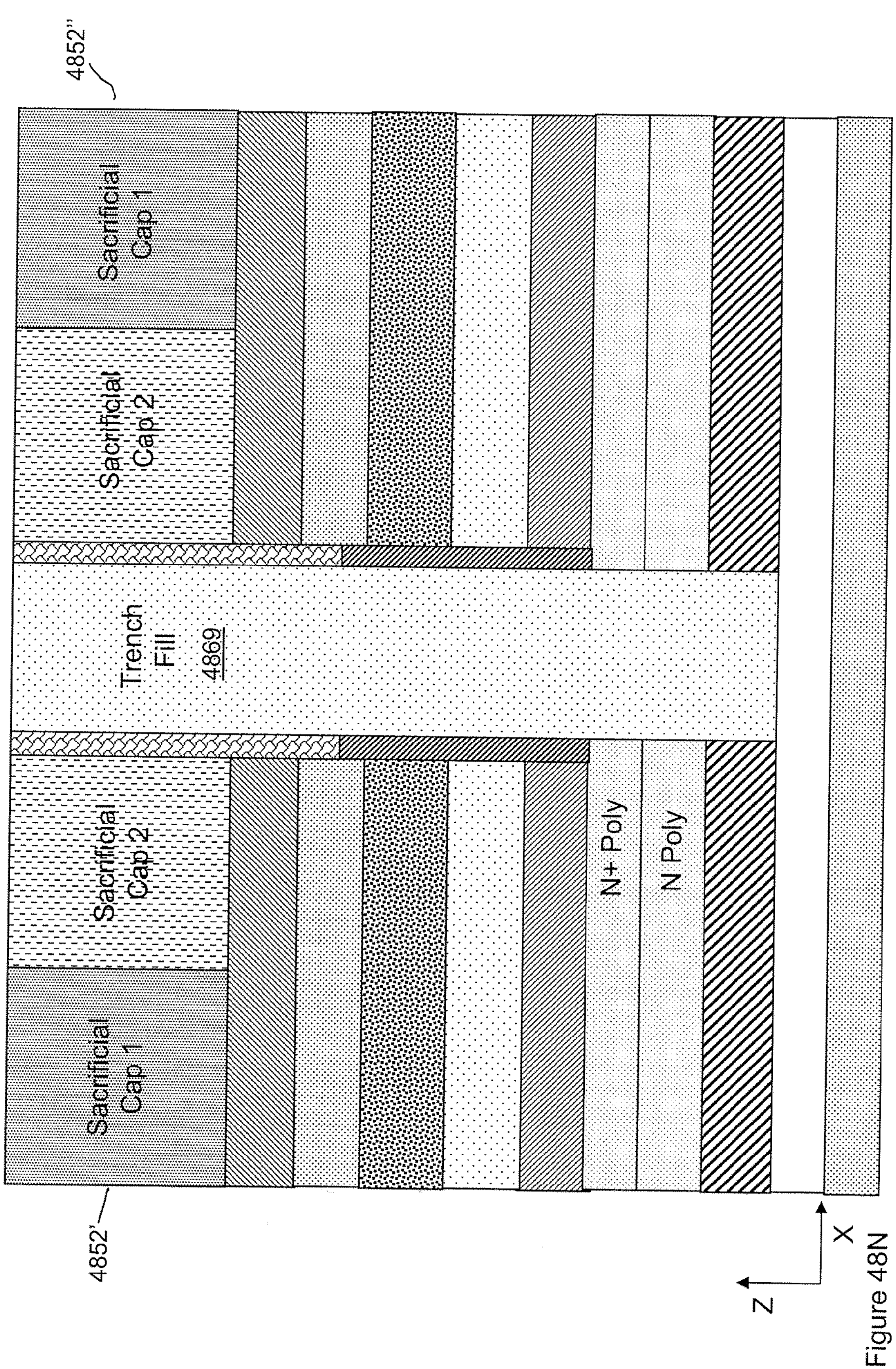

Next methods fill trench opening 4867' with insulator 4869 such as TEOS for example and planarize as illustrated in FIG. 48N.

Figure 48O:
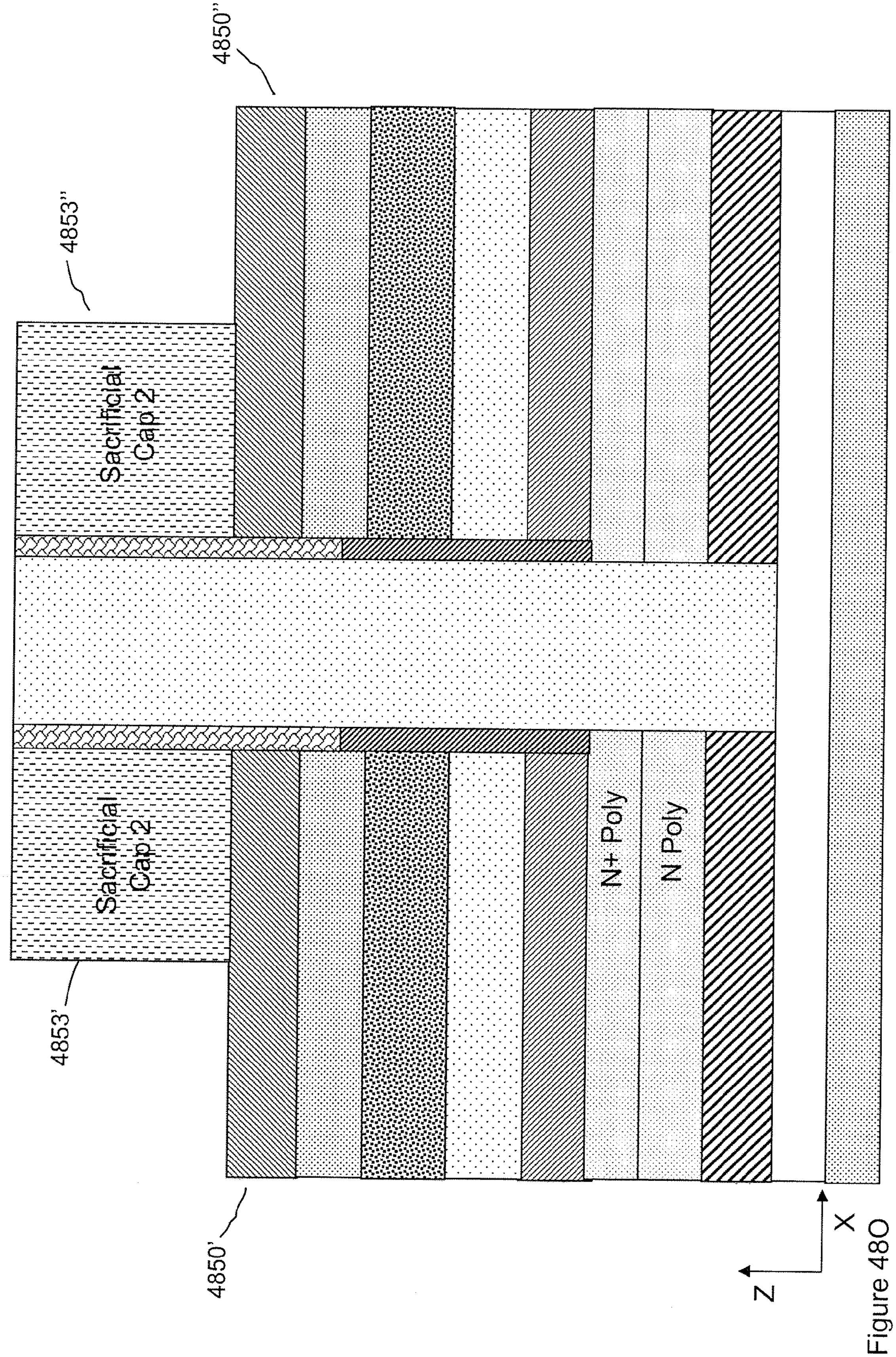

At this point in the process, a second cell boundary is formed along the X direction for 3D memory cells. Methods remove (etch) sacrificial cap layer 1 regions 4852' and 4852" exposing a portion of the surfaces of upper level contact region 4850' and 4850" as illustrated in FIG. 48O.

Figure 48P:
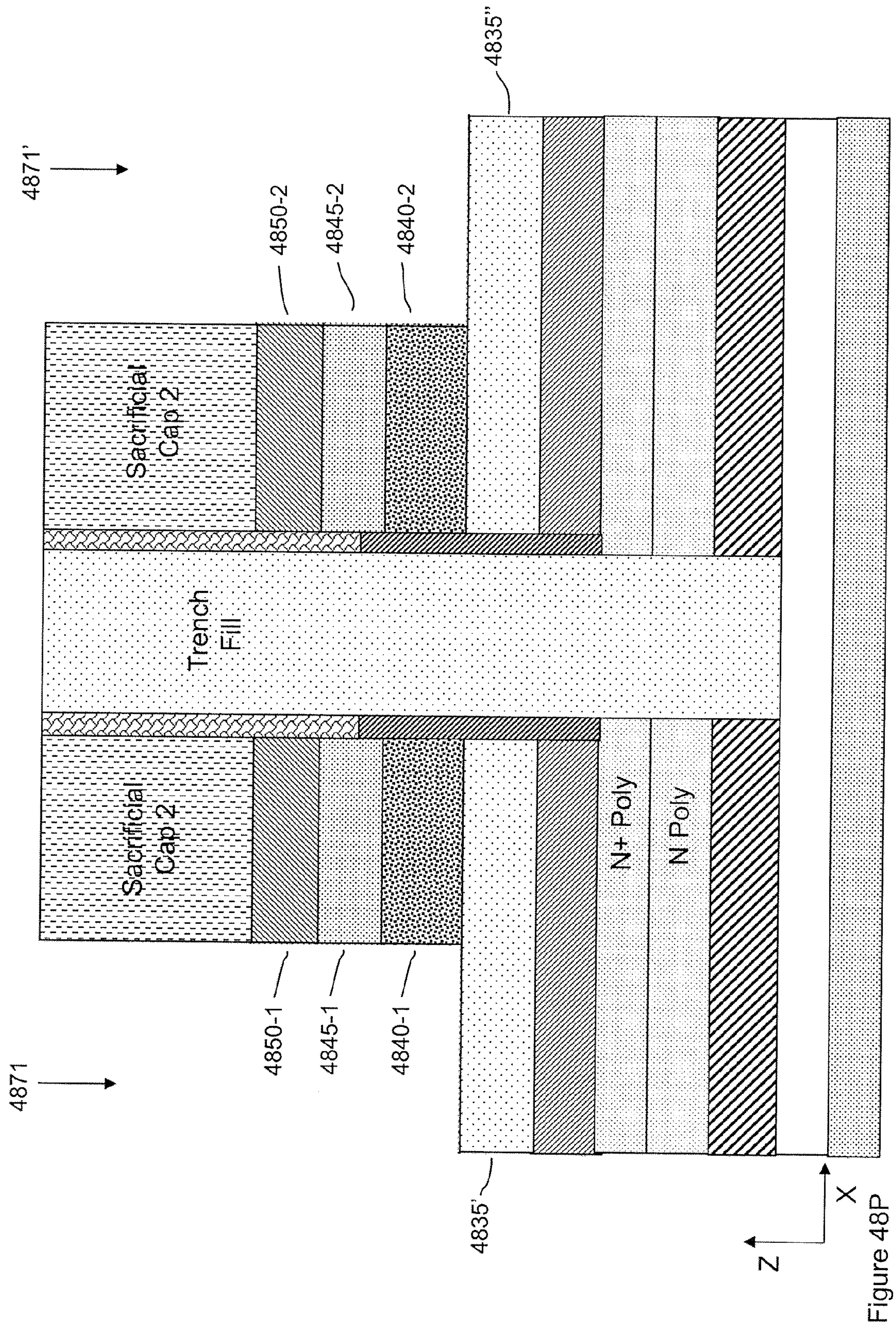

At this point in the process, sacrificial regions 4853' and 4853" may be used as masking layers for directional etching of trenches using methods that define another cell boundary along the X direction for 3D cells using one NV NT diode with an internal cathode-to-nanotube connection per cell as described further above with respect to FIG. 48F. This structure includes vertical sidewalls simultaneously defined by trenches cutting through multiple layers of doped silicon and insulated regions in order avoid multiple alignment steps. Such trench directional selective etch methods may cut through multiple conductor, semiconductor, and oxide layers as described further above with respect to trench formation in FIG. 48F and also in FIGS. 34A-34FF and 36A-36FF. In this example, selective directional trench etch (RIE) removes exposed areas of upper level contact regions 4550' and 4850" to form upper level contacts 4850-1 and 4850-2, respectively; removes exposed areas of protective insulator regions 4845' and 4845" to form protective insulators 4845-1 and 4845-2, respectively; removes exposed areas of nanotube regions 4840' and 4840" to form nanotube elements 4840-1 and 4840-2, respectively; and selective directional etch stops on the top surface of insulator regions 4835' and 4835", forming trench openings 4871 and 4871' as illustrated in FIG. 48P.

Figure 48Q:
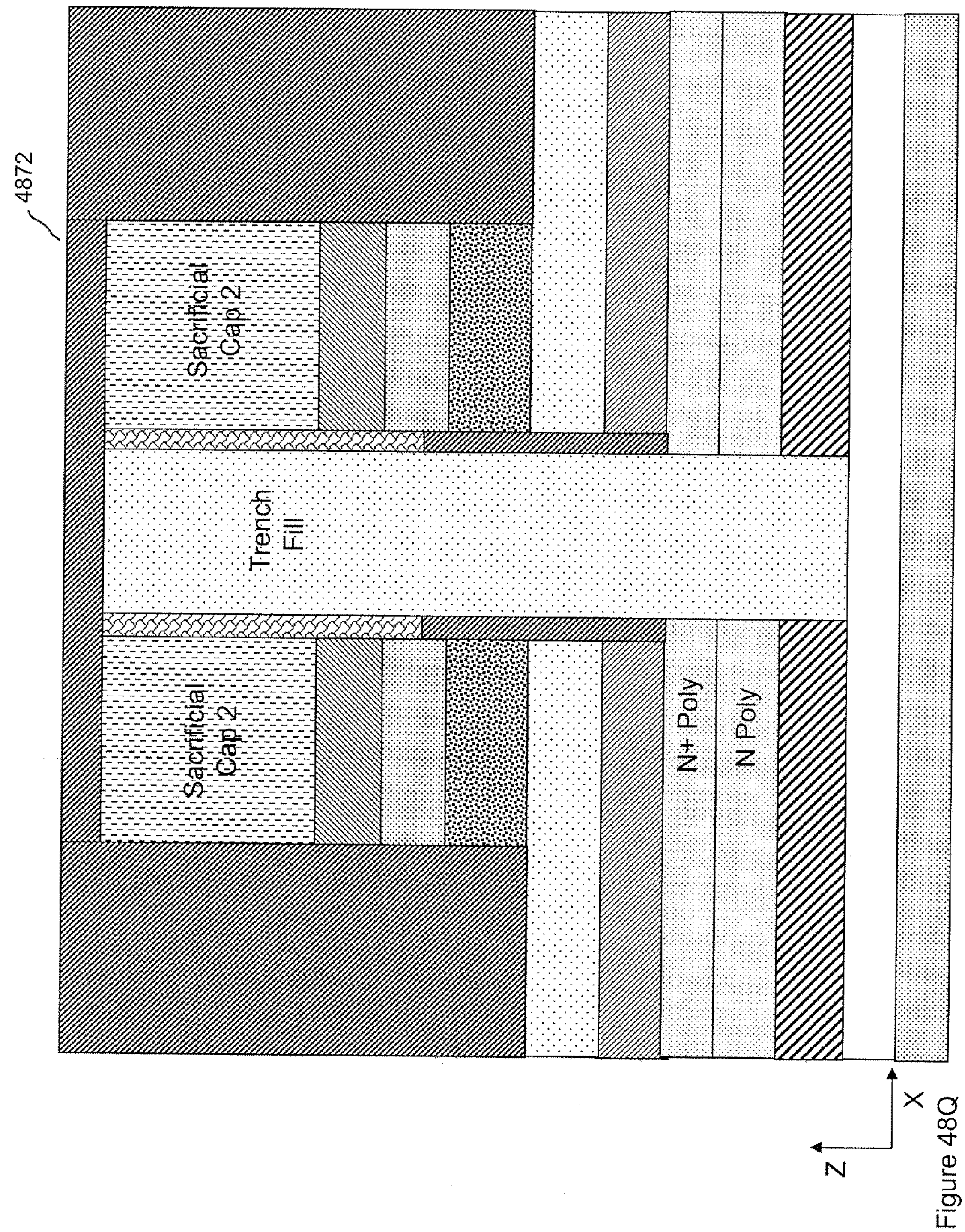

Next, methods such as evaporation or sputtering fill trenches 4871 and 4871' with conductor material 4872 as illustrated in FIG. 48Q, and also described further above with respect to FIG. 48H.

Figure 48R:
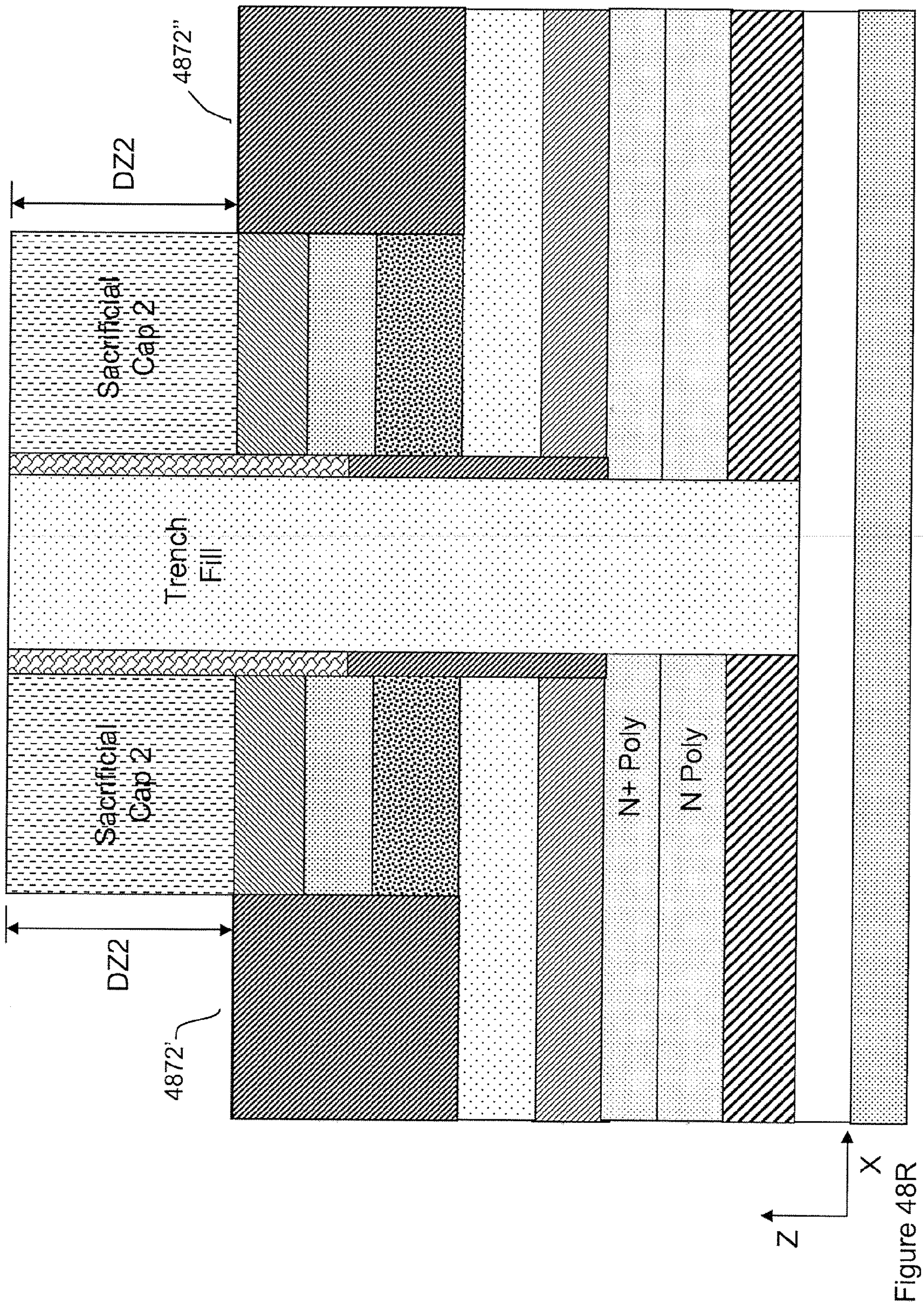

Next, methods selectively directionally etch conductor 4872 to a depth DZ2 below the top surface of sacrificial cap 2 regions 4853' and 4853" as illustrated in FIG. 48R. DZ2 is adjusted to ensure full contact of nanotube end regions while also contacting upper level contacts. At this point in the process, the sidewalls of conductors 4872' and 4872" are in electrical contact with one end of each of nanotube elements 4840-1 and 4840-2, respectively, and one end of upper level conductors 4850-1 and 4850-2, respectively. Sidewall wiring regions can be formed, as illustrated further below.

Figure 48S:
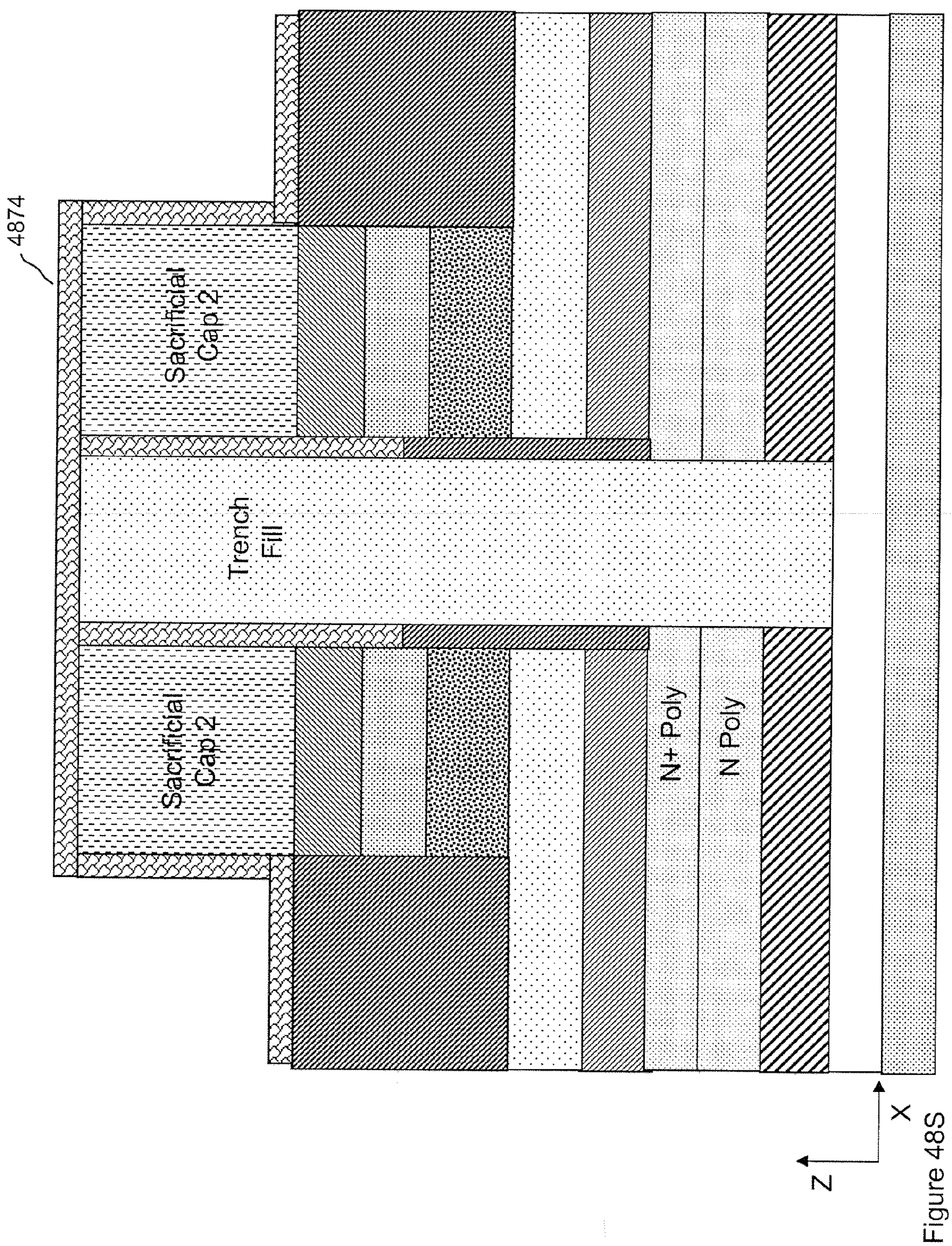

Next, methods deposit a conformal insulator layer 4874 as illustrated in FIG. 48S. Conformal insulator 4874 may be 5 to 50 nm thick, for example, and may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example, such as described in U.S. patent application Ser. No. 11/280,786. Insulator 4874 is deposited to a film thickness that determines the thickness of trench sidewall wiring as described further below.

Figure 48T:
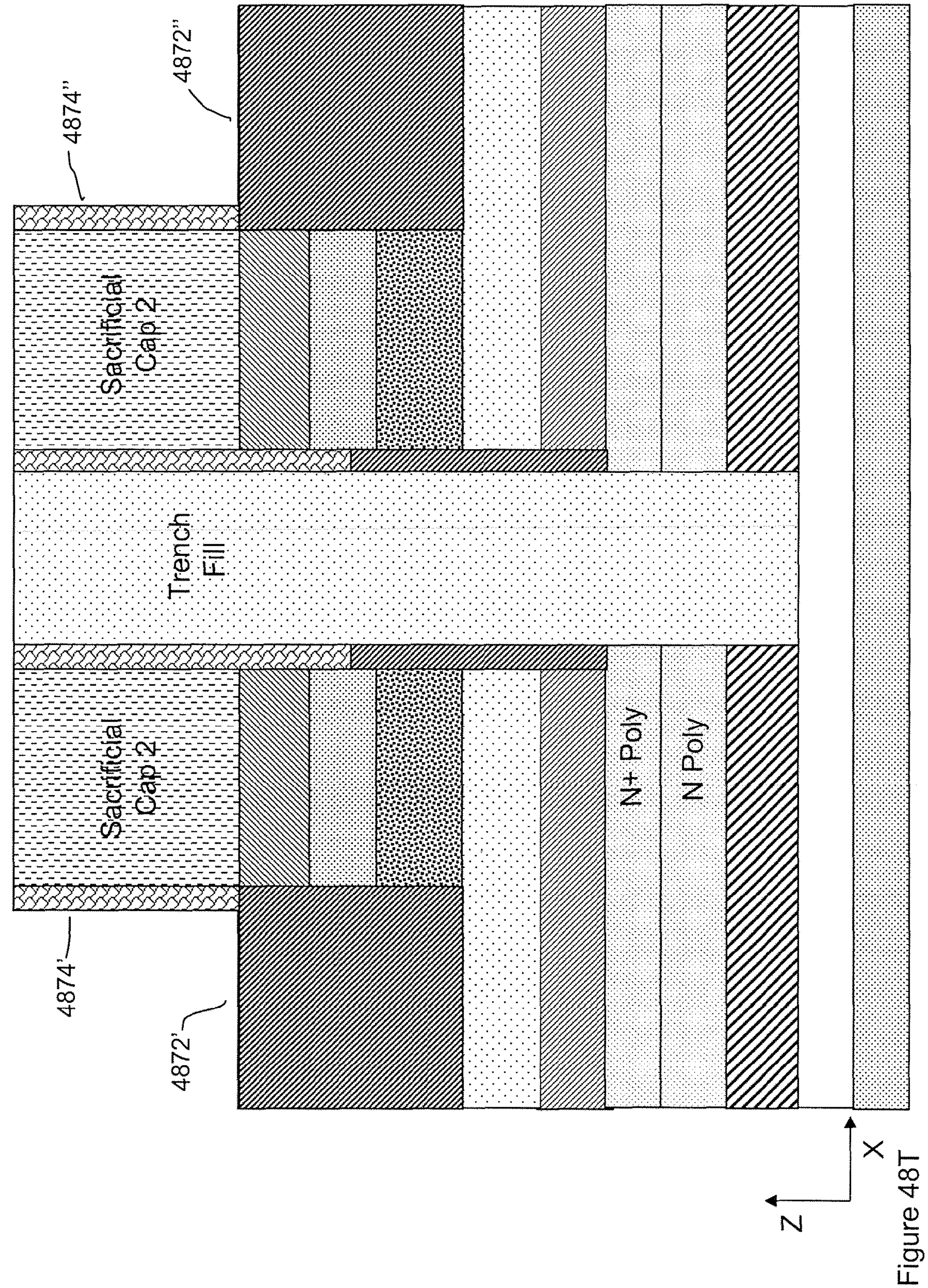

Next, methods directly etch conformal insulator 4874 using RIE and remove conformal layer material on top horizontal surfaces and bottom horizontal surfaces at the bottom of trench opening to form trench openings with sidewall insulators 4874' and 4874" and conductors 4872' and 4872" as illustrated in FIG. 48T.

Figure 48U:
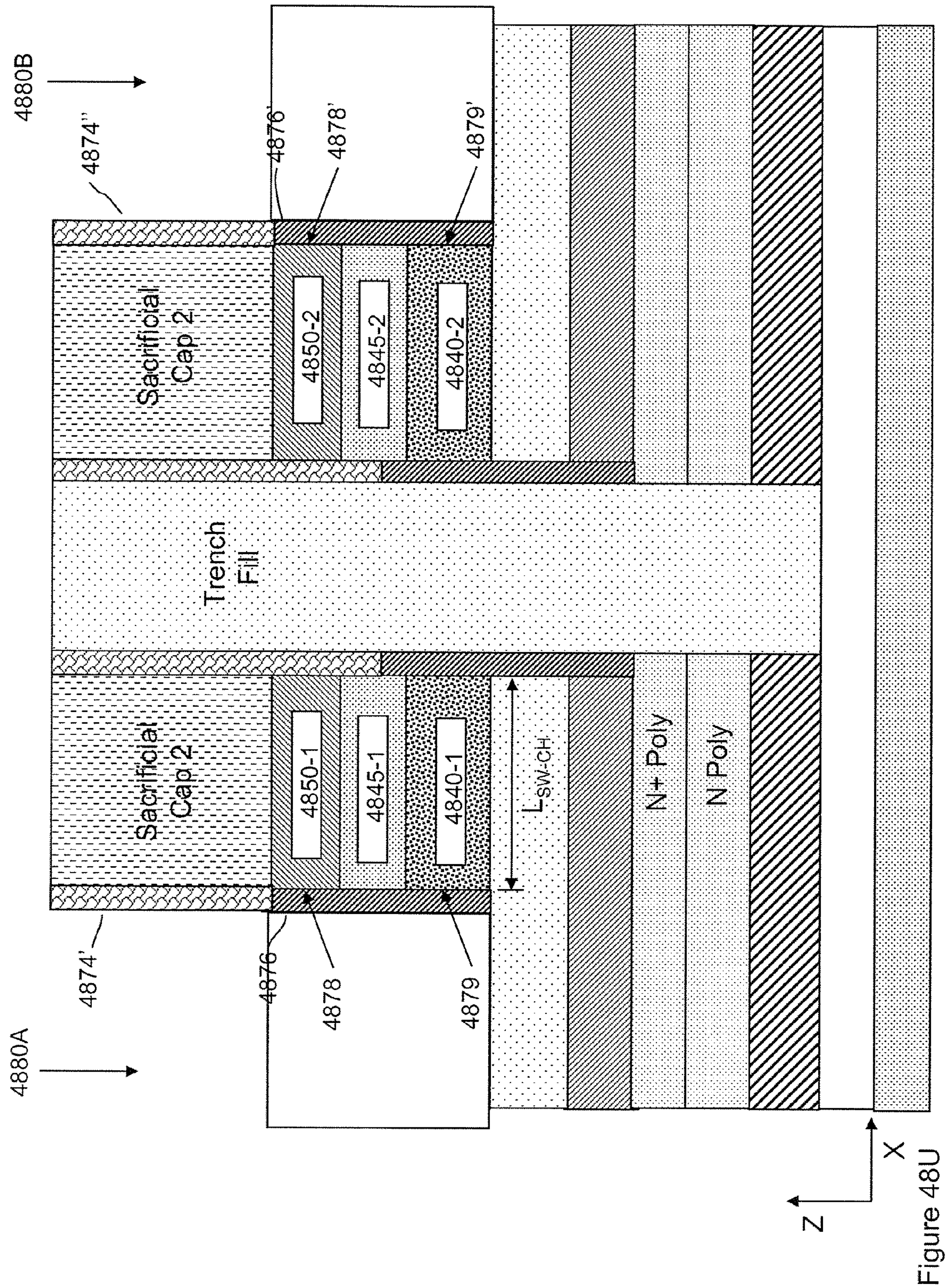

Next, methods directionally etch conductors 4872' and 4872" using sidewall insulators 4874' and 4874", respectively, and corresponding insulators on other sides of trenches 4880A and 4880B, respectively, (not shown) as masking regions and stop at the top surface of insulator regions 4835' and 4835", respectively, as illustrated in FIG. 48U. The thickness of sidewall insulators 4874' and 4874" determine the thickness of trench sidewall wiring regions as illustrated below. Trench sidewall wiring 4876 is formed, which in turn forms contact 4879 between trench sidewall wiring 4876 and one end of nanotube element 4840-1. Trench sidewall wiring 4876 also forms contact 4878 with one sidewall (end) of upper level contact 4850-1. Trench sidewall wiring 4876' is formed, which in turn forms contact 4879' between trench sidewall wiring 4876' and one end of nanotube element 4840-2. Trench sidewall wiring 4876' also forms contact 4878' with one sidewall (end) of upper level contact 4850-2.

Figure 48V:
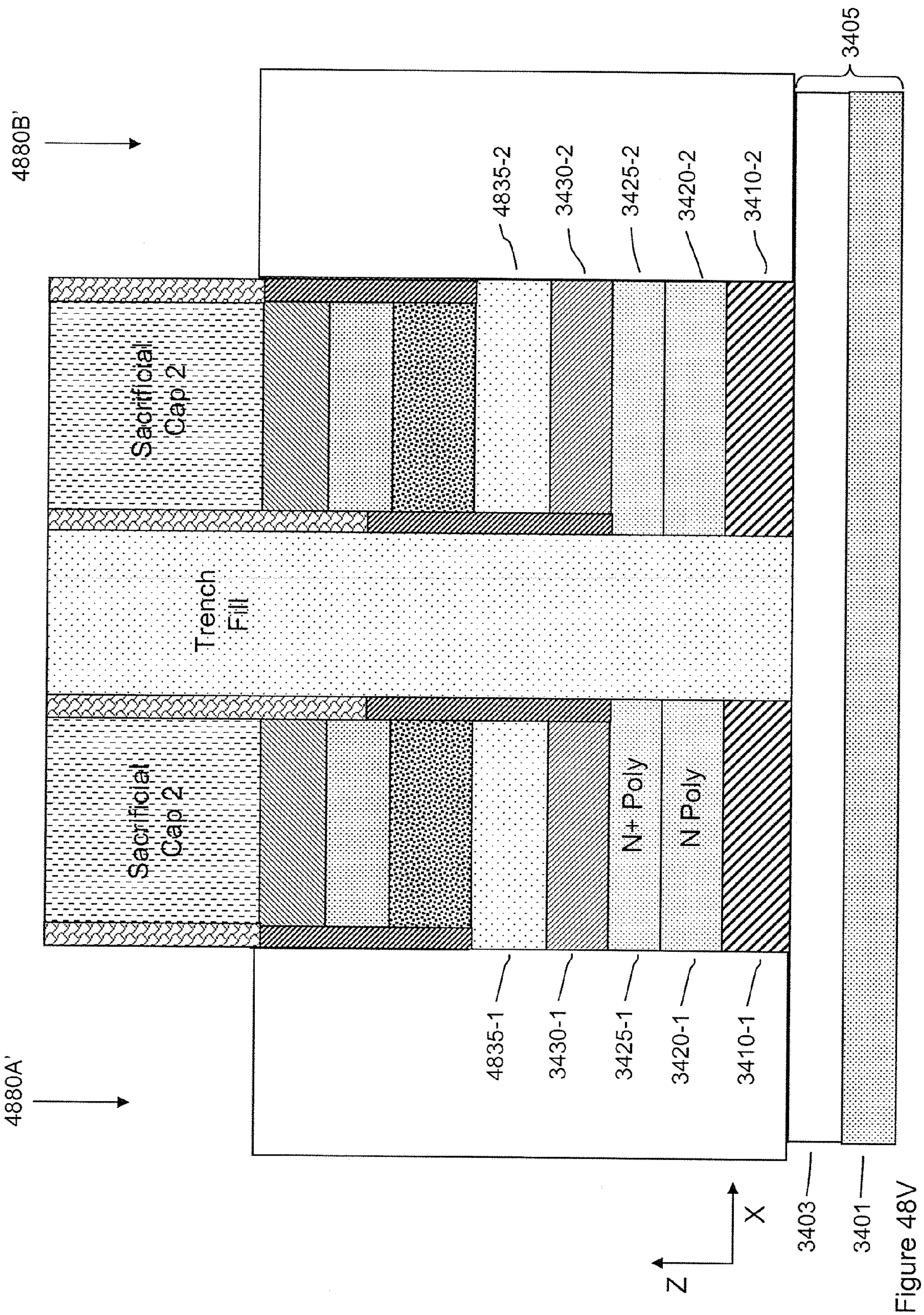

Next, methods directionally etch exposed areas of insulator regions 4835' and 4835" to form insulators 4835-1 and 4835-2, respectively; lower level contact regions 3430' and 3430" to form lower level contacts 3430-1 and 3430-2, respectively; N+ polysilicon regions 3425' and 3425" to form N+ polysilicon regions 3425-1 and 3425-2, respectively; exposed areas of polysilicon regions 3420' and 3420" to form N polysilicon regions 3420-1 and 3420-2; and exposed areas of conductor regions 3410' and 3410" to form conductors 3410-1 and 3410-2, respectively, stopping at the surface of insulator 3403. Sidewall insulators 4874' and 4874" and trench sidewall conductors 4876 and 4876' are used for masking. Directional etching stops at the top surface of insulator 3403 forming trench openings 4880A' and 4880B' as illustrated in FIG. 48V.

Figure 48W:
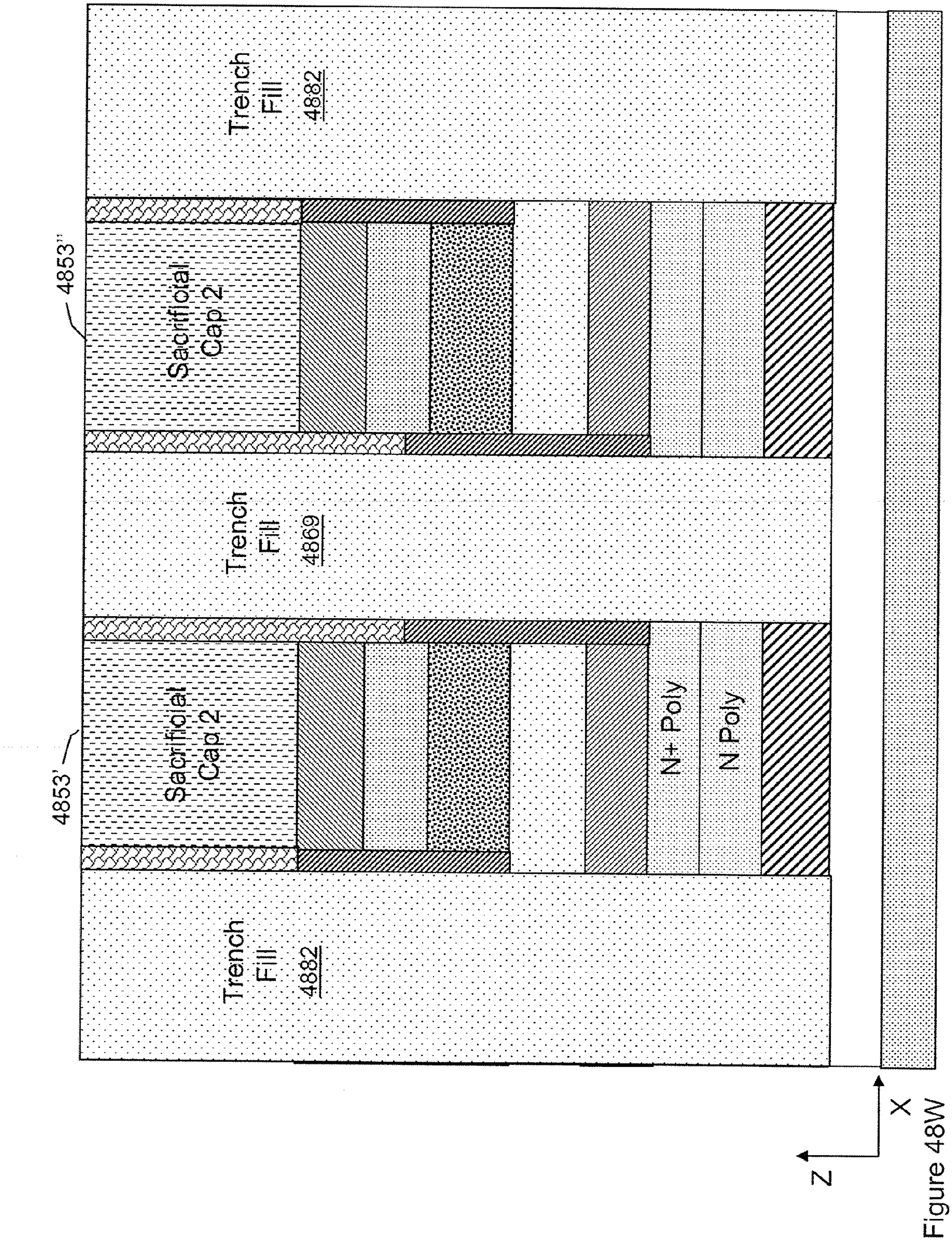

Next methods fill trench openings 4880A' and 4880B' with insulator 4882 such as TEOS for example and planarize as illustrated in FIG. 48W.

Figure 48X:
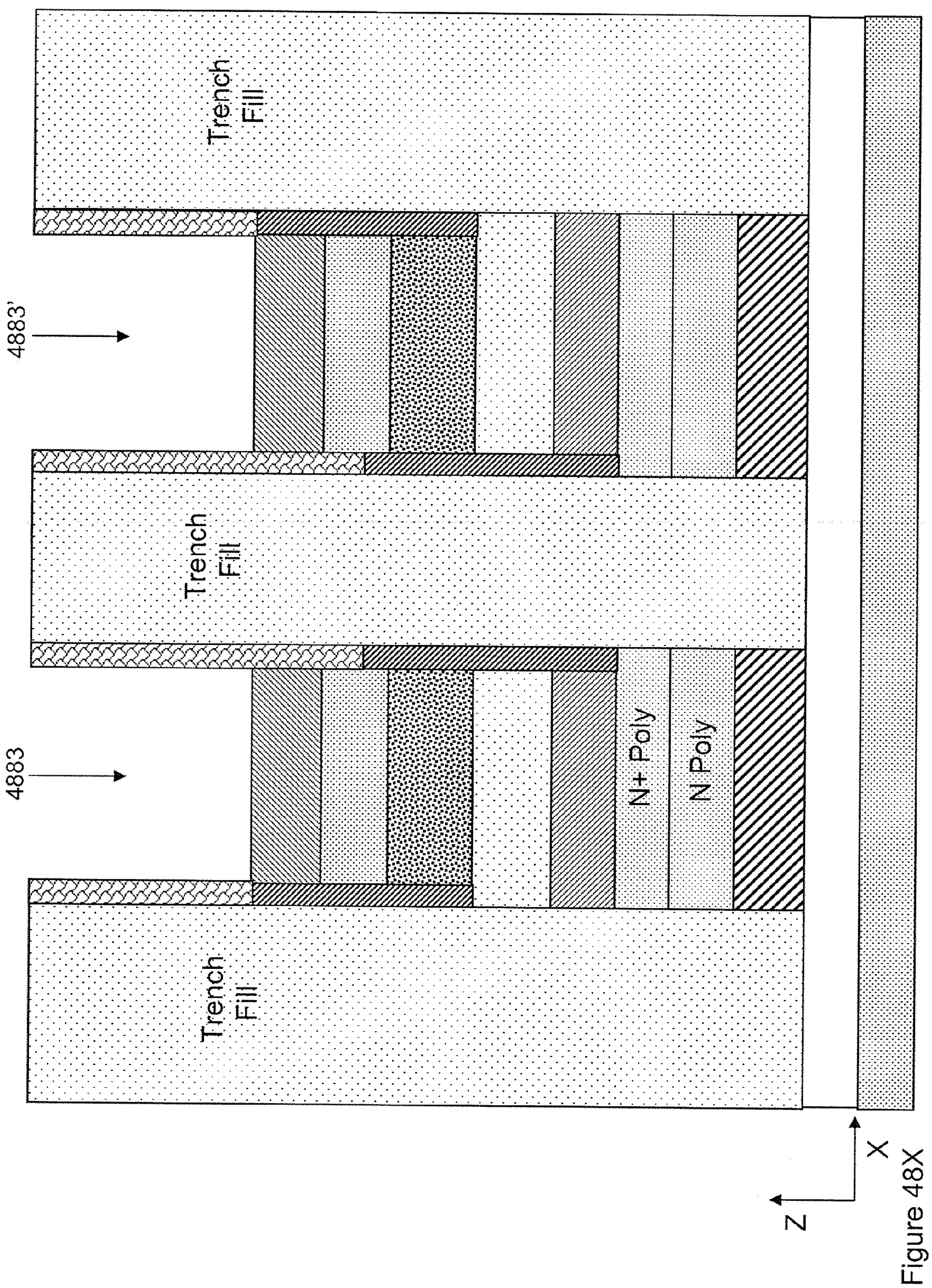

Next, methods remove (etch) sacrificial cap 2 regions 4853' and 4853" to form openings 4883 and 4883', respectively, exposing the top surfaces of upper level contacts 5850-1 and 5850-2, respectively, as illustrated in FIG. 48X.

Figure 48Y:
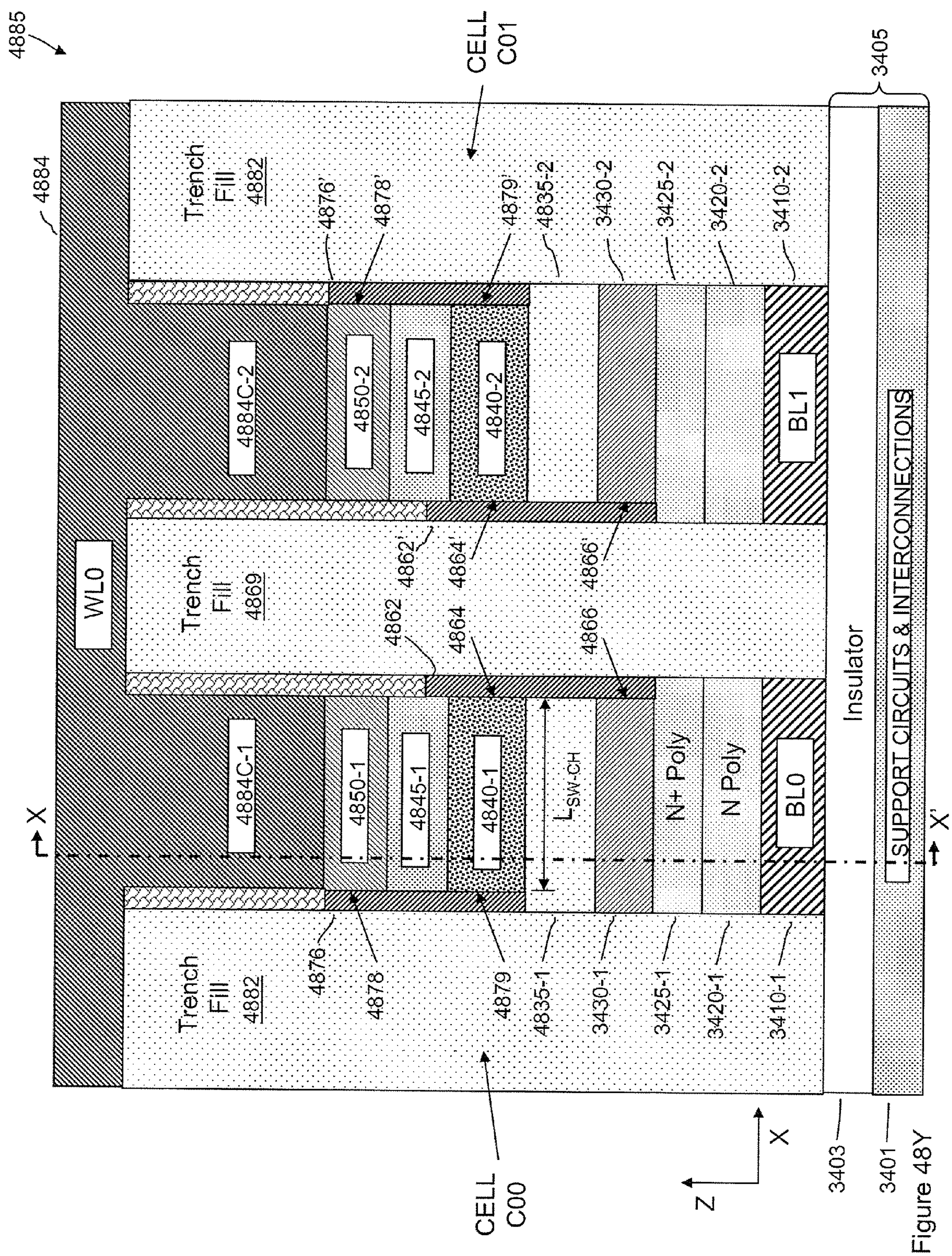

Next, methods deposit and planarize a conductor layer 4884 that also forms contacts 4884C-1 and 4884C-2 that contact upper level contacts 4850-1 and 4850-2, respectively, as illustrated in FIG. 48Y.

Next, conductor layer 4884 is patterned to form word lines orthogonal to conductors (bit lines) 3410-1 and 3410-2 as illustrated further below.

At this point in the process, cross section 4885 illustrated in FIG. 48Y has been fabricated, and includes NV NT diode cell dimensions of F (where F is a minimum feature size) and cell periodicity 2F defined in the X direction as well as corresponding array bit lines. Next, cell dimensions used to define dimensions in the Y direction are formed by directional trench etch processes similar to those described further above with respect to cross section 4885 illustrated in FIG. 48Y. Trenches used to define dimensions in the Y direction are approximately orthogonal to trenches used to define dimensions in the X direction. In this example, cell characteristics in the Y direction do not require self alignment techniques described further above with respect to X direction dimensions. Cross sections of structures in the Y (bit line) direction are illustrated with respect to cross section X-X' illustrated in FIG. 48Y.

Figure 48Z:
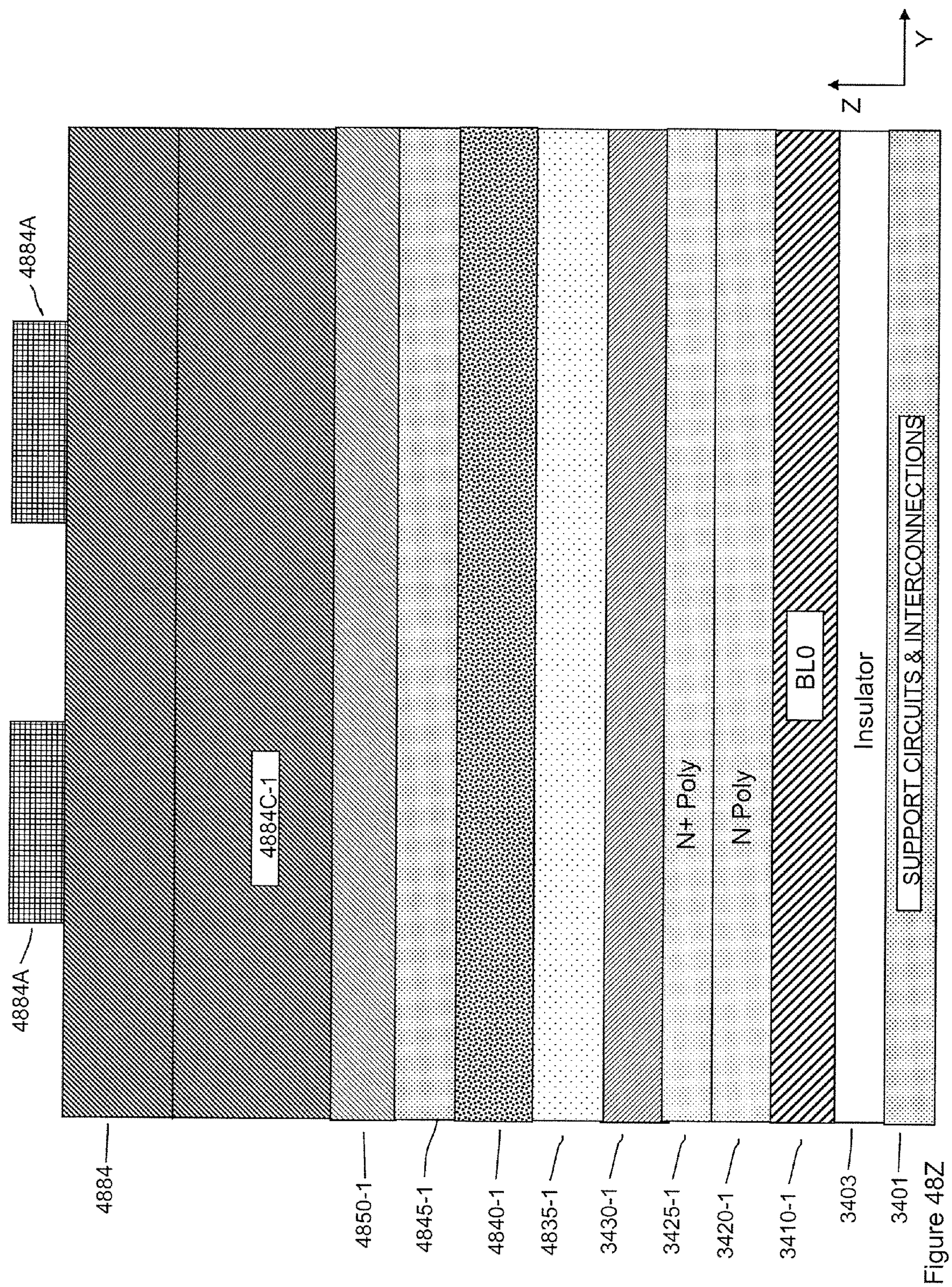
Figure 48A:
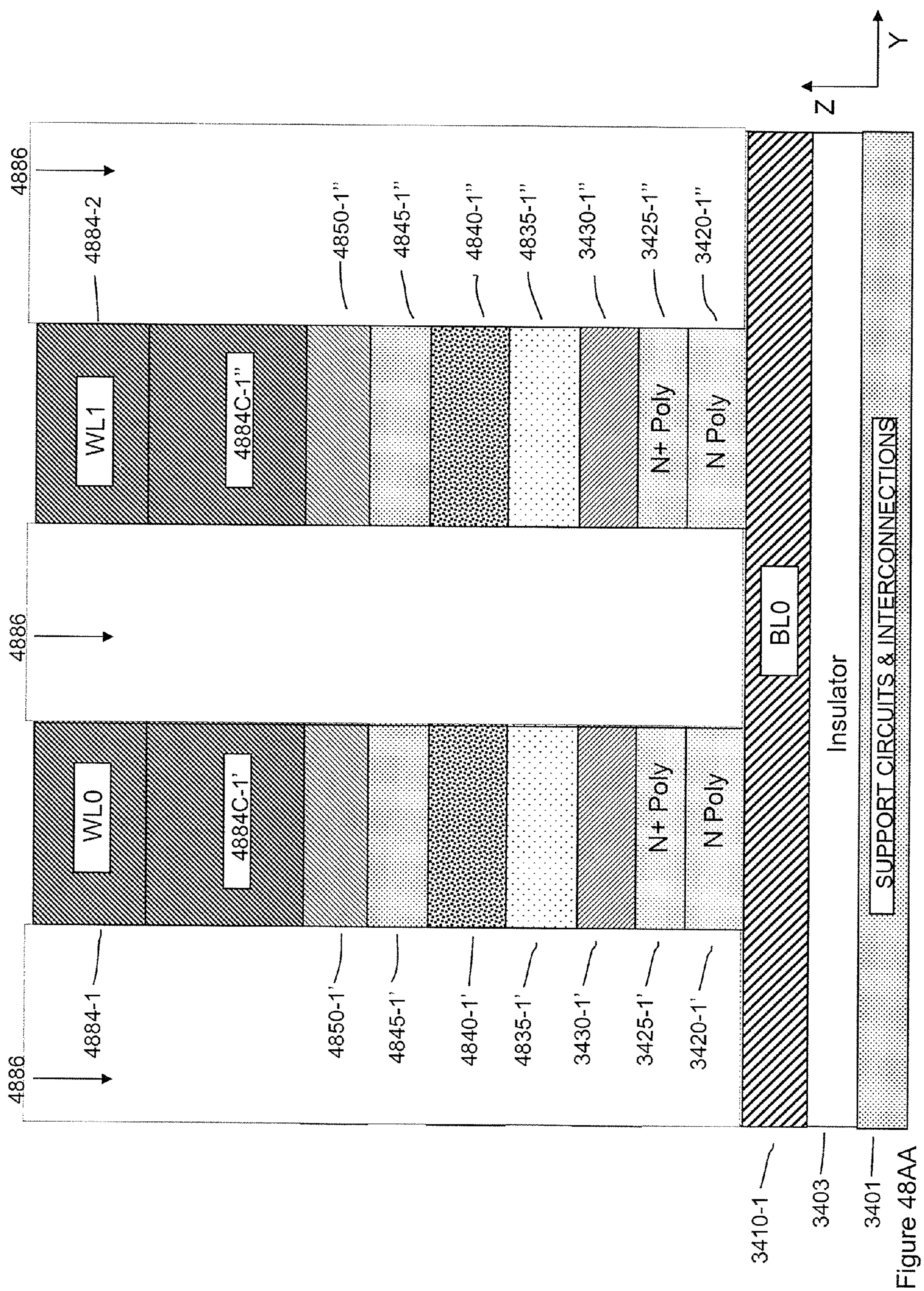
Figure 48B:
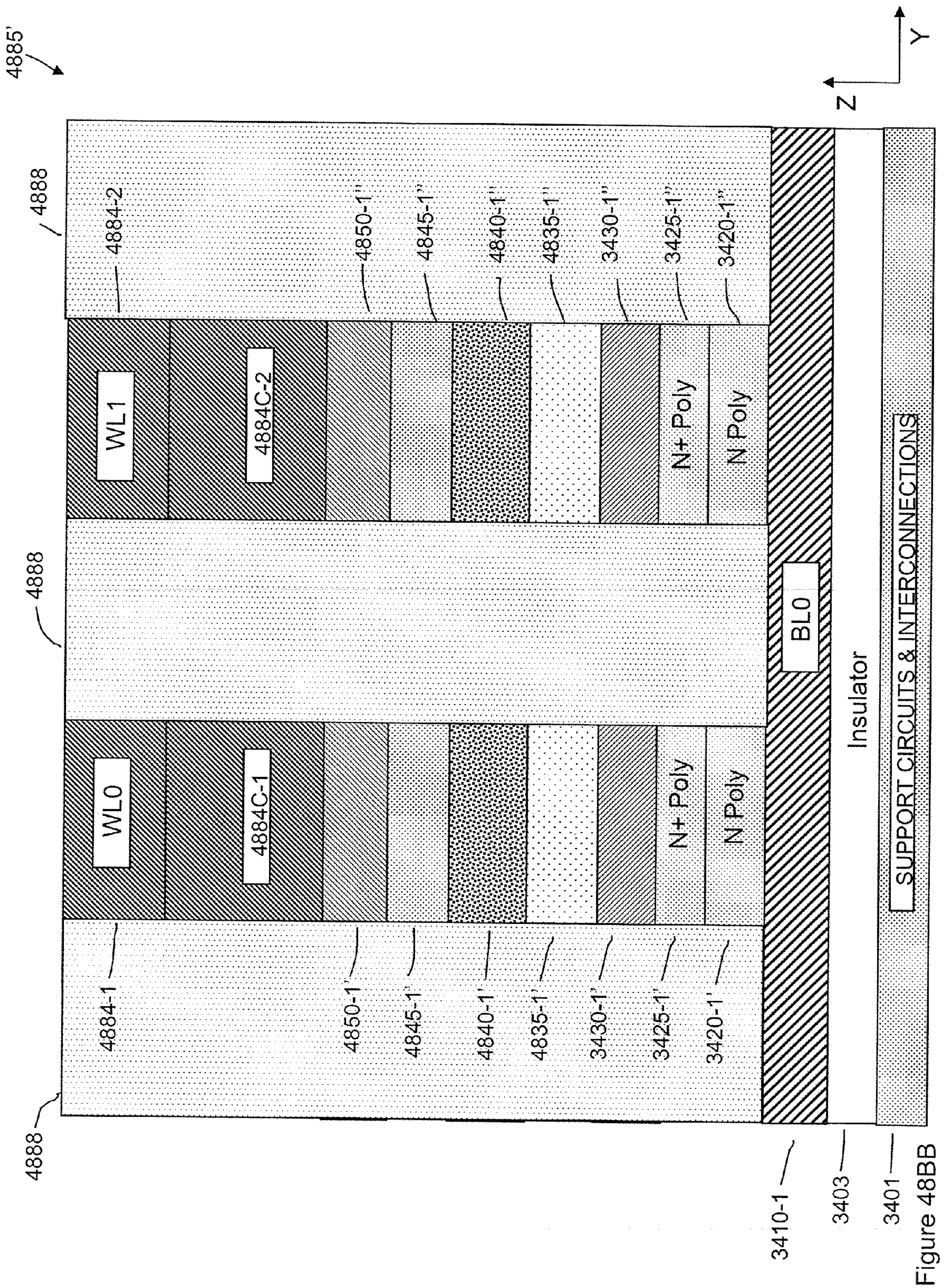

Next, methods deposit and pattern a masking layer such as masking layer 4884A on the surface of word line layer 4884 as illustrated in FIG. 48Z. Masking layer 4884A may be non-critically aligned to alignment marks in planar insulator 3403. Openings in mask layer 4884A determine the location of trench directional etch regions, in this case trenches are approximately orthogonal to bit lines such as conductor 3410-1 (BL0).

At this point in the process, openings in masking layer 4884A may be used for directional etching of trenches using methods that define new cell boundaries along the Y direction for 3D cells using one NV NT diode with an internal cathode-to-nanotube connection per cell. All trenches and corresponding cell boundaries may be formed simultaneously. This structure includes vertical sidewalls simultaneously defined by trenches. Such trench directional selective etch methods may cut through multiple conductor, semiconductor, and oxide layers as described further below and also described further above with respect to trench formation in FIGS. 48F to 48M and also in FIGS. 34A-34FF and 36A-36FF. In this example, selective directional trench etch (RIE) removes exposed areas of conductor layer 4884 to form word line conductors 4884-1 (WL0) and 4884-2 (WL1); exposed areas of contact region 4884C-1 to form contacts 4884C-1' and 4884C-1"; exposed areas of upper level contact regions 4850-1 and 4850-2 to form upper level contacts 4850-1' and 4850-1", removes exposed areas of protective insulator regions 4845-1 and 4845-2 to form protective insulators 4845-1' and 4845-1"; removes exposed areas of nanotube regions 4840-1 and 4840-2 to form nanotube elements 4840-1' and 4840-1"; removes exposed areas of insulator regions 4835-1 and 4835-2 to form insulators 4835-1' and 4835-1"; removes exposed areas of lower level contact regions 3430-1 and 3430-2 to form lower level contacts 3430-1' and 3430-1"; removes exposed areas of N+ polysilicon regions 3425-1 and 3425-2 to form N+ polysilicon regions 3425-1' and 3425-1"; and removes exposed areas of polysilicon regions 3420-1 and 3420-2 to form N polysilicon regions 3420-1' and 3420-1". Directional etching stops at the top surface of conductor 3410-1 forming trench openings 4886 as illustrated in FIG. 48AA.

Then methods fill trenches 4886 with an insulator 4888 such as TEOS, for example, and planarize the surface as illustrated by cross section 4885' in FIG. 48BB. Cross section 4885' illustrated in FIG. 48BB and cross section 4885 illustrated in FIG. 48Y are two cross sectional representations of the same 3D nonvolatile memory array with cells formed with NV NT diode having vertically oriented steering (select) diodes and horizontally-oriented nanotube elements contacted on each end by trench sidewall wiring. Cross section 4885 illustrated in FIG. 48Y corresponds to cross section 4785 illustrated in FIG. 47.

At this point in the process, cross sections 4885 and 4885' illustrated in FIGS. 48Y and 48BB, respectively, have been fabricated, nonvolatile nanotube element horizontally-oriented channel length $L_{SW-CH}$ are defined, including overall NV NT diode cell dimensions of 1F in the X direction and 1F in the Y direction, as well as corresponding bit and word array lines. Cross section 4885 is a cross section of two adjacent cathode-to-nanotube type nonvolatile nanotube diode-based cells in the X direction and cross section 4885' is a cross section of two adjacent cathode-to-nanotube type nonvolatile nanotube diode-based cells in the Y direction. Cross sections 4885 and 4885' include corresponding word line and bit line array lines. The nonvolatile nanotube diodes form the steering and storage elements in each cell illustrated in cross sections 4885 and 4885', and each cell having 1F by 1F dimensions. The spacing between adjacent cells is 1F so the cell periodicity is 2F in both the X and Y directions. Therefore one bit occupies an area of $4F^2$. At the 45 nm technology node, the cell area is less than 0.01 $um^2$.

Nonvolatile Nanotube Switch with Channel-Region End-Contacted Nanotube Elements

FIG. 49 illustrates NV NT Switch 4900 including a patterned nanotube element 4910 on insulator 4920 which is supported by substrate 4930. Patterned protective insulator 4935 is in contact with the top surface of nanotube element 4910. Examples of nanotube element 4910 and protective insulator 4935 are described further above with respect to FIGS. 48A-48BB. Terminals (conductor elements) 4940 and 4950 are deposited adjacent to end-regions of nanotube element 4910 and form terminal-to-nanotube end-region contacts 4960 and 4965, respectively. Examples of end-region contact to nanotube elements are described further above with respect to FIGS. 48L and 48U. The nonvolatile nanotube switch channel length $L_{SW-CH}$ is the separation between nanotube element end-region contacts 4960 and 4965. Substrate 4930 may be an insulator such as ceramic or glass, a semiconductor, or an organic rigid or flexible substrate. Insulator 4920 may be $SiO_2$, SiN, $Al_2O_3$, or another insulator material. Terminals (conductor elements) 4940 and 4950 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Laboratory testing results of individual nonvolatile nanotube switch 4900 with nanotube element 4910 channel length of approximately 250 nm and terminals (conductive elements) 4940 and 4950 formed of TiPd are illustrated by graph 5000 in FIG. 50. Nonvolatile nanotube switch 4900 switching results for 100 ON/OFF cycles shows that most ON resistance values are in range of 10 kOhms to 100 kOhms with a few ON resistance values of 800 kOhms as illustrated by resistance values 5010, and OFF resistance values are in the range of 500 MOhms to 100 GOhms as illustrated by resistance values 5020. In a few cases 5030, ON resistance values were greater than 100 MOhms.

If a 3D memory array is used in a nonvolatile Flash memory application, Flash architecture could be used to detect cases 5030 of ON resistance values that are greater than OFF resistance values 5010 and apply one or several additional cycles as needed to ensure ON resistance values of less than 1 MOhm as illustrated by graph 5000.

Nonvolatile nanotube switch 4900 ON/OFF resistance values demonstrate a lowering of the spread of ON resistance values and a tighter ON resistance value distribution after several tens (or hundreds) of cycles. Graphs 5010 and 5020 in the 80 to 100 ON/OFF cycle range show ON resistance values between 10 kOhms and less than 1 MOhms, for example, and OFF resistance values greater than 80 MOhms. Such nonvolatile nanotube switches may be used in any memory architecture. Applying tens or hundreds of cycles to as-fabricated nonvolatile nanotube switches 4900 may be used as part of a memory array burn-in operation. Examples of applied voltages and currents resulting in cycling between ON and OFF resistance values is described further above with respect to FIGS. 11A and 11B.

3-Dimensional Cell Structure of Nonvolatile Cells using NV NT Devices having Vertically Oriented Diodes and Horizontally Oriented Self Aligned NT Switches using Conductor Trench-Fill for Anode-on-NT Switch Connections FIG. 51 illustrates cross section 5185 including cells C00 and C10 in a 3-D memory embodiment. Nanotube layers are deposited horizontally on a planar insulator surface above previously defined diode-forming layers as illustrated in FIGS. 36A and 36B shown further above. Self-alignment methods, similar to self-alignment methods described further above with respect to FIGS. 34A-34FF, 36A-36FF, and 48A-48BB determine the dimensions and locations of trenches used to define cell boundaries. Self-aligned trench sidewall wiring connects horizontally-oriented nanotube elements with vertically-oriented diodes and also with array wiring.

Methods 3010 described further above with respect to FIG. 30A are used to define support circuits and interconnections 3601.

Next, methods 3030 illustrated in FIG. 30B deposit and planarize insulator 3603. Interconnect means through planar insulator 3603 (not shown in cross section 5185 but shown above with respect to cross section 2800" in FIG. 28C) may be used to connect metal array lines in 3-D arrays to corresponding support circuits and interconnections 3601. By way of example, word line drivers in WL driver and sense circuits 2930 may be connected to word lines WL0 and WL1 in array 2910 of memory 2900 illustrated in FIG. 29A described further above, and in cross section 5185 illustrated in FIG. 51. At this point in the fabrication process, methods 3040 may be used to form a memory array on the surface of insulator 3603, interconnected with memory array support structure 3605-1 illustrated in FIG. 51.

Exemplary methods 3040 illustrated in FIG. 30B deposit and planarize metal, polysilicon, insulator, and nanotube elements to form nonvolatile nanotube diodes which, in this example, include multiple vertically oriented diode and horizontally-oriented nonvolatile nanotube switch series pairs. Individual cell boundaries are formed in a single etch step, each cell having a single NV NT Diode defined by a single trench etch step after layers, except the BL0 layer, have been deposited and planarized, in order to eliminate accumulation of individual layer alignment tolerances that would substantially increase cell area. Individual cell dimensions in the Y direction are F (1 minimum feature) as illustrated in FIG. 51, and also F in the X direction (not shown) which is orthogonal to the Y direction, with a periodicity in X and Y directions of 2F. Hence, each cell occupies an area of approximately $4F^2$.

Vertically-oriented (Z direction) trench sidewall cell wiring on a first cell sidewall connects a vertically-oriented diode and one end of a horizontally-oriented nanotube element; and vertically-oriented trench sidewall cell wiring on a second cell sidewall connects the other end of the horizontally-oriented nanotube element with array wiring. Exemplary methods of forming vertically-oriented trench sidewall cell wiring may be adapted from methods of patterning shapes on trench sidewalls such as methods disclosed in U.S. Pat. No. 5,096,849. Horizontally-oriented NV NT switch element (nanotube element) dimensions in the X and Y direction are defined by trench etching. There are no alignment requirements for the nanotube elements in the X or Y direction. Nanotube element thickness (Z direction) is typically in the 5 to 40 nm range. However, nanotube element thickness may be any desired thickness, less than 5 nm or greater than 40 nm for example.

Horizontally-oriented nanotube elements may be formed using a single nanotube layer, or may be formed using multiple layers. Such nanotube element layers may be deposited e.g., using spin-on coating techniques or spray-on coating techniques, as described in greater detail in the incorporated patent references. FIG. 51 illustrates 3-D memory array cross section 5185 in the Y direction and corresponds to methods of fabrication illustrated with respect to FIGS. 48A-48BB, but with a small modification in that FIGS. 36A and 36B replace FIGS. 34A and 34B in order to form an anode-on-NT 3D memory cell (instead of a cathode-on-NT memory cell). NV NT switches are formed using the same methods of fabrication as the methods of fabrication as described further above with respect to FIGS. 48A-48BB. Nanotube element length dimension $L_{SW\text{-}CH}$ and width dimension $W_{SW\text{-}CH}$ are determined by etched trench wall spacing. If trench wall spacing is equal to minimum technology node dimension F in both X and Y direction, then for technology nodes 90 nm, 65 nm, 45 nm, and 22 nm for example, $L_{SW\text{-}CH}$ and $W_{SW\text{-}CH}$ will be approximately 90 nm, 65 nm, 45 nm, and 22 nm for example.

Methods fill trenches with an insulator; and then methods planarize the surface. Then, methods deposit and pattern bit lines on the planarized surface.

The fabrication of vertically-oriented 3D cells illustrated in FIG. 51 proceeds as follows. Methods deposit a word line wiring layer on the surface of insulator 3603 having a thickness of 50 to 500 nm, for example, as described further above with respect to FIGS. 48A-48BB (the word line wiring layer in FIG. 51 corresponds to the bit line wiring layer in FIGS. 48A-48BB). Fabrication of the vertically-oriented diode portion of structure 5185 is the same as in FIGS. 36A and 36B described further above and are incorporated in methods of fabrication described with respect to FIG. 51. Methods etch the word line wiring layer and define individual word lines such as word line conductors 3610-1 (WL0) and 3610-2 (WL1). Word lines such as WL0 and WL1 are used as array wiring conductors and may also be used as contacts to N+ regions 3620-1 and 3620-2, which are in contact with N regions 3625-1 and 3625-2 forming Schottky diode cathodes. N+ polysilicon regions 3620-1 and 3620-2 may be doped with arsenic or phosphorous of $10^{20}$ or greater, and N polysilicon regions 3625-1 and 3625-2 may be doped with arsenic or phosphorus in the range of $10^{14}$ to $10^{17}$ dopant atoms/$cm^3$ for example, and may have a thickness range of 20 nm to 400 nm, for example.

FIG. 51 illustrates an anode-to-NT type NV NT diode formed with Schottky diodes. However, PN or PIN diodes may be used instead of Schottky diodes.

The electrical characteristics of Schottky (and PN, PIN) diodes may be improved (low leakage, for example) by controlling the material properties of polysilicon, for example polysilicon deposited and patterned to form polysilicon regions 3625-1 and 3625-2. Polysilicon regions may have relatively large or relatively small grain boundary sizes that are determined by methods used in the semiconductor regions. For example, SOI deposition methods used in the semiconductor industry may be used that result in polysilicon regions that are single crystalline (no longer polysilicon), or nearly single crystalline, for further electrical property enhancement such as low diode leakage currents.

Methods form lower level contacts 3630-1 and 3630-2. Examples of contact conductor materials include elemental metals such as Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

Lower level contacts 3630-1 and 3630-2 also form anodes of Schottky diodes having Schottky diode junctions 3618-1 and 3618-2. In some cases conductors such as Al, Au, W, Cu, Mo, Ti, and others may be used as both contact conductor materials as well as anodes for Schottky Diodes. However, in other cases, optimizing anode material for lower forward voltage drop and lower diode leakage is advantageous. Schottky diode anode materials may be added (not shown) between lower level contacts (and Schottky diode anodes) 3630-1 and 3630-2 and polysilicon regions 3625-1 and 3625-2, respectively. Such anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002m pp. 31-41, the entire contents of which are incorporated herein by reference.

Next, methods form planar insulating regions 4735-1 and 4735-2 on the surface of lower level contact (contact) 3630-1 and 3630-2, respectively, typically $SiO_2$ for example, with a thickness of 20 to 500 nm for example and X and Y dimensions defined by trench etching near the end of the process flow.

Next, methods form horizontally-oriented nanotube elements 4740-1 and 4740-2 on the surface of insulator regions 4735-1 and 4735-2, respectively, having nanotube element length and width defined by trench etching near the end of the process flow and insulated from direct contact with lower level contacts 3430-1 and 3430-2, respectively. In order to maximize the density of cells C00 and C10, nanotube elements 4740-1 and 4740-2 illustrated in FIG. 51 are horizontally-oriented with trench-defined end-contacts 4764 and 4779 contacting nanotube element 4740-1, and end-contacts 4764' and 4779' contacting nanotube element 4740-2 as described further below Horizontally-oriented nanotube elements are described in greater detail in the incorporated patent references.

Then, methods form protective insulators 4745-1 and 4745-2 on the surface of conformal nanotube elements 4740-1 and 4740-2, respectively, with X and Y dimensions defined by trench etching near the end of the process flow. Exemplary methods of forming protective insulator 4745-1 and 4745-2 are described further above with respect to FIG. 48B.

Next, methods form upper level contacts 4750-1 and 4750-2 on the surface of protective insulators 4745-1 and 4745-2, respectively, with X and Y dimensions defined by trench etching near the end of the process flow.

Next, methods form (etch) trench openings of width F form inner sidewalls of cells C00 and C10 and corresponding upper and lower level contacts, nanotube elements, and insulators described further above.

Next, methods form sidewall vertical wiring 4762 and 4762'. Vertical sidewall wiring 4762 forms and connects end-contact 4764 of nanotube element 4740-1 with end-contact 4766 of lower level contact 3630-1; vertical sidewall wiring 4762' forms and connects end-contact 4764' of nanotube element 4740-2 with end-contact 4766' of lower level contact 3630-2.

Next, methods complete trench formation (etching) to the surface of insulator 3403.

Next, methods fill trench opening with an insulator such as TEOS and planarize the surface to complete trench fill 4769.

Next, methods form (etch) trench openings of width F that form outer sidewalls of cells C00 and C10 and corresponding upper and lower level contacts, nanotube elements, and insulators described further above.

Next, methods form sidewall vertical wiring 4776 and 4776'. Vertical sidewall wiring 4776 forms and connects end-contact 4779 of nanotube element 4740-1 with the end-contact region 4778 of upper level contact 4750-1; vertical sidewall wiring 4776' forms and connects end-contact 4779' of nanotube element 4740-2 with the end-contact region 4778' of upper level contact 4850-2.

Next, methods complete trench formation (etching) to the surface of insulator 3403.

Next, methods fill trench openings with an insulator such as TEOS and planarize the surface to complete trench fill 4882 and 4882'.

Next, methods directionally etch and form bit line contacts 5184C-1 and 5184C-2 on the surface of upper level contacts 4750-1 and 4750-2, respectively, by depositing and planarizing a bit line layer.

Next, methods pattern bit line 5184.

Nonvolatile nanotube diodes forming cells C00 and C10 correspond to nonvolatile nanotube diode 1300 in FIG. 13, one in each of cells C00 and C10. Cells C00 and C10 illustrated in cross section 5185 in FIG. 51 correspond to corresponding cells C00 and C10 shown schematically in memory array 2910 in FIG. 29A, and word lines WL0 and WL1 and bit line BL0 correspond to array lines illustrated schematically in memory array 2910.

After the fabrication of cross section 5185 illustrated in FIG. 51, 3D memory cell boundaries in the X direction are formed by simultaneously trench etching, trench filling with an insulator and planarizing. Bit lines and bit line contacts to upper level contacts are then formed to complete cross section 5185' in FIG. 52 that corresponds to cross section 5185 in FIG. 51.

Cross section 5185' illustrated in FIG. 52 illustrates support circuits and interconnections 3601 and insulator 3603 as described further above with respect to FIG. 51. Cross section 5185' is in the X direction along word line WL0.

N+ polysilicon regions 3620-1' and 3620-1" form contacts between word line 3610-1 (WL0) and N polysilicon 3625-1' and 3625-1", respectively, that form diode cathode regions. Lower level contacts 3430-1' and 3430-1" act as anodes to form Schottky diode junctions 3618-1' and 3618-1" as well as contacts to nanotube elements 4840-1' and 4840-1", respectively. Contacts between nanotube elements and lower level contacts are illustrated in corresponding cross section 5185 in FIG. 51.

Insulator 4835-1' and 4835-1" is used to separate nanotube elements 4840-1' and 4840-1" from electrical contact with lower level contacts 3630-1' and 3630-1", respectively.

Protective insulators 4845-1' and 4845-1" provide a protecting region above the nanotube elements, and also electrically separate nanotubes elements 4840-1' and 4840-1" from electrical contact with upper level contacts 4850-1' and 4850-1", respectively. Contacts between nanotube elements and upper level contacts are illustrated in corresponding cross sections 5185.

Bit line contacts 5184C-1' and 5184C-1" connect upper level contacts 4850-1' and 4850-1", respectively, to bit lines 5184-1 (BL0) and 5184-2 (BL1), respectively.

Corresponding cross sections 5185 and 5185' illustrated in FIGS. 51 and 52, respectively, show an anode-to-NT 3D memory array with horizontally-oriented nanotube elements. Nanotube channel length and channel width ($W_{SW-CH}$) correspond to NV NT diode cell dimensions of 1F in the X direction and 1F in the Y direction, as well as corresponding bit and word array lines. Cross section 5185 is a cross section of two adjacent anode-to-nanotube type nonvolatile nanotube diode-based cells in the Y direction and cross section 5185' is a cross section of two adjacent anode-to-nanotube type nonvolatile nanotube diode-based cells in the X direction. Cross sections 5185 and 5185' include corresponding word line and bit line array lines. The nonvolatile nanotube diodes form the steering and storage elements in each cell illustrated in cross sections 5185 and 5185', and each cell has 1F by 1F dimensions. The spacing between adjacent cells is 1F so the cell periodicity is 2F in both the X and Y directions. Therefore one bit occupies an area of $4F^2$. At the 45 nm technology node, the cell area is less than 0.01 $um^2$.

Corresponding cross sections 5185 and 5185' illustrated in FIGS. 51 and 52 methods of fabrication correspond to the methods of fabrication described with respect to FIGS. 48A-48BB, except that the vertical position of N polysilicon and N+ silicon layers are interchanged. NV NT switch fabrication methods of fabrication are the same. The only difference is that the N polysilicon layer is etched before N+ polysilicon layer when forming trenches in cross sections 5185 and 5185'.

Nonvolatile Memories using NV NT Diode Device Stacks with both Anode-to-NT Switch Connections and Cathode-to-NT Switch Connections and Horizontally-Oriented Self Alighted End-Contacted NV NT Switches FIG. 32 illustrates a method 3200 of fabricating embodiments having two memory arrays stacked one above the other and on an insulating layer above support circuits formed below the insulating layer and stacked arrays, and with communications means through the insulating layer. While method 3200 is described further below with respect to nonvolatile nanotube diodes 1200 and 1300, method 3200 is sufficient to cover the fabrication of many of the nonvolatile nanotube diode embodiments described further above. Note also that although methods 3200 are described in terms of 3D memory embodiments, methods 3200 may also be used to form 3D logic embodiments based on NV NT diodes arranged as logic arrays such as NAND and NOR arrays with logic support circuits (instead of memory support circuits) as used in PLAs, FPGAs, and PLDs, for example.

FIG. 53 illustrates a 3D perspective drawing 5300 that includes a two-high stack of three dimensional arrays, a lower array 5302 and an upper array 5304. Lower array 5302 includes nonvolatile nanotube diode cells C00, C01, C10, and C11. Upper array 5304 includes nonvolatile nanotube diode cells C02, C12, C03, and C13. Word lines WL0 and WL1 are oriented along the X direction and bit lines BL0, BL1, BL2, and BL3 are oriented along the Y direction and are approximately orthogonal to word lines WL1 and WL2. Nanotube element channel length $L_{SW\text{-}CH}$ is oriented horizontally as shown in 3D perspective drawing 5300. Cross sections of cells C00, C01, C02 and C03 are illustrated further below in FIG. 54A and cells C00, C02, C12, and C10 are illustrated further below in FIG. 54B.

In general, methods 3210 fabricate support circuits and interconnections in and on a semiconductor substrate. This includes NFET and PFET devices having drain, source, and gate that are interconnected to form memory (or logic) support circuits. Such structures and circuits may be formed using known techniques that are not described in this application. Some embodiments of methods 3210 are used to form a support circuits and interconnections 5401 layer as part of cross sections 5400 and 5400' illustrated in FIGS. 54A and 54B using known methods of fabrication in and on which nonvolatile nanotube diode control and circuits are fabricated. Support circuits and interconnections 5401 are similar to support circuits and interconnections 3401 illustrated in FIGS. 47 and 3601 illustrated in FIG. 51, for example, but are modified to accommodate two stacked memory arrays. Note that while two-high stacked memory arrays are illustrated in FIG. 54, more than two-high 3D array stacks may be formed (fabricated), including but not limited to 4-high and 8 high stacks for example.

Next, methods 3210 are also used to fabricate an intermediate structure including a planarized insulator with interconnect means and nonvolatile nanotube array structures on the planarized insulator surface such as insulator 5403 illustrated in cross sections 5400 and 5400' in FIGS. 54A and 54B, respectively, and are similar to insulator 3403 illustrated in FIG. 47 and insulator 3601 illustrated in FIG. 51, but are modified to accommodate two stacked memory arrays. Interconnect means include vertically-oriented filled contacts, or studs, for interconnecting memory support circuits in and on a semiconductor substrate below the planarized insulator with nonvolatile nanotube diode arrays above and on the planarized insulator surface. Planarized insulator 5403 is formed using methods similar to methods 2730 illustrated in FIG. 27B. Interconnect means through planar insulator 5403 (not shown in cross section 5400) are similar to contact 2807 illustrated in FIG. 28C and may be used to connect array lines in first memory array 5410 and second memory array 5420 to corresponding support circuits and interconnections 5401. Support circuits and interconnections 5401 and insulator 5403 form memory array support structure 5405-1.

Next, methods 3220, similar to methods 2740, are used to fabricate a first memory array 5410 using diode cathode-to-nanotube switches based on a nonvolatile nanotube diode array similar to a nonvolatile nanotube diode array cross section 4785 illustrated in FIG. 47 and corresponding methods of fabrication.

Next, methods 3230 similar to methods 3040 illustrated in FIG. 30B, fabricate a second memory array 5420 on the planar surface of first memory array 5410, but using diode anode-to-nanotube switches based on a nonvolatile nanotube diode array similar to a nonvolatile nanotube diode array cross section 5185 illustrated in FIG. 51 and corresponding methods of fabrication FIG. 54A illustrates cross section 5400 including first memory array 5410 and second memory array 5420, with both arrays sharing word line 5430 in common. Word lines such as 5430 are defined (etched) during a methods trench etch that defines memory array (cells) when forming array 5420. Cross section 5400 illustrates combined first memory array 5410 and second memory array 5420 in the word line, or X direction, with shared word line 5430 (WL0), four bit lines BL0, BL1, BL2, and BL3, and corresponding cells C00, C01, C02, and C03. The array periodicity in the X direction is 2F, where F is a minimum dimension for a technology node (generation).

FIG. 54B illustrates cross section 5400' including first memory array 5410' and second memory array 5420' with both arrays sharing word lines 5430' and 5432 in common. Word line 5430' is a cross sectional view of word line 5430. Word lines such as 5430' and 5432 are defined (etched) during a trench etch that defines memory array (cells) when forming array 5420'. Cross section 5400' illustrates combined first memory array 5410' and second memory array 5420' in the bit line, or Y direction, with shared word lines 5430' (WL0) and 5432 (WL1), two bit lines BL0 and BL2, and corresponding cells C00, C10, C02, and C12. The array periodicity in the Y direction is 2F, where F is a minimum dimension for a technology node (generation).

The memory array cell area of 1 bit for array 5410 is $4F^2$ because of the 2F periodicity in the X and Y directions. The memory array cell area of 1 bit for array 5420 is $4F^2$ because of the 2F periodicity in the X and Y directions. Because memory arrays 5420 and 5410 are stacked, the memory array cell area per bit is $2F^2$. If four memory arrays (not shown) are stacked, then the memory array cell area per bit is $1F^2$.

In some embodiments, methods 3240 using industry standard fabrication techniques complete fabrication of the semiconductor chip by adding additional wiring layers as needed, and passivating the chip and adding package interconnect means.

In operation, memory cross section 5400 illustrated in FIG. 54A and corresponding memory cross section 5400' illustrated in FIG. 54B correspond to the operation of memory cross section 3305 illustrated in FIG. 33B and corresponding memory cross section 3305' illustrated in FIG. 33B'. Memory cross section 5400 and corresponding memory cross section 5400' operation is the same as described with respect to waveforms 3375 illustrated in FIG. 33D.

Method of Forming Trench Sidewall Wiring Using Conformal Conductor Deposition as an Alternative to Trench Fill FIG. 48G illustrates a trench opening 4857 that is then filled with conductor 4858 as illustrated in FIG. 48H. Trench sidewall wiring is then formed as further illustrated in methods of fabrication described in FIG. 48A-48BB.

Conformal conductor deposition may be used instead of a trench fill conductor to create trench sidewall wiring as illustrated in FIGS. 55A-55F. Exemplary methods of fabrication illustrated in FIGS. 55A-55F are based on an adaptation of U.S. Pat. No. 5,096,849 illustrated in FIGS. 41A-41B.

Figure 55A:
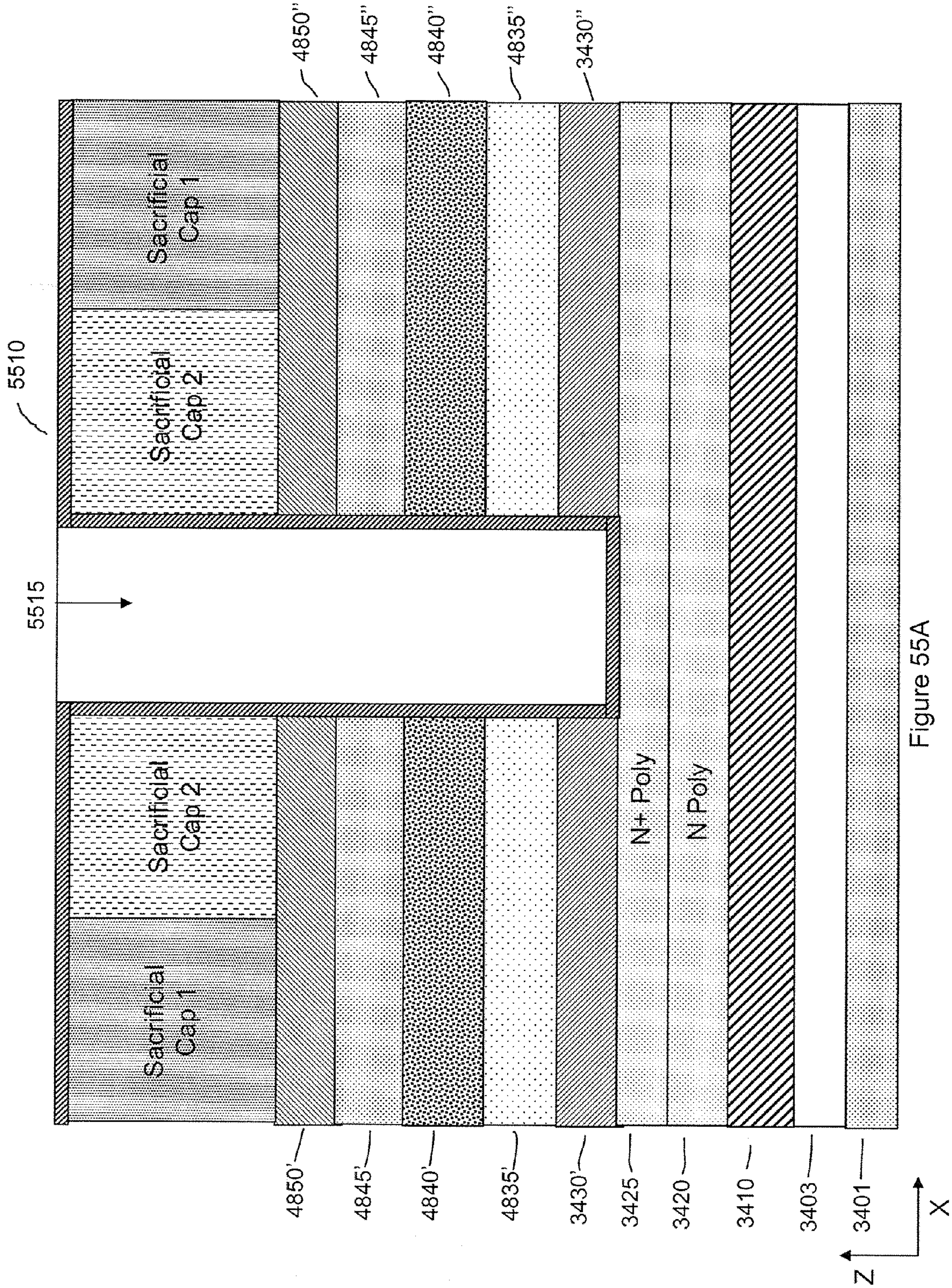
FIGS. 55A-55F illustrate cross sections of 3D memory cells using sidewall wiring formed using conformal conductor deposition inside trench openings instead of trench fill methods used in FIGS. 47, 48A-48BB, 51, and 52, according to some embodiments.

Some methods deposit a conformal conductor layer 5510 in opening 4857 (FIG. 48G) as illustrated in FIG. 55A and forms trench opening 5515. Examples of conductors layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Conductor material is formed into sidewall wiring regions as illustrated further below. Because wiring distances are short, the sheet resistance of resulting trench sidewall wiring is not a concern.

Figure 55B:
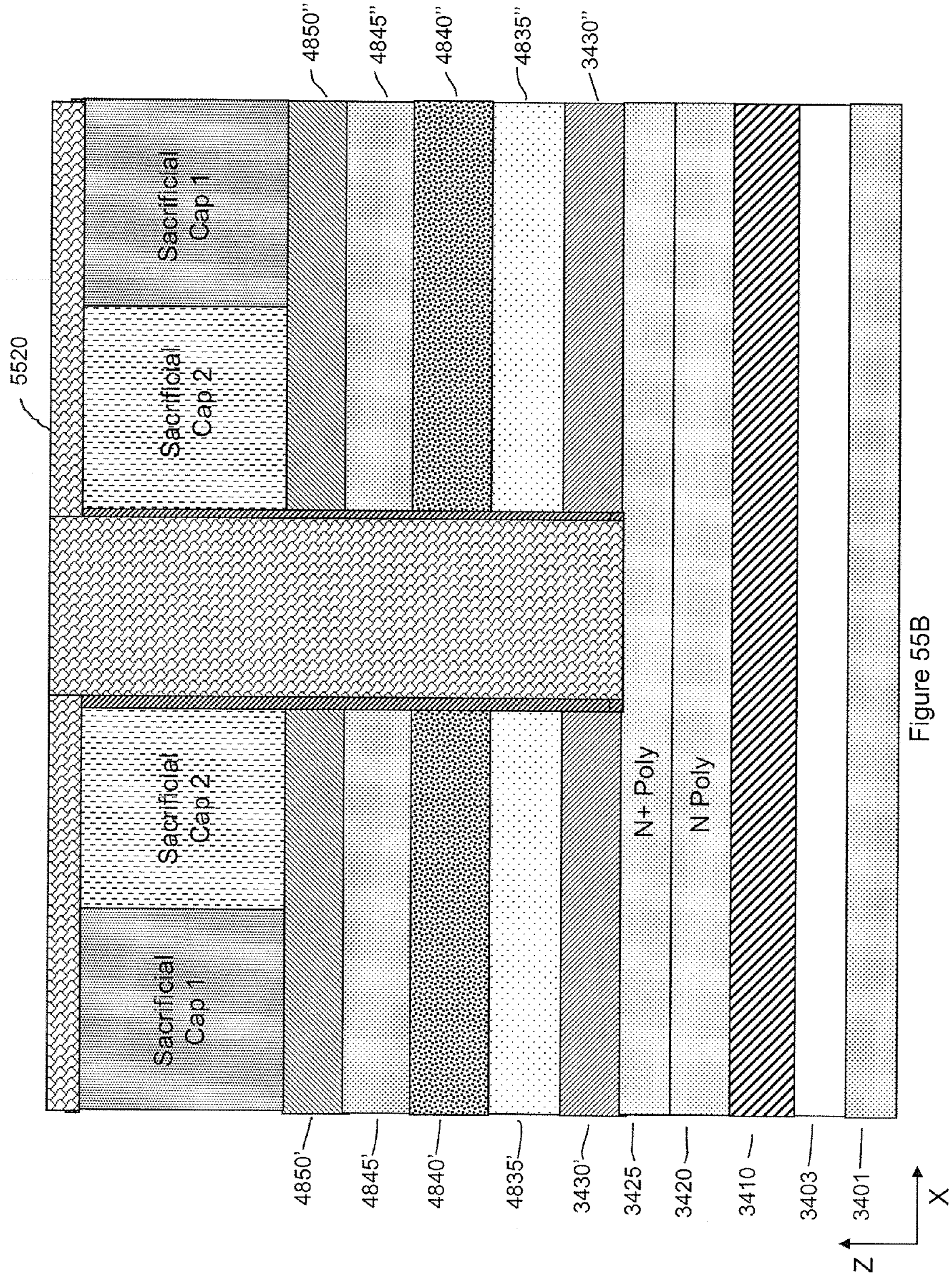

Next, methods fill trench opening 5515 with sacrificial material 5520 as illustrated in FIG. 55B. Sacrificial material 5520 may be a conductor, semiconductor, or an insulator. If an insulator is selected, sacrificial material 5520 may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials.

Figure 55C:
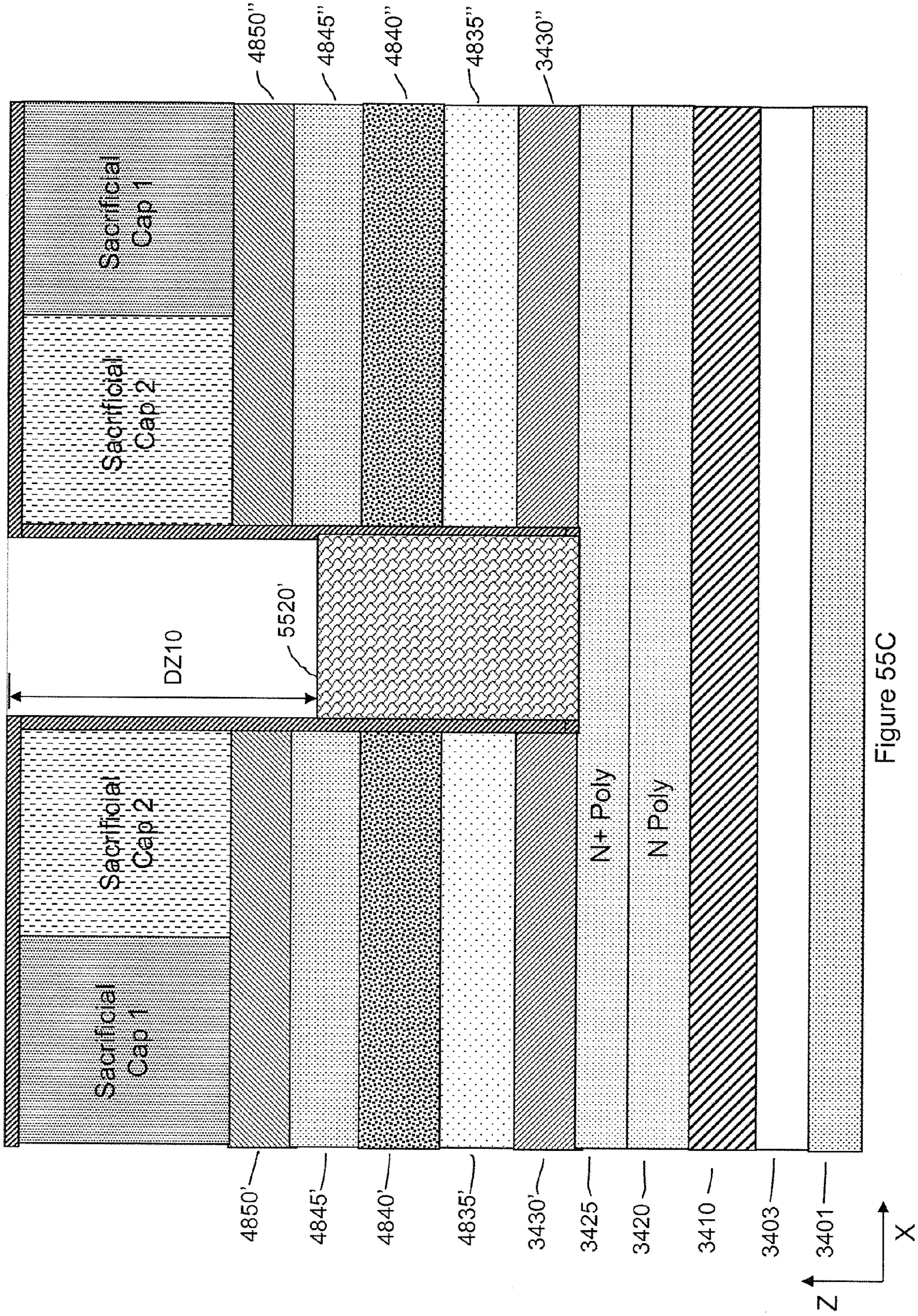

Next, methods etch (RIE) sacrificial material 5520 to a depth DZ10 below the bottom of upper level contacts 4850' and 4850" as illustrated in FIG. 55C leaving sacrificial material 5520'.

Figure 55D:
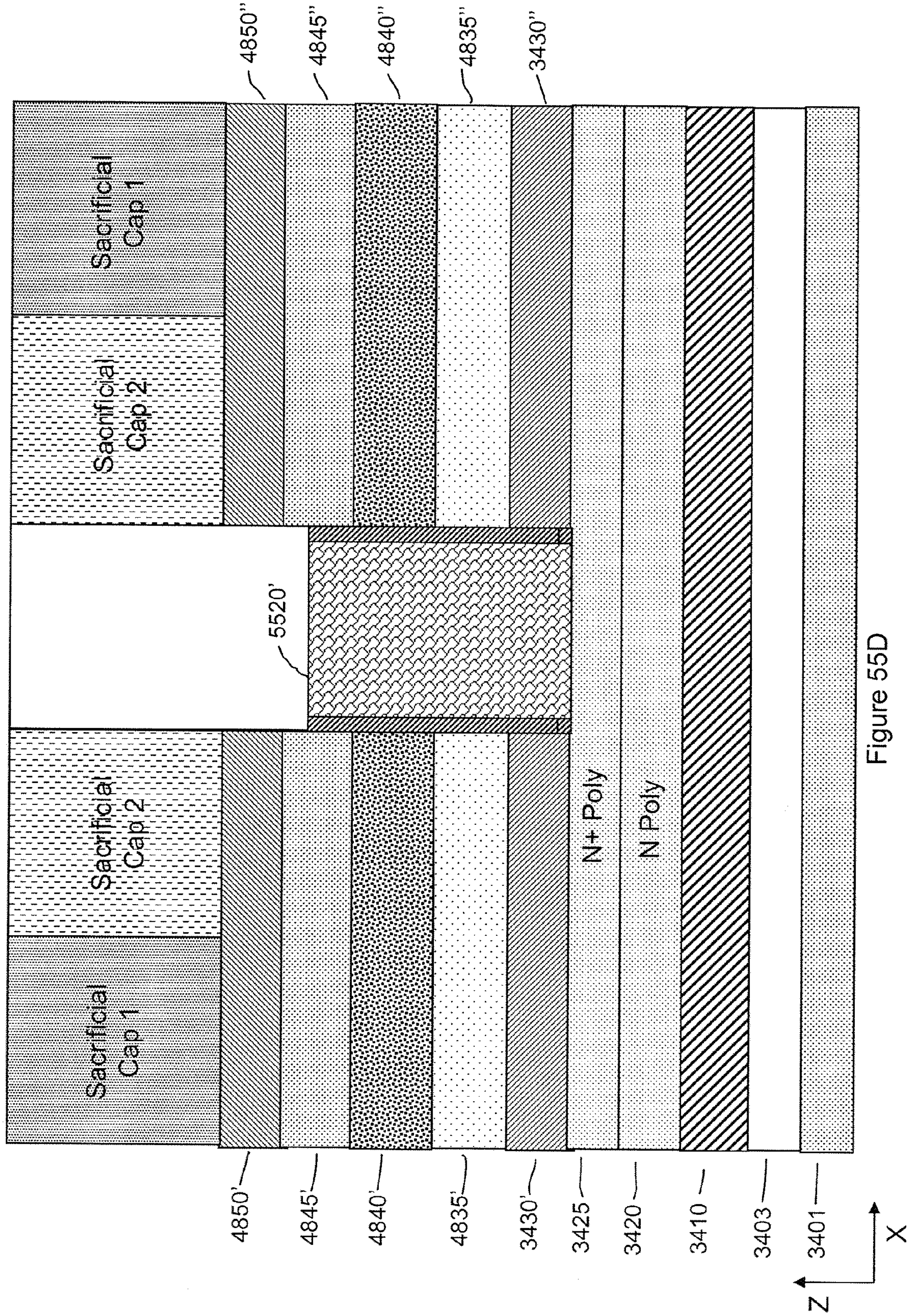

Next, methods remove (etch) exposed regions of the conformal trench sidewall conductor using known industry methods as illustrated in FIG. 55D and leaving sacrificial material 5520'.

Figure 55E:
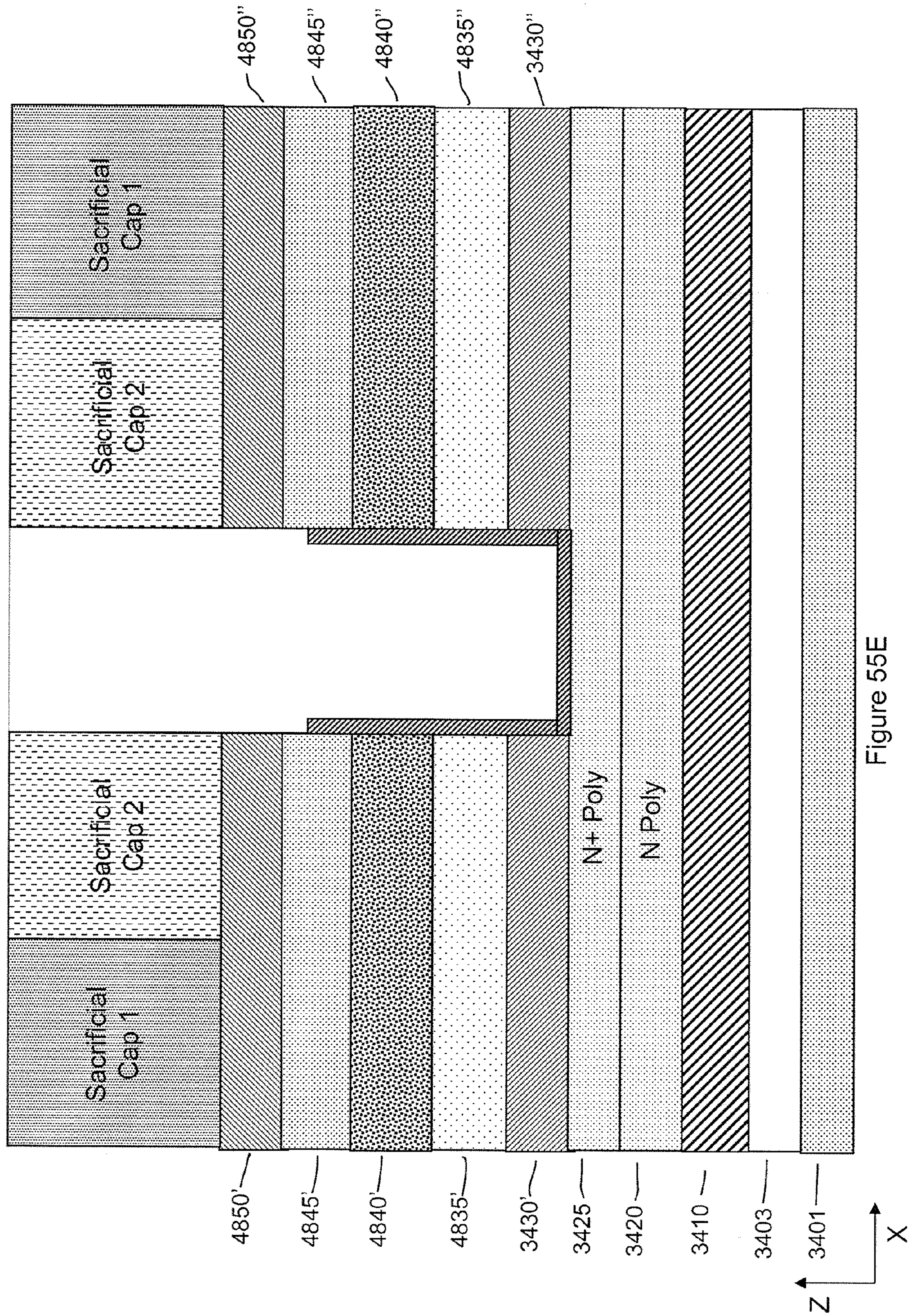
Figure 55F:
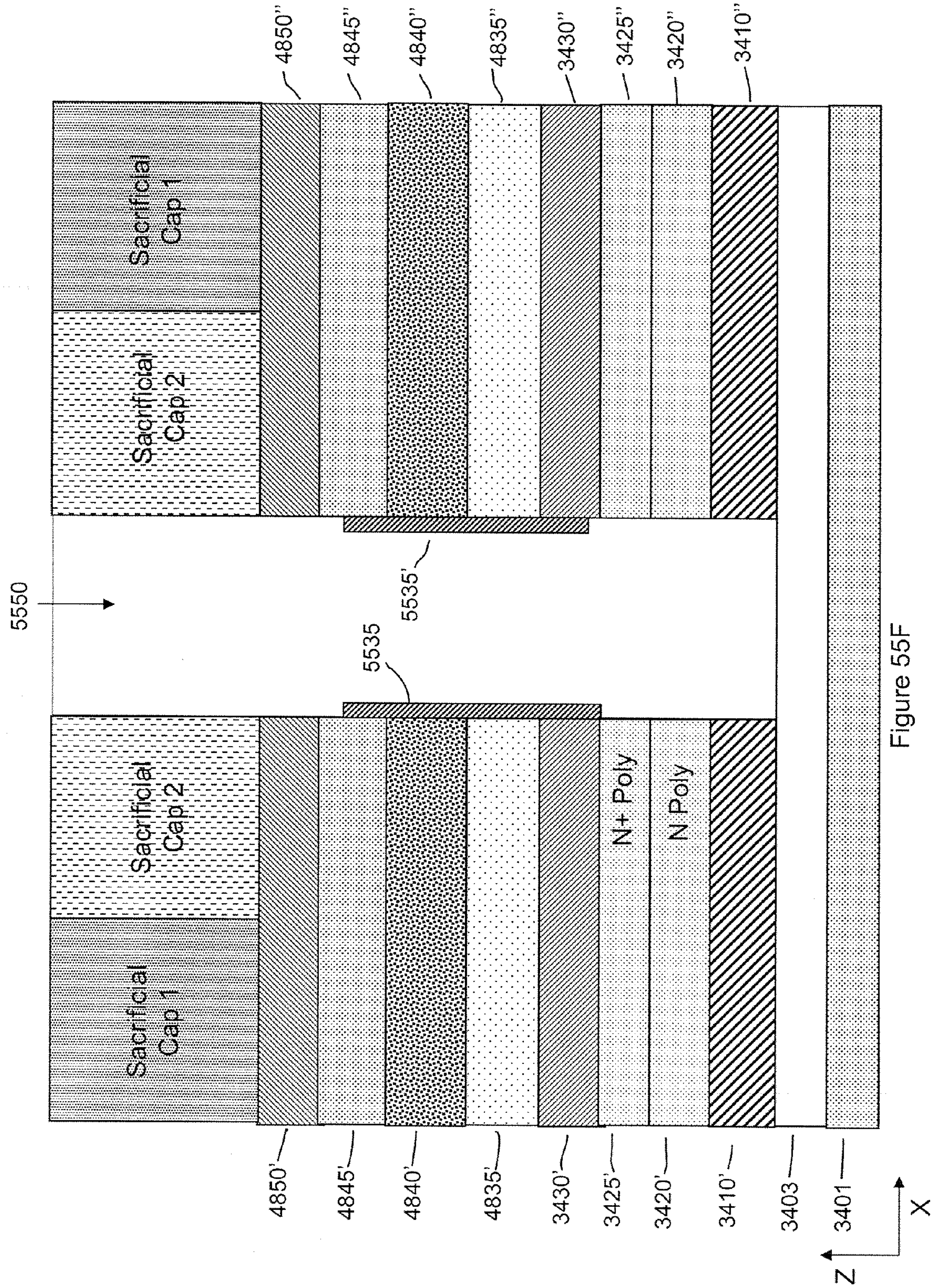

Next, methods remove (etch) remaining sacrificial material 5520' using known industry methods as illustrated in FIG. 55E.

Next, methods RIE remaining conformal conductor forming trench sidewall wiring 5535 and 5535'. Then, methods directionally etch remaining semiconductor and metal layers to form trench sidewall wiring 5535 and 5535' corresponding to sidewall wiring 4862 and 4862' in FIG. 48L, and forming trench 5550.

Methods of fabrication using conformal conductor deposition instead of conductor trench fill as described with respect to FIGS. 55A-55F may be applied to methods of fabrication described with respect to FIGS. 48A-48BB to form 3D memory cross section 4885 illustrated in FIG. 48Y and 3D memory cross section 4885' illustrated in FIG. 48BB.

Methods of fabrication using conformal conductor deposition as described with respect to FIGS. 55A-55F may also be used to form 3D memory cross section 5185 illustrated in FIG. 51 and 3D memory cross section 5185' illustrated in FIG. 52.

Nonvolatile Nanotube Blocks

Nonvolatile nanotube switches (NV NT Switches) are described in detail in U.S. patent application Ser. No. 11/280,786, and switch examples and operation are summarized briefly in this application as illustrated in FIGS. 3-11B illustrated above. FIGS. 3-6B illustrate horizontally-oriented NV NT switches 300, 400, 500, and 600, and FIG. 7B illustrate vertically-oriented NV NT switch 750. These switches are formed by nanotube elements of thickness in the range of 0.5 to 10 nm, for example, that are contacted by metallic terminals in contact with surface regions at opposite ends of the patterned nanotube elements.

FIGS. 26A and 29A illustrate nonvolatile nanotube diode-based memory arrays and circuits using cathode-on-NT and anode-on-NT type nonvolatile nanotube diodes, respectively, as described further above with respect to FIGS. 12 and 13. It is desirable to fabricate the densest possible memory arrays at each technology node F, where F is the minimum technology node lithographic dimension. If each cell is F×F and separated by a dimension F from adjacent cells, then the cell-to-cell periodicity is 2F and the minimum cell area for a technology node F is $4F^2$. If individual cells can hold more than one bit, or if arrays can be stacked one above the other, then the effective memory cell may be $2F^2$ or $1F^2$, for example.

FIG. 28C illustrates cross section 2800" in which the NV NT diode cell includes a vertically-oriented diode steering (select) device in contact with a horizontally-oriented nanotube which is larger than a minimum feature size F in the X direction because horizontally-placed nanotube element contacts at opposite ends of nanotube element 2850 extend beyond minimum feature F. FIGS. 28A and 28B, as well as 31A, 31B, and 31C show vertically-oriented nanotubes with bottom and side/top contacts that are compatible with minimum feature size F.

However, even with vertically-oriented nanotubes, scaling to small dimensions such as technology node F=22 nm (or smaller) may in some embodiments be limited by the nanotube fabric density of the nanotube element, that is the number of individual nanotubes available in the width direction of the device. Another way to express nanotube fabric density is to measure the size of void regions as illustrated in FIG. 38. FIG. 39 illustrates nanotube elements of increased thickness in order to increase the number of nanotubes available for a device of minimum feature width F, which may be 45 nm, 35 nm, or 22 nm for example. FIG. 40 illustrates a dense memory cell in which a nanotube element 4050 has a cross section F×F. The nanotube thickness determines the channel length $L_{SW\text{-}CH}$, which is defined by the separation between upper level contact 4065 and lower level contact 4030 of nanotube switch 4005. Upper level contacts may also be referred to as top contacts and lower level contacts may also be referred to as bottom contacts. Thicker nanotube elements such as nanotube element 4050 may be referred to as a nonvolatile nanotube blocks. NV NT diode arrays fabricated using NV nanotube blocks such as nanotube element 4050 with upper level and lower level contacts as illustrated further above in FIG. 40, and illustrated further below with respect to FIGS. 57, 67 and 68, result in a relatively simple self aligned three-dimensional NV memory array structures.

Nonvolatile nanotube blocks ("NV NT blocks") can be thought of as nanotube elements that include 3-D volumes of nanotube fabric. The term NV NT blocks is used to distinguish relatively thick nanotube elements from relatively thin nanotube elements, e.g., those illustrated in FIGS. 3-7B. For example, NV NT blocks may have thicknesses ranging, e.g., from about 10 nm to 200 nm (or more), e.g., from about 10 to 50 nm. Thus, the thickness of the block is generally substantially larger than the diameters of individual nanotubes in the block, e.g., at least about ten times larger than the individual nanotube diameters, forming a 3-D volume of nanotubes. In contrast, some other kinds of nanotube elements are relatively thin, for example having about the same thickness as the nanotube diameters themselves (e.g., approximately 1 nm), forming a monolayer. In many cases, relatively thin elements can be considered to be "2-D" in nature (although at the nanoscopic level 3-D features can of course be seen). In general, both relatively thin nanotube fabrics, and relatively thick NV NT blocks (e.g., over a broad range of thicknesses, such as from less than about 1 nm to 200 nm or more) include a network of nanotubes.

In many embodiments, NV NT blocks are shaped, sized, and/or are sufficiently dense such that terminals may contact the blocks on any surface(s), including the bottom, top, side, and end, or in any combination of surfaces. The size and/or density of the fabric that forms the block substantially prevents the terminals from contacting each other through the fabric and shorting. In other words, the size and/or density of the fabric physically separates the terminals from one another. As discussed above relative to FIG. 38, one way of ensuring that the fabric forming the NV NT block is sufficiently dense is to control the distribution of the size of voids within the fabric. As discussed in greater detail below, the density of the fabric of the NV NT block can be controlled by selecting appropriate deposition parameters. For example, the nanotubes forming the fabric can be densely deposited using spray coating techniques, or by using spin-coating to coat multiple layers on top of each other. Or, as described in greater detail below, thinner layers may be formed by incorporating a sacrificial material into the nanotube fabric, for example either during or after the deposition of the nanotube fabric. This sacrificial material substantially prevents the terminals from coming into contact when the terminals are formed, i.e., physically separates the terminals. The sacrificial material can later be substantially removed, leaving behind the nanotube fabric. The nanotube fabric need not be as dense or thick as in other embodiments, because the terminals are already formed with a given physical separation from each other.

In many embodiments, many of the nanotubes within the nanotube fabric forming the NV NT block lie substantially parallel to the surface on which they are disposed. In some embodiments, for example if the nanotubes are spin-coated onto a surface, at least some of the nanotubes may also generally extend laterally in a given direction, although their orientation is not constrained to that direction. If another layer of nanotubes is spin-coated on top of that layer, the nanotubes may generally extend in the same direction as the previous layer, or in a different direction. Additionally, while many the nanotubes of the additional layer will also be generally parallel to the surface, some of the nanotubes may curve downwards to fill voids in the previous nanotube layer. In other embodiments, for example if the nanotubes are spray-coated onto a surface, the nanotubes will still lie generally parallel to the surface on which they are disposed, although they may have generally random orientations relative to each other in the lateral direction. In other embodiments, the nanotubes may extend randomly in all directions.

In many embodiments, NV NT blocks have a thickness or height that is on the order of one or more of its lateral dimensions. For example, as described in greater detail below, one or more dimensions of the NV NT block can be defined lithographically, and one dimension defined by the as-deposited thickness of the nanotube fabric forming the NV NT block. The lithographically defined dimension(s) scale with the technology node (F), enabling the fabrication of devices with minimum lateral dimensions of approximately F. e.g., of about 65 nm for F=65 nm, of about 45 nm for F=45 nm, of about 32 nm for F=32 nm, of about 22 nm for F=22 nm, or below. For example, for F=22 nm, an NV NT block could have dimensions of about 22 nm×22 nm×35 nm, assuming that the nanotube fabric forming the NV NT block is about 35 nm thick. Other dimensions and thicknesses are possible. Depending on the arrangement of the terminals, and the thickness and as-deposited characteristics of the nanotube fabric forming the NV NT block, the distance between the terminals (i.e., the switch channel length) may be defined either by a lithographically defined dimension of the NV NT block. Alternately, the distance between the terminals may be defined by the thickness of the fabric forming the NV NT block, which in some circumstances may be sub-lithographic. Alternately, the switch channel length may be defined by providing the terminals in an arrangement that is not directly related to a dimension of the NV NT block itself, but rather by patterning the terminals to have features that are separated from each other by a particular distance. In general, as illustrated in greater detail below, NV NT blocks enable the fabrication of switching elements with areas at least down to about $1F^2$.

Note that a "NV NT block" need not be cube-shaped, e.g., a volume having all dimensions approximately equal, or even have parallel sides, although some embodiments will have those features. For example, in certain embodiments, shapes defined in masking layers at minimum dimensions may have rounded corners such that square shapes as-drawn may be approximately circular as-fabricated, or may be generally square but with rounded features. An approximately circular masking layer results in an approximately cylindrical nonvolatile nanotube element that is also referred to as a NV NT block in this invention. Therefore, nanotube element 4050 illustrated by cross section 4000 in FIG. 40 may have an as-fabricated square cross section F×F if the masking layer used to define trench boundaries is an F×F square as illustrated further below in FIG. 57A. Alternatively, nanotube element 4050 illustrated in cross section 4000 may have an as-fabricated approximately circular cross section of diameter approximately F as part of a cylindrical NV NT block element as illustrated further below in FIG. 57A'.

Individual NT-to-NT overlap regions are estimated to be between 0.5×0.5 nm to 10×10 nm in size, which is below available SEM resolution limitations. FIG. 3 illustrates a NV NT switch 300 that corresponds to NV NT switch 600/600' illustrated in FIGS. 6A and 6B. With respect to FIG. 6A, NV NT Switch 600 is in an ON state such that voltage applied to terminal 620 is transmitted to terminal 610 by patterned nanotube element 630 with a NV NT network in an electrically continuous ON state as illustrated by SEM voltage contrast imaging. FIG. 6B illustrates NV NT Switch 600', which corresponds to NV NT Switch 600, but is in an OFF state. In an OFF state, patterned nanotube element 630 forms a NV NT network in an electrically discontinuous state, and does not electrically connect terminals 610 and 620. SEM voltage contrast imaging of NV NT Switch 600' in FIG. 6B illustrates patterned nanotube element 630 in which patterned nanotube element region 630' is electrically connected to terminal 620 (light region) and patterned nanotube element region 630" is electrically connected to terminal 610' (dark region), but where patterned nanotube element regions 630' and 630" are not electrically connected to each other. Terminal 610' is dark since voltage applied to terminal 620 does not reach terminal 610' because of the electrical discontinuity in the NV NT network between patterned nanotube element regions 630' and 630". Note that terminal 610' is the same as terminal 610, except that it is not electrically connected to terminal 620 in NV NT Switch 600'. While the electrical NV NT network discontinuity is visible in terms of the light portion of region 630' and the dark portion of region 630', individual nanoscale NV NT switches forming the NV NT network are not visible due to SEM resolution limitations.

In operation, as illustrated further above in FIGS. 9A-9B and with test voltages and timings illustrated in FIGS. 11A-11B, switch 300 switches between ON and OFF states. In the ON state, the resistance measured during the read operation is near-ohmic. NV NT elements fabricated with a variety of thicknesses and terminal (contact) configurations illustrated further above with respect to FIGS. 49 and 50, and further below with respect to FIGS. 56A-65, exhibit electrical switching characteristics similar to those in FIGS. 9A-9B when test conditions similar to those illustrated in FIGS. 11A-11B are applied. Nanotube element switching appears relatively insensitive to geometrical variations, with the possible exception of lower voltage operation at shorter switch channel lengths $L_{SW-CH}$ as illustrated in FIG. 10.

FIGS. 56A-56F and 57A-57C further below illustrate various relatively thin NV nanotube elements and relatively thick NV nanotube elements (NV NT blocks) with various terminal contact location configurations in 3-dimensional perspective.

FIGS. 58A-65 illustrate nonvolatile switches fabricated using various nonvolatile nanotube elements and corresponding measured electrical switching characteristics. These nonvolatile nanotube elements and terminal contact configurations correspond to those illustrated in FIGS. 56A-56F and 57A-57C.

Figure 65:
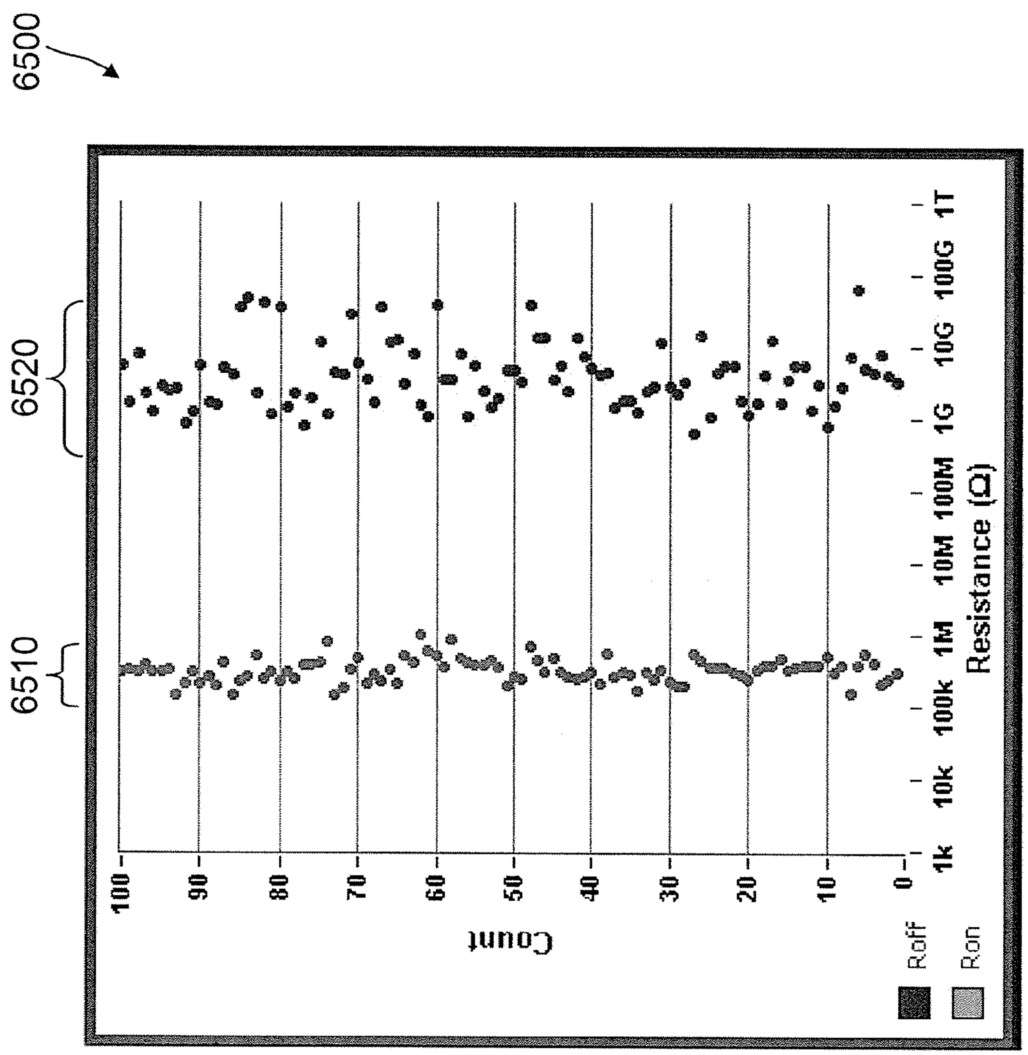
FIG. 65 illustrates electrical ON/OFF switching characteristics of the nonvolatile nanotube block-based switch embodiment illustrated in FIGS. 64A-64C.
Figure 66A:
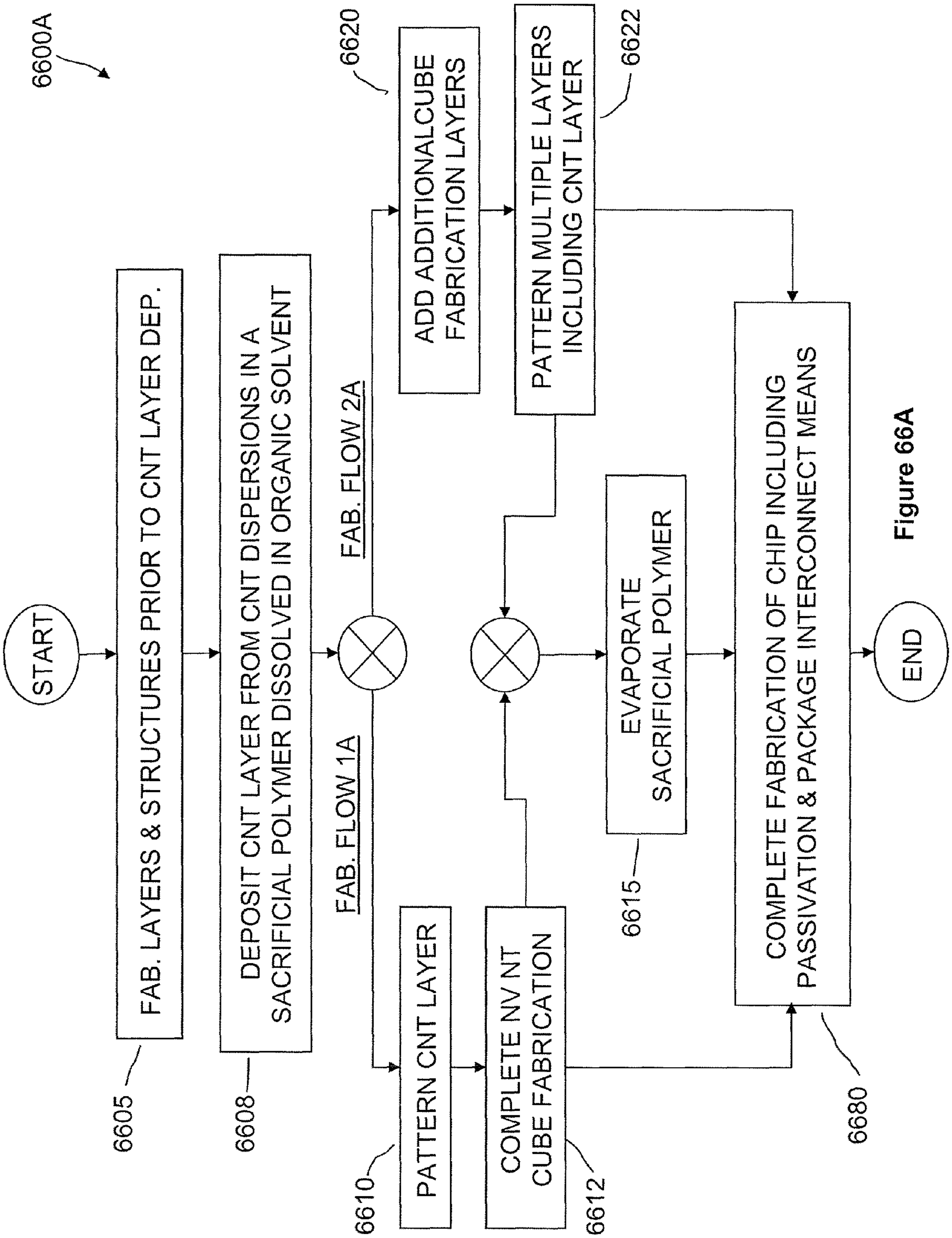
FIGS. 66A-66C illustrate methods of fabrication of nonvolatile nanotube blocks using various nanotube solution types and insulators, according to some embodiments.
Figure 66B:
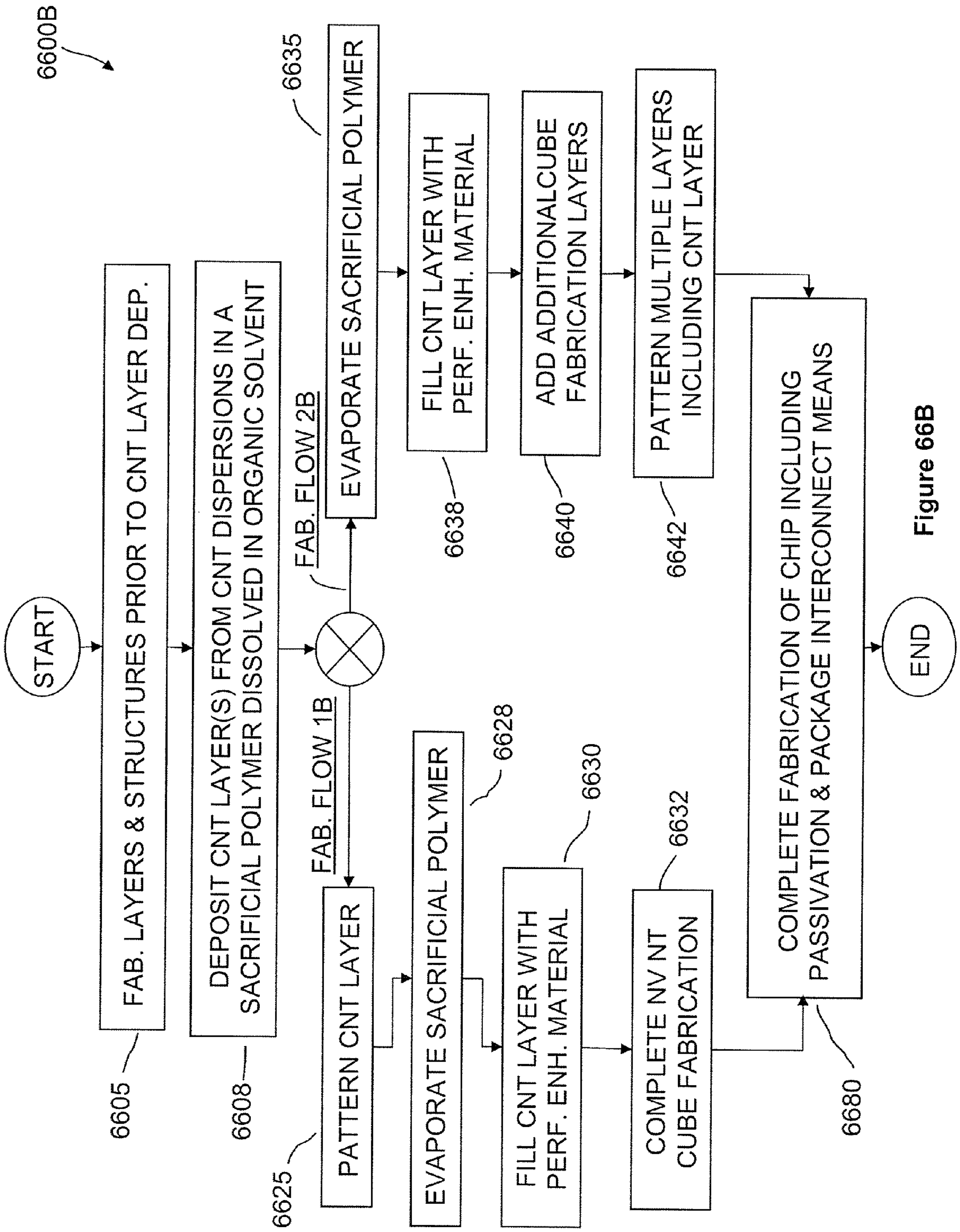
Figure 66C:
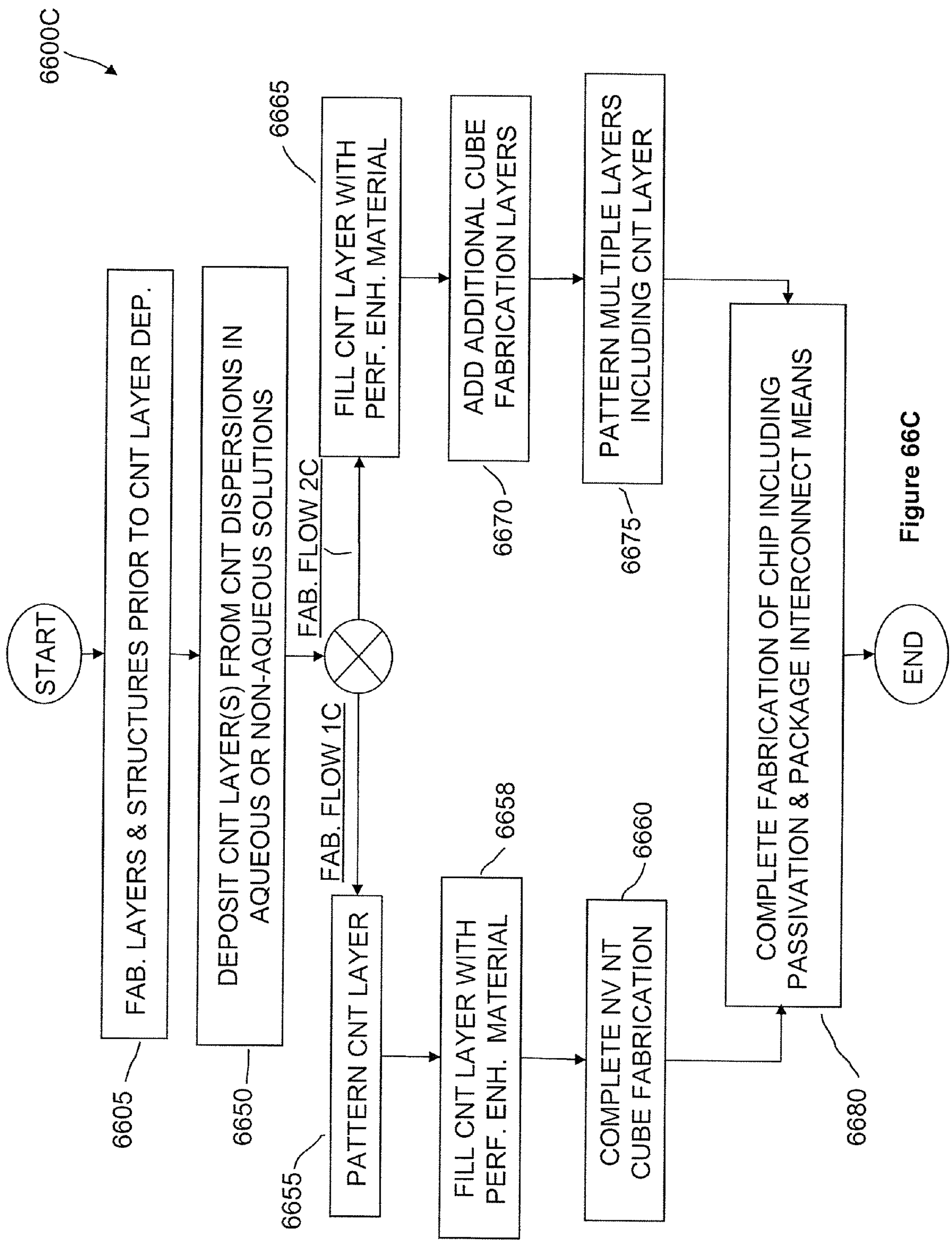

FIGS. 66A-66C illustrate various methods of fabrication of a variety of nonvolatile nanotube blocks, such as those illustrated in FIGS. 40, 47, 49, 56A-56F, 57A-57C, and 58A-65.

Figure 67:
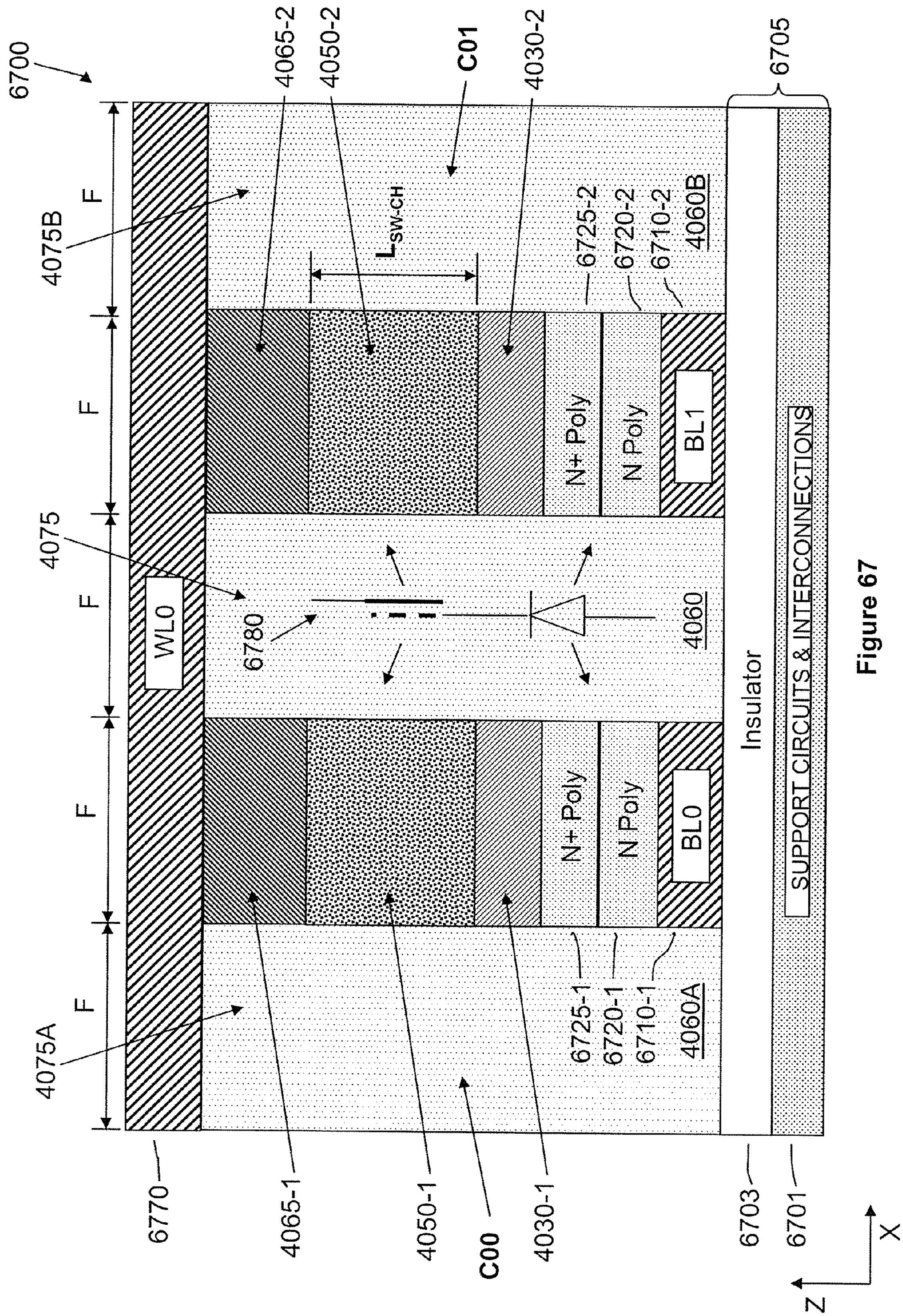
FIG. 67 illustrates a three dimensional cross section along the word line (X-direction) of an embodiment of a dense 3D cell structure formed with cathode-to-NT nonvolatile nanotube diodes, with the diode portion of the structure in series with a nonvolatile nanotube block-based switch including a nonvolatile nanotube block within vertical cell boundaries and filling the region within the cell boundaries.
Figure 68A:
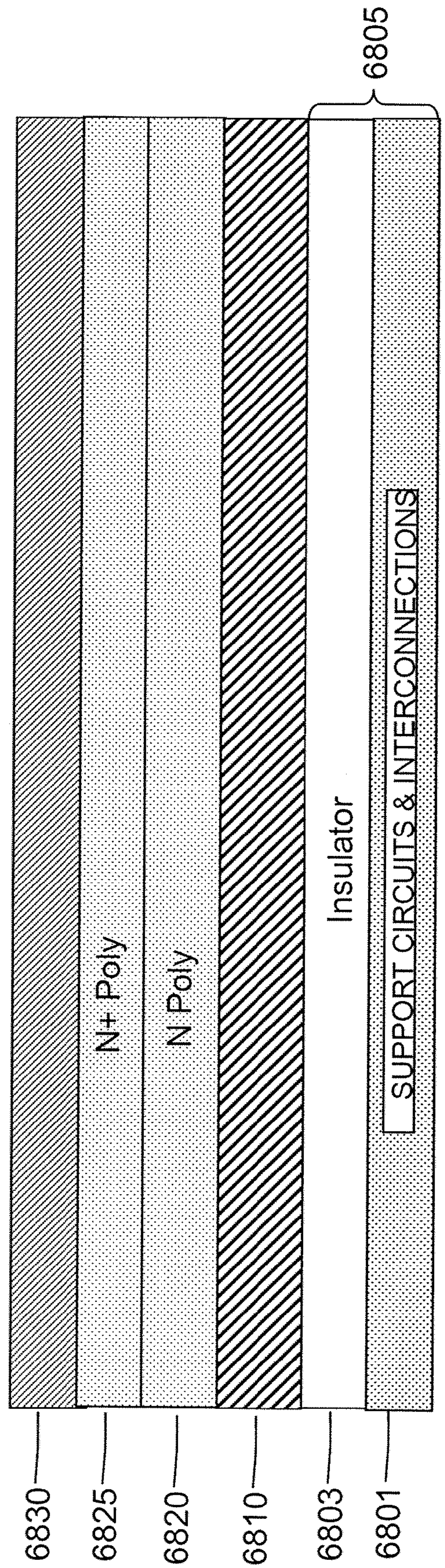
Figure 69:
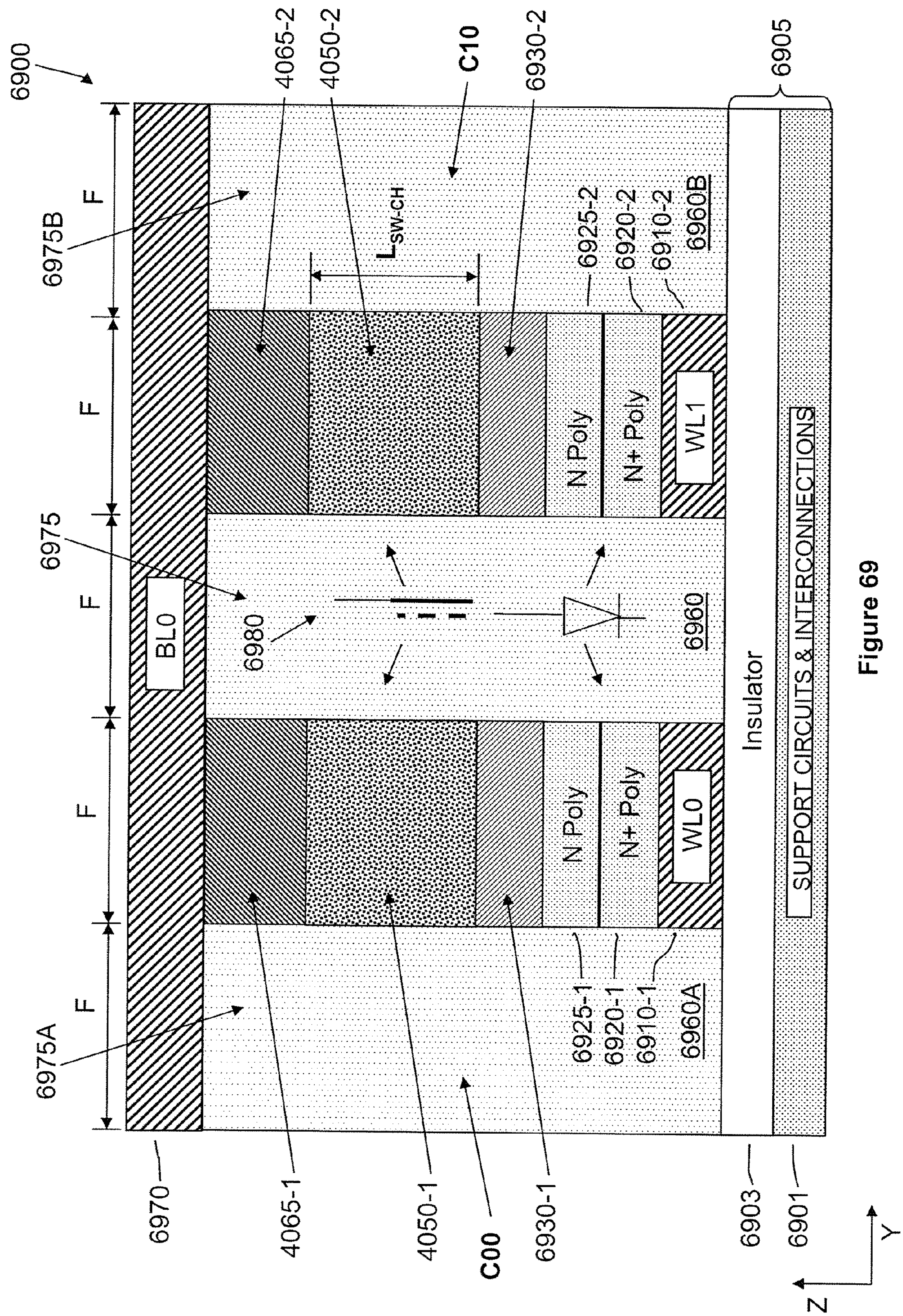
FIG. 69 illustrates a three dimensional cross sectional view along the bit line (Y-direction) of an embodiment of a dense 3-D cell structure formed with anode-to NT nonvolatile nanotube diodes, with the diode portion of the structure in series with a nonvolatile nanotube block-based switch including a nonvolatile nanotube block within vertical cell boundaries and filling the region within the cell boundaries.
Figure 70:
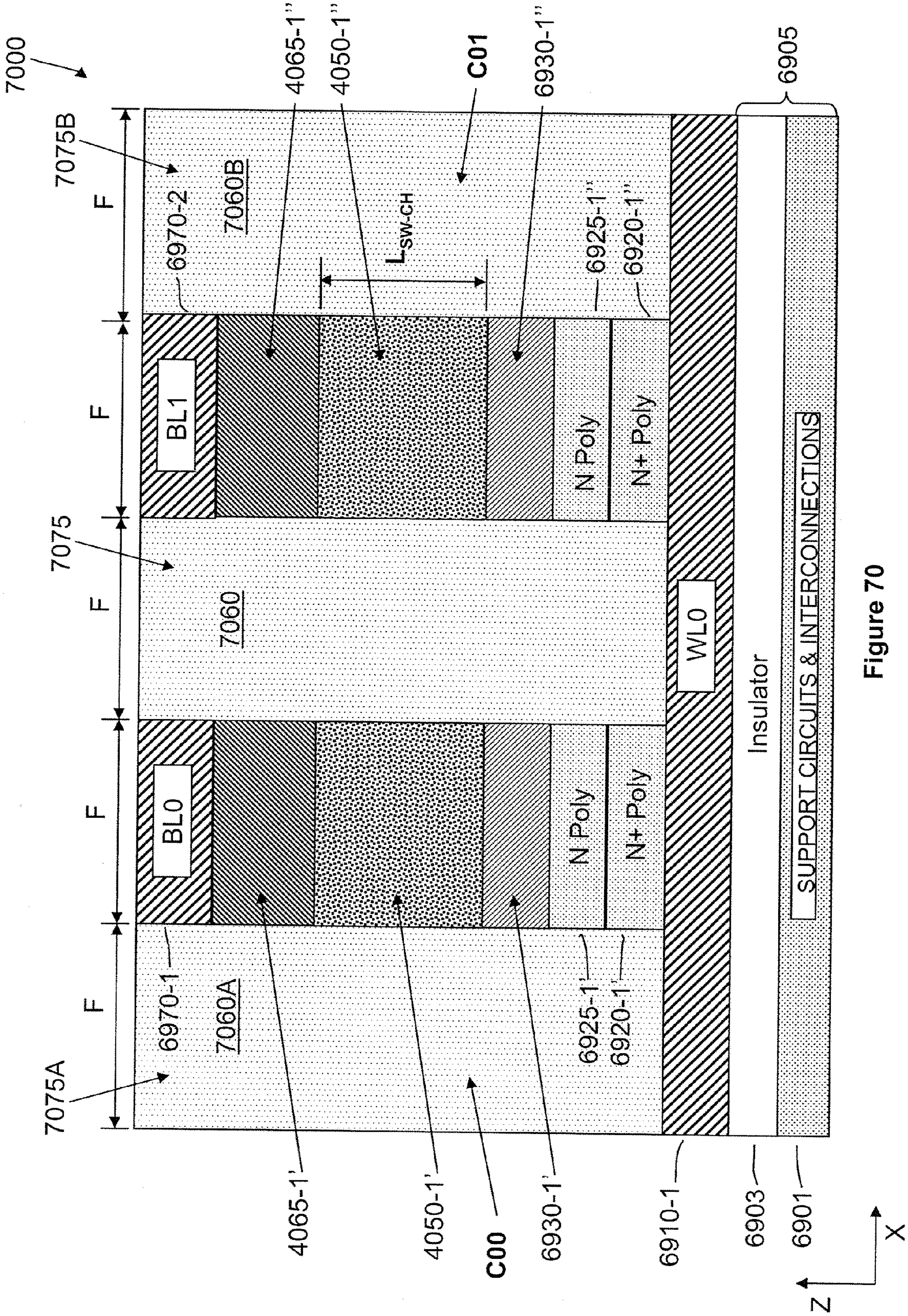
FIG. 70 illustrates a three dimensional cross sectional view along the word line (X-direction) of an embodiment of a dense 3-D cell structure formed with anode-to NT nonvolatile nanotube diodes with the diode portion of the structure in series with a nonvolatile nanotube block-based switch including a nonvolatile nanotube block within vertical cell boundaries and filling the region within the cell boundaries.

FIGS. 67 and 68A-68I illustrate structures and methods of fabricating the memory cell described further above with respect to cross section 4000 illustrated in FIG. 40. FIGS. 67 and 68A-68I are described with respect to cathode-on-NT NV NT diode configurations. FIGS. 69 and 70 illustrate structures of memory cells based on anode-to-NT NV NT diode configurations.

Figure 71:
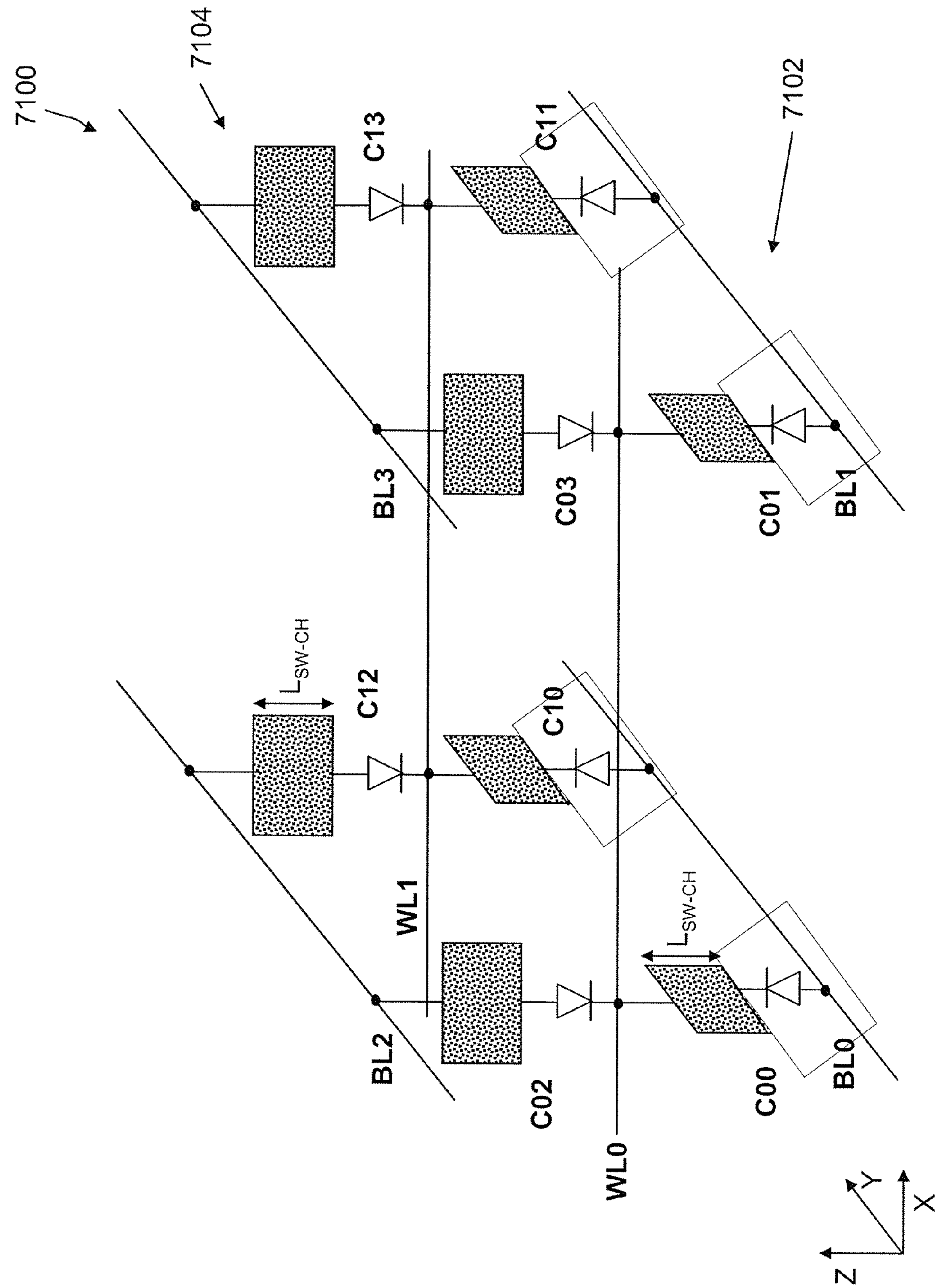
FIG. 71 illustrates a 3D perspective drawing of an embodiment of a two-high stack of three dimensional nonvolatile nanotube block-based switches with top and bottom contacts, and word lines shared between upper and lower arrays.
Figure 72A:
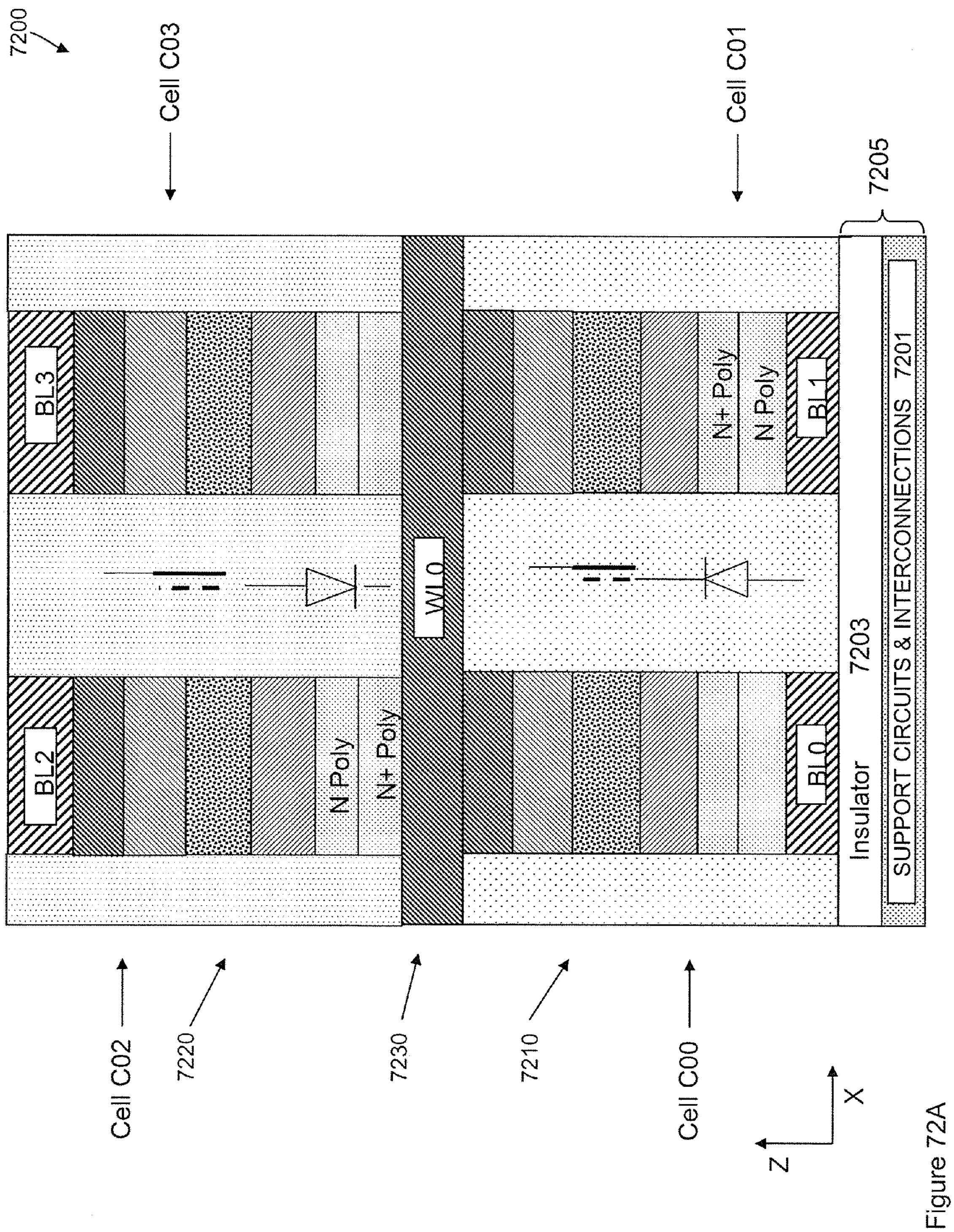
FIG. 72A illustrates a three dimensional cross sectional view along word lines (X-direction) of an embodiment of a two-high stack of three dimensional nonvolatile nanotube block-based switches with top and bottom contacts, and word lines shared between upper and lower arrays.
Figure 72B:
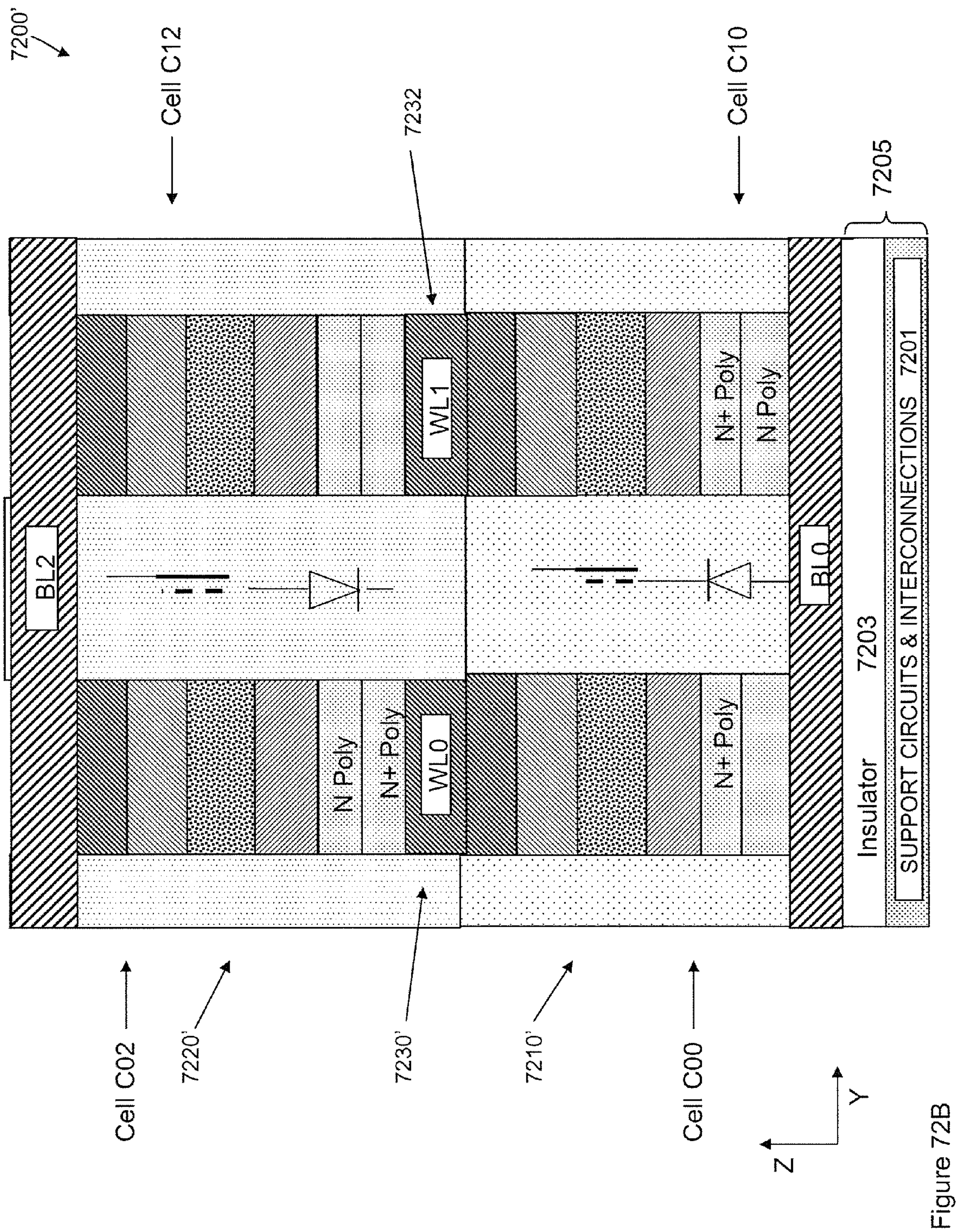
FIG. 72B illustrates a three dimensional cross sectional view along bit lines (Y-direction) of an embodiment of a two-high stack of three dimensional nonvolatile nanotube block-based switches with top and bottom contacts and word lines shared between upper and lower arrays.
Figure 73:
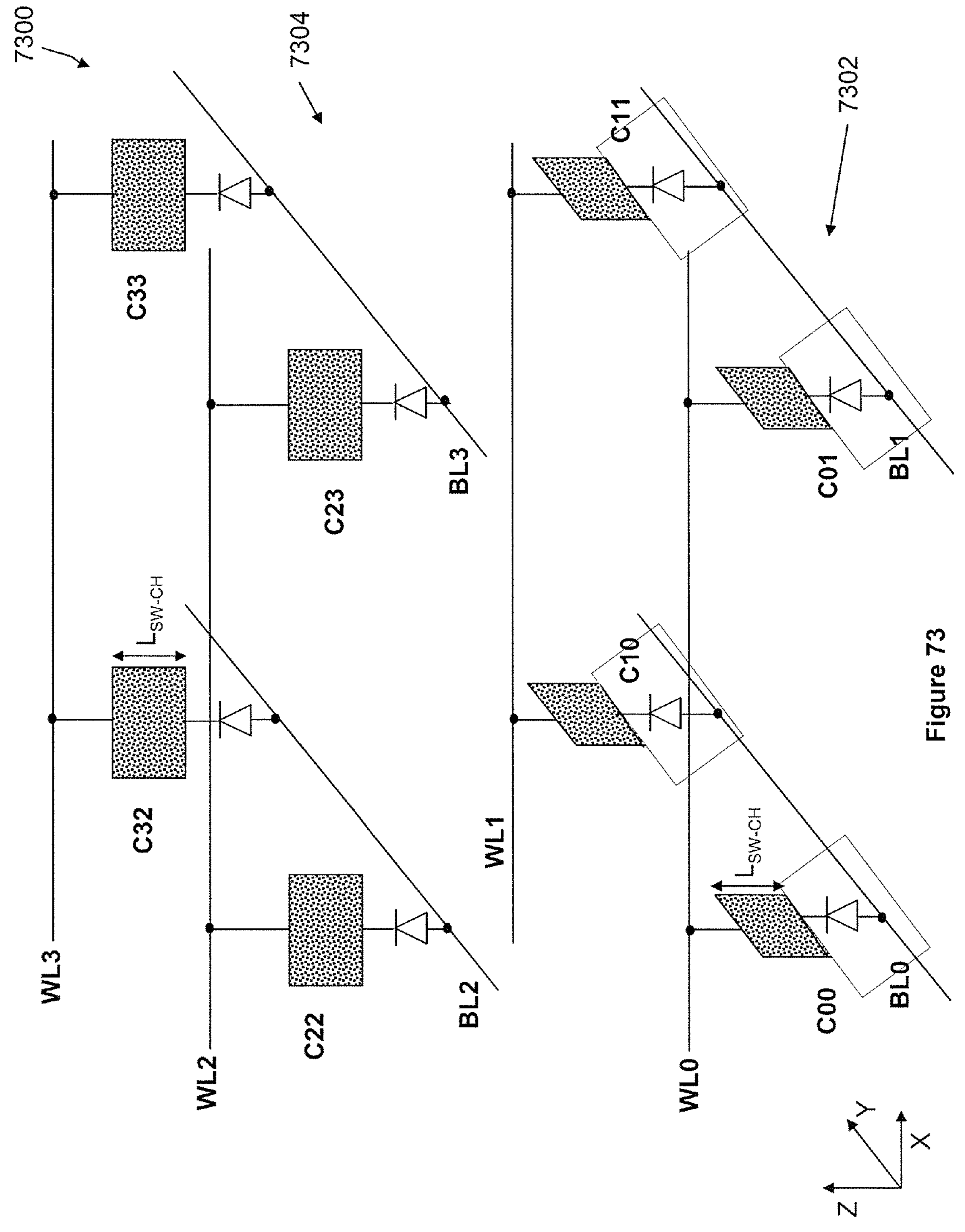
FIG. 73 illustrates a 3D perspective drawing of an embodiment of a two-high stack of three dimensional nonvolatile nanotube block-based switches with top and bottom contacts, with no array lines, such as word lines, shared between upper and lower arrays.
Figure 74:
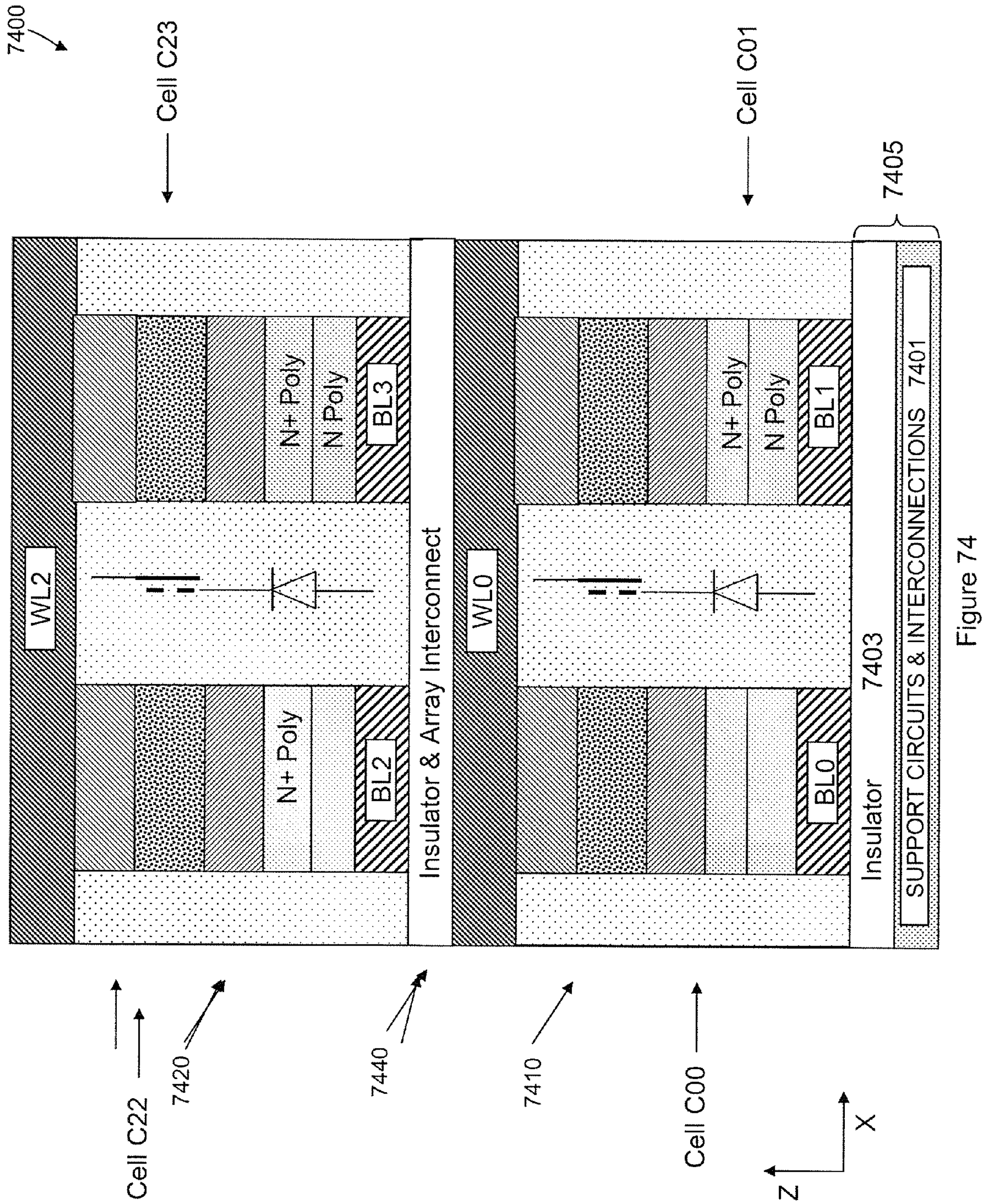
FIG. 74 illustrates a three dimensional cross sectional view along word lines (X-direction) of an embodiment of a two-high stack of three dimensional nonvolatile nanotube block-based switches with top and bottom contacts, and no array lines, such as word lines, shared between upper and lower arrays.

FIGS. 71 and 72A-72B illustrate 2-high stacked arrays of 3-D NV NT diode-based cells that include shared array lines such as shared word lines. FIGS. 73 and 74 illustrate 2-high stacked arrays of 3-D NV NT diode-based cells that do not share array lines such as shared word lines.

FIGS. 75 and 76A-76D illustrate 3-D NV NT diode-based structures and corresponding simplified methods of fabrication. Simplified methods of fabrication enable multi-level arrays of 4, 8, 16 and higher number of levels as illustrated in a perspective drawing illustrated in FIG. 77.

Figures 56A, 56B, 56C, 56D, 56E, 56F:
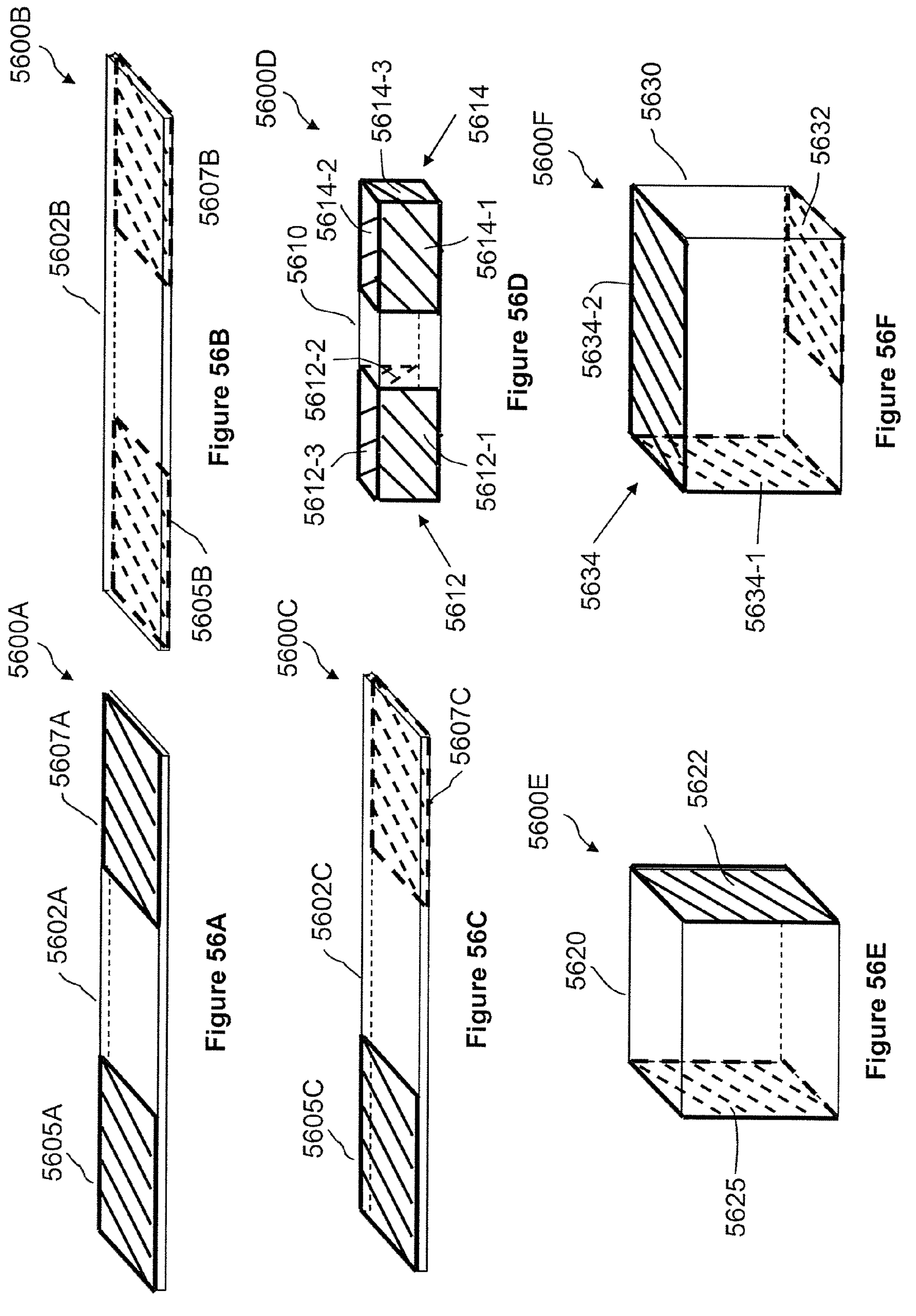
FIGS. 56A-56F illustrate perspective drawings of embodiments of nonvolatile nanotube switches including switch contact locations at opposite ends of the nanotube element, and embodiments of nonvolatile nanotube block-based switches with contacts located at top, bottom, and end locations.

NV NT Switches Fabricated with Nonvolatile Nanotube Blocks, Various Terminal Locations, and Switching Characteristics Thereof NV NT switch 5600A illustrated in 3-D perspective drawing in FIG. 56A shows a NV NT switch with relatively thin (e.g., about 0.5 to less than 10 nm) nonvolatile nanotube element 5602A and top contact locations 5605A and 5607A. Contact locations illustrate where terminals (not shown) contact the surface of nanotube element 5602A. NV NT switch 5600A corresponds to NV NT switch 300 illustrated in FIG. 3, where nanotube element 5602A corresponds to nanotube element 330, contact location 5605A corresponds to the location of terminal 310, and contact location 5607A corresponds to the location of terminal 320.

NV NT switch 5600B illustrated in 3-D perspective drawing in FIG. 56B shows a NV NT switch with thin nonvolatile nanotube element 5602B and bottom contact locations 5605B and 5607B. Contact locations illustrate where terminals (not shown) contact the surface of nanotube element 5602B. NV NT switch 5600B corresponds to NV NT switch 500 illustrated in FIG. 5, where nanotube element 5602B corresponds to nanotube element 530, contact location 5605B corresponds the location of terminal 510, and contact location 5607B corresponds to the location of terminal 520.

NV NT switch 5600C illustrated in 3-D perspective drawing in FIG. 56C shows a NV NT switch with thin nonvolatile nanotube element 5602C and top contact location 5605C and bottom contact location 5607C. Contact locations illustrate where terminals (not shown) contact the surface of nanotube element 5602B. NV NT switch 5600C combines top and bottom contacts to the same nanotube element.

NV NT switch 5600D illustrated in 3-D perspective drawing in FIG. 56D shows a NV NT switch with NV NT block (thick NV NT element) 5610 and contact locations 5612 and 5614. NV NT switch 5600D corresponds to NV NT switch 5800/5800'/5870 having structure and electrical switching results described further below with respect to FIGS. 58A-58D and 59, respectively. In the illustrated embodiment, corresponding switch 5800 is scaled to the technology node used to lithographically define its lateral dimensions. For example, a technology node F=22 nm can provide a switch channel length of approximately 22 nm, and a width of approximately 22 nm for this embodiment. As discussed above, in many embodiments it is desirable to fabricate the switch channel length to be as small as possible, e.g., as small as the technology node allows, although in other embodiments larger channel lengths may be desirable. The thickness of the NV NT block defines the height of the switch 5600D, which in certain embodiments is approximately 10 nm, although other thicknesses are possible as discussed elsewhere. Contact location 5612 in FIG. 56D includes side contact locations 5612-1 and 5612-2, a top contact location 5612-3, and an end contact location (not visible), and corresponds to contacts 5830-1 and 5830-2 in FIGS. 58A-58D. Contact location 5614 includes side contact location 5614-1, a second side contact location (not visible), top contact location 5614-2, and end contact 5614-3, and corresponds to contacts 5840-1 and 5840-2.

NV NT switch 5600E illustrated in 3-D perspective drawing in FIG. 56E shows a NV NT switch with NV NT block 5620 and end-contact locations 5622 and 5625. NV NT block 5620 corresponds to nanotube element 4910, end-contact location 5622 corresponds to end-region contact 4965, and end-contact location 5625 corresponds to end-region contact 4960 illustrated further above with respect to NV NT switch 4900 illustrated in FIG. 49. Switch operation is illustrated in FIG. 50. Also as described further below with respect to NV NT switch 6000/6000'/6050 illustrated in FIGS. 60A-60C, NV NT block 5620 corresponds to nanotube element 6010, end-contact location 5622 corresponds to end-region contact 6040, and end-contact location 5625 corresponds to end-region contact 6030. Electrical switching characteristics are described with respect to FIG. 61.

NV NT switch 5600F illustrated in 3-D perspective drawing in FIG. 56F shows a NV NT switch with NV NT block 5630, bottom contact location 5632, and combined end-contact location 5634 including combined end-contact location 5634-1 and top contact location 5634-2. NV NT switch 5600F corresponds to NV NT switch 6200/6200' described further below with respect to FIGS. 62A-62B. NV NT block 5630 corresponds to NV NT block 6210, bottom contact location 5632 corresponds to bottom contact 6230, and combined end contact location 5634-1 and top contact location 5634-2 correspond to combined end contacts 6240-1 and 6240-2, respectively. Electrical switching characteristics are described with respect to FIG. 63A-63B.

Figures 57A, 57B, 57C:
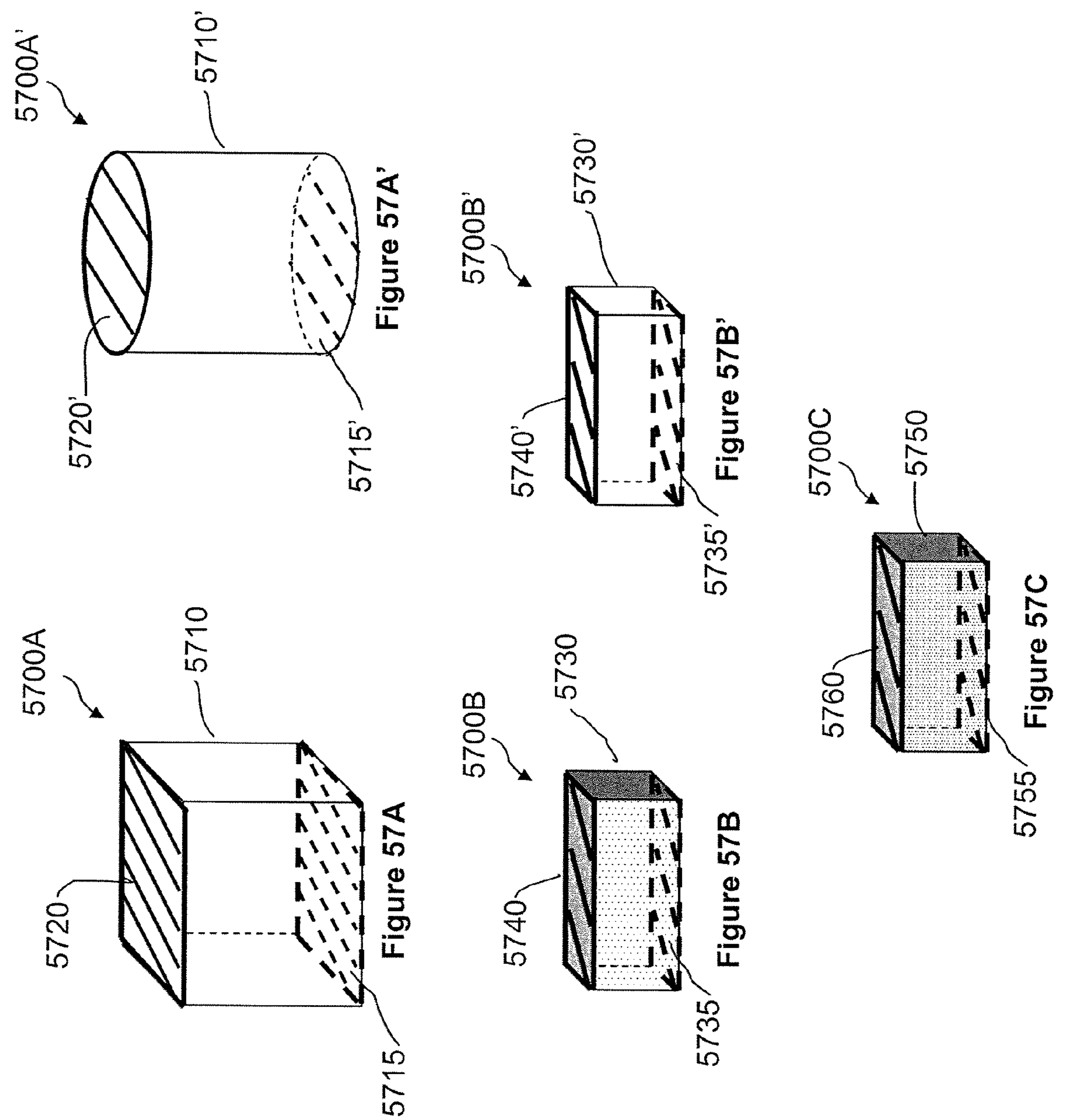
FIGS. 57A-57C illustrate perspective drawings of embodiments of nonvolatile nanotube block-based switches with top and bottom contact locations and various insulator options.

NV NT switch 5700A illustrated in 3-D perspective drawing in FIG. 57A shows a NV NT switch with NV NT block 5710 and bottom contact location 5715 and top contact location 5720. NV NT switch 5700A corresponds to NV NT switch 6400/6400'/6450 having structure and electrical switching results described further below with respect to FIGS. 64A-64C and 65, respectively. NV NT block 5710 corresponds to NV NT block 6410, bottom contact location 5715 corresponds to bottom contact 6427, and top contact location 5720 corresponds to top contact 6437 illustrated in FIG. 64B. Switching results for switch 6400 illustrate no top contact-to-bottom contact shorting though NV NT block at a given thickness, e.g., 35 nm.

NV NT switch 5700A also corresponds to nanotube element 4050 illustrated in FIG. 40 if an F×F masking layer is used in the fabrication. NV NT switch 5700A' illustrated in a 3-D perspective drawing in FIG. 57A' is formed with an approximately round masking layer of diameter F caused by corner-rounding of the drawn image in the masking layer as described further above. NV NT block 5710' is approximately cylindrical in shape with a circular cross section of approximate diameter F, bottom contact location 5715' and top contact location 5720'. The corresponding diode region in cross section 4000 is formed at the same time as nanotube element 4050 and may have a square cross section F×F or a circular cross section of approximately F in diameter. In other words, the 3-D NV NT diode forming the storage cell in cross section 4000 forms a stack with a NV NT block switch on top of a steering (select) diode, with the stack approximately square or approximately circular in cross section shape.

Void regions sufficiently small in size and number as described further above with respect to nanotube layer 3800 illustrated in FIG. 38 can be used in the fabrication of NV NT block 6410 illustrated in FIGS. 64A-64C further below without shorts between bottom contact 5425 and top contact 6435 separated by a given distance, e.g., approximately 35 nm. NV NT block 6410 corresponds to NV NT block 5710 in the 3-D perspective illustration in FIG. 57A.

FIG. 57B illustrated in a 3-D perspective drawing shows NV NT switch 5700B in which block 5730 has smaller separation of bottom contact location 5735 and top contact location 5740 than the corresponding separation between corresponding contact locations illustrated in FIG. 57A. The block volume is also shaded indicating that it is fabricated differently than block 5710. Fabrication differences will be described further below with respect to FIGS. 66A-66C. However, a brief summary of significant differences is given. NV NT blocks described with respect to FIGS. 56A-56F, FIG. 57A and FIG. 57A', and corresponding Figures described further above, can be fabricated using carbon nanotubes deposited from CMOS compatible, trace metal free standard dispersions in aqueous or non-aqueous solvents as described in greater detail in the incorporated patent references. Such nanotube element layers may be deposited using spin-on coating techniques or spray-on coating techniques. Block 5730 illustrated in FIG. 57B may be fabricated with a sacrificial polymer, for example polypropylene carbonate, dissolved in an organic solvent such as NMP or cyclohexanone described further below with respect to FIGS. 66A-66C. Top terminals are formed in contact with top contact region 5740. The presence of the sacrificial polymer in the NV NT block 5730 structure enables top and bottom contacts to be fabricated in relatively close proximity, e.g., less than about 35 nm, for example about 22 nm or less, e.g., about 10 nm (e.g., about 10-22 nm). After patterning and insulation, the sacrificial polymer (polypropylene carbonate, for example), is evaporated, through an insulating layer, or prior to insulating, leaving substantially no residue, at evaporation temperatures in the range of 200 to 400 deg. C. for example. NV NT switch 5700B' illustrated in FIG. 57B' shows block 5730' after sacrificial polymer material removal (e.g., after evaporation), and with bottom contact region 5735' and top contact region 5740'. NV NT block 5730' is similar to NV NT block 5700A, except that top and bottom contact regions may be more closely spaced.

FIG. 57C illustrated in a 3-D perspective drawing shows NV NT switch 5700C in which NV NT block 5750 includes a shaded region indicating that NV NT block 5750 includes additional material between individual nanotubes as described further below with respect to FIGS. 66A-66C. Bottom contact region 5755 formed prior to NV NT block 5750 deposition, and top contact region 5760 is formed after NV NT block 5750 deposition. This additional material may enhance performance characteristics of NV NT block 5750. Such additional material may be a polymer such as polypropylene carbonate that is not evaporated and remains as part NV NT block 5750 structure. Alternatively, polypropylene carbonate may have been evaporated as illustrated in FIG. 57B' and the NV NT block 5730' then filled with a porous dielectric material prior to top contact formation to enhance the switching properties of NV NT switch 5700C.

Figure 58A:
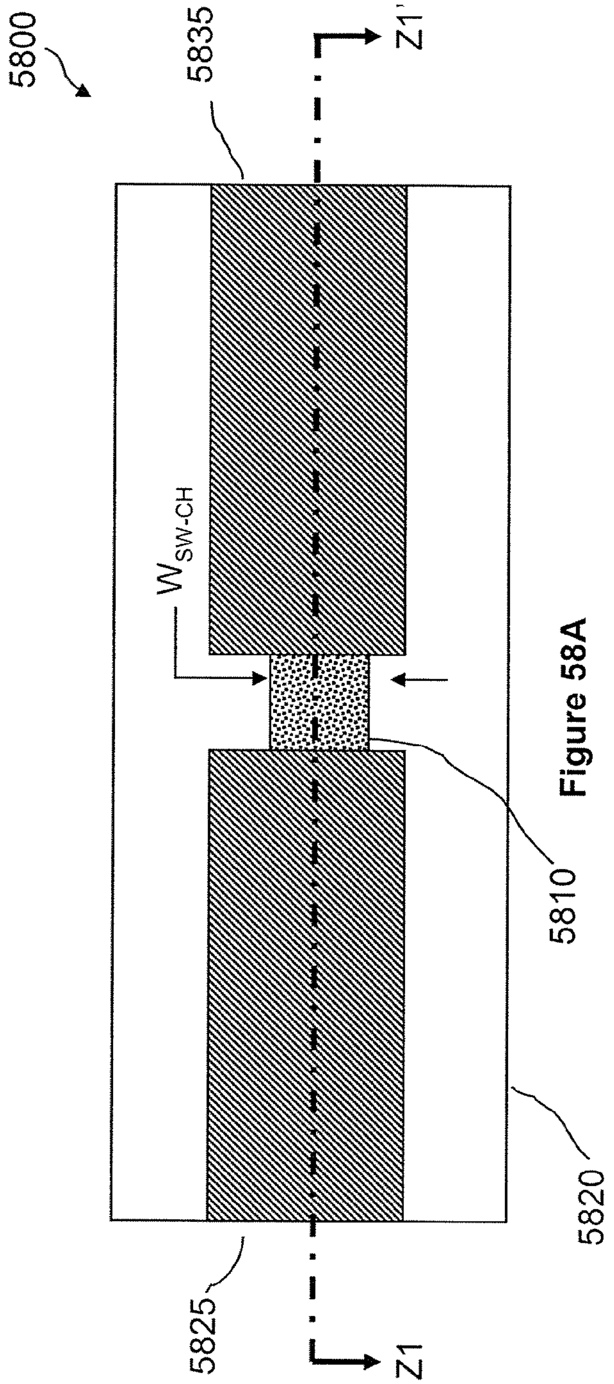
FIGS. 58A-58D illustrate a cross section drawing and an SEM view of an embodiment of a nonvolatile nanotube block-based switch with top, side, and end contacts.
Figure 58B:
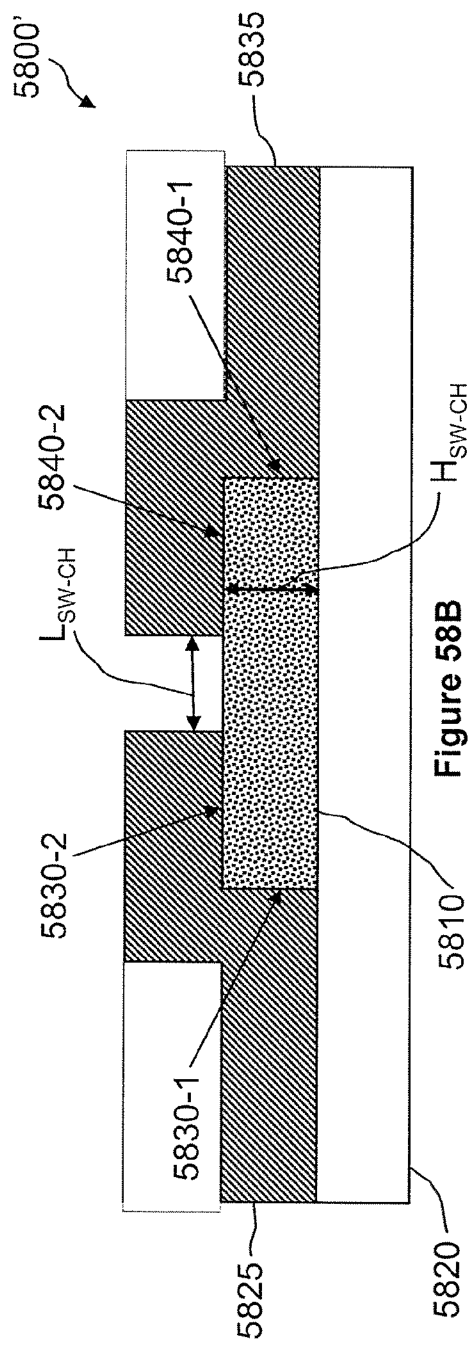

NV NT Switches Fabricated with Nonvolatile Nanotube Block Dimensions Scaled to the Technology Node FIG. 58A illustrates a top view of NV NT Switch 5800 and FIG. 58B illustrates cross section 5800' corresponding to cross section Z1-Z1' shown in FIG. 58A. In certain embodiments, nonvolatile nanotube block 5810 on substrate 5820 has an overall length of approximately 800 nm, a width of approximately 24 nm, and a thickness of approximately 10 nm. As discussed above, cross section dimensions are typically determined by the technology node, however, thickness dimensions orthogonal to the cross section may not correspond to the technology node. Terminal 5825 contacts NV NT block 5810 at end-contact (end-region contact) 5830-1 and top contact 5830-2. Side contacts (not shown) are also used as illustrated in a corresponding 3-D illustration in FIG. 56D. Terminal 5835 contacts NV NT block 5810 at end-contact 5840-1 and top contact 5840-2. Side contacts (not shown) are also used as illustrated in a corresponding 3-D illustration in FIG. 56D. NV NT switch 5800/5800' channel length $L_{SW-CH}$ is determined by the separation of terminals 5825 and 5835, which is approximately 22 nm for example. Switch channel width $W_{SW-CH}$ is approximately 24 nm for example, and is determined by etching. Film thickness $H_{SW-CH}$ is approximately 10 nm as deposited, for example. The electrical performance of block 5810 is determined in part by a NV NT network contained in a volume of approximately 22 nm ($L_{SW-CH}$)×24 nm ($W_{SW-CH}$)×10 nm ($H_{SW-CH}$), in some embodiments, and corresponds to a NV NT switch formed with a NV NT block scaled to a technology node F of 22 nm. In this example, terminals 5825 and 5835 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Substrate 5820 may be an insulator such as ceramic or glass, a semiconductor with an insulated surface, a metal with an insulated surface, or an organic rigid or flexible substrate.

Figure 58D:
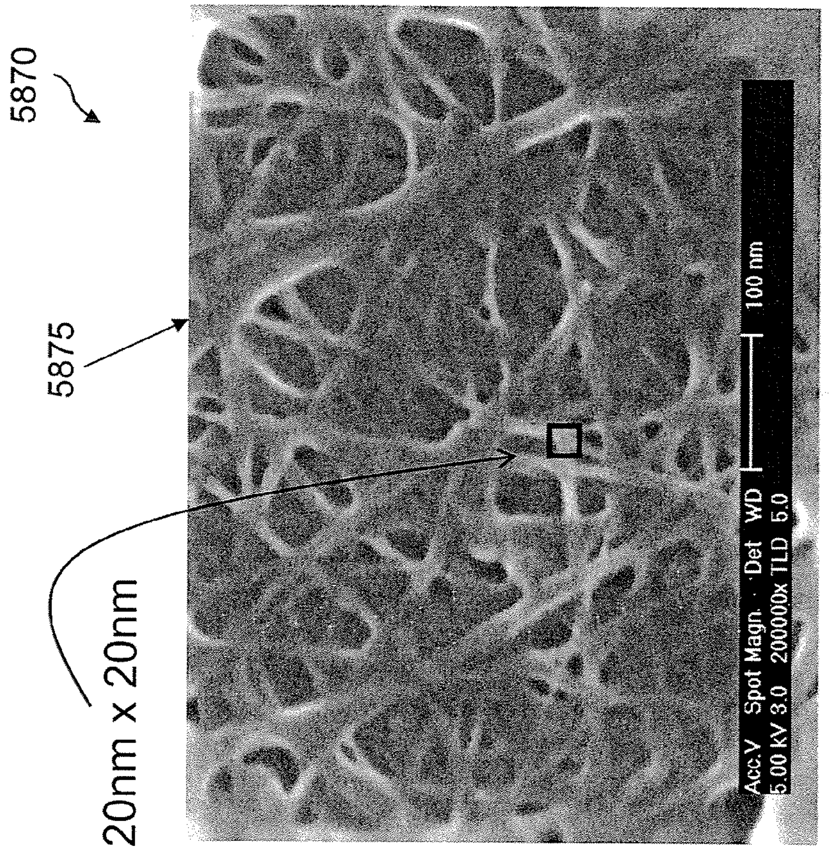
Figure 58C:
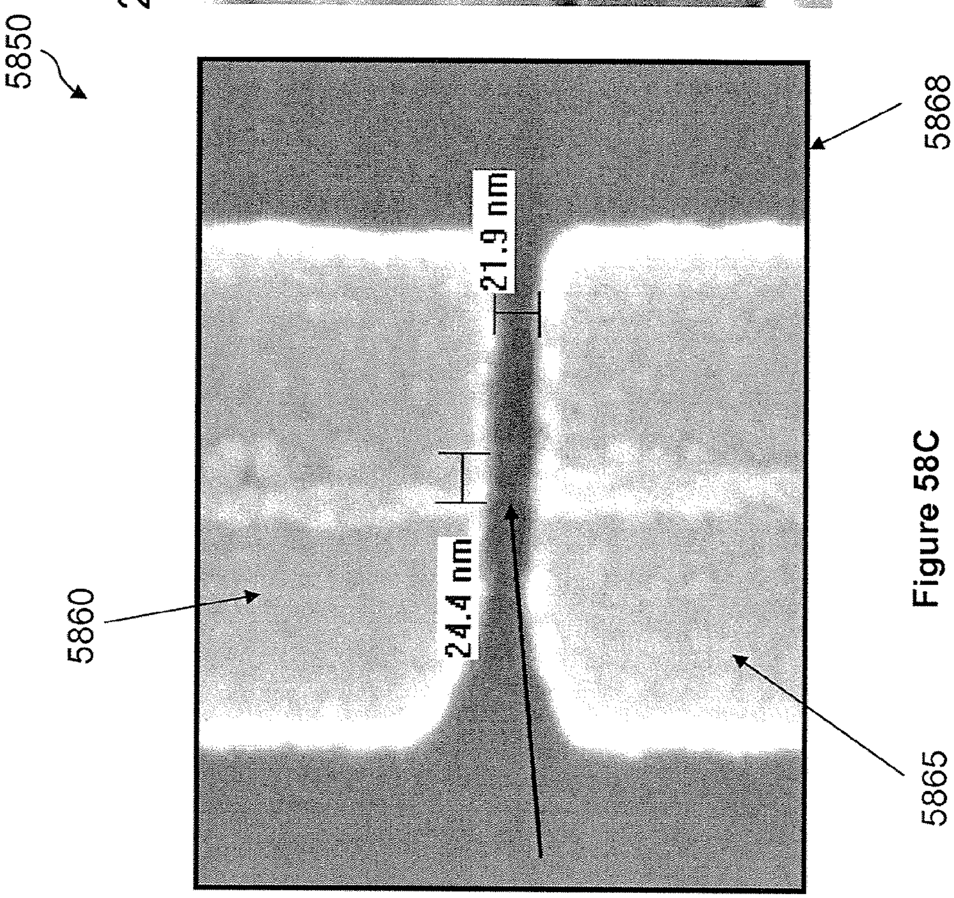

FIG. 58C illustrates a SEM image of an exemplary nonvolatile nanotube switch 5850 prior to passivation and corresponds to nonvolatile nanotube switches 5800/5800' illustrated in FIGS. 58A and 58B. Nonvolatile nanotube switch 5850 includes NV NT block 5855 corresponding to NV NT block 5810, terminal 5860 corresponding to terminal 5825, terminal 5865 corresponding to terminal 5835, and substrate

5868 corresponding to substrate 5820. Nonvolatile nanotube switch 5850 has been fabricated with terminal-to-terminal channel length $L_{SW-CH}$ of 21.9 nm, channel width $W_{SW-CH}$ of 24.4 nm as illustrated in FIG. 58C, and thickness of approximately 10 nm (not shown in FIG. 58C). FIG. 58D illustrates an SEM image of nanotube layer 5875 used to form NV NT block 5855. Nanotube layer 5875 was deposited using 18 spin-on depositions of nanotubes in an aqueous solvent and had a four point probe resistance measured value of 150 ohms. The SEM of nanotube layer 5875 cannot resolve individual nanotubes, which typically have diameters in the range of about 0.5 nm to about 10 nm depending on nanotube type such as SWNTs, DWNTs, and MWNTs, or a mix thereof. Nanotubes in the SEM image appear much larger than their actual diameters. Nanotube layer 5875 was formed using both semiconducting and metallic-type nanotubes.

Figure 59:
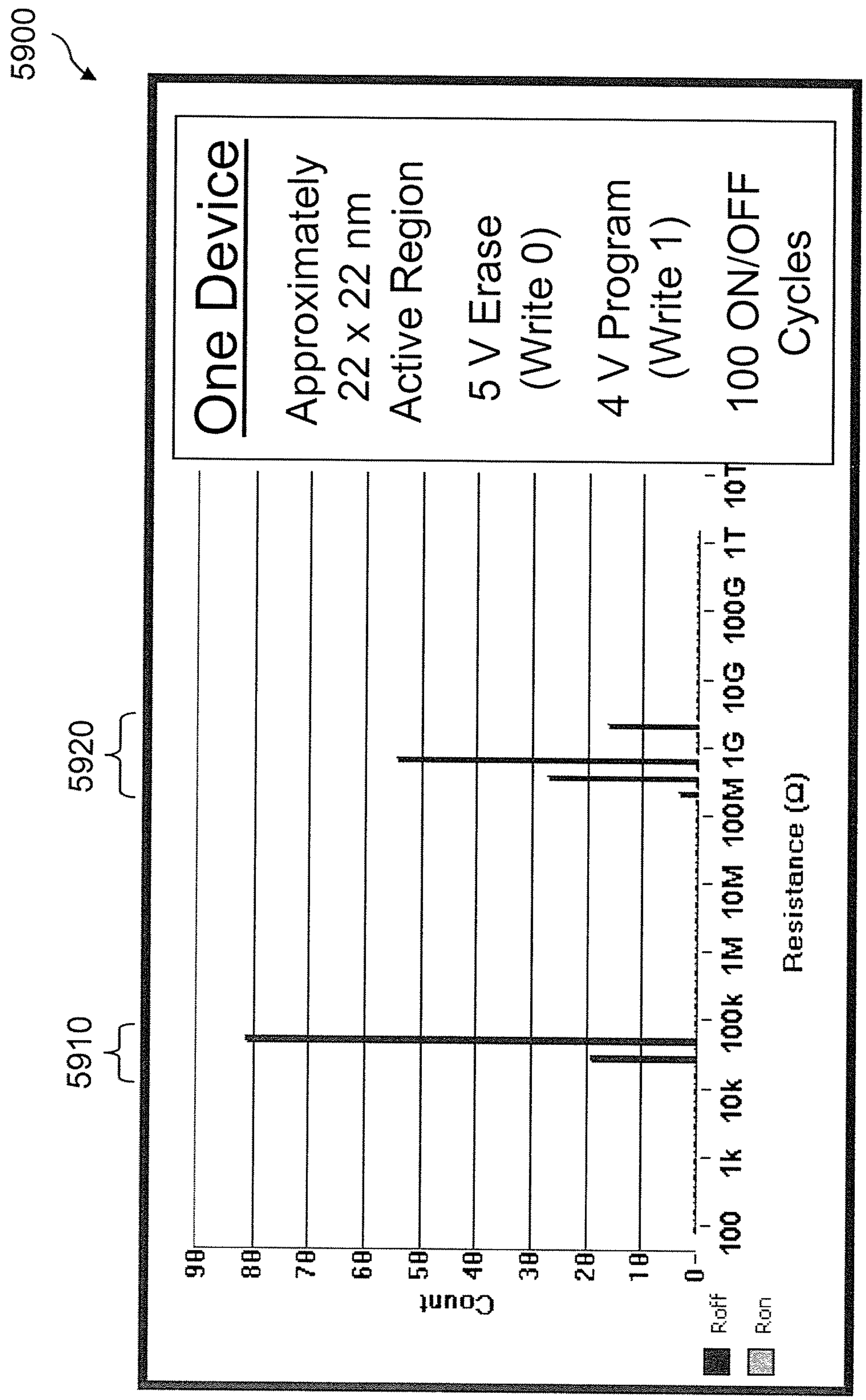
FIG. 59 illustrates electrical ON/OFF switching characteristics for the nonvolatile nanotube block-based switch embodiment illustrated in FIGS. 58A-58D.

Laboratory testing results of nonvolatile nanotube switch 5850 is illustrated by graph 5900 illustrated in FIG. 59. Nonvolatile nanotube switch 5850 switching results for 100 ON/OFF cycles shows that most ON resistance values 5910 are in a range of 50 kOhms to 75 kOhms, and OFF resistance values 5920 are greater than 500 MOhms. Laboratory testing was similar to testing described further above with respect to FIGS. 11A-11B.

NV NT Switches Fabricated with Nonvolatile Nanotube Blocks with End Contacts

Figure 60A:
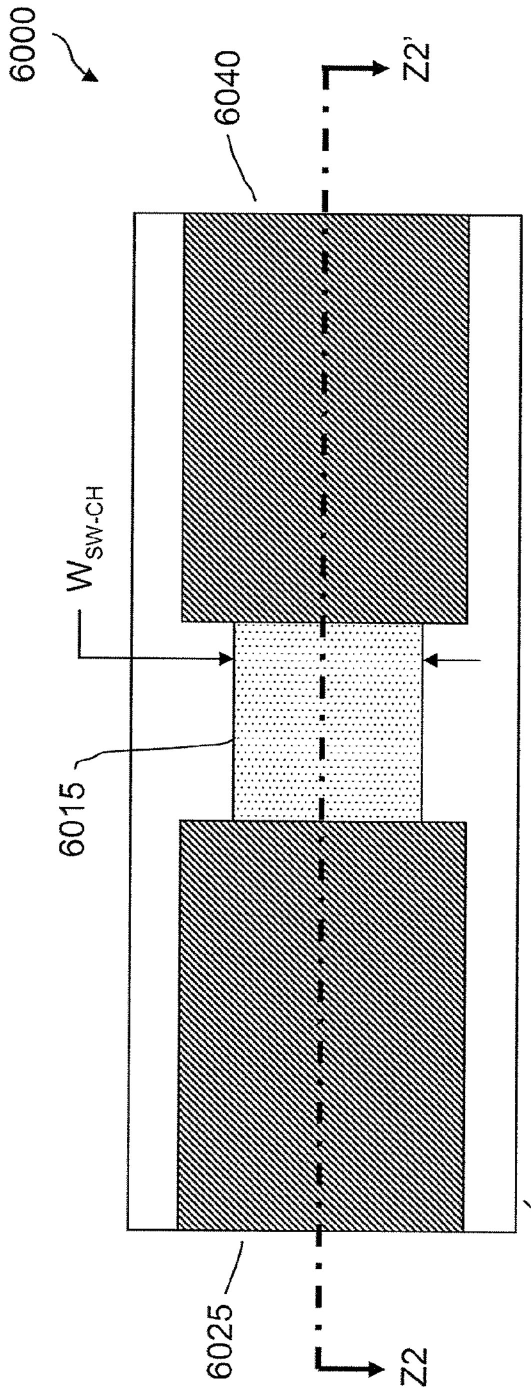
FIGS. 60A-60C illustrate a cross sectional drawing and an SEM image of an embodiment of a nonvolatile nanotube block-based switch with end-only contacts.
Figure 60B:
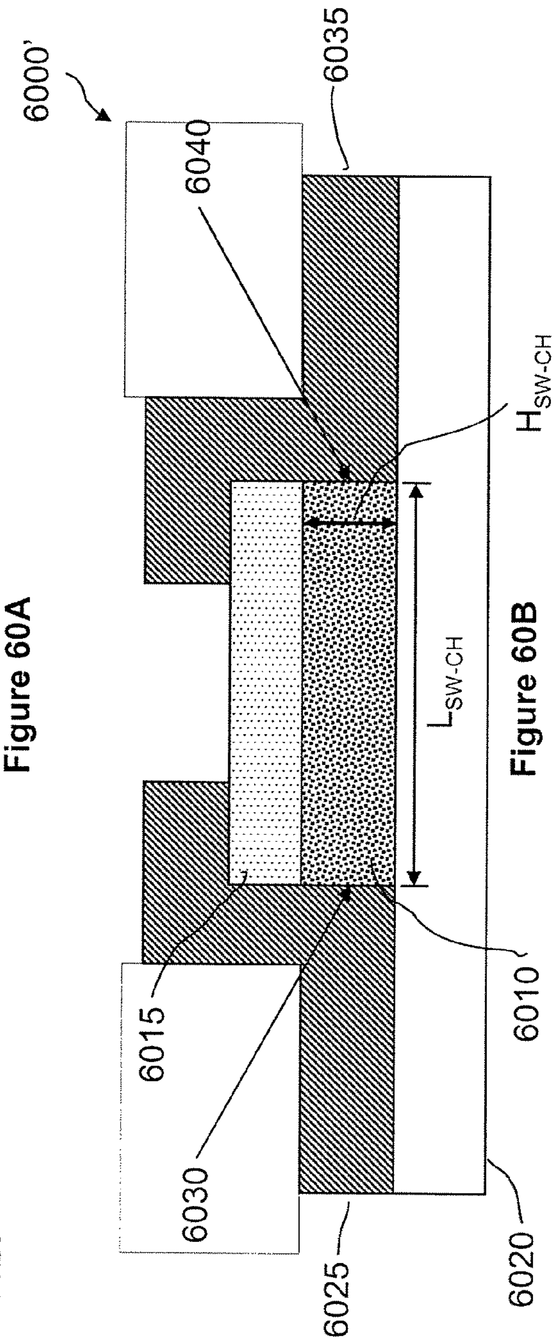

FIG. 60A illustrates a top view of NV NT Switch 6000 and FIG. 60B illustrates cross section 6000' corresponding to cross section Z2-Z2' shown in FIG. 60A that includes NV NT block 6010 with only end contacts. Nonvolatile nanotube block 6010 on substrate 6020 also includes a protective insulator 6015. In an illustrative embodiment, protective insulator 6015 is an $SiO_2$ oxide of thickness 100 nm and 250 nm by 250 nm in size, although in general other dimensions and insulating materials may be used. Protective insulator 6015 can be used as a masking layer to pattern NV NT block 6010 to desired dimensions, e.g., 250×250 nm lateral dimension in the illustrated embodiment. NV NT 6010 has a given thickness, e.g., approximately 50 nm. Terminal 6025 contacts NV NT block 6010 at end-contact (end-region contact) 6030. Terminal 6035 contacts NV NT block 6010 at end-contact 6040. In the embodiments illustrated in FIGS. 60A and 60B, NV NT switch channel length $L_{SW-CH}$ and $W_{SW-CH}$ are directly related to the lateral dimensions of NV NT block 6010, e.g., both are approximately 250 nm using the example block dimensions provided above. Terminals 6025 and 6035 overlap protective insulator 6015 as fabricated, however, the overlap region has substantially no effect on electrical operation. NV NT switch 5600E is a 3-D representation in FIG. 56E corresponding to NV NT switch 6000/6000' in FIGS. 60A and 60B, with NV NT switch 5620 corresponding to NV NT block 6010. The electrical performance of block 6010 is determined by a NV NT network contained in the volume of the block, e.g., approximately 250 nm ($L_{SW-CH}$)×250 nm ($W_{SW-CH}$)×50 nm ($H_{SW-CH}$), using the example dimensions provided above. In this example, terminals 6025 and 6035 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Substrate 6020 may be an insulator such as ceramic or glass, a semiconductor with an insulated surface, a metal with an insulated surface, or an organic rigid or flexible substrate.

Figure 60C:
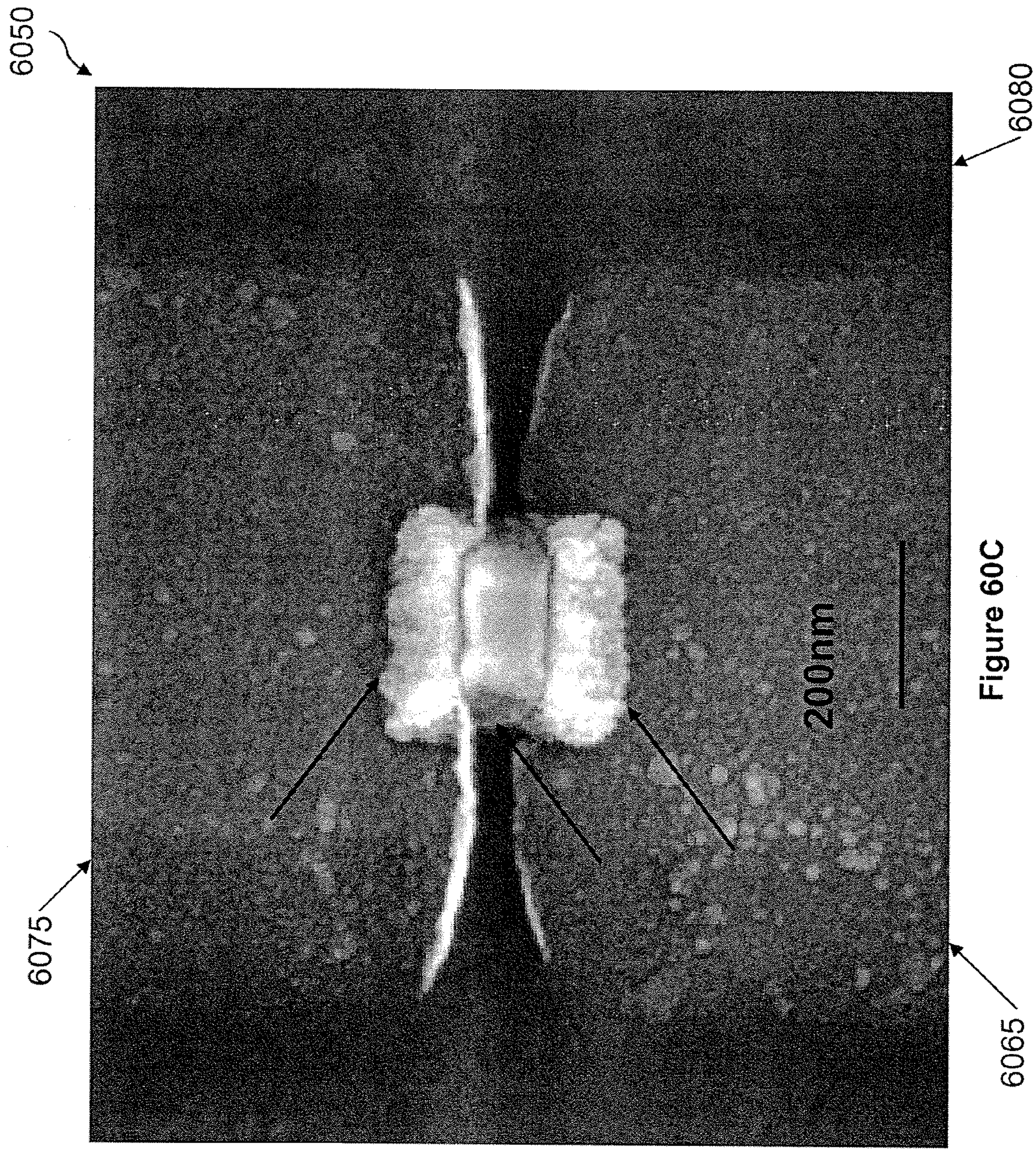

FIG. 60C illustrates a SEM image of nonvolatile nanotube switch 6050 prior to passivation and corresponds to nonvolatile nanotube switch 6000/6000' illustrated in FIGS. 60A and 60B. Nonvolatile nanotube switch 6050 includes NV NT block 6010 (not visible in this top view), exposed portion of protective insulator 6055 corresponding to protective insulator 6015, terminal 6065 and overhang region 6060 corresponding to terminal 6025, terminal 6075 and overhang region 6070 corresponding to terminal 6035, and substrate 6080 corresponding to substrate 6020. Nonvolatile nanotube switch 6050 has been fabricated with terminal-to-terminal channel length $L_{SW-CH}$ of approximately 250 nm, channel width $W_{SW-CH}$ of approximately 250 nm, and a thickness of approximately 50 nm (not shown in FIG. 60C).

NV NT switch 6000/6000' corresponds to NV NT switch 4900 described further above with respect to FIG. 49 but providing more details on the NV NT switch structure, including an SEM image. NV NT block 6010 corresponds to nanotube element 4910, protective insulator 6015 corresponds to protective insulator 4935, terminals 6025 and 6035 correspond to terminals 4940 and 4950, respectively, except that terminals 6025 and 6035 also include regions that overlap protective insulator 6015. End contacts (end-region contacts) 6030 and 6040 correspond to end-region contacts 4960 and 4965, respectively, and substrate 6020 corresponds to a combination of insulator 4920 and substrate 4930.

Figure 61:
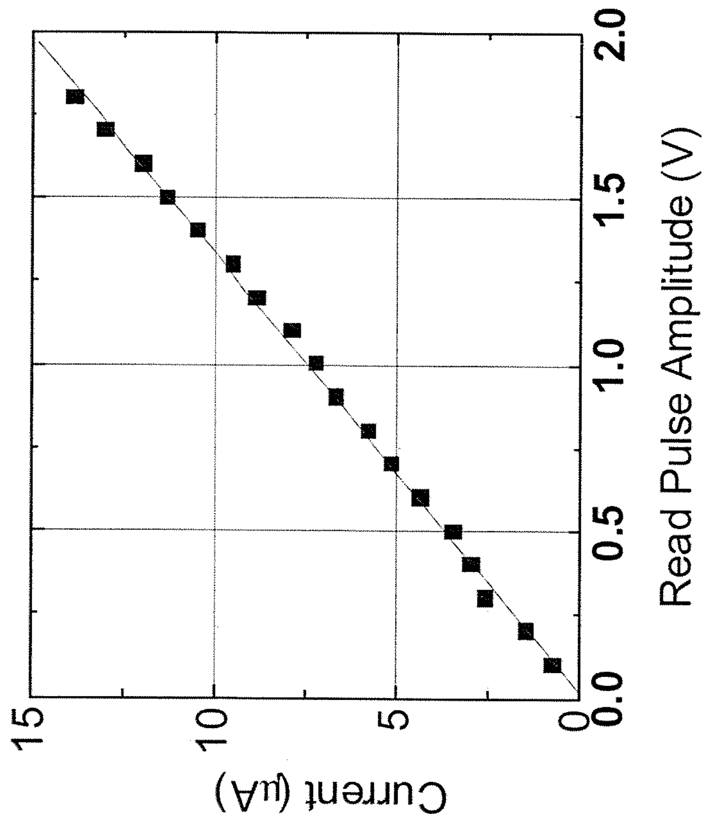
FIG. 61 illustrates the near-ohmic electrical resistance of the nonvolatile nanotube block-based switch embodiment illustrated in FIGS. 60A-60C in the ON state.

Laboratory ON/OFF switching test results of nanotube switch 6050 with only end-region contacts corresponds to the electrical characteristics of NV NT switch 4900 described further above with respect to graph 5000 illustrated in FIG. 50. Nonvolatile nanotube switch 4900 switching results for 100 ON/OFF cycles shows that most ON resistance values are in range of 10 kOhms to 100 kOhms with a few ON resistance values of 800 kOhms as illustrated by resistance values 5010, and OFF resistance values are in the range of 500 MOhms to 100 GOhms as illustrated by resistance values 5020. In a few cases 5030, ON resistance values were greater that 100 MOhms. I-V characteristics of NV NT switch 6050 in the ON state are illustrated by graph 6100 in FIG. 61 showing a near-ohmic ON resistance behavior.

Figure 62A:
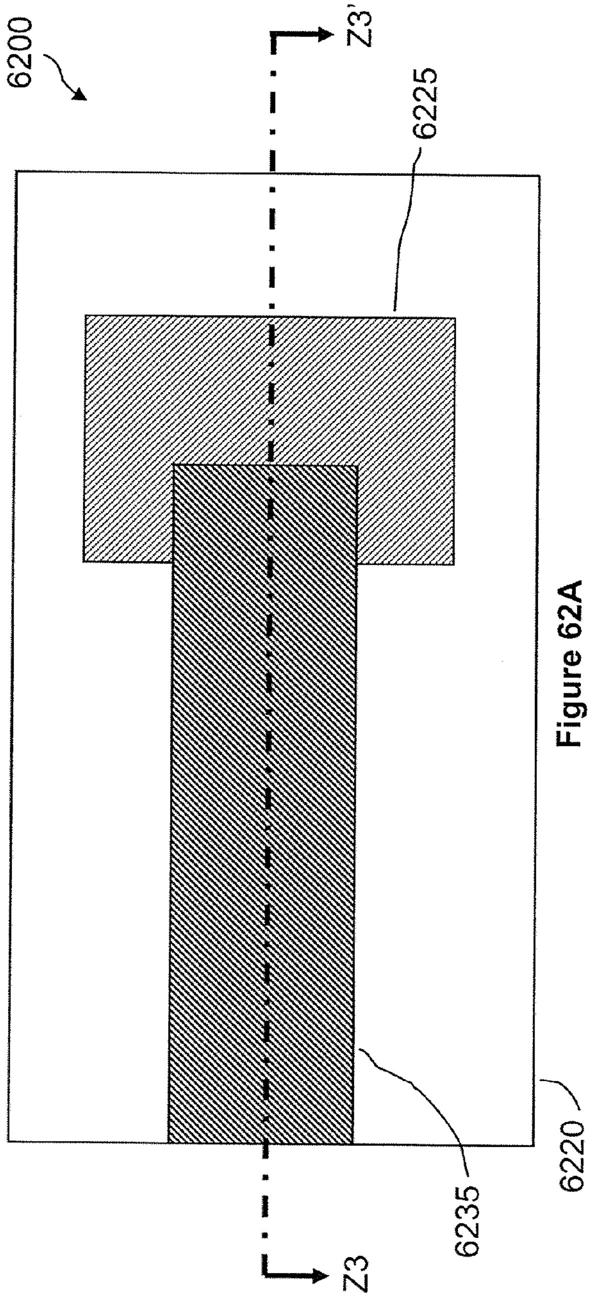
FIGS. 62A-62B illustrate a cross sectional drawing of an embodiment of a nonvolatile nanotube block-based switch with a bottom contact and a combined top and end contact.
Figure 62B:
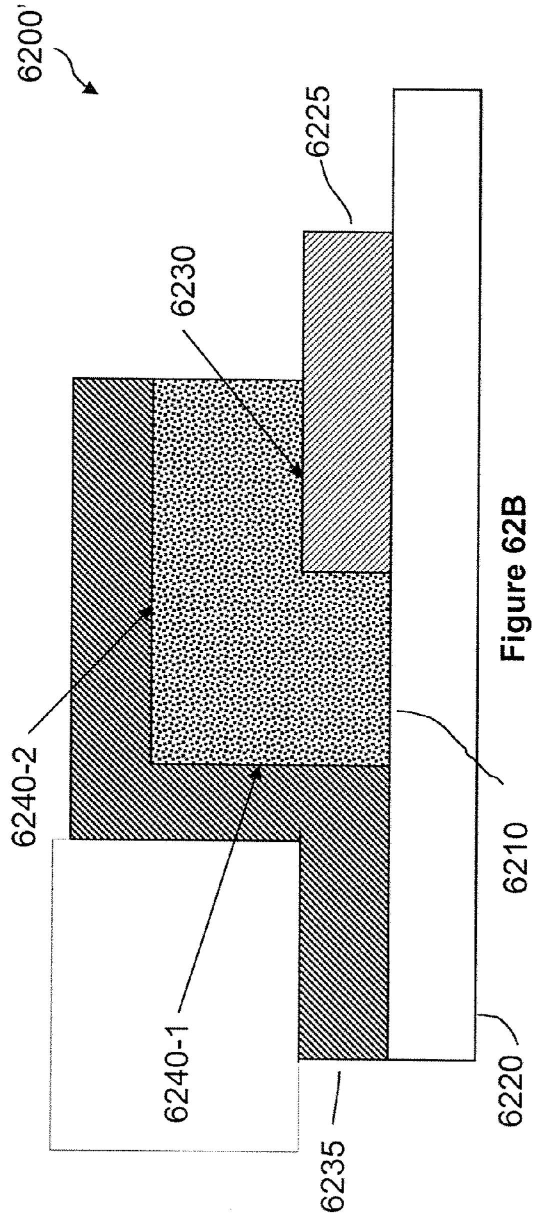

NV NT Switches Fabricated with Nonvolatile Nanotube Blocks with Bottom and End/Top Contacts FIG. 62A illustrates a top view of NV NT Switch 6200 and FIG. 62B illustrates cross section 6200' corresponding to cross section Z3-Z3' shown in FIG. 62A. In one embodiment, nonvolatile nanotube block 6210 on substrate 6220 has dimensions of approximately 100×80 nm in cross section and 50 nm high, although other dimensions are possible. Bottom terminal 6225 forms bottom contact 6230 and terminal 6235 forms combined end contact 6240-1 and top contact 6240-2. Bottom contact 6230 and top contact 6240-2 overlap by approximately 150 nm. NV NT switch 6200 channel length $L_{SW-CH}$ is not well defined in this configuration because of the placement of terminals 6225 and 6235 contacts to NV NT block 6210. Switch 6200 is illustrated in a corresponding 3-D perspective drawing in FIG. 56F, where NV NT block 5630 corresponds to NV NT block 6210, bottom contact location 5632 corresponds to bottom contact 6225, end contact location 5634-1 corresponds to end contact 6240-1, and top contact location 5634-2 corresponds to top contact 6240-2. In this example, terminals 6225 and 6235 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Substrate 6220 may be an insulator such as ceramic or glass, a semiconductor with an insulated surface, a metal with an insulated surface, or an organic rigid or flexible substrate.

Figure 63A:
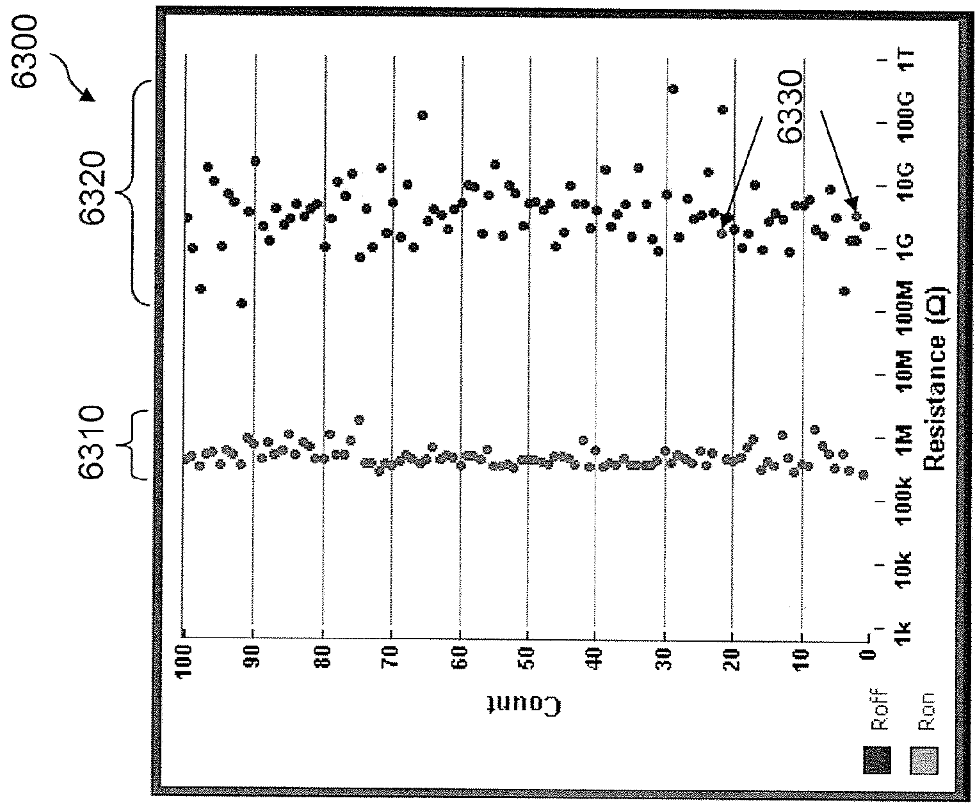
FIGS. 63A-63B illustrate electrical ON/OFF switching characteristics of the nonvolatile nanotube block-based switch embodiment illustrated in FIGS. 62A-62B.
Figure 63B:
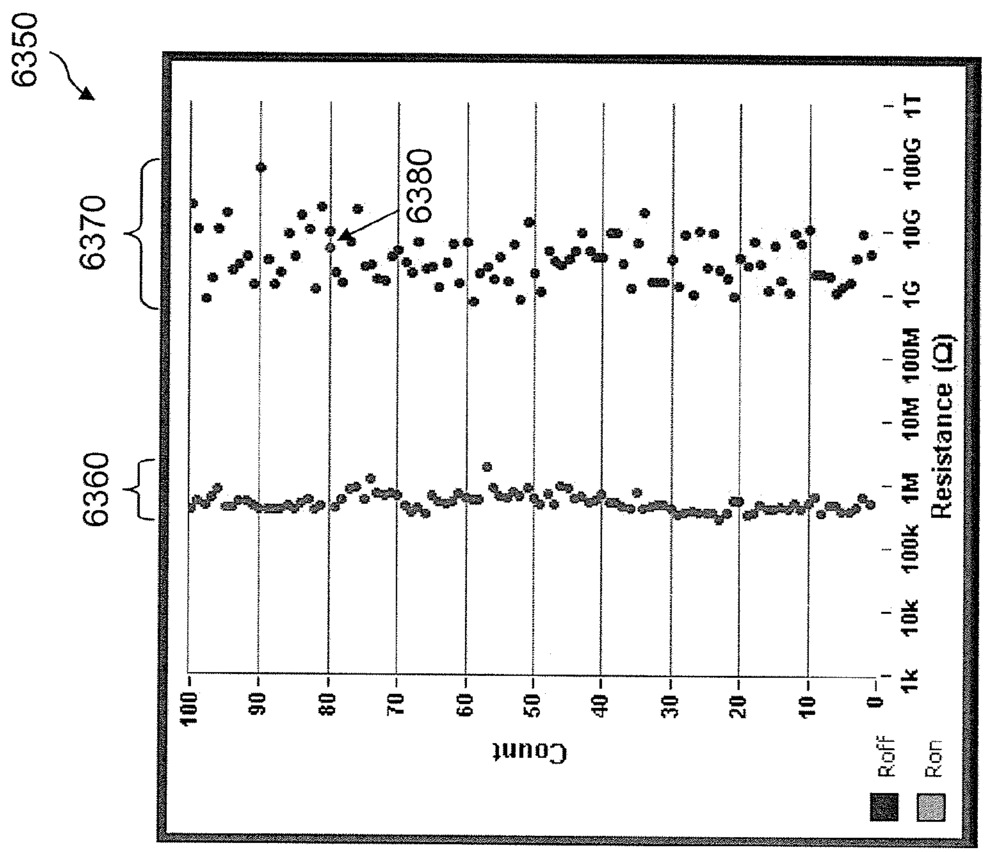

Laboratory ON/OFF switching test results of nanotube switch 6200/6200' are described with respect to graph 6300 illustrated in FIG. 63A and graph 6350 illustrated in FIG. 63B. Test conditions are similar to those described further above with respect to FIGS. 11A-11B; write 0 corresponds to erase, and write 1 corresponds to program. Graph 6300 tests apply one write 0 voltage pulse of 6 volts, one write 1 voltage pulse of 6 V, and measure ON resistance at each ON/OFF cycle for 100 cycles. ON resistance values 6310 are in the 120 kOhm to 1 MOhm range and OFF resistance values 6320 are above 100 MOhms. In two cases, ON resistance values 6330 exceeded 1 GOhm indicating failure to switch to the ON state. Graph 6350 tests apply one write 0 voltage pulse of 6 volts, five write 1 voltage pulses of 6 V, and measure ON resistance at each ON/OFF cycle for 100 cycles. ON resistance values 6360 are in the 130 kOhm to 1 MOhm range and OFF resistance values 6370 are above 800 MOhms. In one case, ON resistance values 6380 exceeded 1 GOhm indicating failure to switch to the ON state.

Figure 64A:
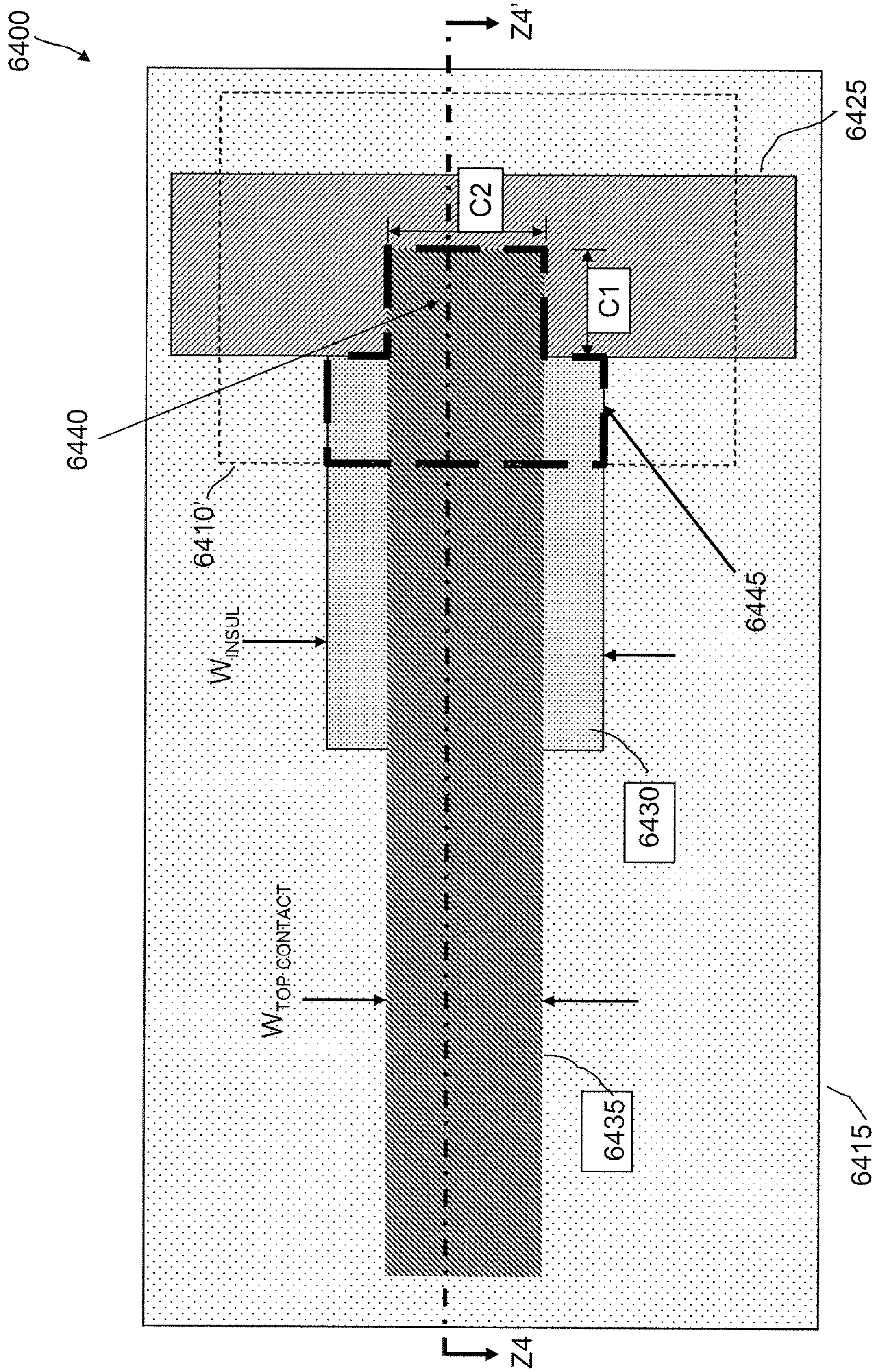
FIGS. 64A-64C illustrate a plan view drawing, a cross sectional drawing, and an SEM image of an embodiment of a nonvolatile nanotube block-based switch with top and bottom contacts.
Figure 64B:
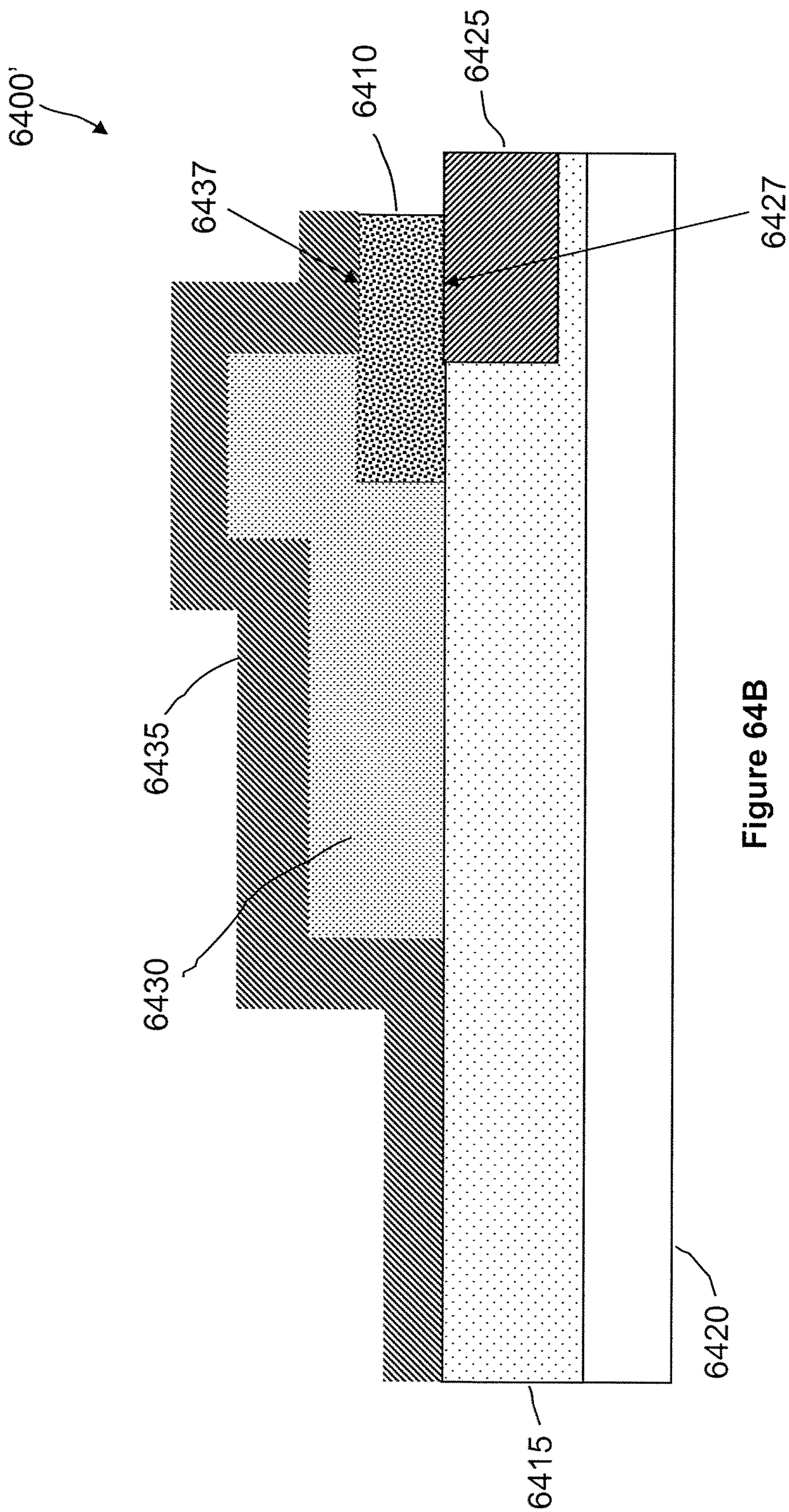

NV NT Switches Fabricated with Nonvolatile Nanotube Blocks with Top and Bottom Contacts FIG. 64A illustrates a top view of NV NT Switch 6400 and FIG. 64B illustrates cross section 6400' corresponding to cross section Z4-Z4' shown in FIG. 64A of a NV NT block 6410 with top and bottom contacts. Nonvolatile nanotube block 6410 is formed on the surface of insulator 6415, which is on substrate 6420, and overlaps bottom terminal 6425 embedded in insulator 6415 to form bottom contact 6427. Bottom terminal 6425 is formed with Ti/Pd of thickness 25 nm. Horizontal dimensions of terminal 6425 are not critical. NV NT block 6410 can be etched from a larger nanotube structure 6410'. In one embodiment, insulator 6430 is an $SiO_2$ oxide approximately 50 nm thick of approximate width $W_{INSUL}$ of 200 nm and overlaps a portion of nanotube structure 6410'. Other embodiments may have other suitable insulators, of other suitable dimensions. Top terminal 6435 of approximate width $W_{TOP\ CONTACT}$ of, for example, 100 nm, overlaps a portion of insulator 6430 and extends beyond insulator 6430 to overlap a portion of nanotube structure 6410' beyond the edge of insulator 6430 to form a top contact region 6440 having dimensions C1 and C2 and forming top contact 6437. Exposed regions of nanotube structure 6410' outside the boundaries 6445 defined by top terminal 6435, insulator 6430, and nanotube structure 6410' are etched using nanotube etching techniques described in incorporated patent references to form NV NT block 6410. ON/OFF switching of NV NT block 6410 occurs mostly in a region defined by dimensions C1 and C2 in top contact region that forms top contact 6437 above bottom contact 6427. Top contact 6437 and bottom contact 6427 are separated by the thickness of the NV NT block 6410, which in one example is approximately 35 nm, although other thicknesses are possible. In one embodiment, C1 is approximately in the range of 40 to 80 nm and C2 is approximately 100 nm. The portion of NV NT network that switches between ON and OFF states is mostly between top and bottom contacts 6437 and 6427, respectively, within approximate dimensions, for example of about 100×40×35 nm volume of NV NT block 6410 (some dimensions not visible in FIGS. 64A-64C) using the illustrative dimensions provided above. The channel length $L_{SW-CH}$ is the distance between top and bottom contacts of approximately 35 nm, in one embodiment. NV NT switch 5700A illustrated in FIG. 57A is a 3-D representation corresponding to NV NT switch 6400/6400' in FIGS. 64A and 64B, with NV NT block 5710 corresponding to NV NT block 6410. Bottom contact location 5715 corresponds to bottom contact 6427 and top contact location 6720 corresponds to top contact 6437. The electrical performance of block 6410 is determined by a NV NT network mostly contained in a volume of approximately 100 nm×40 nm×35 nm as described further above, using the illustrative dimensions. In this example, terminals 6425 and 6435 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators 6415 6430 may be $SiO_2$, $AL_2O_3$, SiN, polyimide, and other compatible insulator materials. Substrate 6420 may be an insulator such as ceramic or glass, a semiconductor with an insulated surface, a metal with an insulated surface, or an organic rigid or flexible substrate.

Figure 64C:
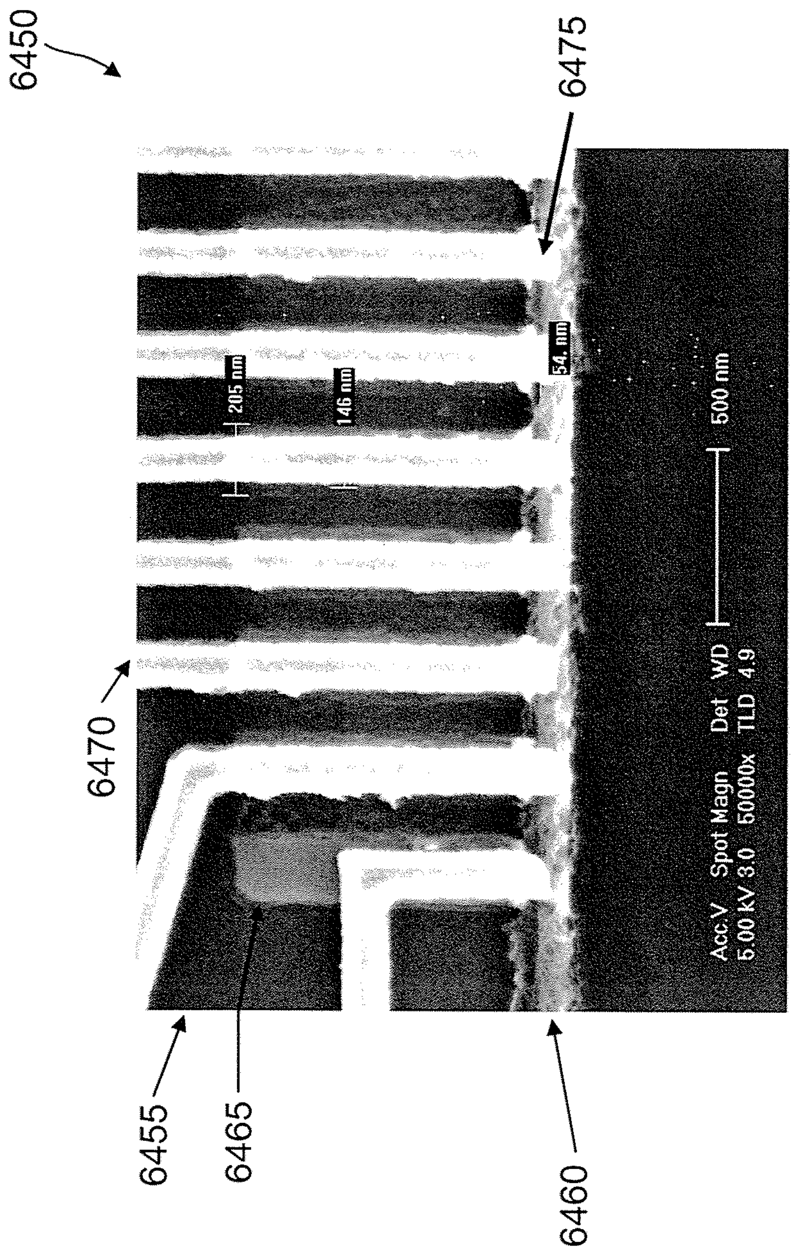

FIG. 64C illustrates a SEM image of nonvolatile nanotube switch 6450 just prior to final etch and passivation and corresponds to nonvolatile nanotube switch 6400/6400' illustrated in FIGS. 64A and 64B. Final etch defines the block 6410 dimensions. Nonvolatile nanotube switch 6450 is shown just prior to NV NT block 6410 formation, exposed portion of insulator 6455 corresponding to insulator 6415, nanotube structure 6460 prior to final etch corresponding to nanotube structure 6410', insulator 6465 corresponding to insulator 6430, top terminal 6470 corresponding to top terminal 6435, and top contact region 6475 corresponding to top contact region 6440. Nonvolatile nanotube switch 6450 has been fabricated with a channel length $L_{SW-CH}$ of approximately 35 nm corresponding to the thickness of the NV NT block between top and bottom contacts.

A graph 6500 of nonvolatile nanotube switch 6450 switching results for 100 ON/OFF cycles is illustrated in FIG. 65. ON resistance values 6510 show that most ON resistance values are in range of 100 kOhms to 1 MOhm, and OFF resistance values 6520 are approximately 1 GOhm or higher. The test conditions are similar to those described further above with respect to FIG. 11; write 0 corresponds to erase and write 1 corresponds to program. Graph 6500 illustrated in FIG. 65 used one 7 volts write 0 pulse, five 6 volts write 1 pulses, and switched the NV NT switch between ON and OFF states for 100 cycles. No shorting between overlapping top and bottom contacts was observed.

NV NT switches using NV NT blocks as switching elements demonstrate ON/OFF switching for fabricated devices over a wide range of horizontal dimensions, e.g., from 22 nm to 300 nm and contacting schemes involving bottom, top, end, and side contacts in various combinations. NV NT blocks may be used in various integration schemes to form a large variety of three-dimensional nonvolatile nanotube diode-based memory arrays. For example, cross section 4000 illustrated in FIG. 40 shows a NV NT block, referred to as nanotube element 4050, with a top contact referred to as upper level contact 4065 and a bottom contact referred to as lower level contact 4030, forming nonvolatile nanotube switch 4005. Cross section 4785 illustrated in FIG. 47 shows NV NT blocks with end contacts, referred to as nanotube elements 4740-1, with end contacts 4779 and 4764, and nanotube elements 4740-2 with end contacts 4779' and 4764'.

The flexibility of NV NT blocks enables integration in a variety of structures and product applications. For example, NV NT switches formed using NV NT blocks may be used as scalable nonvolatile nanotube switches in structures and circuits, such as the structures and circuits described in U.S.

Provisional Patent Application No. 60/836,343. Also, NV NT switches formed using NV NT blocks may be used in memory arrays, such as the memory arrays described in U.S. patent application Ser. Nos. 11/280,786 and 11/274,967. Also, NV NT switches formed using NV NT blocks may be used in non-volatile shadow latches to form register files used in logic circuits, such as the register files described in U.S. patent application Ser. No. 11/280,599. These scalable NV NT Switches formed using NV NT blocks may be used instead of stacked capacitors in DRAM cells to create a less complex scalable nonvolatile storage structure.

Methods of Fabrication of NV NT Switches using Nonvolatile Nanotube Blocks

Some embodiments of methods of depositing and patterning a CNT layer, or layers, of carbon nanotubes (CNTs) from CNT dispersion in aqueous or non-aqueous solutions that may be used to fabricate nonvolatile nantotube blocks are described in incorporated patent references. Examples of such NV NT blocks are illustrated in 3-D representations in FIGS. 56D, 56E, 56F, 57A and 57A'. Such methods may be used to fabricate nonvolatile nanotube switches using NV NT blocks as described further above with respect to FIGS. 58A-65. Such methods may also be used to fabricate 3-D memory cells using NV NT blocks such as illustrated by cross section 4000 in FIG. 40, where nanotube element 4050 is a NV NT block with top and bottom contacts, and by cross section 4785 illustrated in FIG. 47 where nanotube elements 4740-1 and 4740-2 are NV NT blocks with end contacts.

Some embodiments of methods of NV NT block fabrication may be extended to include deposition of a CNT layer, or layers, from CNT dispersions in a sacrificial polymer dissolved in an organic solvent as described with respect to methods 6600A of fabrication illustrated in FIG. 66A. Such methods may, in some embodiments, be used to enhance electrical performance such as cyclability (number of ON/OFF cycles) and/or facilitate NV NT block fabrication to enable, for example, NV NT blocks with more closely spaced top and bottom contact locations as illustrated by comparing NV NT block 5730 shown in a 3-D representation in FIG. 57B with NV NT block 5710 shown in a 3-D representation in FIG. 57A. Shorter NV NT switch channel length $L_{SW-CH}$, corresponding to top-to-bottom contact separation may reduce NV NT switch operating voltage as described further above with respect to FIG. 10. The sacrificial polymer may remain in the NV NT structure 5730 shown in a 3-D representation in FIG. 57B, or may be removed from the NV NT block by evaporation, typically at temperatures in the range of 200 deg C. to 400 deg C., as illustrated by NV NT block 5730' shown in a 3-D representation in FIG. 57B'.

Some embodiments of methods of NV NT block fabrication may also be extended to include the addition of performance enhancing material such as a porous dielectric, for example, as described with respect to methods 6600B of fabrication illustrated in FIG. 66B and methods 6600C of fabrication illustrated in FIG. 66C. Block 5750 shown in a 3-D representation in FIG. 57C illustrates a NV NT block that incorporates performance enhancing material such as a porous dielectric.

Methods of fabrication of Nonvolatile Nanotube Blocks using a Sacrificial Polymer FIG. 66A illustrates certain methods 6600A of fabrication of enhanced NV NT blocks. In general, methods 6605 fabricate support circuits and interconnections in and out of a semiconductor substrate separately, e.g., with methods 2710 described further above with respect to FIGS. 27A-27B. Exemplary methods 6605 deposit and pattern semiconducting, metallic, and insulating layers and form structures prior to CNT layer deposition.

Next, methods 6608 deposit a CNT layer, or layers, from CNT dispersions in a sacrificial polymer dissolved in an organic solvent. For example, sacrificial polymer polypropylene carbonate (PPC) dissolved in one or more organic solvents such as NMP or cyclohexanone available in the industry. A description of the properties of polypropylene carbonate may be found, for example, in referenced technical data available from the company Empower Materials, Inc. While sacrificial polymer PPC is used in this example, other sacrificial polymers such as Unity sacrificial polymer and polyethylene carbonate sacrificial polymer may also be used. At this point in the process, the CNT layer may be patterned continuing with fabrication flow 1A illustrated in FIG. 66A. Alternatively, additional layers may be added to be followed by patterning of multiple layers including the CNT layer continuing with fabrication flow 2A illustrated in FIG. 66A. Exemplary methods will be described first with respect to CNT layer patterning (fabrication flow 1A), and then followed by methods of patterning multiple layers including the CNT layer (fabrication flow 2A).

Continuing methods 6600A of fabrication description using fabrication flow 1A, next, methods 6610 then pattern (etch) the CNT layer using nanotube etching techniques described in incorporated patent references. In certain embodiments, the methods include substantially removing (e.g., etching) the sacrificial polymer such as polypropylene carbonate (PPC) in exposed regions. This removal may be performed, e.g., using anisotropic physical etch, etch as Ar ion milling; or reactive ion etching (RIE) involving $O_2$ plasma; or a combination of both.

Next, methods 6612 complete NV NT block fabrication. Such methods include deposition and patterning a conductor layer to form terminals in contact with the NV NT block at a top, side, or end region, or combinations of contacts thereof as illustrated in FIGS. 58A-58D, for example. Alternatively, such methods may include depositing and patterning an insulating layer and then a conductor layer as illustrated in FIG. 60A-60C.

At this point in the process, NV NT switches incorporating NV NT blocks have been formed, and methods 6680 complete the fabrication of chips including passivation and package interconnect means using known industry methods of fabrication. The encapsulated NV NT blocks include a sacrificial polymer as illustrated with respect to block 5730 shown in a 3-D representation in FIG. 57B.

Alternatively, methods 6615 may substantially remove, (e.g., evaporate) the sacrificial polymer such as polypropylene carbonate for example, by heating the wafer to a temperature in the range of 200 deg. C. to 400 deg. C. In this example, NV NT block 5730 becomes like NV NT block 5730' shown in a 3-D representation in FIG. 57B' with NV NT blocks having substantially only CNT fabric formed of individual nanotubes.

Then, methods 6680 complete the fabrication of chips including passivation and package interconnect means using known industry methods of fabrication. The encapsulated NV NT blocks substantially do not include a sacrificial polymer as illustrated with respect to block 5730' shown in a 3-D representation in FIG. 57B'. At this point in the process, method 6600A of fabrication using fabrication flow 1A ends.

In an alternative fabrication sequence, methods 6600A of fabrication that include fabrication flow 2A use methods 6620 to deposit additional fabrication layers added to the CNT layer, or layers, deposited in a previous step using methods 6608 of fabrication.

Next, methods 6622 pattern multiple layers including the CNT layer. Known industry methods remove (etch) exposed regions of metal, insulator, and semiconductor layers. Exemplary methods of CNT layer etch are described in incorporated patent references. Some methods remove (etch) sacrificial polymer such as polypropylene carbonate (PPC) in exposed regions. Exemplary methods may include anisotropic physical etch, etch as Ar ion milling; or reactive ion etching (RIE) involving $O_2$ plasma; or a combination of both.

By way of example, NV NT switch 6400/6400' illustrated in FIGS. 64A-64C shows the formation of NV NT block 6410 using a top contact (and terminal) conductor and an insulating layer as a mask to remove (etch) the underlying CNT layer. Cross section 4000 illustrated in FIG. 40 also shows the formation of the NV NT block referred to as nanotube element 4050 by patterning additional layers above the NV NT block surface. However, substantial removal of exposed regions of a sacrificial polymer is not illustrated in these two examples.

At this point in the process, NV NT switches incorporating NV NT blocks have been formed, and methods 6680 complete the fabrication of chips including passivation and package interconnect means using known industry methods of fabrication. The encapsulated NV NT blocks include a sacrificial polymer as illustrated with respect to block 5730 shown in a 3-D representation in FIG. 57B.

Alternatively, methods 6615 substantially remove, (e.g., evaporate) the sacrificial polymer such as polypropylene carbonate for example, by heating the wafer to a temperature in the range of 200 deg. C. to 400 deg. C. In this example, NV NT block 5730 becomes like NV NT block 5730' shown in a 3-D representation in FIG. 57B' with NV NT blocks having substantially only CNT fabric formed of individual nanotubes.

Then, methods 6680 complete the fabrication of chips including passivation and package interconnect means using known industry methods of fabrication. The encapsulated NV NT blocks substantially do not include a sacrificial polymer as illustrated with respect to block 5730' shown in a 3-D representation in FIG. 57B'. At this point in the process, method 6600A of fabrication using fabrication flow 2A ends.

A First Method of fabrication of Nonvolatile Nanotube Blocks having a Porous Dielectric FIG. 66B illustrates methods 6600B of fabrication of enhanced NV NT blocks. In general, methods 6605 fabricate support circuits and interconnections in and out of a semiconductor substrate, e.g., using methods 2710 described further above with respect to FIG. 27. Methods 6605 deposit and pattern semiconducting, metallic, and insulating layers and form structures prior to CNT layer deposition.

Next, methods 6608 deposit a CNT layer, or layers, from CNT dispersions in a sacrificial polymer dissolved in an organic solvent. For example, sacrificial polymer polypropylene carbonate (PPC) dissolved in an organic solvent such as NMP or cyclohexanone available in the industry. At this point in the process, methods 6600B of fabrication process flow may proceed with fabrication flow 1B. Alternatively, methods 6600B of fabrication process flow may proceed with fabrication flow 2B. Exemplary methods 6600B of fabrication will be described first with respect to fabrication flow 1B, and then followed by methods 6600B of fabrication with respect to fabrication flow 2A.

Continuing methods 6600B of fabrication description using fabrication flow 1B, next, methods 6625 then pattern (etch) the CNT layer using nanotube etching techniques described in incorporated patent references. In some embodiments, methods substantially remove (e.g., etch) the sacrificial polymer such as polypropylene carbonate (PPC) in exposed regions. Exemplary methods include anisotropic physical etch, etch as Ar ion milling; or reactive ion etching (RIE) involving $O_2$ plasma; or a combination of both.

Next, methods 6628 substantially remove (e.g., evaporate) the sacrificial polymer such as polypropylene carbonate for example, by heating the wafer to a temperature in the range of 200 deg. C. to 400 deg. C. In this example, NV NT block 5730 becomes like NV NT block 5730' shown in a 3-D representation in FIG. 57B' with NV NT blocks having substantially only CNT fabric formed of individual nanotubes.

Next, methods 6630 form a performance enhancing material such as a porous dielectric. Porous dielectric may be formed using spin-on glass (SOG) and spin-on low-κ organic dielectrics as described in a paper by S. Thanawala et al., "Reduction in the Effective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently to generate a modified surface as described in USPTO Patent Pub. No. 2006/0193093 which includes common inventor Bertin and is hereby incorporated by reference in its entirety. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6632 complete NV NT block fabrication. Such methods include deposition and patterning a conductor layer to form terminals in contact with the NV NT block at a top, side, or end region, or combinations of contacts thereof. In this example, encapsulated NV NT blocks with top and bottom contacts include a performance enhancing material such as a porous dielectric as illustrated with respect to block 5750 shown in a 3-D representation in FIG. 57C.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

In an alternative fabrication sequence, methods 6600B of fabrication that include fabrication flow 2B use methods 6635 to substantially remove (e.g., evaporate) the sacrificial polymer such as polypropylene carbonate from the CNT layer for example, by heating the wafer to a temperature in the range of 200 deg. C. to 400 deg. C.

Next, methods 6638 form a performance enhancing material such as a porous dielectric. Porous dielectric may be formed using spin-on glass (SOG) and spin-on low-κ organic dielectrics as described in a paper by S. Thanawala et al., "Reduction in the Effective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently to generate a modified surface as described in USPTO Patent Pub. No. 2006/0193093. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6640 of fabrication deposit additional fabrication layers added to the CNT layer, or layers, such as conductor, insulating, or semiconducting layers deposited using industry methods of fabrication.

Next, methods 6642 pattern multiple layers including the CNT layer. Known industry methods remove (etch) exposed regions of metal, insulator, and semiconductor layers. Exemplary methods of CNT layer etch are described in incorporated patent references. Exemplary methods remove (etch) exposed portions of the performance enhancing material such as a porous dielectric using known industry methods for etching dielectric material.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

A Second Method of fabrication of Nonvolatile Nanotube Blocks having a Porous Dielectric FIG. 66C illustrates methods 6600C of fabrication of enhanced NV NT blocks. In general, methods 6605 fabricate support circuits and interconnections in and out of a semiconductor substrate, e.g., using methods 2710 described further above with respect to FIG. 27. In some embodiments, methods 6605 deposit and pattern semiconducting, metallic, and insulating layers and form structures prior to CNT layer deposition.

Next, methods 6650 deposit a CNT layer, or layers, from CNT dispersion in aqueous or non-aqueous solutions are used to fabricate nonvolatile nanotube blocks as described in incorporated patent references. At this point in the process, methods 6600C of fabrication process flow may proceed with fabrication flow 1C. Alternatively, methods 6600C of fabrication process flow may proceed with fabrication flow 2C. Exemplary methods 6600C of fabrication will be described first with respect to fabrication flow 1C, and then followed by methods 6600C of fabrication with respect to fabrication flow 2C.

Continuing methods 6600C of fabrication description using fabrication flow 1C, next, methods 6655 then pattern (etch) the CNT layer using nanotube etching techniques described in incorporated patent references.

Next, methods 6658 form a performance enhancing material such as a porous dielectric. Porous dielectric may be formed using spin-on glass (SOG) and spin-on low-κ organic dielectrics as described in a paper by S. Thanawala et al., "Reduction in the Effective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently to generate a modified surface as described in USPTO Patent Pub. No. 2006/0193093. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6660 complete NV NT block fabrication. Such methods include deposition and patterning a conductor layer to form terminals in contact with the NV NT block at a top, side, or end region, or combinations of contacts thereof. In this example, encapsulated NV NT blocks with top and bottom contacts include a performance enhancing material such as a porous dielectric as illustrated with respect to block 5750 shown in a 3-D representation in FIG. 57C.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

In an alternative fabrication sequence, methods 6600C of fabrication that include fabrication flow 2C uses methods 6665 to form a performance enhancing material such as a porous dielectric. Porous dielectric may be formed using spin-on glass (SOG) and spin-on low-κ organic dielectrics as described in a paper by S. Thanawala et al., "Reduction in the Effective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently or mixed with pristine nanotubes to generate a modified surface as described in USPTO Patent Pub. No. 2006/0193093. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6670 of fabrication deposit additional fabrication layers added to the CNT layer, or layers, such as conductor, insulating, or semiconducting layers deposited using methods industry methods of fabrication.

Next, methods 6675 pattern multiple layers including the CNT layer. Known industry methods substantially remove (etch) exposed regions of metal, insulator, and semiconductor layers. Exemplary methods of CNT layer etch are described in incorporated patent references. In some embodiments, methods remove (etch) exposed portions of the performance enhancing material such as a porous dielectric by using known industry methods for etching dielectric material, especially oxygen plasma and reactive ion etching with gasses that are capable of removing carbon nanotubes which are unprotected by photoresist or other processing materials. Such etches may be isotropic or anisotropic depending upon the orientation required.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

3-Dimensional Cell Structure of Nonvolatile Cells using NV NT Devices having Vertically Oriented Diodes and Nonvolatile Nanotube Blocks as Nonvolatile NT Switches using Top and Bottom Contacts to form Cathode-on-NT Switches FIG. 67 illustrates cross section 6700 including cells C00 and C01 in a 3-D memory embodiment. Nanotube layers are deposited by coating, spraying, or other means on a planar contact surface on previously defined diode-forming layers as illustrated in FIG. 40 shown further above. Cross section 6700 illustrated in FIG. 67 corresponds to structure 4000 illustrated in FIG. 40, with some additional detail associated with an cathode-on-NT implementation and element numbers to facilitate description of methods of fabrication. Trench etching after the deposition of insulator, semiconductor, conductor, and nanotube layers form sidewall boundaries that define nonvolatile nanotube block-based nonvolatile nanotube diode 3-D memory cells and define nonvolatile nanotube block dimensions, diode dimensions, and the dimensions of all other structures in the three dimensional nonvolatile storage cells. The horizontal 3-D cell dimensions (X and Y approximately orthogonal directions) of all cell structures are formed by trench etching and are therefore self-aligned as fabricated. The vertical dimension (Z) is determined by the thickness and number of vertical layers used to form the 3-D cell. FIG. 67 illustrates cross section 6700 along a word line (X) direction. Stacked series-connected vertically-oriented steering diodes and nonvolatile nanotube block switches are symmetrical and have approximately the same cross sectional dimensions in both X and Y directions. Cross section 6700 illustrates array cells in which the steering diode is connected to the bottom (lower level) contact of the nonvolatile nanotube block in a cathode-on-NT configuration. Word lines are oriented along the X axis and bit lines along the Y axis as illustrated in perspective in FIG. 33A.

Some embodiments of methods 2710 described further above with respect to FIG. 27A are used to define support circuits and interconnections 6701.

Next, methods 2730 illustrated in FIG. 27B deposit and planarize insulator 6703. Interconnect means through planar insulator 6703 (not shown in cross section 6700 but shown above with respect to cross section 2800" in FIG. 28C) may be used to connect metal array lines in 3-D arrays to corresponding support circuits and interconnections 6701. By way of example, bit line drivers in BL driver and sense circuits 2640 may be connected to bit lines BL0 and BL1 in array 2610 of memory 2600 illustrated in FIG. 26A described further above, and in cross section 6700 illustrated in FIG. 67. At this point in the fabrication process, methods 2740 may be used to form a memory array on the surface of insulator 6703, interconnected with memory array support structure 6705 illustrated in FIG. 67. Memory array support structure 6705 corresponds to memory array support structure 3405 illustrated in FIG. 47, and support circuits and interconnections 6701 correspond to support circuits and interconnections 3401, and insulator 6703 corresponds to insulator 3403 except for some changes to accommodate a new memory array structure for 3-D memory cells that include nonvolatile nanotube blocks with top (upper level) and bottom (lower level) contacts.

Exemplary methods 2740 illustrated in FIG. 27B deposit and planarize metal, polysilicon, insulator, and nanotube element layers to form nonvolatile nanotube diodes which, in this example, include multiple vertically oriented diode and nonvolatile nanotube block (NV NT block) switch cathode-on-NT series pairs. Individual cell boundaries are formed in a single etch step for the X direction (and a separate single etch for the Y direction), each cell having a single NV NT Diode defined by a single trench etch step after layers, except the WL0 layer, have been deposited and planarized, in order to eliminate accumulation of individual layer alignment tolerances that would substantially increase cell area. Individual cell dimensions in the X direction are F (1 minimum feature) as illustrated in FIG. 40 and corresponding FIG. 67, and also F in the Y direction (not shown) which is approximately orthogonal to the X direction, with a periodicity in X and Y directions of 2F. Hence, each cell occupies an area of approximately $4F^2$.

NV NT blocks with top (upper level) and bottom (lower level) contacts, illustrated further above in FIG. 40 and corresponding FIG. 67 by nanotube elements 4050-1 and 4050-2, are further illustrated in perspective drawings in FIGS. 57A-57C further above. NV NT block device structures and electrical ON/OFF switching results are described with respect to FIGS. 64A-64C and 65 further above. Methods of fabrication of NV NT blocks with top and bottom contacts are described with respect to methods 6600A, 6600B, and 6600C illustrated in FIGS. 66A, 66B, and 66C, respectively. NV NT blocks with top and bottom contacts have channel lengths $L_{SW-CH}$ approximately equal to the separation between top and bottom contacts, 35 nm for example. A NV NT block switch cross section X by Y may be formed with X=Y=F, where F is a minimum technology node dimension. For a 35 nm technology node, a NV NT block may have dimensions of 35×35×35 nm; for a 22 nm technology node, a NV NT block may have dimensions of 22×22×35 nm, for example.

Methods fill trenches with an insulator; and then methods planarize the surface. Then, methods deposit and pattern word lines on the planarized surface.

The fabrication of vertically-oriented 3D cells illustrated in FIG. 67 proceeds as follows. In some embodiments, methods deposit a bit line wiring layer on the surface of insulator 6703 having a thickness of 50 to 500 nm, for example, as described further below with respect to FIGS. 68A-68I. Fabrication of the vertically-oriented diode portion of structure 6700 may be the same as in FIGS. 34A and 34B described further above and are incorporated in methods of fabrication described with respect to FIGS. 68A-68I. Methods etch the bit line wiring layer and define individual bit lines such as bit line conductors 6710-1 (BL0) and 6710-2 (BL1). Bit lines such as BL0 and BL1 are used as array wiring conductors and may also be used as anode terminals of Schottky diodes. Alternatively, more optimum Schottky diode junctions may be formed using metal or silicide contacts (not shown) in contact with N polysilicon regions 6720-1 and 6720-2, while also forming ohmic contacts with bit line conductors 6710-1 and 6710-2. N polysilicon regions 6720-1 and 6720-2 may be doped with arsenic or phosphorus in the range of $10^{14}$ to $10^{17}$ dopant atoms/$cm^3$ for example, and may have a thickness range of 20 nm to 400 nm, for example.

FIG. 67 illustrates a cathode-to-NT type NV NT diodes formed with Schottky diodes. However, PN or PIN diodes may be used instead of Schottky diodes as described further below with respect to FIG. 68A.

The electrical characteristics of Schottky (and PN, PIN) diodes may be improved (low leakage, for example) by controlling the material properties of polysilicon, for example polysilicon deposited and patterned to form polysilicon regions 6820-1 and 6820-2. Polysilicon regions may have relatively large or relatively small grain boundary sizes that are determined by methods of fabrication such as anneal times and temperatures for example. In some embodiments, SOI deposition methods in the semiconductor industry may be used that result in polysilicon regions that are single crystalline (no longer polysilicon), or nearly single crystalline, for further electrical property enhancement such as low diode leakage currents.

Examples of contact and conductors materials include elemental metals such as Al, Au, Pt, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$. In some cases conductors such as Al, Au, W, Cu, Mo, Ti, and others may be used as both contact and conductors materials as well as anodes for Schottky diodes. However, in other cases, optimizing anode material for lower forward voltage drop and lower diode leakage is advantageous. Schottky diode anode materials may be added (not shown) between conductors 6710-1 and 6710-2 and polysilicon regions 6720-1 and 6720-2, respectively. Such anode materials may include Al, Ag, Au, Ca, Co, Cr, Cu, Fe, Ir, Mg, Mo, Na, Ni, Os, Pb, Pd, Pt, Rb, Ru, Ti, W, Ta, Zn and other elemental metals. Also, silcides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002, pp. 31-41, the entire contents of which are incorporated herein by reference.

Next, having completed Schottky diode select devices, methods form N+ polysilicon regions 6725-1 and 6725-2 to contact N polysilicon regions 6720-1 and 6720-2, respectively. N+ polysilicon is typically doped with arsenic or phosphorous to $10^{20}$ dopant atoms/$cm^3$, for example, and has a thickness of 20 to 400 nm, for example. N and N+ polysilicon region dimensions are defined by trench etching near the end of the process flow.

Next, methods form bottom (lower level) contact regions 4030-1 and 4030-2 with ohmic or near ohmic contacts to polysilicon regions 6725-1 and 6725-2, respectively. Examples of contact and conductors materials include elemental metals such as Al, Au, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$.

Next, methods form NV NT block 4050-1 and 4050-2 on the surface of contact regions 4030-1 and 4030-2, respectively, having the nanotube element length of the NV NT blocks defined by the nanotube thickness in the vertical Z direction and X-Y cross section defined by trench etching near the end of the process flow. Note that NV NT block 4050-1 in FIG. 67 corresponds to nanotube element 4050 in FIG. 40. In order to enhance the density of cells C00 and C01, NV NT blocks 4050-1 and 4050-2 illustrated in FIG. 67 include simple top and bottom contacts within trench-defined cell boundaries.

Next, methods form top (upper level) contacts 4065-1 and 4065-2 on the top surfaces of NV NT blocks 4050-1 and 4050-2, respectively, with X and Y dimensions defined by trench etching near the end of the process flow.

Next, methods form (etch) trench openings 4075, 4075A, and 4075B, each of width F, thereby forming inner and outer sidewalls of cells C00 and C01 and corresponding top (upper level) and bottom (lower level) contacts, nanotube elements, and insulators. Bottom (lower level) contacts 4030-1 and 4030-2 form an electrical connection between NV NT blocks 4050-1 and 4050-2, respectively, and corresponding underlying steering diode cathode terminals, and form bit lines 6710-1 and 6710-2. Trench formation (etching) stops at the surface of insulator 6703.

Next, methods fill trench openings 4075, 4075A, and 4075B with an insulator 4060, 4060A, and 4060B, respectively, such as TEOS and planarize the surface. All trenches can be formed simultaneously.

Next, methods deposit and planarize a word line layer.

Next, methods pattern word line 6770.

Next, methods 2750 illustrated in FIG. 27A complete fabrication of semiconductor chips with nonvolatile memory arrays using nonvolatile nanotube diode cell structures including passivation and package interconnect means using known industry methods.

Nonvolatile nanotube diodes forming cells C00 and C01 correspond to nonvolatile nanotube diode 1200 schematic in FIG. 12, also illustrated schematically by NV NT diode 6780 in FIG. 67, one in each of cells C00 and C01. Cells C00 and C01 illustrated in cross section 6700 in FIG. 67 correspond to corresponding cells C00 and C01 shown schematically in memory array 2610 in FIG. 26A, and bit lines BL0 and BL1 and word line WL0 correspond to array lines illustrated schematically in memory array 2610.

Embodiments of methods 2700 illustrated in FIGS. 27A and 27B may be used to fabricate nonvolatile memories using NV NT diode devices with cathode-to-NT switch connections to NV NT block switches such as those shown in cross section 6700 illustrated in FIG. 67 and as described further below with respect to FIGS. 68A-68I. Structures such as cross section 6700 may be used to fabricate memory 2600 illustrated schematically in FIG. 26A.

Methods of Fabricating 3-Dimensional Cell Structure of Nonvolatile Cells using NV NT Devices having Vertically Oriented Diodes and Nonvolatile Nanotube Blocks as Nonvolatile NT Switches Using Top and Bottom Contacts to form Cathode-on-NT Switches Embodiments of methods 2710 illustrated in FIG. 27A may be used to define support circuits and interconnects similar to those described with respect to memory 2600 illustrated in FIG. 26A as described further above. Methods 2710 apply known semiconductor industry techniques design and fabrication techniques to fabricated support circuits and interconnections 6801 in and on a semiconductor substrate as illustrated in FIG. 68A. Support circuits and interconnections 6801 include FET devices in a semiconductor substrate and interconnections such as vias and wiring above a semiconductor substrate. FIG. 68A corresponds to FIG. 34A illustrating a Schottky diode structure, except that an optional conductive Schottky anode contact layer 3415 shown in FIG. 34A is not shown in FIG. 68A. Note that FIG. 34A' may be used instead of FIG. 34A' as a starting point if a PN diode structure is desired. If N polysilicon layer 3417 in FIG. 34A' were replaced with an intrinsically doped polysilicon layer instead (not shown), then a PIN diode would be formed instead of a PN diode. Therefore, while the structure illustrated in FIG. 68A illustrates a Schottky diode structure, the structure may also be fabricated using either a PN diode or a PIN diode.

Methods of fabrication for elements and structures for support circuits and interconnections 6801, insulator 6803, memory array support structure 6805, conductor layer 6810, N polysilicon layer 6820, N+ polysilicon layer 6825, and bottom (lower level) contact layer 6830 illustrated in FIG. 68A are described further above with respect to FIGS. 34A and 34B, where support circuits and interconnections 6801 correspond to support circuits and interconnections 3401; insulator 6803 corresponds to insulator 3403; memory array support structure 6805 corresponds to memory array support structure 3405; conductor layer 6810 corresponds to conductor layer 3410; N polysilicon layer 6820 corresponds to N polysilicon layer 3420; N+ polysilicon layer 6825 corresponds to N+ polysilicon layer 3425; and bottom (lower level) contact layer 6830 corresponds to bottom (lower level) contact layer 3430.

Figure 68B:
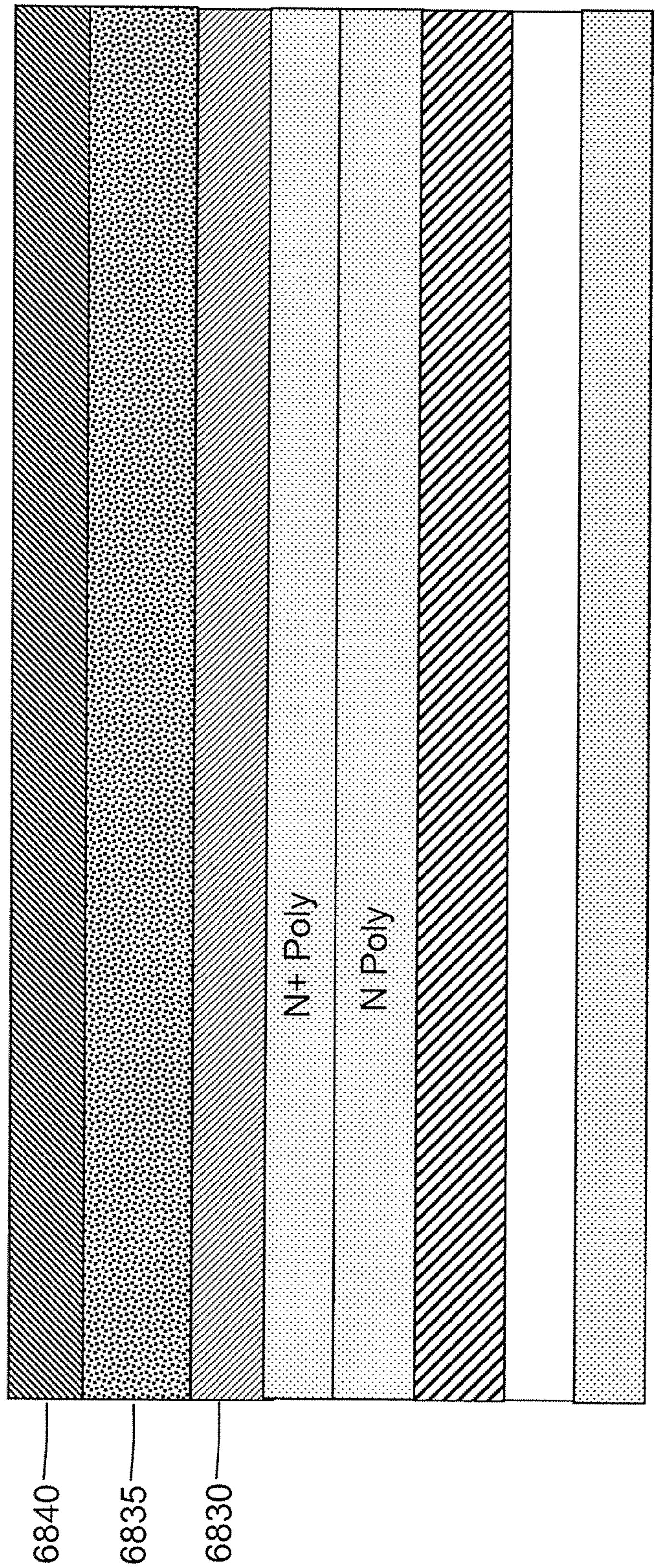

Next, methods deposit a nanotube layer 6835 on the planar surface of contact layer 6830 as illustrated in FIG. 68B using spin-on of multiple layers, spray-on, or other means. Nanotube layer 6835 may be in the range of 10-200 nm for example. Exemplary devices of 35 nm thicknesses have been fabricated and switched between ON/OFF states as illustrated in FIGS. 64A-64C and 65. Methods of fabrication of NV NT blocks with top and bottom contacts are described with respect to methods 6600A, 6600B, and 6600C illustrated in FIGS. 66A, 66B, and 66C, respectively.

At this point in the fabrication process, methods deposit top (upper level) contact layer 6840 on the surface of nanotube layer 6835 as illustrated in FIG. 68B. Top (upper level) contact layer 6840 may be 10 to 500 nm in thickness, for example. Top (upper level) contact layer 6840 may be formed using Al, Au, Ta, W, Cu, Mo, Pd, Pt, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$, for example.

Figure 68C:
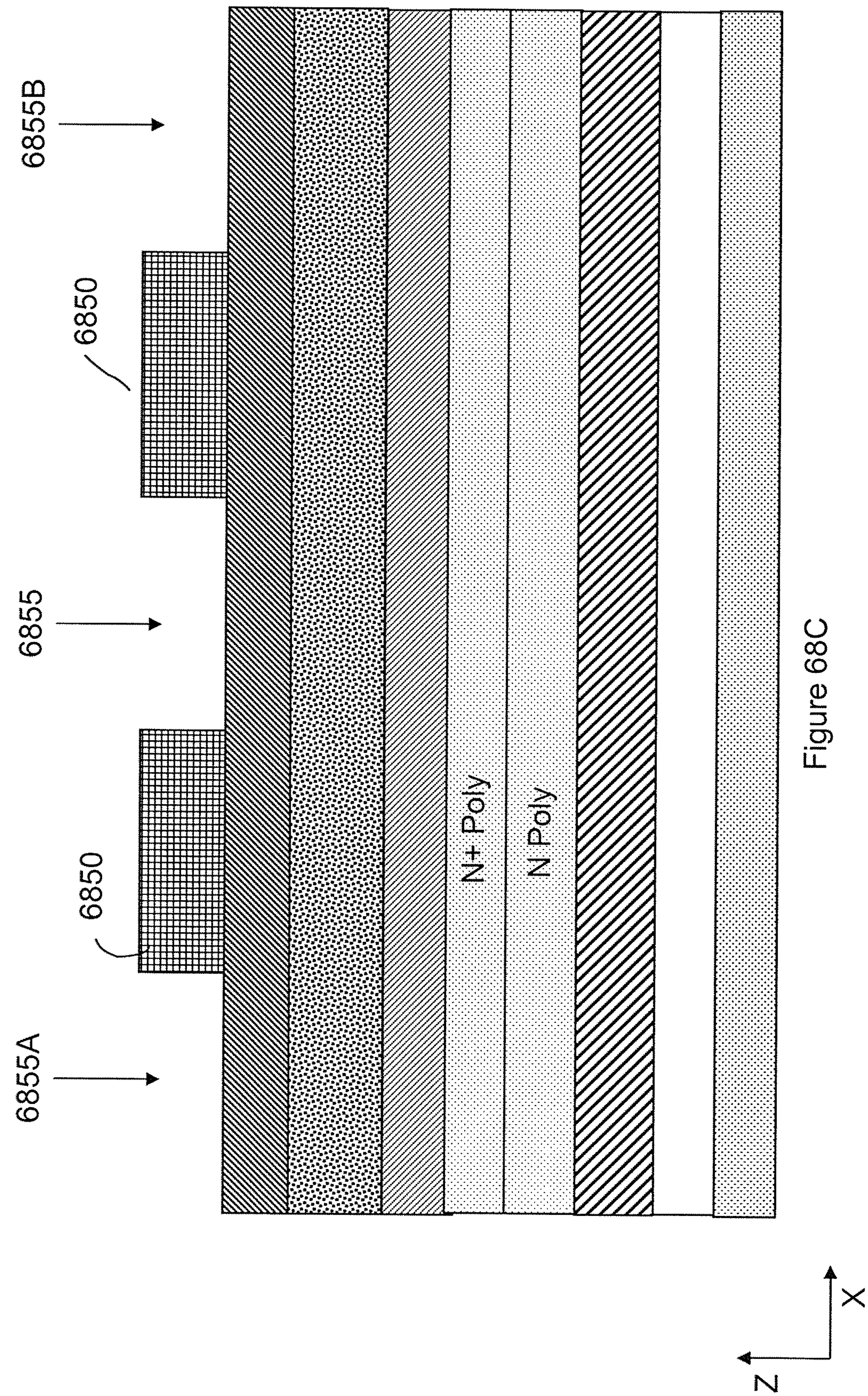

Next methods deposit and pattern a masking layer 6850 on top (upper level) contact layer 6840 as illustrated in FIG. 68C using known industry methods. Masking layer 6850 may be in the range of 10 to 500 nm thick and be formed using resist such as photoresist, e-beam resist, or conductor, semiconductor, or insulator materials. Mask layer 6850 openings 6855, 6855A and 6855B expose underlying regions for purposes of trench etching. The mask opening may be aligned to alignment marks in planar insulating layer 6803 for example; the alignment is not critical. In order to achieve minimum cell dimensions, mask layer 6850 openings 6855, 6855A, and 6855B are approximately equal to the minimum allowed technology dimension F. F may be 90 nm, 65 nm, 45 nm, 35 nm, 25 nm, 12 nm, or sub-10 nm, for example.

Figure 68D:
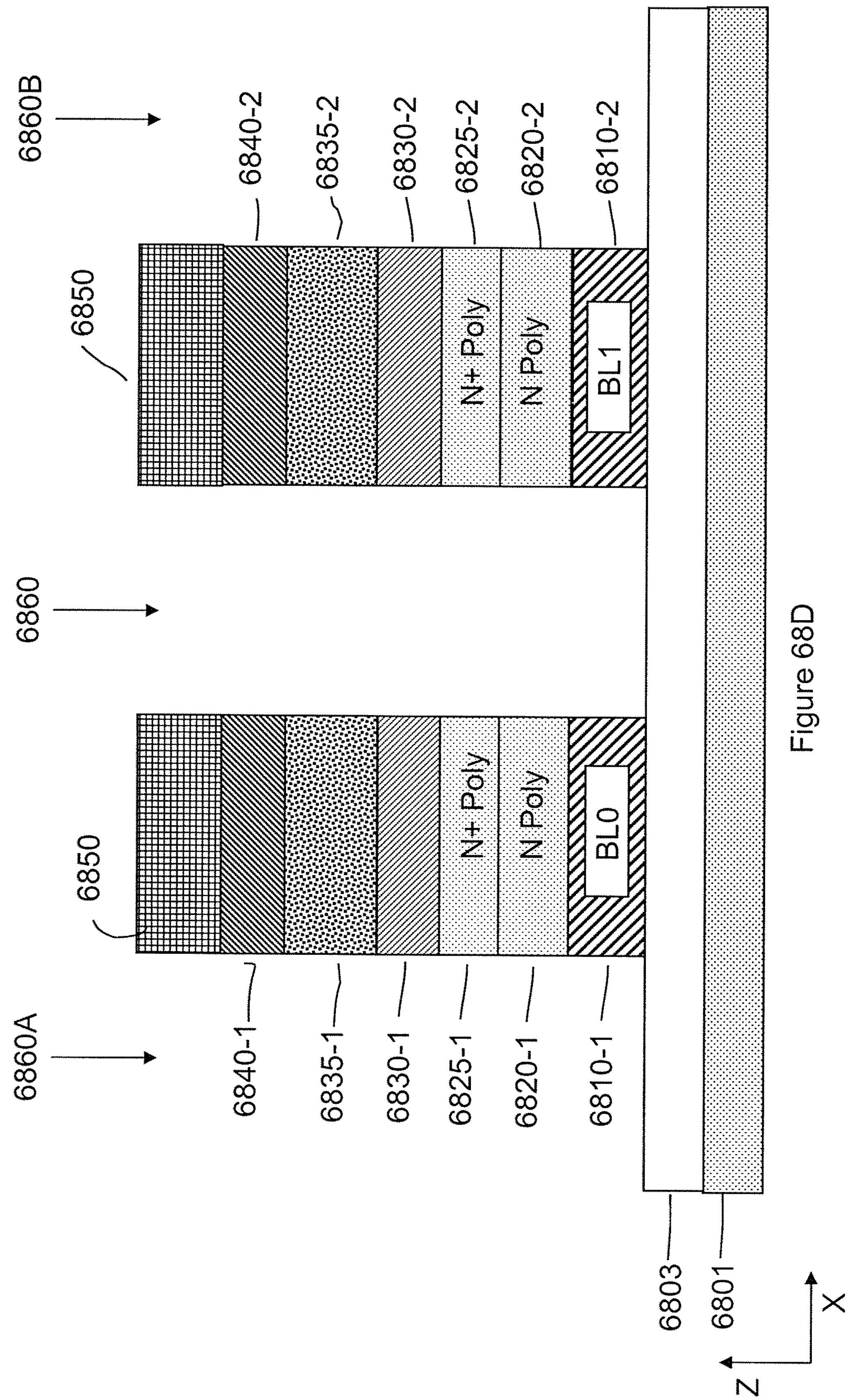

At this point in the process, mask layer 6850 openings 6855, 6855A, and 6855B may be used for directional etching of trenches using methods that define a cell boundary along the X direction for 3D cells using one NV NT diode with an internal cathode-to-nanotube connection per cell. U.S. Pat. No. 5,670,803, the entire contents of which are incorporated herein by reference, to co-inventor Bertin, discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may cut through multiple conductor, semiconductor, oxide, and nanotube layers as described further above with respect to trench formation in FIGS. 34A-34FF and 36A-36FF. In this example, selective directional trench etch (RIE) removes exposed areas of top (upper level) contact layer 6840 to form upper level contact regions 6840-1 and 6840-2; removes exposed areas of nanotube layer 6835 to form nanotube regions 6835-1 and 6835-2; removes exposed areas of bottom (lower level) contact layer 6830 to form bottom (lower level) contact regions 6830-1 and 6830-2; directional etch removes exposed areas of N+ polysilicon layer 6825 to form N+ polysilicon regions 6825-1 and 6825-2; removes exposed areas of polysilicon layer 6820 to form N polysilicon regions 6820-1 and 6820-2; and removes exposed areas of conductor layer 6810 to form conductor regions 6810-1 and 6810-2, stopping at the surface of insulator 6803 and simultaneously forming trench openings 6860, 6860A, and 6860B as illustrated in FIG. 68D.

Next methods fill trench openings 6860, 6860A, and 6860B with insulators 6865, 6865A, and 6865B, respectively, such as TEOS for example and planarize as illustrated in FIG. 68E.

Figure 68F:
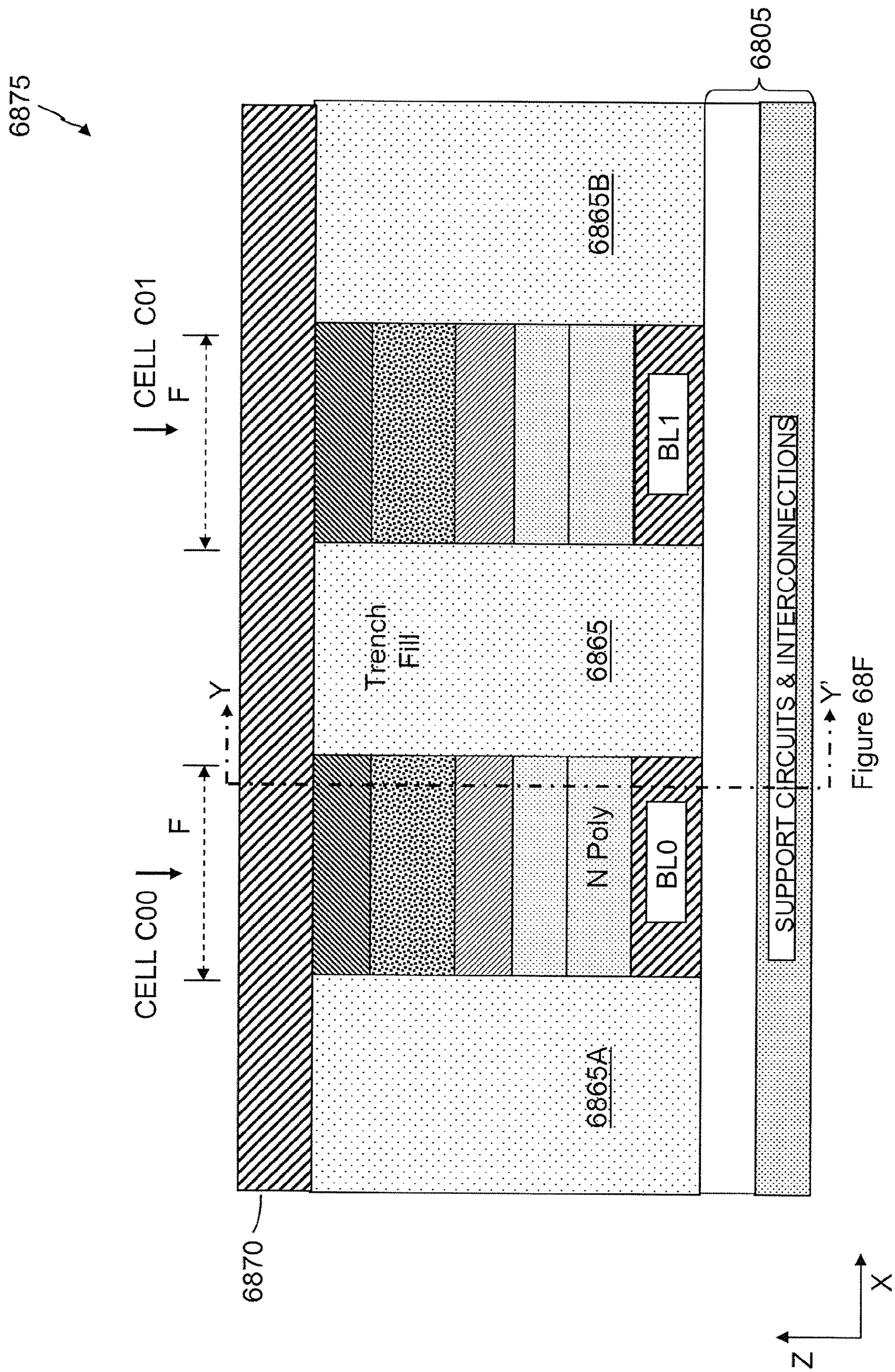

Next, methods deposit and planarize a conductor layer 6870 that contacts top (upper level) contacts 6840-1 and 6840-2 as illustrated in FIG. 68F.

Next, conductor layer 6870 is patterned to form word lines approximately orthogonal to conductors (bit lines) 6810-1 and 6810-2 as illustrated further below.

At this point in the process, cross section 6875 illustrated in FIG. 68F has been fabricated, and includes NV NT diode cell dimensions of F (where F is a minimum feature size) and cell periodicity 2F defined in the X direction as well as corresponding array bit lines. Next, cell dimensions used to define dimensions in the Y direction are formed by directional trench etch processes similar to those described further above with respect to cross section 6875 illustrated in FIG. 68F. Trenches used to define dimensions in the Y direction are approximately orthogonal to trenches used to define dimensions in the X direction. Cross sections of structures in the Y (bit line) direction are illustrated with respect to cross section Y-Y' illustrated in FIG. 68F.

Figure 68G:
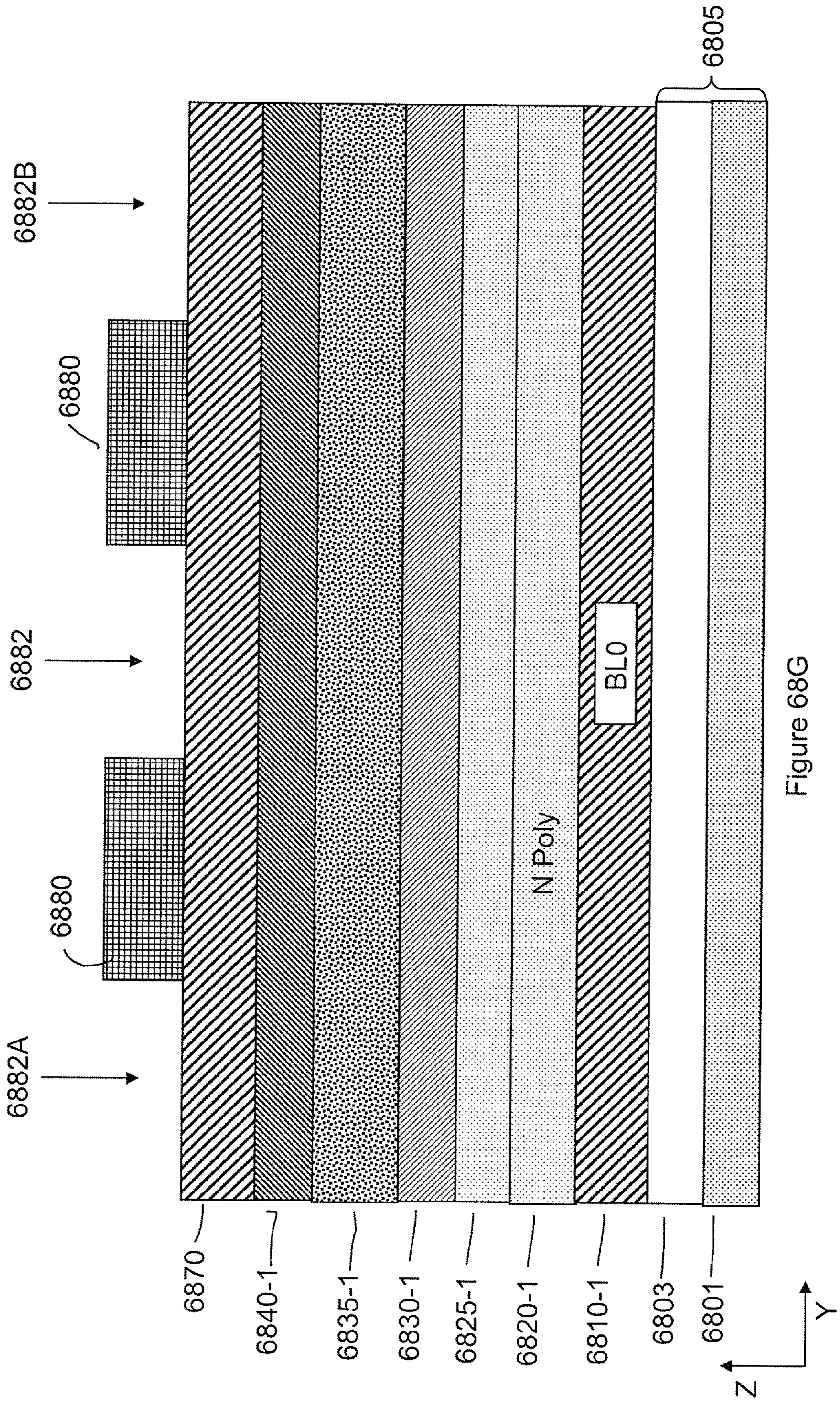

Next, methods deposit and pattern a masking layer such as masking layer 6880 with openings 6882, 6882A, and 6882B on the surface of word line layer 6870 as illustrated in FIG. 68G. Masking layer 6880 openings may be non-critically aligned to alignment marks in planar insulator 6803. Openings 6882, 6882A, and 6882B in mask layer 6880 determine the location of trench directional etch regions, in this case trenches are approximately orthogonal to bit lines such as bit line 6810-1 (BL0).

Figure 68H:
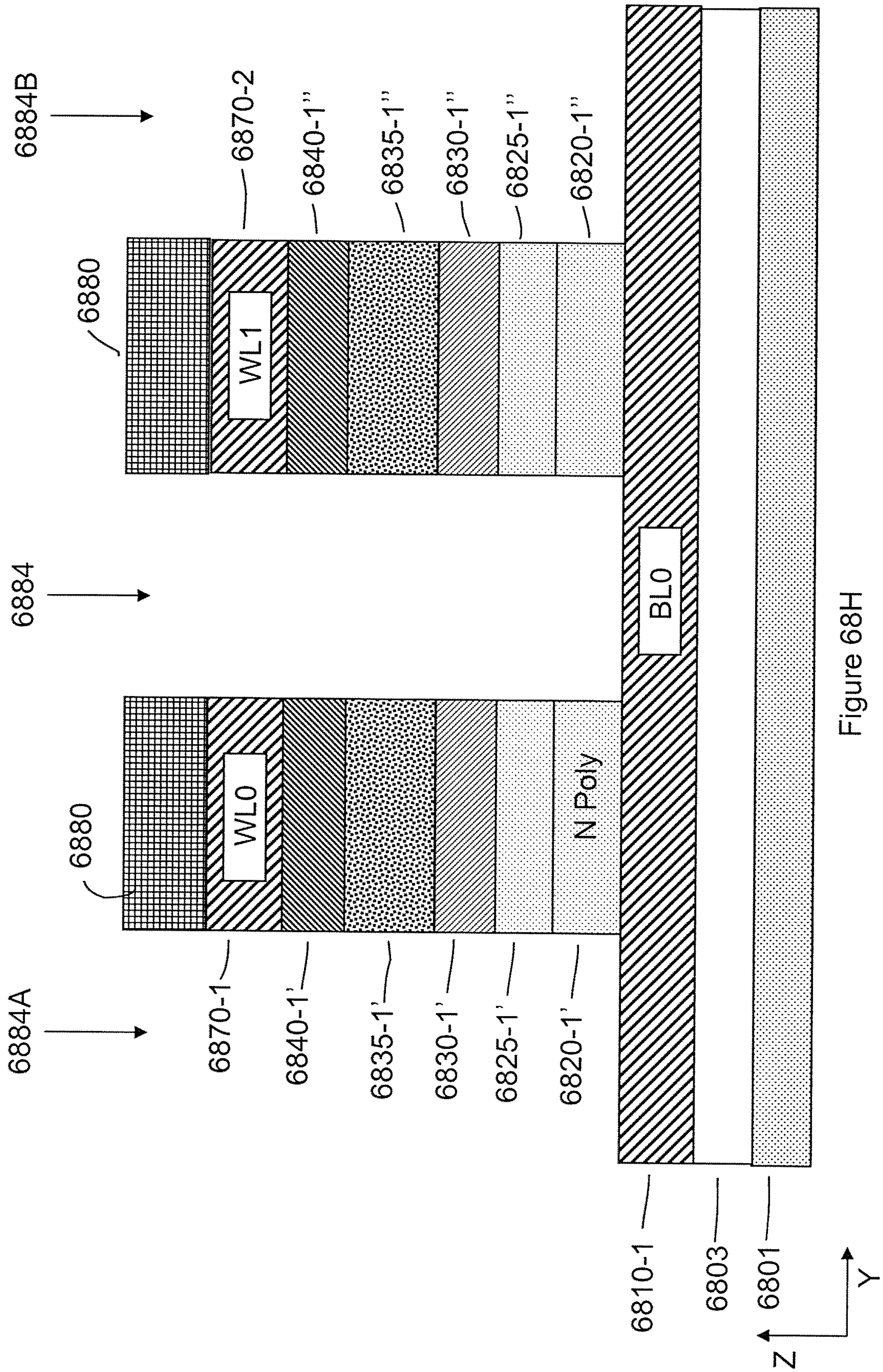

At this point in the process, openings 6882, 6882A, and 6882B in masking layer 6880 may be used for directional etching of trenches using methods that define new cell boundaries along the Y direction for 3D cells using one NV NT diode with an internal cathode-to-nanotube connection per cell. All trenches and corresponding cell boundaries may be formed simultaneously (e.g., using one etch step) using the methods of fabrication as used to form X-direction trenches as described with respect to FIG. 68D. This structure includes vertical sidewalls simultaneously defined by trenches; X and Y direction dimensions and materials are the same. In this example, methods of selective directional trench etch (RIE) removes exposed areas of conductor layer 6870 to form word lines 6870-1 (WL0) and 6870-2 (WL1) approximately orthogonal to bit lines 6810-1 (BL0) and 6810-2 (BL1); top (upper level) contact layer 6840-1 to form upper level contact regions 6840-1' and 6840-1"; removes exposed areas of nanotube layer 6835-1 to form nanotube regions 6835-1' and 6835-1"; removes exposed areas of bottom (lower level) contact layer 6830-1 to form bottom (lower level) contact regions 6830-1' and 6830-1"; selective directional etch removes exposed areas of N+ polysilicon layer 6825-1 to form N+ polysilicon regions 6825-1' and 6825-1"; removes exposed areas of polysilicon layer 6820-1 to form N polysilicon regions 6820-1' and 6820-1"; and stops etching at the surface of exposed areas of conductor layer 6810-1 as illustrated in FIG. 68H.

Figure 68I:
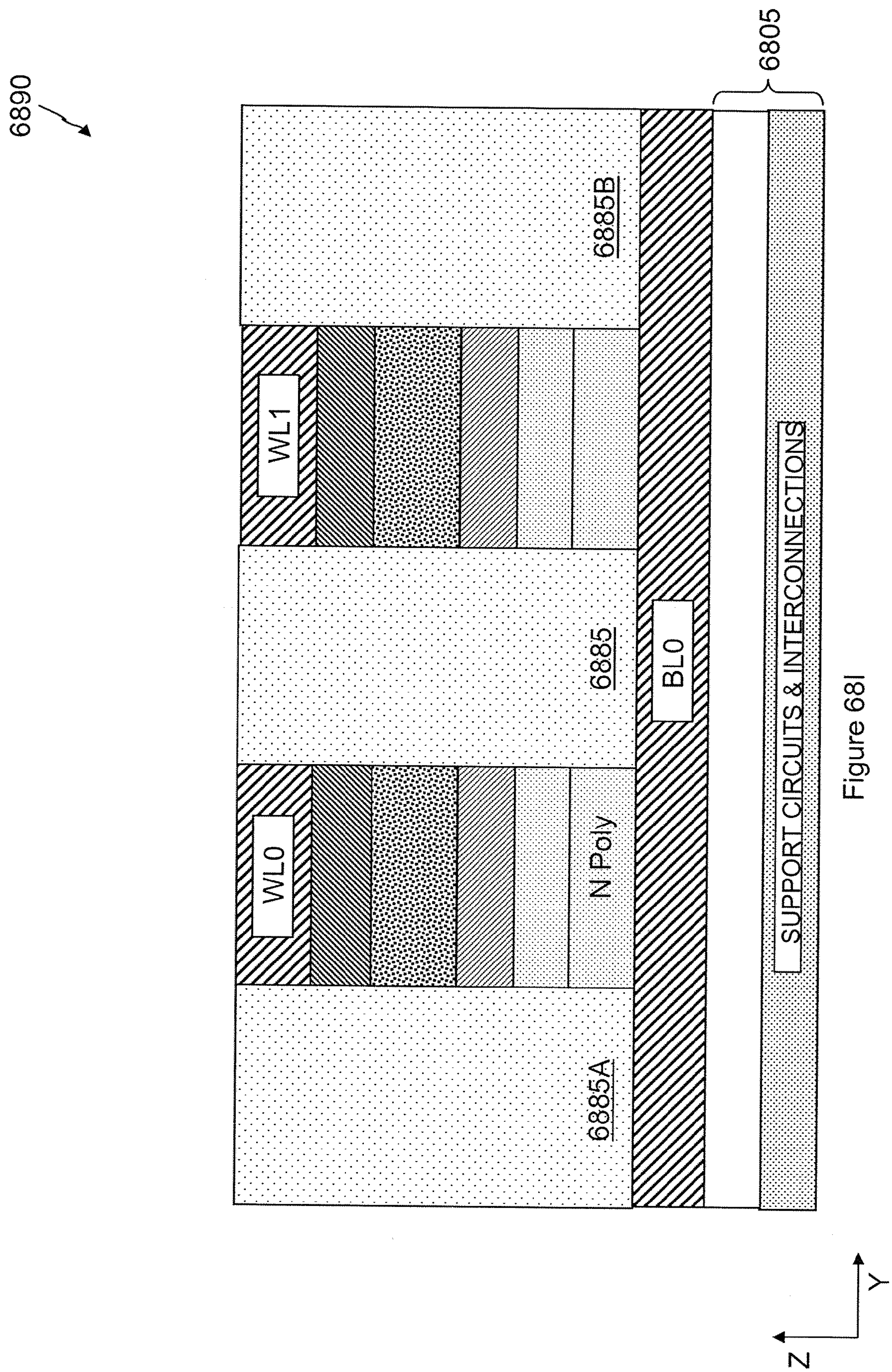

Next methods fill trench openings 6884, 6884A, and 6884B with insulators 6885, 6885A, and 6885B such as TEOS for example and planarize as illustrated by cross section 6890 in FIG. 68I. At this point in the process, nonvolatile nanotube diode-based cells are completely formed and interconnected with bit lines and approximately orthogonal word lines. Cross section 6875 illustrated in FIG. 68F and cross section 6890 illustrated in FIG. 68I are two cross sectional representation of the same 3D nonvolatile memory array with cells formed with NV NT diode having vertically oriented steering (select) diodes and nonvolatile nanotube blocks. The cathode terminal of the diode contacts the lower face of the block within the cell boundaries The anode side of the diode is in contact with a bit line such as bit line 6810-1 (BL0) and the top face of the block is in contact with an approximately orthogonal word line such as word line 6870-1 (WL0) as shown by cross section 6890 in FIG. 68I.

At this point in the process, cross sections 6875 and 6890 illustrated in FIGS. 68F and 68I, respectively, correspond to cross section 6700 illustrated in FIG. 67 and have been fabricated with cells having a vertically-oriented steering diodes and corresponding nonvolatile nanotube block switches in series, vertically-oriented (Z direction) channel lengths $L_{SW-CH}$ are defined, including overall NV NT diode cell dimensions of 1F in the X direction and 1F in the Y direction, as well as corresponding bit and word array lines. Cross section 6875 is a cross section of two adjacent cathode-to-nanotube type nonvolatile nanotube diode-based cells in the X direction and cross section 6890 is a cross section of two adjacent cathode-to-nanotube type nonvolatile nanotube diode-based cells in the Y direction. Cross sections 6875 and 6890 include corresponding word line and bit line array lines. The nonvolatile nanotube diodes form the steering and storage elements in each cell illustrated in cross sections 6875 and 6890, and with each cell having 1F by 1F dimensions. The spacing between adjacent cells is 1F so the cell periodicity is 2F in both the X and Y directions. Therefore one bit occupies an area of $4F^2$. At the 45 nm technology node, the cell area is less than 0.01 $um^2$, or approximately 0.002 $um^2$ in this example.

3-Dimensional Cell Structure of Nonvolatile Cells using NV NT Devices having Vertically Oriented Diodes and Nonvolatile Nanotube Blocks as Nonvolatile NT Switches using Top and Bottom contacts to form Anode-on-NT Switches FIG. 69 illustrates cross section 6900 including cells C00 and C10 in a 3-D memory embodiment. Nanotube layers are deposited by coating, spraying, or other means on a planar contact surface above previously defined diode-forming layers as illustrated in FIG. 40 shown further above. Cross section 6900 illustrated in FIG. 69 correspond to structure 4000 illustrated in FIG. 40, with some additional detail associated with an anode-on-NT implementation and element numbers to facilitate description of methods of fabrication. Trench etching after the deposition of insulator, semiconductor, conductor, and nanotube layers form sidewall boundaries that define nonvolatile nanotube block-based nonvolatile nanotube diode 3-D memory cells and define nonvolatile nanotube block dimensions, diode dimensions, and the dimensions of all other structures in the three dimensional nonvolatile storage cells. The horizontal 3-D cell dimensions (X and Y approximately orthogonal directions) of all cell structures are formed by trench etching and are therefore self-aligned as fabricated. The vertical dimension (Z) is determined by the thickness and number of vertical layers used to form the 3-D cell. FIG. 69 illustrates cross section 6900 along a bit line (Y) direction. Stacked series-connected vertically-oriented steering diodes and nonvolatile nanotube block switches are symmetrical and have approximately the same cross sections in both X and Y directions. Cross section 6900 illustrates array cells in which the steering diode is connected to the bottom (lower level) contact of the nonvolatile nanotube block in an anode-on-NT configuration. Word lines are oriented along the X axis and bit lines along the Y axis as illustrated in perspective in FIG. 33A.

In some embodiments, methods 3010 described further above with respect to FIG. 30A are used to define support circuits and interconnections 6901.

Next, methods 3030 illustrated in FIG. 30B deposit and planarize insulator 6903. Interconnect means through planar insulator 6903 (not shown in cross section 6900 but shown above with respect to cross section 2800" in FIG. 28C) may be used to connect metal array lines in 3-D arrays to corresponding support circuits and interconnections 6901. By way of example, word line drivers in word line driver 2930 may be connected to word lines WL0 and WL1 in array 2910 of memory 2900 illustrated in FIG. 29A described further above, and in cross section 6900 illustrated in FIG. 69. At this point in the fabrication process, methods 3040 may be used to form a memory array on the surface of insulator 6903, interconnected with memory array support structure 6905 illustrated in FIG. 69. Memory array support structure 6905 corresponds to memory array support structure 3605 illustrated in FIG. 51, and support circuits and interconnections 6901 correspond to support circuits and interconnections 3601, and insulator 6903 corresponds to insulator 3603 except for some changes to accommodate a new memory array structure for 3-D memory cells that include nonvolatile nanotube blocks with top (upper level) and bottom (lower level) contacts.

In some embodiments, methods 3040 illustrated in FIG. 30B deposit and planarize metal, polysilicon, insulator, and nanotube element layers to form nonvolatile nanotube diodes which, in this example, include multiple vertically oriented diode and nonvolatile nanotube block (NV NT block) switch anode-on-NT series pairs. Individual cell boundaries are formed in a single etch step, each cell having a single NV NT Diode defined by a single trench etch step after layers, except the BL0 layer, have been deposited and planarized, in order to eliminate accumulation of individual layer alignment tolerances that would substantially increase cell area. Individual cell dimensions in the X direction are F (1 minimum feature) as illustrated in FIG. 40 and corresponding FIG. 67, and also F in the Y direction as illustrated in FIG. 69 which is approximately orthogonal to the X direction, with a periodicity in X and Y directions of 2F. Hence, each cell occupies an area of approximately $4F^2$.

NV NT blocks with top (upper level) and bottom (lower level) contacts, illustrated further above in FIG. 69 by nanotube elements 4050-1 and 4050-2, are further illustrated in perspective drawings in FIG. 57 further above. NV NT block device structures and electrical ON/OFF switching results are described with respect to FIGS. 64 and 65 further above. Methods of fabrication of NV NT blocks with top and bottom contacts are described with respect to methods 6600A, 6600B, and 6600C illustrated in FIGS. 66A, 66B, and 66C, respectively. NV NT blocks with top and bottom contacts have channel lengths $L_{SW-CH}$ approximately equal to the separation between top and bottom contacts, 35 nm for example as described further above with respect to FIGS. 64A-64C. A NV NT block switch cross section X by Y may be formed with X=Y=F, where F is a minimum technology node dimension. For a 35 nm technology node, a NV NT block may have dimensions of 35×35×35 nm; for a 22 nm technology node, a NV NT block may have dimensions of 22×22×35 nm, for example. The thickness of the nanotube element need not be related in any particular way to F.

Methods fill trenches with an insulator; and then methods planarize the surface. Then, methods deposit and pattern bit lines on the planarized surface.

The fabrication of vertically-oriented 3D cells illustrated in FIG. 69 proceeds as follows. In some embodiments, methods deposit a word line wiring layer on the surface of insulator 6903 having a thickness of 50 to 500 nm, for example. Fabrication of the vertically-oriented diode portion of structure 6900 is the same as in FIG. 36A described further above. In some embodiments, methods etch the word line wiring layer and define individual word lines such as word line conductors 6910-1 (WL0) and 6910-2 (WL1). Word lines such as WL0 and WL1 are used as array wiring conductors and may also be used as near-ohmic contacts to N+poly cathode terminals of Schottky diodes.

Examples of contact and conductors materials include elemental metals such as Al, Au, W, Ta, Cu, Mo, Pd, Pt, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

Next, methods form N+ polysilicon regions 6920-1 and 6920-2 to contact word line regions 6910-1 and 6920-2, respectively. N+ polysilicon is typically doped with arsenic or phosphorous to $10^{20}$ dopant atoms/$cm^3$, for example, and has a thickness of 20 to 400 nm, for example.

Next, N polysilicon regions 6925-1 and 6925-2 are formed to contact N+ polysilicon regions 6920-1 and 6920-2, respectively, and may be doped with arsenic or phosphorus in the range of $10^{14}$ to $10^{17}$ dopant atoms/$cm^3$ for example, and may have a thickness range of 20 nm to 400 nm, for example. N polysilicon regions 6925-1 and 6925-2 form the cathode regions of corresponding Schottky diodes. N and N+ polysilicon region dimensions are defined by trench etching near the end of the process flow.

Next, methods form contact regions 6930-1 and 6930-2 on N polysilicon regions 6925-1 and 6925-2, respectively. Contact regions 6930-1 and 6930-2 form anode regions that complete the formation of vertically oriented steering diode structures. Contact regions 6930-1 and 6930-2 also form bottom (lower level) contacts for NV NT blocks 4050-1 and 4050-2, respectively. Fabrication of the vertically-oriented diode portion of structure 6900 is similar to methods of fabrication described with respect to FIG. 36A further above. While FIG. 69 illustrates an anode-on-NT type NV NT diode formed with Schottky diodes, PN or PIN diodes may be sued instead of Schottky diodes as described further above with respect to FIG. 36A'

In some cases conductors such as Al, Au, W, Cu, Mo, Ti, and others may be used as both NV NT block contacts and anodes for Schottky diodes. However, in other cases, optimizing anode material for lower forward voltage drop and lower diode leakage is advantageous. In such an example (not shown) a sandwich may be formed with Schottky diode anode material in contact with N polysilicon regions and NV NT block contact material forming bottom (lower regions) contacts. Such anode materials may include Al, Ag, Au, Ca, Co, Cr, Cu, Fe, Ir, Mg, Mo, Na, Ni, Os, Pb, Pd, Pt, Rb, Ru, Ta, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002, pp. 31-41, the entire contents of which are incorporated herein by reference. Examples of NV NT block contact and materials, also in contact with anode materials, include elemental metals such as Al, Au, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$.

Next, methods form NV NT block 4050-1 and 4050-2 on the surface of contact regions 6930-1 and 6930-2, respectively, having the nanotube element length $L_{SW-CH}$ of the NV NT blocks defined by the nanotube thickness in the vertical Z direction and X-Y cross section defined by trench etching near the end of the process flow. Note that NV NT block 4050-1 in FIG. 69 corresponds to nanotube element 4050 in FIG. 40. In order to maximize the density of cells C00 and C10, NV NT blocks 4050-1 and 4050-2 illustrated in FIG. 69 include simple top and bottom contacts within trench-defined cell boundaries.

Next, methods form top (upper level) contacts 4065-1 and 4065-2 on the top surfaces of NV NT blocks 4050-1 and 4050-2, respectively, with X and Y dimensions defined by trench etching near the end of the process flow.

Next, methods form (etch) trench openings 6975, 6975A, and 6975B of width F thereby forming inner and outer sidewalls of cells C00 and C10 and corresponding top (upper level) and bottom (lower level) contacts, nanotube elements, and insulators. Bottom (lower level) contacts 6930-1 and 6930-2 form an electrical connection between NV NT blocks 4050-1 and 4050-2, respectively, and also form underlying steering diode anode terminals, and form word lines 6910-1 and 6910-2. Trench formation (etching) stops at the surface of insulator 6903.

Next, methods fill trench openings 6975, 6975A, and 6975B with an insulator 6960, 6960A, and 6960B such as TEOS and planarize the surface. All trenches can be formed simultaneously.

Next, methods deposit and planarize a bit line layer.

Next, methods pattern bit line 6970.

Nonvolatile nanotube diodes forming cells C00 and C10 correspond to nonvolatile nanotube diode 1300 schematic in FIG. 13, also illustrated schematically by NV NT diode 6980 in FIG. 69, one in each of cells C00 and C10. Cells C00 and C10 illustrated in cross section 6900 in FIG. 69 correspond to corresponding cells C00 and C10 shown schematically in memory array 2910 in FIG. 29A, and word lines WL0 and WL1 and bit line BL0 correspond to array lines illustrated schematically in memory array 2910.

At this point in the process, corresponding structures in the X direction are formed to complete NV NT diode-based cell structures. FIG. 70 illustrates cross section 7000 along word line WL0 along word line (X axis) direction. Stacked series-connected vertically-oriented steering diodes and nonvolatile nanotube block switches are symmetrical and have approximately the same cross sections in both X and Y directions. Cross section 7000 illustrates array cells in which the steering diode is connected to the bottom (lower level) contact of the nonvolatile nanotube block in an anode-on-NT configuration. Word lines are oriented along the X axis and bit lines along the Y axis as illustrated in perspective in FIG. 33A.

Cross section 7000 illustrated in FIG. 70 illustrates support circuits and interconnections 6901 and insulator 6903 as described further above with respect to FIG. 69. Cross section 7000 is in the X direction along word line 6910-1 (WL0). Methods described above with reference to FIG. 69 form (etch) trench openings 7075, 7075A, and 7075B of width F thereby forming inner and outer sidewalls of cells C00 and C10 and corresponding top (upper level) and bottom (lower level) contacts, nanotube elements, and insulators. The trench openings are subsequently filled with insulator regions 7060, 7060A, and 7060B.

N+ polysilicon regions 6920-1' and 6920-1" form contacts between word line 6910-1 (WL0) and N polysilicon regions 6925-1' and 6925-1", respectively, that form diode cathode regions. Bottom (lower level) contacts 6930-1' and 6930-1" act as anodes to form Schottky diodes with N polysilicon regions 6925-1' and 6925-1", respectively, as well as contacts to nonvolatile nanotube blocks 4050-1' and 4050-1", respectively, as illustrated in cross section 7000 illustrated in FIG. 70.

NV NT block 4050-1' and 4050-1" on the surface of contact regions 6930-1' and 6930-1", respectively, have nanotube element length $L_{SW-CH}$ of the NV NT blocks defined by the nanotube thickness in the vertical Z direction and X-Y cross section defined by trench etching near the end of the fabrication process. Note that NV NT block 4050-1' in FIG. 70 corresponds to NV NT block 4050-1 illustrated in FIG. 69. In order to maximize the density of cells C00 and C01 illustrated in FIG. 70, NV NT blocks 4050-1' and 4050-1" include simple top and bottom contacts within trench-defined cell boundaries Contacts to the top surfaces of NV NT tubes are illustrated in FIG. 70 by top (upper level) contacts 4065-1' and 4065-1" on the top surfaces of NV NT blocks 4050-1' and 4050-1", respectively.

Bit lines 6970-1 (BL0) and 6970-2 are in direct contact with top (upper level) contacts 4065-1' and 4065-1", respectively, as illustrated in FIG. 70.

Next, methods 3050 illustrated in FIG. 30A complete fabrication of semiconductor chips with nonvolatile memory arrays using nonvolatile nanotube diode cell structures including passivation and package interconnect means using known industry methods.

Corresponding cross sections 6900 and 7000 illustrated in FIGS. 69 and 70, respectively, show an anode-to-NT 3D memory array with nonvolatile nanotube block-based switches. Nanotube channel length $L_{SW-CH}$ corresponds to NV NT diode cell dimensions in the Z direction, with X-Y cross sections with X=Y=F, as well as corresponding bit and word array lines. Cross section 6900 is a cross section of two adjacent anode-to-nanotube type nonvolatile nanotube diode-based cells in the Y direction that includes a NV NT block-based switch, and cross section 7000 is a cross section of two adjacent anode-to-nanotube type nonvolatile nanotube diode-based cells in the X direction that includes a NV NT block-based switch. Cross sections 6900 and 7000 include corresponding word line and bit line array lines. The nonvolatile nanotube diodes form the steering and storage elements in each cell illustrated in cross sections 6900 and 7000, and each cell has 1F by 1F dimensions. The spacing between adjacent cells is 1F so the cell periodicity is 2F in both the X and Y directions. Therefore one bit occupies an area of $4F^2$. At the 45 nm technology node, the cell area is less than about 0.01 $\mu m^2$, or approximately 0.002 $um^2$ in this example.

Corresponding cross sections 6900 and 7000 illustrated in FIGS. 69 and 70, respectively, methods of fabrication correspond to the methods of fabrication described with respect to FIG. 68, except that the vertical position of N polysilicon and N+ silicon layers are interchanged. NV NT block switch fabrication methods of fabrication are the same. The only difference is that the N polysilicon layer is etched before N+ polysilicon layer when forming trenches in cross sections 6900 and 7000.

Nonvolatile Memories using NV NT Diode Device Stacks with both Shared Array Line and Non-Shared Array Line Stacks and Cathode-to-NT Switch Connections and Nonvolatile Nanotube Block with Top and Bottom Contacts forming 3-D NV NT Switches FIG. 32 illustrates a method 3200 of fabricating embodiments of the invention having two memory arrays stacked one above the other and on an insulating layer above support circuits formed below the insulating layer and stacked arrays, and with communications means through the insulating layer. While method 3200 is described further herein with respect to nonvolatile nanotube diodes 1200 and 1300, method 3200 is sufficient to cover the fabrication of many of the embodiments of nonvolatile nanotube diodes described further above. Note also that although methods 3200 are described in terms of 3D memory embodiments, methods 3200 may also be used to form 3D logic embodiments based on NV NT diodes arranged as logic arrays such as NAND and NOR arrays with logic support circuits (instead of memory support circuits) as used in PLAs, FPGAs, and PLDs, for example.

FIG. 71 illustrates a 3D perspective drawing 7100 that includes a two-high stack of three dimensional arrays, a lower array 7102 and an upper array 7104. Lower array 7102 includes nonvolatile nanotube diode cells C00, C01, C10, and C11. Upper array 7104 includes nonvolatile nanotube diode cells C02, C12, C03, and C13. Word lines WL0 and WL1, shared between upper and lower arrays, are oriented along the X direction and bit lines BL0, BL1, BL2, and BL3 are oriented along the Y direction and are approximately orthogonal to word lines WL1 and WL2. Nanotube element channel length $L_{SW-CH}$ is oriented vertically as shown in 3D perspective drawing 7100. Cross section 7200 corresponding to cells C00, C01, C02 and C03 is illustrated further below in FIG. 72A and cross section 7200' corresponding to cells C00, C02, C12, and C10 are illustrated further below in FIG. 72B.

In general, methods 3210 fabricate support circuits and interconnections in and on a semiconductor substrate. This includes NFET and PFET devices having drain, source, and gate that are interconnected to form memory (or logic) support circuits. Such structures and circuits may be formed using known techniques that are not described in this application. In some embodiments, methods 3210 are used to form a support circuits and interconnections 7201 layer as part of cross sections 7200 and 7200' illustrated in FIGS. 72A and 72B using known methods of fabrication in and on which nonvolatile nanotube diode control and circuits are fabricated. Support circuits and interconnections 7201 are similar to support circuits and interconnections 6701 illustrated in FIGS. 67 and 6901 illustrated in FIG. 69, for example, but are modified to accommodate two stacked memory arrays. Note that while two-high stacked memory arrays are illustrated in FIGS. 72A-72B, more than two-high 3D array stacks may be formed (fabricated), including but not limited to 4-high and 8 high stacks for example.

Next, methods 3210 are also used to fabricate an intermediate structure including a planarized insulator with interconnect means and nonvolatile nanotube array structures on the planarized insulator surface such as insulator 7203 illustrated in cross sections 7200 and 7200' in FIGS. 72A and 72B, respectively, and are similar to insulator 6703 illustrated in FIG. 67 and insulator 6901 illustrated in FIG. 69, but are modified to accommodate two stacked memory arrays. Interconnect means include vertically-oriented filled contacts, or studs, for interconnecting memory support circuits in and on a semiconductor substrate below the planarized insulator with nonvolatile nanotube diode arrays above and on the planarized insulator surface. Planarized insulator 7203 is formed using methods similar to methods 2730 illustrated in FIG. 27B. Interconnect means through planar insulator 7203 (not shown in cross section 7200) are similar to contact 2807 illustrated in FIG. 28C and may be used to connect array lines in first memory array 7210 and second memory array 7220 to corresponding support circuits and interconnections 7201. Support circuits and interconnections 7201 and insulator 7203 form memory array support structure 7205.

Next, methods 3220, similar to methods 2740, are used to fabricate a first memory array 7210 using diode cathode-to-nanotube switches based on a nonvolatile nanotube diode array similar to a nonvolatile nanotube diode array cross section 6700 illustrated in FIG. 67 and corresponding methods of fabrication.

Next, methods 3230 similar to methods 3040 illustrated in FIG. 30B, fabricate a second memory array 7220 on the planar surface of first memory array 7210, but using diode anode-to-nanotube switches based on a nonvolatile nanotube diode array similar to a nonvolatile nanotube diode array cross section 6900 illustrated in FIG. 69 and corresponding methods of fabrication FIG. 72A illustrates cross section 7200 including first memory array 7210 and second memory array 7220, with both arrays sharing word line 7230 in common. Word lines such as 7230 are defined (etched) during a methods trench etch that defines memory array (cells) when forming array 7220. Cross section 7200 illustrates combined first memory array 7210 and second memory array 7220 in the word line, or X direction, with shared word line 7230 (WL0), four bit lines BL0, BL1, BL2, and BL3, and corresponding cells C00, C01, C02, and C03. The array periodicity in the X direction is 2F, where F is a minimum dimension for a technology node (generation).

FIG. 72B illustrates cross section 7200' including first memory array 7210' and second memory array 7220' with both arrays sharing word lines 7230' and 7232 in common. Word line 7230' is a cross sectional view of word line 7230. Word lines such as 7230' and 7232 are defined (etched) during a methods trench etch that defines memory array (cells) when forming array 7220'. Cross section 7200' illustrates combined first memory array 7210' and second memory array 7220' in the bit line, or Y direction, with shared word lines 7230' (WL0) and 7232 (WL1), two bit lines BL0 and BL2, and corresponding cells C00, C10, C02, and C12. The array periodicity in the Y direction is 2F, where F is a minimum dimension for a technology node (generation).

The memory array cell area of 1 bit for array 7210 is $4F^2$ because of the 2F periodicity in the X and Y directions. The memory array cell area of 1 bit for array 7220 is $4F^2$ because of the 2F periodicity in the X and Y directions. Because memory arrays 7220 and 7210 are stacked, the memory array cell area per bit is $2F^2$. If four memory arrays (not shown) are stacked, then the memory array cell area per bit is $1F^2$.

Exemplary methods 3240 using industry standard fabrication techniques complete fabrication of the semiconductor chip by adding additional wiring layers as needed, and passivating the chip and adding package interconnect means.

Figure 33D:
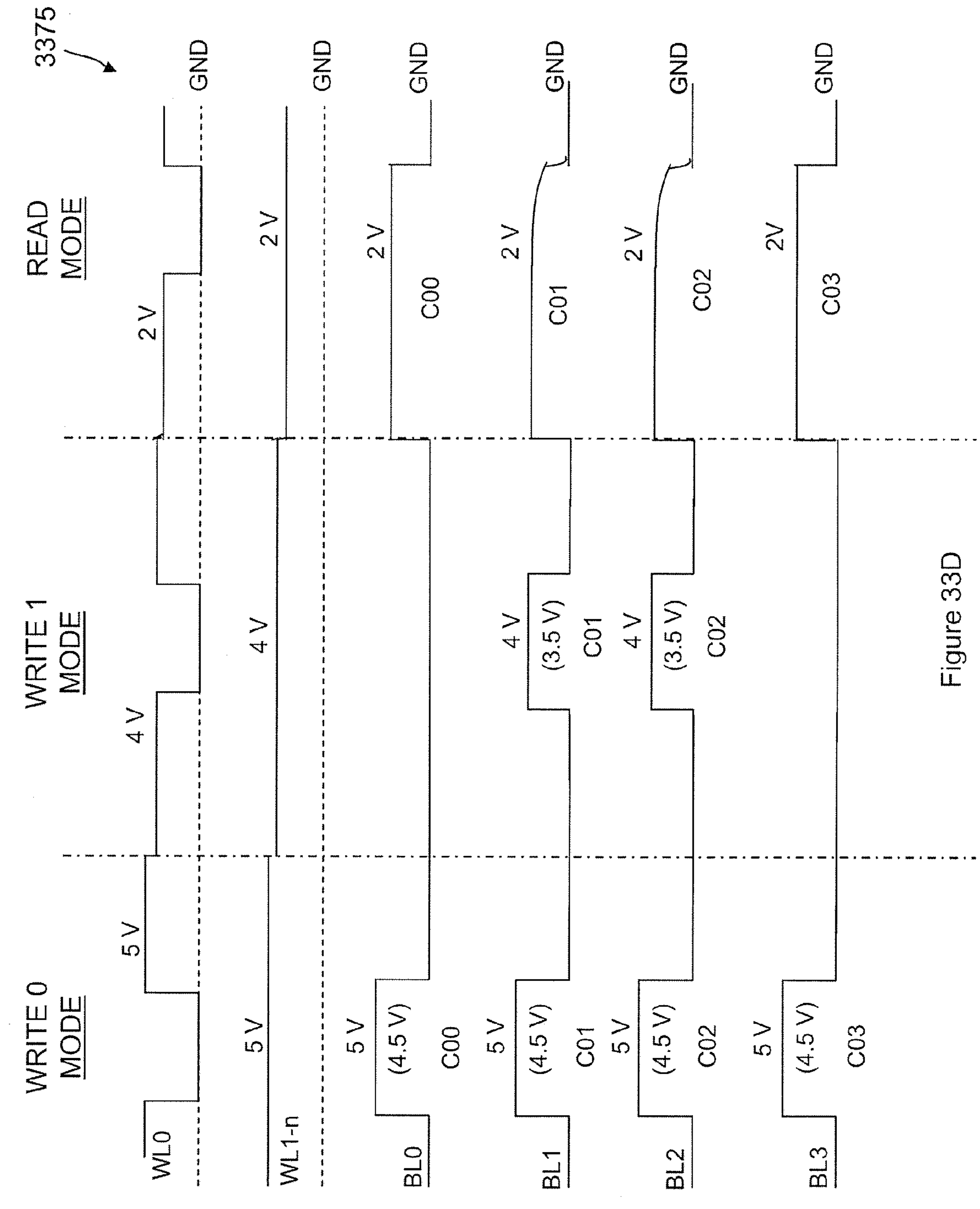
FIG. 33D illustrates operational waveforms for the memory structures illustrated in FIGS. 33A, 33B, and 33B', according to some embodiments.

In operation, memory cross section 7200 illustrated in FIG. 72A and corresponding memory cross section 7200' illustrated in FIG. 72B correspond to the operation of memory cross section 3305 illustrated in FIG. 33B and corresponding memory cross section 3305' illustrated in FIG. 33B'. Memory cross section 7200 and corresponding memory cross section 7200' operation is the same as described with respect to waveforms 3375 illustrated in FIG. 33D FIG. 71 shows a 3D perspective drawing 7100 of a 2-high stacked array with shared word lines WL0 and WL1. FIG. 72A illustrates a corresponding 2-high cross section 7200 in the X direction and FIG. 72B illustrates a corresponding 2-high cross section 7200' in the Y direction. Cells C00 and C01 in the lower array are formed using cathode-to-NT NV NT diode and cells C02 and C03 in the upper array are formed using anode-to-NT NV NT diodes. An alternative stacked array structure that does not share array wiring, such as word lines for example, is illustrated in FIGS. 73 and 74. Stacked arrays that do not share word line may use the same NV NT diode types. For example, FIGS. 73 and 74 use cathode-on-NT NV NT diodes for both upper and lower arrays. However, anode-on-NT NV NT diode cells may be used instead. If desired, stacks may continue to use a mixture of cathode-on NT and anode-on-NT NV NT diode cells. By not sharing array lines between upper and lower arrays, greater fabrication flexibility and interconnect flexibility are possible as illustrated further below with respect to FIGS. 75, 76A-76D, and 77.

FIG. 73 illustrates a 3D perspective drawing 7300 that includes a two-high stack of three dimensional arrays, a lower array 7302 and an upper array 7304, with no shared (common) array lines between upper array 7304 and lower array 7302. Word lines WL0 and WL1 oriented in the X direction and bit lines BL0 and BL1 oriented in the Y direction interconnect cells C00, C01, C10, and C11 to form array interconnections for lower array 7302. Lower array 7302 cells COO, C01, C10, and C11 are formed by cathode-on-NT NV NT diodes, however, anode-on-NT NV NT diodes may be used instead. Word lines WL2 and WL3 oriented in the X direction and bit lines BL2 and BL3 oriented in the Y direction interconnect cells C22, C32, C23, and C33 to form array interconnections for upper array 7304. Upper array 7304 cells C22, C32, C23, and C33 are formed by cathode-on-NT NV NT diodes, however, anode-on-NT NV NT diodes may be used instead. Bit lines are approximately parallel, word lines are approximately parallel, and bit lines and word lines are approximately orthogonal. Nanotube element channel length $L_{SW-CH}$ is oriented vertically as shown in 3D perspective drawing 7300. Cross section 7400 illustrated in FIG. 74 corresponding to cells C00, C01, C22, and C23 are illustrated further below in FIG. 74.

FIG. 74 illustrates cross section 7400 including first memory array 7410 that includes cells C00 and C01, bit lines BL0 and BL1, and word line WL0, and second memory array 7420 that includes cells C22 and C23, bit lines BL2 and BL3, and word line WL2. Lower array 7410 and upper array 7420 are separated by insulator and interconnect region 7440 and do not share word lines. Cross section 7400 illustrates stacked first memory array 7210 and second memory array 7220 in the word line, or X direction, with word lines WL0 and WL2, four bit lines BL0, BL1, BL2, and BL3, and corresponding cells C00, C01, C22, and C23. The array periodicity in the X direction is 2F, where F is a minimum dimension for a technology node (generation). A cross section in the Y direction corresponding to X direction cross section 7400 is not shown. However, the NV NT diode cells are symmetrical in both X and Y direction, hence the NV NT diode cells look the same. Only the orientation of bit lines and word lines change due to a rotation by 90 degrees.

The memory array cell area of 1 bit for array 7410 is $4F^2$ because of the 2F periodicity in the X and Y directions. The memory array cell area of 1 bit for array 7420 is $4F^2$ because of the 2F periodicity in the X and Y directions. Because memory arrays 7420 and 7410 are stacked, the memory array cell area per bit is $2F^2$. If four memory arrays (not shown) are stacked, then the memory array cell area per bit is $1F^2$.

Figure 75:
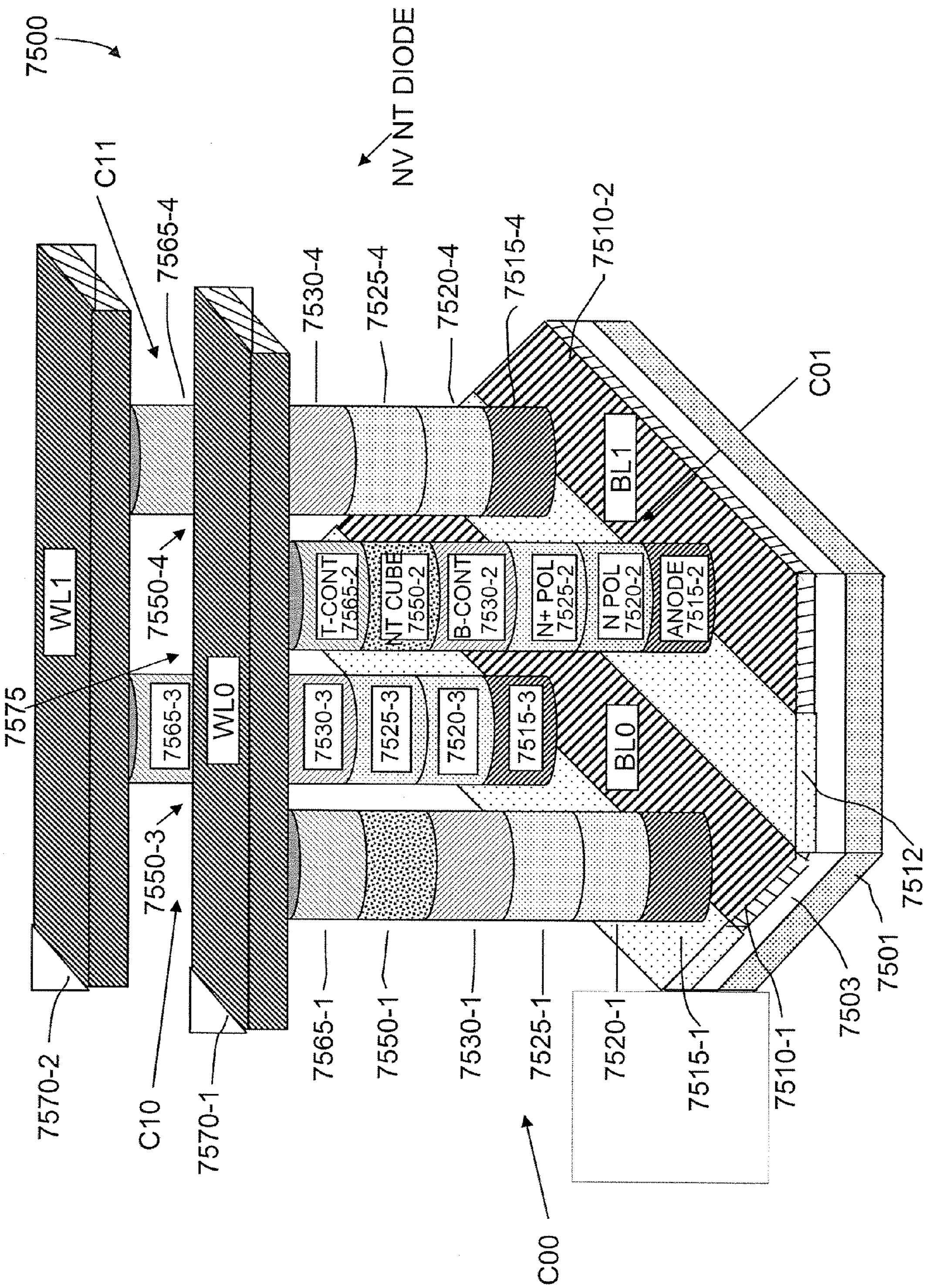
FIG. 75 illustrates a 3-D perspective of an embodiment of a nonvolatile memory array including four 3-D nonvolatile memory cells, with each cell including a 3-D nonvolatile nanotube diode including a nonvolatile nanotube block-based switch, and cell interconnections formed by bit lines and word lines.

An Alternative Simplified 3-Dimensional Cell Structure of Nonvolatile Cells using NV NT Devices having Vertically Oriented Diodes and Nonvolatile Nanotube Blocks as Nonvolatile NT Switches using Top and Bottom contacts to form Cathode-on-NT Switches FIG. 75 illustrates a 3-D perspective of nonvolatile memory array 7500 including four 3-D nonvolatile memory cells C00, C01, C10, and C11, with each cell including a 3-D nonvolatile nanotube diode, and cell interconnections formed by bit lines BL0 and BL1 and word lines WL0 and WL1. Nonvolatile memory array 7500 illustrated in FIG. 75 corresponds to cross section 4000 illustrated in FIG. 40, cross section 6700 illustrated in FIG. 67, and cross sections 6875 and 6890 illustrated in FIG. 68F and FIG. 68I, respectively, shown further above. The 3-D NV NT diode dimensions used to form cells in cross sections 6700, 6875, and 6890 are defined in two masking steps. First methods of masking define trench boundaries used to form cell boundaries using directional methods of trench etching. In some embodiments, methods of fabrication described further above with respect to FIGS. 68A-681 form cell boundaries in the X direction, fill trenches with insulation, and planarize the surface. Then, second methods of masking define trenches and then methods of fabrication described further above with respect to FIG. 68A-681 form cell boundaries in the Y direction, fill trenches with insulation, and planarize the surface. Cell boundaries in the X and Y directions are approximately orthogonal.

A memory block structure with top (upper level) and bottom (lower level) contacts illustrated in FIGS. 40, 67, and 68A-681 is symmetrical in the X and Y directions. 3-D memory arrays formed with NV NT blocks with top (upper level) and bottom (lower level) contacts enable 3-D symmetric cells, which may be leveraged to enable simplified methods of fabrication to pattern and simultaneously fabricate memory arrays of 3-D NV NT diodes. X and Y direction dimensions may be defined simultaneously, selective directional etching may be used to simultaneously define 3-D NV NT diode cells, then fill the opening with insulation and planarize the surface. So, for example, methods of fabrication that correspond to methods of fabrication described with respect to structures illustrated in FIG. 68D also simultaneously form the structures illustrated in FIG. 68H. Such simplified methods of fabrication facilitate multi-level array stacking because each level is fabricated with less processing steps. In this example, X=Y=F, where F is a minimum technology dimension for a chosen technology node. For example, for F=45 nm technology nodes, X=Y=45 nm. The array mask design illustrated further below with respect to 76C illustrates a plan view of FxF shapes as drawn, with each FxF shape stepped in X and Y direction by a distance F. During the process of exposing a mask layer image on the surface of the chip, rounding of corners typically takes place at minimum technology node dimensions F, and the masking layer images approximate circles of diameter F as illustrated in a plan view illustrated further below in FIG. 76D. Because of the rounding effects, 3-D NV NT diodes forming the cells of memory array 7500 will be approximately cylindrical in shape as illustrated in FIG. 75. Memory array 7500 illustrated in FIG. 75 uses cathode-on-NT type of 3-D NV NT diodes. However, anode-on-NT type of 3-D NV NT diodes such as those illustrated in FIGS. 69 and 70 may be formed instead.

Figure 76A:
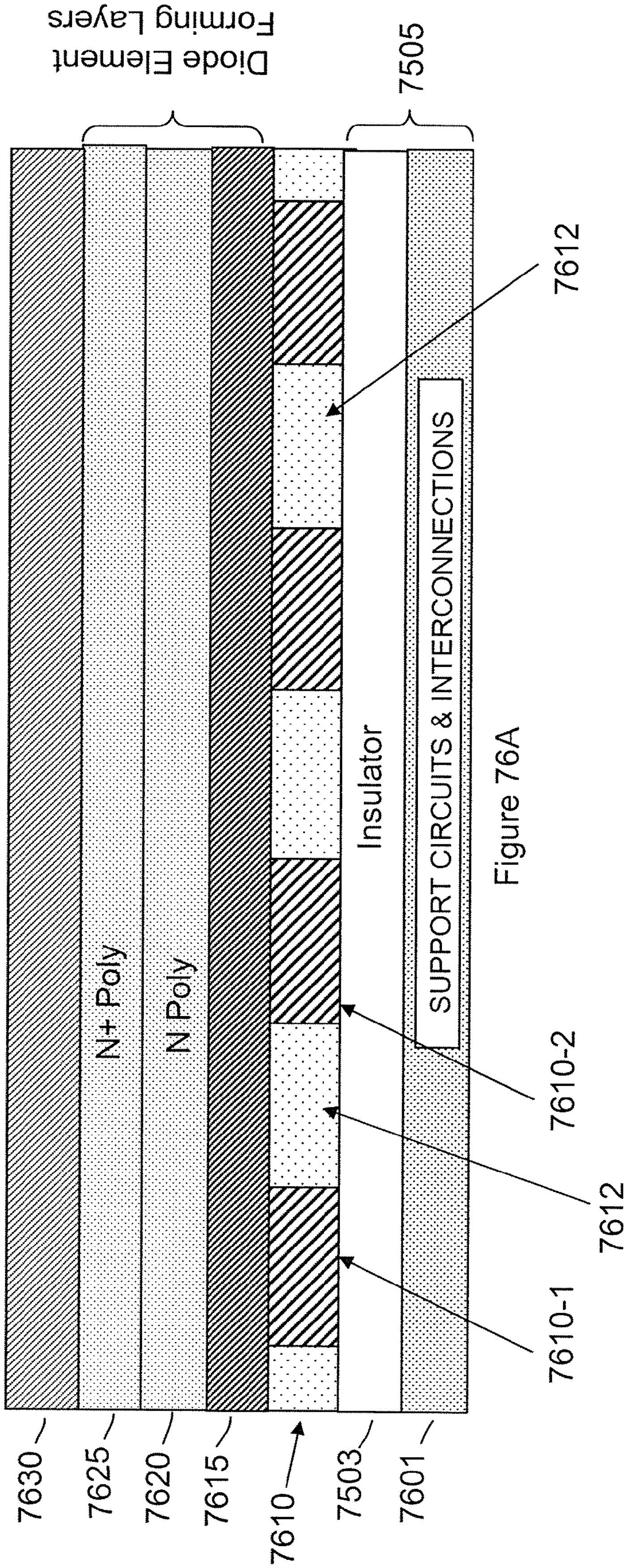
FIGS. 76A-76D illustrate methods of fabrication of a cathode-on-nanotube memory cross sectional structure with nonvolatile nanotube diodes that include nonvolatile nanotube block-based switches within vertical cell boundaries, such as those illustrated in FIG. 75, according to some embodiments.

Nonvolatile memory array methods of fabrication correspond to methods of fabrication described further above with respect to FIGS. 68A-68I. However, bit line dimensions are defined prior to 3-D NV NT diode cell formation since bit lines are no longer defined by an etch step process at the same time as the definition of cell boundaries, and FIG. 68A is modified as illustrated in FIG. 76A. Also, mask 6850 dimensions illustrated in FIG. 68C had only the X direction equal to F. However, the Y direction was as long as the memory array or memory sub-array used to form the memory array. Simplified methods of fabrication illustrated further below with respect to FIGS. 76C and 76D illustrate a mask having the same in X and Y directions. In some embodiments, methods of fabrication corresponding to methods of fabrication described with respect to FIGS. 68D, 68E, and 68F may be used to complete fabrication of the memory array 7500 structure.

Defining bit lines BL0 and BL1 prior to 3-D NV NT diode formation requires that masks be aligned to pre-defined bit lines BL0 and BL1. Using semiconductor industry methods, alignment may be achieved within a range of approximately +−F/3. So, for example, for F=45 nm node, the alignment will be within +−15 nm and bit lines BL0 and BL1 are therefore in contact with most of the anode area of 3-D NV NT diodes memory cells as illustrated further below with respect to FIG. 76B.

Support circuits and interconnections 7501 illustrated in nonvolatile memory array 7500 illustrated in FIG. 75 corresponds to support circuits and interconnections 6701 shown in cross section 6700 illustrated in FIG. 67.

Planarized insulator 7503 illustrated in FIG. 75 corresponds to planarized insulator 6703 illustrated in FIG. 67. Interconnect means through planar insulator 7503 (not shown in cross section 7500 but shown above with respect to cross section 2800" in FIG. 28C) may be used to connect metal array lines in 3-D arrays to corresponding support circuits and interconnections 7501. By way of example, bit line drivers in BL driver and sense circuits 2640 may be connected to bit lines BL0 and BL1 in array 2610 of memory 2600 illustrated in FIG. 26A described further above, and in nonvolatile memory array 7500 illustrated in FIG. 75.

Bit lines 7510-1 (BL0) and 7510-2 (BL1) are patterned as described further below with respect to FIG. 76A. Cells C00, C01, C10, and C11 are formed by corresponding 3-D NV NT diodes that include NV NT blocks with top (upper level) and bottom (lower level) contacts as described further below with respect to FIGS. 76A-76D.

Cell C00 includes a corresponding 3-D NV NT diode formed by a steering diode with a cathode-to-NT series connection to a bottom (lower level) contact of a NV NT block. Anode 7515-1 is in contact with bit line 7510-1 (BL0), and the top (upper level) contact 7565-1 of NV NT block 7550-1 is in contact with word line 7570-1 (WL0). The NV NT diode corresponding to cell C00 includes anode 7515-1 in contact with bit line 7510-1 (BL0), and also in contact with N polysilicon region 7520-1. N polysilicon region 7520-1 is in contact with N+ polysilicon region 7525-1. Anode 7515-1, N polysilicon region 7520-1, and N+ polysilicon region 7525-1 form a Schottky-type of steering diode. Note that PN or PIN diodes (not shown) may be used instead. N+ polysilicon region 7525-1 is in contact with bottom (lower level) contact 7530-1, which also forms the bottom (lower level) contact of NV NT block 7550-1. NV NT block 7550-1 is also in contact with top (upper level) contact 7565-1, which is in turn in contact with word line 7570-1 (WL0). NV NT block 7550-1 channel length $L_{SW-CH}$ is vertically oriented and is approximately equal to the distance between top (upper level) contact 7565-1 and bottom (lower level) contact 7530-1, which may be defined by the thickness of the NV NT block.

Cell C01 includes a corresponding 3-D NV NT diode formed by a steering diode with a cathode-to-NT series connection to a bottom (lower level) contact of a NV NT block. Anode 7515-2 is in contact with bit line 7510-2 (BL1), and the top (upper level) contact 7565-2 of NV NT block 7550-2 is in contact with word line 7570-1 (WL0). The NV NT diode corresponding to cell C01 includes anode 7515-2 in contact with bit line 7510-2 (BL1), and also in contact with N polysilicon region 7520-2. N polysilicon region 7520-2 is in contact with N+ polysilicon region 7525-2. Anode 7515-2, N polysilicon region 7520-2, and N+ polysilicon region 7525-2 form a Schottky-type of steering diode. Note that PN or PIN diodes (not shown) may be used instead. N+ polysilicon region 7525-2 is in contact with bottom (lower level) contact 7530-2, which also forms the bottom (lower level) contact of NV NT block 7550-2. NV NT block 7550-2 is also in contact with top (upper level) contact 7565-2, which is in turn in contact with word line 7570-1 (WL0). NV NT block 7550-2 channel length $L_{SW-CH}$ is vertically oriented and is approximately equal to the distance between top (upper level) contact

7565-2 and bottom (lower level) contact 7530-2, and may be defined by the thickness of the NV NT block.

Cell C10 includes a corresponding 3-D NV NT diode formed by a steering diode with a cathode-to-NT series connection to a bottom (lower level) contact of a NV NT block. Anode 7515-3 is in contact with bit line 7510-1 (BL0), and the top (upper level) contact 7565-3 of NV NT block 7550-3 (not visible behind word line 7570-1) is in contact with word line 7570-2 (WL1). The NV NT diode corresponding to cell C10 includes anode 7515-3 in contact with bit line 7510-1 (BL0), and also in contact with N polysilicon region 7520-3. N polysilicon region 7520-3 is in contact with N+ polysilicon region 7525-3. Anode 7515-3, N polysilicon region 7520-3, and N+ polysilicon region 7525-3 form a Schottky-type of steering diode. Note that PN or PIN diodes (not shown) may be used instead. N+ polysilicon region 7525-3 is in contact with bottom (lower level) contact 7530-3, which also forms the bottom (lower level) contact of NV NT block 7550-3. NV NT block 7550-3 is also in contact with top (upper level) contact 7565-3, which is in turn in contact with word line 7570-2 (WL1). NV NT block 7550-3 channel length $L_{SW-CH}$ is vertically oriented and is approximately equal to the distance between top (upper level) contact 7565-3 and bottom (lower level) contact 7530-3, and may be defined by the thickness of NV NT block.

Cell C11 includes a corresponding 3-D NV NT diode formed by a steering diode with a cathode-to-NT series connection to a bottom (lower level) contact of a NV NT block. Anode 7515-4 is in contact with bit line 7510-2 (BL1), and the top (upper level) contact 7565-4 of NV NT block 7550-4 (not visible behind word line 7570-1) is in contact with word line 7570-2 (WL1). The NV NT diode corresponding to cell C11 includes anode 7515-4 in contact with bit line 7510-2 (BL1), and also in contact with N polysilicon region 7520-4. N polysilicon region 7520-4 is in contact with N+ polysilicon region 7525-4. Anode 7515-4, N polysilicon region 7520-4, and N+ polysilicon region 7525-4 form a Schottky-type of steering diode. Note that PN or PIN diodes (not shown) may be used instead. N+ polysilicon region 7525-4 is in contact with bottom (lower level) contact 7530-4, which also forms the bottom (lower level) contact of NV NT block 7550-4. NV NT block 7550-4 is also in contact with top (upper level) contact 7565-4, which is in turn in contact with word line 7570-2 (WL1). NV NT block 7550-4 channel length $L_{SW-CH}$ is vertically oriented and is approximately equal to the distance between top (upper level) contact 7565-4 and bottom (lower level) contact 7530-4, and may be defined by the thickness of the NV NT block. The opening 7575 between 3-D NV NT diode-based cells C00, C01, C10, and C11 is filled with in an insulator such as TEOS (not shown).

Nonvolatile nanotube diodes forming cells C00, C01, C10, and C11 correspond to nonvolatile nanotube diode 1200 schematic in FIG. 12. Cells C00 C01, C10, and C11 illustrated in nonvolatile memory array 7500 in FIG. 75 correspond to corresponding cells C00, C01, C10, and C11 shown schematically in memory array 2610 in FIG. 26A, and bit lines BL0 and BL1 and word lines WL0 and WL1 correspond to array lines illustrated schematically in memory array 2610.

An Alternative Simplified Methods of Fabricating 3-Dimensional Cell Structure of Nonvolatile Cells using NV NT Devices having Vertically Oriented Diodes and Nonvolatile Nanotube Blocks as Nonvolatile NT Switches Using Top and Bottom Contacts to form Cathode-on-NT Switches In some embodiments, methods 2710 illustrated in FIG. 27A are used to define support circuits and interconnects similar to those described with respect to memory 2600 illustrated in FIG. 26A as described further above. Exemplary methods 2710 apply known semiconductor industry techniques design and fabrication techniques to fabricated support circuits and interconnections 7601 in and on a semiconductor substrate as illustrated in FIG. 76A. Support circuits and interconnections 7601 include FET devices in a semiconductor substrate and interconnections such as vias and wiring above a semiconductor substrate. FIG. 76A corresponds to FIG. 34A illustrating a Schottky diode structure, including an optional conductive Schottky anode contact layer 3415 shown in FIG. 34A and shown in FIG. 76A as anode contact layer 7615. Note that FIG. 34A' may be used instead of FIG. 34A' as a starting point if a PN diode structure is desired. If N polysilicon layer 3417 in FIG. 34A' were replaced with an intrinsically doped polysilicon layer instead (not shown), then a PIN diode would be formed instead of a PN diode. Therefore, while the structure illustrated in FIG. 76A illustrates a Schottky diode structure, the structure may also be fabricated using either a PN diode or a PIN diode.

Methods of fabrication for elements and structures for support circuits and interconnections 7601 and insulator 7603 forming memory array support structure 7605 correspond to methods of fabrication described further above with respect to FIGS. 34A and 34B, where support circuits and interconnections 7601 correspond to support circuits and interconnections 3401; insulator 7603 corresponds to insulator 3403. Methods of fabrication for elements and structures for support circuits and interconnections 7601 and insulator 7603 forming memory array support structure 7605 also corresponds to support circuits and interconnections 6801 and insulator 7603 corresponds to insulator 6803 as illustrated in FIG. 68A, and also correspond to support circuits and interconnections 7501 and insulator 7503, respectively, in FIG. 75.

At this point in the process, methods of fabrication pattern conductor layer 7610 to form bit lines 7610-1 and bit lines 7610-2 and other bit lines separated by insulating regions 7612, as illustrated in FIG. 76A. Bit lines 7610-1 and 7610-2 correspond to bit lines 7510-1 (BL0) and 7510-2 (BL1), respectively, illustrated in FIG. 75. Insulating regions 7612 correspond to insulating regions 7512 illustrated in FIG. 75. In some embodiments, methods form a masking layer (not shown) using masking methods known in the semiconductor industry. Next, methods such as directional etch define bit lines 7610-1 and 7610-2 using methods known in the semiconductor industry. Then, methods deposit and planarize an insulating region such as TEOS forming insulating regions 7612 using methods known in the semiconductor industry.

Examples of conductor (and contact) materials include elemental metals such as Al, Au, Pt, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$.

In some cases materials such as those used in conductor layer 7610 may also be used as anodes for Schottky diodes, in which case a separate layer such as contact (anode) layer 7615 may not be required. In other cases, a separate contact (anode) layer 7615 may be used for enhanced diode characteristics. For example, contact layer 3415 illustrated in FIG. 34A, corresponding to contact (anode) layer 7615 in FIG. 76A, is used to form anodes of Schottky diodes In some embodiments, methods may deposit Schottky diode anode materials to form contact (anode) layer 7615 on conductor layer 7610 as in FIG. 76A having a thickness range of 10 to 500 nm, for example. Such anode materials may include Al, Ag, Au, Ca, Co, Cr, Cu, Fe, Ir, Mg, Mo, Na, Ni, Os, Pb, Pd, Pt, Rb, Ru, Ti, W, Ta, Zn and other elemental metals.

Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by NG, K. K. "Complete Guide to Semiconductor Devices", Second Edition, John Wiley and Sons, 2002, pp. 31-41, the entire contents of which are incorporated herein by reference.

At this point in the process, methods deposit N polysilicon layer 7620 on contact (anode) layer 7615; N+ polysilicon layer 7625 deposited on N polysilicon layer 7620; and bottom (lower level) contact layer 7630 deposited on N+ polysilicon layer 7625 as illustrated in FIG. 76A.

Exemplary methods of fabrication for N polysilicon layer 7620 illustrated in FIG. 76A are described further above with respect to corresponding N polysilicon layer 6820 illustrated in FIG. 68A and corresponding N polysilicon layer 3420 illustrated in FIG. 34A; N+ polysilicon layer 7625 corresponds to N+ polysilicon layer 6825 illustrated in FIG. 68A and N+ polysilicon layer 3425 illustrated in FIG. 34A; bottom (lower level) contact layer 7630 corresponds to bottom (lower level) contact layer 6830 illustrated in FIG. 68A and bottom (lower level) contact layer 3430 illustrated in FIG. 34B. Element 3481' is an insulator.

Figure 76B:
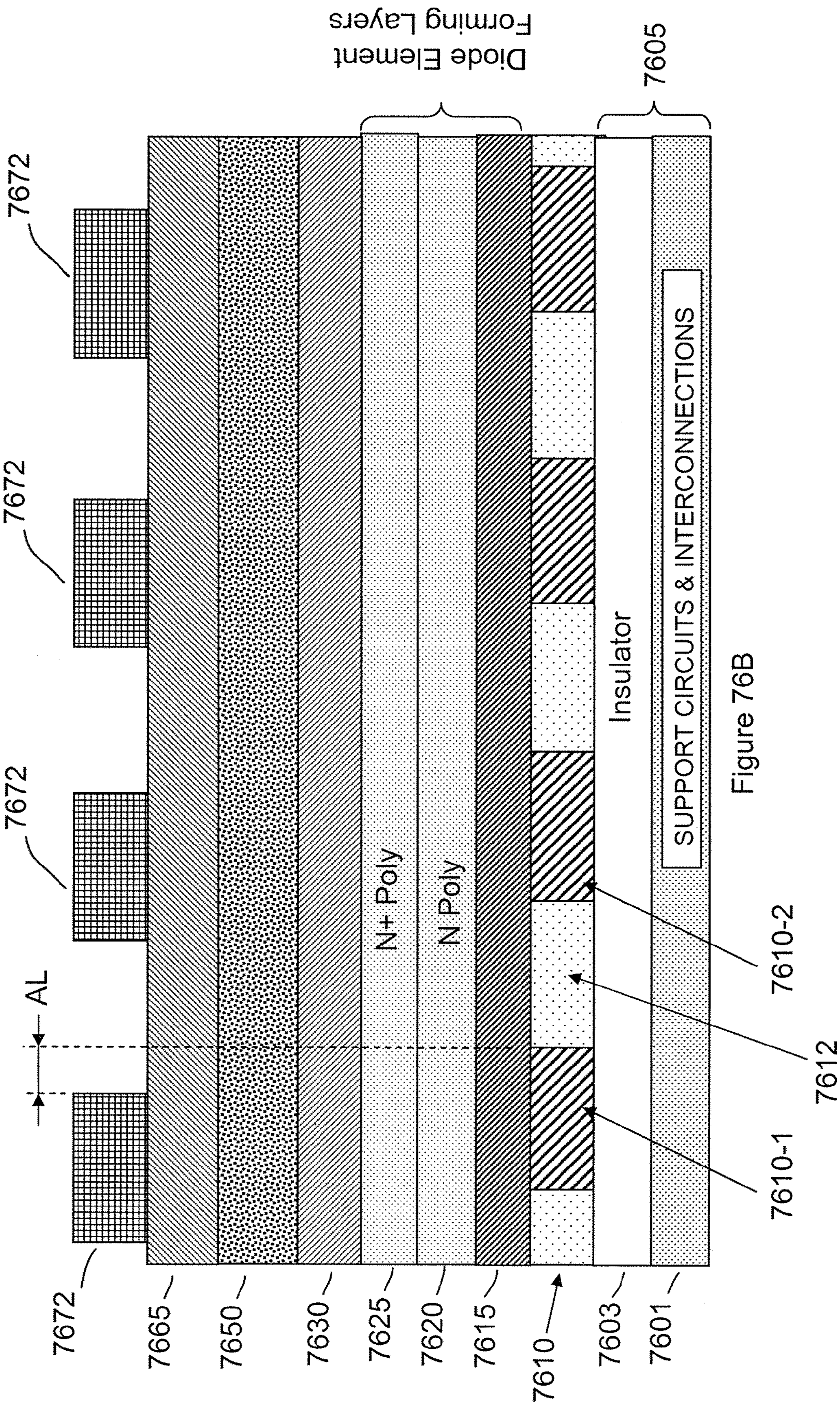
Figure 76C:
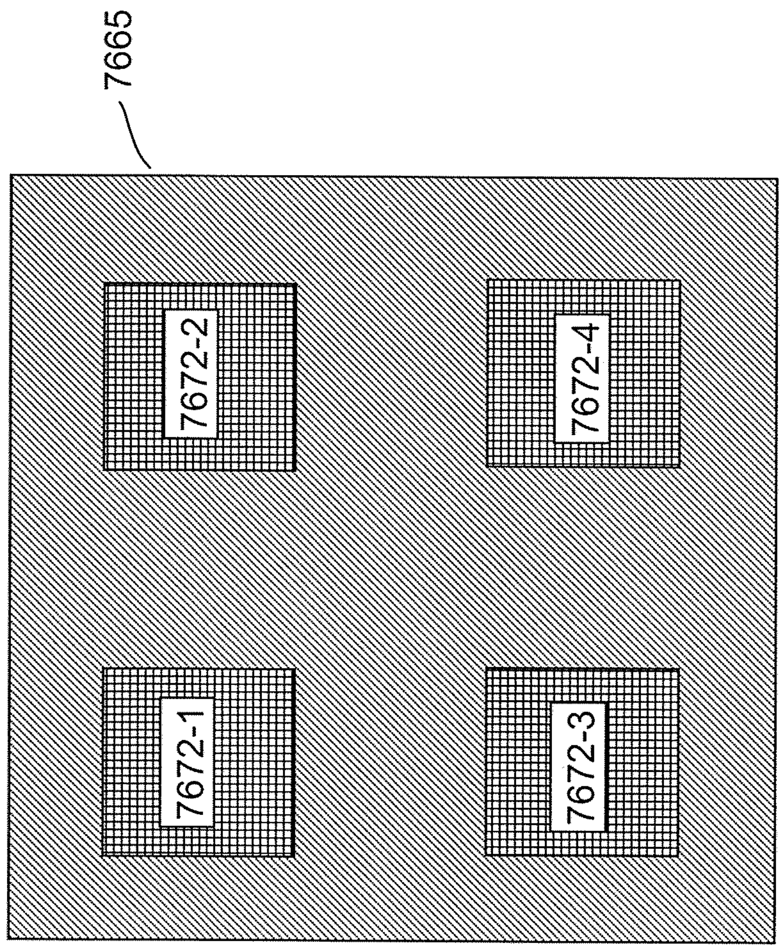
Figure 76D:
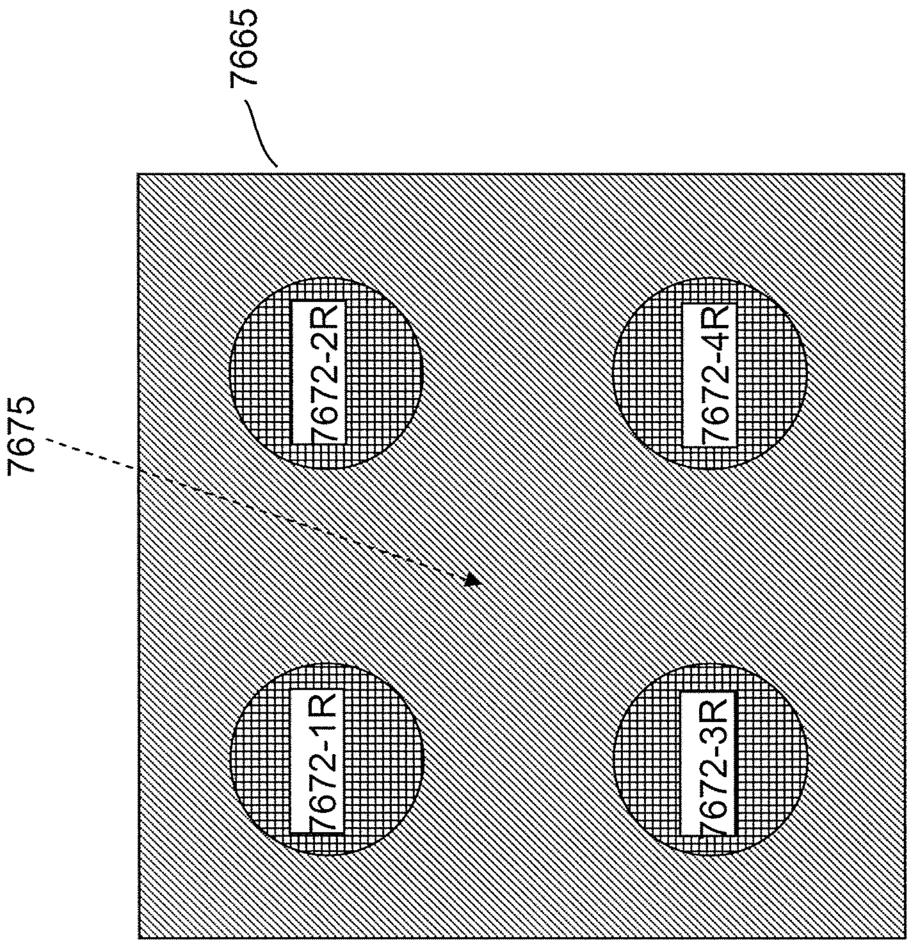

Next, methods deposit a nanotube layer 7650 on the planar surface of contact (anode) layer 7630 as illustrated in FIG. 76B using spin-on of multiple layers, spray-on, or other means. Nanotube layer 7650 may be in the range of 10-200 nm for example. Nanotube layer 7650 corresponds to nanotube layer 6835 illustrated in FIG. 68B. Exemplary devices of 35 nm thicknesses have been fabricated and switched between ON/OFF states as illustrated in FIGS. 64 and 65. Methods of fabrication of NV NT blocks with top and bottom contacts are described with respect to methods 6600A, 6600B, and 6600C illustrated FIGS. 66A, 66B, and 66C, respectively.

At this point in the fabrication process, methods deposit top (upper level) contact layer 7665 on the surface of nanotube layer 7650 as illustrated in FIG. 76B. Top (upper level) contact layer 7665 may be 10 to 500 nm in thickness, for example. Top (upper contact) layer 7665 may be formed using Al, Au, Ta, W, Cu, Mo, Pd, Pt, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$, for example. Top (upper level) contact layer 7665 corresponds to top (upper level) contact layer 6840 illustrated in FIG. 68B.

Next methods deposit and pattern a masking layer 7672 on top (upper level) contact layer 7650 as illustrated in FIG. 76B using known industry methods. Masking layer 7672 may be in the range of 10 to 500 nm thick and be formed using resist such as photoresist, e-beam resist, or conductor, semiconductor, or insulator materials. Mask layer 7672 openings expose underlying regions for purposes of trench etching. The mask openings may be aligned to alignment marks in conductor layer 7610, methods align mask openings to an alignment accuracy AL of + or −F/3 or better using known semiconductor methods. For an F=45 nm technology node, alignment AL is equal to or better than + or −15 nm with respect to a bit line edge, such as the edge of bit line 7610-1 illustrated in FIG. 76B for example. In order to achieve reduced cell dimensions, mask layer 7672 openings can be arranged to be approximately equal to the minimum allowed technology dimension F. F may be 90 nm, 65 nm, 45 nm, 35 nm, 25 nm, 12 nm, or sub-10 nm for example.

FIG. 76C illustrates a plan view of masking layer 7672 with as-drawn shapes on top (upper level) contact layer 7665. Each mask pattern 7672-1, 7672-2, 7672-3, and 7672-4 shape is approximately F×F as-drawn, and all shapes are separated from each other by a distance F.

FIG. 76D illustrates the effects of corner rounding when methods pattern masking regions on the surface of top (upper level) contact layer 7665 at technology node minimum dimensions F using known semiconductor industry methods. As-drawn shape 7672-1 becomes as-patterned approximately circular shape 7672-1R of diameter approximately F; as-drawn shape 7672-2 becomes as-patterned approximately circular shape 7672-2R of diameter approximately F; as-drawn shape 7672-3 becomes as-patterned approximately circular shape 7672-3R of diameter approximately F; and as-drawn shape 7672-4 becomes as-patterned approximately circular shape 7672-4R of diameter approximately F.

At this point in the process, methods selectively directionally etch exposed regions between mask shapes 7672-1R, 7672-2R, 7672-3R, and 7672-4R, beginning with top (upper level) contact layer 7665 ending on surface of conductor layer 7610, at the top surface of bit lines such as bit lines 7610-1 and 7610-2 thus forming opening 7675 (not shown) and simultaneously forming all surfaces (boundaries) of 3-D NV NT diodes that form cells C00, C01, C10, and C11 in FIG. 75. In some embodiments, methods fill opening 7675 (not shown) with an insulator such as TEOS and planarize the surface. Opening 7675 corresponds to opening 7575 in FIG. 75. If a rectangular (e.g., square) cross-section is desired, mask shapes 7672-1, 7672-2, 7672-3, and 7672-4 can be used instead of 7672-1R, 7672-2R, 7672-3R, and 7672-4R.

U.S. Pat. No. 5,670,803, the entire contents of which are incorporated herein by reference, to co-inventor Bertin, discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may be adapted for use to cut through multiple conductor, semiconductor, oxide, and nanotube layers as described further above with respect to trench formation in FIGS. 34A-34FF, 36A-36FF, and 68A-68I for example. In this example, selective directional trench etch (RIE) removes exposed areas of top (upper level) contact layer 7665 to form top (upper level) contacts 7565-1, 7565-2, 7565-3, and 7565-4 illustrated in FIG. 75; removes exposed areas of nanotube layer 7650 to form NV NT blocks 7550-1, 7550-2, 7550-3, and 7550-4 illustrated in FIG. 75; removes exposed areas of bottom (lower level) contact layer 7630 to form bottom (lower level) contacts 7530-1, 7530-2, 7530-3, and 7530-4 illustrated in FIG. 75; directionally etch removes exposed areas of N+ polysilicon layer 7625 to form N+ polysilicon regions 7525-1, 7525-2, 7525-3, and 7525-4 as illustrated in FIG. 75; removes exposed areas of polysilicon layer 7620 to form N polysilicon regions 7520-1, 7520-2, 7520-3, and 7520-4 as illustrated in FIG. 75. Exemplary methods of selective directional etching stops at the top surface of conductor layer 7610 and top surfaces of bit lines 7610-1 and 7610-2 as illustrated in FIGS. 76B and 75.

Exemplary methods of selectively directionally etching exposed regions between mask shapes 7672-1R, 7672-2R, 7672-3R, and 7672-4R correspond to methods of directionally etching corresponding to forming trench regions in FIG. 68D, except that etching stops at the surface of bit lines BL0 and BL1 since bit lines BL0 and BL1 have been patterned in an earlier step as illustrated in FIG. 76B.

Next methods fill trench openings 7675 and planarize with an insulator such as TEOS for example filling region 7575 (fill not shown) illustrated in FIG. 75. Exemplary methods of filling and planarizing trench openings 7675 corresponds to methods of filling as and planarizing trench openings 6860, 6860A, and 6860B as described with respect to FIG. 68E.

Next, methods deposit, planarize, and pattern (form) conductors such as word lines 7570-1 (WL0) and 7570-2 (WL1) illustrated in FIG. 75. Exemplary methods of forming word lines 7570-1 and 7570-2 correspond to methods of forming word lines WL0 and WL1 as described with respect to FIG. 68I further above.

Nonvolatile Memories using Stacks of Alternative Simplified 3-Dimensional Cell Structures with Non-Shared Array Lines Simplified 3-dimensional nonvolatile memory array 7500 enables stacking multi-levels of sub-arrays based on memory array 7500 to achieve high density bit storage per unit area. Nonvolatile memory array 7500 has a cell area $4F^2$ and a bit density of $4F^2$/bit. However, a 2-high stack holds two bits in the same $4F^2$ area and achieves a bit density of $2F^2$/bit. Likewise, a 4-high stack achieves a bit density of $1F^2$/bit, an 8-high stack achieves a $0.5F^2$/bit density, and a 16-high stack achieves a $0.25F^2$/bit density.

Figure 77:
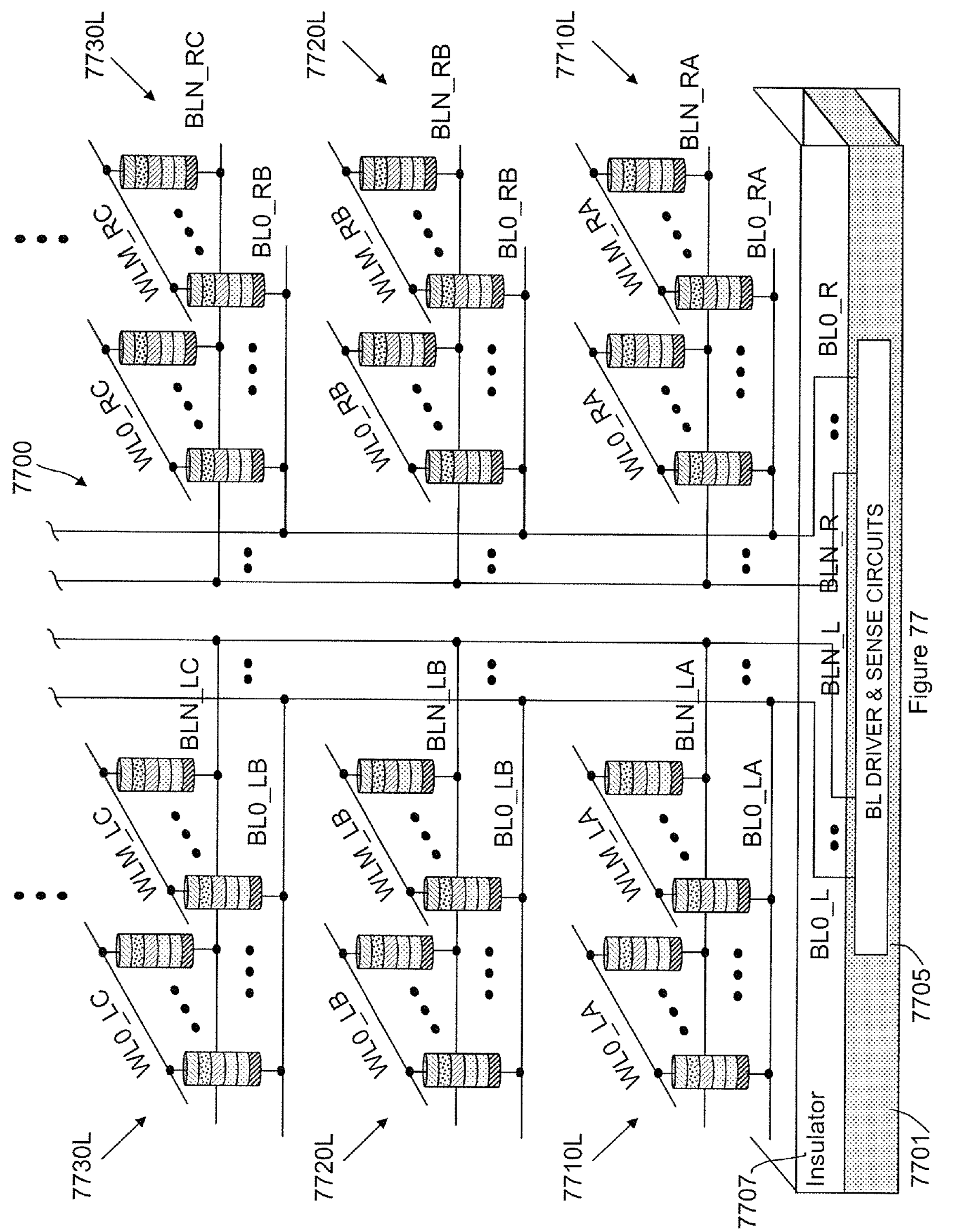
FIG. 77 illustrates a 3D perspective drawing of an embodiment of a multi-level high stack of three dimensional nonvolatile nanotube block-based switches with top and bottom contacts, with no array lines, such as word lines, shared between upper and lower arrays.

FIG. 77 illustrates a schematic of stacked nonvolatile memory array 7700 based on nonvolatile memory array 7500 illustrated in FIG. 75. Support circuits and interconnections 7701 illustrated in stacked nonvolatile memory array 7700 illustrated in FIG. 77 corresponds to support circuits and interconnections 7501 shown in cross section 7500 illustrated in FIG. 75, except for circuit modifications to accommodate stacked arrays. BL driver and sense circuits 7705, a subset of support circuits and interconnections 7701, are used to interface to bit lines in stacked nonvolatile memory array 7700.

Planarized insulator 7707 illustrated in FIG. 77 corresponds to planarize insulator 7503 illustrated in FIG. 75. Interconnect means through planar insulator 7707 (not shown in stacked nonvolatile memory array 7700 but shown above with respect to cross section 2800" in FIG. 28C) may be used to connect metal array lines in 3-D arrays, bit lines in this example, to corresponding BL driver and sense circuits 7705 and other circuits (not shown). By way of example, bit line drivers in BL driver and sense circuits 2640 may be connected to bit lines BL0 and BL1 in array 2610 of memory 2600 illustrated in FIG. 26A described further above, and in stacked nonvolatile memory array 7700 illustrated in FIG. 77.

Three stacking levels with left and right-side 3-D sub-arrays corresponding to nonvolatile memory array 7500 in FIG. 75 are illustrated, with additional memory stacks (not shown) above. Memories of 8, 16, 32, and 64 and more nonvolatile memory stacks may be formed. In this example, a first stacked memory level is formed that includes nonvolatile memory array 7710L including m×n NV NT diode cells interconnected by m word lines WL0_LA to WLM_LA and n bit lines BL0_LA to BLN_LA, and nonvolatile memory array 7710R including m×n NV NT diode cells interconnected by m word lines WL0_RA to WLM_RA and n bit lines BL0_RA to BLN_RA. Next, a second stacked memory level is formed that includes nonvolatile memory array 7720L including m×n NV NT diode cells interconnected by m word lines WL0_LB to WLM_LB and n bit lines BL0_LB to BLN_LB, and nonvolatile memory array 7720R including m×n NV NT diode cells interconnected by m word lines WL0_RB to WLM_RB and n bit lines BL0_RB to BLN_RB. Next, a third stacked memory level is formed that includes nonvolatile memory array 7730L including m×n NV NT diode cells interconnected by m word lines WL0_LC to WLM_LC and n bit lines BL0_LC to BLN_LC, and nonvolatile memory array 7730R including m×n NV NT diode cells interconnected by m word lines WL0_RC to WLM_RC and n bit lines BL0_RC to BLN_RC. Additional stacks of nonvolatile memory arrays are included (but not shown in FIG. 77).

Sub-array bit line segments are interconnected by vertical interconnections and then fanned out to BL driver and sense circuits 7705 as illustrated in stacked nonvolatile memory arrays 7700 in FIG. 77. For example, BL0_L interconnects bit line BL0-LA, BL0_LB, BL0-LC segments, and other bit line segments (not shown), and connect these bit line segments to BL driver and sense circuits 7705. Also, BLN_L interconnects bit line BLN-LA, BLN_LB, BLN-LC segments, and other bit line segments (not shown), and connect these bit line segments to BL driver and sense circuits 7705. Also, BL0_R interconnects bit line BL0-RA, BL0_RB, BL0-RC segments, and other bit line segments (not shown), and connect these bit line segments to BL driver and sense circuits 7705. Also, BLN_R interconnects bit line BLN-RA, BLN_RB, BLN-RC segments, and other bit line segments (not shown), and connect these bit line segments to BL driver and sense circuits 7705.

BL driver and sense circuits 7705 may be used to read or write to bit locations on any of the stacked levels in stacked nonvolatile memory array 7700 illustrated in FIG. 77. Word lines may also be selected by support circuits and interconnections 7701 (not shown in this example).

When forming nonvolatile memory arrays, annealing of polysilicon layers in the temperature range of 700 to 800 deg-C for approximately one hour may be required to control grain boundary size and achieve desired electrical parameters such as forward voltage drop and breakdown voltages for steering diodes. For 3-D arrays, such annealing may be performed before or after NV NT block switch formation. When stacking memory arrays to form stacked nonvolatile memory arrays 7700, annealing in the temperature range of 700 to 800 deg-C for one hour may be required to improve steering diode electrical properties after NV NT block switches are formed, because the diode layers may be arranged over the NV NT blocks. Bottom (lower level) and top (upper level) contact materials may need to tolerate temperatures of up to 800 deg-C without forming carbides (note, nanotubes are tolerant of temperatures well in excess of 800 deg-C). Choosing a block contact material such as Pt can help to ensure that carbides do not form because Pt is insoluble in carbon. Also, choosing high melting point materials such as Mo, Cr, and Nb can also avoid carbide formation. Mo and Nb carbides form above 1000 deg-C, and Cr carbides form above 1200 deg-C. Other high-melting point metals may be used as well. By choosing contact metals that either do not form carbides, or form carbides above 800 deg-C, annealing of stacked nonvolatile memory arrays, in which diodes are arranged above and/or below the NV NT blocks and their associated contacts, can be performed without contact-to-nanotube degradation. Thus, at least some embodiments of the invention are resilient to high temperature processing without degradation. Phase diagrams for various metals and carbon may found in various references.

Alternate Embodiments

Figure 78:
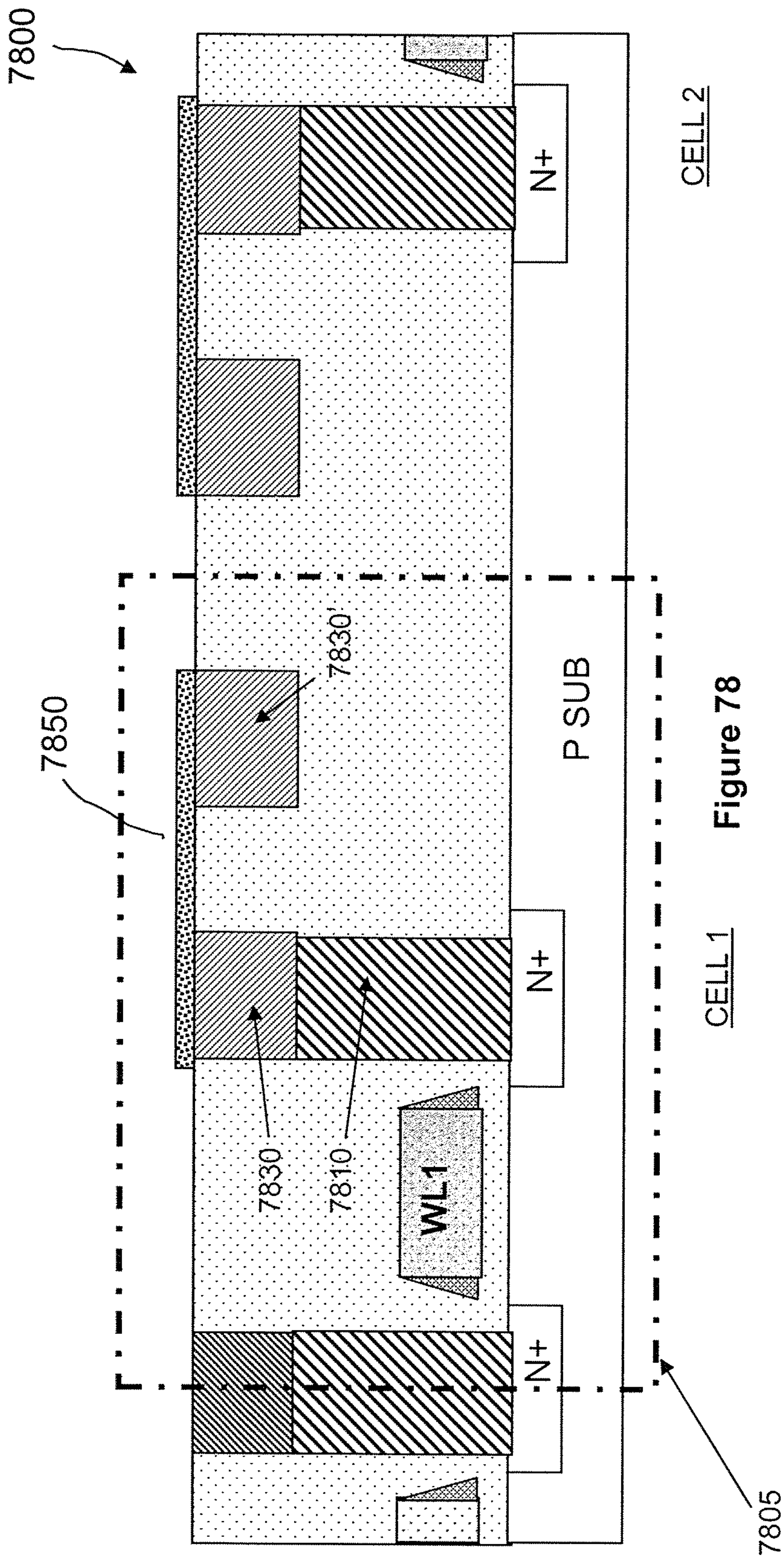
FIG. 78 illustrates a cross sectional view of a two terminal nanotube switch having a thin nanotube fabric article, with cell select circuitry, according to some embodiments.

FIG. 78 illustrates a non-volatile nanotube switch with select circuitry according to one embodiment. The nanotube switching element includes a substantially thin nanotube fabric region, as opposed to a thick, multilayered nanotube fabric. The 2-D NV NT switch and select circuitry are identified as CELL 1, 7805 and are one of a plurality of cells in an array of 2-D NV NT switch structures 7800 (e.g. adjacent to CELL 2).

CELL 1 includes p-type doped substrate PSUB with n-type doped regions N+, and write line 1 WL 1, according to conventional field effect transistor select technology. Conductive element (stud) 7810 creates an electrical pathway between N+ (e.g. drain) and first conductive terminal 7830. Thin nanotube article 7850 is disposed in direct and permanent physical contact to the first conductive terminal 7830 and the second conductive terminal 7830'. The resistive characteristics of the thin NV NT article 7850 may be controllably changed in response to electrical stimulus applied to 7830 and 7830' according to the various explanations provided above and in the incorporated references.

The 2-D NV NT switches depicted in 7800 have numerous advantages. The nanotube article 7850 may be coated with one or relatively few applications towards the end of the fabrication process flow. Moreover, the thin characteristics imply that less CNT material, on the whole, is needed to form the film from which nanotube article 7850 is patterned. In certain instances, less CNT material corresponds to lower fabrication costs. Moreover, the aforementioned attributes result in higher wafer throughput, in certain embodiments. By increasing wafer throughput, fabrication costs can again be reduced when producing relatively significant volume of arrays of 2D NV NT switches. In certain instances, structure 7800 may be more easily patterned at smaller dimensions than alternate structures having, for example, multilayered nanotube fabrics.

Yet the 2D NV NT switches depicted in 7800 have various disadvantages as well, under particular circumstances. The structure of FIG. 78 results in a relatively large cell size (e.g. $\geq 8F^2$) and thus a correspondingly larger chip area than those arrangements having smaller cell sizes. Thus, in certain instances, the multilayered nanotube fabric embodiments described in the previous sections of the present application may have a more compact layout, resulting in correspondingly small chip area. The relatively large cell size may limit productivity by implying fewer chips per wafer. As noted above, fewer chips per wafer may result in more costly memory in certain instances.

Figure 79:
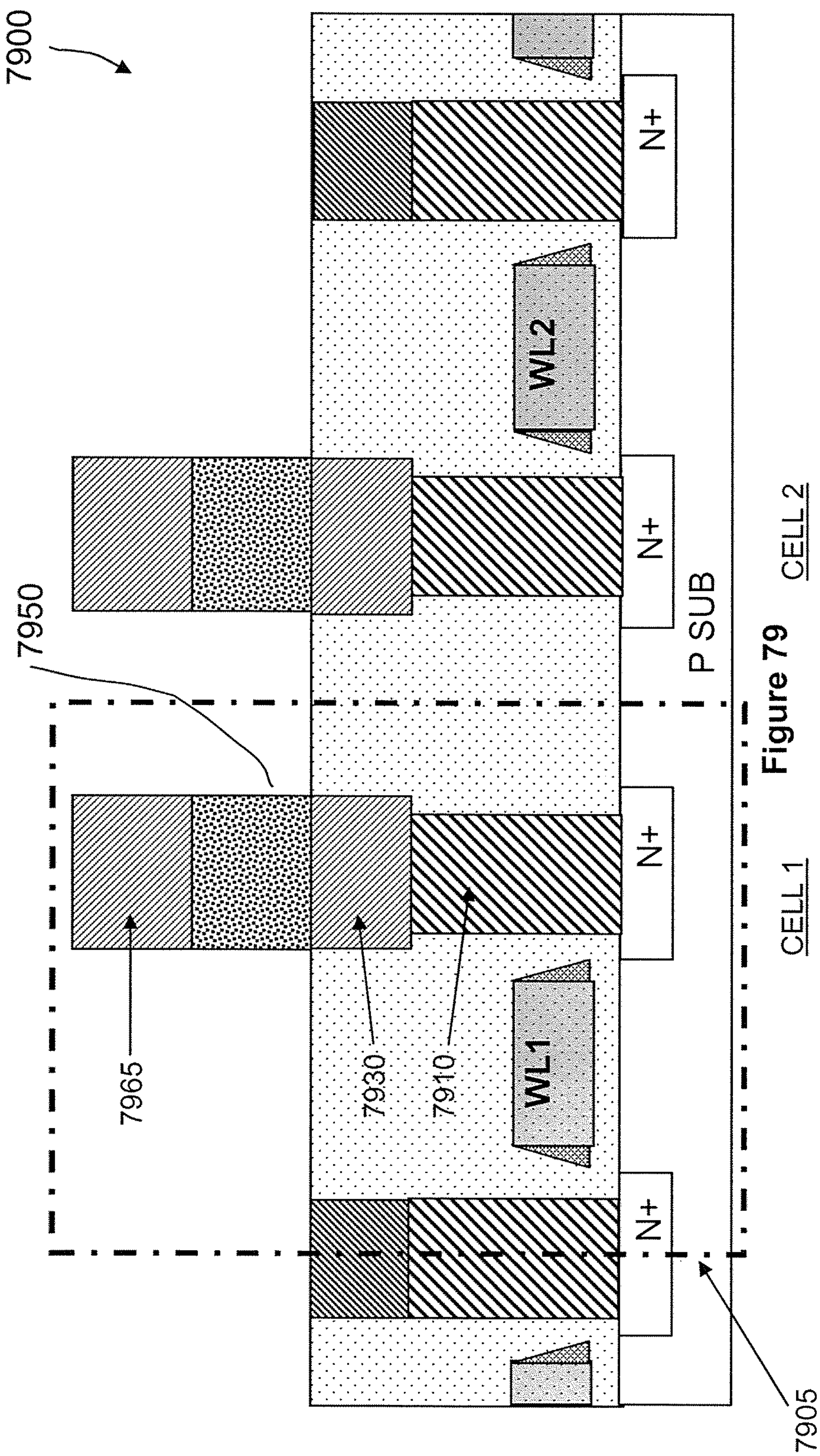
FIG. 79 illustrates a cross sectional view of a two terminal nanotube switch having a thick nanotube fabric article, with cell select circuitry, according to some embodiments.

FIG. 79 illustrates a non-volatile nanotube switch (NV-NT) using a 3-D nonvolatile nanotube block, according to certain embodiments. The nanotube switching element includes a substantially thick or multilayered nanotube fabric region, as opposed to a thin nanotube fabric. The 3-D NV NT switch and select circuitry are identified as CELL 1, 7905 and are one of a plurality of cells in an array of 2-D NV NT switch structures 7900 (e.g. adjacent to CELL 2).

CELL 1 includes select circuitry, according to conventional field effect transistor select technology. Conductive element (stud) 7910 creates an electrical pathway between N+ (e.g. source) and first conductive terminal 7930. 3-D nanotube block 7950 is disposed in direct and permanent physical contact to the first conductive terminal 7830 and the second conductive terminal 7965. The resistive characteristics of the NV NT block 7950 may be controllably changed in response to electrical stimulus applied to 7930 and 7965, according to the various explanations provided above and in the incorporated references.

The 3-D NV NT switch with NV NT block 7910 has various advantages that differentiate it from the structure disclosed above in FIG. 78. The NV NT block 7910 enables a smaller cell size of approximately (as small as) $6F^2$ which, in turn, allows for a smaller chip area for a given number of cells. By allowing more chips per wafer, the compact design/layout offered by 7900 enables higher productivity and less costly memory overall, in certain applications. Many of these advantages are described in greater detail above.

As compared with the structure depicted in FIG. 78, the structure of FIG. 79 (7900) has certain limitations, in particular applications. The thick layer or multi-layered nanotube fabric forming nanotube block 7950 typically is formed through applying numerous thin coats of nanotube material. The thick layer of nanotube fabric typically involves more CNT material total, than the thin nanotube article counterparts. As a result of the multi-layered nanotube fabric production steps, fabricating the structure of 7900 typically entails a lower wafer throughput and, correspondingly, increased fabrication costs. Moreover, the multi-layered fabric used to create NV NT block 7950 and upper contact 7965 may be more difficult to pattern at the smallest of desired dimensions. For switching characteristics, see the detailed description in U.S. Ser. No. 11/835,583, filed Aug. 8, 2007 entitled "Latch Circuits and Operation Circuits Having Scalable Nonvolatile Nanotube Switches as Electronic Fuse Replacement Elements" the entire contents of which are incorporated by reference U.S. Ser. No. 11/835,583, filed Aug. 8, 2007 entitled "Latch Circuits and Operation Circuits Having Scalable Nonvolatile Nanotube Switches as Electronic Fuse Replacement Elements" details multi-level storage characteristics, and the forward and reverse program/erase electrical stimulus used to operate memory cells constructed according to structure 7900.

Figure 80:
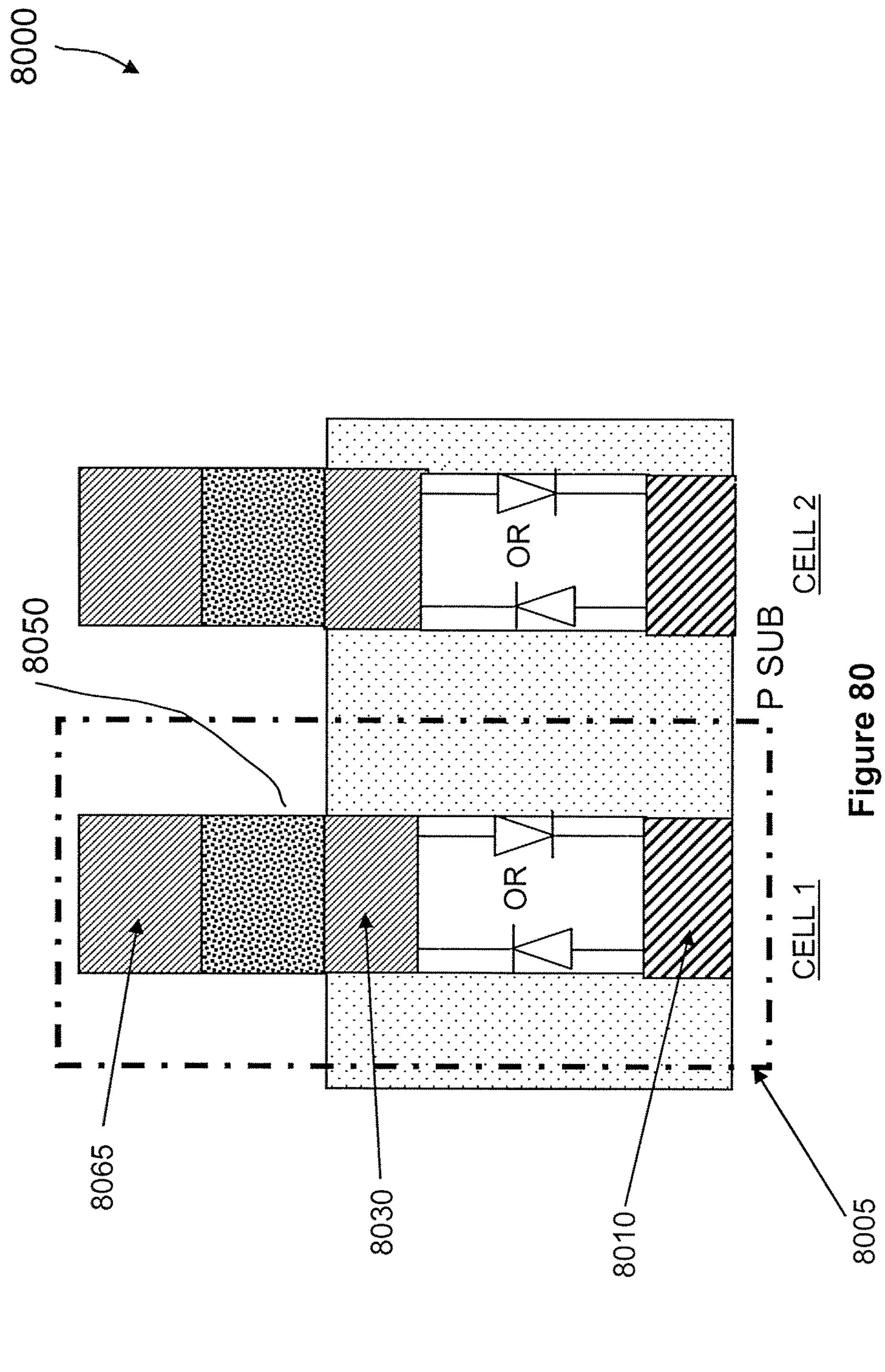
FIG. 80 illustrates a cross sectional view of a nanotube diode having a thick nanotube fabric article, with cell select circuitry, according to some embodiments.

FIG. 80 illustrates a detailed schematic of a 3-D NV NT diode with a NV NT block, according to one embodiment. Adjacent pair of 3D NV NT diodes having a NV NT block 8000 are described in detail in incorporated reference U.S. Ser. No. 11/835,613, filed Aug. 8, 2007, entitled "Memory Elements and Cross Point Switches and Arrays of Same Using Nonvolatile Nanotube Blocks". By way of summary, CELL 1 of structure 8000 is a single 3-D NV NT diode with a NV NT block 8005. CELL 1 comprises a select line 8010 and a p-type or n-type semiconductor region(s) forming steering diode that dictates the bias of the resulting NV NT diode. Bottom conductive contact 8030 forms a first terminal to NV NT block 8050. Top conductive contact 8065 forms a second terminal to NV NT block 8050. In summary, appropriate electrical stimulus applied to the first and second terminals 8030 and 8065 induces changes in the resistance characteristics of NV NT block 8050 effectively activating or deactivating a conductive pathway through semiconductor diode region to/from the select line 8010. The resultant memory cell may be used for multilevel store, and may be programmed and erased through forward activation, according to a plurality of embodiments described in incorporated reference.

3-D NV NT diode with a NV NT block structure 8000 has a number of advantages. The first prominent advantages involves the highly compact cell size of approximately $4F^2$ and, correspondingly the smallest chip area implemented to date. As a result, the embodiment depicted in FIG. 80 enables some of the highest productivity or most chips per wafer enabled. In certain applications, this has the result of creating, overall, the least costly memory. However, there are disadvantages to the structure 8000. Because a relatively thick layer or multi-layered fabric is used to form NV NT block 8050, numerous thin coats of nanotube material are used. Typically, 10 to 50 coats of nanotube material are used. This results, in certain applications, in a greater net amount of CNT material used to form the film, than in alternate thin-film embodiments. Consequentially, the fabrication method to achieve structure 8000 may entail a lower wafer throughput and increased fabrication costs than the aforementioned thin-film variations. As noted above, multi-layer or thick films used to create NV NT blocks 8050 are, at present somewhat more difficult to pattern at the smallest dimensions.

Figure 81:
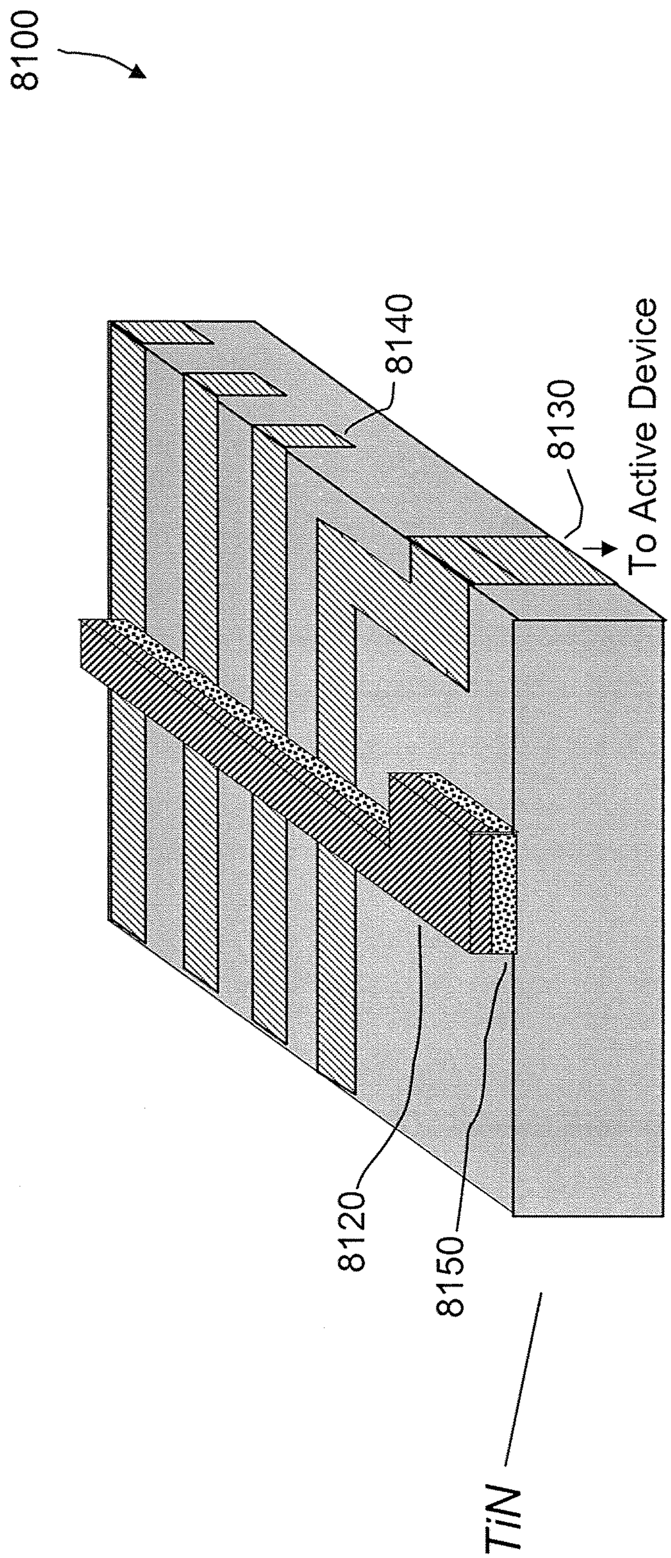
FIG. 81 illustrates a 3-D perspective drawing of an array of nonvolatile nanotube cells formed from bottom conductive traces and top conductive trace nanotube trace elements, according to some embodiments.

For purposes of illustration, FIG. 81 depicts a perspective drawing of NV NT cross point switches 8100 formed using a NV NT trace 8150 (multiple NV NT traces may be used but not shown) approximately orthogonal to underlying conductors 8130. The NV NT trace includes a conformally disposed overlying conductor 8120. A NV NT cross point switch is defined electrically in the NV NT trace 8150 material at the intersection of the conformal overlying conductor/NV NT trace and the approximately underlying conductor layer. A NV NT trace may simplify processing and therefore lower fabrication cost because a minimum size cross point switch may be defined using a minimum photolithographically defined dimension in only one axis while the other approximately orthogonal dimension is defined electrically. The present layout is described more completely in U.S. Provisional Patent Appl. No. 61/074,241, filed Jun. 20, 2008, entitled "NRAM Arrays with Nanotube Blocks, Nanotube Traces, and Nanotube Planes and Methods of Making Same," the entire contents of which are hereby incorporated by reference.

Specifically, NV NT cross point switches 8100 include one or more bottom traces 8130 disposed in or on a substrate 8140. Disposed over an upper surface of the bottom trace 8130 and adjacent substrate 8140 is NV NT trace 8150 comprising a patterned CNT fabric layer and patterned conductor 8120, conformally disposed. The NV NT trace 8150 and conductor 8120 are typically applied conformally and then etched in a single step to form the sandwitched NV NT trace. However, numerous fabrication methods are described in incorporated reference U.S. patent application Ser. No. 61/074,241 and envisioned here. U.S. patent application Ser. No. 61/074,241 shows examples of cells such as illustrated in FIG. 79 formed using NV NT traces instead of 3-D nonvolatile nanotube blocks. Similar methods may be used to modify 3-D NV NT diode structures that include NV NT blocks as illustrated in FIG. 80. In this method, NV NT block 8050 and second contact 8065 are replaced by a NV NT trace corresponding to NV NT trace 8150 and a conductor corresponding to conductor 8120 resulting in a 3-D NV NT diode cell with a NV NT trace storage element. In the present embodiment, structure 8100 features bottom trace 8130 and NV NT trace 8150 approximately orthogonally disposed, but any variety of configurations is envisioned. It is the intersection between bottom trace 8130 and NV NT trace (8150/8120) in the cross section normal to the major substrate surface (in the present embodiment) that form the 3D NV NT diode. Incorporated reference U.S. patent application Ser. No. 61/074,241 details the operation of this switch configuration and the integration of multiple, uniquely addressable switching cells in a memory array.

NV NT switch 8100 layout, when combined with 3-D NV NT diode cells such as illustrated in FIG. 80 (according to certain embodiments) has numerous advantages. As detailed above with reference to FIG. 80, the present structure has one of the smallest cell sizes available to date (≥4F$^2$) and, correspondingly, the smallest chip area dedicated to a fixed number of switching cells. This enables the highest productivity or most chips per wafer, to date, when compared with alternate embodiments. Moreover, in certain instances, this highly dense layout results in least costly memory, overall.

The various disadvantages to structure 8100 are similar to those described above with reference to structure 8000, in terms of the thick multi-layered fabric entailing multiple thin coats and relatively larger amounts of CNT material used. However, structure 8100 is distinguishable from the NV NT block embodiments discussed above. First, it is less difficult to pattern a NV NT trace at the smallest dimensions than it is to pattern a NV NT block because fewer critical etching (and alignment) steps are required. Second, the NV NT traces should be operated in a way such that adjacent cell cross talk is minimized. The NV NT block structures have no such operation limitation. Of note is that the multilevel storage features and program/erase operation operation described above, with reference to incorporated reference U.S. Ser. No. 11/835,583, filed Aug. 8, 2007 entitled "Latch Circuits and Operation Circuits Having Scalable Nonvolatile Nanotube Switches as Electronic Fuse Replacement Elements" also apply to structure 8100.

Figure 82:
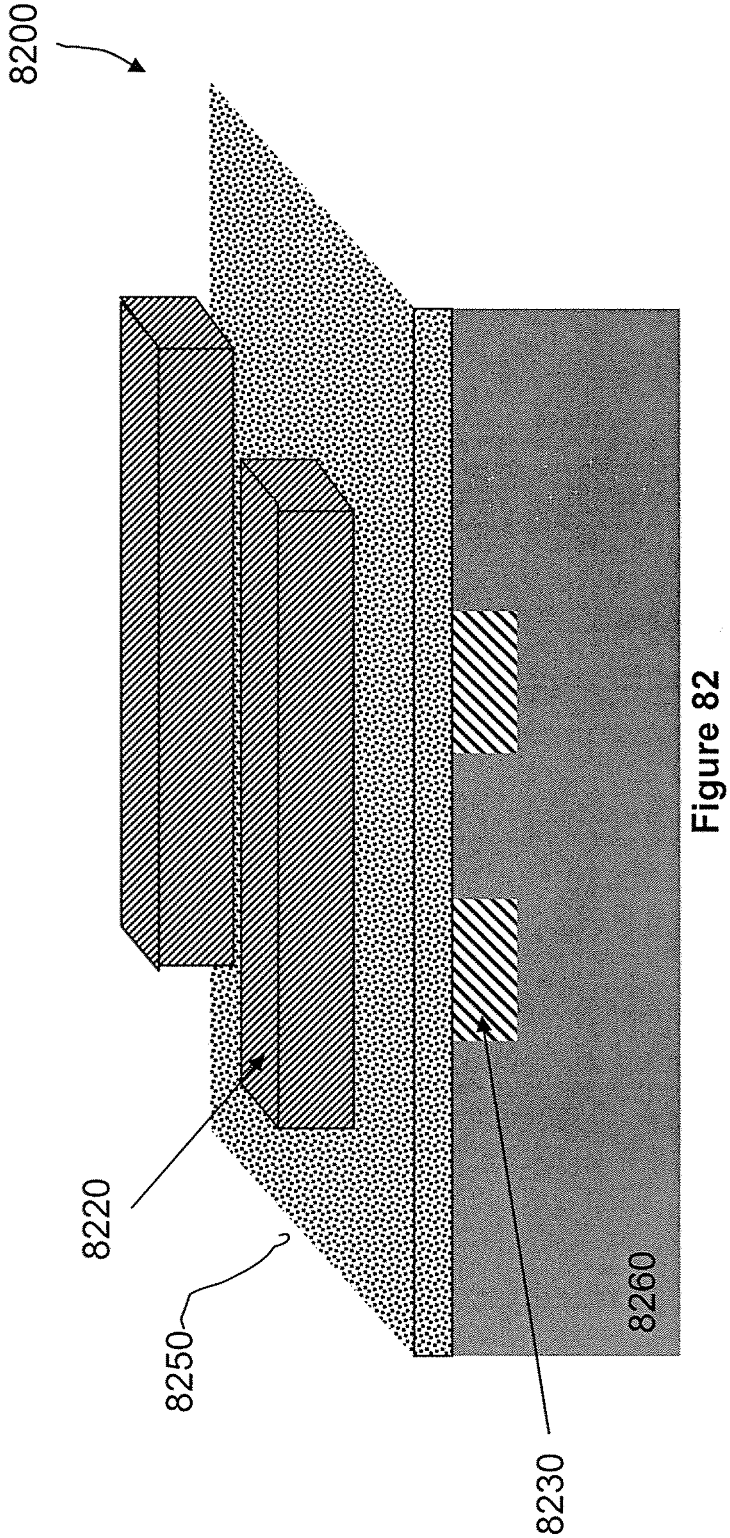
FIG. 82 illustrates a 3-D perspective drawing of an array of nonvolatile nanotube cells from top and bottom conductive traces and a plane of nanotube fabric, according to some embodiments.

FIG. 82 illustrates a schematic drawing of NV NT cross point switches 8200 formed in NV NT plane 8250 according to embodiments. The present layout is described more completely in U.S. Provisional Patent Appl. No. 61/074,241, filed Jun. 20, 2008, entitled "NRAM Arrays with Nanotube Blocks, Nanotube Traces, and Nanotube Planes and Methods of Making Same,". Structure 8200 includes an array of adjacent NV NT cross point switches (four are depicted here). A plurality of bottom conductive traces 8230 are embedded in substrate 8260. NV NT fabric plane 8250 is disposed over an upper surface of bottom conductive traces 8230 and surrounding substrate material 8260, approximately conformal to those surfaces. NV NT fabric plane 8250 is left substantially planar while upper conductive traces 8220 are formed over the NV NT fabric plane. Methods of making and operating the resultant array 8200 of NV NT cross point switches within the NV NT plane are described in detail in incorporated reference U.S. Provisional Patent Application No. 61/074,241, filed Jun. 20, 2008, entitled "Nram Arrays with Nanotube Blocks, Nanotube Traces, and Nanotube Planes and Methods of Making Same". U.S. patent application Ser. No. 61/074,241 shows examples of cells such as illustrated in FIG. 79 formed using NV NT planes instead of 3-D nonvolatile nanotube blocks. Similar methods may be used to modify 3-D NV NT diode structures that include NV NT blocks as illustrated in FIG. 80. In this method, NV NT block 8050 and second contact 8065 are replaced by a NV NT plane corresponding to NV NT plane 8250 and a conductor corresponding to conductor 8220 resulting in a 3-D NV NT diode cell with a NV NT trace storage element. Other configurations may be suitable in other applications and are not detailed here for brevity.

The advantages detailed above with reference to FIG. 81 also apply to structure 8200. Indeed, an extremely small cell size of as little as 4F$^2$ may be achieved, enabling the smallest chip area to date in the present embodiments. As noted above, the highly dense cell layout and reduced chip area enables high productivity with the most chips per wafer and, depending on certain factors, the least costly memory overall. Disadvantages, as detailed above, may be attributed to the multiple coating steps (e.g. 10-50) used to create the thick multilayered fabrics and the need for more CNT material that would otherwise be required for thin nanotube film embodiments. These features imply lower wafer throughput and increased fabrication costs. One noteworthy advantage to structure 8200 is that the layout eliminates the need for patterning the CNT plane at all. Because patterning CNT at small dimensions is typically a significant challenge in terms of instrumentation precision and fabrication methods, the present CNT plane structure significantly simplifies the fabrication process by circumventing the challenge. The cells of structure 8200 should be operated in a such a way to minimize cross talk between adjacent cells to preserve the accuracy and performance of each cell. The multilevel storage features and program/erase operation operation described above, with reference to incorporated reference U.S. Ser. No. 11/835,583, filed Aug. 8, 2007, entitled "Latch Circuits and Operation Circuits Having Scalable Nonvolatile Nanotube Switches as Electronic Fuse Replacement Elements" apply to structure 8200.

Switch and Diode Structures Using Mixed Nanoscopic Materials and Various Performance and Fabrication Advantages The above NV NT switches, structures, NRAM arrays and NV NT diodes have all been described as containing nanotube fabric articles. Nanotube fabric articles can be composed primarily of nanotubes. In certain embodiments, purified nanotubes may be preferred. In fact, relatively purified nanotube materials may have clear performance benefits in particular applications. However, in other applications, a nanotube fabric can include any number of different additional materials that can play an active or passive role in switching performance. Together, a first volume of carbon nanotubes and a second volume of other nanoscopic particles can be used to provide a matrix of mixed or composite nanoscopic materials. The first volume of carbon nanotubes and second volume of other nanoscopic particles may interact covalently or non-covalently. The introduction of the second volume of other nanoscopic particles may be used to controllably alter the porosity of a nanotube fabric and/or the density of the resultant matrix.

Although the Figures below depict the nanoscopic particles as discrete particles and the nanotubes as the matrix, it should be noted that the morphology of the nanoscopic particles and carbon nanotubes may be different. For example, in certain embodiments, the carbon nanotubes may form the discrete phase and the nanoscopic particles may form the matrix phase. In some other embodiments, the carbon nanotubes and the nanoscopic particles can both form interconnected matrix phases. The nanotube fabric layer can act as a switching material between a first electrode and a second electrode.

Whereas in other contexts, nanoscopic particles other than nanotubes might be viewed as undesirable impurities, in the composite article of the present invention, the nanoscopic particles are a deliberately added component, introduced to achieve the desired device performance, such as desired switching attributes. Indeed, the nanoscopic particles are selectively mixed with nanotubes to form a composite article having a predefined volumetric ratio of nanoscopic particles to nanotubes. The ratio may be pre-selected and tuned to ensure, for example, the desired range of electrical switching or resistive states. The attributes of the nanoscopic particles—the material, the size, the uniformity of the particulate population, the shape of the nanoscopic particles, its interaction with the nanotubes, etc.—can all be specifically selected to further tune the desired device characteristics (e.g., electrical switching or resistive characteristics) of the resultant composite article. Moreover, in certain instances, the attributes of the nanoscopic particles itself may further dictate the predefined ratio of the nanoscopic particles and nanotubes. Regardless, in each case, the purposeful and deliberate addition of nanoscopic particles can have the common effect of allowing inventors additional control in tuning and refining the characteristics (electrical, physical, thermal or otherwise) of the composite article. For example, addition of the nanoscopic particles in a predefined ratio with the nanotubes may decrease the switching voltages of the composite article as compared to switches formed from pristine nanotubes.

The predefined ratio of the nanoscopic particles to the nanotubes can be any ratio selected by the manufacturer depending on the application, method of combination, or the composition of materials used in the device. For example, in certain applications, some suitable and non-limiting predefined ratio of the nanoscopic particles to the nanotubes may be from about 1:1 (one part nanoscopic particles to about one part nanotubes) to about 1:10 (one part nanoscopic particles to about ten part nanotubes). For example, some suitable and non-limiting predefined ratio of the nanoscopic particles to the nanotubes may be 1:1, 1:2, 1:3, 1:4, 1:5, 1:6, 1:7, 1:8, 1:9, or 1:10.

In such cases, the employment of composite nanoscopic materials may have certain different advantages, both in terms of device performance and ease of fabrication. As noted above with respect to FIG. 57C, these additional nanoscopic materials can be introduced to actively improve the switching characteristics of the nanotube article—in such a case, they may be referred to as performance enhancing materials. Thus the present section discloses NV NT switches, structures, NRAM arrays and NV NT diodes that are constructed from articles containing a mixture or composite of nanotube materials and additional nanoscopic particles. The additional nanoscipic particles can take any variety of forms—from carbon particles to silicon oxide, silicon nitride or other particle types. At present, the inventors envision a variety of matrix materials. For example, there may be a first volume of carbon nanotubes and a second volume of other nanoscopic particles that play either an active role in switching behavior or remain inert during switching operation. There may be a first volume of one form of carbon nanotubes (i.e. multi-walled) and a second volume of additional materials comprising a second variety of carbon nanotubes (i.e. single-walled), the two varieties forming a matrix of material around one another. Moreover, there may be a plurality of discrete phases of carbon represented in the matrix material, with one phase forming the first volume of material and another phase forming the second volume of material. Further still, the additional material comprising the second volume of nanoscopic particles may be selected to have the effect of increasing the population of carbon nanotubes present in a fixed volume. Yet other examples are envisioned and incorporated into the existing disclosure.

By way of introduction, the advantages and disadvantages of including certain selected additional nanoscopic materials to create a composite or mixed nanoscopic material fall under two categories: fabrication process and device performance. In certain process flows, a composite or mixed nanoscopic material can be easier to fabricate and use than a material consisting of substantially purified nanotubes. For example, corresponding equivalent nonvolatile nanotube switches formed using mixed or composite nanoscopic materials may be applied to a wafer in a single coat, or at most a few coats, as opposed to multiple coats (i.e. 10 to 50 for example). A single coat (or few coats) relaxes the process flow requirements because a single coat (or few coats) requires less process time, fewer tools, and increases wafer throughput, as well as reducing the amount of costly purified nanotubes required to achieve certain device parameters. Lower fabrication costs result in less costly NV NT memory. Mixed or composite nanoscopic material can be also be more easily patterned. This is because mixed or composite nanoscopic material may be thinner than CNT-only nanotube material while still preventing shorts between upper and lower electrodes. Therefore, mixed or composite nanoscopic material may be somewhat easier to pattern than a substantially purified nanotube fabric at smaller dimensions.

In addition to fabrication advantages, when using mixed or composite nanoscopic materials to form the various NV NT devices, there are performance advantages as well. As discussed above with reference to FIG. 57C, performance enhancing additional nanoscopic materials can be used to fine-tune the switching characteristics of the nanotube article and achieve more precise and/or more responsive switching. In certain instances, the introduction of performance enhancing materials may actually be used to lower the operation voltage for NV NT switch. Of course, lower operation voltages can mean power savings or lower thermal attributes than those structures requiring higher operation voltages. These performance advantages are discussed in detail below.

In certain embodiments, a variety of nanoscopic particles may be used as an additional nanoscopic material and/or performance enhancing material to form a mixed or composite nanoscopic material. Carbon particles may be used. Carbon particles may include may include various allotropes of carbon. To date, known allotropes of carbon include Diamond, Graphite, Lonsdaleite, $C_{60}$ (Buckminsterfullerene), fullerenes such as but not limited to C20, C26, C28, C36, C50, C70, C72, C76, C84, C540, Amorphous carbon, and carbon nanotubes, each having a distinct atomic structure. Additional nanoscopic materials may have one or more of these forms of carbon. For the purposes of the ensuing discussion, "nanoscopic particle", (which has no required short-range structural periodicity) will be used to cover these "mixed or composite carbon allotropes" and other types of nanoscopic elements or materials that might be used. While amorphous carbon is typically used in the art to describe one particular allotrope of carbon having no short range order in lattice structure or other atomic pattern, this application will use the term "nanoscopic particles" (NP) to additional nanoscopic materials that may include one or more allotropes of carbon that may or may not have short range order (e.g. fullerene, graphene, carbon nanotubes, etc.). Accordingly, in the ensuing discussion, the particular form of a mixed or composite nanoscopic material in which the additional nanoscopic material includes carbon in some form will be referred to as a nanoscopic particle:carbon nanotube mixture (NP:CNT). This mixed or composite nanoscopic material is understood to cover a matrix of material having at least some carbon nanotubes and other nanoscopic particles.

Selected carbon allotropes may be specifically used, or a generic mixture of nanoscopic particles may be used as the additional nanoscopic material. In certain instances, there will occur in situ formation of one or more particular allotropes of carbon from an NP mixture, in response to electrical stimulus (with certain voltage and current combinations). To date, a generic mixture of NP having multiple carbon allotropes has been observed to actively contribute to electrical switching mechanisms of an NP:CNT device. Thus at least one allotrope of carbon aside from the carbon nanotubes contributes to the NP:CNT switching behaviors. The inventors, while not wishing to be bound by theory, believe that the observed switching behavior may be attributable to nanoscopic electromechanical behaviors, atomic dislocation and/or structural transformations on the atomic scale, or contributions of both.

Figure 83A:
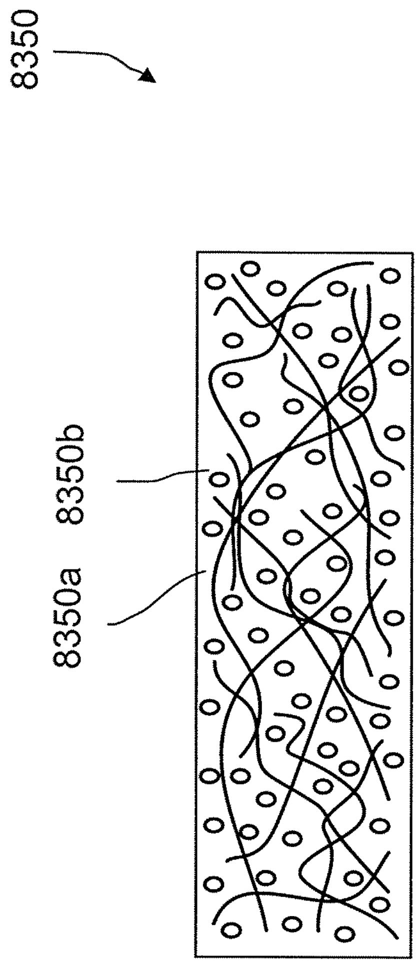
FIGS. 83A-83B illustrate embodiments of a mixed or composite nanoscopic material with additional nanoscopic material and a mixed or composite nanoscopic material with additional nanoscopic material used to form a two-terminal switch, according to some embodiments.
Figure 83B:
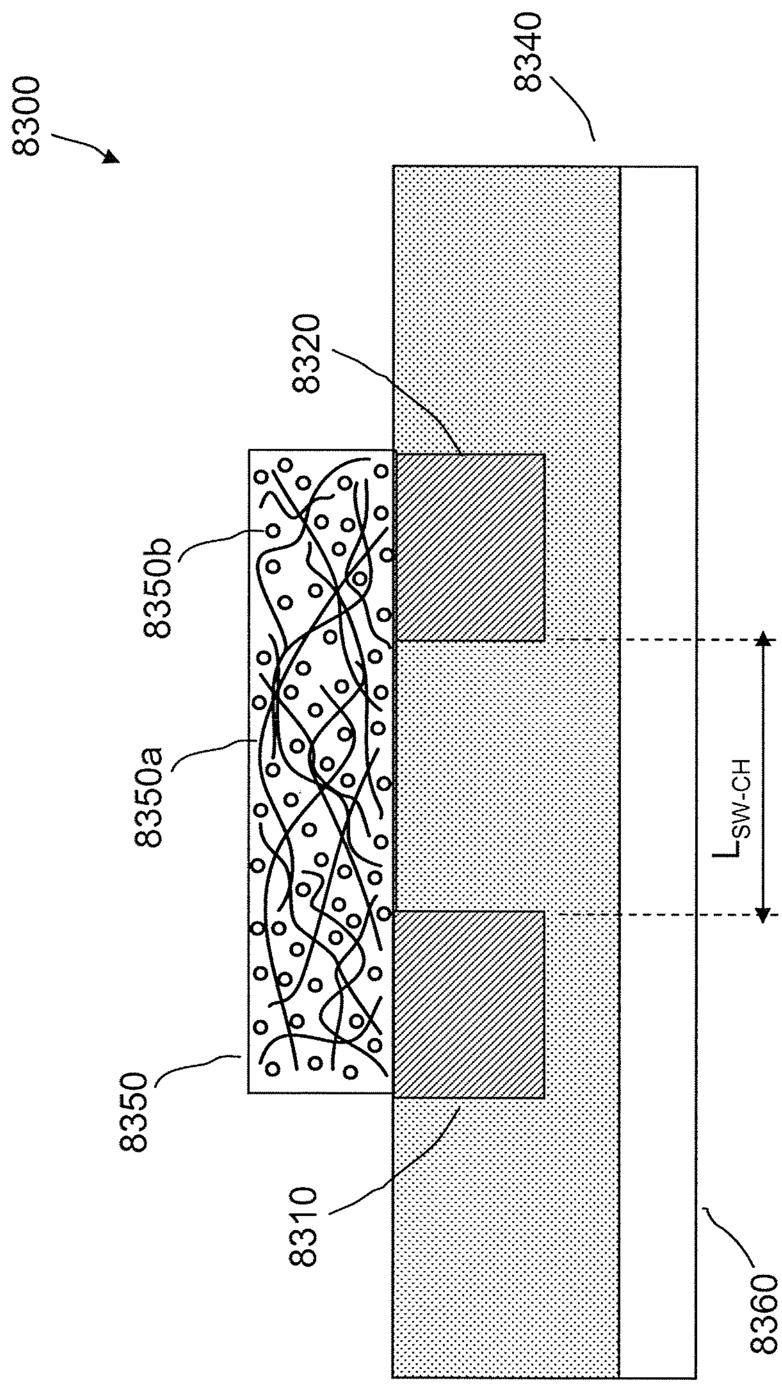

FIGS. 83A-B illustrate a mixed or composite nanoscopic material and a nonvolatile nanotube switch constructed from the mixed or composite nanoscopic material. The mixed or composite nanoscopic material is schematically represented in FIG. 83A as element 8350. The mixed or composite nanoscopic material comprises carbon nanotubes or carbon nanotubes 8350*a* and additional nanoscopic particles 8350*b*. In the embodiments described below, the additional nanoscopic material may comprise one or more allotropes of carbon, for example, amorphous carbon. In such instances, the mixed or composite nanoscopic material is referred to as an nanoscopic particle/carbon nanotube mixture (NP:CNT). The discussion of performance and fabrication advantages will focus on the NP:CNT mixture, for purposes of illustration. One of sufficient skill in the art will understand that other similar mixtures are envisioned and within the scope of the present disclosure. Element 8350 is discussed in detail below, first in the context of its application the switch depicted in FIG. 83B. Yet other switch configurations are provided and detailed below.

The other nanoscopic particles 8350*b* can take a plurality of forms depending on the needs of an application or structure in which the methods of the present invention are employed. In certain embodiments, the nanoscopic particles may be miscible with the nanotubes and form a continuous material around the nanotube. In some other embodiments, the nanoscopic particles The additional nanoscopic particles may be inert to the nanotubes and remain in the same form as initially introduced into the mixture and therefore non-miscible. In yet some other embodiments, the nanoscopic particles may be partially miscible with the nanotubes and form a semi-miscible mixture with the nanotubes. The nanoscopic particles may be introduced to the mixture of nanoscopic particles and carbon nanotubes either before deposition on the substrate or after the nanotube fabric is applied to the substrate. In the first application, the nanoscopic particles are combined with the carbon nanotubes by introducing them into the solution in which the carbon nanotubes are suspended. In the second application, the nanoscopic particles may be introduced by, for example, ion-implantation, vapor deposition, or other methods known in the art.

Furthermore, in certain embodiments, the choice of such nanoscopic particles can include a material or materials that can be formed with a uniform particle size. In certain applications, the choice of a nanoscopic particle can include a material or materials which can be fabricated as individual particles within certain dimensions. For example, an application may require a nanoscopic particle wherein individual particles are not larger than some fraction of a device feature size. Nanoscopic particles can be some aggregation of material having a size of one or more atoms or molecules grouped together. At least one dimension being less than one micron (μm) and at least one dimension being greater than or equal to one nanometer (nm). The particles can have any variety of shapes with a corresponding range of surface areas. The nanoscopic particles may interact covalently or non-covalently with another nanoscopic materials, for example the carbon nanotubes. The nanoscopic particles have the ability to alter the porosity of the total matrix.

The additional nanoscopic particles can take a plurality of forms depending on the needs of an application or structure in which the methods of the present invention are employed. The nanoscopic particles may be spherical, oblong, square, irregular, or any other shapes as would be readily apparent to ordinary skill in the art. The nanoscopic particles may have at least one dimension that is in the nanometer size. For example, the nanoscopic particles may have at least one dimension which is less than 100 nm, 50 nm, 40 nm, 30 nm, 25 nm, 20 nm, 10 nm, 5 nm, or 1 nm. In certain embodiments, the nanoscopic particles may have dimensions that are acceptable in semiconductor fabrication facilities, such as a CMOS facility. In certain embodiments, the nanoscopic particles may be individual atoms or ions. In each such case, the nanoscopic particle can interact covalently or non-covalently to another nanoscopic material, for example, carbon nanotubes. In certain embodiments, the nanoscopic particles may be miscible with the nanotubes and form a continuous material around the nanotube. In some other embodiments, the nanoscopic particles may be inert to the nanotubes and remain in the same form as initially introduced into the mixture and therefore non-miscible. In yet some other embodiments, the nanoscopic particles may be partially miscible with the nanotubes and form a semi-miscible mixture with the nanotubes. In certain embodiments, the nanoscopic particles has the ability to alter the porosity between the carbon nanotubes.

The nanscopic particles may be introduced to the mixture of nanoscopic particles with carbon nanotubes either before deposition non the substrate or after the nanotube fabric is applied to the substrate. In the first application, the nanoscopic particles can be combined with the carbon nanotubes by introducing them into the solution containing carbon nanotubes. In the second application, the nanoscopic particles can be introduced, for example, by ion implantation, vapor deposition, or other methods known in the art.

In some other embodiments, the choice of such nanoscopic particles can include a material or materials which do not adversely affect the switching operation (that is, the changing from one nominal nonvolatile resistive state to another) of the nanotube fabric layer. In fact, in certain embodiments, the nanoscopic particles 8350*b* may improve switching operation by lowering the voltage needed for the nanotube fabric layer to change its resistance.

In some other embodiments, inorganic nanoparticles can be utilized. For example, silicon based materials (such as, but not limited to silicon oxide and silicon nitride) can be used for said other nanoscopic particles 8350*b*.

In some embodiments, one or more allotropes of carbon (such as, but not limited to, diamond, graphite, graphene, fullerenes, amorphous carbon, carbon black, carbon nanopowder, carbon nanobuds, carbon nanorods, carbon nanofoam, lonsdaleite, linear acetylenic carbon, polyaromatic hydrocarbons, and the like) can be used for said other nanoscopic particles 8350*b*.

In certain embodiments, nanoscopic particles 8350*b* can include a mixture of different nanoscopic materials, such as any combination of nanoscopic particles 8350*b* described above.

In the ensuing discussion, nanoscopic particle/carbon nanotube mixture "NP:CNT" will be used to refer to those mixed or composite materials in which one or more allotropes of carbon, including carbon nanotubes, are present. The particular allotrope, amorphous carbon (aC), and the general nanoscopic particle mixture (NP) are exemplary instances of the additional nanoscopic material. In certain embodiments, NP may consist of a plurality of different carbon structures that may repeat their atomic arrangement over comparatively short periods and may, in fact, vary their atomic arrangement during switching operation. Depending on the particular NP used, the additional nanoscopic material may play an active or passive role in the switching mechanism enacted in the NP:CNT composite nanoscopic material article.

FIG. 83B illustrates an embodiment of a NV NT Switch 8300. The NV NT Switch 8300 includes switching element 8350 on insulator 8340 which is supported by substrate 8360. Switching element 8350 is a composite nanomaterial on a planar surface that at least partially overlaps and contacts terminals (conductive elements) 8310 and 8320. Terminals (contacts) 8310 and 8320 are deposited and patterned in substrate 8340 prior to switching element 8350 formation. The composite nanomaterial comprising switching element 8350 can be a nanofabric having a first plurality of nanotubes 8350*a* and a second plurality of additional nanoscopic material particles 8350*b*. The composition of the nanomaterial fabric is described in greater detail below.

The nonvolatile nanotube switch channel length $L_{SW-CH}$ is the separation between terminal 8310 and 8320. $L_{SW-CH}$ is important to the operation of nonvolatile nanotube switch 8300 as described further below. Substrate 8360 may be an insulator such as ceramic or glass, a semiconductor, or an organic rigid or flexible substrate. Substrate 8360 may be also be organic, and may be flexible or stiff. Insulator 8340 may be $SiO_2$, SiN, $Al_2O_3$, or another insulator material. Terminals 8310 and 8320 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Carbon may be used as well.

Within the nanomaterial switching element 8350, there are a variety of nanomaterials. In certain embodiments, the composite nanomaterial may be constructed so that the ratio of the first component—the plurality of nanotubes 8350*a*, to the second component—the plurality of additional nanoscopic particles 8350*b*, is carefully managed. The ratio may be selected such that the volume density of nanotubes 8350*a* within the switching element 8350 is optimized for the intended application of the NV NT Switch 8300. For example, a switching element (article of composite nanomaterial) 8350 that has a smaller volume density of nanotubes 8350*a* would, in a typical application, tend to require a smaller switching voltage. In contrast, a switching element (article of composite nanomaterial) 8350 that has a larger volume density of nanotubes may, depending on the additional nanoscopic material population, tend to use a larger switching voltage. Further, by optimizing the volume density of nanotubes 8350*a*, the switching performance and responsiveness of the switching element (article of composite nanomaterial) can be controlled, independently from the physical dimensions of switching element 8350. In other words, the ratio of the number of nanotubes 8350*a* to additional nanoscopic material particles 8350*b* used within said switching element 8350, is selected to achieve the desired switching parameters for a range of physical dimensions and geometries. As a result, the switching element 8350 has the flexibility to be integrated into a great range of applications.

In addition to electrical consideration, the additional nanoscopic material may reduce the overall need for nanotube material. Since nanotubes are more expensive, significant cost reduction per wafer may be achieved.

Within switching element 8350, the nanotubes 8350*a* are typically nanotubes. A variety of nanotubes are envisioned for use—semiconducting, metallic, single-walled, multi-walled, etc.—and may be selected according to the requirements of the particular application. The additional nanoscopic particles 8350*b* can be selected from a plurality of materials including, but not limited to, other allotropes of carbon—such as amorphous carbon, graphene, graphite, diamond, and black carbon, or mixtures of carbon fiber materials. Additional nanoscopic particles 8350*b* may also be composed of silicon based materials—such as, but not limited to, silicon oxide particles and silicon nitride particles. Performance enhancing materials 8350*b* may also include porous dielectric materials (e.g. polypropylene). In some embodiments the selected additional nanoscopic material is inert, meaning that it does not participate in the programming of nonvolatile resistance states within the NV NT switch 8300. In yet other embodiments, the selected additional nanoscopic material is active, meaning that is does participate in the programming of nonvolatile resistance states within the NV NT switch 8350. Further, in some embodiments, more than one type of additional nanoscopic material is used.

The formation of nanotubes 8350 having inert and active selected additional nanoscopic materials is also detailed in Nantero U.S. patent application Ser. No. 10/936,119, now U.S. Pat. No. 7,416,993, incorporated by reference in its entirety. U.S. Pat. No. 7,416,993 specifically describes nanotube articles in which the carbon nanotubes may be pristine, functionalized, or filled with other material, e.g., nanowire materials. Additionally, Nantero U.S. Pat. No. 6,643,165, the entire contents of which are incorporated by reference, discloses combinations of carbon nanotubes and other materials—e.g. pyrenes. Various other examples of inert and active additional nanoscopic materials are envisioned.

In those embodiments in which the selected additional nanoscopic material is inert, the nanotubes 8350*a* provide a plurality of variably conductive pathways through the nanotube article. The nanotube fabric's characteristics and variable resistance in response to electrical stimulus are described at length in U.S. patent application Ser. No. 11/280,786, the entire contents of which are incorporated by reference in their entirety. Inert additional nanoscopic materials may be used to provide various structural, fabrication, and performance improvements. For example an inert additional nanoscopic material may be used to create a more robust mixed or composite nanotube fabric, reducing the amount of nanotubes present in a given volume of composite material. In other embodiments, inert additional nanoscopic materials may simplify fabrication process flows by permitting certain impurities or reducing the amount of purified carbon nanotube material used. fewer layers. Moreover, the density of nanotubes may be deliberately controlled to influence electrical characteristics by adjusting the matrix porosity. In certain embodiments, the introduction of inert materials effectively lowers the required operating voltage. The introduction of certain inert additional nanoscopic materials may also reduce the contact voltage between the composite nanoscopic material and the conductive contacts.

In those embodiments in which the selected additional nanoscopic material is active, the nanotubes 8350*a* and additional nanoscopic particles 8350*b* jointly provide a plurality of variably conductive pathways through the composite nanoscopic article. The active additional nanoscopic material may be selected to enhance switching performance by, for example, increasing the difference in resistance values between the substantially conductive (ON) and substantially non-conductive (OFF) states of the switch. The active additional nanoscopic material may also be selected to enhance switching performance by increasing the number of switch cycles achieved without degradation of results. Where the selected additional nanoscopic material is active and comprises one or more carbon allotropes, high and low resistance states of the switching element 8350 can be attributed to changes in the electrically conductive pathways provided by nanotubes 8350*a* and particles 8350*b*.

Various explanations have been proposed for the switching mechanism, including the mechanism described in European Patent No. 1916722 entitled "Carbon Filament Memory and Fabrication Method," the entire contents of which are hereby incorporated by reference. European Patent No. 1916722 proposes a mechanism in which conductive filaments may be formed in one or more carbon layers, the carbon layer(s) including the $sp^2$-rich carbon that is substantially conductive and the $sp^3$-rich carbon that is substantially insulating. European Patent No. 1916722 proposes that changes in conductivity in the carbon layers(s) is attributed to changes in the proportion of $sp^2$ and $sp^3$ carbon, in response to applied electrical stimulus. While not wishing to be bound by theory, the inventors believe that the mechanism proposed by European Patent No. 1916722 is one of several possible explanations for the operation of nonvolatile nanotube switches having carbon-based active additional nanoscopic materials. As a variety of non-carbon-based active additional nanoscopic materials may be used as performance enhancing materials, the aforementioned example is illustrative and not representative.

There are many advantages to using a mixed or composite nanoscopic material for switching applications, as described above. The new switching material 8350 enables the fabrication of NV NT switches and NV NT diodes and other structures with these advantages. For example, NP:CNT mixtures enable at least some of the following advantages over purified CNT materials, when used in fabricating NV NT switches and/or NV NT diodes:

- Single-step application of NP:CNT mixture
- Lower (and optimized) CNT density in the mixture per wafer
- Lower mixture cost per wafer
- Higher wafer throughput rate
- NV NT block and trace configurations thinner with the new mixture
- Patterning facilitated at smaller dimensions
- Smallest chip area to date
- Higher productivity—more chips per wafer Detailed information concerning the fabrication steps and corresponding advantages are provided in U.S. Pat. No. 7,915,637 filed on date even herewith, entitled "Improved Switching Materials Comprising Mixed Nanoscopic Particles and Carbon Nanotubes and Methods of Making and Using Same," the entire contents of which are herein incorporated by reference. Inventors have found that NP:CNT mixture materials can enable the combined advantages of more chips per wafer with less CNT material and fewer process steps than those contemplated in CNT-only applications. As a result, the NP:CNT mixtures and devices employing them entail reduced memory manufacturing costs. These various fabrication processes are compatible with providing a NV NT switch, diode, or memory element having multi-level storage characteristics, as described in detail in incorporated reference U.S. patent application Ser. No. 11/835,583. Depending upon the particular semiconductor fabrication methods implemented (e.g. to form select diodes, select FETs or other integrated circuit components) certain additional nanoscopic materials may be more or less preferable in improving process flow and switching performance.

FIGS. 84A-B illustrate tables detailing aspects of the additional nanoscopic materials used to create composite or mixed nanotube articles. U.S. Pat. No. 7,416,993, filed Sep. 8, 2004, entitled "Patterned Nanoscopic Articles on a Substrate and Methods of Making the Same," discloses various composite nanoscopic materials comprises nanoscopic particles, nanowires and various functionalized nano-materials, and is hereby incorporated by reference in its entirety. U.S. patent Ser. No. (to be determined), filed on date even herewith, entitled "Improved Switching Materials Comprising Mixed Nanoscopic Particles and Carbon Nanotubes and Methods of Making and Using Same," discloses specific methods for making NP:CNT materials used in the present switching and device applications. Specifically, the patent application provides methods for forming a mixed or composite nanotube fabric layer over a substrate within the constraints of a semiconductor manufacturing process.

Generally, the process to form a mixed or composite nanoscopic particle layer over a substrate includes the following steps. First, a plurality of nanotubes 8350*a* is combined with a volume of additional nanoscopic particles 8350*b* to create a homogenous solution or heterogeneous mixture 8350. The homogenous solution or heterogeneous mixture 8350 is then applied to a substrate 8340 via a spin coat process. The ratio of nanotubes 8350*a* to additional nanoscopic particles 8350*b* within the mixture 8350 is selected such as to provide a desired volume density of nanotubes 8350*a* within said mixture 8350 such that a desired nanotube volume density within a layer formed using said homogenous solution can be realized. The nanotubes 8350*a* can be carbon nanotubes with multi-wall, single-wall, semiconducting, metallic and/or other characteristics. The additional nanoscopic particles 8350*b* can be comprised of one or more silicon based materials, including, but not limited to, silicon oxide ($siO_2$) and silicon nitride ($Si_3N_4$). Or, additional nanoscopic particles 8350*b* can be comprised of one or more allotropes of carbon, including but not limited to, graphite, carbon nanopowder, amorphous carbon, carbon black, and diamond. Mixtures of various additional nanoscopic materials are also possible. Creating additional nanoscopic materials from carbon typically entails creating carbon black material from a carbon nanopowder and implementing a number of chemical treatment processes known in the art to create nanoscopic carbon particles (e.g. one or more carbon allotropes with having no clear short term atomic order).

The conversion involves one or more chemical treatments. According to one exemplary embodiment of the process flow, a first step comprises reacting carbon black with an oxidizing agent such as nitric acid. The reaction typically decreases the size of carbon black particles and also enables the removal of metallic contaminants via solubilization (which can be improved by adding other acids such as HCl). Subsequently, filtration at low pH via cross-flow membranes may be used to remove the solubilized impurities from the slurry. Next, an exemplary process may include increasing the slurry pH to achieve a homogeneous or stable colloidal system. In certain embodiments, sonication might be used to improve homogeneity. The resulting colloidal system may subsequently be filtered through a train of filters to remove any particles which would lead to defects in the spin coated film. In certain embodiments, this may entail using filters with pores as small as approximately 5 nm. At this point, the process entails mixing the resultant colloidal system with a CNT solution at rations which will enable the generation of a suitable film. Suitable films will be expected to have incorporated the necessary density of CNT's to build memory devices of the specified sizes and performance attributes.

In one or more process steps, the NP:CNT mixture is deposited over a first electrode element via a spin coating process to form composite article (as illustrated by structure 8350). The NP:CNT mixture allows for the deposition of significantly thicker (as compared to prior art nanotube solutions) layers (or films) within a single spin coat process as compared to nanotube-only liquids. For example, thickness ranging from about a few to hundreds of nanometers may be possible through a single coat. Some non-limiting example thicknesses that can be achieve include 1, 2, 2.5, 5, 10, 20, 30, 40, 50, 60, 70, 80, 90, 100, 150, or 200 nm. As such, a sufficiently thick composite article suitable for use within a plurality of nanotube block switching devices (such as, but not limited to, block switches, programmable resistive materials, and programmable logic devices) can be realized in a minimum number of spin coat process steps. Further, in many applications, such a layer can be realized within a single spin coat process step, significantly reducing process time and cost.

The NP:CNT mixture can be deposited over a first electrode via a spin coating process to form composite article 8350. The composite article 8350 can have very low level metal contamination. For example, the composite article 8350 may have less than $10^{18}$, $10^{16}$, $10^{15}$, $10^{14}$, $10^{13}$, $10^{12}$, $5\times10^{11}$, $1\times10^{11}$, $5\times10^{10}$, or even less than $1\times10^{10}$ atoms/cm$^2$. Thereafter, a second electrode can be deposited over the composite article 8350.

FIG. 84A illustrates a table showing various nanoscopic material characteristics and corresponding states for a composite nanoscopic material comprising one or more additional nanoscopic materials. Passive additional nanoscopic materials are generally electrically nonconductive and do not participate in the switching process. They serve to occupy volume, facilitate the fabrication process, provide structural stability, or enhance other aspects of the composite nanoscopic material without directly impacting the electrical switching characteristics. Examples of such materials are SiO, SiN, AlO, and others. Active additional nanoscopic materials can be electrically conductive, electrically non-conductive/insulating, or be controllably switchable between conducting and non-conducting states either in coordination with or independently of the nanotubes in the composite nanoscopic material. Active additional nanoscopic materials play a direct role in the electrical performance and behavior of the resultant nanotube switch, diode or device. Active additional nanoscopic materials may also provide structural stability, facilitate the fabrication process, occupy volume, or impact other, non-electrical aspects of the composite nanotube fabric. The resultant composite article may operate with various states. Conductive nanoscopic materials may be conductive as-deposited; non-conductive (but switchable) as deposited. Also, in some cases, additional material may be activated in situ; that is after deposition but prior to nonvolatile nanotube switch operation. The behavior of the composite article is the behavior expected if, for example, the additional nanoscopic material is carbon (as measured during initial testing). FIG. 84B illustrates a table listing various carbon nanoscopic materials—i.e. various allotropes of carbon. As noted, these allotropes can be collectively referred to with the generic term, nanoscopic particles (NP). The presence/absence of a short range structural order for each set of allotropes is listed, as are thermal and/or electrical characteristics.

Figure 85:
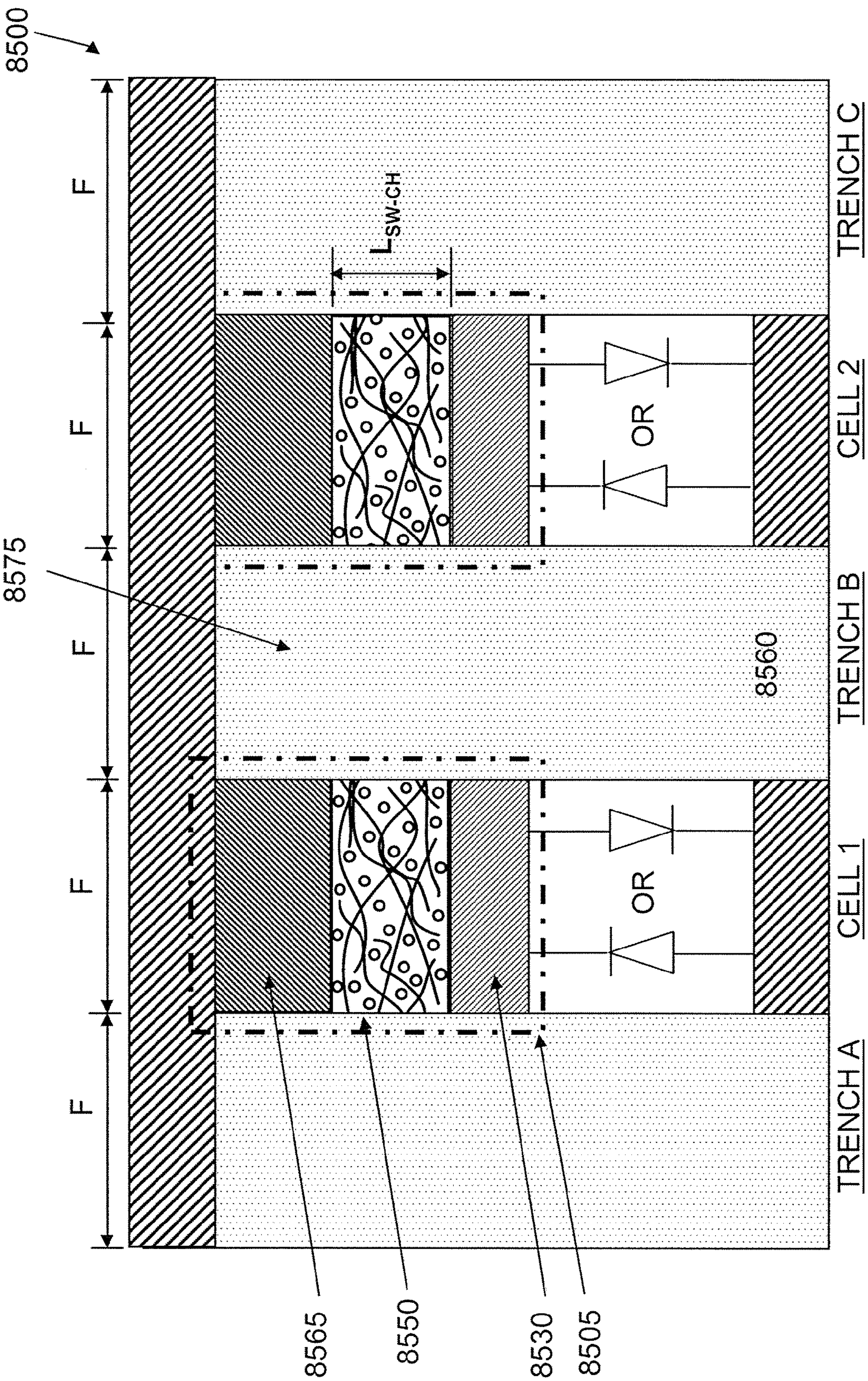
FIG. 85 illustrates a cross sectional view of nanotube diode cells having a mixed or composite nanoscopic material, according to some embodiments.

FIG. 85 illustrates two cells and corresponding components in a NV NT block diode memory array. FIG. 85 depicts cross section 8500 of nanotube block memory array 8560, which is a variation on that structure described above with reference to FIG. 40. Structure 8560 includes two cells, CELL1 and CELL2, separated by Trench B and bounded by Trench A and Trench C. The structure includes composite nanoscopic material switch 8505. The thickness of nanotube element 8550 (e.g. NP:CNT, as detailed above with reference to element 8350) is usually as thin as possible without resulting in a short circuit between upper and lower electrodes. As one of skill in the art will appreciate, patterning a thin layer facilitates achieving minimum cell dimension F which is the minimum defined dimension achieved with selected fabrication techniques and/or manufacture methods at a particular technology node. In this example, composite nanotube element 8550 may be deposited by spin-on or spray-on methods of fabrication, for example. For a technology node (generation) with F approximately 22 nm and a nanotube element thickness of approximately 22 nm for example, the nanotube region fills the available cell region. Lower level contact 8530 and upper level contact 8565 form the two terminal (contact) regions to nanotube 8550. Substrate material 8575 separates adjacent cells. The depth of composite nanotube element 8550 is depicted in the Figure as a channel length $L_{SW\text{-}CH}$. In one or more embodiments, $L_{SW\text{-}CH}$ of composite nanotube element 8550 will be substantially thinner than $L_{SW\text{-}CH}$ of a substantially pure nanotube element such as 4050 of FIG. 40. As noted, select diodes may be used to controllably read, write, and store memory states in each cell of the composite nanoscopic material NV NT block-based memory array.

FIG. 86 illustrates a table showing various switch configurations in which CNT material or CNT and additional nanoscopic material mixture may be employed. Table 8600 depicts in rows 1 to 11 each switch configuration or geometry. The table shows that in the various geometries discussed in previous FIGS. 56, 57, 81 and 82, an NP:CNT or other composite material may be used in place of a nanotube fabric. At present, the indicated geometries have been implemented with NP:CNT or materials having carbon nanotubes and various other additional nanoscopic materials. These examples are illustrative and non-limiting as yet other geometries or structural configurations using NP:CNT or other composite CNT materials are envisioned.

The first column 8601 of table 8600 lists various nonvolatile nanotube switch configurations, as exemplified in the indicated Figures. By way of example, the first entry of column 8601 refers to the geometrical arrangement depicted in FIG. 56A, structure 5600A which entails a substantially thin nanotube article (for ease of reference, substantially thin configurations are described here as 2D) in a substantially horizontal orientation. Other entries in column 8601 follow the aforementioned example. The second column 8602 identifies the reference number for the nanotube article corresponding to the structure indicated in column 8601. By way of example, the first entry of column 8602 indicates nanotube article is element 5602A depicted in FIG. 56A, structure 5600A. The third column 8603 and fourth column 8604 list configurations for first and second contacts, respectively, as they are oriented with respect to the nanotube article. In accordance with the aforementioned example, the first items in columns 8603 and 8604 indicate that in structure 5600A, both the first and second contacts may be disposed on top of the nanotube article, element 5602A.

The fifth column, 8605 simply indicates that element 8350 of FIG. 83, the NP:CNT material or carbon nanotube composite with additional nanoscopic material, may be used in place of a carbon nanotube material to form the element or block listed in column 8602. Moreover, table 8600 summarizes various NV NT diode configurations in which NV NT diode CNT blocks, traces and planes are replaced by composite material 8350. Incorporated references U.S. Pat. No. 7,394,687, U.S. patent application Ser. Nos. 11/280,786, 11/835,583, 11/835,613, and U.S. Provisional Patent Application No. 61/088,828 provide further detail of the various NV NT switch and NV NT diode configurations. Testing to date indicates similar and or comparable performance characteristics for a given NV NT structure or geometry that employs a CNT element or block as those performance characteristics for the same structure/geometry that employs an NP:CNT element or block having material 8350. Note that row 9 features those nanotube blocks having performance enhancing materials integrated with the nanotube materials. The performance enhancing materials are understood to entail active additional nanoscopic materials that participate actively in the switching mechanism. While performance enhancing materials describe in reference to FIG. 57C can include $SiO_2$, they can also include any number of optional additional nanoscopic materials. Thus, those embodiments in which NP is used as an additional nanoscopic material to form NP:CNT is just one particularly useful instance of a performance enhancing material.

Figure 87:
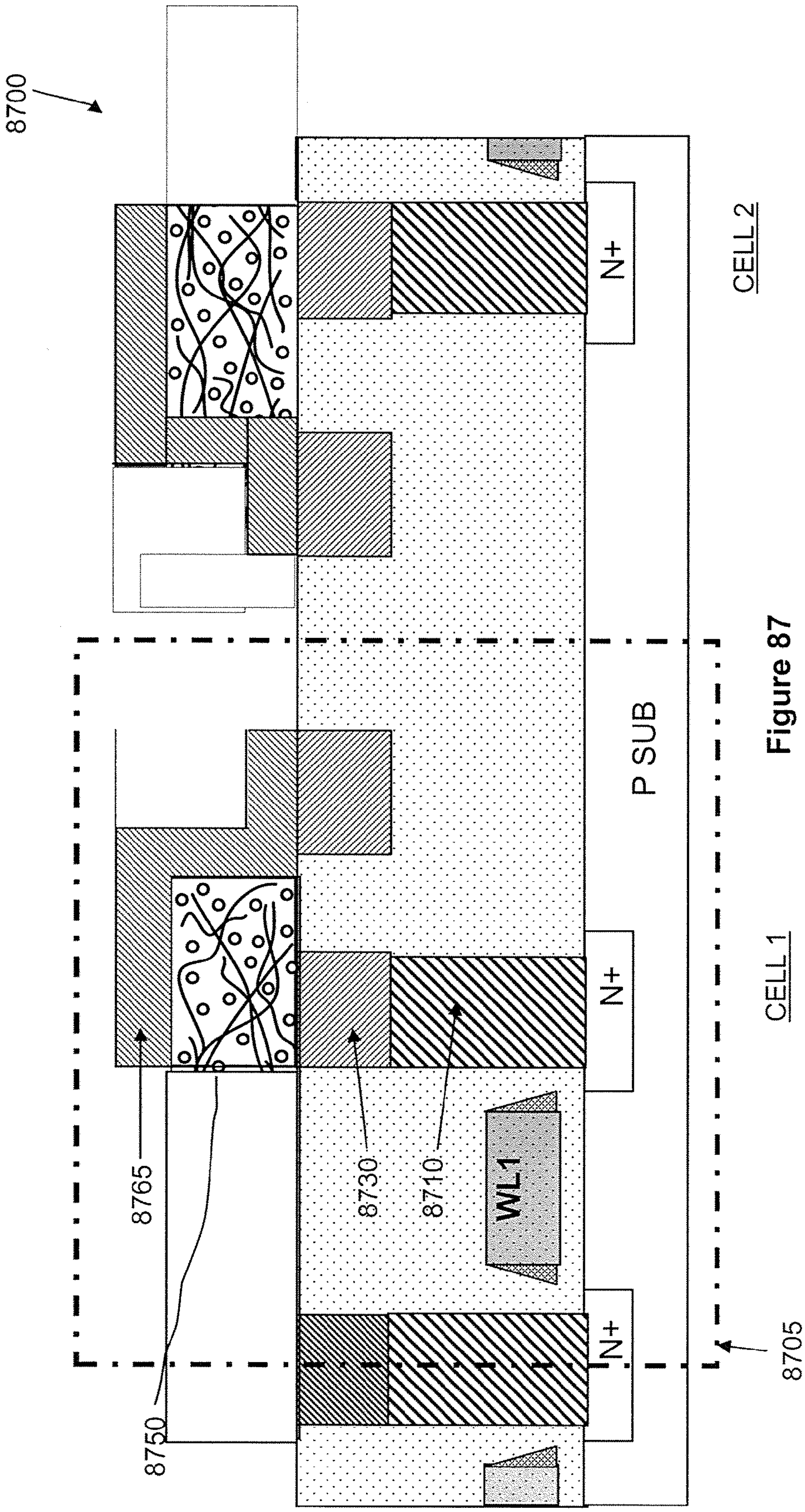
FIG. 87 illustrates a cross sectional view of cells having mixed or composite nanoscopic material block elements and corresponding cell select circuitry, according to some embodiments.

FIG. 87 depicts a NV NT switch corresponding to the cell structure discussed above with reference to FIG. 78. In contrast to 7800, cell structure 8700 having cell 8705 comprises a 3D NP:CNT block 8710. The NP:CNT block 8750 has top/end contact 8765 and bottom 8730 contact. Note that the cell structure implements geometrical configuration listed in row 6 of table 8600. The present cell select and control structure includes conductive plug 8710 connecting bottom contact 8730 to an N+ region embedded in P-type substrate PSUB. In the present cross sectional view word line WL1 is used as one portion of the cell select circuitry. Cell 8705 may be integrated on a 1024 bit array for the purposes of electrical testing to evaluate electrical characteristics of the mixed or composite nanoscopic material NP:CNT 8350 used to form block 8750. In one or more embodiments, tests include SET to program the cell (write 1), RESET to erase the cell (write 0) and READ to access the stored state of the cell. SET, RESET and READ functions are known in the art and discussed in greater detail above in relation to 3-D cell structures employing nanotube articles.

FIG. 88 summarizes typical RESET and SET electrical parameters, according to one or more embodiments. Specifically, typical applied pulse rise and fall times, duration, voltages and currents are listed. Testing has revealed that in certain embodiments and switch structures, the NP:CNT material or other nanotube-containing composite material enables a lower operating voltage than does the CNT-only material counterpart. For example, various embodiments of the NP:CNT NV NT switches function at operating voltages less than or equal to approximately 5.0V. As a point of comparison, various switching structures having CNT-only materials to form the carbon nanotube articles typically function at operating voltages between approximately 7.0 and 8.0V. Moreover, testing has suggested that the NP:CNT material, when used in certain switch configurations, may be faster in performing the SET function than a CNT-only material counterpart. In other words, the NP:CNT material may, in certain embodiments, be programmable under shorter duration write 1 operations. The NP:CNT articles (elements or blocks) may be used in multi-level store applications in order to achieve even greater density of programmable cells. Multi-level store applications are detailed in U.S. patent application Ser. No. 11/835,583, the entire contents of which are incorporated by reference. Test results were obtained using cells illustrated in FIG. 87 are representative of switching results for configurations illustrated in FIG. 86 and other configurations.

Figure 89:
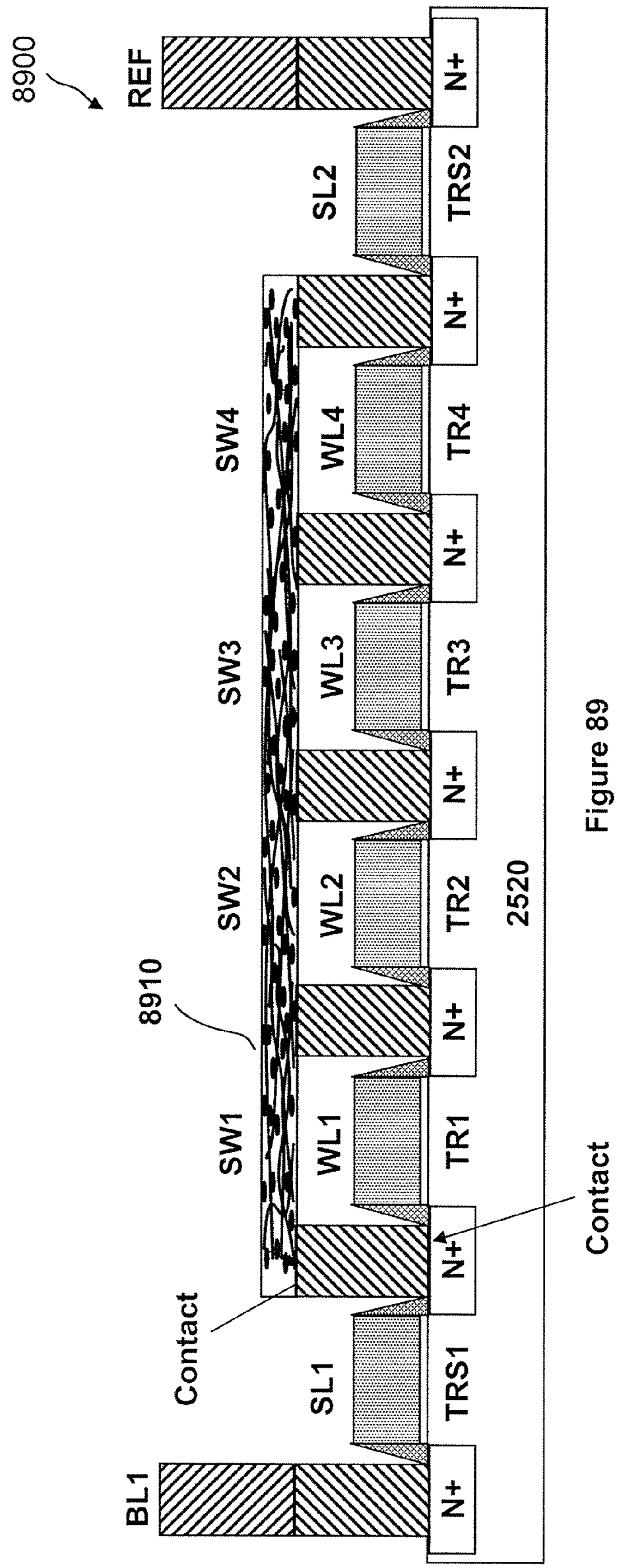
FIG. 89 illustrates a cross sectional view of an array of cells and corresponding cell select circuitry, each cell having mixed or composite nanoscopic material, according to some embodiments.

FIG. 89 illustrates a NV NT element-based NAND memory array according to one embodiment. Specifically, FIG. 89 illustrates a cross sectional view of NAND sub-array 8900. Patterned NP:CNT composite nanotube fabric 8910, in combination with stud vias (CONTACT), connect regions of each portion NP:CNT composite material to a corresponding FET diffusion N+ and define NV NT switch length. The composite NP:CNT material 8350 may be patterned over conventional FET layouts and used to form composite nanotube fabric element 8910. The width is defined by an etch operation. In certain embodiments the NAND subarray 8900 is disposed on a P substrate 8920. Various fabrication methods may be used to form NV NT switches above corresponding FETs, as detailed in incorporated reference U.S. patent application Ser. No. 11/835,583, filed Aug. 8, 2007 entitled "Latch Circuits and Operation Circuits Having Scalable Nonvolatile Nanotube Switches as Electronic Fuse Replacement Elements."

Specifically, NAND memory array 8900 includes a first bit line BL1, a reference line REF, write lines corresponding to each cell WL1-WL4 and corresponding switch regions SW1-SW4. The stud/vias form electrical connections to corresponding N+ diffusions of underlying FETs TR1-TR4, respectively. The select line SL1 enables an electrical connection between bit line BL1 and a contact on one side of the NAND array structure by activating transistor TRS1. The select line SL2 enables an electrical connection between reference line REF and a contact on the other side of the NAND array structure by activating transistor TRS2. Note that it is also possible to connect one side (contact) of the NAND array directly to reference line REF and eliminate select line SL2 and transistor TRS2.

Figure 90:
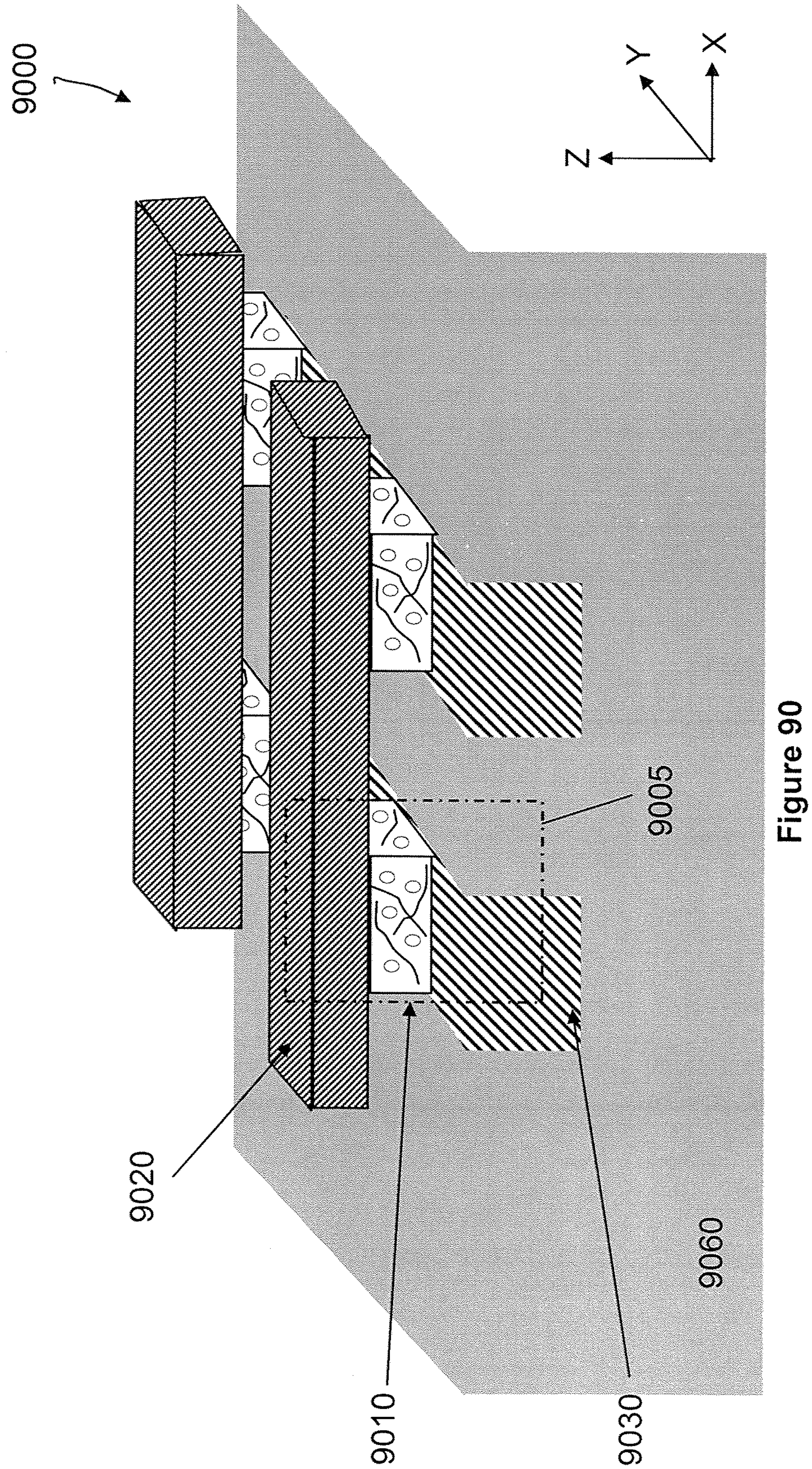
FIG. 90 illustrates a 3-D perspective view of an array of cells having top and bottom conductive traces and blocks of mixed or composite nanoscopic material, according to some embodiments.

FIG. 90 illustrates a perspective view of 2×2 nonvolatile cross point switch array of discrete programmable logic switches using NP:CNT material switching element 8350. Etching techniques and the layout/design used to produce array 9000 typically result in an easier fabrication process. In the present embodiment, nonvolatile cross point switch array 9000 comprises a thin layer of NP:CNT etched to form discrete NP:CNT blocks 9010. Array 9000 includes a substrate 9060 in which bottom conductive traces 9030 are embedded. The bottom conductive traces may comprise, for example, a first logic wiring layer. Disposed above the bottom conductive traces are upper conductive traces 9020 which may comprise, for example a second logic wiring layer. In nonvolatile cross point switch array 9000, the bottom and upper conductive traces 9020 and 9030, are arranged perpendicularly, with respect to the x-y plane (shown), but any number of other configurations may be suitable in other contexts. In the present example, each of the bottom and upper conductive traces 9030, 9020, intersect in a vertical region (along z-axis) where a discrete NP:CNT block 9010 is disposed. The discrete NP:CNT block 9010, at each such intersection, forms an active region between the bottom and upper conductive traces 9030, 9020, providing a vertical conductive pathway between the bottom and upper conductive traces. This vertical conductive pathway can be formed and unformed (corresponding to a low and high resistance path) between conductive traces. Structure 9000 and variation on it are described in detail in U.S. Provisional Patent Application 61/074,241, filed Jun. 20, 2008, entitled "Nram Arrays with Nanotube Blocks, Nanotube Traces, and Nanotube Planes and Methods of Making Same", the entire contents of which are hereby incorporated by reference.

Switching mechanisms for the vertical conductive pathway are described fully in incorporated U.S. patent application Ser. No. 11/835,613, entitled "Memory Elements and Cross Point Switches and Arrays of Same Using Nonvoltatile Nanotube Blocks," incorporated by reference in its entirety. Each bit line—word line combination (e.g. bottom and top conductive trace) selects a discrete NP:CNT block 9050, thereby selecting a discrete nanotube memory cell in the NRAM array. The resistance state of each NP:CNT block 9010 may thus be programmed to represent a memory state of each nonvolatile cross point switch used for logic signal routing. Multi-resistance states (values) may be used to represent multiple to generate logic weighting states programmed into the same nonvolatile nanotube block. As an example, one low resistance state and one high resistance state may be used to represent an activated routing path and an unactivated routing path, respectively. Alternatively, three low resistance states and one high resistance state may be used to store three logic weighting factors and one no connect represented as logical 00, logical 01, logical 10, and logical 11 states. More logic weighting states are possible using more resistance states. U.S. patent application Ser. No. 11/835,612 illustrates NRAM memories with multi-resistance states per nonvolatile nanotube storage location. Similar techniques may be used to generate multiple logic weighting states. The electrical signals for programming the weighting factor of each logic routing path is formed by altering the resistance state for each nanotube block as described fully in the incorporated references and may be selected according the various requirements of the particular application.

Constructed with NP:CNT material 8350 to form switching region 9010, array 9000 is capable of being SET and RESET at lower voltages than analogous cross point switch arrays using primarily CNT material. The switching element 9005 (dashed outline of switching region 9010 and top and bottom lines 9030, 9020) can be SET and RESET to ON or OFF states multiple times for programmable wiring. The switching function of each adjacent cell is largely independent but may experience certain amounts of capacitive coupling. Capacitive coupling at the intersection between approximately orthogonal conductors can cause unwanted noise coupling between adjacent lines and is factored into cross point switch design.

Switching element 9005 can be made of a thicker or thinner NP:CNT layer 9010 to minimize coupling noise as needed. The thickness of 9010 may be varied between approximately 2-5 nm to approximately 500 nm, for example, based on capacitance coupling considerations without inhibiting or compromising the switch operation. As noted above, the use of the NP:CNT material 8350 to form blocks 9010 enable switching for SET and RESET functions at or less than a device operating voltage of 5 V. Programmable wiring and implementation for array 9000 is described in detail in U.S. Provisional Patent Application No. 61/088,828, entitled "Nonvolatile Nanotube Programmable Logic Devices and a Nonvolatile Nanotube Field Programmable Gate Array Using Same," filed Aug. 14, 2008, the entire contents of which are herein incorporated by reference. U.S. Provisional Patent Application No. 61/088,828 specifically details field programmable gate array (FPGA) technology integrated with NV NT switches.

Figure 91:
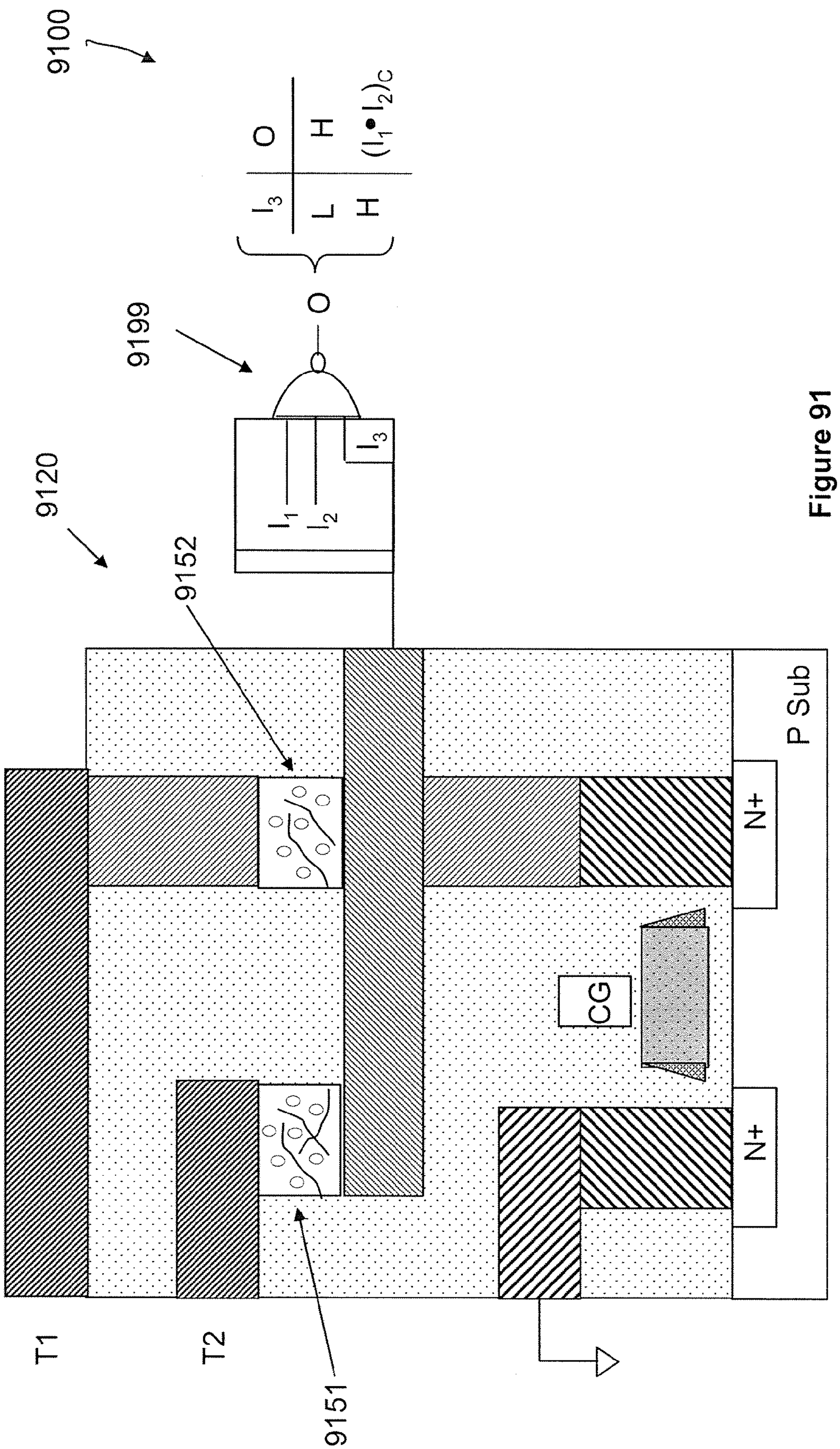
FIG. 91 illustrates a schematic representation of logic circuitry employing a pair of blocks comprising mixed or composite nanoscopic material and corresponding cell select circuitry, according to some embodiments.

FIG. 91 illustrates a reprogrammable logic circuit 9100 using switching elements constructed from NP:CNT material or other composite nanotube/additional nanoscopic material 8350. Reprogrammable logic circuit 9100 includes two NV NT switches 9151 and 9152 having a switching region of NP:CNT material. NAND circuit 9199 has inputs I1 and I2. Input I3 is determined by the high or the low resistance state of the NV NT switches 9151 and 9152. NV NT switches 9151 and 9152 are set using T1, T2 and FET control gate CG. The control features for the present arrangement 9120 are described in detail in incorporated reference U.S. Provisional Patent Application No. 61/088,828. The output 0 of NAND circuit 9199 may be modified by the state of I3, as explained in U.S. Provisional Patent Application No. 61/088,828. The resistance state of NV NT switches 9151 and 9152 may be changed or written multiple times and read multiple times. The thickness of the NP:CNT region of NV NT switches 9151 and 9152 may be used to determine the resistance and capacitance characteristics of the switches and their cumulative effect on the reprogrammable logic circuit 9100.

NV NT Switches Formed Using Carbon Nanotube Elements, Carbon Elements, and Various Non-carbon Elements As described in detail above, nonvolatile nanotube switches and blocks may be formed using a carbon nanotube-only material (CNT) or may be formed using a mixture of nanoscopic elements such as CNT with another nanoscopic material to form a composite material having carbon nanotubes and additional nanoscopic particles (NP:CNT). CNT-only material and NP:CNT material may be used to form nanoscopic switching elements and various devices. Various geometrical configurations and devices of interest include: NRAM® memory cells such as 7800 and 7900 illustrated in FIGS. 78 and 79, respectively; NV NT diode memory cells 4005 illustrated in FIG. 40; and NV NT diode memory cells

8000 illustrated in FIG. 80; cross point switches such as 8100 and 8200 illustrated in FIGS. 81 and 82, respectively; nanotube NAND arrays such as illustrated in FIG. 89; cross point switches such 9000 used for logic signal routing such as illustrated in FIG. 90; and programmable logic circuits such as illustrated in NanoLogic® circuit 9100 in FIG. 91.

In each such instance depicted in the Figures, the nonvolatile nanotube (NV NT) switches and NV NT blocks use nanotube material (CNT) of varying thickness and composition. Each device and geometrical configuration may also be constructed using a composite material, NP:CNT. When these NV NT switches and blocks include an additional nanoscopic material, a composite is formed from a mixture of the CNT with that additional material. As noted, the composite may be substantially homogeneous or heterogeneous. One example in which a composite material NP:CNT is used is depicted in FIG. 57C. The composite nanoscopic material in FIG. 57C includes the NV NT block 5700C which has insulating nanoscopic particles (NP). Another example in which a composite material NP:CNT is used is described in FIG. 83B. The composite nanoscopic material in FIG. 83B includes the NV NT switching material 8350 which has carbon nanoscopic particles (NP). Whether insulating nanoscopic particles, conducting nanoscopic particles, semiconducting nanoscopic particles or mixtures are selected to be the NP, depends on the fabrication constraints, performance objectives and desired applications. In certain embodiments it is desirable for the NP to be carbon based materials.

In a variety of embodiments, carbon-based materials may be chosen and fabricated to form carbon layers in contact with carbon nanotube layers so as to improve the performance of switches constructed from these layers. For example, the use of carbon layers may improve switch performance by lowering the operating voltage to less than 5 volts, lowering operating current to less than 50 μA, and improving the ability to tolerate high rapid thermal anneal (RTA) temperatures. The RTA temperature tolerance depends on the application. For example, for NRAM® memories in which memory arrays are formed, RTA temperatures of less than 500 to 600° C. for a short time may be sufficient. However, when forming NV NT diode memories such as illustrated in FIG. 40 in which diodes may be formed after the formation of NV NT switches, including stacked memory arrays, high RTA temperatures of 750° C. may be required. The RTA temperatures should not impact NV NT switch electrical characteristics. As memory cells are scaled to ever smaller dimensions such as less than 50 nm technology nodes for example, the amount of current available from smaller diode and FET select devices is reduced. Hence, improved NV NT switch electrical characteristics for dimensions less than 50 nm for example may include voltages of less than 5 volts, currents less than 50 μA for reset (and set) operations after exposure to RTA temperatures as high as 750° C., for example. Lower voltage and current operation enables reduced power dissipation and faster performance.

One way of attaining the aforementioned characteristics includes reducing contact resistance between carbon nanotubes and contacts. Reducing contact resistance may reduce operating voltage by enabling more of the applied voltage across the two terminals of the switch to appear across the active region of the switch. In another example, nanotube material may be processed and nanotube solutions may be formed to provide enhanced electrical characteristics in the resultant NV NT switches (such as those illustrated in FIGS. 40, 78, and 79 for example). That is, a new generation of materials that exhibit lower voltage switching at <5 volts, lower currents for reset (set) of <50 μA, and tolerance of RTA temperatures of 750° C. for NV NT switch dimensions of <50 nm enable scaling of cells sizes to smaller dimensions. These attributes may be further refined by adding carbon-based and non-carbon based materials to adjust density, reduce power dissipation, and increase performance.

Figure 92:
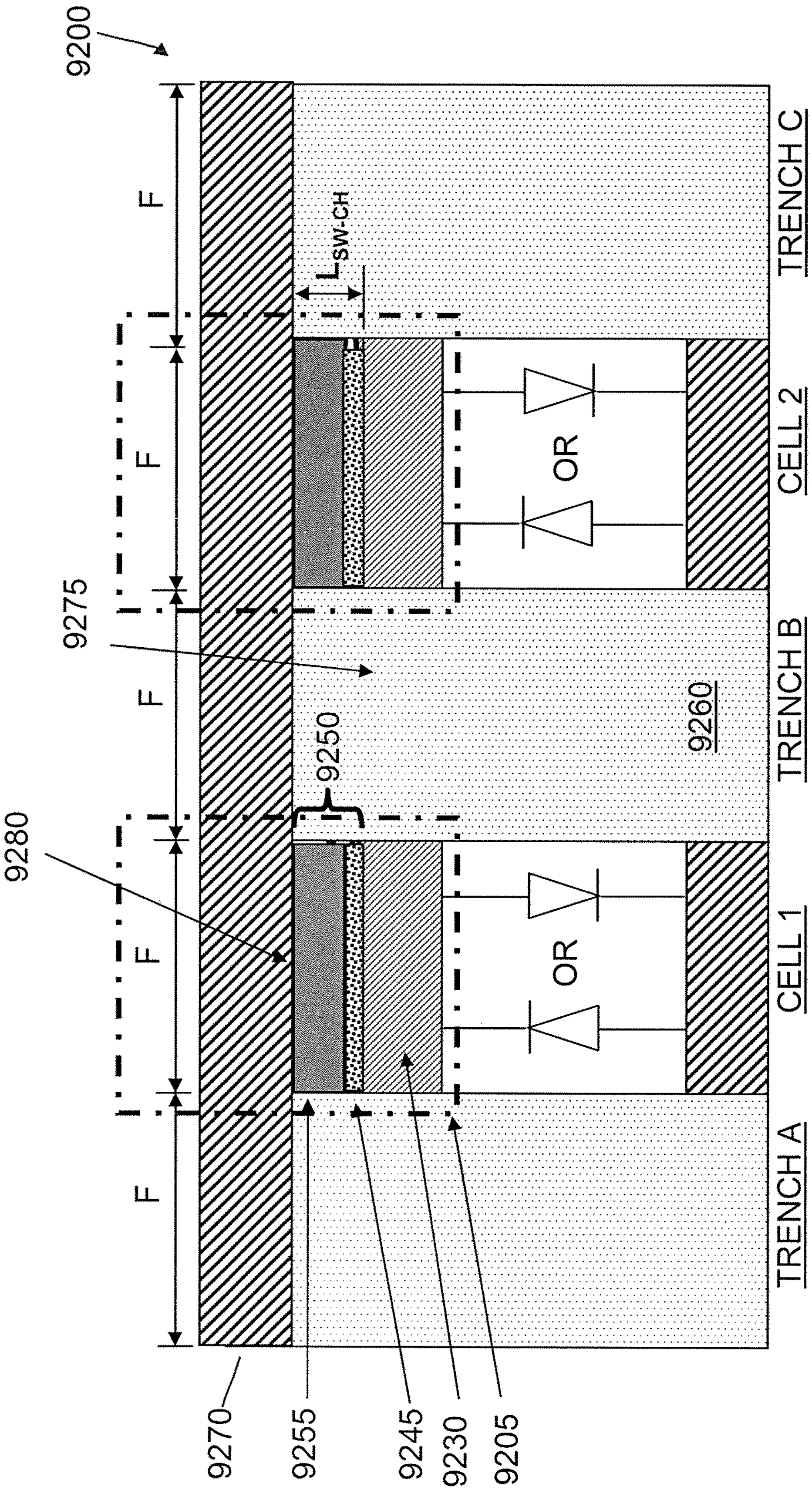
FIG. 92 illustrates a cross-sectional view of a pair of nanotube diodes and corresponding select circuitry, according to some embodiments.

FIG. 92 illustrates a cross-sectional view of a two cell memory array, with each cell formed by a 3-D NV NT diode. Specifically FIG. 92 depicts cross section 9200 of NV NT diode memory array 9260 that includes nonvolatile (NV) nanoscopic carbon stacks. NV NT diode memory array 9260 is a variation on that structure described above with reference to FIGS. 40, 80, and 85, the latter of which includes element 8550 having a NP:CNT matrix. In the case of FIG. 40, the adjacent pair of 3-D NV NT diodes are referred to as having NV NT block storage nodes and are described in detail in incorporated reference U.S. Ser. No. 11/835,613, filed Aug. 8, 2007, entitled "Memory Elements and Cross Point Switches and Arrays of Same Using Nonvolatile Nanotube Blocks." The structure of the NV NT diode memory array 9260 includes two cells, CELL1 and CELL2, separated by Trench B and bounded by Trench A and Trench C which are filled with insulator 9275.

The NV NT diode memory array 9260 in fact includes nonvolatile nanoscopic carbon stacks having multiple elements. The nanoscopic carbon stacks forming NV NT diode memory array 9260 are not composed exclusively of nanotubes but instead include one or more layers of carbon and carbon nanotubes to form one or more carbon elements and carbon nanotube elements, respectively. Whereas in previously described embodiments, such as FIG. 57C and FIG. 85 in which the NV NT block storage nodes in memory arrays formed using NV NT diodes are constructed of material comprising a somewhat homogeneous mixture or composite having carbon nanotubes (CNT) and additional nanoscopic particles (NP), the present nanoscopic element stack 9250 comprises at least two distinct layers. In the present embodiment the NV NT diode includes a nanoscopic element stack 9250 as follows. The bottom layer is a layer comprising substantially carbon nanotube (CNT), patterned to form a nanotube element 9245. The top layer is a layer comprising substantially carbon layer, patterned to form a carbon element 9255. Thus in the present embodiment, the two elements are disposed to form a stack of elements, nanoscopic element stack 9250. While many of the ensuing embodiments are described with reference to carbon layers patterned to form carbon elements, other non-carbon layers are envisioned and may be used.

The NV NT switch 9205 is formed by replacing upper level (top) contact 4065 in FIG. 40 with a carbon element 9255 upper level contact. This carbon element 9255 upper level contact is formed as part of a nanoscopic element stack 9250. As a result, a newly defined upper level (top) contact 9280 is formed in the overlap region between the array wire 9270 and nanoscopic element stack 9250. This overlap region 9280 is illustrated in FIG. 92 and defines the lateral extent of the NV NT switch 9205 (the switch is indicated in the Figure by enclosing dashed line). One will note that in the present embodiment, the lateral extent of the NV NT switch 9205 is the minimum fabrication dimension "F" defined in accordance with the particular fabrication steps and equipment used.

In the present example, nanoscopic element stack 9250 has upper level carbon element 9255 and underlying carbon nanotube (CNT) element referred to as nanotube element 9245. Thus together, the carbon element 9255 and nanotube element 9245 form a heterogeneous block referred to as nanoscopic element stack 9250. The top surface of carbon element 9255 is the portion of nanoscopic element stack 9250 that is in contact with array wire 9270, as noted above. Therefore, it is the interface between the carbon element 9255 and the array wire 9270 that forms the upper level (top) contact 9280. Similarly, it is the interface between the bottom surface of the nanotube material 9245 and bottom contact 9230 which forms the lower level (bottom) contact corresponding to element 4030 illustrated in FIG. 40.

Within upper level carbon element 9255 can be found any range of carbon materials. As described in greater detail above, the carbon layer can comprise one or more carbon allotropes such as amorphous carbon, graphene, graphite, diamond, fullerenes such as but not limited to C20, C26, C28, C36, C50, C60, C70, C72, C76, C84, C540, etc. which includes carbon nanotubes (similar to carbon nanotubes in carbon element 9245), nanoscopic carbon elements, as well as any variety of impurities as described further below with respect to FIG. 96. The carbon element 9255 may be deposited using PECVD, CVD, e-beam evaporation, spin-on, and other methods of fabrication described further below with respect to methods 10450 of depositing carbon included in methods of fabrication 10400 illustrated in FIGS. 104A and B. Carbon element 9255 has properties similar to those described for generic nanoscopic carbon elements in FIGS. 84A and 84B even though carbon element 9255 is deposited as a carbon layer (film) and not formed from carbon nanoscopic particles.

Within the lower level carbon nanotube element 9245 can be found any range of carbon nanotube materials. As described in detail above, carbon nanotubes can comprise one or more of multi-walled, single-walled, semiconducting and/or metallic nanotubes, or nanotubes having other attributes. Due at least in part to the performance attributes of carbon element 9255, inventors have found that the thickness of carbon nanotube element 9245 may be less than corresponding nanotube element 4050 illustrated in FIG. 40. When used in combination with carbon element 9255, carbon nanotube element 9245 may be a thin nanotube layer having a thickness of approximately 1-20 nm, for example. Corresponding carbon element 9255 may be in the range of approximately 5 to 200 nm, for example. The NV NT switch 9205 channel length $L_{SW\text{-}CH}$ is defined as the distance between the upper and lower surfaces of NV nanoscopic element stack 9250. Nanotube element 9245 need not, however, be thin. Relatively thick layers of carbon nanotubes such as 20 to 200 nm for example may also be used to provide nanotube element 9245 and may be preferred in certain applications.

Forming the 3-D NV NT diodes in CELL 1 and CELL 2 of NV NT diode memory array 9260 having nanoscopic element stacks has a number of advantages. The first prominent advantage involves the highly compact cell size of approximately $4F^2$ and, correspondingly, the smallest chip area implemented to date. As a result, the embodiment depicted in FIG. 92 enables some of the highest density nonvolatile memories. The second prominent advantage is that a thin carbon nanotube layer 9245 may be used in a variety of geometrical configurations. For example, the nanotube element 4050 in FIG. 40 and nanotube element 8050 in FIG. 80 may each be replaced with nanoscopic element stack 9250. Incorporating carbon element 9255 in NV nanoscopic element stack 9250 enables inventors to successfully use of a very thin nanotube element 9245. As a result, the amount of carbon nanotubes needed to form NV nanoscopic element stack 9250 may be reduced and the NV NT switch 9205 performance may be enhanced by enabling a lower operating voltage. A third prominent advantage is that in the aforementioned design, a thin nanotube element may be deposited in one or a few applications, thereby reducing process complexity. In sum, the present NV NT diode memory array 9260 structure offers some of the most compact, lowest power, and highest performance cells to date.

FIG. 92 illustrates the use of nanoscopic element stack 9250 described further below with respect to FIG. 96A. Various nanotube elements and nanoscopic element stacks may be used instead, corresponding to those illustrated in FIGS. 96B-I and FIGS. 97A-C illustrated below.

Figure 96B:
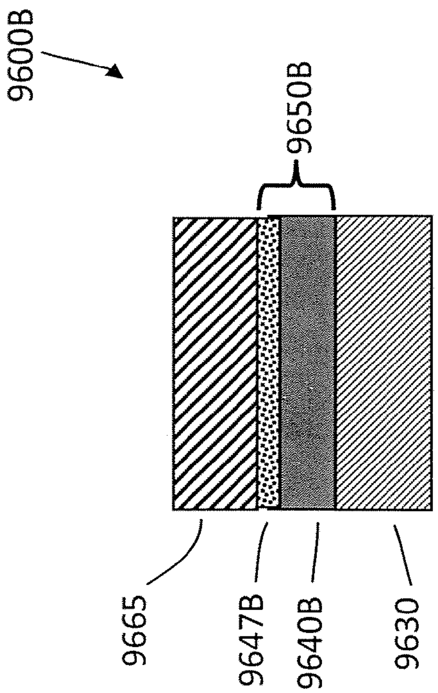
FIG. 96A-I illustrate a cross sectional views of two terminal nonvolatile nanotube (NV NT) switches having nanoscopic element stacks, and various ion implantation steps, according to various embodiments.
Figure 96C:
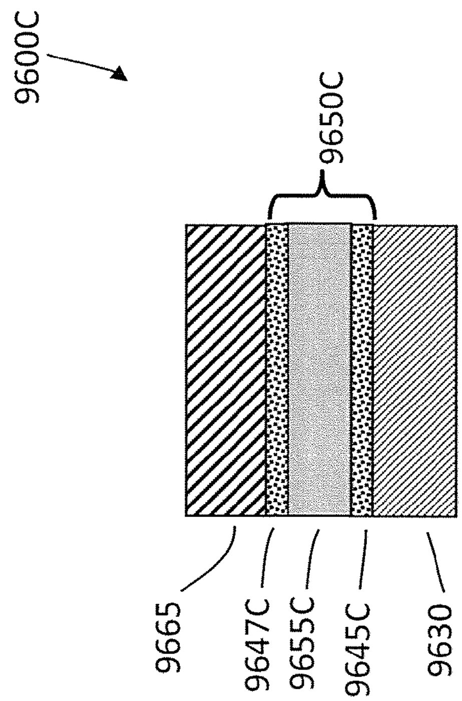
Figure 96A:
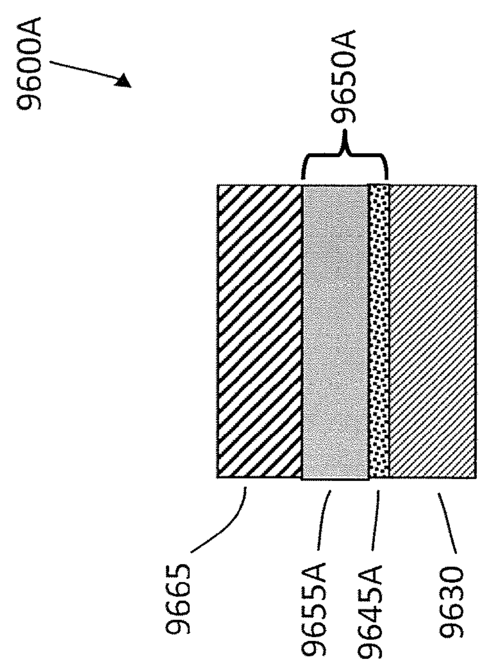

FIG. 92 described above illustrates cross section 9200 of NV NT diode memory array 9260 that includes NV NT switch 9205 with nanoscopic element stack 9250 which corresponds to nanoscopic element stack 9650A illustrated in FIG. 96A. The supporting substrate, not shown in FIG. 92, may be an insulator such as ceramic or glass, a semiconductor, or an organic rigid or flexible substrate and the organic, and may be flexible or stiff. Insulator 9275 filling trenches A, B, and C may be $SiO_2$, SiN, $Al_2O_3$, or another insulator material. Upper and lower level contacts 9280 and 9230, respectively, may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, WN, TiCN, TaN, $CoSi_x$ and $TiSi_x$.

Figure 93:
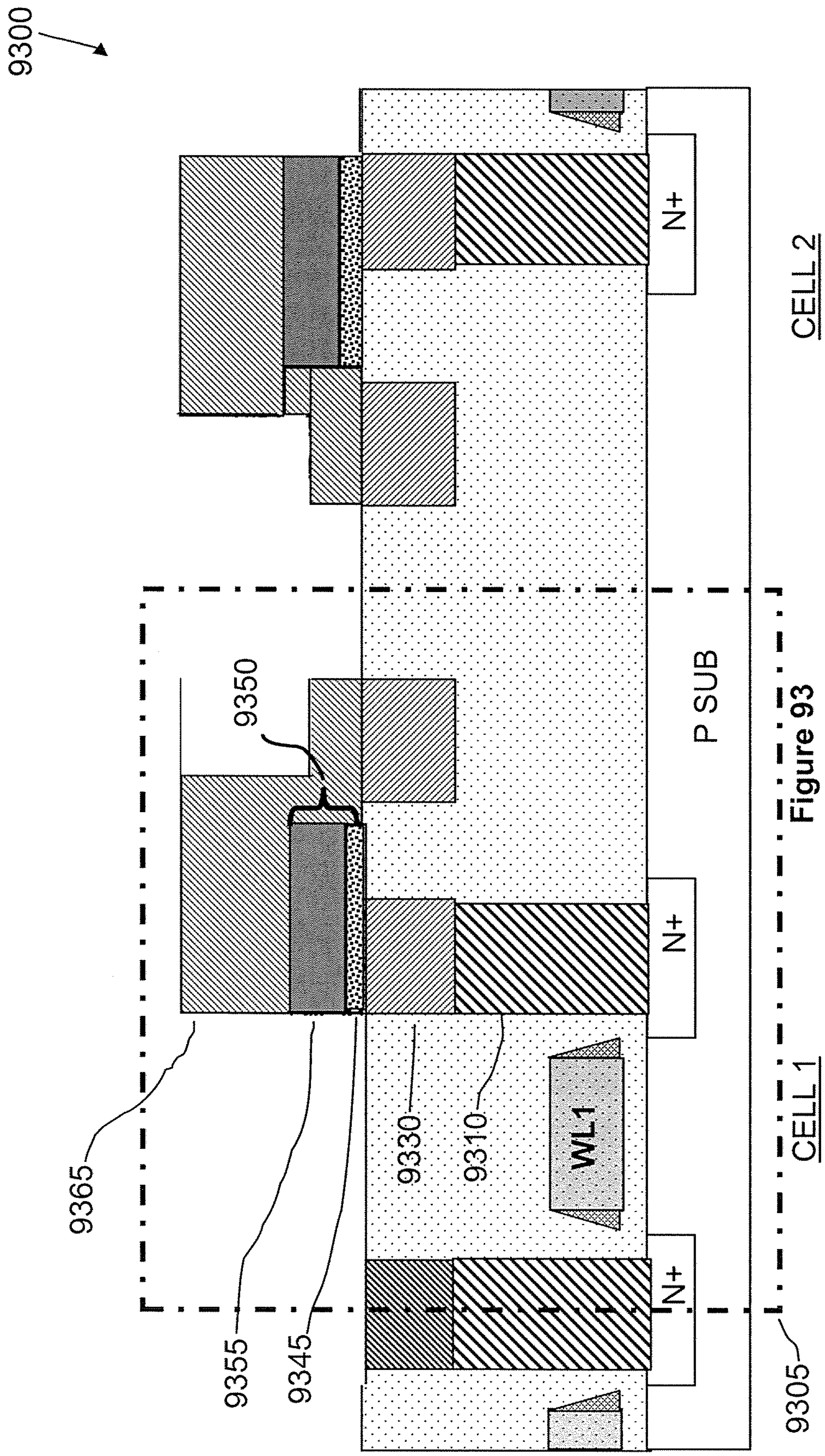
FIG. 93 illustrates a cross-sectional view of a pair of cells and corresponding cell select circuitry, according to some embodiments.

FIG. 93 depicts a pair of NV NT switches and portions of select circuitry corresponding to the NRAM® cell structure discussed above with reference to FIG. 87. While the geometries are similar, the switching elements differ. The cell structure 8700 has cell 8705 that comprises a nanoscopic element stack 8750, also referred to as NP:CNT block 8750, where the NP and CNT form a mixed or composite matrix. The structure 9300 has cell 9305 that comprises a nanoscopic element stack 9350 where the carbon element 9355 and nanotube element 9345 form distinct layered regions. Nanoscopic element stack 9350, like nanoscopic element stack 8750 (NP:CNT block 8750), abuts top/end contact 9365 and bottom end contact 9330. Note that the cell structure implements geometrical configuration listed in row 6 of table 8600 shown in FIG. 86 but with new switching element 8350 in column 8605 replaced by nanoscopic element stack 9350. Similarly, all NV NT switches listed in column 8601 of table 8600 may substitute nanoscopic element stack 9250 in the place of switching element 8350 in column 8605 to form operable devices. Other geometries are also envisioned. For example, nanoscopic element stacks illustrated in FIGS. 96 and 97.

The present cell select and control structure include conductive plug (stud) 9310 connecting bottom contact 9330 to an N+ region embedded in P-type substrate PSUB. In the present cross sectional view, word line WL1 forms one portion of the cell select circuitry. CELL 1, structure 9305, may be integrated on a 1024 bit array for the purposes of electrical testing to evaluate electrical characteristics of nanoscopic element stack 9350 formed using carbon element 9355 and nanotube element 9345. In one or more embodiments, tests include SET to program the cell (write 1), RESET to erase the cell (write 0) and READ to access the stored state of the cell. SET, RESET and READ functions are known in the art and discussed in greater detail above in relation to 3-D cell structures employing nanotube articles as described in, U.S. patent application Ser. No. 11/835,613, filed Aug. 8, 2007, entitled "Memory Elements and Cross Point Switches and Arrays of Same Using Nonvolatile Nanotube Blocks," the entire contents if which are incorporated by reference.

FIG. 94 is a chart summarizing typical RESET and SET electrical parameters, according to one or more embodiments. Specifically, typical applied pulse rise and fall times, duration, voltages and currents are listed. Testing has revealed that in certain embodiments and switch structures, the nanoscopic element stack 9350 containing carbon element 9355 and nanotube element 9345 enables a lower operating voltage than does the CNT-only material counterpart. For example, various embodiments of the elements 9350 function at operating voltages less than or equal to approximately 5.0V. As a point of comparison, various switching structures having CNT-only materials to form the carbon nanotube articles typically function at operating voltages between approximately 7.0 and 8.0V. Moreover, testing has suggested that the nanoscopic element stack 9350, when used in certain switch configurations, may be faster in performing the SET function than a CNT-only material counterpart. In other words, the nanoscopic element stack 9350 and variations thereof may, in certain embodiments, be programmable under shorter duration SET (write 1) operations. The nanoscopic element stacks 9350 (articles) may be used in multi-level store applications in order to achieve even greater density of programmable cells. Multi-level store applications are detailed in U.S. patent application Ser. No. 11/835,583, now US Patent Publication No. 08-0159042, the entire contents of which are incorporated by reference. Test results were obtained using cells illustrated in FIG. 93 but are representative of switching results for configurations illustrated in FIG. 86 in which composite NP:CNT block 8350 switching element is replaced with nanoscopic element stack 9350 and other configurations.

Figure 95:
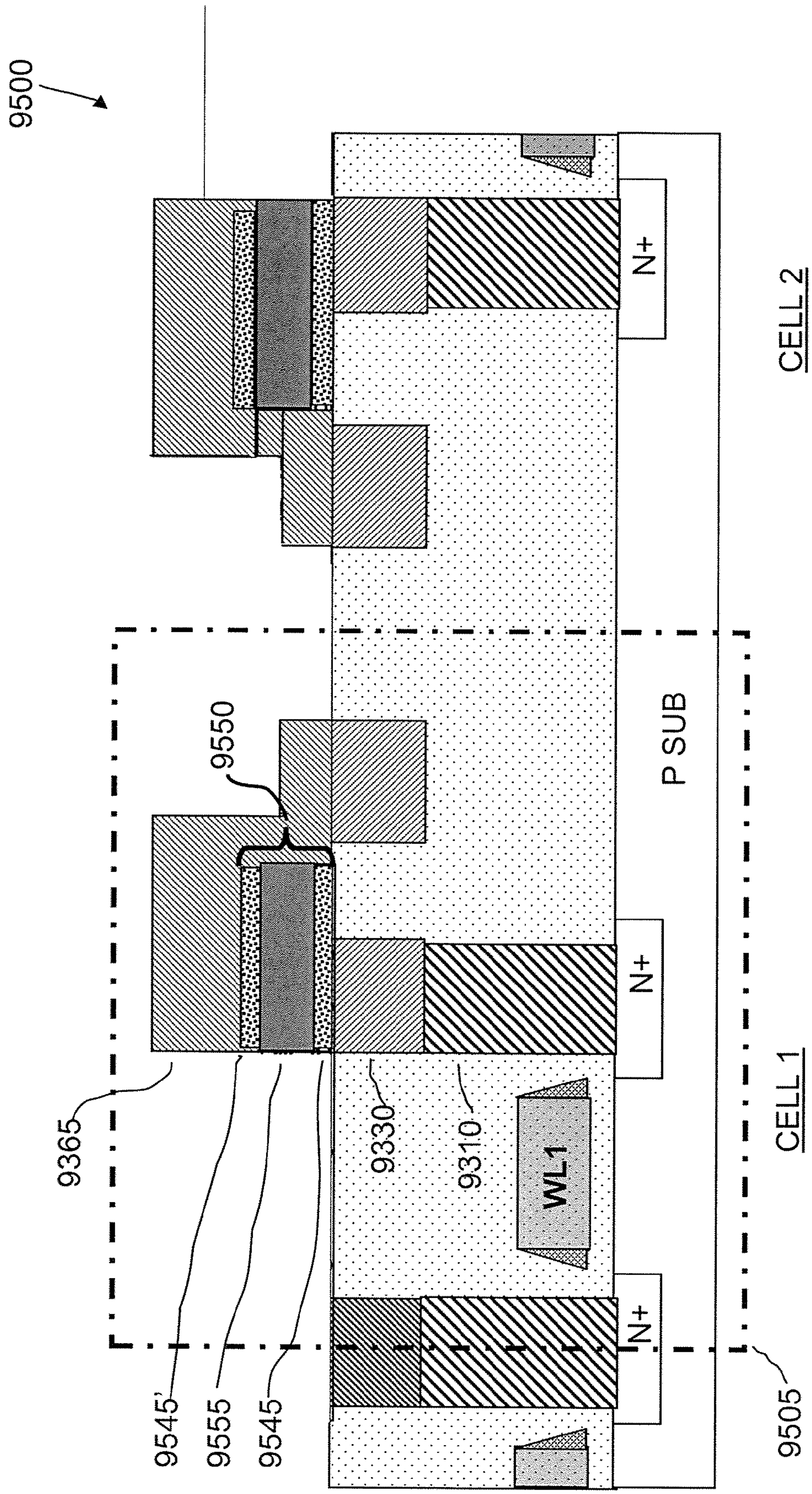
FIG. 95 illustrates a cross-sectional view of a pair of cells and corresponding cell select circuitry, according to some embodiments.

FIG. 95 depicts cross section 9500 and a NV NT switch within a cell 9505 structure corresponding to the cell 9305 structure illustrated in FIG. 93. Cell 9505 corresponds to cell 9303 except that nanoscopic element stack 9350, which includes carbon element 9355 and carbon nanotube element 9345, is replaced with nanoscopic element stack 9550 which includes a nanotube element 9545' in contact with top/end contact 9365, carbon element 9655 with topside in contact with the underside of nantotube element 9545', and a nanotube element 9545 in contact with the underside of carbon element 9555 and bottom contact 9330. Cell 9505 may be integrated on a 1024 bit array for the purposes of electrical testing to evaluate electrical characteristics of the NV NT switch forming the NRAM® cell 1 storage element which includes nanoscopic element stack 9550. In one or more embodiments, tests include SET to program the cell (write 1), RESET to erase the cell (write 0) and READ to access the stored state of the cell. SET, RESET and READ functions are known in the art and discussed in greater detail above in relation to 3-D cell structures employing nanotube articles. Cell 9505 may be integrated on a 1024 bit array for the purposes of electrical testing to evaluate electrical characteristics of NV nanoscopic carbon element. In one or more embodiments, tests include SET to program the cell (write 1), RESET to erase the cell (write 0) and READ to access the stored state of the cell. SET, RESET and READ functions are known in the art and discussed in greater detail above in relation to 3-D cell structures employing nanotube articles. Test results are similar to those described in FIG. 94 for cell 9305.

FIG. 96A illustrates a nonvolatile nanotube switch 9600A constructed from a nanoscopic element stack. This is schematically represented in FIG. 96A with nanoscopic element stack 9650A. Nanoscopic element stack 9650A corresponds to nanoscopic element stack 9250 in FIG. 92. The composite material comprises nanotube element 9645A and carbon element 9655A. In the present example, carbon element 9655A is disposed over nanotube element 9645A to form substantially heterogeneous layers. As described below with reference to FIG. 96, when forming nanoscopic element stack 9650A, carbon element 9655A and nanotube element 9645A may be patterned at the same time. Elements 9665 and 9630 are contacts to nanoscopic element stack 9650A.

In the embodiments described below, the carbon material (carbon NP:CNT) may comprise one or more allotropes of carbon, for example, amorphous carbon. The discussion of performance and fabrication advantages will focus on NV nanoscopic element stacks for purposes of illustration. One of sufficient skill in the art will understand that other similar combinations are envisioned and within the scope of the present disclosure. Nanoscopic element stack 9650A is discussed in detail below. In the ensuing discussion, carbon elements will be used to refer to those materials in which one or more allotropes of carbon, including carbon nanotubes, are present. The particular allotrope, amorphous carbon, is referred to here to exemplify the variability of the carbon element material. In certain embodiments, NV nanoscopic carbon elements may consist of a plurality of different carbon structures that may repeat their atomic arrangement over comparatively short periods and may, in fact, vary their atomic arrangement during switching operation.

Within the NV nanoscopic element stack 9650A, there may be a variety of carbon materials, depending on the fabrication methods used. For example, portions of nanoscopic element stack 9650A may include electrically conductive regions, electrically nonconductive regions, thermally conductive regions, thermally nonconductive regions, and mixed electrically and thermally conducting regions. The electrically conductive regions may be conductive as-deposited, non-electrically conductive as-deposited, in situ-activated conductive regions. Electrically conductive paths in nanoscopic element stack 9650A form and uniform with applied voltage and/or current. Such regions may include various allotropes of carbon such graphite, diamond, amorphous carbon, Buckminster-fullerenes, and carbon nanotubes of various types. Characteristics of various regions of nanoscopic element stack 9650A correspond to those properties are listed in FIGS. 84A and 84B and described further above. In certain embodiments, the NV nanoscopic element stack may be constructed so that the ratio of the carbon element and nanotube element materials is optimized to enhance overall switch performance, by lowering switching voltage to less than 5 volts for example, and adjusting for the intended application. As a result, the switching element 9650A has the flexibility to be integrated into a wide range of nonvolatile memory and programmable logic applications.

Various characteristics of nanoscopic element stack 9650A described further above optimize the composition of nanoscopic element stack 9650A in terms of less fabrication complexity and electrical performance such as switching voltages below 5 volts. A variety of allotropes of carbon are envisioned based on methods of NV nanoscopic carbon element fabrication. An important consideration in achieving lower switch operating voltages is minimizing contact resistance and thereby maximizing the portion of applied voltage to terminals of NV NT switch 9600A that appears across nanoscopic element stack 9650A. For example, this involves controlling the contact resistance between top contact 9665 and carbon element 9655A and bottom contact 9630 and nanotube element 9645A of nanoscopic element stack 9650A. In addition, the interface between bottom surface of carbon element 9655A and the top surface of nanotube element 9645A may be optimized for performance as well. Optimization of electrical characteristics may be achieved by using carbon material and methods of fabrication that produce in carbon element 9655A composed of various allotropes of carbon. Also, a variety of nanotubes may be used in forming nanotube element 9645A: semiconducting, metallic, single-walled, multi-walled, etc. These, and other methods of fabrication may be selected to optimize nanoscopic element stack 9650A according to the requirements of particular applications.

The nanoscopic element stack 9650A can be formed from a plurality of performance enhancing materials other than allotropes of carbon or carbon black. For example, noncarbon material such as silicon, Ge, and other semiconductor materials may form the additional material. Silicon based materials include but not are not limited to, silicon oxide and/or silicon nitride particles. Other nanoscopic particles of Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silcides such as RuN, RuO, TiN, TiCN, WN, TaN, CoSix and TiSix may be used to provide the additional material. Yet other examples of performance enhancing materials such as porous dielectric materials (e.g. porous $SiO_2$) are envisioned to provide enhanced structure for pattern definition and etching, used to prevent penetration of the top electrode during deposition, and enhanced operation through improved ion implant control in the CNT layer. For those skilled in the art of porous dielectric materials, other examples in addition to porous $SiO_2$ are porous HSQ (hydrogen silsesquioxane), porous MSQ (methylsilsesquioxane), porous silicon oxynitride, and proprietary materials such as porous SiLK available from Dow Chemical Company, Silica Xerogels available from Honeywell Electronics Materials, and Orion™ a SiCOH PECVD film available from Trikon.

In each instance, the additional material is used to enhance the performance of the nanoscopic element stack 9650A material, from which the devices and/or switches are formed. In some embodiments the selected included material is inert, meaning that it does not participate in the programming of nonvolatile resistance states within the nanoscopic element stack 9650A of NV NT switch 9600A. In yet other embodiments, the selected included material is active, meaning that is does participate in the programming of nonvolatile resistance states within the NV NT switch 9600A. Further, in some embodiments, more than one type of selected included material is used.

NV NT switch 9600A illustrates one of a number of NV carbon-based structures. Other examples of NV NT switch structures are illustrated further below in FIGS. 96B-96I and FIGS. 97A-97C and may be used to enable desired switch performance in various applications. In some applications it may be desirable for NV NT switches to be normally ON and to have lower NV NT switch resistance between top and bottom contacts. In other applications it may be desirable for NV NT switches to be normally ON but have higher initial resistance between top and bottom contacts to ensure that small diode steering devices or small FET select devices are able to supply sufficient current to switch NV NT switches to an OFF (high resistance) state and then back to an ON (low resistance state) state. ON resistance values may be in the 100 kΩ to 1 MΩ range and OFF resistance values may be 100 MΩ and higher range, for example. In still other applications it may be desirable for NV NT switches to be normally OFF or to at least have a relatively high resistance as-fabricated. Also, NV NT switch structures may have different electrical characteristics based on the sequence of fabrication. So for example, NV NT switch 9600A and NV NT switch 9600B may exhibit somewhat different electrical characteristics because carbon nanotube element 9645A is in contact with bottom contact 9630 in NV NT switch 9600A while carbon nanotube element 9647B is in contact with top contact 9665 in NV NT switch 9700B, as described further below.

For NV NT switch 9600A, during the fabrication of nanoscopic element stack 9650A described further below with respect to FIGS. 104 and 105, carbon nanotube element 9645A is formed in electrical and physical contact with the top surface of bottom contact 9630. There is no penetration of bottom contact 9630 conductor material within the porous carbon nanotube element 9645A region (boundaries). Carbon element 9655A is formed on the top surface of porous carbon nanotube element 9645A. Some carbon material penetration may occur in the region near the top of carbon nanotube element 9645A which may affect the electrical switching characteristics of NV NT switch 9600A.

While top and bottom contacts are described in terms of conductive material, top and bottom contacts may be formed of semiconducting material such as silicon, germanium, and others. Silicon, for example, may be P-type or N-type and doped over a broad range of dopant concentrations values from near-intrinsic high resistivity to degenerately doped low resistivity. Various dopants including boron, phosphorous, or arsenic, for example, may be used and are well known in the industry.

In the case of NV NT switch 9600B illustrated in FIG. 96B, during the fabrication of nanoscopic element stack 9650B, carbon element 9640B is formed in electrical and physical contact with bottom contact 9630. Then, nanotube element 9647B is formed on the top surface of carbon element 9640B making electrical and physical contact. Unlike nanoscopic element stack 9650A, there is no penetration of carbon element 9640B within the porous CNT 9647B region. Top metal 9665 conductor material is formed on the top surface of CNT element 9647B. This metal conductor may penetrate in the region near the top of CNT element 9647B which may affect the electrical switching characteristics of NV NT switch 9600B.

FIG. 96C shows NV NT switch 9600C with the nanoscopic element stack 9650C in contact with top contact 9665 and bottom contact 9630. Nanoscopic element stack 9650C includes two CNT regions 9647C and 9645C in contact with the top surface of and bottom surface of carbon element 9655C, respectively. The CNT elements 9645C and 9647C are porous. Therefore some penetration of carbon element 9655C into the top region of CNT 9645C and some penetration of top contact 9665 conductor material into the top region of CNT 9647C may occur. Electrical characteristics of NV NT switch 9600C may differ somewhat from those of NV NT switches 9600A and 9600B.

As described above with respect to FIG. 77, current steering diodes may be formed using high annealing temperatures of approximately 750° C. for example. For example annealing temperatures in the range of 700° C., and in some cases as high as approximately 800° C. may be required for durations as long as approximately one hour. For some array configurations, such as illustrated in FIG. 92, diodes are formed before the formation of NV NT switch 9205 so that the carbon elements are not exposed to these high temperature anneals. However, NV NT switch 9205 may also be formed first follows by diode formation and therefore exposed to high temperature diode anneal conditions. Or NV NT diode memory array 9260 may be stacked in layers as described with respect to FIG. 77 such that all NV NT switches are exposed to high temperature diode anneal conditions described further above.

Various NV NT switch configurations such as NV NT switch 4005 shown in FIG. 40, NV NT switch 8505 shown in FIG. 85, and NV NT switch 9205 shown in FIG. 92 include carbon structures and conductor materials compatible with high anneal temperatures. However, NV NT switch structures, initially at relatively low resistance ON states, may change if those NV NT switch structures are exposed to high annealing temperatures. The resistance of NV NT switch resistance states, such as ON state resistance for example, may change when exposed to high anneal temperatures during rapid thermal anneal (RTA) at temperatures in the range of 700 to 800° C. Such resistance states may increase or, more typically, decrease to relatively low values in the 1 kΩ to 10 kΩ resistance range for example. Such changes may occur because contact resistance between top contact and bottom contact conductor material and NV nanoscopic carbon elements has changed for example. Also, resistance change may occur in nanoscopic element stacks themselves for example. Incorporated reference U.S. Provisional Patent Appl. No. 61/074,241 describes potential concerns associated for NV NT switches with relatively low ON resistance state values and describes various approaches for increasing ON resistance state values.

In certain embodiments, an amorphous carbon layer or a high resistance region within the nanoscopic element stack is used in the construction of NV NT switch structures to increase the initial resistance of the nanoscopic element stack. In such embodiments, various modifications may be made with the use of the process flow and resultant structures described in detail above and with reference to the preceding Figures. In certain embodiments, NRAM® cells may be formed by providing an amorphous carbon layer. Upper metal or dielectric layers may be deposited over the nanotube layer and provided such that they do not penetrate into the nanotube fabric or have only limited penetration into the nanotube fabric. To control the penetration of the metal or dielectric layer into the nanotube layer, characteristics of the nanotube fabric are controlled.

In certain embodiments, a thin oxide layer (thin enough to permit tunneling, for example) may be interposed between a conductor such as tungsten and the nanotubes at or near the nanoscopic element stack surface. This thin oxide layer may be used to enhance contact performance and/or yield. In this case, surface functionalization may be achieved using standard chemical surface modification techniques known to those skilled in the art.

Contact resistance between carbon nanotube elements and top or bottom contacts may also be affected by relatively high RTA temperatures. For example, when top or bottom contacts are formed using TiN in contact with carbon nanotube elements and the contact is exposed to high temperatures (e.g. 750° C. RTA), contact resistance may be reduced by the formation of relatively low resistance titanium-carbide contacts. If higher contact resistance is desired, then tungsten may be used. Tungsten is a good option because it does not react with carbon to form tungsten-carbide unless temperatures are significantly above 800° C.

Lower ON resistance of NV NT switches may also be caused at relatively high RTA temperatures in excess of 700° C. for example. In this case, defects present in carbon nanotube elements may be reduced by RTA and corresponding carbon nanotube element resistance may be reduced. Ion implantation of nitrogen, argon, or xenon for example in the carbon nanotube element region may be used to controllably introduce defects that may increase carbon nanotube element resistance. However, in cases where carbon nanotube element resistance is too high, carbon may be implanted to lower the resistance.

In certain embodiments, ion implantation may be applied through the top conductor layer into various underlying layers. This is enabled by optimizing ion implant energy for various species such as nitrogen, argon, germanium, silicon, oxygen, carbon, and other examples. FIGS. 96G-961 and FIGS. 97B and 97C illustrate various ion implanted regions in NV NT switches. Examples of ion implantation equipment suppliers include: the VIISTa series of implanter by Varian Tool Corporation and the Optima series of implanters by Axcellis Tool Corporation.

The operation of the nanoscopic element stack switch may be controlled by introducing additional non-carbon nanoscopic particles NP (FIG. 96D) during the CNT formation as described further above. The operation of the nanoscopic element stack switch may also be controlled by adding non-carbon atoms after carbon nanotube element formation, using ion implantation methods or other methods as described further above with respect to FIGS. 96G, 96H, and 96I1 and FIGS. 97B and 97C. (See incorporated reference U.S. Provisional Patent Appl. No. 61/074,241.) If the additional atomic particles are carbon, they too may be introduced using ion implantation fabrication methods. Thus a variety of methods and sequences for adjusting nanoscopic element stack electrical properties are envisioned.

NV NT switch (device) performance altering materials—carbon and non-carbon—may be added anywhere within a nanoscopic element stack region that may include carbon nanotube elements (material) or NP:CNT matrix material for example. Thus a stack may have non-carbon elements, carbon elements, carbon nanotube elements and/or NP:CNT matrix material elements. Performance enhancing atoms may also be added by ion implantation or material may be included during deposition anywhere in the NV NT switch, including in top and bottom contact regions as well. Performance altering material may be used to decrease or increase NV NT switch ON resistance, to reduce NV NT switching voltages and/or current flow during transitions between high and low resistance states for example, to increase NV NT switch cyclability (number of ON/OFF cycles allowed), or any other number of attributes. Performance altering material may be used to increase NV NT switch reliability and improve tolerance to harsh conditions such as high temperatures operation (250° C., for example) or relatively high doses of radiation.

Figure 96E:
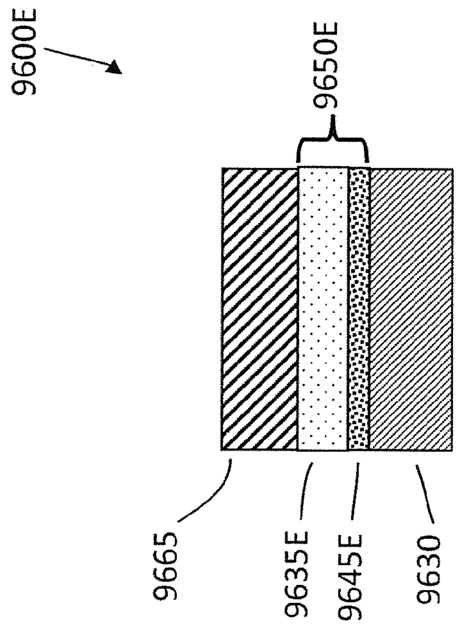
Figure 96F:
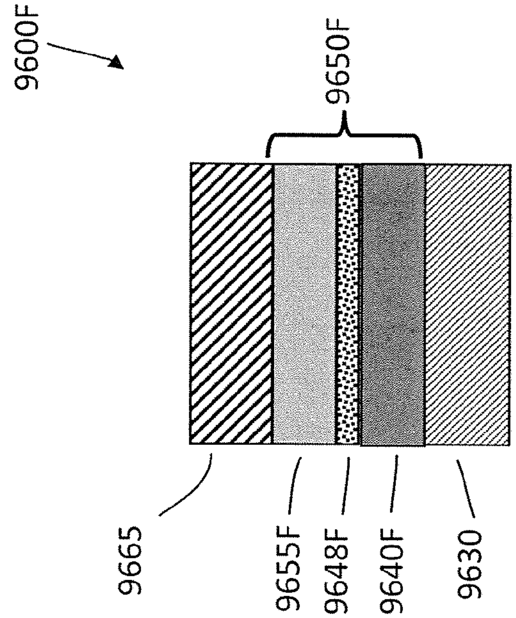
Figure 96D:
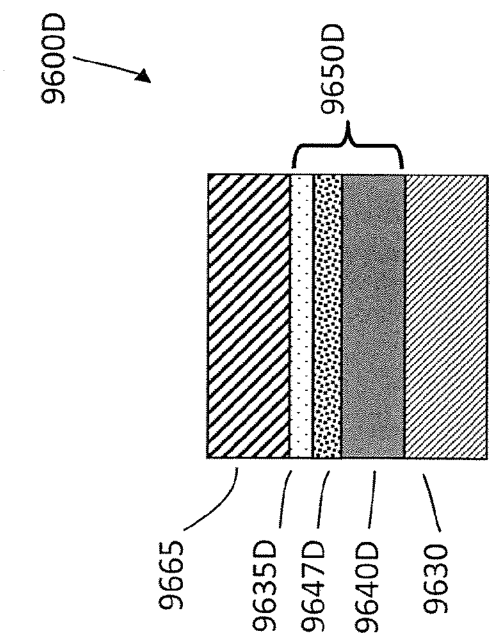

By way of example, FIG. 96D shows a modified version of nanoscopic element stack 9650B illustrated in FIG. 96B. FIG. 96D illustrates NV NT switch 9600D in which nanoscopic element stack 9650D is in contact with top contact 9665 and bottom contact 9630. Nanoscopic element stack 9650D includes carbon element 9640D which corresponds to carbon element 9640B and nanotube element 9647D which corresponds to nanotube element 9647B. NV NT switch 9600D is modified to include in nanoscopic element stack 9650D an additional interface element 9635D, disposed over nanotube element 9647D and carbon element 9640D. In nanoscopic element stack 9650D, interface element 9635D is formed between nanotube element 9647D and top contact 9665 for the purpose of controlling current flow in NV NT switch 9600D. For example, NV NT switch 9600D resistance may be increased above a relatively low resistance ON state of nanoscopic element stack 9650B by the addition of interface element 9635D as described further below.

Interface element 9635D may be formed using relatively thin SiO, SiN, alumina or other dielectric structures in the range of 1 to 20 nm for example. Interface element 9635D thickness may be chosen such that tunneling current may flow, thereby limiting current flow in NV NT switch 9600D resulting in relatively high ON resistance states. Alternately, interface element 9635D may be formed as an antifuse layer which is activated in-situ and used to limit current flow. Another alternative is to form a silicon rich SiO oxide element for use as interface element 9635D with limited controlled current flow. Still another alternative for current control is to form interface element 9635D using a semiconductor layer doped in a range from relatively low to relatively high resistivity values, as described further above. Semiconductor materials may include silicon, germanium, or other semiconductor materials.

In certain cases, even with the inclusion of interface element 9635D, NV NT switch 9600D ON resistance may still be too low. In that case, NV NT switch ON resistance may be increased further by using less carbon material in the NV NT switch structure. FIG. 96E illustrates NV NT switch 9600E in which carbon element 9655A illustrated in NV NT switch 9600A in FIG. 96A has been replaced by interface element 9635E. Interface element 9635E characteristics correspond to those of 9635D described further above.

FIG. 96E illustrates NV NT switch 9600E in which nanoscopic element stack 9650E is in contact with top contact 9665 and bottom contact 9630. Nanoscopic element stack 9650E includes interface element 9635E which replaces carbon element 9655A in FIG. 96A. Nanotube element 9645E corresponds to nanotube element 9645A in FIG. 96A. Interface element 9635E is formed between the top surface of nanotube element 9645E and the bottom surface of top contact 9665 to control current flow in switch 9600E.

In certain cases, lower ON resistance NV NT switches may be desirable. In such cases, ON resistance may be reduced by adding another carbon element layer. However, carbon element resistance may vary depending on methods of fabrication as described below with respect to FIGS. 96 and 97. Some methods of fabrication may actually form carbon elements that increase ON resistance.

FIG. 96F illustrates NV NT switch 9600F in which nanoscopic element stack 9650F is disposed in contact with top contact 9665 and bottom contact 9630. Nanoscopic element stack 9650F includes carbon element 9655F with top surface in contact with the lower surface of top contact 9655 and bottom surface in contact with the top surface of carbon nanotube element 9648F and carbon element 9640F in contact with the top surface of bottom contact 9630 and the bottom surface of carbon nanotube element 9648F. NV NT switch 9600F may be viewed as a combination of NV NT switch 9600A and 9600B structures such that NT switch structure 9600F includes features of both.

Figure 96H:
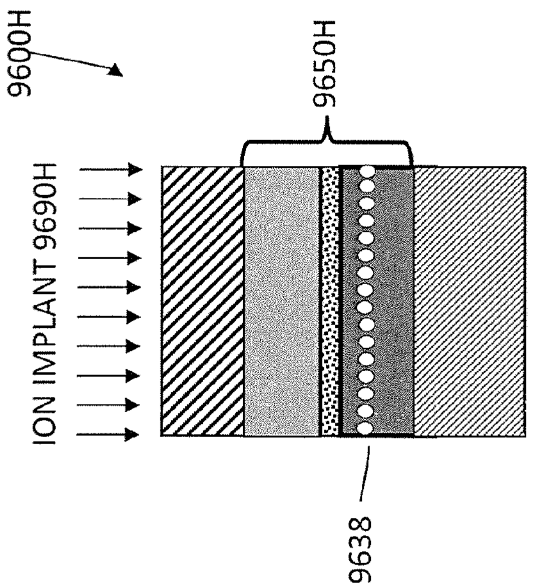
Figure 96I:
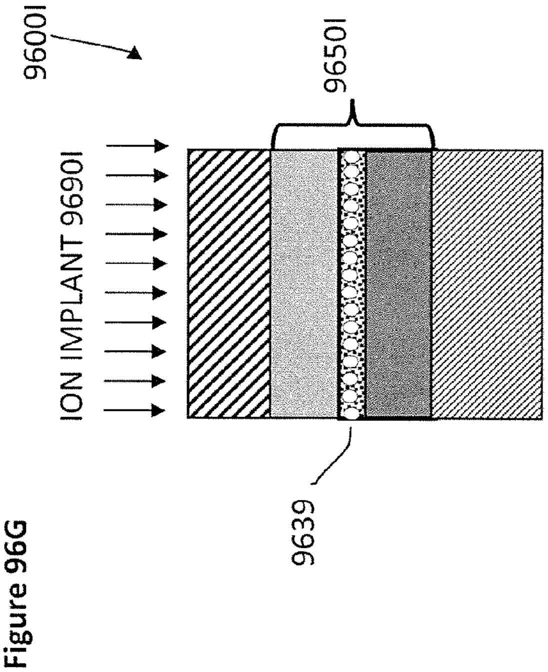
Figure 96G:
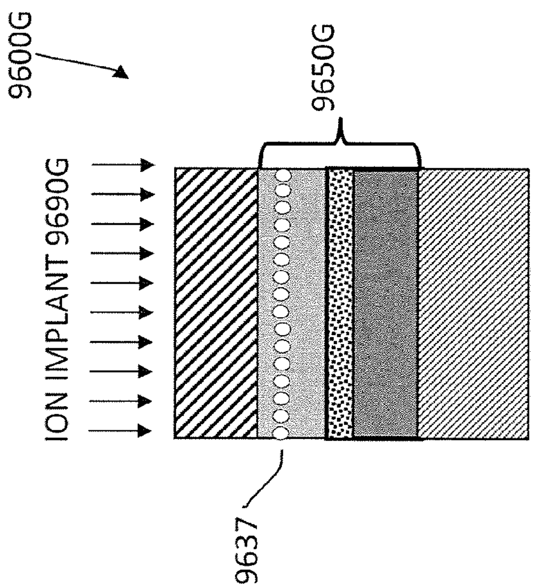

FIGS. 96G and 96H illustrate NV NT switches 9600G and 9600H, respectively. In these examples, various species of ions are implanted in NV NT switch 9600F to form nanoscopic element stacks 9650G and 9650H, respectively. Ion implantation species (atoms) are shown in carbon element regions but may also be present in the carbon nanotube element region, as shown in FIG. 96I. Ion implantation of NV NT switches through the top contact region is described further above and may be applied to any of the NV NT switch structures described with respect to FIGS. 96A-96F, FIG. 97A, and other NV NT switch structures (not shown).

FIG. 96G illustrates NV NT switch 9600G which corresponds to NV NT switch 9600F with ion implant region 9637 formed by ion implant 9690G followed by an anneal to form nanoscopic element stack 9650G. FIG. 96H illustrates NV NT switch 9600H which corresponds to NV NT switch 9600F with ion implant region 9638 formed by ion implant 9690H followed by an anneal to form nanoscopic element stack 9650H. FIG. 96I illustrates NV NT switch 96001 which corresponds to NV NT switch 9600F with ion implant region 9639 formed by ion implant 96901 followed by an anneal to form nanoscopic element stack 9650I.

FIGS. 96G, H, and I show a region of a NV NT switch modified by ion implantation and anneal. However, more than one region of each NV NT switch may be ion implanted. Ion implantation may be used to modify the electrical characteristics of top and bottom contacts as well.

Figure 97B:
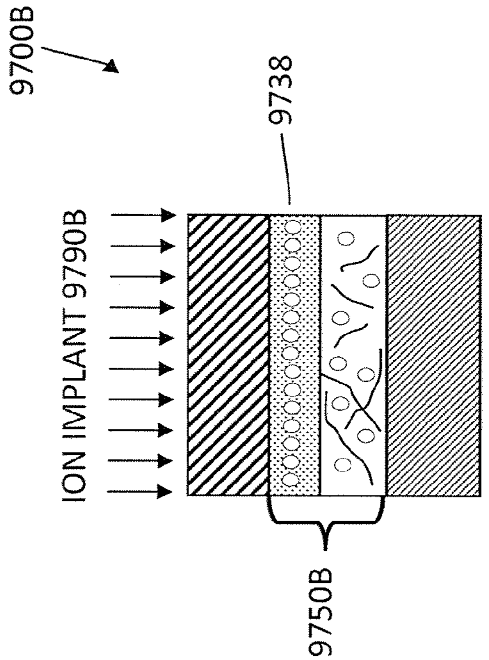
FIG. 97A-C illustrate a cross sectional views of two terminal nonvolatile nanotube switches having nanoscopic element stacks, and various ion implantation steps, according to various embodiments.
Figure 97C:
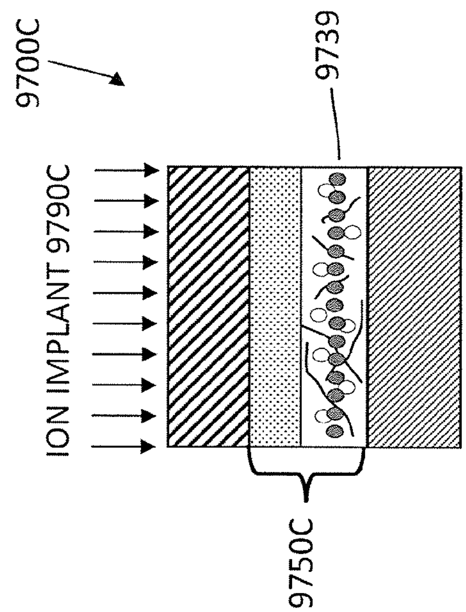
Figure 97A:
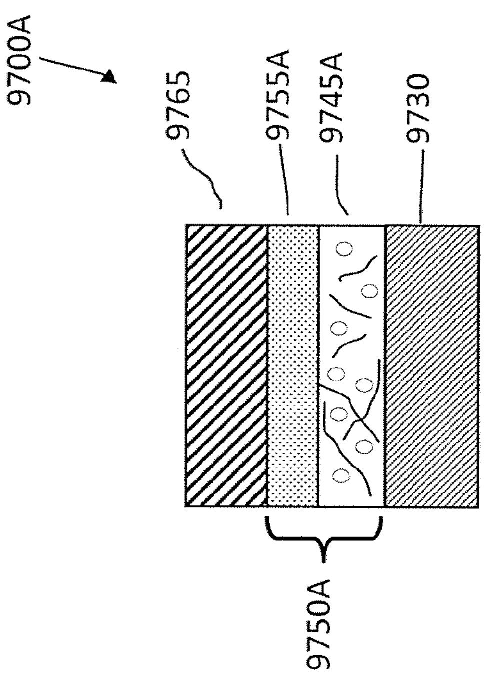

FIG. 97A illustrates NV NT switch 9700A which includes nanoscopic element stack 9750A in physical and electrical contact with top and bottom contacts 9765 and 9730, respectively. In this example, nanoscopic element stack 9750A includes interface element 9755A and matrix material element 9745A. The matrix material corresponds to the additional material (NP) substantially homogeneously dispersed among carbon nanotubes as described further above with respect to FIG. 57C and FIG. 83A. Additional NP material may include a porous dielectric such as SiO, for example.

Matrix material may also correspond to a composition of multiple materials or material phases including various nanoscopic particles and carbon nanotubes in a matrix (NP:CNT matrix) described further above. Nanoscopic particles may include insulators such as SiO, SiN, AlO, other insulators. Nanoscopic particles may also include various semiconductor nanoscopic particles such as Si, Ge, and other semiconductor material. Nanoscopic particles may include various conductive nanoscopic particles such as W, Ti, TiN and others, nanoscopic particles may also include nanoscopic particles of carbon. Nanoscopic particles may also include various combinations of these various insulating, semiconducting, conducting, carbon including one or more allotropes of carbon, and other nanoparticles. Examples of NP:CNT matrix materials are described further above with respect to FIGS. 57C, 83A and 83B. Combining interface element 9755A and matrix material element 9745A provides more options to enhance switch performance as discussed above with respect to NV NT switches 9600A-9600I for example. NV NT switch 9700A may be used as a replacement for various NV NT switches 9600 in various applications described further above and further below in this disclosure.

FIG. 97B illustrates NV NT switch 9700B which corresponds to NV NT switch 9700A with ion implant region 9738 formed by ion implant 9790B followed by an anneal to form nanoscopic element stack 9750B. FIG. 97C illustrates NV NT switch 9700C which corresponds to NV NT switch 9700A with ion implant region 9739 formed by ion implant 9790C followed by an anneal to form nanoscopic element stack 9750C FIGS. 97B and C each show a region of a NV NT switch modified by ion implantation and anneal. More that one region of each NV NT switch may be ion implanted. Ion implantation may be used to modify the electrical characteristics of top and bottom contacts as well.

Figure 98:
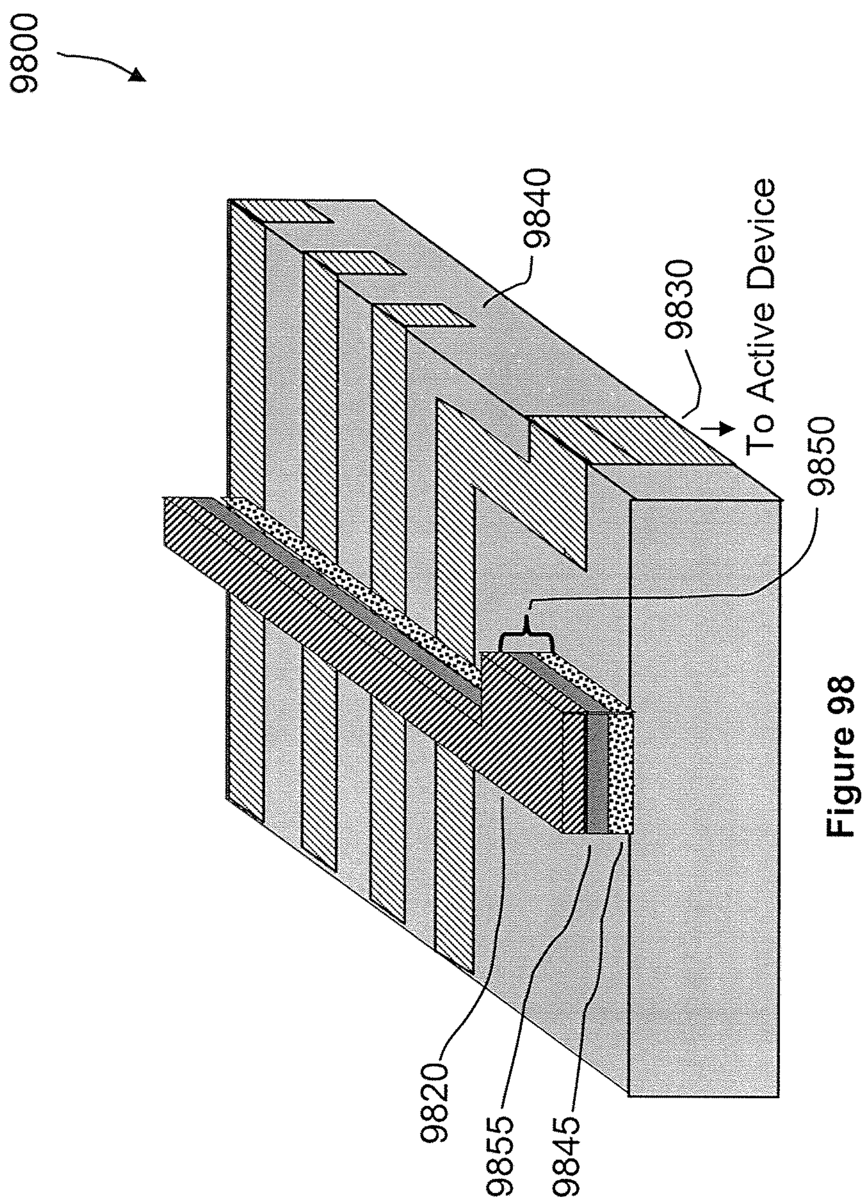
FIG. 98 illustrates a 3D perspective drawing of an array of nanotube cross point switches formed from bottom conductive traces, at least one top conductive trace, and at least one nanoscopic trace stack, according to some embodiments.

FIG. 98 depicts a perspective drawing of nonvolatile nanotube cross point switches 9800 formed using a nonvolatile nanoscopic trace stack 9850 (multiple nanoscopic trace stacks may be used but are not shown) approximately orthogonal to underlying conductors 9830. The nanoscopic trace stack 9850 includes a conformally disposed overlying conductor 9820. Nanoscopic trace stack 9850 is formed by carbon trace 9855 in contact with underlying nanotube trace 9845. Nanoscopic trace stack 9850 is a geometrical variation of nanoscopic element stack 9650A in FIG. 96A. However, nanoscopic trace stack 9850 may also be formed using a geometrical variation of nanoscopic element stacks in FIGS. 96B-96I and 97A-C. A NV nanotube cross point switch is defined electrically in the NV nanoscopic trace stack 9850 material at the intersection of the conformal overlying conductor 9820 and the approximately orthogonal underlying conductor trace 9830. A nanoscopic trace stack may simplify processing because a minimum size cross point switch may be defined using a minimum photolithographically defined dimension in only one axis while the other approximately orthogonal dimension is defined electrically. The present layout is described more completely in U.S. Provisional Patent Appl. No. 61/074,241, filed Jun. 20, 2008, entitled "NRAM Arrays with Nanotube Blocks, Nanotube Traces, and Nanotube Planes and Methods of Making Same."

Specifically, NV nanoscopic nanotube cross point switches 9800 include one or more bottom traces 9830 disposed in or on a substrate 9840. These elements correspond to bottom traces 8130 in or on a substrate 8140 illustrated in FIG. 81. Disposed over an upper surface of the bottom trace 9830 and adjacent substrate 9840 is nanoscopic trace stack 9850 comprising a patterned nanoscopic trace stack 9850 and patterned overlying conductor 9820, conformally disposed. The nanoscopic trace stack 9850 and overlying conductor 9820 are typically applied conformally and then etched in a single step to form the sandwiched nanoscopic trace stack with overlying conductor. However, numerous fabrication methods are described in incorporated reference U.S. patent application Ser. No. 61/074,241 and envisioned here.

U.S. patent application Ser. No. 61/074,241 shows examples of cells such as illustrated in FIG. 92 formed using NV nanoscopic carbon traces instead of 3-D nonvolatile nanoscopic carbon element used with 3-D NV NT diode structures. In this example, nanoscopic trace stacks 9850 may be used to replace nanoscopic element stack 9250A as described further above. Similar methods may be used to modify NRAM® cell structures using FET select transistors that include NV nanoscopic trace stacks to replace nanoscopic element stack 9350 illustrated in FIG. 93. In the present embodiment, structure 9800 features bottom trace 9830 and nanoscopic trace stack 9850 approximately orthogonally disposed, but any variety of configurations is envisioned. It is the intersection between bottom trace 9830, nanoscopic trace stack 9850, and top conductor trace 9820 in the cross section normal to the major substrate surface (in the present embodiment) that form the 3D NV NT diode cell structure. Incorporated reference U.S. patent application Ser. No. 61/074,241 details the operation of this switch configuration and the integration of multiple, uniquely addressable switching cells in a memory array.

NV nanotube cross point switches 9800 layout using nanoscopic trace stack concepts may be combined with 3-D NV NT diode cells such as illustrated in FIG. 92. This combination, according to certain embodiments, has numerous advantages. As detailed above with reference to FIG. 92, the present structure has one of the smallest cell sizes available to date (≥4F$^2$) and, correspondingly, the smallest chip area dedicated to a fixed number of switching cells. This enables the highest density, lowest power, and highest performance when compared with alternate embodiments. In order to preserve the advantages of the memory array illustrated in cross section 9200, nanoscopic element stack 9250 in FIG. 92 may be replaced with nanoscopic trace stack 9850. As a result, minimum cell dimensions are defined photolithographically in the width direction of nanoscopic trace stack 9850 and top conductor trace 9820 while minimum cell dimensions along nanoscopic trace stack 9850 and top conductor trace 9820 are defined electrically thereby reducing photolithographic process complexity.

Figure 99:
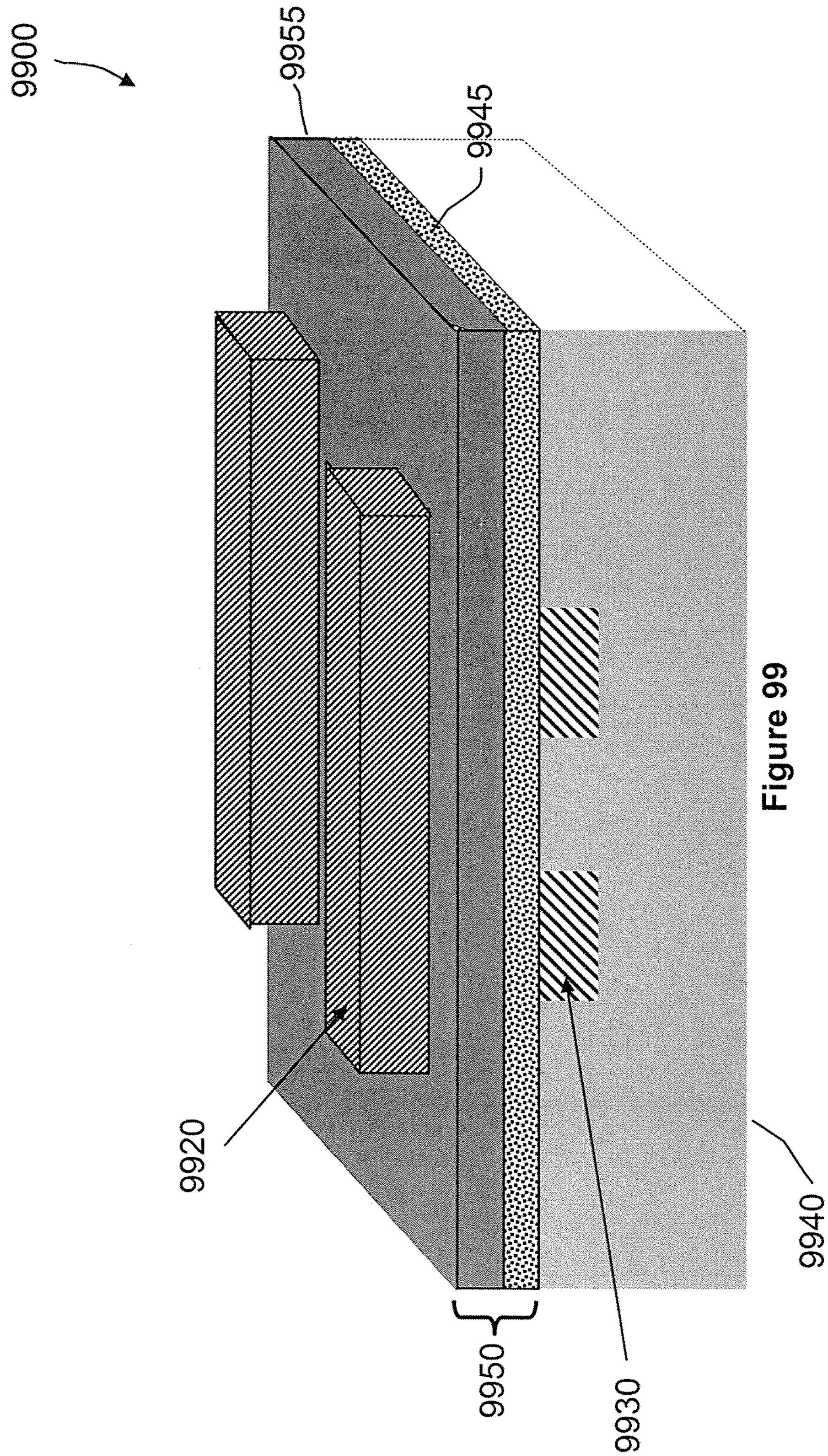
FIG. 99 illustrates a 3D perspective drawing of an array of nanotube cross point switches formed from bottom conductive traces, at least one top conductive trace, and a nanoscopic plane stack, according to some embodiments.

For purposes of illustration, FIG. 99 depicts a perspective drawing of NV nanotube cross point switches 9900 formed using a nanoscopic plane stack 9950 over underlying bottom traces (conductors) 9930. Overlying conductor 9920 is disposed over nanoscopic plane stack 9950. Nanoscopic plane stack 9950 is formed by carbon plane 9955 in contact with underlying nanotube plane 9945. Nanoscopic plane stack 9950 is a geometrical variation of nanoscopic element stack 9650A in FIG. 96A. However, nanoscopic plane stack 9950 may also be formed using a geometrical variation of nanoscopic element stacks in FIGS. 96B-96I and 97A-C. A NV NT cross point switch is defined electrically in the nanoscopic plane stack 9950 material at the intersection of the overlying conductors and the approximately orthogonal underlying bottom traces (conductors). A nanoscopic plane stack may simplify processing because a minimum size cross point switch may be defined electrically and without using a minimum photolithographically defined dimension. The present layout is described more completely in U.S. Provisional Patent Appl. No. 61/074,241, filed Jun. 20, 2008, entitled "NRAM Arrays with Nanotube Blocks, Nanotube Traces, and Nanotube Planes and Methods of Making Same Specifically, NV nanoscopic carbon cross point switches 9900 include one or more bottom traces 9930 disposed in or on a substrate 9940. These elements correspond to bottom traces 8230 in or on a substrate 8240 illustrated in FIG. 82. Disposed over an upper surface of the bottom trace 9930 and adjacent substrate 9940 is nanoscopic plane stack 9950 comprising a carbon plane 9955 layer and nanotube plane 9945 layer. Patterned conductor traces 9920 are disposed over nanoscopic plane stack 9950. Numerous fabrication methods are described in incorporated reference U.S. patent application Ser. No. 61/074,241 and envisioned here. U.S. patent application Ser. No. 61/074,241 shows examples of cells such as illustrated in FIG. 92 formed using NV nanoscopic carbon planes instead of 3-D nonvolatile nanoscopic carbon element used with 3-D NV NT diode structures. In this example, nanoscopic plane stack 9950 may be used to replace nanoscopic element stack 9250. Similar methods may be used to modify NRAM® cell structures using FET select transistors that include nanoscopic trace stacks as illustrated in FIG. 93. In the present embodiment, structure 9900 features bottom trace 9930 and nanoscopic plane stack 9850, but any variety of configurations is envisioned. It is the intersection between bottom trace 9930, nanoscopic plane stack 9850, and top trace 9920 in the cross section normal to the major substrate surface (in the present embodiment) that form the 3D NV NT diode cell structure. Incorporated reference U.S. patent application Ser. No. 61/074,241 details the operation of this switch configuration and the integration of multiple, uniquely addressable switching cells in a memory array.

NV nanoscopic carbon switch 9900 layout using nanoscopic plane stack concepts when combined with 3-D NV NT diode cells such as illustrated in FIG. 92, according to certain embodiments, has numerous advantages. As detailed above with reference to FIG. 92, the present structure has one of the smallest cell sizes available to date (≥4F$^2$) and, correspondingly, the smallest chip area dedicated to a fixed number of switching cells. This enables higher densest, lower power dissipation, and higher performance when compared with alternate embodiments. In order to preserve the advantages of the memory array illustrated in cross section 9200, nanoscopic element stack 9250 in FIG. 92 may be replaced with nanoscopic plane stack 9950. As a result, minimum cell dimensions are defined electrically in both X-Y direction in nanoscopic plane stack 9950 at the intersection of traces such as top trace 9920 and approximately orthogonal bottom trace 9930 thereby reducing the photolithographic complexity.

FIG. 78 above illustrates one embodiment of a non-volatile nanotube switch with select circuitry. The nanotube switching element includes a substantially thin nanotube fabric region, as opposed to a thick, multilayered nanotube fabric.

The 2-D NV NT switch and select circuitry are identified as CELL 1, 7805 and are one of a plurality of cells in an array of 2-D NV NT switch structures 7800 (e.g. adjacent to CELL 2) as described further above. Thin nanotube article 7850 may require 5 to 10 depositions. Also, thin nanotube article 7850 may typically require switching voltages in the 7-8 volt range.

Figure 100A:
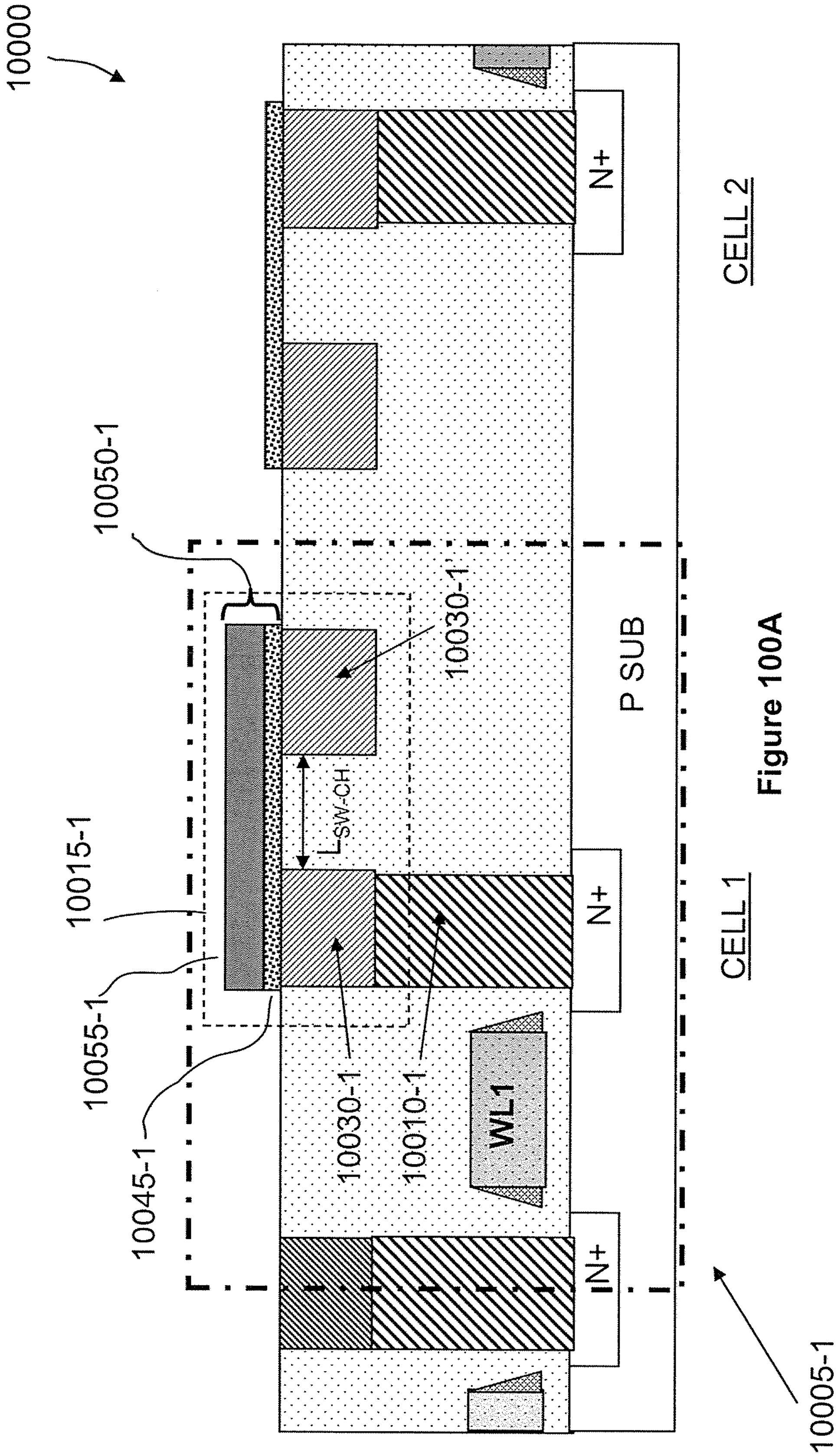
FIG. 100A-C illustrate cross-sectional views of two-terminal NV NT switches having nanoscopic element stacks and corresponding select circuitry, according to some embodiments.

FIG. 100A illustrates an array of NV NT switch structures 10000 (e.g. adjacent cells CELL 1 and CELL 2). NV NT switch structures 10000 correspond to NV NT switch structures 7800 illustrated in FIG. 78 except that thin nanotube article 7850 is replaced with nanoscopic element stack 10050-1. Nanoscopic element stack 10050-1 is in contact with underlying first conductive contact 10030-1 and underlying second conductive contact 10030-1' that form NV NT switch 10015-1. Conductive element (stud) 10010-1 creates an electrical pathway between N+ (e.g. source) and first conductive contact 10030-1. Cell 10005-1 corresponds to cell 7805. The operation of cell 10005-1 corresponds to the operation of cell 7805 described further above.

NV NT switch 10015-1 corresponds to NV NT switch 9600A. Nanoscopic element stack 10050-1 corresponds to nanoscopic element stack 9650A shown in FIG. 96A. Nanoscopic element stack 10050-1 is formed by a combination of carbon element 10055-1 on top of nanotube element 10045-1 corresponding to carbon element 9655A and nanotube element 9645A, respectively. The properties of nanoscopic element stack 10050-1 correspond to those of nanoscopic element stack 9650A as described further above with respect to FIG. 96A. However, any of the nanoscopic element stacks illustrated in FIGS. 96 and 97 further above may be used. NV NT switch 10015-1 uses two bottom contacts, instead of one top and one bottom contact, and these two bottom contacts both contact nanotube element 10045-1. However, two-terminal NV NT switches operate in a wide variety of contact configurations as illustrated in FIGS. 56 and 57 described further above which, among other contact configurations, include top and bottom contacts and two bottom contacts. The channel length of NV NT switch 10015-1 is $L_{SW\text{-}CH}$ and is defined by the edges of first conductive contact 10030-1 and second conductive contact 10030-1' as shown in FIG. 100A.

By using nanoscopic element stack 10050-1 as part of NV NT Switch 10015-1, a thin layer of nanotube element 10045-1 may deposited in a single operation. This reduces process complexity and results in simpler deposition methods. NV NT switch 10015-1 performance is enhanced because lower operating voltages may be used. The operating conditions are similar to those described in FIG. 94.

Figure 100B:
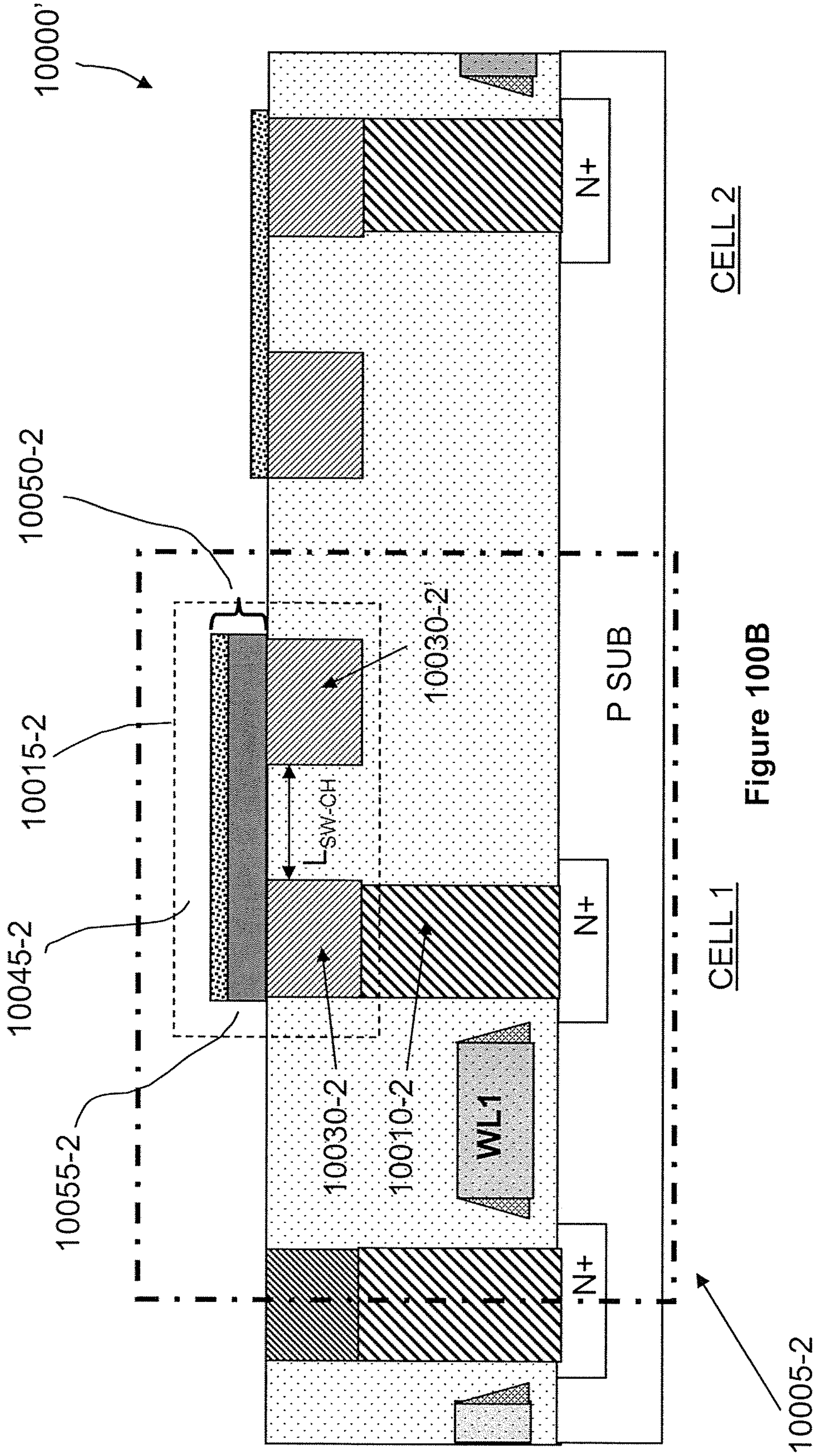

FIG. 100B illustrates NV NT switch structure 10000' which corresponds to NV NT switch structure 10000 illustrated in FIG. 100A. NV NT switch 10015-2 corresponds to NV NT switch 10015-1 except that nanoscopic element stack 10050-2 is formed with nanotube element 10045-2 on top of carbon element 10055-2 such that the two bottom contacts, first conductive contact 10030-2 and second conductive contact 10030-2', both contact carbon element 10055-2. The properties of nanoscopic element stack 10050-2 correspond to those of nanoscopic element stack 10050-1 described further above. Underlying first conductive contact 10030-2 corresponds to underlying first contact 10030-1 and underlying second conductive contact 10030-2' corresponds to underlying conductive contact 10030-1'. Conductive element (stud) 10010-2 corresponds to conductive element (stud) 10010-1. The operation of cell 10005-2 corresponds to the operation of cell 10005-1 described further above.

As is the case with NV NT switch structure 10000 described further above, NV NT switch structure 10000' may enhance the performance of NV NT switch 10015-2 because lower operating voltage may be used as described further above with respect to NV NT switch 10015-1.

Figure 100C:
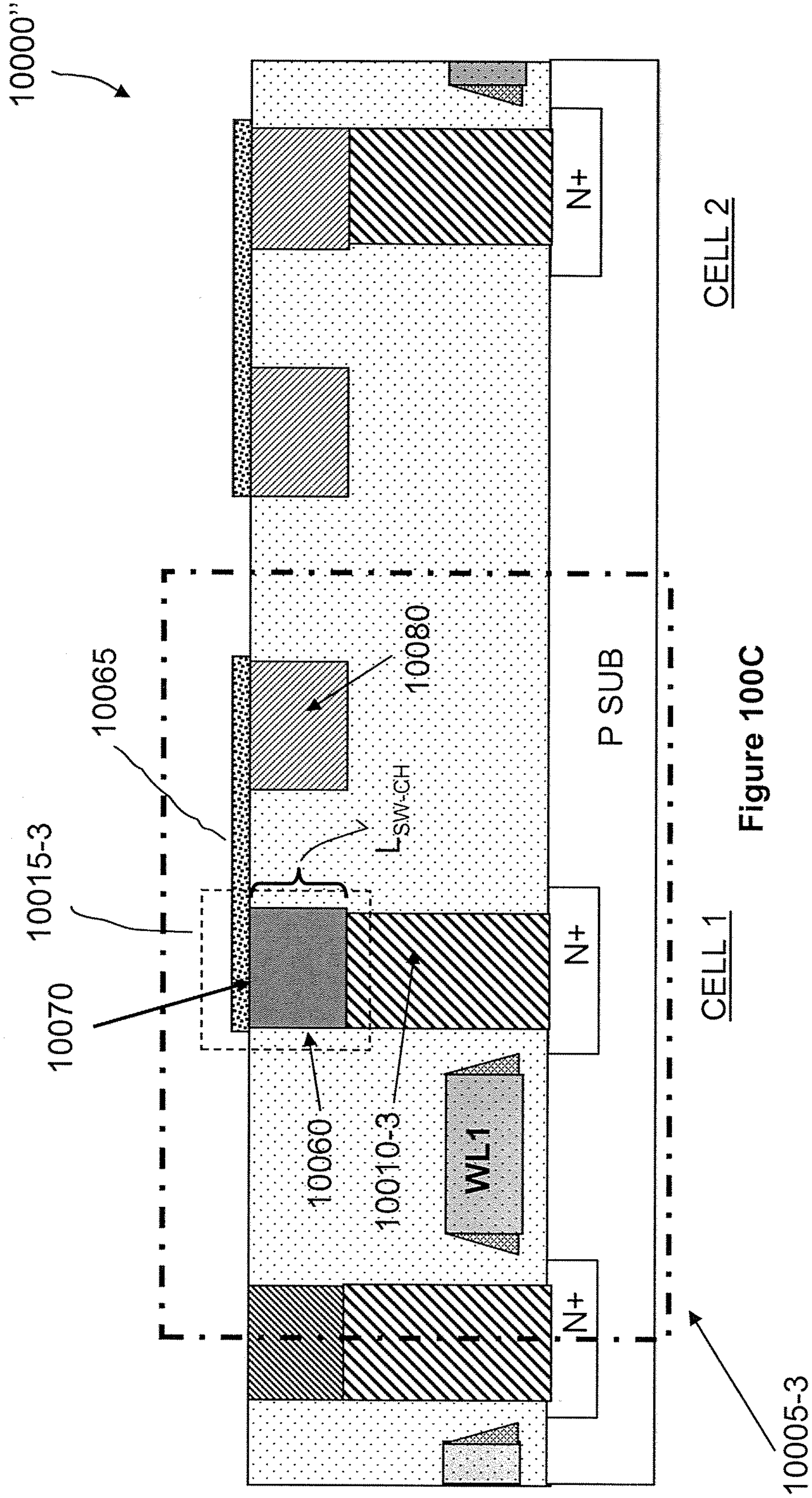

NV NT switch structure 10000" illustrated in FIG. 100C uses NV NT switch 10015-3 in which first conductive contact 7830 illustrated in FIG. 78 is replaced with carbon element 10060. Conductive element (stud) 10010-3 forms a bottom contact to the underside of carbon element 10060. Carbon element 10060 may be similar in composition to carbon element 9640B illustrated in FIG. 96B and carbon element 10055-2 illustrated in FIG. 100B for example as described further above. The top surface of carbon element 10060 is in contact with a portion of nanotube article 10065. The overlap region between the underside of nanotube article 10065 and carbon element 10060 is referred to as contact region 10070. Conductive contact 10080 contacts the underside of thin nanotube article 10065. Conductive contact 10080 may be a portion of an array line such as a reference line (not visible in a cross sectional drawing). Switch channel length is indicated by $L_{SW\text{-}CH}$ in FIG. 100C.

Nanotube article 10065 may be used as local wiring within cell 10005-3. Examples of nanotube articles (fabrics) used as local wiring in memory cells and arrays as illustrated in incorporated references U.S. Pat. No. 6,706,402 and U.S. Provisional Patent Appl. No. 61/088,828. Nanotube article 10065 may include a combination of metallic and semiconducting nanotubes; may include SWNTs, MWNTs or combinations thereof, may include only metallic nanotubes; may include only semiconductor nanotubes. Contact 10070 electrical properties may be optimized by the type of thin nanotube article 10065 used and the properties of carbon element 10060. Nanotube article 10065 may be relatively thin in the range of 1-20 nm for example, or relatively thick in the range of 20 to 200 nm for example.

As is the case with NV NT switch structure 10000' described further above, NV NT switch structure 10000" may enhance the performance of NV NT switch 10015-3 because lower operating voltage may be used as described further above with respect to NV NT switch 10015-1 and 10015-2.

Figure 101A:
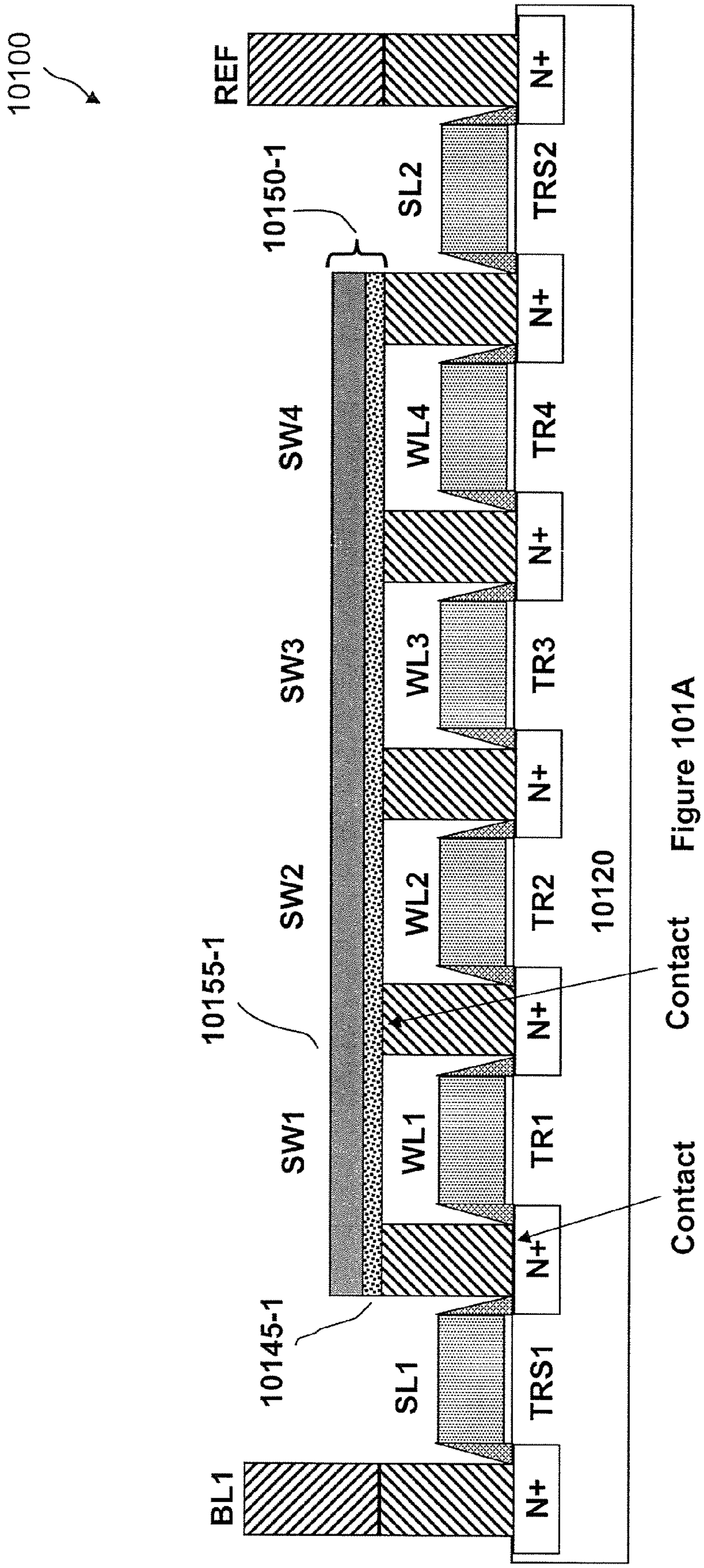
FIGS. 101A-B illustrate cross sectional views of memory arrays of cells in a nanotube NAND memory array configuration and corresponding cell select circuitry, with each nanotube NAND memory array region having a nanoscopic trace stack, according to some embodiments.

FIG. 101A illustrates a cross section of NV nanoscopic trace stack-based nanotube NAND (N-NAND) memory array 10100 on substrate 10120 according to one embodiment. FIG. 101A illustrates N-NAND memory array 10100 and corresponds to a cross section of nanotube NAND sub-array 8900 illustrated in FIG. 89 but with NV nanoscopic trace stack-based storage instead of NP:CNT matrix-based storage. N-NAND memory array 10100 includes nanoscopic trace stack 10150-1 in the form of a continuous trace, in combination with stud vias (CONTACT), connect regions of each portion of NV nanoscopic trace stack 10150-1 to a corresponding FET diffusion N+ and define NV NT switch length in segments between stud vias (contacts) along the NV nanoscopic trace stack 10150-1 that may be patterned over conventional FET layouts. The width of NV nanoscopic trace stack 10150-1 is defined by an etch operation. In certain embodiments the N-NAND memory array 10100 is disposed on a P substrate 10120. NV nanoscopic trace stack 10150-1 includes carbon trace 10155-1 above and in contact with nanotube trace 10145-1. The stud vias (CONTACT) contact the bottom surface of nanotube element trace 10145-1. NV nanoscopic trace stack 10100 corresponds to nanoscopic element stack 9650A illustrated in FIG. 96A in terms of electrical and physical properties described further above except for length to form a trace that spans multiple FETs to form a nanotube NRAM (N-NRAM) memory array and memory architecture. However, nanoscopic trace stack 10100 may be formed as a geometrical variation of any of the nanoscopic element stacks illustrated in FIGS. 96 and 97 or other nanoscopic element stack variations (not shown).

For example, note that a nanoscopic trace stack 9750A-based NV NT switch illustrated in FIG. 97 may be used instead of nanoscopic element stack 9650A-based NV NT switch illustrated in FIG. 96. While N-NAND memory array 10100 is described in terms of NV nanoscopic trace stacks, various nanoscopic trace stacks may be used instead as described further above with respect to other memory array configurations. Various fabrication methods may be used to form NV NT switches above corresponding FETs, as detailed in incorporated reference U.S. patent application Ser. No. 11/835,583, filed Aug. 8, 2007 entitled "Latch Circuits and Operation Circuits Having Scalable Nonvolatile Nanotube Switches as Electronic Fuse Replacement Elements."

Specifically, N-NAND memory array 10100 includes a first bit line BL1, a reference line REF, write lines corresponding to each cell WL1-WL4 and corresponding switch regions SW1-SW4. The stud vias form electrical connections to corresponding N+ diffusions of underlying FETs TR1-TR4, respectively. The select line SL1 enables an electrical connection between bit line BL1 and a contact on one side of the N-NAND array structure by activating transistor TRS1. The select line SL2 enables an electrical connection between reference line REF and a contact on the other side of the N-NAND array structure by activating transistor TRS2. Note that it is also possible to connect one side (contact) of the NAND array directly to reference line REF and eliminate select line SL2 and transistor TRS2. While only a first bit line BL1 is illustrated in FIG. 101A, N-NAND memory array 10100 includes multiple bit lines and corresponding cells (not shown). Note also that each bit is formed by the parallel combination of an FET transistor such as FET TR1 and the portion of nanoscopic trace stack 10150-1 above corresponding combined gate and word line WL1 with channel length defined by the spacing between corresponding contact regions. The operation of N-NAND memory arrays is described in incorporated reference, U.S. patent application Ser. No. 11/835,583

Figure 101B:
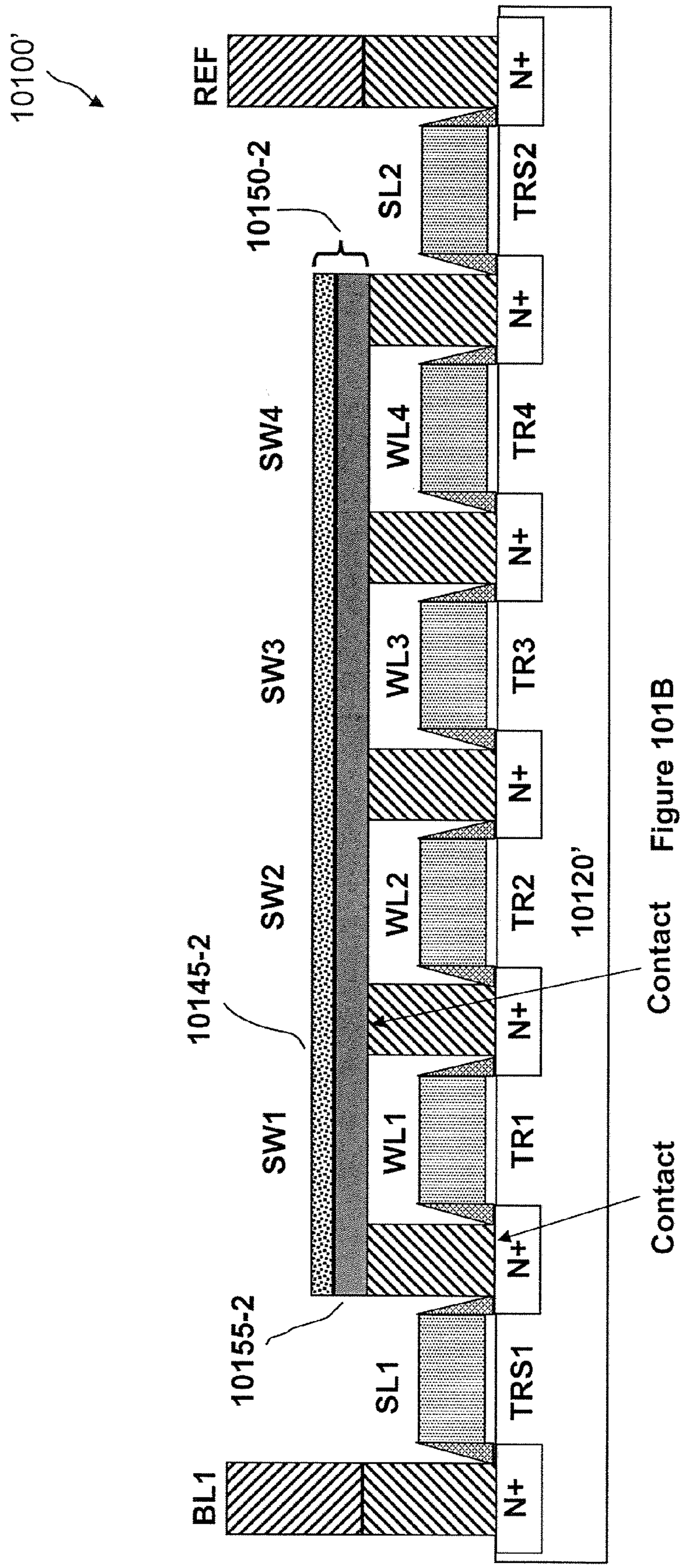

FIG. 101B illustrates a cross section of NV nanoscopic trace stack-based N-RAM memory array 10100' on substrate 10120' according to one embodiment. FIG. 101B N-NAND memory array 10100' corresponds to N-NRAM memory array 10100 illustrated in FIG. 101A. NV nanoscopic trace stack 10150-2 corresponds to NV nanoscopic trace stack 10150-1 except that NV nanoscopic trace stack 10150-2 is formed with nanotube trace 10145-2 on top of carbon trace 10155-2. Hence the stud vias (CONTACT) contact the bottom surface of carbon trace 10155-2. In all other respects, the N-NAND memory array 10100' architecture and operation corresponds to that of N-NAND memory array 10100 described further above. While N-NAND memory array 10100' is described in terms of NV nanoscopic trace stacks which are geometric variations of nanoscopic element stack 9650B illustrated in FIG. 96B, geometric variations of the any of the nanoscopic element stacks illustrated in FIGS. 96 and 97, and other variations not shown, may be used instead as described further above with respect to other memory array configurations.

Figure 102:
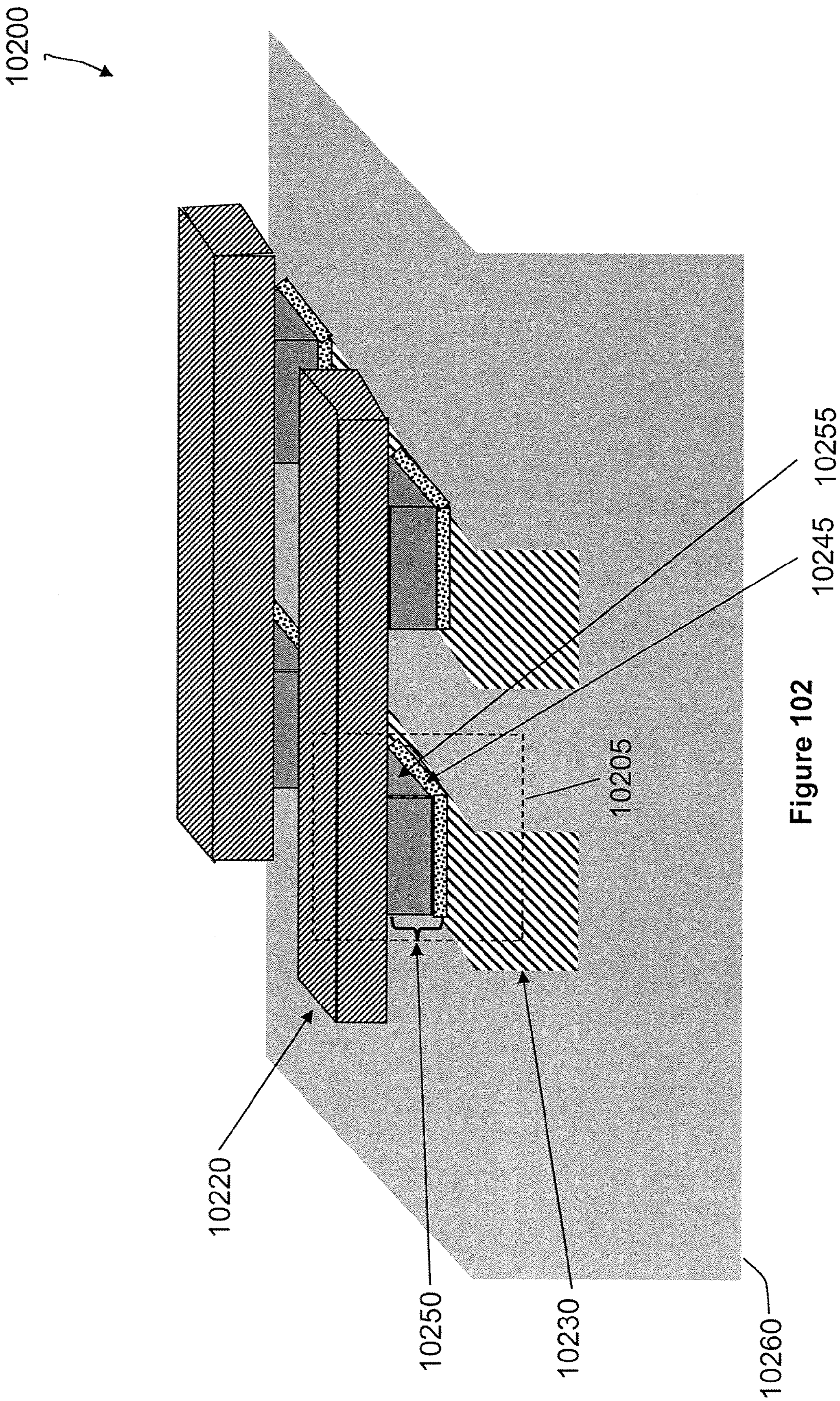
FIG. 102 illustrates a 3D perspective drawing of an array of cross point switches having interconnected programmable logic switches formed from bottom conductive traces, top conductive traces, and nanoscopic element stacks, according to some embodiments.

FIG. 102 illustrates a perspective view of 2×2 nonvolatile cross point switch array 10200 of discrete interconnected programmable logic switches 10205 corresponding to NV NT switch 9650A shown in FIG. 96A including nanoscopic element stack 9650A illustrated in FIG. 96A. Nanoscopic element stack 9750A illustrated in FIG. 97A may be used instead for example. Alternately, various NV nanoscopic element stacks illustrated in FIGS. 96B-96I and FIGS. 97B and 97C may be used instead as well as other structures (not shown). Etching techniques and the layout/design used to produce cross point switch array 10200 typically result in an easier fabrication process.

In the present embodiment, nonvolatile cross point switch array 10200 includes a NV carbon nanoscopic element stack 10250 etched to form discrete integrated programmable logic switches 10205 at the intersection of upper conductor traces 10220 and bottom conductor traces 10230. Cross point switch array 10200 includes a substrate 10260 in which bottom conductive traces 10230 are embedded. The bottom conductive traces may comprise, for example, a first logic wiring layer. Disposed above the bottom conductive traces are upper conductive traces 10220 which may comprise, for example a second logic wiring layer. In nonvolatile cross point switch array 10200, the bottom and upper conductive traces 10220 and 10230, are arranged approximately perpendicularly, with respect to the x-y plane (shown), but any number of other configurations may be suitable in other contexts. In the present example, each of the bottom and upper conductive traces 10230, 10220, intersect in a vertical region (along z-axis) where a discrete nanoscopic element stack 10250 is disposed.

The discrete nanoscopic element stack 10250, at each such intersection, forms an active region between the bottom and upper conductive traces 10230, 10220, providing a vertical conductive pathway between the bottom and upper conductive traces. This vertical conductive pathway can be formed and unformed (corresponding to a low and high resistance path) between conductive traces. In this example, discrete nanoscopic element stack 10250 is formed with carbon element 10255 on top of nanotube element 10245 with the top surface of carbon element 10255 in contact with the bottom surface of conductive traces 10220 and the bottom surface of nanotube element 10245 in contact with the top surface of conductive traces 10230. Cross point switch array 10200 and variation on it are described in detail in U.S. Provisional Patent Application 61/074,241.

Switching mechanisms for the vertical conductive pathway are described fully in incorporated U.S. patent application Ser. No. 11/835,613, entitled "Memory Elements and Cross Point Switches and Arrays of Same Using Nonvolatile Nanotube Blocks," incorporated by reference in its entirety. Each bit line—word line combination (e.g. bottom and top conductive trace) selects a discrete nanoscopic element stack 10250, the active region of a discrete integrated programmable logic switch 10250, thereby selecting a discrete nanotube memory cell in cross point switch array 10200. The resistance state of each nanoscopic element stack 10250 may thus be programmed to represent a memory state of each nonvolatile cross point switch used for logic signal routing. Multi-resistance states (values) may be used to generate multiple logic weighting states programmed into the same NV nanoscopic element stack. As an example, one low resistance state and one high resistance state may be used to represent an activated routing path and an unactivated routing path, respectively. Alternately, three low resistance states and one high resistance state may be used to store three logic weighting factors and one no connect represented as logical 00, logical 01, logical 10, and logical 11 states. More logic weighting states are possible using more resistance states. In fact, any resistance value may be set between a lowest and a highest value such that an analog (continuously varying) resistance state or resistance ratio with other resistor (or impedance) function may be achieved. U.S. patent application Ser. No. 11/835,612 illustrates NRAM® memories with multi-resistance states per nonvolatile nanotube storage location. Similar techniques may be used to generate multiple logic weighting states. The electrical signals for programming the weighting factor of each logic routing path is formed by altering the resistance state for each NV nanoscopic carbon element are as described fully in the incorporated references and may be selected according the various requirements of the particular application.

Constructed with nanoscopic element stack 10250 that corresponds to nanoscopic element stack 9650 to form programmable logic switch 10205, and cross point switch array 10200 is capable of being SET and RESET at lower voltages than analogous cross point switch arrays using primarily nanotube material. The programmable logic switch 10205 (dashed outline of switching region 10250 and corresponding regions of top and bottom lines 10230, 10220) can be SET and RESET to ON or OFF states multiple times for programmable wiring. The switching function of each adjacent cell is largely independent but may experience certain amounts of capacitive coupling. Capacitive coupling at the intersection between approximately orthogonal conductors can cause unwanted noise coupling between adjacent lines and is factored into cross point switch design.

Switching element 10205 can be made of a thicker or thinner nanoscopic element stack 10250 to minimize coupling noise as needed. The thickness of carbon element 10255 and nanotube element 10245 that comprise nanoscopic element stack 10250 may be adjusted independently to minimize coupling noise as needed and each can be varied in thickness between approximately 2-5 nm to approximately 500 nm, for example, based on capacitance coupling considerations without inhibiting or compromising the switch operation. As noted above, the use of the nanoscopic element stack 9650A-I-type switching material show in FIGS. 96A-I and nanoscopic element stack 9750A-C shown in FIGS. 97A-C to form NV nanoscopic element stacks 10250 enable switching for SET and RESET functions at or less than a device operating voltage of 5 V and lower switching currents as described further above. Programmable wiring and implementation for cross point switch array 10200 is described in detail in U.S. Provisional Patent Application No. 61/088,828, entitled "Nonvolatile Nanotube Programmable Logic Devices and a Nonvolatile Nanotube Field Programmable Gate Array Using Same," filed Aug. 14, 2008, the entire contents of which are herein incorporated by reference. U.S. Provisional Patent Application No. 61/088,828 specifically details field programmable gate array (FPGA) technology integrated with NV NT switches.

Figure 103:
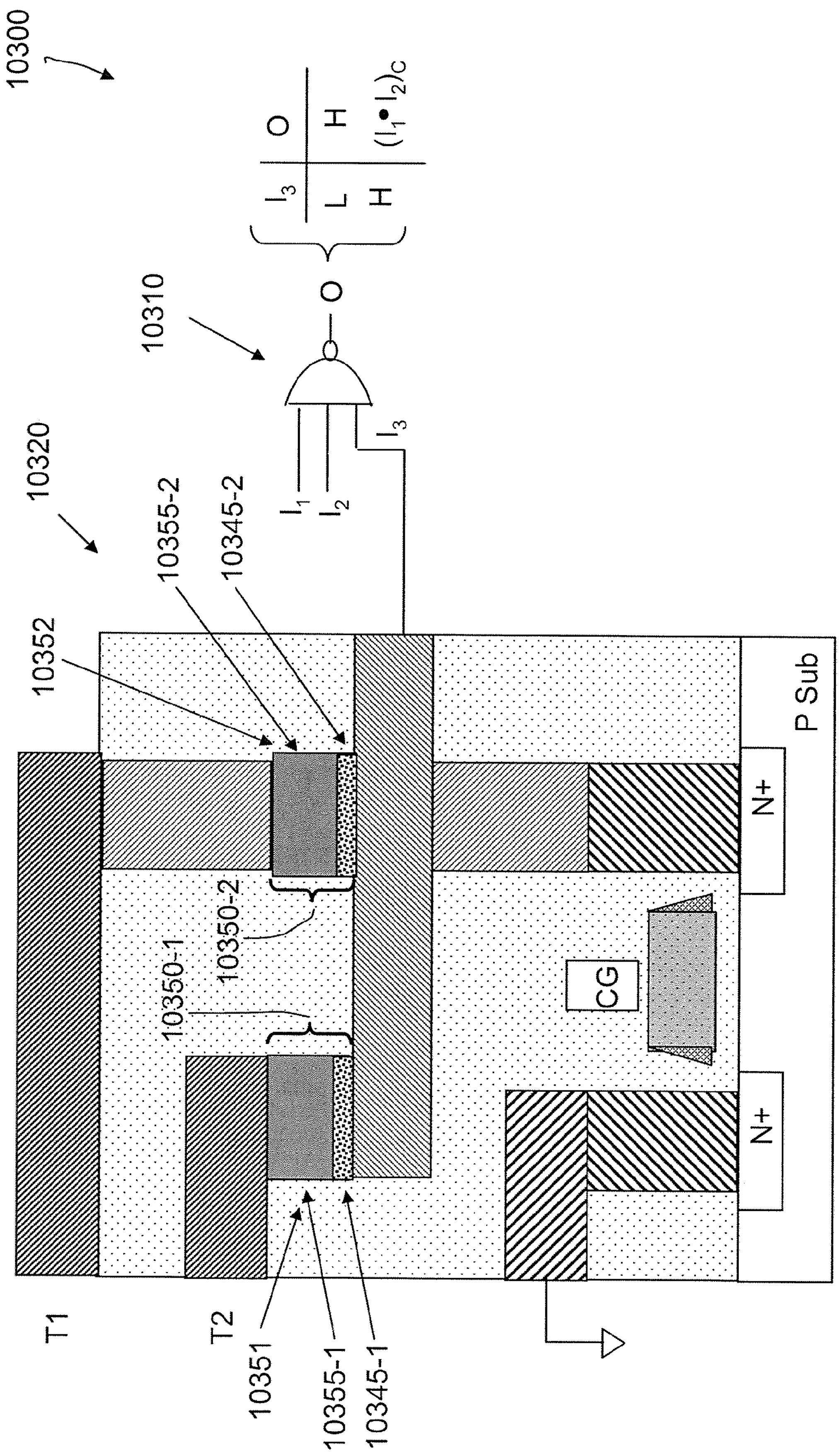
FIG. 103 illustrates a schematic representation of reprogrammable logic circuitry employing a pair of NV NT switches having nanoscopic element stacks and corresponding cell select circuitry, according to some embodiments.

FIG. 103 illustrates a schematic representation of a reprogrammable logic circuit 10300 using switching elements constructed from NV nanoscopic material corresponding to nanoscopic element stack 9650A. Alternately, various NV nanoscopic carbon elements and NV nanoscopic modified carbon elements illustrated in FIGS. 96B-96I and FIGS. 97A-97D may be used instead. Reprogrammable logic circuit 10300 includes two NV NT switches 10351 and 10352 having a switching region of NV nanoscopic element stacks 10350-1 and 10350-2 respectively. Nanoscopic element stack 10350-1 is formed with carbon element 10355-1 on top of nanotube element 10345-1 and nanoscopic element stack 10350-2 is formed with carbon element 10355-2 on top of nanotube element 10345-2. NAND circuit 10310 has inputs I1 and I2. Input I3 is determined by the high or the low resistance state of the NV NT switches 10351 and 10352. NV NT switches 10351 and 10352 are set using T1, T2 and FET control gate CG. The control features for the present arrangement 10320 are described in detail in incorporated reference U.S. Provisional Patent Application No. 61/088,828. The output 0 of NAND circuit 10310 may be modified by the state of I3, as explained in U.S. Provisional Patent Application No. 61/088,828. The resistance state of NV NT switches 10351 and 10352 may be changed or written multiple times and read multiple times. The thickness of the NV nanoscopic carbon region of NV NT switches 10351 and 10352 may be used to determine the resistance and capacitance characteristics of the switches and their cumulative effect on the reprogrammable logic circuit 10300.

Multi-resistance states (values) may also be used to generate multiple logic weighting states programmed into the same NV nanoscopic carbon element as described further above with respect to cross point switch array 10200. Therefore, in addition to one low resistance state and one high resistance state that may be used to set a low voltage and a high voltage output, three low resistance states and one high resistance state may be used to store three logic weighting factors and one no connect represented as logical 00, logical 01, logical 10, and logical 11 states to output four voltage levels. For multi-level (greater that two in this example) voltage level outputs, a multilevel voltage sensing circuits (not shown) may replace NAND circuit 10310.

Methods of Fabricating NV NT Switches Using CNT Layers, Carbon NP Layers, and Various Non-carbon NP Layers FIGS. 104-110 present various methods of depositing a carbon nanotube layer, multiple carbon nanotube layers and mixed NP:CNT layers. Such methods may be used to fabricate NV NT switches with top and bottom contacts as illustrated in FIGS. 96A-961 and FIGS. 97A-C for example and described further above and also additional structures (not shown) based on other combinations of layers. These methods using nanotube element layers and carbon element layers are not limited to NV NT switches with top and bottom contacts but may include NV NT switches with top/side and bottom contacts as illustrated in FIG. 93 for example. These methods also may be used to form NV NT switches with horizontally disposed switching regions as illustrated in NRAM® arrays illustrated in FIGS. 100A, 100B and 100C. Also, these methods may be used to generate N-NRAM subarrays illustrated in FIGS. 101A and 101B. These methods may also be used to form NV NT cross point switches for programmable signal routing for example using NV NT switches defined lithographically in all dimensions as illustrated in FIG. 102 and programmable logic circuits illustrated in FIG. 103; NV NT switches defined lithographically in one dimension and electrically in another approximately orthogonal direction as illustrated in FIG. 98; NV NT switches defined electrically in two approximately orthogonal directions as illustrated in FIG. 99.

These methods for depositing non-carbon layers such as a thin insulator regions forming interface element 9535D in FIG. 96D include using CVD, PECVD, spin-on layers and others known in the industry. Methods may also include ion implantation to introduce non-carbon species in such as atoms of Si, Ge, Cu, W, Ti, and many other materials in various layers of NV nanoscopic carbon layers to form NV nanoscopic modified carbon (and non-carbon) layers such as those illustrated in, but not limited to, NV NT switches illustrated in FIGS. 96F-96I and 97B and 97C. Methods of ion implantation may also be used to implant carbon into various layers of NV nanoscopic carbon elements.

Figure 104A:
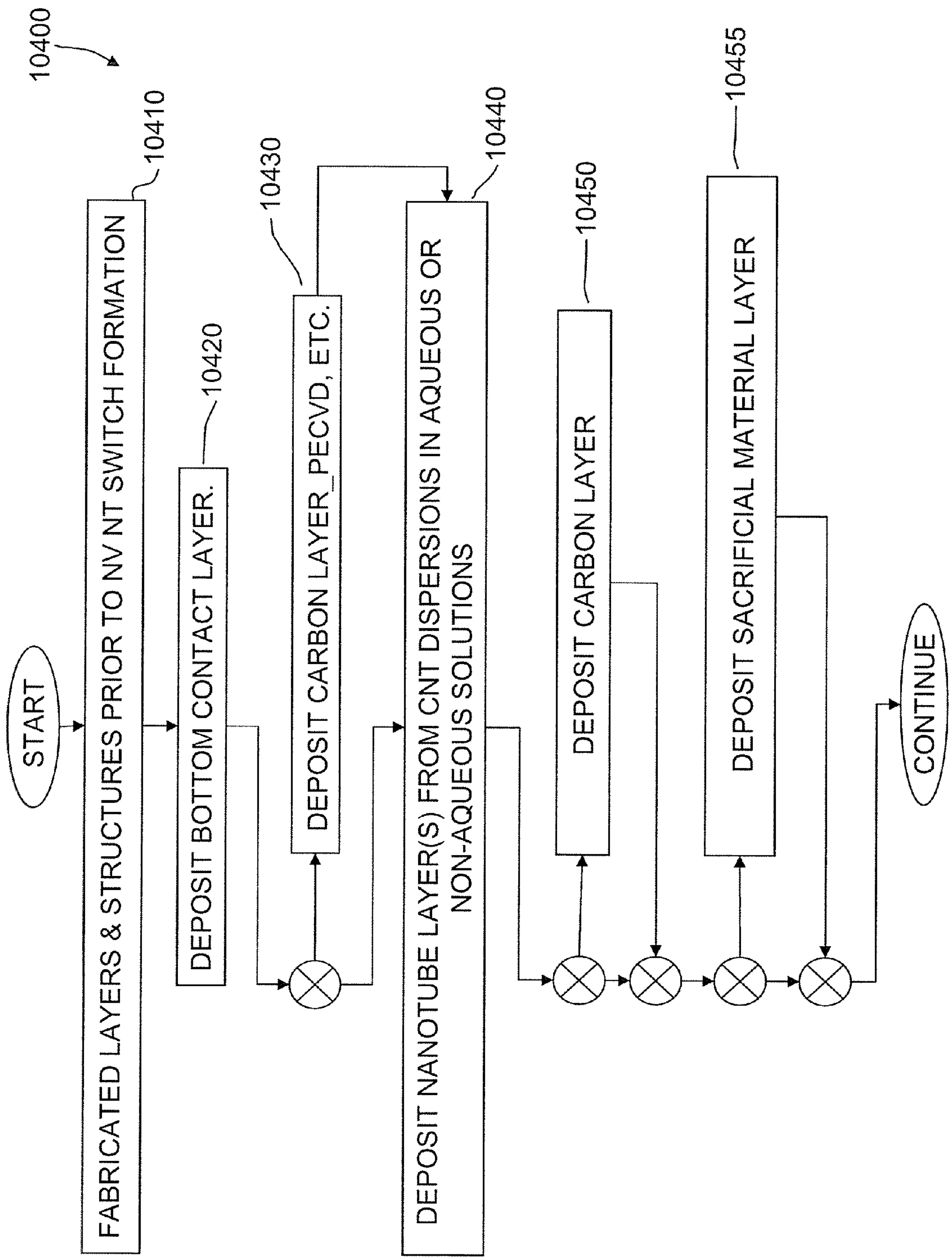
FIGS. 104A-B collectively illustrate a schematic chart representing a process flow for fabricating nonvolatile nanotube switches having nanoscopic element stacks, nanoscopic trace stacks, or a nanoscopic plane stack according to certain embodiments.
Figure 104B:
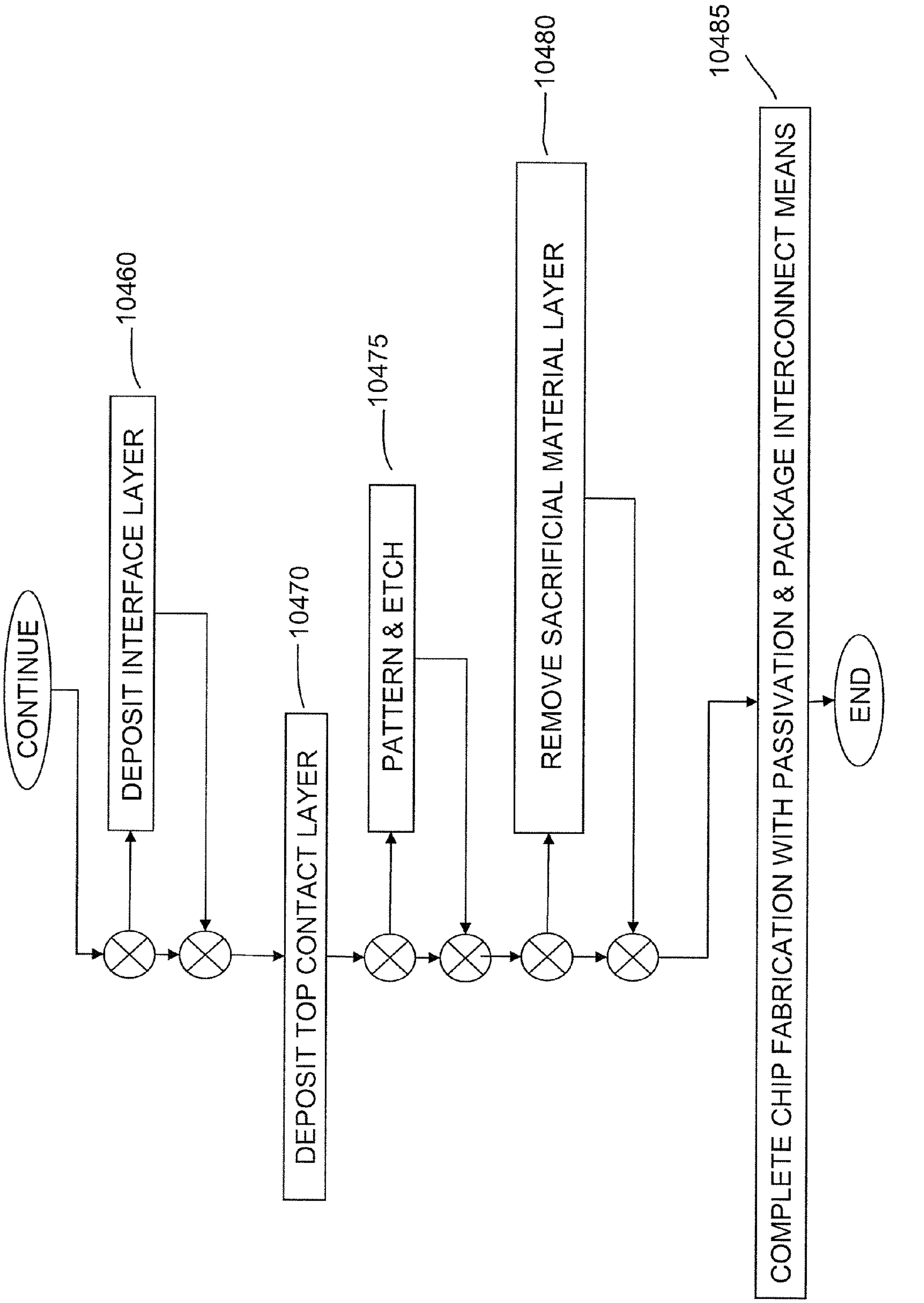

Methods of Fabricating NV NT Switches Using Combinations of Carbon Layers, CNT Layers, Non-Carbon Interface Layers, and Atomic Species Implanted in Various Layers FIGS. 104A-B illustrate a methods of fabrication 10400 of fabricating various NV NT switches such as those illustrated in, but not limited to, FIG. 96 shown and described above.

Methods 10410 entails depositing and patterning semiconducting, metallic, and insulating layers and forming structures using methods well known in the industry prior to deposition of layers for the formation of NV NT switches. Such fabricated layers and structures include NRAM® memory circuits and arrays as illustrated for example in FIGS. 93, 100A, 100B, and 100C; NV NT diode-based memory as illustrated in FIG. 92; nanotube NAND-based memory as illustrated in FIGS. 101A and B; NV NT cross point switches for programmable signal routing illustrated in FIG. 102; and NV NT switches for programmable logic illustrated in FIG. 103. In the present example, methods of fabrication 10400 are used to deposit layers needed to form NV NT switch 9600A illustrated in FIG. 96A.

Figure 105A:
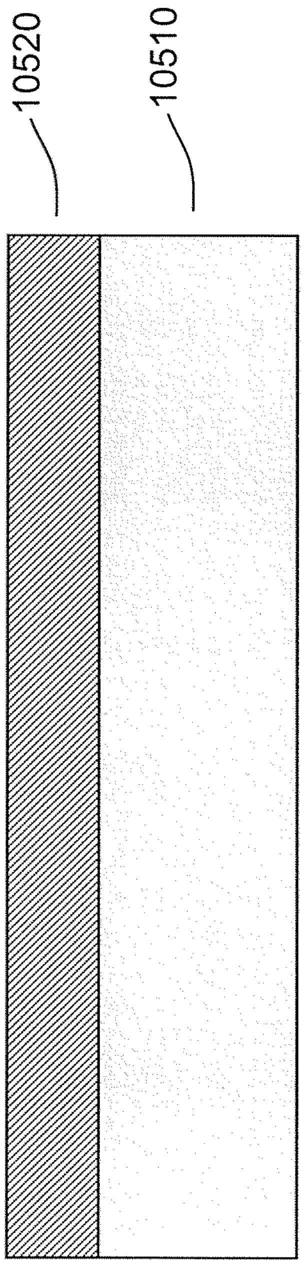
FIGS. 105 A-D illustrate steps for fabricating nonvolatile nanotube switches having nanoscopic element stacks, nanoscopic trace stacks, or a nanoscopic plane stack according to certain embodiments.

Next, methods 10420 deposit a bottom contact layer of an electrically conducting material on a substrate with fabricated layers using known industry methods resulting in the structure illustrated in FIG. 105A where bottom layer 10520 is deposited on substrate 10510. Bottom contact layer 10520 thickness may be in the range of 5 nm to 200 nm for example. In this example, bottom contact layer 10520 may be formed using conducting material such as W, TiN, WN, or TiCN, although various other conductor, semiconductor, and carbon materials may also be used. Such conductive material may be Ru, Ti, Cr, Al, Al(Cu), Au, Pd, Ni, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TaN, CoSix and TiSix . Semiconducting material may be used such as silicon doped to N or P type, Ge, and other semiconductor material. Silicides of silicon such as tungsten silicide may also be used Alternately, a carbon material may also be used as a bottom contact layer. Such conductive material layers may be deposited using known industry methods such as CVD, LP CVD, PECVD, evaporation, sputtering and other industry methods.

At this point in the process, methods 10430 may optionally be used to deposit a carbon layer. In this example, a carbon nanotube layer is deposited directly on the top surface of bottom contact layer 10520 so optional methods 10430 are bypassed. However, methods 10430 corresponds to methods 10450 of carbon deposition described further below.

Figure 105B:
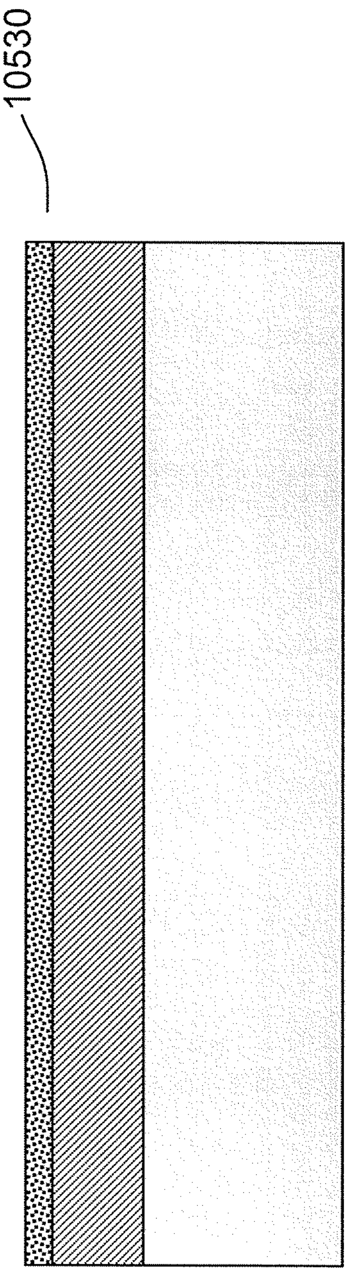

Next, methods 10440 deposits a carbon layer such as carbon nanotube (CNT) layer, or layers, from CNT dispersions in aqueous or non-aqueous solutions and deposit carbon nanotube layer 10530 on the top surface of bottom contact layer 10520 illustrated in FIG. 105B. Carbon nanotube layer 10530 may be in the range of approximately 1 or 2 nm to approximately 250 nm, for example. New methods of processing nanotube material and solution formation may enhance the electrical characteristics of the nanotube material for new generations of carbon nanotube materials that exhibit lower voltage switching at <5 volts, lower currents for reset (set) of <50 μA, and tolerance of RTA temperatures of 750° C. for NV NT switch dimensions of <50 nm thereby enabling scaling of cells sizes to smaller dimensions. Methods of carbon nanotube layer deposition are described in incorporated patent references.

Alternately, method 10440 may include additional material between individual carbon nanotubes (CNTs) as described further above with respect to FIGS. 57B and 57C. Additional material may include nanoscopic particles (NP) thereby forming a composition of multiple materials of material phases and described further above with respect to FIGS. 83A, 83B, 84A, and 84B. Nanoscopic particles may be nanoscopic carbon particles. FIG. 97A illustrates NV NT switch 9700A which includes nanoscopic particle and carbon nanotube (NP:CNT) element 9745A. Alternately, non-carbon nanoscopic particles may be also be included or may be substituted for carbon particles.

Figure 105C:
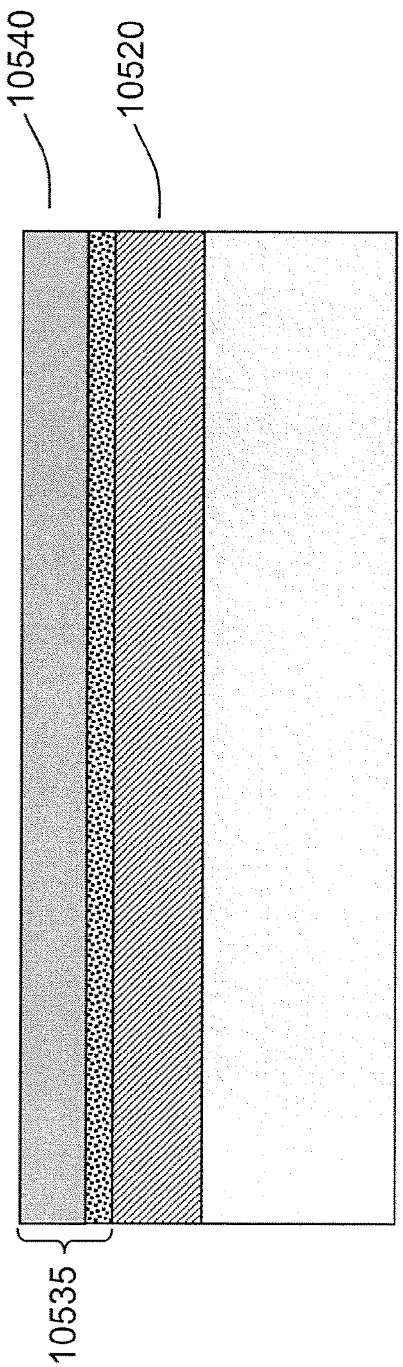

Then, method 10450 deposit carbon layer 10540 on the top surface of carbon nanotube layer 10530 as illustrated in FIG. 105C. Carbon layer 10540 may be in a thickness range of approximately 5 nm to approximately 200 nm, for example. Methods of carbon layer deposition include PECVD (plasma enhanced chemical vapor deposition) at temperatures of less than 500° C. and pressure in the mTorr range for example. PECVD also may be integrated with TiN PECVD deposition. Typically PECVD conditions include precursor typically carbon based ($CH_4$, $CF_4$, and others) diluted in argon. Dopants such as boron formed using $BH_4$ diluted in argon and other dopants may be included as well. Film electrical and physical characteristics may be a function of preferred deposition methods such as $CH_4$ or $CF_4$ for example, dopants such as boron for example, and RF power, pressure, temperature, and chamber design. PECVD equipment suppliers include Novellus Vector series and Applied Materials (AMAT) Producer series for example.

Other methods 10450 of carbon layer deposition may include CVD (chemical vapor deposition) but typically at higher temperatures than for PECVD depositions. Methods 10450 also include PVD (physical vapor deposition), ebeam evaporation of a carbon source, spin-on of a carbon layer such as carbon black for example. PVD (physical vapor deposition) may be deposited at lower temperatures such as 200° C. for example and may be integrated with TiN PVD for example.

Still other methods 10450 of carbon layer deposition include PhECVD (photo-enhanced CVD) typically laser based. Also, microwave surface-wave plasma CVD, FCAD (filtered cathodic arc deposition) that may produce hydrogen-free carbon layers, and electroplating using tools such as those supplied by Semitool may be used. Deposition of a polymer coated layer and then carbonization ("burning") to form a carbon layer may also be used.

At this point in the process, methods 10455 may optionally be used to deposit a sacrificial material layer. A sacrificial polymer layer is described further above with respect to deposition in FIG. 57B and removal after completion of a top contact (terminal) formation with respect to FIG. 57B'. However, other sacrificial materials may be used. In this example, methods 10455 deposit germanium (Ge) as a sacrificial material layer. Germanium may be used because deposition methods are compatible with silicon-based FETs, diodes, NV NT switches, and other structures. Also, Ge may be removed (etched) selective to silicon, various contact metallurgies such as W, TiN and carbon nanotubes for example so structures are not impacted. While sacrificial material is not used in forming structures in the FIG. 105 example, sacrificial material may be used to form item 5 in table 10600 shown in FIG. 106 further below so optional methods 10455 is described.

After the formation of carbon nanotube layer 10530 as described further above, methods 10455 forms a Ge layer by depositing a layer of Ge of approximately 5 nm to approximately 250 nm in thickness using rapid thermal processing (RTP) using industry LPCVD tools and methods, for example. Methods 10455 of Ge deposition may deposit a layer of polycrystalline Ge that penetrates a porous carbon nanotube layer such as carbon nanotube layer 10530 completely from top-to-bottom or may penetrate only the top portion of the carbon nanotube layer 10530 depending on the relative thickness of the Ge and carbon nanotube layers. Carbon nanotube layer 10530 volume is typically approximately 90% void with carbon nanotubes occupying approximately 10% of the volume.

Next, methods 10455 etch-back sufficient Ge to expose the top surface of the carbon nanotube layer such as carbon nanotube layer 10530 to ensure contact to the next layer, a top contact layer for example. A chlorine-based chemistry may be applied using reactive ion etch (RIE) industry tools and methods to remove a controlled amount of Ge. A sufficiently thick Ge layer remains within the carbon nanotube volume region to prevent top-to-bottom shorts when another layer is deposited. Examples of other layers that may be deposited are carbon, W, WN, TiN, TiCN, and other conductors and semiconductors illustrated with respect to step 10420 described further above.

At this point in the process, methods 10460 may optionally be used to deposit an interface layer. In this example, no interface layer is included in the structure and these optional fabrication steps are omitted. However, methods 10460 of depositing an interface layer corresponds to interface layer materials described further above in FIG. 96D with respect to interface element 9635D. Methods 10460 use known semiconductor industry methods.

Figure 105D:
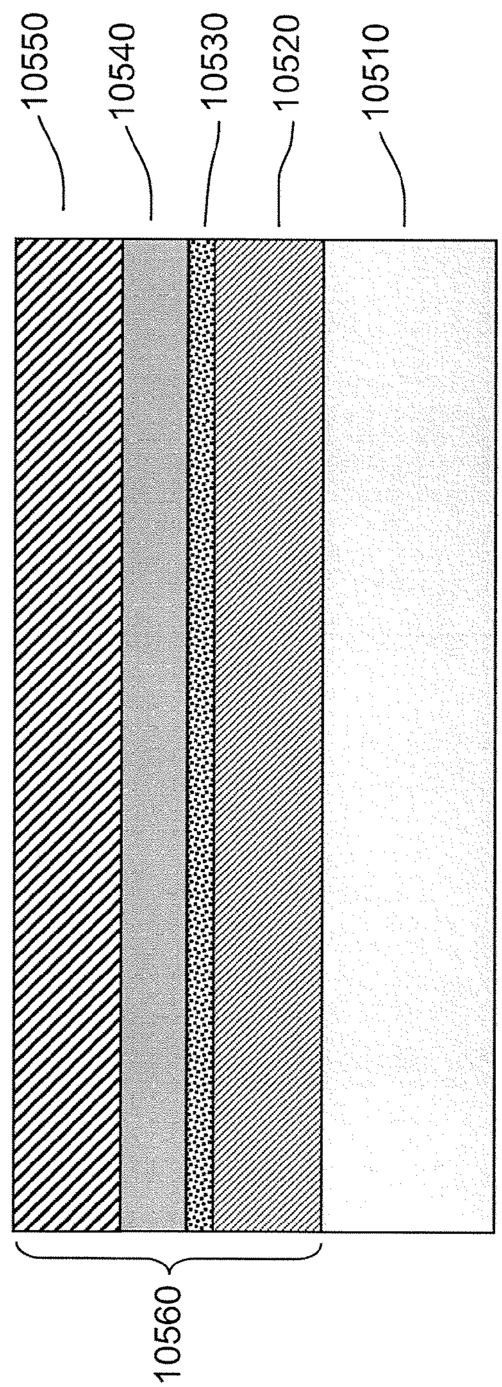

Next, in this example, methods 10470 deposit top contact layer 10550 on the top surface of carbon layer 10540 as illustrated in FIG. 105D. Top contact layer 10550 is similar in thickness and composition to bottom layer 10520 described further above.

Alternately, methods 10470 may deposit a top contact conductive layer on the surface of a carbon nanotube layer such as carbon nanotube layer 10530 in FIG. 105B using electroless deposition. If the carbon nanotube layer is hydrophobic, for example, then surface tension may prevent the solution from penetrating into the nanotube layer between the nanotubes thereby preventing conductor atoms from coating individual nanotubes avoiding shorting to a bottom conductor. Methods and tools for electroless plating of conductors such as Ni, Au, and other conductors are available from Precision Plating Company, Chicago, Ill. for example.

At this point in the process, photolithographic methods 10475 that pattern and etch corresponding to well known industry methods may be applied to layers 10560 of FIG. 105D to form NV NT switches with top and bottom contacts as shown in FIGS. 96A-I. Photographic methods of fabrication described further above with respect to FIGS. 68A-681 may be used to pattern, etch trenches, fill trenches, and planarize and may be used to form NV NT switch 9600A illustrated in FIG. 96A and also cell 9205 illustrated in FIG. 92. Methods 10475 described with respect to FIGS. 68A-I may also be used to etch NV NT switches or combinations of NV NT switches and diodes to form NV NT diodes memory arrays. Note that while FIGS. 68A-I illustrate NV NT switch stacked in series with a diode below the switch, the diode may also be formed above and in series with the NV NT switch.

At this point in the process, methods 10480 may optionally remove the sacrificial material if present in the structure. Methods 10480 is chosen to optimize the removal of a layer or layers of sacrificial material in the carbon nanotube layer. For purposes of illustration, it is assumed that a TiN top contact layer is in contact with the top surface of a carbon nanotube layer that includes sacrificial Ge material that needs to be removed and that a pattern has been formed in a masking layer on the top surface of the TiN contact layer.

Next, methods 10480 removes TiN using a chlorine-chemistry-based RIE process for example. This process is selective to carbon nanotubes and exposes the tops of the carbon nanotubes and the top surface of the Ge sacrificial layer. Dilute peroxide may be used to remove the Ge sacrificial material in the opening and below the TiN top contact region. Exposed portions of the carbon nanotube layer may be etched using methods disclosed in U.S. Pat. No. 6,835,591, filed Apr. 23, 2002, entitled "Methods of Nanotube Films and Articles," the contents of which are incorporated reference in their entirety. Then, methods 10485 complete the fabrication of chips including additional contact and interconnect structures, passivation, and package interconnect terminals.

Methods 10475 for patterning and etching are introduced prior to methods 10485. However, there are examples where patterning and etching may be introduced later in the process. For example, a diode layer (a silicon-based PN junction diode for example) may be formed by applying silicon layers above the layers that form an underlying NV NT switch. In that case, methods may be used to pattern and etch to form PN diodes, and other etch methods may then continue to etch and form underlying NV NT switches in series with the PN diodes.

Ion implantation may be used to enhance performance by introducing various species (atoms and molecules) in any of the layers described above with respect to various methods of fabrication 10400. Ion implantation may be carried out after the deposition of a top contact layer for example. Ion implantation may also be carried out after patterning and etching. Ion implantation may also be carried out after deposition of a carbon nanotube layer such as carbon nanotube layer 10530. Examples of ion implanted regions in various elements corresponding to various layers are illustrated in FIGS. 96G-96I.

Methods of fabrication 10400 may be used to form various NV NT switch structures including various nanoscopic element stacks summarized in table 10600 shown in FIG. 106 and other structures not shown in table 10600. These NV NT switch examples correspond to NV NT switches (item #1-6 in table 1060) illustrated in FIGS. 96A, 96B, 96D, 96E, 57B and 57B', and 97A. Methods 10400 used to fabricate each NV NT switch (item # 1-6) is shown by the presence of an X in a column corresponding to a method number in various methods of fabrication 10400. By way of example, nanoscopic element stack 9650A (item # 1) includes methods 10440 and 10450 described further above with respect to methods of fabrication 10400 resulting in the deposition of NV nanoscopic element layers 10535 on the top surface of bottom contact layer 10520 as illustrated in FIG. 105C. Fabrication of the entire NV NT switch 9600A structure illustrated in FIG. 96A also includes methods 10420, 10470, and 10475 in addition to methods 10440 and 10450, all described further above with respect to methods of fabrication 10400.

Fabrication of NV NT switch 9600B (item # 2 in table 10600) and illustrated in FIG. 96B includes the formation of nanoscopic element layers, corresponding to nanoscopic element stack 9650B, by methods 10430 and 10440 on the top surface of a bottom contact layer corresponding to bottom contact layer 10520 illustrated in FIG. 105A. Fabrication of the entire NV NT switch 9600B structure illustrated in FIG. 96B includes methods 10420, 1070, and 10475 in addition to methods 10430 and 10440, all described further above with respect to methods of fabrication 10400.

Fabrication of NV NT switch 9600D (item #3 in table 10600) and illustrated in FIG. 96D includes the formation of nanoscopic element layers, corresponding to nanoscopic element stack 9650D, by methods 10340, 10440, and 10460 on the top surface of a bottom contact layer corresponding to bottom contact layer 10520 illustrated in FIG. 105A. Fabrication of the entire NV NT switch 9600D structure illustrated in FIG. 96D includes methods 10420, 1070, and 10475 in addition to methods 10430, 10440, and 10460 all described further above with respect to methods of fabrication 10400.

Fabrication of NV NT switch 9600E (item #4 in table 10600) and illustrated in FIG. 96E includes the formation of nanoscopic element layers, corresponding to nanoscopic element stack 9650E, by methods 10440, and 10460 on the top surface of a bottom contact layer corresponding to bottom contact layer 10520 illustrated in FIG. 105A. Fabrication of the entire NV NT switch 9600E structure illustrated in FIG. 96E includes methods 10420, 1070, and 10475 in addition to methods 10440 and 10460 all described further above with respect to methods of fabrication 10400.

Fabrication of NV NT switch 5700B (item # 5 in table 10600) and illustrated in FIG. 57B includes the formation of NV nanoscopic modified carbon layers in which a sacrificial material, in this example Ge, is formed in a carbon nanotube layer. The carbon nanotube layer can be layer 10530 illustrated in FIG. 105B as described further above with respect to methods 10455 and illustrated in FIG. 57B by NV NT block 5730. A bottom contact region 5755 corresponds to a bottom contact layer similar to bottom contact layer 10520 illustrated in FIG. 105A. Fabrication of the entire NV NT switch 5700B structure illustrated in FIG. 57B includes methods 10420, 10470, and 10475 in addition to methods 10440, and 10455 such that a top contact element is formed on top contact region 5740 in FIG. 57B prior to the removal of the Ge sacrificial material that prevents top-contact to bottom-contact shorts. Then, sacrificial Ge is removed as described further above by methods 10480 with respect to methods of fabrication 10400 such that NV NT block 5730' in FIG. 57B' contains only a NV nanoscopic carbon element composed of a carbon nanotubes.

Methods 10455 and 10480 are shown as dotted-Xs because the sacrificial material is removed and is not part of the final NV NT switch 5700B' structure. NV NT block 5730' in FIG. 57B' is formed of only carbon nanotubes; however, top-to-bottom contacts may be more closely spaced because of the use of the sacrificial material. Combined with new methods of processing nanotube material and solution formation may make it easier to enhance the electrical characteristics of the carbon nanotube material such that it exhibit lower voltage switching at <5volts, lower currents for reset (set) of <50 μA, and tolerance of RTA temperatures of 750° C. for NV NT switch dimensions of <50 nm thereby enabling scaling of cells sizes to smaller dimensions.

While NV NT switch 5700B' does not include any substantial amount of additional NP material in the carbon nanotube fabric region, FIG. 57C illustrates a NV NT switch 5700C in which a performance enhancing material may be included and remain in the carbon nanotube volume region. This is illustrated by NV NT block 3750 as described further above with respect to FIG. 57C. In this case, method 10480 is omitted and the performance enhancing material is not removed.

Fabrication of NV NT switch 9750A (item #6 in table 10600) and illustrated in FIG. 97A includes the formation of nanoscopic element layers, corresponding to nanoscopic element stack 9750A. This uses methods 10440, and 10450 on the top surface of a bottom contact layer corresponding to bottom contact layer 10520 illustrated in FIG. 105A. In this case, methods 10440 appears as "O" in table 10600 to indicate modified methods of deposition corresponding to deposition of matrix material element 9745A described with respect to FIG. 97A is used instead. Fabrication of the entire NV NT switch 9700A structure illustrated in FIG. 97A includes methods 10420, 10470, and 10475 in addition to modified methods 10440, and methods 10450

Ion implantation may be used to enhance performance by introducing various species (atoms and molecules) in any of the layers described above with respect to methods of fabrication 10400. Ion implantation may be carried out after the deposition of a top contact layer for example. Ion implantation may also be carried out after patterning and etching. Ion implantation may also be carried out after deposition of a carbon nanotube layer such as carbon nanotube layer 10530. Examples of ion implanted regions in various elements corresponding to various layers are illustrated in FIGS. 96G-96I as well as FIGS. 97B and 97C. Ion implantation may be applied to various layers prior to methods 10475 of pattern and etch or after pattern and etch is complete.

Example Methods for Increasing CNT Fabric Resistance by Fabricating CNT Fabrics with Defects in the CNTs CNTs used in forming CNT dispersions corresponding to methods 10440 illustrated in FIG. 104 are described in patents and patent applications, U.S. Pat. No. 6,835,591 and U.S. patent application Ser. No. 10/341,005, entitled "Methods of Making Carbon Nanotube Films, Layers, Fabrics, Ribbons, Elements and Articles," the entire contents of which are herein incorporated by reference. Methods of deposition of CNT dispersions are described in patents and patent applications including U.S. patent application Ser. No. 10/860,433, entitled "Applicator Liquid Containing Ethyl Lactate for Preparation of Nanotube Films," the entire contents of which are herein incorporated by reference. As described in the incorporated references, CNTs are treated with acids such as nitric acid (see below). Also, CNTs may be treated with a combination of nitric acid and sulfuric acid. Various other CNT treatments may be used.

Monitor wafers are used to monitor CNT fabric layer resistance per unit area using well known four-point probe resistance measuring techniques. What is observed for CNT dispersions with primarily multi-wall nanotubes (MWNTs) is that if CNTs are treated with a combination of nitric acid and sulfuric acid instead of just nitric acid, then the resistance per unit area for approximately the same thickness films is higher. CNT exposure to a stronger acid solution appears to increase defect in the CNTs which in turn increases resistance to current flow resulting in higher CNT fabric (nanofabric) resistance. Four-point probing of CNT fabric layers minimizes the effect of contact resistance between probes and CNT fabric layer so measured increase in per unit area resistance is primarily caused by an increase in the CNT fabric resistance. Additional CNT defects also are expected to reduce the maximum current carrying capacity of CNTs. The effects of reduced maximum current carrying capacity of CNTs may be observed in terms of reduced maximum switching currents from an ON to an OFF state for example.

Changing the type of CNTs can also change the sensitivity of CNTs to acid treatment. For example, if single wall nanotubes (SWNTs) are used to form CNT dispersions and deposited on monitor wafers using methods 10440 for example, then a similar increase in CNT fabric resistance is observed with just nitric acid treatment. In other words CNT dispersions formed primarily of SWNTs treated with nitric acid result in approximately the same CNT fabric resistance increase as CNT dispersions formed primarily of MWNTs and treated with nitric and sulfuric acid. Monitor wafer four point probe resistance increases are correlated with NV NT switch electrical test results such that NV NT switch voltages are less than or equal to 5 volts and reset currents are less than or equal to 40 μA. Higher defect levels may be used to achieve even lower switching voltages (less than 4 volts for example, and reset currents lower than 40 μA for example).

In addition to, or instead of, forming defects with increased acid (or other) CNT treatments, CNT defects can be introduced by ion implantation of CNT fabric layers before or after patterning. Examples of ion implantation used to change CNT fabric properties are described further above with respect to FIG. 96I for example. Ion implantation may be applied to the CNT layer, or ion implantation can be carried out after the NV NT switch is formed (etched), or both. A simple NV NT diode cell such as cell 1 illustrated by cross section 4000 in FIG. 40 may be fabricated with nanotube switch 4005 which includes nanotube element 4050 whose CNT fabric resistance can be increased by acid (or other) treatments of CNTs as part of the CNT dispersion formation; and/or nanotube element 4050 CNT fabric resistance may be increased by ion implantation; and/or nanotube element 4050 CNT fabric resistance may be increased by using SWNTs to replace MWNTs to increase CNT sensitivity to defects.

Nanotube switches such as nanotube switch 4005 illustrated in FIG. 40 may be formed by selecting the following method sub-steps in methods of fabrication 10400: Methods 10410, 10420, 10440, 10470, 10475, and 10485. Comparing nanotube switches from CNT dispersions from batches with higher four-point contact-measured resistance per unit area as described further above typically result in switches with lower switching voltage and lower ON-to-OFF state switching current values. It is reasonable to assume that contact resistance RC between terminals and CNTs may be approximately unchanged for CNT fabric resistance increased by various means described further above. In the case of ion implantation, the ion implanted species can be controlled such is the implanted species are present only in the CNT fabric layer region. The total applied voltage applied to nanotube switches appears across two series resistances $R_C$ and also across the CNT fabric resistance $R_{CNT}$. For higher fabric resistance $R_{CNT}$ in series with the contact resistance increases the total resistance between the two terminals of the switch is higher for the same geometries and more of the voltage applied to the two terminals of the nanotube switch appears across $R_{CNT}$. Hence, it is reasonable to expect lower overall switching voltage V across the two terminals of switches while still maintaining the same switching voltage across the CNT switching-portion of the switch for a lower overall switching voltage operation for higher resistance CNTs.

Since a lower overall switching voltage is applied across the two terminals of the nanotube switch, the maximum available switching current is reduced. Measuring switching reset currents (ON-to-OFF state), which are typically higher than set current (OFF-to-ON state), shows that the required NV NT switch switching current is reduced for higher nanotube fabric resistance ($R_{CNT}$) switches. So the combination of lower applied switching voltage and higher NV NT switch resistance reduces the maximum available switching current. However, since defective CNTs require less current to switch from ON to OFF states for example, then these reduced nanotube switching currents are sufficient to cause switching. In other words, CNT defects resulting in higher CNT fabric resistance $R_{CNT}$ reduces the threshold for the switching current such that a lower switching current at a lower overall switching voltage across a higher resistance remains adequate for switching. Switching voltage and switching current measurements on sulfuric/nitride acid treated CNT-based switches show the following:

Set and reset voltages in the 4-5 volt range for a majority of switching embodiments, Reset (ON-to-OFF) switching current median values 101 and less than 40-50 μA for almost all switches, Set currents typically in the 1-3 μA range.

Reducing overall switching voltages and switching currents using higher resistance CNT fabrics enables the scaling memory cell sizes to smaller dimensions for technology nodes to 22 nm and even lower, to 10 nm minimum dimensions or less, while enabling cell select NRAM® FETs and steering diodes in NV NT diode memory cells to supply the reduced switching currents at the reduced voltages.

Tests were carried out on a 1024 bit 32×32 bit NRAM® memory test structure with FET select devices corresponding to FIG. 93 described further above. However, unlike the NAN-93 example, the nanotube element is surrounded on all sides with an insulator such as $SiO_2$ or $Al_2O_3$ for example so there is no end contact. Hence, only top and bottom contacts are made to the NV NT switch. A similar structure is illustrated in FIG. 64B. In this example, a 3-dimensional NV NT block-type switch was fabricated with a bottom tungsten contact corresponding to bottom contact 6427 illustrated in FIG. 64B and a top Ti/Pd strap corresponding to top terminal 6435 which forms a top contact corresponding to top contact 6437 illustrated in FIG. 64B. The nanotube element (or nanotube block) is typically in the range of 15 to 45 nm in thickness.

While a variety of reaction schemes can be used to produce the above-mentioned carbon nanotube materials and introduce defects in CNTs that form the nanofabric, a specific example is provided. The example is illustrative and should not be considered limiting, as a variety of other parameters can be favorably used by a one skilled in the art. In this example, 4-16 g of carbon nanotubes were mixed with 225-450 mL of 96% sulfuric acid and 150-300 ml of 70% nitric acid in a quartz reaction vessel. The volume ratio of sulfuric acid and nitric acid is 3:2. The addition of acids has to be done slowly and carefully to avoid excessive heat evolution. The quartz reaction vessel was attached to a reflux condenser and the reaction mixture was heated in oil bath set to 125-150° C. for 6 h.

In this example, after the acid reaction step, the CNT suspension in acid was diluted in 1% nitric acid (~2 L) and taken through several passes of cross-flow filtration (CFF). The pH of the suspension is maintained at 1+/−0.3 during this process by recovering the material in 1% nitric acid after each step. Typically ten CFF are performed. After the CFF1 steps, the retentate was recovered in DI water and the pH of the nanotube:DI water suspension was increased to 9.0+/−0.5 with 29% ammonium hydroxide and sonicated. The CNT suspension in DI water was rendered optically homogeneous. This liquid was taken through another set of CFF passes (hereinafter referred as CFF2). CFF2 was performed until optical density of the permeate was about less than 0.035. After CFF2 process the retentate is collected in basic de-ionized water (pH 8.5+/−0.5) and sonicated for 60-120 min in a chilled sonicator bath (4-5° C.). If necessary the pH of the solution is adjusted to 8.5+/−0.5 during the sonication step. Finally, the solution was centrifuged about two or three times at about 37700 g for 30 min at 15° C. After centrifugation step, the supernatant was collected and used as the final CMOS grade applicator liquid.

Methods of Fabricating NV NT Switches using Processing on a Substrate and Off-line Processing Using a Handle Wafer NV NT switch methods of fabrication to enhance NV NT switch performance with respect to methods of fabrication 10400 are illustrated in FIG. 104. Corresponding structures are illustrated in FIG. 105. A summary of various methods of fabrication and corresponding NV NT switches are illustrated in table 10600, FIG. 106. However, these examples describe methods of fabrication applied to the same substrate (or wafer), in this example a silicon substrate. Opportunities for additional NV NT switch performance enhancements are possible by optimizing portions or all of the NV NT switch fabrication on a handle wafer (or handle substrate) and then transferring these structures to the substrate as described further below. A substrate may be a conductor, a semiconductor, or an insulator. A substrate may be ceramic, organic, rigid, or flexible.

FIGS. 107-110 illustrate methods of fabrication using a combination of processing on a substrate, such as a silicon wafer for example, and off-line processing on a handle wafer whose layers (structures) are transferred to the substrate from the handle wafer, followed by removal of the handle wafer. Typically the handle wafer may be re-used. At this point in the process, fabrication on the substrate continues until all layers have been deposited and patterned. Handle wafers may be conducting, semiconducting, insulating and also ceramic, organic, quartz, rigid or flexible. A quartz handle wafer is described in examples further below.

Figure 107A:
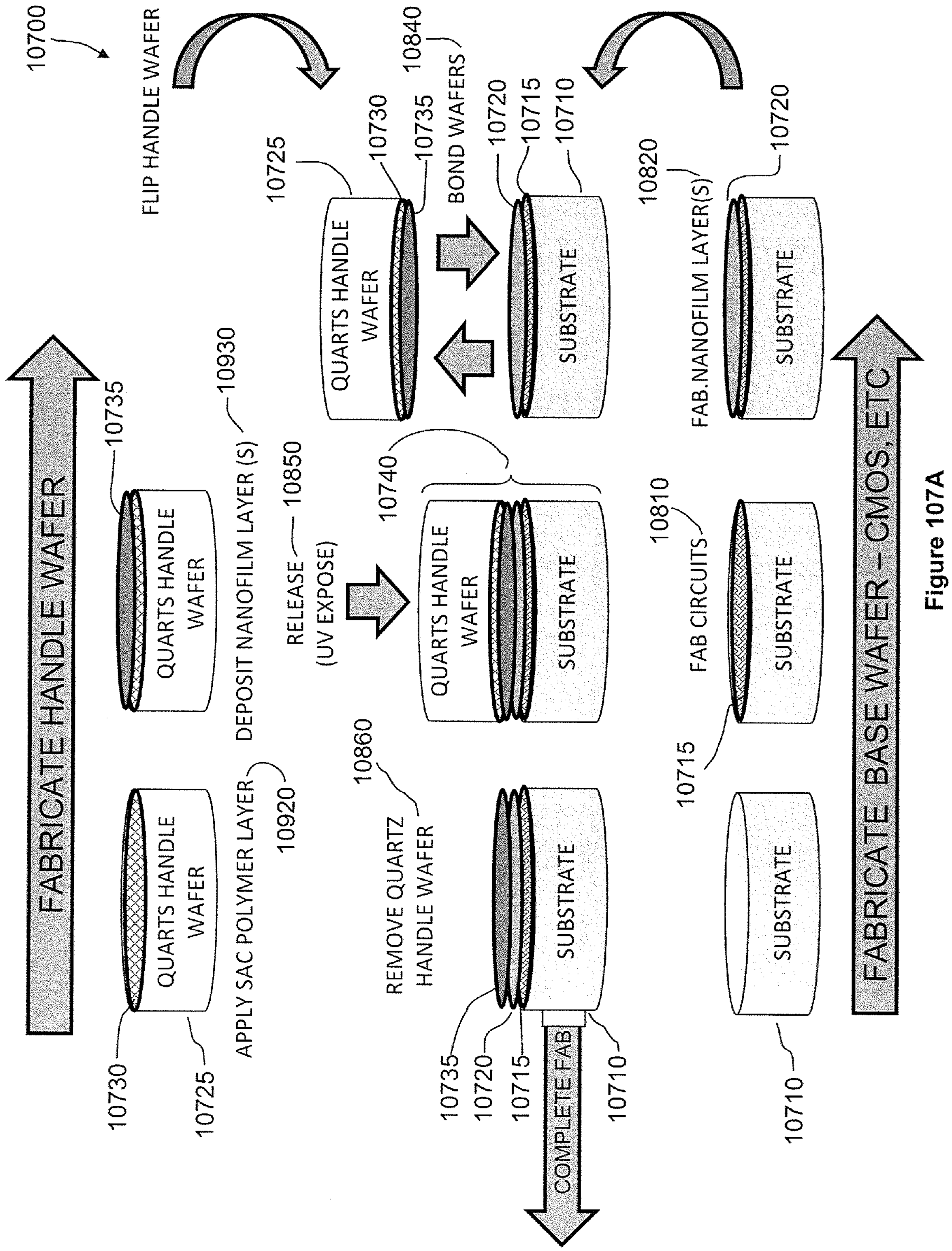
FIGS. 107A-B illustrate steps for fabricating nonvolatile nanotube switches having nanoscopic element stacks, nanoscopic trace stacks, or a nanoscopic plane stack, according to certain embodiments.
Figure 107B:
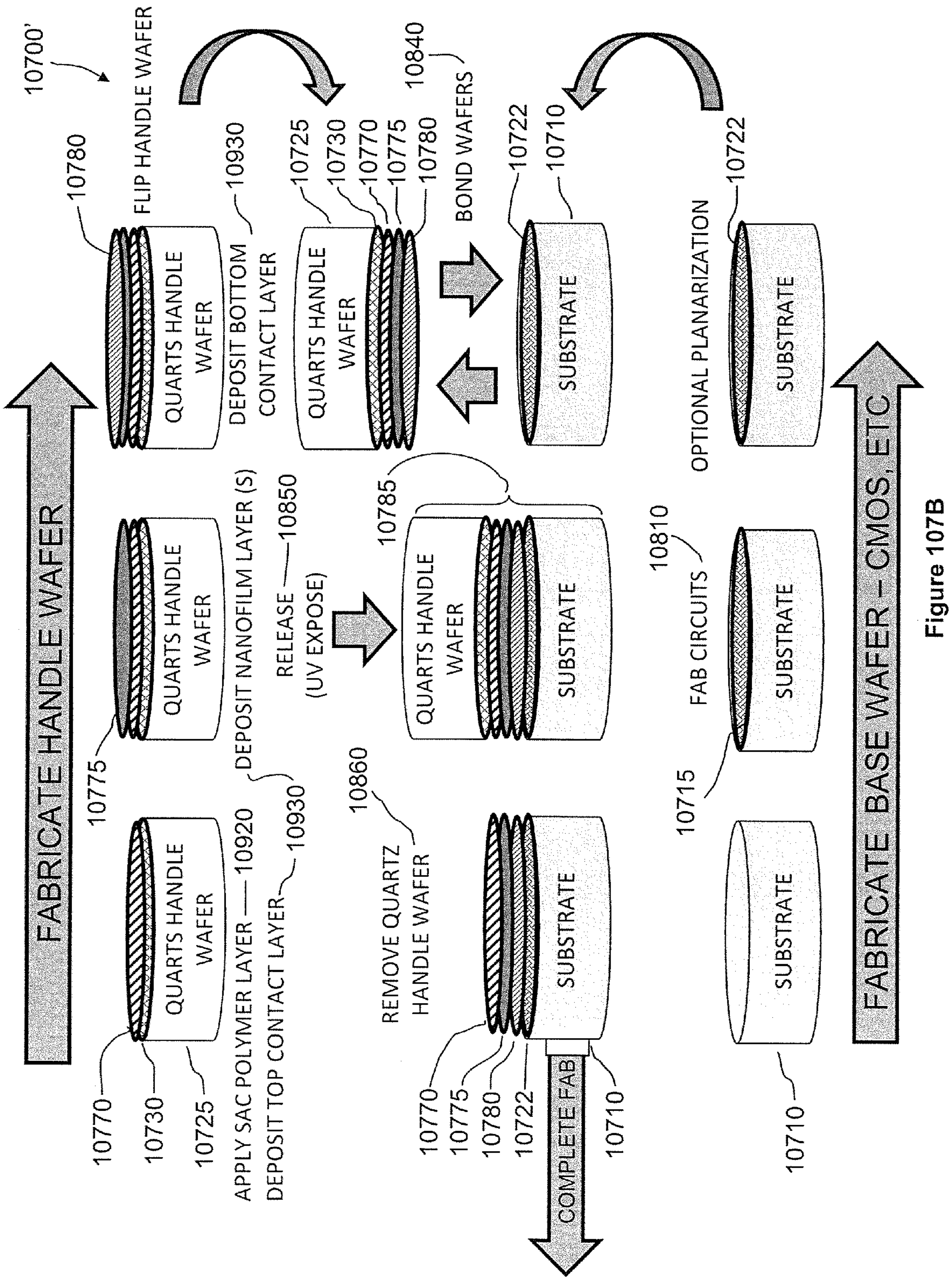
Figure 108A:
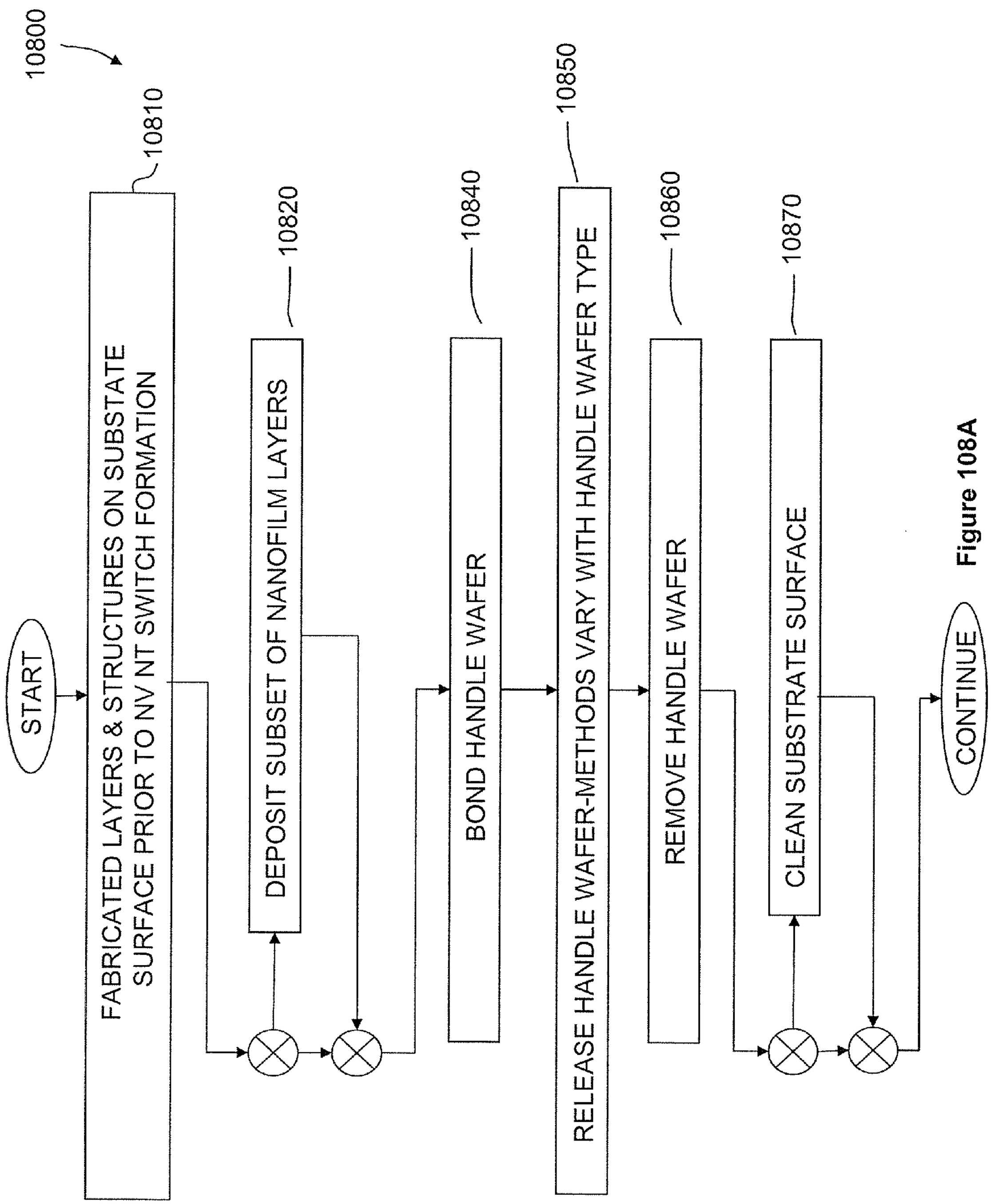
FIGS. 108A-B collectively illustrate a schematic chart representing a process flow for fabricating nonvolatile nanotube switches having nanoscopic element stacks, nanoscopic trace stacks, or a nanoscopic plane stack, according to certain embodiments.
Figure 108B:
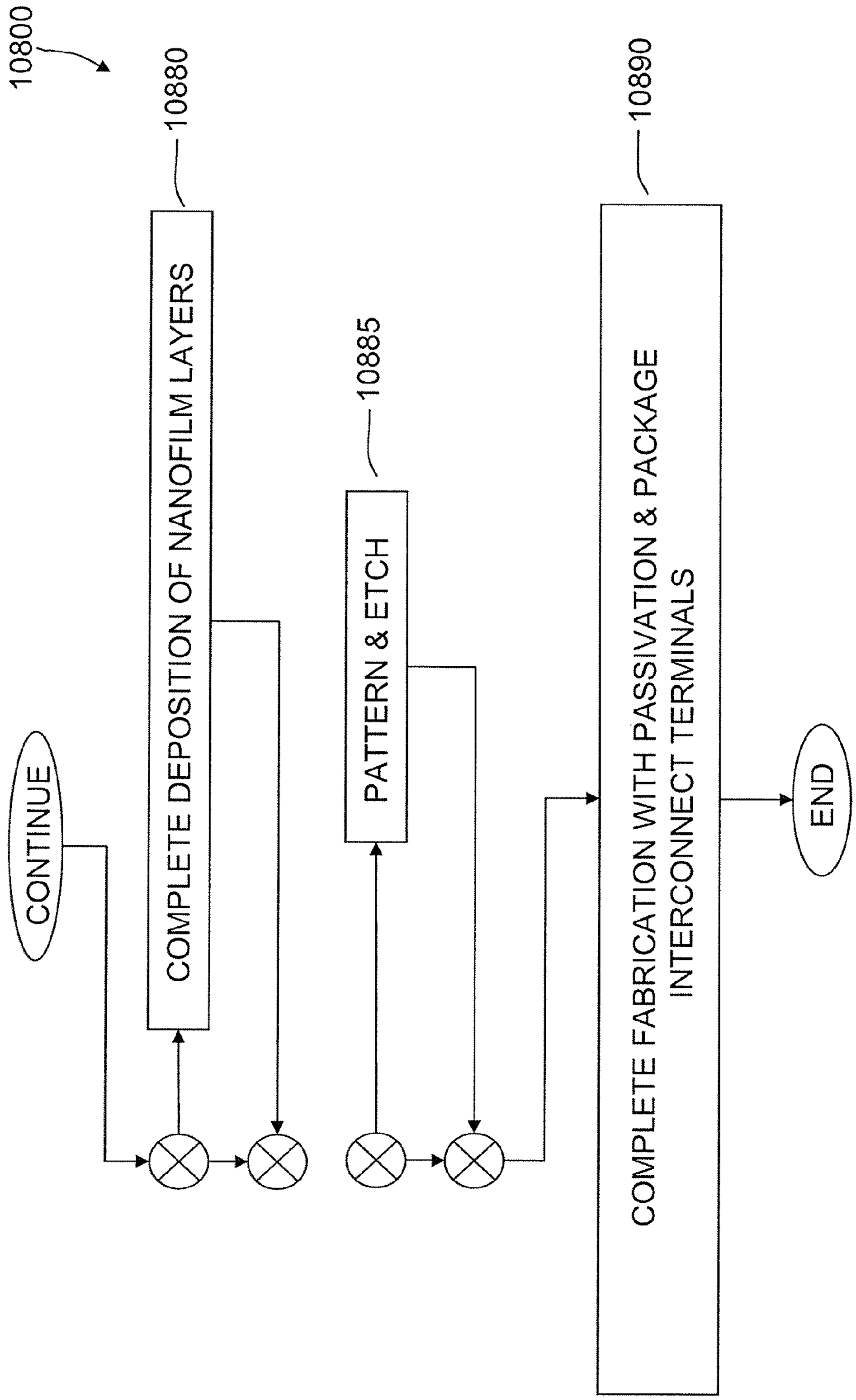
Figure 109:
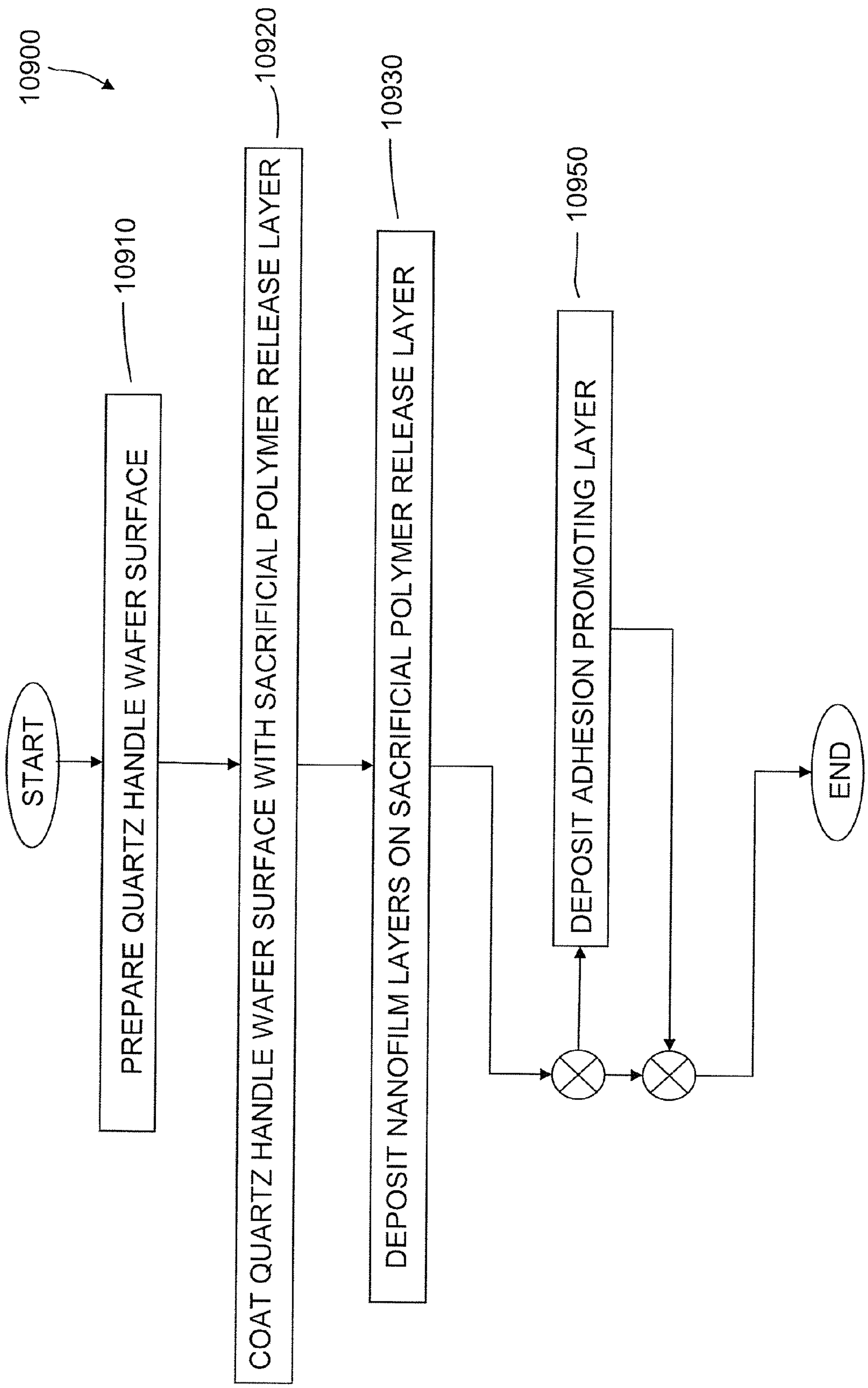
FIG. 109 illustrates a schematic chart representing a process flow for fabricating a handle wafer, according to certain embodiments.

FIGS. 107-109 are described in terms of forming and transferring a portion of a NV NT switch as illustrated in FIG. 107A or forming and transferring entire NV NT switches as illustrated in FIG. 107B from the handle wafer to the substrate. However, transfer of layers forming various structures from a handle wafer to a substrate is not limited to NV NT switches. For example, a NV NT diode-based NV NT array including cells C00 and C01 shown in cross section 6700 in FIG. 67 may be formed on a handle wafer and transferred to a substrate. NanoLogic® functions or subset of such functions as illustrated in FIG. 103 may be formed on a handle wafer and transferred to a substrate. Similar approaches may be used to form NRAM® functions. Also, CNT-FET logic or memory functions such as described in U.S. patent application Ser. No. 11/332,529, filed Jan. 13, 2006, entitled "Field Effect Device Having a Channel of Nanofabric and Methods of Making Same," and U.S. patent application Ser. No. 11/332,080, filed Jan. 13, 2006, entitled "Hybrid Carbon Nanotubes FET(CNFET)-FET Static RAM (SRAM) and Method of Making Same," herein incorporated by reference, may also be formed on handle wafers and transferred to substrate wafers.

Ion implantation may be used to optimize electrical characteristics of layers on handle wafers at various steps in the process prior to transfer of layers to substrates. Or ion implantation may be applied to various layers after completion of layer deposition, including a conductive layer, by varying the energy applied to various species of doping atoms.

Figure 110:
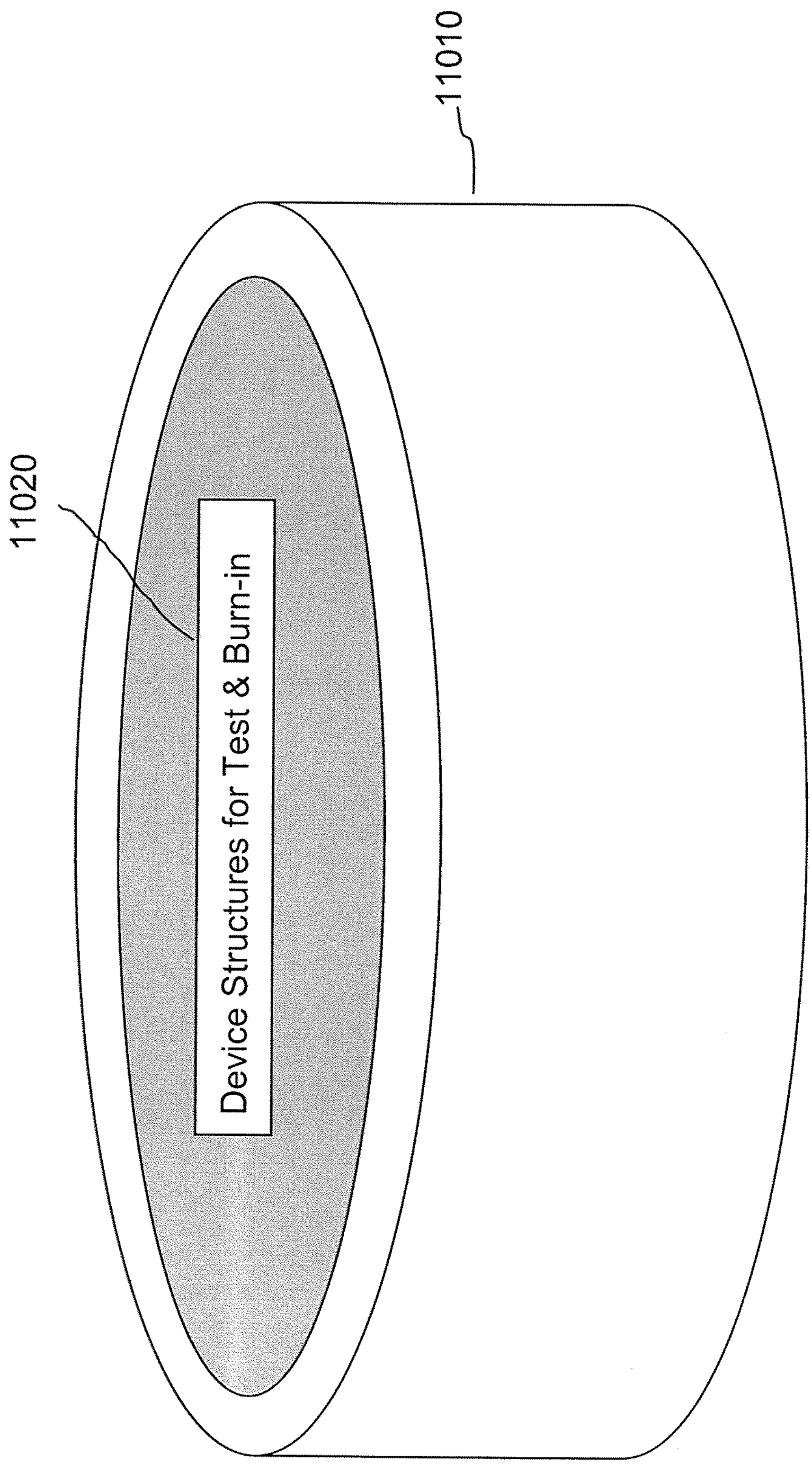

Forming structures on handle wafers may be used to improve performance by characterizing handle wafers prior to transfer of structure to the substrate as described further below with respect to FIG. 110. This may include physical inspection, electrical tests, electrical and thermal stress and characterization. One or more handle wafers may be selected from a lot and patterned to enable further electrical stressing and testing. Results may be used to eliminate handle wafer lots that do not enhance, or sufficiently enhance, switch function for example. Alternately, pattern and etch may be performed on the handle wafer and then transferred to the substrate using wafer-to-wafer (wafer-to-substrate) alignment methods known in the industry.

Fabrication flow 10700 illustrated in FIG. 107A shows various intermediate structures and corresponding methods of fabrication based on methods of fabrication 10800 or methods of fabrication 10900 illustrated in FIGS. 108 and 109 respectively. Substrate 10710 and additional layers are illustrated by a fabrication flow from left-to-right at the bottom of FIG. 107A. Fabrication flow 10700 also illustrates quartz handle wafer 10725 and additional layers with fabrication flow from left-to-right at the top of FIG. 107A. At a point in process described further below, quarts handle wafer 10725 including deposited layers, and substrate 10710 also including deposited layers, are bonded (joined) top-surface-to-top-surface to form stacked wafer 10740 as illustrated in the middle of FIG. 107A. Methods bond, transfer layers, and release the quartz wafer in a fabrication flow from right-to-left followed by additional fabrication as needed to complete the formation of the total function on the surface of substrate 10710 as described further below.

Methods 10800 illustrated in FIGS. 108A and 108B fabricate layers and structures on the substrate 10710 to form circuits 10715. Methods 10810 correspond to methods 10410 described further above with respect to FIG. 104. Next, methods 10820 for fabricating a nanofabric layer or multiple nanofabric layers, in this example, deposit bottom contact layer 10720 illustrated in FIG. 107A which corresponds to bottom contact layer 10520 illustrated in FIG. 105A deposited using methods 10420 described further above with respect to FIG. 104 and which corresponds to methods 10820. A nanofabric layer may be any of various layers described further above with respect to methods of fabrication 10400 and various NV NT switches described further above with respect to FIGS. 96A-I and FIGS. 97A-C. Examples of a nanofabric layer may include, but not be limited to, a nanotube layer such as a carbon nanotube layer, a contact layer formed of various materials described above with respect to the description of methods 10420 shown in FIG. 104. Methods of fabrication may include an interface layer formed of various oxides, nitrides, oxide-nitride-oxide (ONO) layers and other materials described further above.

Now turning to methods of fabrication 10900 shown in FIG. 109, methods 10910 prepare (clean) the quartz handle wafer 10725 illustrated in FIG. 107A using known industry methods. Then methods 10920 coat a quartz handle wafer 10725 surface to form a sacrificial polymer release layer 10730. A possible sacrificial polymer release layer 10730 may be formed using a self-ablating polymer layer. An ablation process may be done thermally or using UV exposure through the quartz wafer. Ablation may not leave residue on the top surface layer of substrate 10710 after bonding and release. Also, gases may be produced by the ablation process which may assist in mechanical release (mechanical lifting or removal) of quarts handle wafer 10725. A layer of Polyphthalaldehydes may be used as described in the following references: Hiroshi Ito, Reinhold Schwalm, "Highly Sensitive Thermally Developable, Positive Resist Systems," J. Electrochemical Soc. Vol. 136, No. 1, January 1989, pp. 241-245 and Hiroshi Ito, Ueda Mitsuru, Reinhold Schwalm, "Thermally Developable, Positive Resist Systems with High Sensitivity," J. Vac. Sci. Technol. B, Vol. 6, No. 6, November/December 1988, pp 2259-2263. Alternately, a layer of Polysilanes may also be used as described in the following references: West, R. et. al., J. Am. Chem. Soc. 1981, 103, 7352 and Trefonas, P. T., Polym. Sci, Polym. Lett. Ed., 1983, 21, 819. Still another alternative may be used to form a layer of Polycarbonates as described in Jean M. Frechet, et. al., Polymer Journal. Vol 19, No. 1, 1987, pp 31-49.

At this point in the process, methods 10930 deposit one or more nanofabric layers on sacrificial polymer release layer 10730 to form nanofabric layer 10735 as shown in FIG. 107A. Methods 10930 illustrated in FIG. 109 correspond to methods illustrated in FIG. 104. If, for example, only a carbon nanotube layer is to be deposited, then methods 10440 may be used. Alternately, if NV nanoscopic element layers 10535 illustrated in FIG. 105C is to be formed, then methods 10430 deposits a carbon layer on the top surface of sacrificial polymer release layer 10730 corresponding to carbon layer 10540 followed by methods 10440 that deposits carbon nanotube layer corresponding to carbon nanotube layer 10530. This fabrication sequence is selected so that, in this example, when quarts handle wafer 10725 is flipped onto substrate 10710, the carbon nanotube layer is in contact with lower electrode 10720 to form a NV nanoscopic carbon layer corresponding to nanoscopic element stack 9650A illustrated in table 10600, item #1. While item #1 was chosen for illustrative purposes, any of the structures illustrated in table 10600, and other structures not illustrated in table 10600, may be formed using methods of fabrication 10900 and 10800 as well as methods of fabrication 10400.

Next, methods 10950 may deposit an adhesion promoting layer. Alternately, methods 10950 may be omitted and quarts handle wafer to substrate bonding (joining) may be carried out using methods 10840 described further below.

At this point in the process, quartz handle wafer 10725 and substrate 10710 are aligned and joined as described with respect to methods 10840. The alignment is non-critical because non-patterned layers are transferred. Patterning and etching occurs later in the process. However, for some applications it may be desirable to pattern and etch structures on the quarts handle wafer 10725 as described further below in which case alignment may be required. One alignment method is to alignment marks by using the transparency of the quartz handle wafer using known industry wafer-to-wafer alignment techniques that may be adapted for this application. For example, IC wafer alignment and bonding tools and corresponding processes create hydrophobic or hydrophilic surfaces using tools such as SST International Model 3180/3190, EV Group EVG501, SUSS Microtech ELAN CB6L and others for alignment and bonding. Accordingly, methods 10840 may use known industry methods of wafer-to-wafer bonding to join two or more wafers or substrates by creating hydrophobic or hydrophilic surfaces for example. After alignment and bonding, wafers and substrates may be held together by van de Waals forces for example. Alternately, wafers or wafers and substrates may be bonded with an adhesive layers.

Next, methods 10850 exposes sacrificial polymer release layer 10730 to UV radiation or to heat. Then, methods 10860 removes quartz handle wafer 10725 by holding substrate 10710 while mechanically lifting quarts handle wafer 10725 and leaving nanofabric layer 10735 in contact with bottom contact layer 10720. After removal, quartz handle wafer 10725 may be cleaned and reused.

Next, methods 10880 complete deposition of nanofabric layers which may include methods 10470 of depositing a top contact layer such as top contact layer 10550 described further above with respect to FIG. 105D. Then, methods 10885 may be used to pattern and etch the top contact layer, nanofabric layer 10735, and bottom contact layer 10720 to form NV NT switches. At this point in the process, methods 10890 may be used to complete fabrication including passivation, wiring, and interconnect terminals.

Methods and structures corresponding to fabrication flow 10700 illustrated in FIG. 107A have been described further above. Methods and structures corresponding to fabrication flow 10700' illustrated in FIG. 107B are described further below. In the case of FIG. 107B, layers needed to form complete NV NT switches are formed on the quarts handle wafer 10725 and then transferred to the substrate 10710. So for example, methods 10810 form circuit 10715 as described above with respect to FIG. 107A. An optional planarization step may be added to form circuit 10715 layers with a planarized surface 10722.

Now turning to methods of fabrication 10900, processing up to applying sacrificial polymer layer 10730 is the same as described with respect to FIG. 107A. Next, methods 10920 deposit top contact layer 10770 on sacrificial polymer layer 10730 and corresponds to methods described further above with respect to methods of fabrication 10400. Then, methods 10930 deposits nanofabric layer 10775. Nanofabric 10775 fabrication corresponds to nanofabric layer 10735 illustrated further above with respect to FIG. 107A. Then methods 10930 deposits bottom contact layer 10780 on the top surface of nanofabric layer 10775 and corresponds to methods described further above with respect to methods of fabrication 10400.

At this point in the process, nanofabric layers needed for a complete NV NT switch have been deposited on sacrificial polymer layer 10730 which is on the surface of quarts wafer 10725. At this point in the process, quartz handle wafer 10725 and substrate 10710 are aligned and joined as described with respect to methods 10840 and form stacked wafer 10785 as described further above with respect to stacked wafer 10740.

Next, methods 10850 and 10860 release and remove quartz handle wafer 10725, respectively, as described further above with respect to FIG. 107A. At this point in the process, NV NT switches formed on quartz handle wafer 10725 have been transferred to the top surface of substrate wafer 10710. Next, methods 10885 pattern and etch NV NT switch layers to complete NV NT switch formation (unless pattern and etch was carried out on the quartz including passivation, wiring, and interconnect terminals).

Methods of Test and Burn-in of NV NT Switches and NV NT Switches Integrated with Other Devices Test and burn-in methods for enhancing the performance of memory and other types of chips are well known in the industry. For example, burn-in and test methods are described in Bertin et al. patent U.S. Pat. No. 6,574,763 "Method and Apparatus for Semiconductor Integrated Circuit Testing and Burn-in" Jun. 3, 2003 hereby incorporated by reference and multi-chip testing on a wafer and then dicing and mounting chips for further evaluation is described in Bertin et al. U.S. Pat. No. 7,132,841 "Carrier for Test, Burn-in, and First Level Packaging" Nov. 7, 2006 hereby incorporated by reference in its entirety. The methods illustrated in U.S. Pat. No. 6,574,763 and U.S. Pat. No. 7,132,841 may be applied to NV NT switches and NV NT switches combined with other devices.

For example, FIG. 11000 illustrates a handle wafer 11010 corresponding to quarts handle wafer 10725 and other layers forming a subset of NV NT switch layers as illustrated in FIG. 107A or a complete NV NT switch structure as illustrated in FIG. 107B. The test and burn-in methods illustrated in U.S. Pat. Nos. 6,574,763 and 7,132,841 may be applied to any substrate such as a semiconductor substrate or any type of handle wafer such as a quarts handle wafer as described further below. In this example, the focus is on handle wafer 11010 as described further below.

For purposes of illustration, handle wafer 11010 is assumed to be quarts handle wafer 11011 corresponding to handle wafer 10725 with added nanofabric layers as illustrated in FIG. 107B which includes the nanofabric layers that may used to form a NV NT switch for example. Test and burn-in may be used to enhance the performance of corresponding NV NT switches.

In one embodiment, a voltage at elevated temperature is applied to bottom conductor layer 10780 with respect to the top conductor layer 10770 then NV NT switches formed after wafer bonding, separation, pattern and etch are tested and compared (correlated) to applied voltage and temperature conditions.

In another embodiment, a few quarts handle wafers with nanofabric layers are patterned, tested, then burned-in, then tested and switch performance is measured. Quarts handle wafer batches are selected based on test and burn-in results for bonding to substrates as illustrated in FIG. 107B for example. Examples of simple structures to evaluate NV NT switches are illustrated in FIGS. 98 and 99. Logic signal routing structures such as illustrated in FIG. 102 may be used. NV NT switches (blocks) with carbon nanotube-only layers such as illustrated in FIGS. 40, 78, and 79 may be stressed and tested for example. Other NV NT switches that also include nanoscopic carbon and non-carbon material such as those illustrated in FIGS. 96 and 97 may be tested and burned-in for example. More complex structures such as NV NT diodes that include diodes and NV NT switches in series as illustrated in the perspective drawing in FIG. 75 and a NanoLogic® signal routing structure illustrated in FIG. 102 may also be used.

In yet another embodiment, NV NT switches or combinations of NV NT switches and other devices may be cut and mounted in packages for test and burn-in. In yet another embodiment, NV NT switches or combinations of NV NT switches and other devices may be patterned, tested, and burned-in for all quarts handle wafers. Only those quarts handle wafers passing test and burn-in requirements are bonded to substrate wafers. This embodiment may result in the best switch performance; however, alignment is more difficult than when transferring non-patterned wafers. Test and burn-in methods may be enhanced by incorporating device structures 11020 to assist in wafer-level, or in this case handle wafer-level, test and burn-in.

The various embodiments described further above may be used to test, burn-in, and select quarts handle wafers with NV NT switches that exhibit desired performance criteria such as lower voltage switching at <5 Volts, lower currents for reset (set) of <50 μA, and tolerance of high RTA temperatures of 750° C. for NV NT switch dimensions of <50 nm thereby enabling scaling of cells sizes to smaller dimensions. Also, process changes such as ion implantation for example may be evaluated to optimize NV NT switch electrical characteristic.

The invention may be embodied in other specific forms without departing from the spirit or essential characteristics thereof. The present embodiments are therefore to be considered in respects as illustrative and not restrictive. For example, the 3D examples described further above may be used to form stand alone memory arrays. Alternatively, the 3D examples described further above may be used as embedded memory in logic chips. Also, 3D examples described further above may be stacked above one or more microprocessors in a logic chip such that address, timing, and data line lengths are mostly vertically oriented and short in distance for enhanced performance at lower power. Also, for example, many of the embodiments described above are described with reference to minimum technology node F. While it can be useful to fabricate memory elements at the smallest size allowed by the minimum technology node, embodiments can be fabricated at any size allowed by the minimum technology node (e.g., larger than the minimum feature size).

INCORPORATED PATENT REFERENCES

The following commonly-owned patent references, referred to herein as "incorporated patent references," describe various techniques for creating nanotubes (nanotube fabric articles and switches), e.g., creating and patterning nanotube fabrics, and are incorporated by reference in their entireties:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Memory Having Cell Selection Circuitry Constructed With Nanotube Technology (U.S. patent application Ser. No. 09/915,173, now U.S. Pat. No. 6,643,165), filed on Jul. 25, 2001;

Hybrid Circuit Having Nanotube Electromechanical Memory (U.S. patent application Ser. No. 09/915,095, now U.S. Pat. No. 6,574,130), filed on Jul. 25, 2001;

Electromechanical Three-Trace Junction Devices (U.S. patent application Ser. No. 10/033,323, now U.S. Pat. No. 6,911,682), filed on Dec. 28, 2001;

Methods of Making Electromechanical Three-Trace Junction Devices (U.S. patent application Ser. No. 10/033,032, now U.S. Pat. No. 6,784,028), filed on Dec. 28, 2001;

Nanotube Films and Articles (U.S. patent application Ser. No. 10/128,118, now U.S. Pat. No. 6,706,402), filed on Apr. 23, 2002;

Methods of Nanotube Films and Articles (U.S. patent application Ser. No. 10/128,117, now U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Non-volatile Electromechanical Field Effect Devices and Circuits using Same and Methods of Forming Same (U.S. patent application Ser. No. 10/864,186, US Patent Publication No. 2005/0062035), filed Jun. 9, 2004;

Devices Having Horizontally-Disposed Nanofabric Articles and Methods of Making the Same, (U.S. patent application Ser. No. 10/776,059, US Patent Publication No. 2004/0181630), filed Feb. 11, 2004;

Devices Having Vertically-Disposed Nanofabric Articles and Methods of Making the Same (U.S. patent application Ser. No. 10/776,572, now U.S. Pat. No. 6,924,538), filed Feb. 11, 2004;

Patterned Nanoscopic Articles and Methods of Making the Same (U.S. patent application Ser. No. 10/936,119, now U.S. Pat. No. 7,416,993);

Nonvolatile Nanotube Programmable Logic Devices and a Nonvolatile Nanotube Field Programmable Gate Array Using Same (U.S. Provisional Patent Application No. 61/088,828), filed Aug. 14, 2008; and NRAM Arrays With Nanotube Blocks, Nanotube Traces, and Nanotube Planes and Methods of Making Same, (U.S. Provisional Patent Application No. 61/074,241) filed Jun. 20, 2008.

What is claimed is:

1. A non-volatile nanotube switch, comprising:

a conductive terminal;

a nanoscopic element stack having a first nanoscopic element and a second nanoscopic element in electrical contact with the first nanoscopic element, the first nanoscopic element comprising a nanotube fabric, the second nanoscopic element comprising a matrix material layer comprising a substantially homogenous mixture of nanotubes and nanoscopic particles, at least a portion of the nanoscopic element stack in electrical contact with at least a portion of the conductive terminal, wherein the matrix material layer is electrically conductive; and control circuitry in electrical communication with the conductive terminal, the control circuitry applying electrical stimulus to at least a portion of the nanoscopic element stack through the conductive terminal;

wherein at least one of the first and second nanoscopic elements is switchable among a plurality of electronic states in response to the electrical stimulus, the electronic states corresponding to resistances of the nanoscopic element stack.

2. The switch of claim 1 wherein the nanotube fabric includes a multi-layered nanotube fabric having a thickness of approximately 5 to 500 nm.

3. The switch of claim 1 wherein the matrix material layer forms an electrically conductive interface between the nanotube fabric and the conductive terminal.

4. The switch of claim 1 wherein the nanoscopic element stack includes a third nanoscopic element comprising a nanotube fabric.

5. The switch of claim 1 wherein an interface element is interposed between the conductive terminal and the nanoscopic element stack, the interface element selected to provide a predetermined electrically resistive pathway between the conductive terminal and the nanoscopic element stack.

6. The switch of claim 5 wherein the interface element comprises at least one of SiO, SiN, alumina, silicon, germanium, another dielectric material, and another semiconductor material.

7. The switch of claim 1 wherein the first nanoscopic element is substantially interposed between the conductive terminal and the second nanoscopic element.

8. The switch of claim 1 wherein the conductive terminal comprises an electrically conducting material including at least one of W, TiN, WN, TiCN, Ru, Ti, Cr, AI, AICu, Au, Pd, Ni, Cu, Mo, Ag, In, Ir, Pb, Sn, TiAu, TiCu, TiPd, Pbln, TiW, a conductive nitride, a conductive oxide, and a conductive silicide.

9. The switch of claim 1 wherein the nanotube fabric further includes nanoscopic particles comprising at least one of conductive nanoscopic particles, semiconductive nanoscopic particles, insulating nanoscopic particles, and carbon particles.

10. The switch of claim 1 wherein for a first of the plurality of electronic states, the nanoscopic element stack has an electrical resistance between approximately 100 kΩ and 1 MΩ.

11. The switch of claim 1 wherein for a second of the plurality of electronic states, the nanoscopic element stack has an electrical resistance of approximately 100 MΩ.

12. The switch of claim 1 wherein the electrical stimulus comprises a voltage of less than approximately 5 volts.

13. The switch of claim 1 wherein the electrical stimulus comprises a SET current of approximately 1-3 μA.

14. The switch of claim 1 wherein the electrical stimulus comprises a RESET current of approximately 10-50 μA.

15. The switch of claim 1 further comprising a second conductive terminal, wherein the nanoscopic element stack is substantially interposed between the conductive terminal and the second conductive terminal.

16. The switch of claim 1, wherein the matrix material layer and the conductive terminal are physically separated by an insulating material and wherein the first nanoscopic element comprises a nanotube fabric trace forming an electrically conductive pathway between the matrix material layer and the conductive terminal.

17. A non-volatile nanotube memory array, comprising:

a plurality of nanotube switches, each switch having a conductive terminal and a nanoscopic element stack, wherein the nanoscopic element stack comprises a first nanoscopic element and a second nanoscopic element in electrical contact with the first nanoscopic element, the first nanoscopic element comprising a nanotube fabric, the second nanoscopic element comprising a matrix material layer comprising a substantially homogenous mixture of nanotubes and nanoscopic particles, at least a portion of the nanoscopic element stack in electrical contact with at least a portion of the conductive terminal, wherein the matrix material layer is electrically conductive; and control circuitry in electrical communication with and for applying electrical stimulus to one or more of the nanotube switches;

wherein, in response to the electrical stimulus applied to one or more of the nanotube switches, a portion of the nanoscopic element stack of one or more of the nanotube switches is switchable among a plurality of electronic states, the electronic states corresponding to resistances of the nanoscopic element stack.

18. The switch of claim 17 wherein the nanotube fabric includes a multi-layered nanotube fabric having a thickness of approximately 5 to 500 nm.

19. The switch of claim 17 wherein the matrix material layer forms an electrically conductive interface between the nanotube fabric and the conductive terminal.

20. The switch of claim 17 wherein an interface element is interposed between the conductive terminal and the nanoscopic element stack, the interface element comprising a predetermined electrically resistive pathway between the conductive terminal and the nanoscopic element stack.

21. The switch of claim 20 wherein the interface element comprises at least one of SiO, SiN, alumina, silicon, germanium, a dielectric material, and a semiconductor material.

22. The switch of claim 17 wherein the first nanoscopic element is substantially interposed between the conductive terminal and the second nanoscopic element.

23. The switch of claim 17 wherein the nanotube fabric further includes nanoscopic particles comprising at least one of conductive nanoscopic particles, semiconductive nanoscopic particles, insulating nanoscopic particles, and carbon particles.

24. The switch of claim 17 wherein for a first of the plurality of electronic states, the nanoscopic element stack has an electrical resistance between approximately 100 kΩ and 1 MΩ.

25. The switch of claim 17 wherein for a second of the plurality of electronic states, the nanoscopic element stack has an electrical resistance of approximately 100 MΩ.

26. The switch of claim 17 wherein the electrical stimulus comprises a voltage of less than approximately 5 volts.

27. The switch of claim 17 wherein the electrical stimulus comprises a SET current of approximately 1-3 μA.

28. The switch of claim 17 wherein the electrical stimulus comprises a RESET current of approximately 10-50 μA.

29. A non-volatile nanotube memory array, comprising:

an array of conductive terminals;

a nanoscopic element stack having a first nanoscopic element and a second nanoscopic element arranged in electrical contact with the first nanoscopic element, the first nanoscopic element comprising a substantially planar nanotube fabric, the second nanoscopic element comprising a substantially planar matrix material layer conformally disposed in relation to the first nanoscopic element, at least a portion of the nanoscopic element stack in electrical contact with at least a portion of the conductive terminals, wherein the carbon material is electrically conductive; and control circuitry in electrical communication with one or more conductive terminals selected from the array for applying electrical stimulus to at least a portion of the nanoscopic element stack;

wherein, in response to the electrical stimulus, the portion of the nanoscopic element stack is switchable among a plurality of electronic states, the electronic states corresponding to resistances of the nanoscopic element stack; and wherein the matrix material layer comprises a substantially homogenous mixture of nanotubes and nanoscopic particles.

30. The memory array of claim 29 wherein the nanotube fabric includes a multi-layered nanotube fabric having a thickness of approximately 5 to 500 nm.

31. The memory array of claim 29 wherein the matrix material layer forms an electrically conductive interface between the nanotube fabric and the selected conductive terminal.

32. The memory array of claim 29 wherein the nanoscopic element stack includes a third nanoscopic element comprising a substantially planar nanotube fabric conformally disposed in relation to one of the first and second nanoscopic elements.

33. The memory array of claim 29 wherein an interface element is interposed between the selected conductive terminal and the nanoscopic element stack, the interface element selected to provide a predetermined electrically resistive pathway between the selected conductive terminal and the nanoscopic element stack.

34. The memory array of claim 33 wherein the interface element comprises at least one of SiO, SiN, alumina, silicon, germanium, a dielectric material, and a semiconductor material.

35. The memory array of claim 29 wherein the nanotube fabric is substantially interposed between the conductive terminals and the matrix material layer.

36. The memory array of claim 29 wherein the conductive terminals comprise an electrically conducting material including at least one of W, TiN, WN, TiCN, Ru, Ti, Cr, AI, AICu, Au, Pd, Ni, Cu, Mo, Ag, In, Ir, Pb, Sn, TiAu, TiCu, TiPd, Pbln, TiW, a conductive nitride, a conductive oxide, and a conductive silicide.

37. The memory array of claim 29 wherein the nanotube fabric further includes nanoscopic particles comprising at least one of conductive nanoscopic particles, semiconductive nanoscopic particles, insulating nanoscopic particles, and carbon particles.

38. The memory array of claim 29 wherein for a first of the plurality of electronic states, the portion of the nanoscopic element stack has an electrical resistance between approximately 100 kΩ and 1 MΩ.

39. The memory array of claim 29 wherein for a second of the plurality of electronic states, the portion of the nanoscopic element stack has an electrical resistance of approximately 100 MΩ.

40. The memory array of claim 29 wherein the electrical stimulus comprises a voltage of less than approximately 5 volts.

41. The memory array of claim 29 wherein the electrical stimulus comprises a SET current of approximately 1-3 μA.

42. The memory array of claim 29 wherein the plurality of electrical stimulus comprises a RESET current of approximately 10-50 μA.

43. The memory array of claim 29, wherein the nanoscopic element stack is patterned to form a nanoscopic element trace having defined lithographic dimensions.

44. The non-volatile nanotube switch of claim 1 wherein the nanoscopic element stack corresponds to a cell size of $4F^2$.

45. The non-volatile nanotube memory array of claim 17 wherein the nanoscopic element stack corresponds to a cell size of $4F^2$.

* * * * *